US012421449B2

(12) United States Patent
Kim et al.

(10) Patent No.: US 12,421,449 B2
(45) Date of Patent: Sep. 23, 2025

(54) COMPOUND AND ORGANIC LIGHT EMITTING DEVICE COMPRISING SAME

(71) Applicant: LG CHEM, LTD., Seoul (KR)

(72) Inventors: Seonwoo Kim, Daejeon (KR); Wanpyo Hong, Daejeon (KR); Sujeong Geum, Daejeon (KR); Moung Gon Kim, Daejeon (KR); Kyunghee Kim, Daejeon (KR)

(73) Assignee: LG CHEM, LTD., Seoul (KR)

( * ) Notice: Subject to any disclaimer, the term of this patent is extended or adjusted under 35 U.S.C. 154(b) by 902 days.

(21) Appl. No.: 17/609,472

(22) PCT Filed: Sep. 18, 2020

(86) PCT No.: PCT/KR2020/012610
§ 371 (c)(1),
(2) Date: Nov. 8, 2021

(87) PCT Pub. No.: WO2021/107359
PCT Pub. Date: Jun. 3, 2021

(65) Prior Publication Data

US 2022/0263027 A1 Aug. 18, 2022

(30) Foreign Application Priority Data

Nov. 29, 2019 (KR) ........................ 10-2019-0156843

(51) Int. Cl.

| | |
|---|---|
| ***C07F 5/02*** | (2006.01) |
| ***C09K 11/06*** | (2006.01) |
| ***H10K 85/30*** | (2023.01) |
| ***H10K 85/60*** | (2023.01) |
| *H10K 50/11* | (2023.01) |
| *H10K 101/10* | (2023.01) |
| *H10K 101/30* | (2023.01) |

(52) U.S. Cl.
CPC .............. *C09K 11/06* (2013.01); *C07F 5/027* (2013.01); *H10K 85/322* (2023.02); *H10K 85/658* (2023.02); *C07B 2200/05* (2013.01); *C09K 2211/1018* (2013.01); *H10K 50/11* (2023.02); *H10K 2101/10* (2023.02); *H10K 2101/30* (2023.02)

(58) Field of Classification Search
None
See application file for complete search history.

(56) References Cited

U.S. PATENT DOCUMENTS 11,502,261 B2 * 11/2022 Hong ..................... H10K 85/40
11,631,821 B2 * 4/2023 Suh ...................... H10K 85/657 257/40
11,685,751 B2 * 6/2023 Geum .................. H10K 85/626 257/40
11,780,856 B2 * 10/2023 Cho ....................... H10K 85/40 257/40
2004/0251816 A1 12/2004 Leo et al.
2017/0365787 A1 12/2017 Cha et al.
2018/0010040 A1 1/2018 Pan et al.
2019/0181350 A1 * 6/2019 Hatakeyama ........ H10K 85/631
2019/0280209 A1 9/2019 Fujita
2020/0058885 A1 2/2020 Hong et al.
(Continued)

FOREIGN PATENT DOCUMENTS

CN 107108408 8/2017
CN 107406384 11/2017
(Continued)

*Primary Examiner* — Robert S Loewe
(74) *Attorney, Agent, or Firm* — Bryan Cave Leighton Paisner LLP

(57) ABSTRACT

Provided is a compound of Chemical Formula 1:

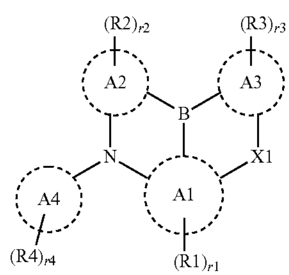

wherein:

X1 is O or

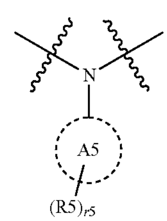

,

A1 is an aromatic hydrocarbon ring or a hetero ring;

at least one of A2 and A3 is a hetero ring comprising S or O, and the other is an aromatic hydrocarbon ring, and when each of A2 and A3 are a hetero ring comprising S or O, A2 and A3 are the same as or different from each other;

A4 and A5 are each independently an alkyl group, a cycloalkyl group, an aryl group, or a heterocyclic group; and adjacent two or more of A1 to A5 are optionally bonded to each other to form a substituted or unsubstituted ring, and an organic light emitting device including the same.

17 Claims, 2 Drawing Sheets

(56) References Cited

U.S. PATENT DOCUMENTS

| | | | | |
|---|---|---|---|---|
| 2020/0098991 | A1* | 3/2020 | Kim | H10K 85/322 |
| 2020/0172558 | A1* | 6/2020 | Joo | H10K 85/636 |
| 2020/0176679 | A1 | 6/2020 | Jeong et al. | |
| 2020/0194683 | A1* | 6/2020 | Sim | C09K 11/06 |
| 2020/0395553 | A1* | 12/2020 | Park | H10K 85/6572 |
| 2021/0036233 | A1* | 2/2021 | Joo | H10K 85/658 |
| 2021/0167293 | A1* | 6/2021 | Joo | H10K 85/658 |
| 2021/0184121 | A1 | 6/2021 | Suh et al. | |
| 2021/0305512 | A1* | 9/2021 | Suzaki | H10K 85/636 |
| 2021/0320256 | A1* | 10/2021 | Lim | C07F 5/027 |
| 2023/0002419 | A1* | 1/2023 | Shim | H10K 85/615 |
| 2023/0110346 | A1* | 4/2023 | Shin | H10K 85/658 568/6 |

FOREIGN PATENT DOCUMENTS

| | | | |
|---|---|---|---|
| CN | 107417715 | | 12/2017 |
| CN | 108336239 | | 7/2018 |
| CN | 110225917 | | 9/2019 |
| JP | 2019-161218 | | 9/2019 |
| KR | 10-2018-0127918 | | 11/2018 |
| KR | 101990818 | | 6/2019 |
| KR | 10-2019-0101900 | | 9/2019 |
| WO | 2003-012890 | A2 | 2/2003 |
| WO | 2003-012890 | A3 | 8/2003 |
| WO | 2019-102936 | | 5/2019 |
| WO | 2019088799 | A1 | 5/2019 |
| WO | 2020080872 | A1 | 4/2020 |

* cited by examiner

[Figure 1]
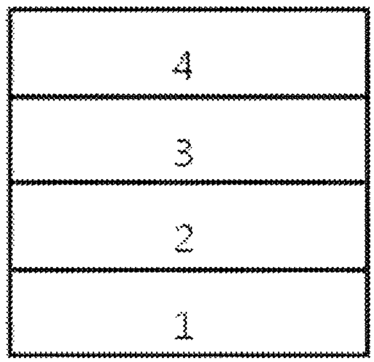
[Figure 2]
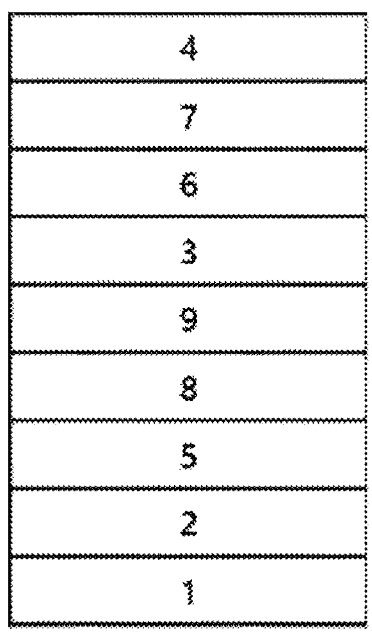

[Figure 3]
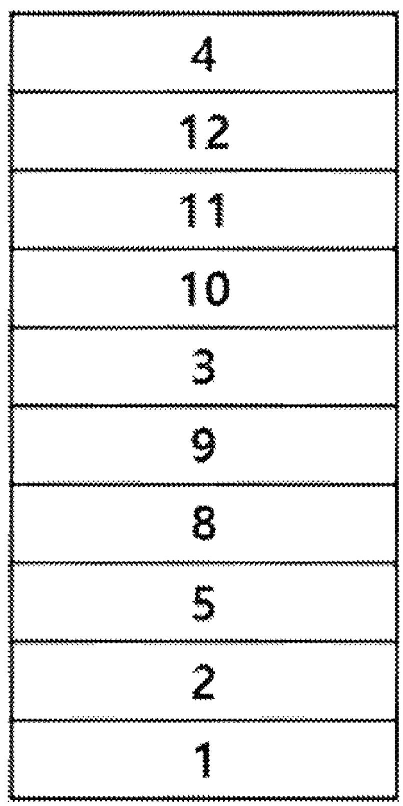

COMPOUND AND ORGANIC LIGHT EMITTING DEVICE COMPRISING SAME

CROSS-REFERENCE TO RELATED APPLICATIONS

This application is a National Stage Application of International Application No. PCT/KR2020/012610 filed on Sep. 18, 2020, which claims priority to and the benefit of Korean Patent Application No. 10-2019-0156843 filed in the Korean Intellectual Property Office on Nov. 29, 2019, the entire contents of which are incorporated herein by reference.

TECHNICAL FIELD

The present specification relates to a compound and an organic light emitting device including the same.

BACKGROUND

In general, an organic light emitting phenomenon refers to a phenomenon in which electric energy is converted into light energy by using an organic material. An organic light emitting device using the organic light emitting phenomenon usually has a structure including a positive electrode, a negative electrode, and an organic material layer interposed therebetween. Here, the organic material layer can have a multi-layered structure composed of different materials in many cases in order to improve the efficiency and stability of the organic light emitting device, and can be composed of, for example, a hole injection layer, a hole transport layer, a light emitting layer, an electron transport layer, an electron injection layer, and the like. In such a structure of the organic light emitting device, if a voltage is applied between the two electrodes, holes are injected from the positive electrode into the organic material layer and electrons are injected from the negative electrode into the organic material layer, and when the injected holes and electrons meet each other, an exciton is formed, and light is emitted when the exciton falls down again to a ground state.

There is a continuous need for developing a new material for the aforementioned organic light emitting device.

BRIEF DESCRIPTION

Technical Problem

The present specification provides a compound and an organic light emitting device including the same.

Technical Solution

An exemplary embodiment of the present specification provides a compound of the following Chemical Formula 1:

<Chemical Formula 1>

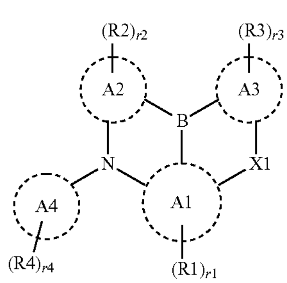

wherein in Chemical Formula 1,

X1 is O or

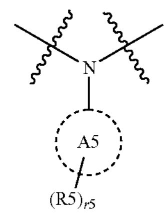

;

A1 is an aromatic hydrocarbon ring or a hetero ring;

at least one of A2 and A3 is a hetero ring that includes S or O, and the other is an aromatic hydrocarbon ring;

when A2 and A3 is a hetero ring that includes S or O, A2 and A3 are the same as or different from each other;

A4 and A5 are the same as or different from each other, and are each independently an alkyl group, a cycloalkyl group, an aryl group, or a heterocyclic group;

adjacent two or more of A1 to A5 can be bonded to each other to form a substituted or unsubstituted ring;

R1 is a substituted or unsubstituted alkyl group, a substituted or unsubstituted heterocyclic group, or a group of the following Chemical Formula 2, or is bonded to an adjacent group to form a substituted or unsubstituted ring;

R2 to R5 are the same as or different from each other, and are each independently hydrogen, deuterium, a halogen group, a cyano group, a substituted or unsubstituted alkyl group, a substituted or unsubstituted aryloxy group, a substituted or unsubstituted alkoxy group, a substituted or unsubstituted alkylthioxy group, a substituted or unsubstituted arylthioxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, a substituted or unsubstituted heterocyclic group, or a group of the following Chemical Formula 2, or adjacent groups are bonded to each other to form a substituted or unsubstituted ring;

r1 to r5 are each an integer from 1 to 15;

when r1 to r5 are each 2 or higher, two or more substituents in the parenthesis are the same as or different from each other;

<Chemical Formula 2>

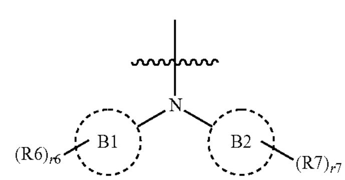

wherein in Chemical Formula 2:

B1 and B2 are the same as or different from each other, and are each independently an alkyl group, a cycloalkyl group, an aryl group, or a heterocyclic group;

R6 and R7 are the same as or different from each other, and are each independently hydrogen, deuterium, a halogen group, a cyano group, a substituted or unsubstituted alkyl group, a substituted or unsubstituted alkoxy group, a substituted or unsubstituted aryloxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted heterocyclic group, or adjacent groups are bonded to each other to form a substituted or unsubstituted ring;

r6 and r7 are each an integer from 1 to 10;

when r6 and r7 are each 2 or higher, two or more substituents in the parenthesis are the same as or different from each other; and at least one hydrogen at a substitutable position of Chemical Formula 1 is substituted with deuterium.

Further, the present specification provides an organic light emitting device including: a first electrode; a second electrode provided to face the first electrode; and an organic material layer having one or more layers provided between the first electrode and the second electrode, in which one or more layers of the organic material layer include the compound.

Advantageous Effects

The compound described in the present specification can be used as a material for an organic material layer of an organic light emitting device. The compound according to another exemplary embodiment can improve the efficiency, achieve low driving voltage and/or improve lifetime characteristics in the organic light emitting device. In particular, the compound described in the present specification can be used as a material for hole injection, hole transport, hole injection and hole transport, electron blocking, light emission, hole blocking, electron transport, or electron injection. Further, the organic light emitting device according to an exemplary embodiment of the present specification has low driving voltage, high efficiency, or long service life effects.

BRIEF DESCRIPTION OF THE DRAWINGS

FIGS. 1 to 3 illustrate an example of an organic light emitting device according to an exemplary embodiment of the present specification.

EXPLANATION OF REFERENCE NUMERALS AND SYMBOLS

1: Substrate
2: First electrode
3: Light emitting layer
4: Second electrode
5: Hole injection layer
6: Hole blocking layer
7: Electron injection and transport layer
8: Hole transport layer
9: Electron blocking layer
10: First electron transport layer
11: Second electron transport layer
12: Electron injection layer

DETAILED DESCRIPTION

Hereinafter, the present specification will be described in more detail.

A boron compound in the related art has a full-width at half-maximum of approximately 23 to 30 nm, and a wavelength of a basic core structure thereof is approximately 453 nm, but the boron compound in the related art has a limitation in that the service life deteriorates because the stability of the material relatively reduced compared to an amine compound. Therefore, there is a need for a method of securing a long service life by improving the stability of a material while maintaining excellent optical properties by adjusting a substituent of the boron compound.

The present specification provides a compound in which at least one hydrogen at a substitutable position is substituted with deuterium, and an organic light emitting device including the same. Since a C-D bond of the compound of the present invention is stronger than a C—H bond, the stability of the compound can be improved. When the chemical decomposition of a light emitting compound is accompanied by the destruction of the C(sp3)-H bond, which is relatively weak, there is an effect that the stability of the compound can be further improved using the C-D bond which is stronger than the C—H bond.

In this case, when an alkyl group is used as a substituent capable of donating electrons, the light emitting characteristics can be effectively adjusted, but the C—H bond of the alkyl group introduced in a high energy state is destroyed, and the decomposition of the compound is promoted, so that a problem occurs to the overall service life characteristics of a device. Therefore, when an alkyl group substituted with deuterium is used, it is possible to effectively adjust the light emitting characteristics while securing the stability of a blue device. Additionally, when a smaller van der Waals radius of deuterium is used, the steric hindrance is smaller than that of the existing alkyl group, so that the conjugation can be improved.

Further, due to a carbon-deuterium bond of a hetero ring that includes O or S in a central core of Chemical Formula 1 of the present specification, the long service life of an organic light emitting device including the same can appear to be maximized. In addition, the boron compound having a hetero ring that includes O or S of Chemical Formula 1 exhibits a characteristic of having a lower excited triplet energy than the boron compound in the related art. Unlike the singlet state which rapidly returns to the ground state by the light emitting process, the triplet state slowly returns to the ground state while eliminating energy by heat or vibration energy, so that there occurs a problem in that the boron compound in the related art deteriorates through intermolecular interaction with a molecule having a high triplet state energy. Therefore, in the boron compound in the related art, a carbon-hydrogen bond, which is a weak bond in the molecule, is dissociated to form radicals and ions in a process in which the compound is decomposed by light or electric current, but the compound of Chemical Formula 1 can effectively prevent the decomposition of the compound by changing the carbon-hydrogen bond into a stronger carbon-deuterium bond.

Examples of the substituents in the present specification will be described below, but are not limited thereto.

In the present specification,

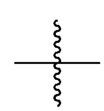

means a moiety to be linked.

The term "substitution" means that a hydrogen atom bonded to a carbon atom of a compound is changed into another substituent, and a position to be substituted is not limited as long as the position is a position at which the hydrogen atom is substituted, that is, a position at which the substituent can be substituted, and when two or more are substituted, the two or more substituents can be the same as or different from each other.

In the present specification, the term “substituted or unsubstituted” means being substituted with one or more substituents selected from the group consisting of deuterium, a halogen group, a cyano group, an alkyl group, a cycloalkyl group, an alkoxy group, an aryloxy group, an alkylthioxy group, an arylthioxy group, an alkenyl group, a haloalkoxy group, an arylalkyl group, a haloalkyl group, a silyl group, a boron group, an amine group, an aryl group, and a heterocyclic group, being substituted with a substituent to which two or more substituents among the exemplified substituents are linked, or having no substituent.

In the present specification, the fact that two or more substituents are linked indicates that hydrogen of any one substituent is linked to another substituent. For example, when two substituents are linked to each other, a phenyl group and a naphthyl group can be linked to each other to become a substituent of

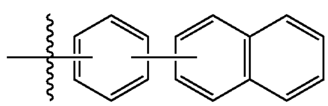

or

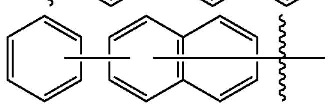

.

Further, the case where three substituents are linked to one another includes not only a case where (Substituent 1)-(Substituent 2)-(Substituent 3) are consecutively linked to one another, but also a case where (Substituent 2) and (Substituent 3) are linked to (Substituent 1). For example, a phenyl group, a naphthyl group, and an isopropyl group can be linked to one another to become a substituent of

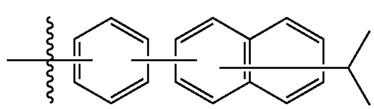

,

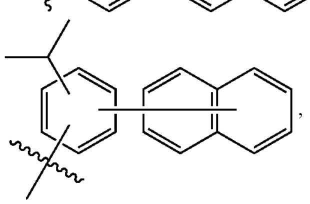

, or

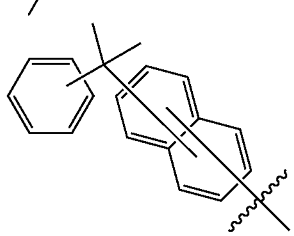

.

The above-described definition also applies equally to the case where four or more substituents are linked to one another.

In the present specification, examples of a halogen group include fluorine, chlorine, bromine or iodine.

In the present specification, the alkyl group can be straight-chained or branched, and the number of carbon atoms thereof is not particularly limited, but is preferably 1 to 30. Specific examples thereof include methyl, ethyl, propyl, n-propyl, isopropyl, butyl, n-butyl, isobutyl, tert-butyl, sec-butyl, 1-methyl-butyl, 1-ethyl-butyl, pentyl, n-pentyl, isopentyl, neopentyl, tert-pentyl, hexyl, n-hexyl, 1-methylpentyl, 2-methylpentyl, 4-methyl-2-pentyl, 3,3-dimethylbutyl, 2-ethylbutyl, heptyl, n-heptyl, 1-methylhexyl, cyclopentylmethyl, cyclohexylmethyl, octyl, n-octyl, tert-octyl, 1-methylheptyl, 2-ethylhexyl, 2-propylpentyl, n-nonyl, 2,2-dimethylheptyl, 1-ethyl-propyl, 1,1-dimethyl-propyl, isohexyl, 2-methylpentyl, 4-methylhexyl, 5-methyl-hexyl, and the like, but are not limited thereto.

In the present specification, a cycloalkyl group is not particularly limited, but has preferably 3 to 30 carbon atoms, and specific examples thereof include cyclopropyl, cyclobutyl, cyclopentyl, 3-methyl-cyclopentyl, 2,3-dimethylcyclopentyl, cyclohexyl, 3-methylcyclohexyl, 4-methyl-cyclohexyl, 2,3-dimethyl-cyclohexyl, 3,4,5-trimethylcyclohexyl, 4-tert-butyl-cyclohexyl, cycloheptyl, cyclooctyl, an adamantyl group, a bicyclo[2.2.1]octyl group, a norbornyl group, and the like, but are not limited thereto.

In the present specification, the alkoxy group can be straight-chained, branched, or cyclic. The number of carbon atoms of the alkoxy group is not particularly limited, but is preferably 1 to 30. Specific examples thereof include methoxy, ethoxy, n-propoxy, isopropoxy, n-butoxy, isobutoxy, tert-butoxy, sec-butoxy, n-pentyloxy, neopentyloxy, isopentyloxy, n-hexyloxy, 3,3-dimethylbutyloxy, 2-ethyl-butyloxy, n-octyloxy, n-nonyloxy, n-decyloxy, benzyloxy, p-methylbenzyloxy, and the like, but are not limited thereto.

In the present specification, the alkenyl group can be straight-chained or branched, and the number of carbon atoms thereof is not particularly limited, but is preferably 2 to 30. Specific examples thereof include vinyl, 1-propenyl, isopropenyl, 1-butenyl, 2-butenyl, 3-butenyl, 1-pentenyl, 2-pentenyl, 3-pentenyl, 3-methyl-1-butenyl, 1,3-butadienyl, allyl, 1-phenyl-vinyl-1-yl, 2-phenylvinyl-1-yl, 2,2-diphenyl-vinyl-1-yl, 2-phenyl-2-(naphthyl-1-yl)vinyl-1-yl, 2,2-bis(di-phenyl-1-yl)vinyl-1-yl, a stilbenyl group, a styrenyl group, and the like, but are not limited thereto.

In the present specification, the haloalkyl group means that at least one halogen group is substituted instead of hydrogen in an alkyl group in the definition of the alkyl group.

In the present specification, the haloalkoxy group means that at least one halogen group is substituted instead of hydrogen in an alkoxy group in the definition of the alkoxy group.

In the present specification, an aryl group is not particularly limited, but has preferably 6 to 30 carbon atoms, and the aryl group can be monocyclic or polycyclic.

When the aryl group is a monocyclic aryl group, the number of carbon atoms thereof is not particularly limited, but is preferably 6 to 30. Specific examples of the monocyclic aryl group include a phenyl group, a biphenyl group, a terphenyl group, and the like, but are not limited thereto.

When the aryl group is a polycyclic aryl group, the number of carbon atoms thereof is not particularly limited, but is preferably 10 to 30. Specific examples of the polycyclic aryl group include a naphthyl group, an anthracene group, a phenanthrene group, a triphenylene group, a pyrene group, a phenalene group, a perylene group, a chrysene group, a fluorene group, and the like, but are not limited thereto.

In the present specification, the fluorene group can be substituted, and adjacent substituents can be bonded to each other to form a ring.

Examples of the case where the fluorene group is substituted include

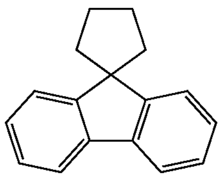
,
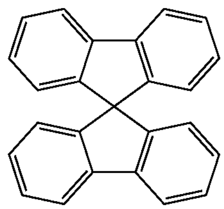
,
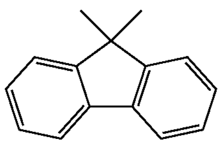
,
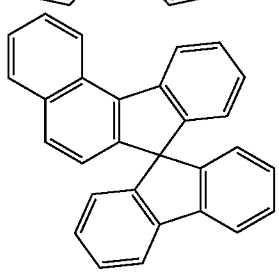
,
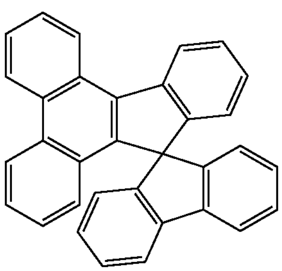
,
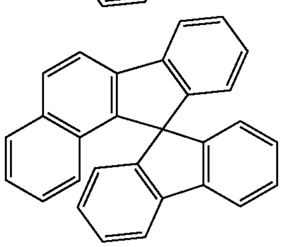
,
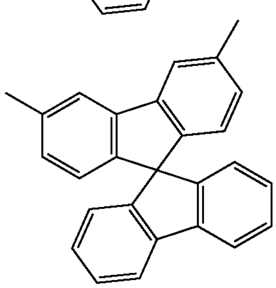
and
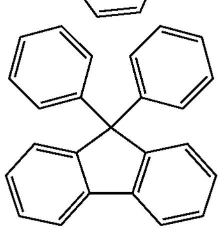
, and the like, but are not limited thereto.

In the present specification, the "adjacent" group can mean a substituent substituted with an atom directly linked to an atom in which the corresponding substituent is substituted, a substituent disposed to be sterically closest to the corresponding substituent, or another substituent substituted with an atom in which the corresponding substituent is substituted. For example, two substituents substituted at the ortho position in a benzene ring and two substituents substituted with the same carbon in an aliphatic ring can be interpreted as groups which are "adjacent" to each other.

In the present specification, an arylalkyl group means that the alkyl group is substituted with an aryl group, and examples of the aryl group and the alkyl group described above can be applied to the aryl group and the alkyl group of the arylalkyl group.

In the present specification, an aryloxy group means that in the definition of the alkoxy group, the alkoxy group is substituted with an aryl group instead of an alkyl group, and examples of the aryloxy group include a phenoxy group, a p-tolyloxy group, an m-tolyloxy group, a 3,5-dimethylphenoxy group, a 2,4,6-trimethylphenoxy group, a p-tert-butylphenoxy group, a 3-biphenyloxy group, a 4-biphenyloxy group, a 1-naphthyloxy group, a 2-naphthyloxy group, a 4-methyl-1-naphthyloxy group, a 5-methyl-2-naphthyloxy group, a 1-anthryloxy group, a 2-anthryloxy group, a 9-anthryloxy group, a 1-phenanthryloxy group, a 3-phenanthryloxy group, a 9-phenanthryloxy group, and the like, but are not limited thereto.

In the present specification, the alkyl group in the alkylthioxy group is the same as the above-described examples of the alkyl group. Specific examples of the alkylthioxy group include a methylthioxy group, an ethylthioxy group, a tert-butylthioxy group, a hexylthioxy group, an octylthioxy group, and the like, but are not limited thereto.

In the present specification, the aryl group in the arylthioxy group is the same as the above-described examples of the aryl group. Specific examples of the arylthioxy group include a phenylthioxy group, a 2-methylphenylthioxy group, a 4-tert-butyl-phenylthioxy group, and the like, but are not limited thereto.

In the present specification, a heterocyclic group includes one or more atoms other than carbon, that is, one or more heteroatoms, and specifically, the heteroatom can include one or more atoms selected from the group consisting of O, N, Se, S, and the like. The number of carbon atoms thereof is not particularly limited, but is preferably 2 to 30, and the heterocyclic group can be monocyclic or polycyclic. Examples of the heterocyclic group include a thiophene group, a furan group, a pyrrole group, an imidazole group, a thiazole group, an oxazole group, an oxadiazole group, a pyridine group, a bipyridine group, a pyrimidine group, a triazine group, a triazole group, an acridine group, a pyridazine group, a pyrazine group, a quinoline group, a quinazoline group, a quinoxaline group, a phthalazine group, a pyridopyrimidine group, a pyridopyrazine group, a pyrazinopyrazine group, an isoquinoline group, an indole group, a carbazole group, a benzoxazole group, a benzimidazole group, a benzothiazole group, a benzocarbazole group, a benzothiophene group, a dibenzothiophene group, a benzofuran group, a phenanthridine group, a phenanthroline group, an isoxazole group, a thiadiazole group, a dibenzofuran group, a dibenzosilole group, a phenoxathiine group, a phenoxazine group, a phenothiazine group, a dihydroindenocarbazole group, a spirofluorenexanthene group, a spirofluorenexanthene group, a spirofluorenethioxanthene group, and the like, but are not limited thereto.

In the present specification, the silyl group can be an alkylsilyl group, an arylsilyl group, a heteroarylsilyl group, and the like. The above-described examples of the alkyl group can be applied to the alkyl group in the alkylsilyl group, the above-described examples of the aryl group can be applied to the aryl group in the arylsilyl group, and the examples of the heterocyclic group can be applied to the heteroaryl group in the heteroarylsilyl group.

In the present specification, a boron group can be —$BR_{100}R_{101}$, and $R_{100}$ and $R_{101}$ are the same as or different from each other, and can be each independently selected from the group consisting of hydrogen; deuterium; halogen; a nitrile group; a substituted or unsubstituted monocyclic or polycyclic cycloalkyl group having 3 to 30 carbon atoms; a substituted or unsubstituted straight-chained or branched alkyl group having 1 to 30 carbon atoms; a substituted or unsubstituted monocyclic or polycyclic aryl group having 6 to 30 carbon atoms; and a substituted or unsubstituted monocyclic or polycyclic heterocyclic group having 2 to 30 carbon atoms. Specific examples of the boron group include a trimethylboron group, a triethylboron group, a t-butyldimethylboron group, a triphenylboron group, a phenylboron group, and the like, but are not limited thereto.

In the present specification, an amine group can be selected from the group consisting of —$NH_2$, an alkylamine group, an N-alkylarylamine group, an arylamine group, an N-arylheteroarylamine group, an N-alkylheteroarylamine group, and a heteroarylamine group, and the number of carbon atoms thereof is not particularly limited, but is preferably 1 to 30. Specific examples of the amine group include a methylamine group, a dimethylamine group, an ethylamine group, a diethylamine group, a phenylamine group, a naphthylamine group, a biphenylamine group, an anthracenylamine group, a 9-methyl-anthracenylamine group, a diphenylamine group, a ditolylamine group, an N-phenyltolylamine group, a triphenylamine group, an N-phenylbiphenylamine group, an N-phenylnaphthylamine group, an N-biphenylnaphthylamine group, an N-naphthylfluorenylamine group, an N-phenylphenanthrenyl-amine group, an N-biphenylphenanthrenylamine group, an N-phenylfluorenylamine group, an N-phenyl terphenylamine group, an N-phenanthrenylfluorenylamine group, an N-biphenylfluorenylamine group, and the like, but are not limited thereto.

In the present specification, an N-alkylarylamine group means an amine group in which an alkyl group and an aryl group are substituted with N of the amine group. The alkyl group and the aryl group in the N-alkylarylamine group are the same as the above-described examples of the alkyl group and the aryl group.

In the present specification, an N-arylheteroarylamine group means an amine group in which an aryl group and a heteroaryl group are substituted with N of the amine group. The aryl group and heteroaryl group in the N-arylheteroarylamine group are the same as the above-described examples of the aryl group and the heterocyclic group.

In the present specification, an N-alkylheteroarylamine group means an amine group in which an alkyl group and a heteroaryl group are substituted with N of the amine group. The alkyl group and the heteroaryl group in the N-alkylheteroarylamine group are the same as the above-described examples of the alkyl group and the heterocyclic group.

In the present specification, examples of an alkylamine group include a substituted or unsubstituted monoalkylamine group or a substituted or unsubstituted dialkylamine group. The alkyl group in the alkylamine group can be a straight-chained or branched alkyl group. The alkylamine group including two or more alkyl groups can include a straight-chained alkyl group, a branched alkyl group, or both a straight-chained alkyl group and a branched alkyl group. For example, the alkyl group in the alkylamine group can be selected from the above-described examples of the alkyl group.

In the present specification, examples of a heteroarylamine group include a substituted or unsubstituted monoheteroarylamine group or a substituted or unsubstituted diheteroarylamine group. The heteroarylamine group including two or more heteroaryl groups can include a monocyclic heteroaryl group, a polycyclic heteroaryl group, or both a monocyclic heteroaryl group and a polycyclic heteroaryl group. For example, the heteroaryl group in the heteroarylamine group can be selected from the above-described examples of the heterocyclic group.

In the present specification, the "adjacent two are bonded to each other to form a ring" among the substituents means that a substituent is bonded to an adjacent group to form a substituted or unsubstituted hydrocarbon ring, or a substituted or unsubstituted hetero ring.

In the present specification, in a substituted or unsubstituted ring formed by bonding adjacent groups, the "ring" means a substituted or unsubstituted hydrocarbon ring; or a substituted or unsubstituted hetero ring.

In the present specification, a hydrocarbon ring can be an aromatic hydrocarbon ring, an aliphatic hydrocarbon ring, or a fused ring of an aromatic hydrocarbon and an aliphatic hydrocarbon, and can be selected from the examples of the cycloalkyl group or the aryl group, except for the hydrocarbon ring which is not monovalent.

In the present specification, a hetero ring includes one or more atoms other than carbon, that is, one or more heteroatoms, and specifically, the heteroatom can include one or more atoms selected from the group consisting of O, N, Se, S, and the like. The hetero ring can be monocyclic or polycyclic and can be an aromatic ring, an aliphatic ring, or a fused ring of the aromatic ring and the aliphatic ring, and the aromatic hetero ring can be selected from the examples of the heterocyclic group, except for the aromatic hetero ring which is not monovalent.

In the present specification, an aliphatic hetero ring means an aliphatic ring including one or more of hetero atoms. Examples of the aliphatic hetero ring include oxirane, tetrahydrofuran, 1,4-dioxane, pyrrolidine, piperidine, morpholine, oxepane, azocane, thiocane, and the like, but are not limited thereto.

In the present specification, the hetero ring includes the ring of Chemical Formula 1.

In the present specification, an arylene group means a group having two bonding positions in an aryl group, that is, a divalent group. The above-described description on the aryl group can be applied to the arylene group, except that the arylene groups are each a divalent group.

In the present specification, a heteroarylene group means a group having two bonding positions in a heteroaryl group, that is, a divalent group. The above-described description on the heterocyclic group can be applied to the heteroarylene group, except that the heteroarylene groups are each a divalent group.

In the present specification, 'deuterated', 'substituted with deuterium', or 'including deuterium' means that at least one substitutable H (hydrogen) is substituted with D (deuterium). 'x % deuterated', 'substituted with x % deuterium', or 'including x % deuterium' indicates that deuterium is present at the substitutable position of Chemical Formula 1 in at least 100 times the natural abundance level in hydrogen.

Specifically, deuterium is present at the substitutable position of Chemical Formula 1 in at least 50 times the natural abundance level in hydrogen.

In the present specification, the degree of deuteration can be confirmed by a publicly-known method such as nuclear magnetic resonance spectroscopy ($^1$H NMR) or GC/MS.

According to an exemplary embodiment of the present specification, the degree of deuteration of Chemical Formula 1 is 10% to 100%.

According to an exemplary embodiment of the present specification, the degree of deuteration of Chemical Formula 1 is 10% or more and less than 100%.

According to an exemplary embodiment of the present specification, the degree of deuteration of Chemical Formula 1 is 75% or less.

According to an exemplary embodiment of the present specification, the degree of deuteration of Chemical Formula 1 is 5% or more and 75% or less. When the degree of deuteration of Chemical Formula 1 is within the above range, a device having a long service life can be economically configured by replacing a C—H bond at a position where dissociation easily occurs in an excited state with a relatively stronger C-D bond than by using a compound having a degree of deuteration of 100%.

Hereinafter, the heterocyclic compound of Chemical Formula 1 will be described in detail.

According to an exemplary embodiment of the present specification, in Chemical Formula 1, X1 is O.

According to an exemplary embodiment of the present specification, in Chemical Formula 1, X1 is

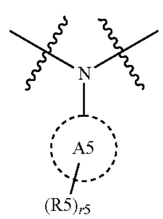

According to an exemplary embodiment of the present specification, Chemical Formula 1 is the following Chemical Formula 1-1 or 1-2:

<Chemical Formula 1-1>

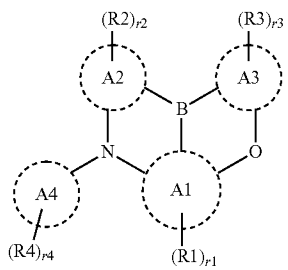

-continued

<Chemical Formula 1-2>

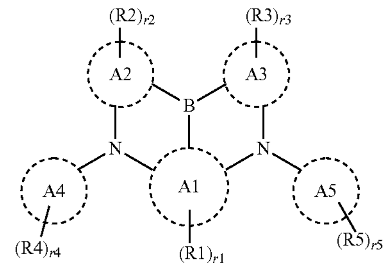

wherein in Chemical Formulae 1-1 and 1-2:

the definitions of A1 to A5, R1 to R5, and r1 to r5 are the same as those defined in Chemical Formula 1.

According to an exemplary embodiment of the present specification, Chemical Formula 1 is any one of the following Chemical Formulae 1-3 to 1-10:

<Chemical Formula 1-3>

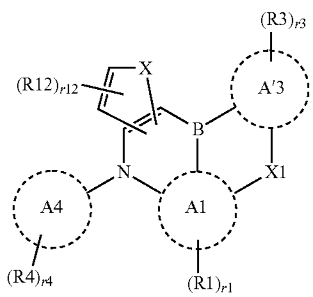

<Chemical Formula 1-4>

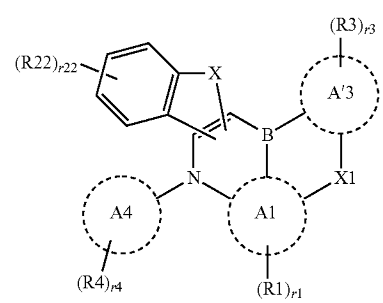

<Chemical Formula 1-5>

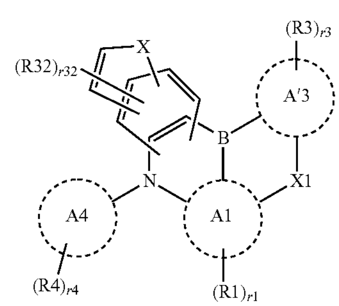

-continued

<Chemical Formula 1-6>

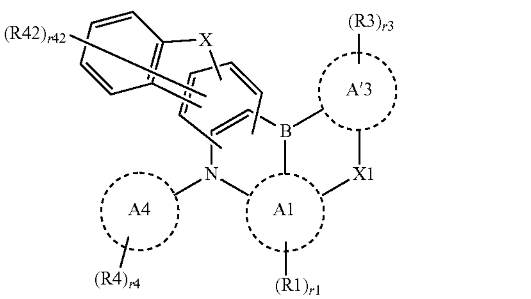

<Chemical Formula 1-7>

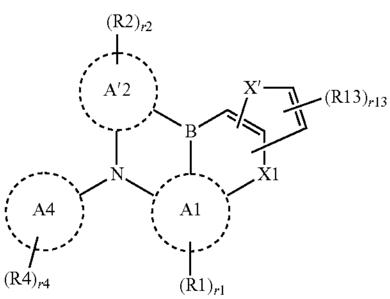

<Chemical Formula 1-8>

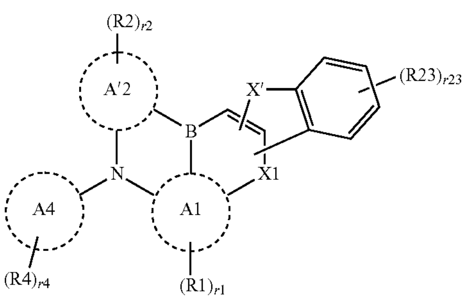

<Chemical Formula 1-9>

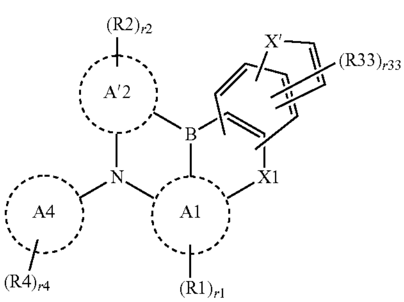

<Chemical Formula 1-10>

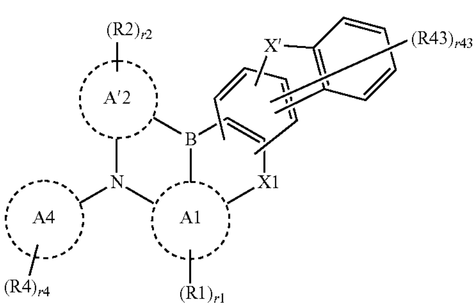

wherein in Chemical Formulae 1-3 to 1-10:

the definitions of X1, A1, A4, R1 to R4, and r1 to r4 are the same as those defined in Chemical Formula 1;

R12, R13, R22, R23, R32, R33, R42, and R43 are the same as each other, and are each independently hydrogen, deuterium, a halogen group, a cyano group, a substituted or unsubstituted alkyl group, a substituted or unsubstituted alkoxy group, a substituted or unsubstituted aryloxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group; a substituted or unsubstituted aryl group, or a substituted or unsubstituted heterocyclic group, or the group of Chemical Formula 2, or adjacent groups are bonded to each other to form a substituted or unsubstituted ring;

r12 and r13 are each 1 or 2;

r22, r23, r32, and r33 are each an integer from 1 to 4;

r42 and r43 are each an integer from 1 to 6;

when r12 and r13 are each 2, two structures in the parenthesis are the same as or different from each other;

when r22, r23, r32, r33, r42, and r43 are each 2 or higher, two or more structures in the parenthesis are the same as or different from each other;

X and X' are the same as or different from each other, and are each independently O or S; and A'2 and A'3 are the same as or different from each other, and are each independently an aromatic hydrocarbon ring.

According to an exemplary embodiment of the present specification, Chemical Formula 1 is any one of the following Chemical Formulae 1-11 to 1-26:

<Chemical Formula 1-11>

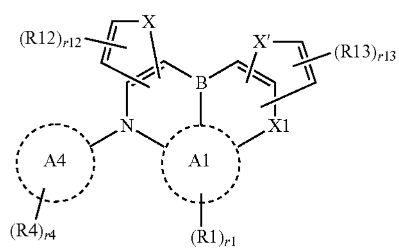

<Chemical Formula 1-12>

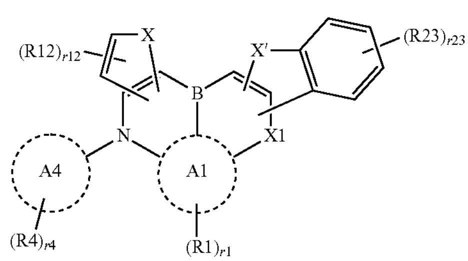

<Chemical Formula 1-13>

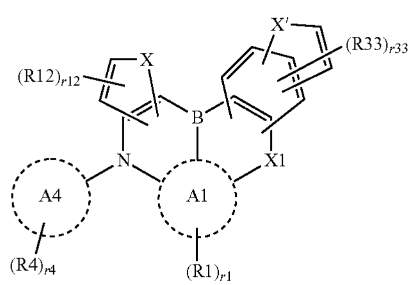

-continued
<Chemical Formula 1-14>
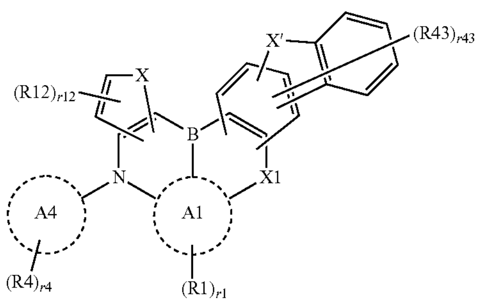
<Chemical Formula 1-15>
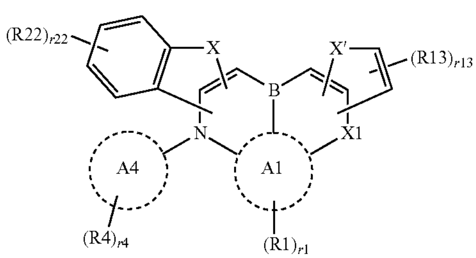
<Chemical Formula 1-16>
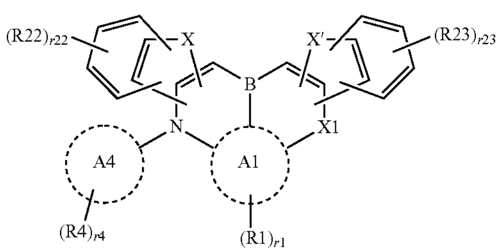
<Chemical Formula 1-17>
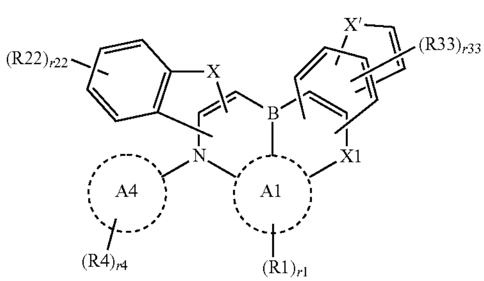
<Chemical Formula 1-18>
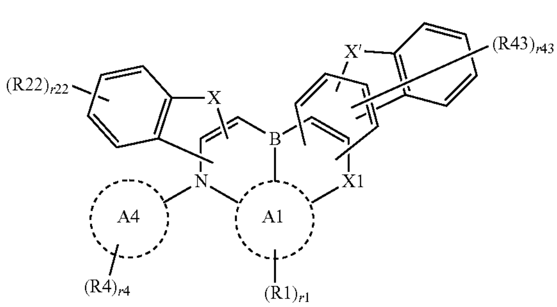
-continued
<Chemical Formula 1-19>
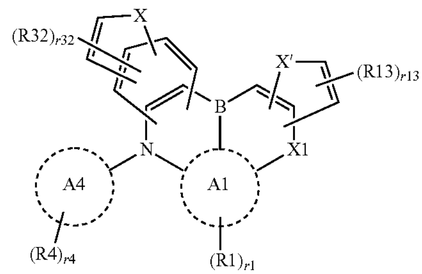
<Chemical Formula 1-20>
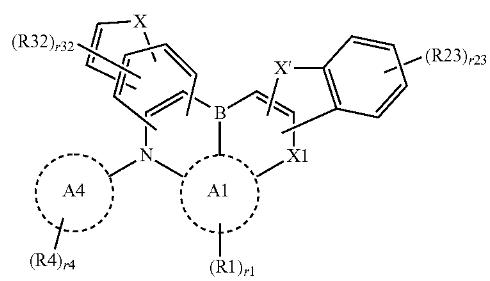
<Chemical Formula 1-21>
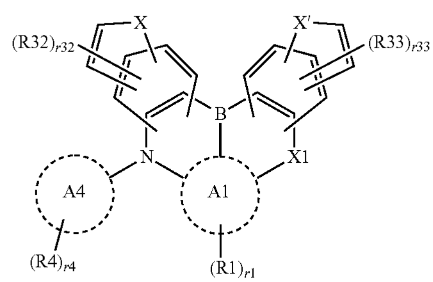
<Chemical Formula 1-22>
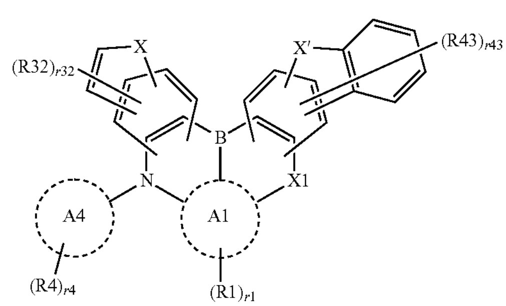
<Chemical Formula 1-23>
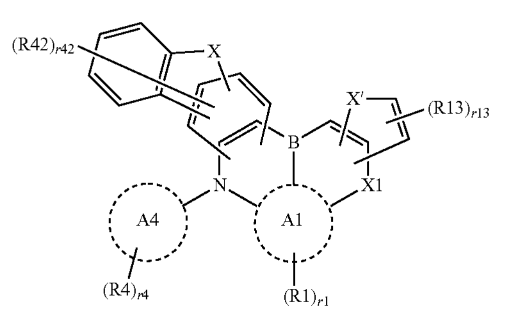

-continued

<Chemical Formula 1-24>

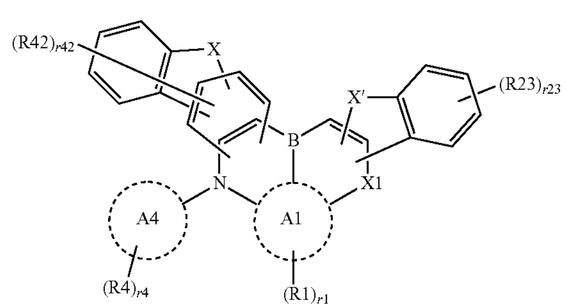

<Chemical Formula 1-25>

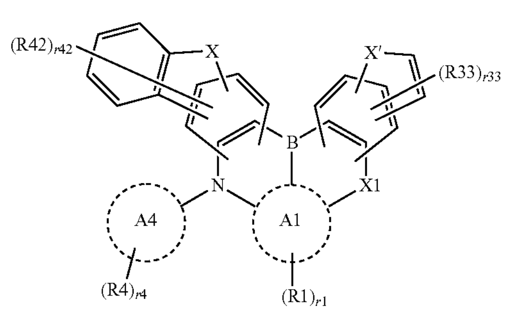

<Chemical Formula 1-26>

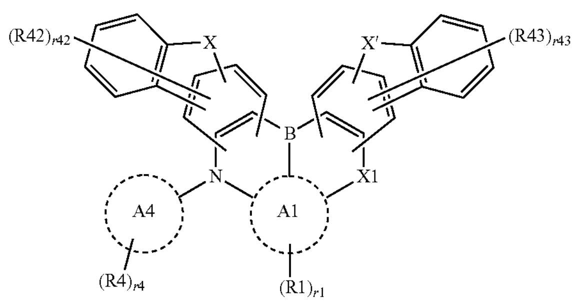

wherein in Chemical Formulae 1-11 to 1-26:

the definitions of X1, A1, A4, R1, R4, r1, and r4 are the same as those defined in Chemical Formula 1;

R12, R13, R22, R23, R32, R33, R42, and R43 are the same as each other, and are each independently hydrogen, deuterium, a halogen group, a cyano group, a substituted or unsubstituted alkyl group, a substituted or unsubstituted alkoxy group, a substituted or unsubstituted aryloxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted heterocyclic group, or the group of Chemical Formula 2, or adjacent groups are bonded to each other to form a substituted or unsubstituted ring;

r12 and r13 are each 1 or 2;

r22, r23, r32, and r33 are each an integer from 1 to 4;

r42 and r43 are each an integer from 1 to 6;

when r12 and r13 are each 2, two structures in the parenthesis are the same as or different from each other;

when r22, r23, r32, r33, r42, and r43 are each 2 or higher, two or more structures in the parenthesis are the same as or different from each other; and X and X' are the same as or different from each other, and are each independently O or S.

According to another exemplary embodiment of the present specification, X is O.

According to still another exemplary embodiment of the present specification, X' is O.

According to yet another exemplary embodiment of the present specification, X is S.

According to still yet another exemplary embodiment of the present specification, X' is S.

According to further exemplary embodiment of the present specification, X is O, and X' is O.

According to another further exemplary embodiment of the present specification, X is O, and X' is S.

According to still another further exemplary embodiment of the present specification, X is S, and X' is O.

According to yet another further exemplary embodiment of the present specification, X is S, and X' is S.

According to an exemplary embodiment of the present specification, in Chemical Formula 1, A1 is a monocyclic or polycyclic aromatic hydrocarbon ring having 6 to 30 carbon atoms; or a monocyclic or polycyclic heterocyclic ring having 2 to 30 carbon atoms.

According to an exemplary embodiment of the present specification, in Chemical Formula 1, A1 is a monocyclic or polycyclic aromatic hydrocarbon ring having 6 to 20 carbon atoms; or a monocyclic or polycyclic heterocyclic ring having 2 to 20 carbon atoms.

According to an exemplary embodiment of the present specification, in Chemical Formula 1, A1 is a benzene ring.

According to an exemplary embodiment of the present specification, in Chemical Formula 1, at least one of A2 and A3 is a monocyclic or polycyclic hetero ring that includes S or O and having 2 to 30 carbon atoms, and the other is a monocyclic or polycyclic aromatic hydrocarbon ring having 6 to 30 carbon atoms.

According to an exemplary embodiment of the present specification, in Chemical Formula 1, at least one of A2 and A3 is a monocyclic or polycyclic hetero ring that includes S or O and having 2 to 20 carbon atoms, and the other is a monocyclic or polycyclic aromatic hydrocarbon ring having 6 to 20 carbon atoms According to an exemplary embodiment of the present specification, in Chemical Formula 1, at least one of A2 and A3 is a monocyclic or bicyclic hetero ring that includes S or O and having 2 to 10 carbon atoms, and the other is a monocyclic or polycyclic aromatic hydrocarbon ring having 6 to 12 carbon atoms According to an exemplary embodiment of the present specification, in Chemical Formula 1, at least one of A2 and A3 is a furan ring, a benzofuran ring, a dibenzofuran ring, a thiophene ring, a benzothiophene ring, or a dibenzothiophene ring, and the other is a benzene ring or a fluorene ring.

According to an exemplary embodiment of the present specification, A4 and A5 are the same as or different from each other, and are each independently a straight-chained or branched alkyl group having 1 to 30 carbon atoms, a monocyclic or polycyclic cycloalkyl group having 3 to 30 carbon atoms, a monocyclic or polycyclic aryl group having 6 to 30 carbon atoms, or a monocyclic or polycyclic heterocyclic group having 2 to 30 carbon atoms.

According to an exemplary embodiment of the present specification, A4 and A5 are the same as or different from each other, and are each independently a straight-chained or branched alkyl group having 1 to 20 carbon atoms, a monocyclic or polycyclic cycloalkyl group having 3 to 20 carbon atoms, a monocyclic or polycyclic aryl group having 6 to 20 carbon atoms, or a monocyclic or polycyclic heterocyclic group having 2 to 20 carbon atoms.

According to an exemplary embodiment of the present specification, A4 and A5 are the same as or different from each other, and are each independently a phenyl group, a biphenyl group, a terphenyl group, a naphthyl group, a fluorene group, a triphenylene group, a tert-butyl group, an adamantyl group, a benzofuran group, or a dibenzothiophene group.

According to an exemplary embodiment of the present specification, adjacent two or more of A1 to A5 are bonded to each other to form a substituted or unsubstituted hetero ring.

According to an exemplary embodiment of the present specification, adjacent two or more of A1 to A5 are bonded to each other to form a substituted or unsubstituted monocyclic or polycyclic hetero ring having 2 to 30 carbon atoms.

According to an exemplary embodiment of the present specification, adjacent two or more of A1 to A5 are bonded to each other to form the ring represented by Chemical Formula 1.

According to an exemplary embodiment of the present specification, adjacent two or more of A1 to A5 are bonded to each other to form any one ring structure of the following Group A:

<Group A>

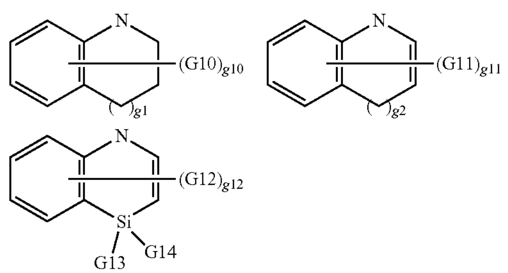

wherein in the structures:

G10 to G14 are the same as or different from each other, and are each independently hydrogen, deuterium, a halogen group, a cyano group, a substituted or unsubstituted alkyl group, a substituted or unsubstituted alkoxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted heterocyclic group, or are bonded to an adjacent group to form a substituted or unsubstituted ring;

g10 is an integer from 1 to 10;

g11 is an integer from 1 to 8;

g12 is an integer from 1 to 6;

when g10 to g12 are each 2 or higher, two or more structures in the parenthesis are the same as or different from each other;

g1 is 0 or 1;

when g1 is 0, structures in the parenthesis are directly bonded to each other without a carbon atom;

g2 is 0 or 1; and when g2 is 0, structures in the parenthesis are directly bonded to each other without a carbon atom.

According to an exemplary embodiment of the present specification, adjacent two or more of A1 to A5 are bonded to each other to form any one ring structure of the following Group B:

<Group B>

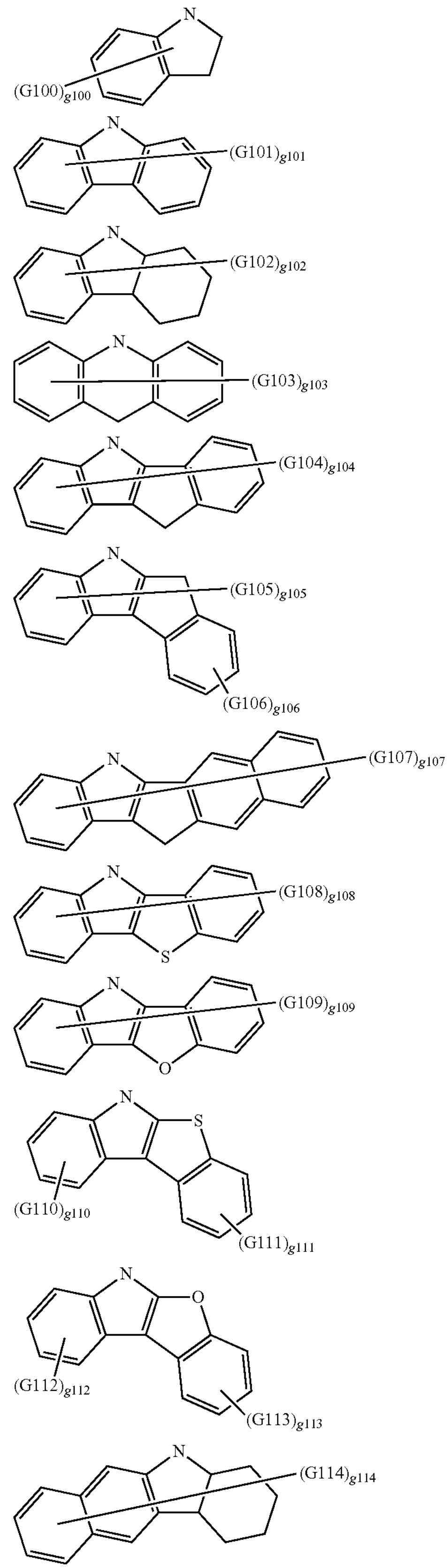

-continued

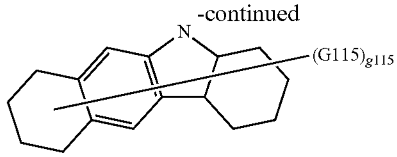

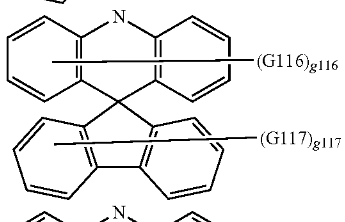

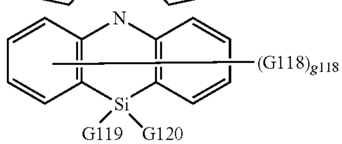

wherein in the structures:

G100 to G120 are the same as or different from each other, and are each independently hydrogen, deuterium, a halogen group, a cyano group, a substituted or unsubstituted alkyl group, a substituted or unsubstituted alkoxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted hetero ring;

g100, g101, g108, g109, and g116 to g118 are each an integer from 1 to 8;

g102 and g107 are each an integer from 1 to 12;

g103 and g104 are each an integer from 1 to 10;

g105 and g110 to g113 are each an integer from 1 to 4;

g114 is an integer from 1 to 14;

g115 is an integer from 1 to 18; and when g100 to g118 are each 2 or higher, two or more structures in the parenthesis are the same as or different from each other.

According to an exemplary embodiment of the present specification, G100 to G120 are the same as or different from each other, and are each independently hydrogen, deuterium, a substituted or unsubstituted alkyl group, a substituted or unsubstituted cycloalkyl group, a substituted or unsubstituted silyl group, or a substituted or unsubstituted aryl group.

According to an exemplary embodiment of the present specification, G100 to G120 are the same as or different from each other, and are each independently hydrogen, deuterium, a substituted or unsubstituted straight-chained or branched alkyl group having 1 to 30 carbon atoms, a substituted or unsubstituted monocyclic or polycyclic cycloalkyl group having 3 to 30 carbon atoms, a substituted or unsubstituted straight-chained or branched alkylsilyl group having 1 to 30 carbon atoms, or a substituted or unsubstituted monocyclic or polycyclic aryl group having 6 to 30 carbon atoms.

According to an exemplary embodiment of the present specification, G100 to G120 are the same as or different from each other, and are each independently hydrogen, deuterium, a substituted or unsubstituted straight-chained or branched alkyl group having 1 to 20 carbon atoms, a substituted or unsubstituted monocyclic or polycyclic cycloalkyl group having 3 to 20 carbon atoms, a substituted or unsubstituted straight-chained or branched alkylsilyl group having 1 to 20 carbon atoms, or a substituted or unsubstituted monocyclic or polycyclic aryl group having 6 to 20 carbon atoms.

According to an exemplary embodiment of the present specification, G100 to G120 are the same as or different from each other, and are each independently hydrogen; deuterium; a straight-chained or branched alkyl group having 1 to 30 carbon atoms, which is unsubstituted or substituted with deuterium; a monocyclic or polycyclic cycloalkyl group having 3 to 30 carbon atoms, which is unsubstituted or substituted with deuterium; a straight-chained or branched alkylsilyl group having 1 to 30 carbon atoms, which is unsubstituted or substituted with deuterium; or a monocyclic or polycyclic aryl group having 6 to 30 carbon atoms, which is unsubstituted or substituted with deuterium.

According to an exemplary embodiment of the present specification, G100 to G120 are the same as or different from each other, and are each independently hydrogen; deuterium; a straight-chained or branched alkyl group having 1 to 20 carbon atoms, which is unsubstituted or substituted with deuterium; a monocyclic or polycyclic cycloalkyl group having 3 to 20 carbon atoms, which is unsubstituted or substituted with deuterium; a straight-chained or branched alkylsilyl group having 1 to 20 carbon atoms, which is unsubstituted or substituted with deuterium; or a monocyclic or polycyclic aryl group having 6 to 20 carbon atoms, which is unsubstituted or substituted with deuterium.

According to an exemplary embodiment of the present specification, G100 to G120 are the same as or different from each other, and are each independently hydrogen, deuterium, a methyl group, —$CD_3$, a tert-butyl group, a cyclohexyl group, a trimethylsilyl group, or a phenyl group which is unsubstituted or substituted with deuterium.

According to an exemplary embodiment of the present specification, A1 and Ar4 are bonded to each other to form a substituted or unsubstituted hetero ring.

According to an exemplary embodiment of the present specification, A1 and A4 are bonded to each other to form a substituted or unsubstituted monocyclic or polycyclic hetero ring having 2 to 30 carbon atoms.

According to an exemplary embodiment of the present specification, A1 and A4 are bonded to each other to form the ring represented by Chemical Formula 1.

According to an exemplary embodiment of the present specification, A1 and A4 are bonded to each other to form any one of the ring structures of Group A and Group B.

According to an exemplary embodiment of the present specification, A1 and A5 are bonded to each other to form a substituted or unsubstituted hetero ring.

According to an exemplary embodiment of the present specification, A1 and A5 are bonded to each other to form a substituted or unsubstituted monocyclic or polycyclic hetero ring having 2 to 30 carbon atoms.

According to an exemplary embodiment of the present specification, A1 and A5 are bonded to each other to form the ring of Chemical Formula 1.

According to an exemplary embodiment of the present specification, A1 and A5 are bonded to each other to form any one of the ring structures of Group A and Group B.

According to an exemplary embodiment of the present specification, A2 and Ar4 are bonded to each other to form a substituted or unsubstituted hetero ring.

According to an exemplary embodiment of the present specification, A2 and A4 are bonded to each other to form a substituted or unsubstituted monocyclic or polycyclic hetero ring having 2 to 30 carbon atoms.

According to an exemplary embodiment of the present specification, A2 and A4 are bonded to each other to form the ring of Chemical Formula 1.

According to an exemplary embodiment of the present specification, A2 and A4 are bonded to each other to form any one of the ring structures of Group A and Group B.

According to an exemplary embodiment of the present specification, A3 and A5 are bonded to each other to form a substituted or unsubstituted hetero ring.

According to an exemplary embodiment of the present specification, A3 and A5 are bonded to each other to form a substituted or unsubstituted monocyclic or polycyclic hetero ring having 2 to 30 carbon atoms.

According to an exemplary embodiment of the present specification, A3 and A5 are bonded to each other to form the ring of Chemical Formula 1.

According to an exemplary embodiment of the present specification, A3 and A5 are bonded to each other to form any one of the ring structures of Group A and Group B.

According to an exemplary embodiment of the present specification, any one or more of adjacent two of R2's, adjacent two of R3's, adjacent two of R4's, adjacent two of R5's, adjacent two of R6's, and adjacent two of R7's are bonded to each other to form a substituted or unsubstituted hydrocarbon ring, or a substituted or unsubstituted hetero ring.

According to an exemplary embodiment of the present specification, any one or more of adjacent two of R2's, adjacent two of R3, adjacent two of R4's, adjacent two of R5's, adjacent two of R6's, and adjacent two of R7's are bonded to each other to form a substituted or unsubstituted monocyclic or polycyclic hydrocarbon ring having 3 to 30 carbon atoms; or a substituted or unsubstituted monocyclic or polycyclic hetero ring having 2 to 30 carbon atoms.

According to an exemplary embodiment of the present specification, any one or more of adjacent two of R2's, adjacent two of R3's, adjacent two of R4's, adjacent two of R5's, adjacent two of R6's, and adjacent two of R7's are bonded to each other to form a substituted or unsubstituted monocyclic or polycyclic aliphatic, aromatic, or aliphatic and aromatic fused hydrocarbon ring having 3 to 30 carbon atoms; or a substituted or unsubstituted monocyclic or polycyclic aliphatic hetero ring having 2 to 30 carbon atoms.

According to an exemplary embodiment of the present specification, any one or more of adjacent two of R2's, adjacent two of R3's, adjacent two of R4's, adjacent two of R5's, adjacent two of R6's, and adjacent two of R7's are bonded to each other to form a monocyclic or polycyclic aliphatic, aromatic, or aliphatic and aromatic fused hydrocarbon ring having 3 to 30 carbon atoms, which is unsubstituted or substituted with deuterium or a straight-chained or branched alkyl group having 1 to 30 carbon atoms, which is unsubstituted or substituted with deuterium; or a monocyclic or polycyclic aliphatic hetero ring having 2 to 30 carbon atoms, which is unsubstituted or substituted with deuterium, or a straight-chained or branched alkyl group having 1 to 30 carbon atoms, which is unsubstituted or substituted with deuterium.

According to an exemplary embodiment of the present specification, any one or more of adjacent two of R2's, adjacent two of R3's, adjacent two of R4's, adjacent two of R5's, adjacent two of R6's, and adjacent two of R7's are bonded to each other to form a cyclopentane ring, a cyclohexane ring, a cycloheptane ring, a bicyclo[2.2.1]octane ring, a norbornane ring, an adamantane ring; an indene ring, a phenanthrene ring, a tetrahydrofuran ring, a tetrahydrothiophene ring, a pyrrolidine ring, an octahydrobenzofuran ring; an octahydrobenzothiophene ring, or an octahydroindene ring, and the ring is unsubstituted or substituted with deuterium, a methyl group substituted with deuterium, or an unsubstituted methyl group.

According to an exemplary embodiment of the present specification, R1 is a substituted or unsubstituted alkyl group, a substituted or unsubstituted haloalkyl group, a substituted or unsubstituted cycloalkyl group, or a polycyclic heterocyclic group which is substituted or unsubstituted and includes N, or the group of Chemical Formula 2.

According to an exemplary embodiment of the present specification, R1 is a substituted or unsubstituted straight-chained or branched alkyl group having 1 to 30 carbon atoms, a substituted or unsubstituted straight-chained or branched haloalkyl group having 1 to 30 carbon atoms, a substituted or unsubstituted monocyclic or polycyclic cycloalkyl group having 3 to 30 carbon atoms, a polycyclic heterocyclic group having 2 to 30 carbon atoms, which is substituted or unsubstituted and includes N, or the group of Chemical Formula 2.

According to an exemplary embodiment of the present specification, R1 is a substituted or unsubstituted straight-chained or branched alkyl group having 1 to 20 carbon atoms, a substituted or unsubstituted straight-chained or branched haloalkyl group having 1 to 20 carbon atoms, a substituted or unsubstituted monocyclic or polycyclic cycloalkyl group having 3 to 20 carbon atoms, a polycyclic heterocyclic group having 2 to 30 carbon atoms, which is substituted or unsubstituted and includes N, or the group of Chemical Formula 2.

According to an exemplary embodiment of the present specification, R1 is a straight-chained or branched alkyl group having 1 to 30 carbon atoms, which is unsubstituted or substituted with deuterium, a straight-chained or branched haloalkyl group having 1 to 30 carbon atoms, a monocyclic or polycyclic cycloalkyl group having 3 to 30 carbon atoms, a polycyclic heterocyclic group having 2 to 30 carbon atoms, which is substituted or unsubstituted and includes N, or the group of Chemical Formula 2.

According to an exemplary embodiment of the present specification, R1 is a straight-chained or branched alkyl group having 1 to 20 carbon atoms, which is unsubstituted or substituted with deuterium, a straight-chained or branched haloalkyl group having 1 to 20 carbon atoms, a monocyclic or polycyclic cycloalkyl group having 3 to 20 carbon atoms, a polycyclic heterocyclic group having 2 to 30 carbon atoms, which is substituted or unsubstituted and includes N, or the group of Chemical Formula 2.

According to an exemplary embodiment of the present specification, R1 is a methyl group, $—CD_3$, $—OCF_3$, a tert-butyl group, a cyclohexyl group, an adamantyl group, a polycyclic heterocyclic group having 2 to 30 carbon atoms, which is substituted or unsubstituted and includes N, or the group of Chemical Formula 2.

According to an exemplary embodiment of the present specification, R1 is a methyl group, a tert-butyl group, a cyclohexyl group, an adamantyl group, a polycyclic heterocyclic group having 2 to 30 carbon atoms, which includes N, or the group of Chemical Formula 2, and the tert-butyl group, the cyclohexyl group, the adamantyl group, the polycyclic heterocyclic group having 2 to 30 carbon atoms, which includes N, or the group of Chemical Formula 2, is substituted with deuterium.

According to an exemplary embodiment of the present specification, R1 includes deuterium.

According to an exemplary embodiment of the present specification, the polycyclic heterocyclic group having 2 to 30 carbon atoms, which includes N is a group of any one of structures of the following Group C:

<Group C>

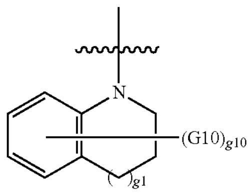

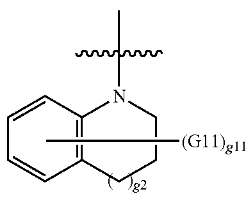

wherein in the structures:

G10 and G11 are the same as or different from each other, and are each independently hydrogen, deuterium, a halogen group, a cyano group, a substituted or unsubstituted alkyl group, a substituted or unsubstituted alkoxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted heterocyclic group, or are bonded to an adjacent group to form a substituted or unsubstituted ring;

g10 is an integer from 1 to 10;

g11 is an integer from 1 to 8;

when g10 and g11 are each 2 or higher, two or more structures in the parenthesis are the same as or different from each other;

g1 is 0 or 1;

when g1 is 0, structures in the parenthesis are directly bonded to each other without a carbon atom;

g2 is 0 or 1;

when g2 is 0, structures in the parenthesis are directly bonded to each other without a carbon atom;

and

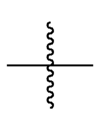

is a moiety bonded to Chemical Formula 1.

According to an exemplary embodiment of the present specification, the polycyclic heterocyclic group having 2 to 30 carbon atoms, which includes N is a group of any one of the structures of the following Group D:

<Group D>

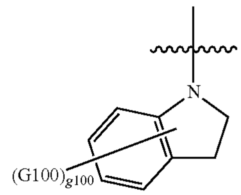

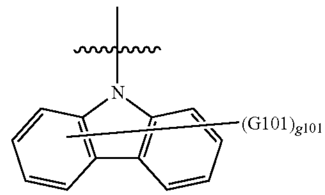

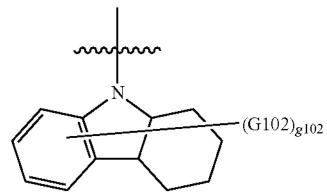

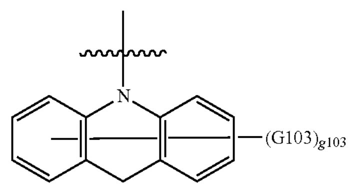

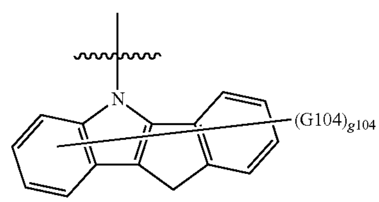

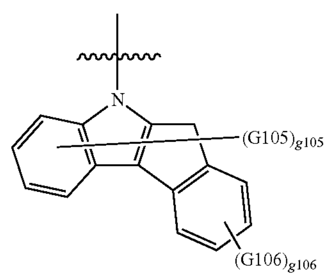

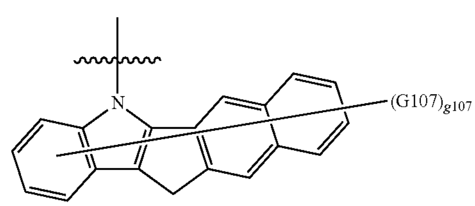

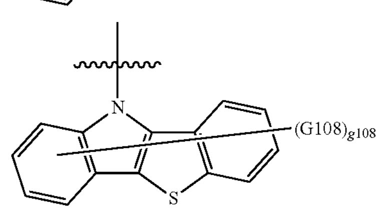

-continued

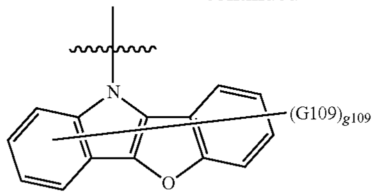

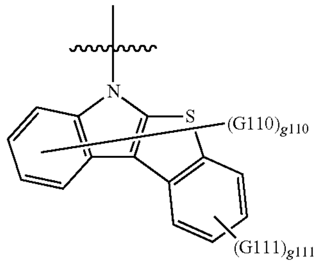

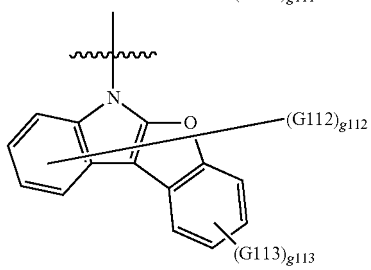

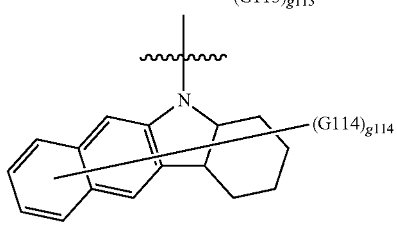

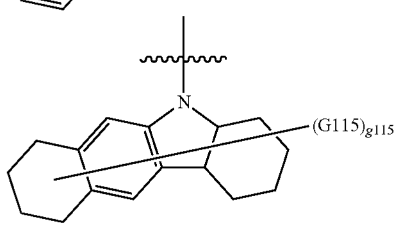

wherein in the structures:

G100 to G115 are the same as or different from each other, and are each independently hydrogen, deuterium, a halogen group, a cyano group, a substituted or unsubstituted alkyl group, a substituted or unsubstituted alkoxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted hetero ring;

g100, g101, g108, and g109 are each an integer from 1 to 8;

g102 and g107 are each an integer from 1 to 12;

g103 and g104 are each an integer from 1 to 10;

g105 and g110 to g113 are each an integer from 1 to 4;

g114 is an integer from 1 to 14;

g115 is an integer from 1 to 18;

when g100 to g115 are each 2 or higher, two or more structures in the parenthesis are the same as or different from each other; and

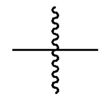

is a moiety bonded to Chemical Formula 1.

According to an exemplary embodiment of the present specification, G100 to G115 are the same as or different from each other, and are each independently hydrogen; deuterium; a substituted or unsubstituted alkyl group; a substituted or unsubstituted cycloalkyl group; a substituted or unsubstituted silyl group; or a substituted or unsubstituted aryl group.

According to an exemplary embodiment of the present specification, G100 to G115 are the same as or different from each other, and are each independently hydrogen; deuterium; a substituted or unsubstituted straight-chained or branched alkyl group having 1 to 30 carbon atoms; a substituted or unsubstituted monocyclic or polycyclic cycloalkyl group having 3 to 30 carbon atoms; a substituted or unsubstituted straight-chained or branched alkylsilyl group having 1 to 30 carbon atoms; or a substituted or unsubstituted monocyclic or polycyclic aryl group having 6 to 30 carbon atoms.

According to an exemplary embodiment of the present specification, G100 to G115 are the same as or different from each other, and are each independently hydrogen; deuterium; a substituted or unsubstituted straight-chained or branched alkyl group having 1 to 20 carbon atoms; a substituted or unsubstituted monocyclic or polycyclic cycloalkyl group having 3 to 20 carbon atoms; a substituted or unsubstituted straight-chained or branched alkylsilyl group having 1 to 20 carbon atoms; or a substituted or unsubstituted monocyclic or polycyclic aryl group having 6 to 20 carbon atoms.

According to an exemplary embodiment of the present specification, G100 to G115 are the same as or different from each other, and are each independently hydrogen; deuterium; a straight-chained or branched alkyl group having 1 to 30 carbon atoms, which is unsubstituted or substituted with deuterium; a monocyclic or polycyclic cycloalkyl group having 3 to 30 carbon atoms, which is unsubstituted or substituted with deuterium; a straight-chained or branched alkylsilyl group having 1 to 30 carbon atoms, which is unsubstituted or substituted with deuterium; or a monocyclic or polycyclic aryl group having 6 to 30 carbon atoms, which is unsubstituted or substituted with deuterium.

According to an exemplary embodiment of the present specification, G100 to G115 are the same as or different from each other, and are each independently hydrogen; deuterium; a straight-chained or branched alkyl group having 1 to 20 carbon atoms, which is unsubstituted or substituted with deuterium; a monocyclic or polycyclic cycloalkyl group having 3 to 20 carbon atoms, which is unsubstituted or substituted with deuterium; a straight-chained or branched alkylsilyl group having 1 to 20 carbon atoms, which is unsubstituted or substituted with deuterium; or a monocyclic or polycyclic aryl group having 6 to 20 carbon atoms, which is unsubstituted or substituted with deuterium.

According to an exemplary embodiment of the present specification, G100 to G115 are the same as or different from each other, and are each independently hydrogen, deuterium, a methyl group, $—CD_3$, a tert-butyl group, a cyclohexyl group, a trimethylsilyl group, or a phenyl group which is unsubstituted or substituted with deuterium.

According to an exemplary embodiment of the present specification, in Chemical Formula 2, B1 and B2 are the same as or different from each other, and are each independently an aryl group.

According to an exemplary embodiment of the present specification, in Chemical Formula 2, B1 and B2 are the same as or different from each other, and are each independently a monocyclic or polycyclic aryl group having 6 to 30 carbon atoms.

According to an exemplary embodiment of the present specification, in Chemical Formula 2, B1 and B2 are the same as or different from each other, and are each independently a monocyclic or polycyclic aryl group having 6 to 20 carbon atoms.

According to an exemplary embodiment of the present specification, in Chemical Formula 2, B1 and B2 are the same as or different from each other, and are each independently a phenyl group or a biphenyl group.

According to an exemplary embodiment of the present specification, in Chemical Formula 2, B1 and B2 are a phenyl group.

According to an exemplary embodiment of the present specification, in Chemical Formula 2, B1 and B2 are a biphenyl group.

According to an exemplary embodiment of the present specification, R2 to R7 are the same as or different from each other, and are each independently hydrogen, deuterium, a halogen group, a cyano group, a substituted or unsubstituted alkyl group, a substituted or unsubstituted cycloalkyl group, a substituted or unsubstituted silyl group, a substituted or unsubstituted aryl group, a substituted or unsubstituted arylalkyl group, or a substituted or unsubstituted heterocyclic group.

According to an exemplary embodiment of the present specification, R2 to R7 are the same as or different from each other, and are each independently hydrogen, deuterium, a halogen group, a cyano group, a substituted or unsubstituted straight-chained or branched alkyl group having 1 to 30 carbon atoms, a substituted or unsubstituted monocyclic or polycyclic cycloalkyl group having 3 to 30 carbon atoms, a substituted or unsubstituted straight-chained or branched alkylsilyl group having 1 to 30 carbon atoms, a substituted or unsubstituted monocyclic or polycyclic arylsilyl group having 6 to 30 carbon atoms, a substituted or unsubstituted monocyclic or polycyclic aryl group having 6 to 30 carbon atoms, a substituted or unsubstituted straight-chained or branched arylalkyl group having 6 to 30 carbon atoms, or a substituted or unsubstituted monocyclic or polycyclic heterocyclic group having 2 to 30 carbon atoms.

According to an exemplary embodiment of the present specification, R2 to R7 are the same as or different from each other, and are each independently hydrogen, deuterium, a halogen group, a cyano group, a substituted or unsubstituted straight-chained or branched alkyl group having 1 to 20 carbon atoms, a substituted or unsubstituted monocyclic or polycyclic cycloalkyl group having 3 to 20 carbon atoms, a substituted or unsubstituted straight-chained or branched alkylsilyl group having 1 to 20 carbon atoms, a substituted or unsubstituted monocyclic or polycyclic arylsilyl group having 6 to 20 carbon atoms, a substituted or unsubstituted monocyclic or polycyclic aryl group having 6 to 20 carbon atoms, a substituted or unsubstituted straight-chained or branched arylalkyl group having 6 to 20 carbon atoms, or a substituted or unsubstituted monocyclic or polycyclic heterocyclic group having 2 to 20 carbon atoms.

According to an exemplary embodiment of the present specification, R2 to R7 are the same as or different from each other, and are each independently hydrogen, deuterium, a halogen group, a cyano group, a straight-chained or branched alkyl group having 1 to 30 carbon atoms, a monocyclic or polycyclic cycloalkyl group having 3 to 30 carbon atoms, a straight-chained or branched alkylsilyl group having 1 to 30 carbon atoms, a monocyclic or polycyclic arylsilyl group having 6 to 30 carbon atoms, a monocyclic or polycyclic aryl group having 6 to 30 carbon atoms, a straight-chained or branched arylalkyl group having 6 to 30 carbon atoms, a monocyclic or polycyclic heterocyclic group having 2 to 30 carbon atoms, and the substituent is unsubstituted or substituted with one or more selected from the group consisting of deuterium, a halogen group, a straight-chained or branched alkyl group having 1 to 30 carbon atoms, which is unsubstituted or substituted with deuterium, and a straight-chained or branched haloalkyl group having 1 to 30 carbon atoms.

According to an exemplary embodiment of the present specification, R2 to R7 are the same as or different from each other, and are each independently hydrogen; deuterium; a halogen group; a cyano group; a straight-chained or branched alkyl group having 1 to 20 carbon atoms; a monocyclic or polycyclic cycloalkyl group having 3 to 20 carbon atoms; a straight-chained or branched alkylsilyl group having 1 to 20 carbon atoms; a monocyclic or polycyclic arylsilyl group having 6 to 20 carbon atoms; a monocyclic or polycyclic aryl group having 6 to 20 carbon atoms; a straight-chained or branched arylalkyl group having 6 to 20 carbon atoms; a monocyclic or polycyclic heterocyclic group having 2 to 20 carbon atoms, and the substituent is unsubstituted or substituted with one or more selected from the group consisting of deuterium, a halogen group, a straight-chained or branched alkyl group having 1 to 20 carbon atoms, which is unsubstituted or substituted with deuterium, and a straight-chained or branched haloalkyl group having 1 to 20 carbon atoms.

According to an exemplary embodiment of the present specification, R2 to R7 are the same as or different from each other, and are each independently hydrogen; deuterium; —F; a cyano group; —$CD_3$; a methyl group; an iso-propyl group; a tert-butyl group; a cyclohexyl group; an adamantyl group; a cumyl group; a phenyl group; a biphenyl group; a naphthyl group; a trimethylsilyl group; a triphenylsilyl group; a pyridine group; a triazine group; or a carbazole group, and the substituent is unsubstituted or substituted with one or more selected from the group consisting of deuterium, —F, —$CF_3$, —$CD_3$, and a tert-butyl group which is unsubstituted or substituted with deuterium.

The cumyl group means

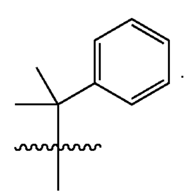 [SMILES: *C(C)(C)c1ccccc1]

According to an exemplary embodiment of the present specification, R2 includes deuterium.

According to an exemplary embodiment of the present specification, R2 is deuterium, —F, a cyano group, —$CD_3$, a methyl group, an iso-propyl group, a tert-butyl group, a cyclohexyl group, an adamantyl group, a cumyl group, a phenyl group, a biphenyl group, a naphthyl group, a trimethylsilyl group, a triphenylsilyl group, a pyridine group, a triazine group, or a carbazole group, and the methyl group, the iso-propyl group, the tert-butyl group, the cyclohexyl group, the adamantyl group, the cumyl group, the phenyl group, the biphenyl group, the naphthyl group, the trimethylsilyl group, the triphenylsilyl group, the pyridine group, the triazine group, or the carbazole group is substituted with deuterium.

According to an exemplary embodiment of the present specification, R6 and R7 are bonded to each other to form any one of the ring structures of Group A:

<Group A>

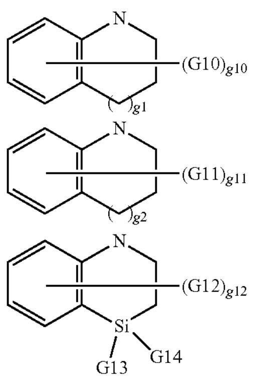

wherein in the structures:

G10 to G14 are the same as or different from each other, and are each independently hydrogen, deuterium, a halogen group, a cyano group, a substituted or unsubstituted alkyl group, a substituted or unsubstituted alkoxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted heterocyclic group, or are bonded to an adjacent group to form a substituted or unsubstituted ring;

g10 is an integer from 1 to 10;

g11 is an integer from 1 to 8;

g12 is an integer from 1 to 6;

when g10 to g12 are each 2 or higher, two or more structures in the parenthesis are the same as or different from each other;

g1 is 0 or 1;

when g1 is 0, structures in the parenthesis are directly bonded to each other without a carbon atom, g2 is 0 or 1; and when g2 is 0, structures in the parenthesis are directly bonded to each other without a carbon atom.

According to an exemplary embodiment of the present specification, R6 and R7 are bonded to each other to form any one of the ring structures of Group B:

<Group B>

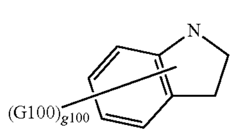

-continued

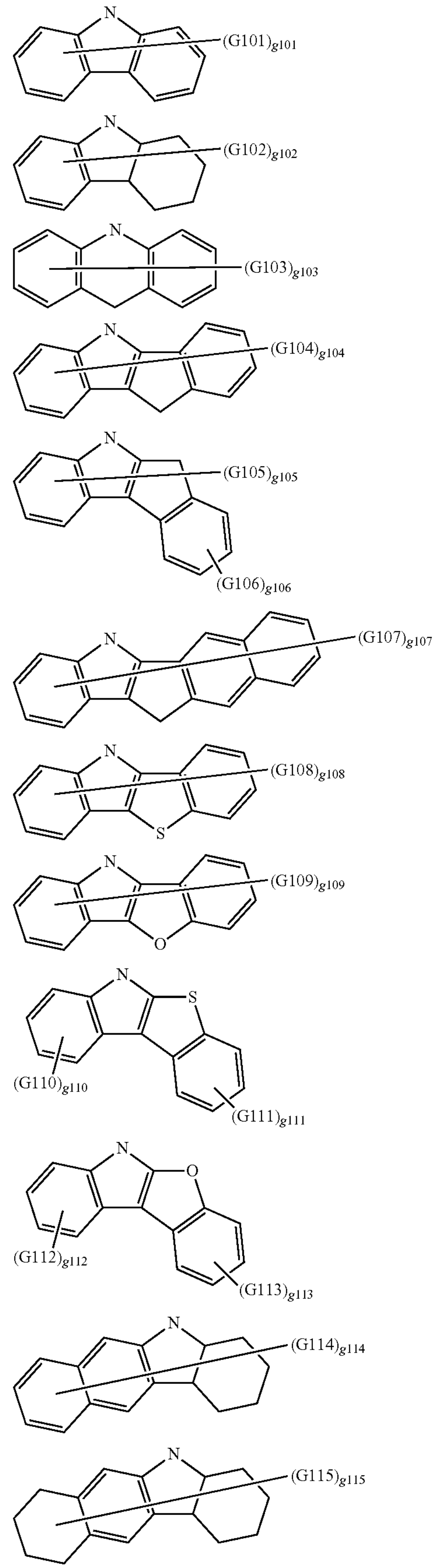

-continued

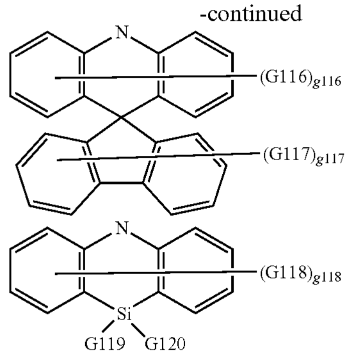

wherein in the structures:

G100 to G120 are the same as or different from each other, and are each independently hydrogen, deuterium, a halogen group, a cyano group, a substituted or unsubstituted alkyl group, a substituted or unsubstituted alkoxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted hetero ring;

g100, g101, g108, g109, and g116 to g118 are each an integer from 1 to 8;

g102 and g107 are each an integer from 1 to 12;

g103 and g104 are each an integer from 1 to 10;

g105 and g110 to g113 are each an integer from 1 to 4;

g114 is an integer from 1 to 14;

g115 is an integer from 1 to 18; and when g100 to g118 are each 2 or higher, two or more structures in the parenthesis are the same as or different from each other.

According to an exemplary embodiment of the present specification, G100 to G120 are the same as or different from each other, and are each independently hydrogen, deuterium, a substituted or unsubstituted alkyl group, a substituted or unsubstituted cycloalkyl group, a substituted or unsubstituted silyl group, or a substituted or unsubstituted aryl group.

According to an exemplary embodiment of the present specification, G100 to G120 are the same as or different from each other, and are each independently hydrogen, deuterium, a substituted or unsubstituted straight-chained or branched alkyl group having 1 to 30 carbon atoms, a substituted or unsubstituted monocyclic or polycyclic cycloalkyl group having 3 to 30 carbon atoms, a substituted or unsubstituted straight-chained or branched alkylsilyl group having 1 to 30 carbon atoms, or a substituted or unsubstituted monocyclic or polycyclic aryl group having 6 to 30 carbon atoms.

According to an exemplary embodiment of the present specification, G100 to G120 are the same as or different from each other, and are each independently hydrogen, deuterium, a substituted or unsubstituted straight-chained or branched alkyl group having 1 to 20 carbon atoms, a substituted or unsubstituted monocyclic or polycyclic cycloalkyl group having 3 to 20 carbon atoms, a substituted or unsubstituted straight-chained or branched alkylsilyl group having 1 to 20 carbon atoms, or a substituted or unsubstituted monocyclic or polycyclic aryl group having 6 to 20 carbon atoms.

According to an exemplary embodiment of the present specification, G100 to G120 are the same as or different from each other, and are each independently hydrogen; deuterium; a straight-chained or branched alkyl group having 1 to 30 carbon atoms, which is unsubstituted or substituted with deuterium; a monocyclic or polycyclic cycloalkyl group having 3 to 30 carbon atoms, which is unsubstituted or substituted with deuterium; a straight-chained or branched alkylsilyl group having 1 to 30 carbon atoms, which is unsubstituted or substituted with deuterium; or a monocyclic or polycyclic aryl group having 6 to 30 carbon atoms, which is unsubstituted or substituted with deuterium.

According to an exemplary embodiment of the present specification, G100 to G120 are the same as or different from each other, and are each independently hydrogen; deuterium; a straight-chained or branched alkyl group having 1 to 20 carbon atoms, which is unsubstituted or substituted with deuterium; a monocyclic or polycyclic cycloalkyl group having 3 to 20 carbon atoms, which is unsubstituted or substituted with deuterium; a straight-chained or branched alkylsilyl group having 1 to 20 carbon atoms, which is unsubstituted or substituted with deuterium; or a monocyclic or polycyclic aryl group having 6 to 20 carbon atoms, which is unsubstituted or substituted with deuterium.

According to an exemplary embodiment of the present specification, G100 to G120 are the same as or different from each other, and are each independently hydrogen, deuterium, a methyl group, —$CD_3$, a tert-butyl group, a cyclohexyl group, a trimethylsilyl group, or a phenyl group which is unsubstituted or substituted with deuterium.

According to an exemplary embodiment of the present specification, at least one of R1 to R7 is a group of any one of the structures of Group C:

<Group C>

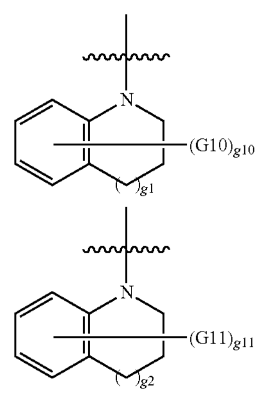

wherein in the structures:

G10 and G11 are the same as or different from each other, and are each independently hydrogen, deuterium, a halogen group, a cyano group, a substituted or unsubstituted alkyl group, a substituted or unsubstituted alkoxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted heterocyclic group, or are bonded to an adjacent group to form a substituted or unsubstituted ring;

g10 is an integer from 1 to 10;

g11 an integer from 1 to 8;

when g10 and g11 are each 2 or higher, two or more structures in the parenthesis are the same as or different from each other;

g1 is 0 or 1;

when g1 is 0, structures in the parenthesis are directly bonded to each other without a carbon atom;

g2 is 0 or 1;

when g2 is 0, structures in the parenthesis are directly bonded to each other without a carbon atom;

and

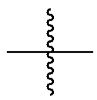

is a moiety bonded to Chemical Formula 1.

According to an exemplary embodiment of the present specification, at least one of R1 to R7 is a group of any one of the structures of Group D:

<Group D>

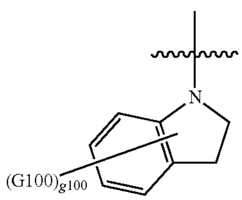

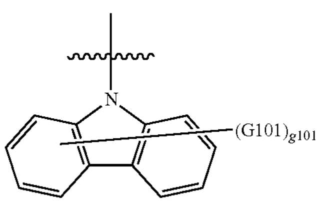

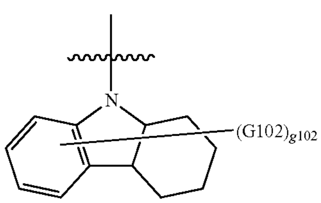

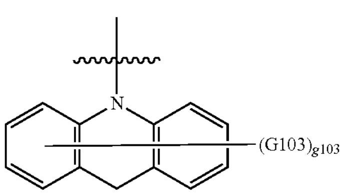

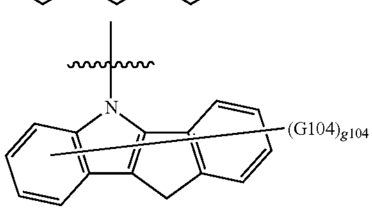

-continued

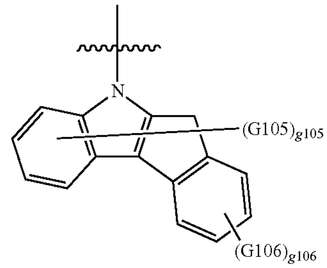

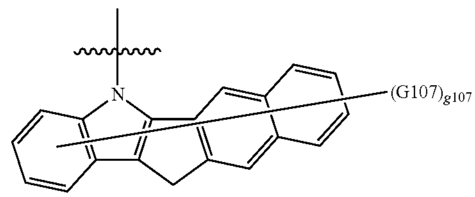

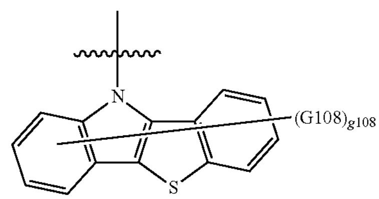

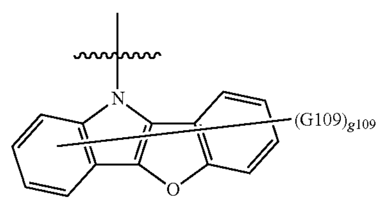

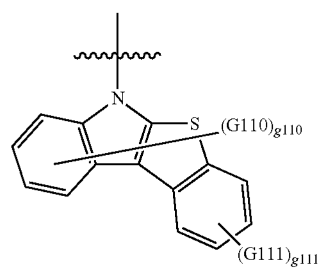

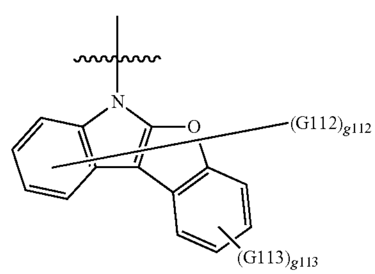

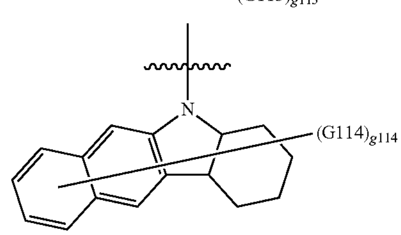

-continued

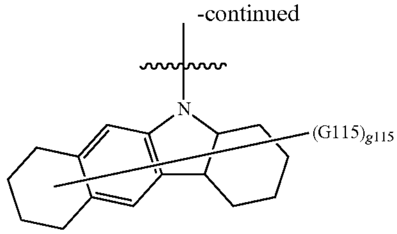

wherein in the structures:

G100 to G115 are the same as or different from each other, and are each independently hydrogen, deuterium, a halogen group, a cyano group, a substituted or unsubstituted alkyl group, a substituted or unsubstituted alkoxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted hetero ring;

g100, g101, g108, and g109 are each an integer from 1 to 8;

g102 and g107 are each an integer from 1 to 12;

g103 and g104 are each an integer from 1 to 10;

g105 and g110 to g113 are each an integer from 1 to 4;

g114 is an integer from 1 to 14;

g115 is an integer from 1 to 18;

when g100 to g115 are each 2 or higher, two or more structures in the parenthesis are the same as or different from each other; and

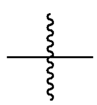

is a moiety bonded to Chemical Formula 1.

According to an exemplary embodiment of the present specification, G100 to G115 are the same as or different from each other, and are each independently hydrogen, deuterium, a substituted or unsubstituted alkyl group, a substituted or unsubstituted cycloalkyl group, a substituted or unsubstituted silyl group, or a substituted or unsubstituted aryl group.

According to an exemplary embodiment of the present specification, G100 to G115 are the same as or different from each other, and are each independently hydrogen, deuterium, a substituted or unsubstituted straight-chained or branched alkyl group having 1 to 30 carbon atoms, a substituted or unsubstituted monocyclic or polycyclic cycloalkyl group having 3 to 30 carbon atoms, a substituted or unsubstituted straight-chained or branched alkylsilyl group having 1 to 30 carbon atoms, or a substituted or unsubstituted monocyclic or polycyclic aryl group having 6 to 30 carbon atoms.

According to an exemplary embodiment of the present specification, G100 to G115 are the same as or different from each other, and are each independently hydrogen, deuterium, a substituted or unsubstituted straight-chained or branched alkyl group having 1 to 20 carbon atoms, a substituted or unsubstituted monocyclic or polycyclic cycloalkyl group having 3 to 20 carbon atoms, a substituted or unsubstituted straight-chained or branched alkylsilyl group having 1 to 20 carbon atoms, or a substituted or unsubstituted monocyclic or polycyclic aryl group having 6 to 20 carbon atoms.

According to an exemplary embodiment of the present specification, G100 to G115 are the same as or different from each other, and are each independently hydrogen; deuterium; a straight-chained or branched alkyl group having 1 to 30 carbon atoms, which is unsubstituted or substituted with deuterium; a monocyclic or polycyclic cycloalkyl group having 3 to 30 carbon atoms, which is unsubstituted or substituted with deuterium; a straight-chained or branched alkylsilyl group having 1 to 30 carbon atoms, which is unsubstituted or substituted with deuterium; or a monocyclic or polycyclic aryl group having 6 to 30 carbon atoms, which is unsubstituted or substituted with deuterium.

According to an exemplary embodiment of the present specification, G100 to G115 are the same as or different from each other, and are each independently hydrogen; deuterium; a straight-chained or branched alkyl group having 1 to 20 carbon atoms, which is unsubstituted or substituted with deuterium; a monocyclic or polycyclic cycloalkyl group having 3 to 20 carbon atoms, which is unsubstituted or substituted with deuterium; a straight-chained or branched alkylsilyl group having 1 to 20 carbon atoms, which is unsubstituted or substituted with deuterium; or a monocyclic or polycyclic aryl group having 6 to 20 carbon atoms, which is unsubstituted or substituted with deuterium.

According to an exemplary embodiment of the present specification, G100 to G115 are the same as or different from each other, and are each independently hydrogen, deuterium, a methyl group, —$CD_3$, a tert-butyl group, a cyclohexyl group, a trimethylsilyl group, or a phenyl group which is unsubstituted or substituted with deuterium.

According to an exemplary embodiment of the present specification, Chemical Formula 1 includes: a straight-chained or branched alkyl group having 1 to 10 carbon atoms, which is substituted with deuterium; a monocyclic or polycyclic cycloalkyl group having 3 to 10 carbon atoms, which is substituted with one or more of deuterium and a straight-chained or branched alkyl group having 1 to 10 carbon atoms, which is substituted with deuterium; or a monocyclic or polycyclic aliphatic hydrocarbon fused ring having 3 to 10 carbon atoms, which is substituted with one or more of deuterium and a straight-chained or branched alkyl group having 1 to 10 carbon atoms, which is substituted with deuterium.

According to an exemplary embodiment of the present specification, Chemical Formula 1 includes: a methyl group substituted with deuterium; an ethyl group substituted with deuterium; an iso-propyl group substituted with deuterium; a tert-butyl group substituted with deuterium; a cyclopentyl group substituted with one or more of deuterium and a methyl group substituted with deuterium; a cyclohexyl group substituted with one or more of deuterium and a methyl group substituted with deuterium; a cycloheptyl group substituted with one or more of deuterium and a methyl group substituted with deuterium; a bicyclo[2.2.1]octyl group substituted with one or more of deuterium and a methyl group substituted with deuterium; a norbornane group substituted with one or more of deuterium and a methyl group substituted with deuterium; an adamantyl group substituted with one or more of deuterium and a methyl group substituted with deuterium; a cyclopentane ring substituted with one or more of deuterium and a methyl group substituted with deuterium; a cyclohexane ring substituted with one or more of deuterium and a methyl group substituted with deuterium; a cycloheptane ring substituted with one or more of deuterium and a methyl group substituted with deuterium; a bicyclo[2.2.1]octane ring substituted with one or more of deuterium and a methyl group substituted with deuterium; a norbornane ring substituted with one or more of deuterium and a methyl group substituted with deuterium; or an adamantane ring substituted with one or more of deuterium and a methyl group substituted with deuterium.

According to an exemplary embodiment of the present specification, Chemical Formula 1 is any one compound selected from among the following compounds:

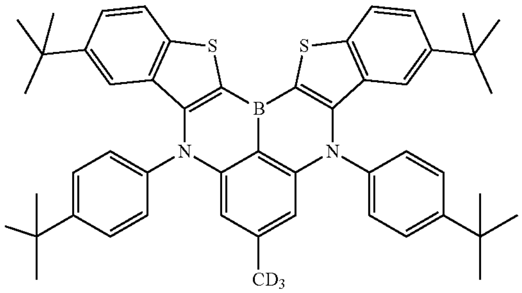

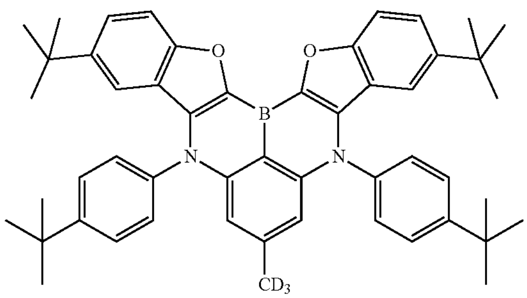

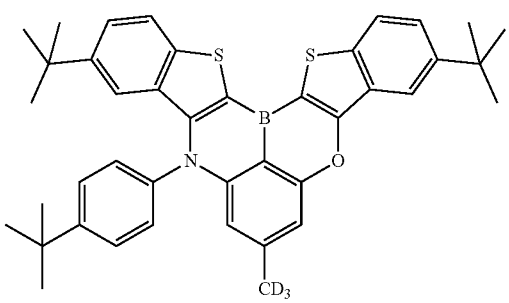

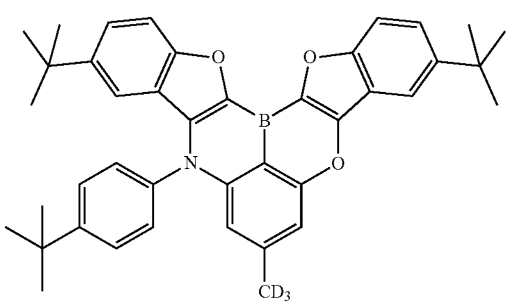

-continued

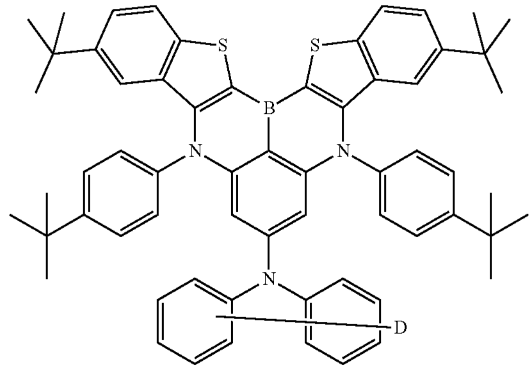

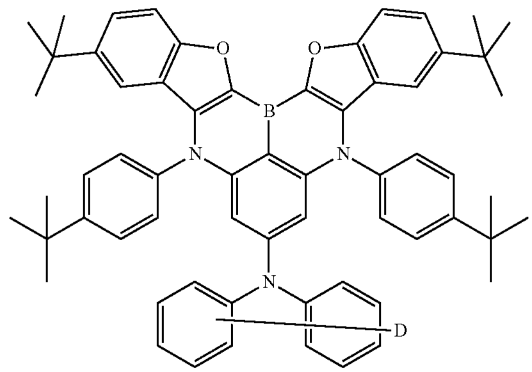

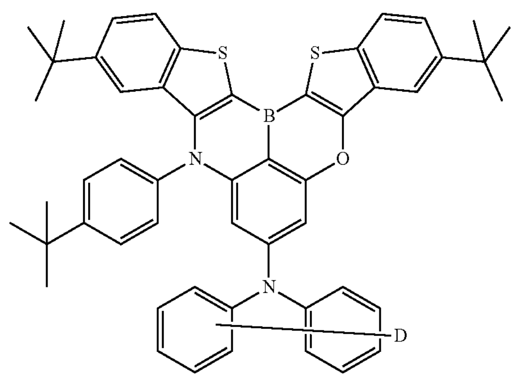

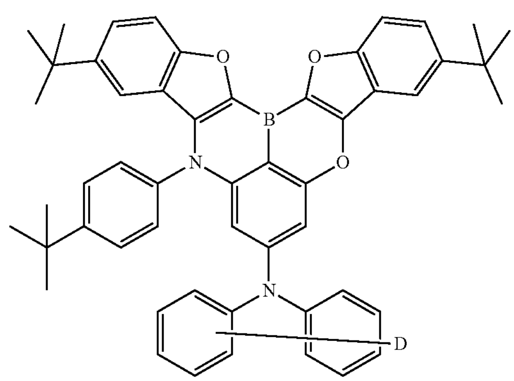

-continued
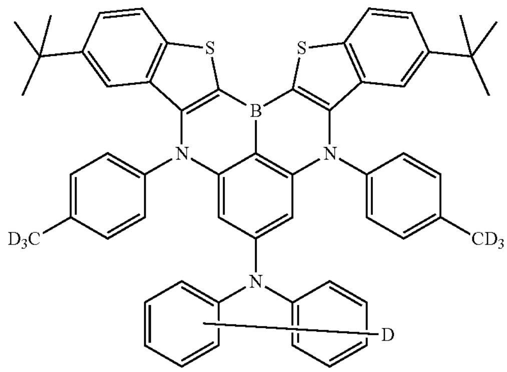
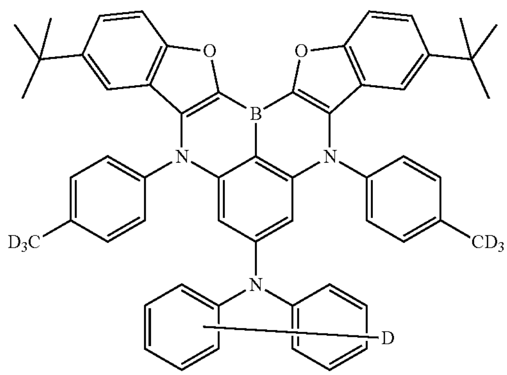
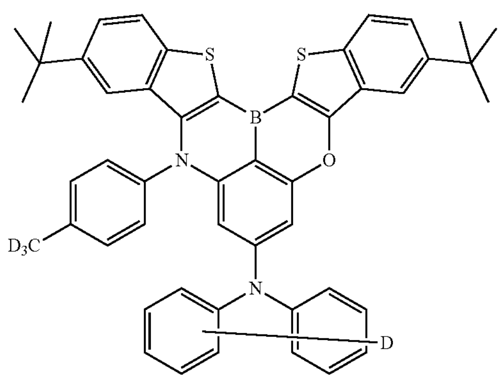
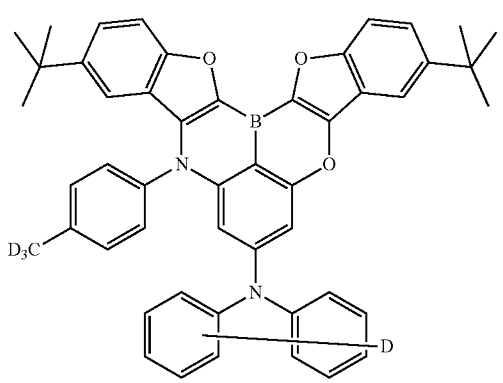
-continued
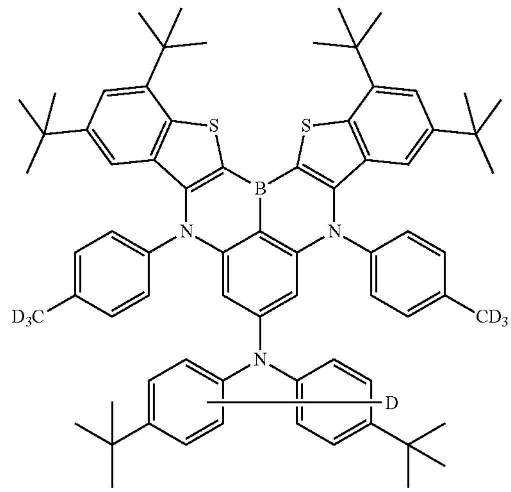
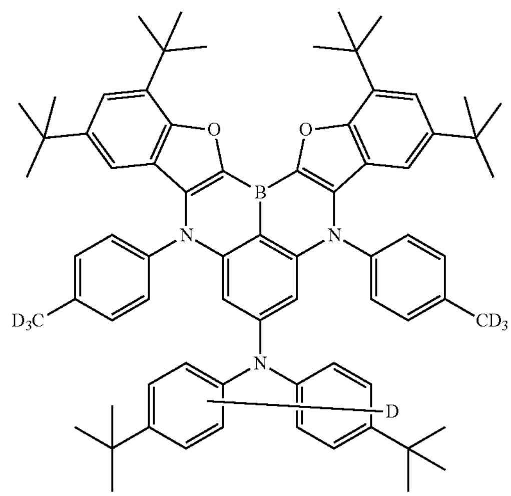
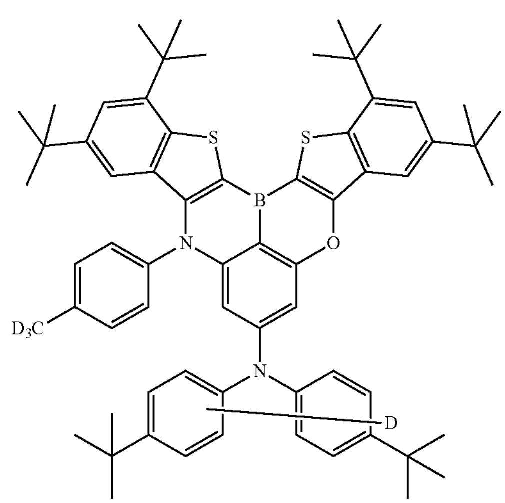

-continued
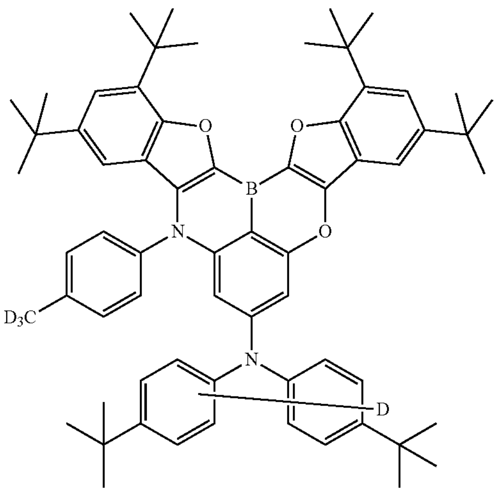
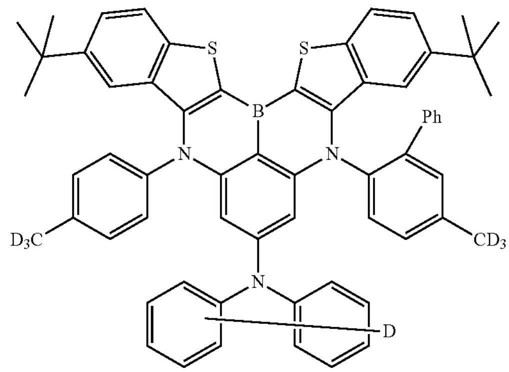
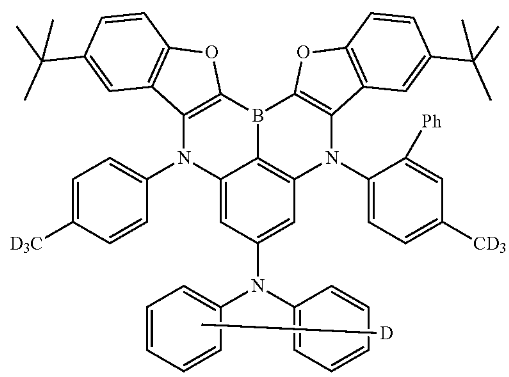
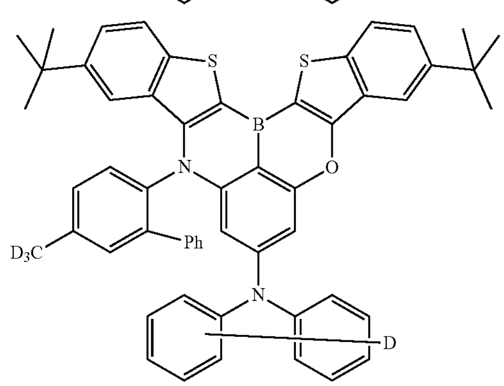
-continued
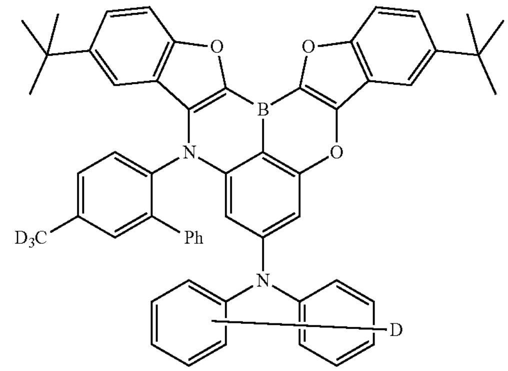
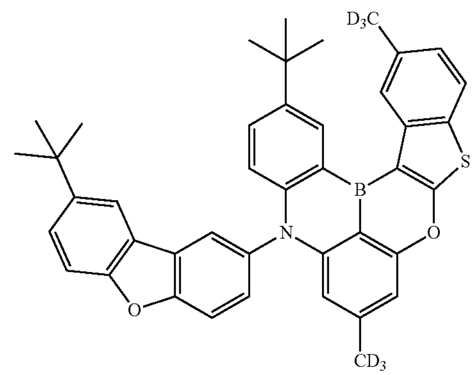
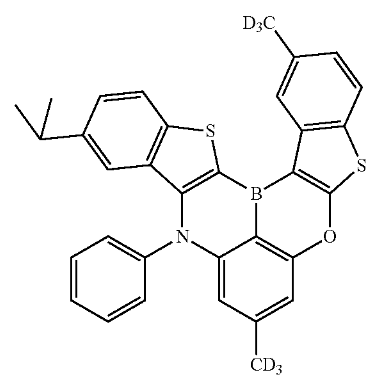
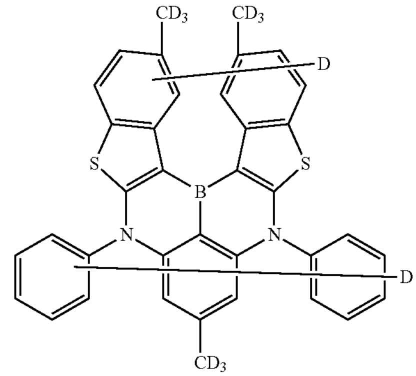

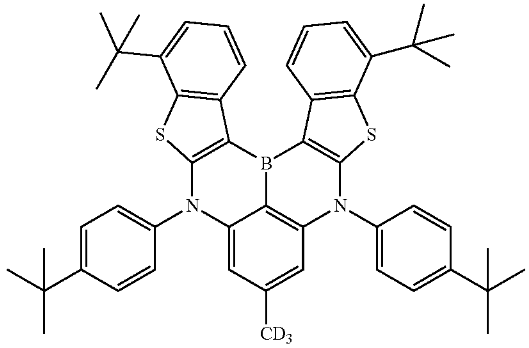
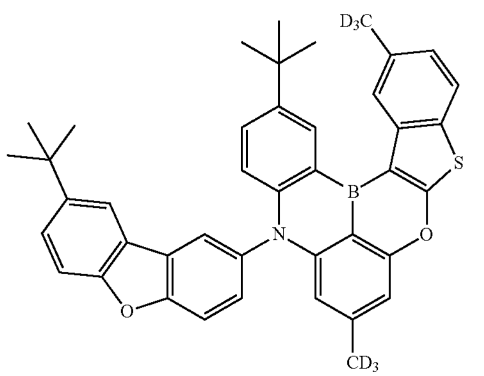
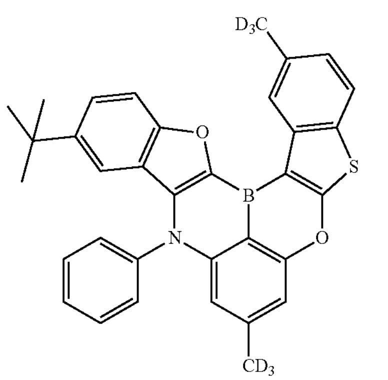
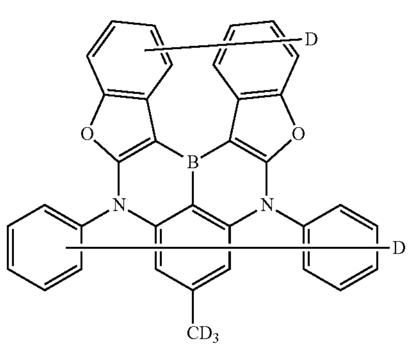
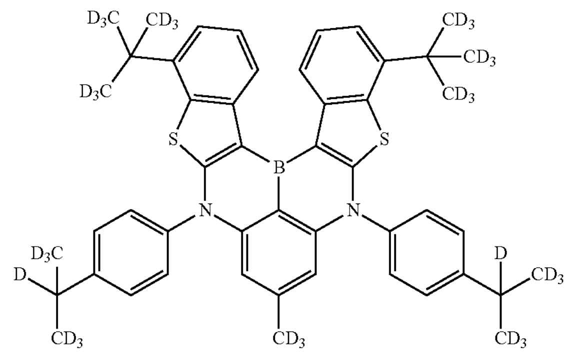
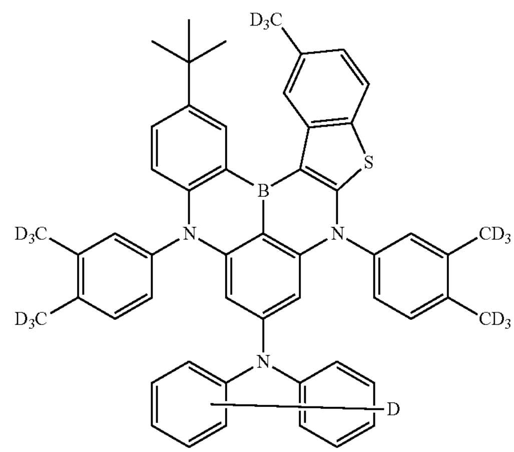
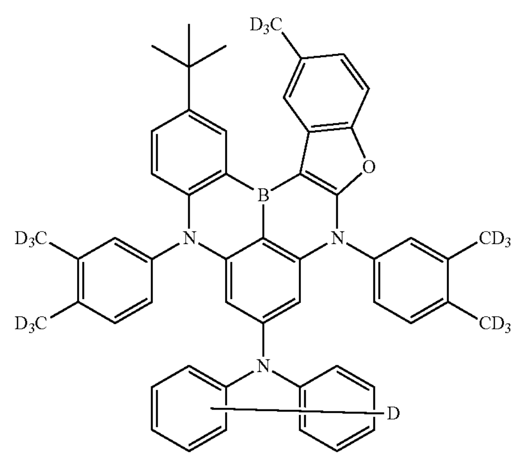
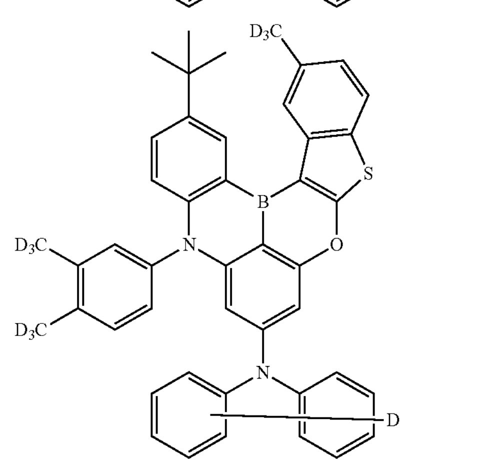

-continued
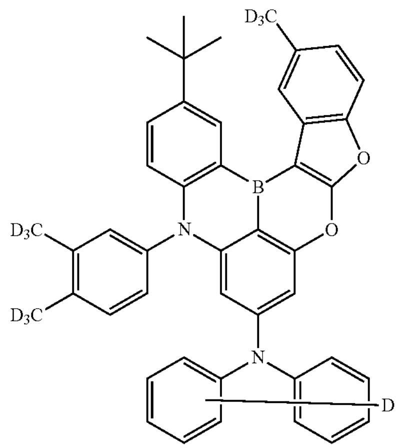
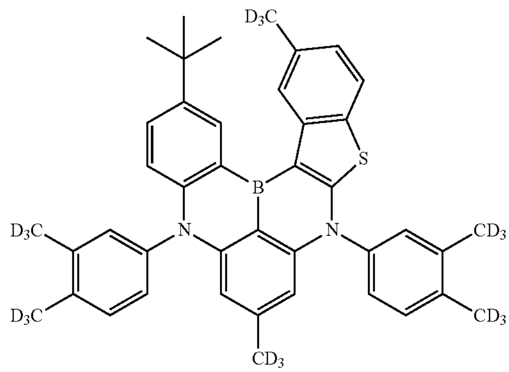
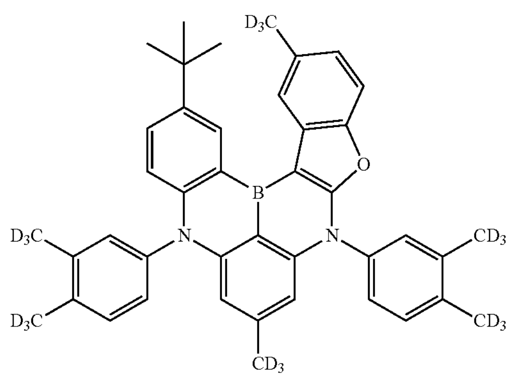
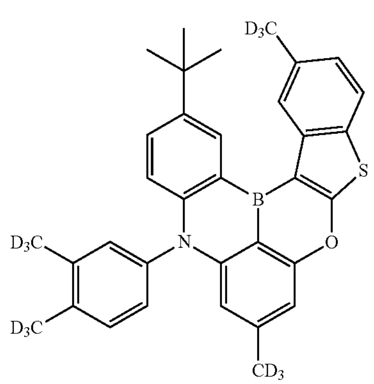
-continued
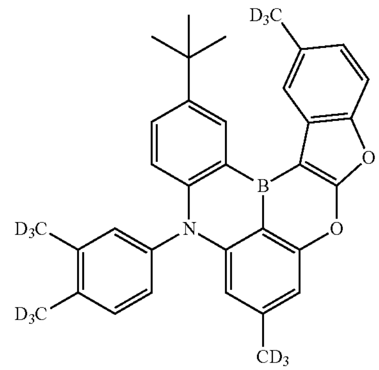
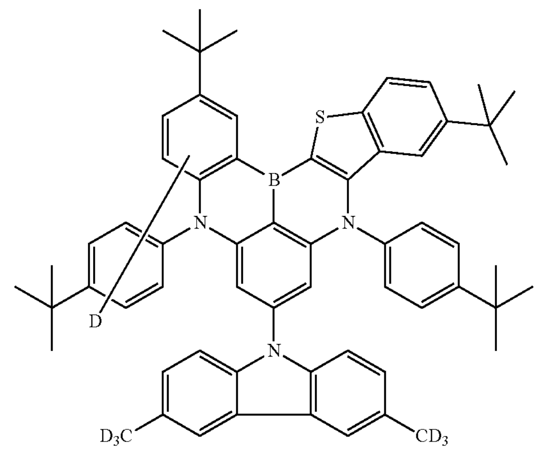
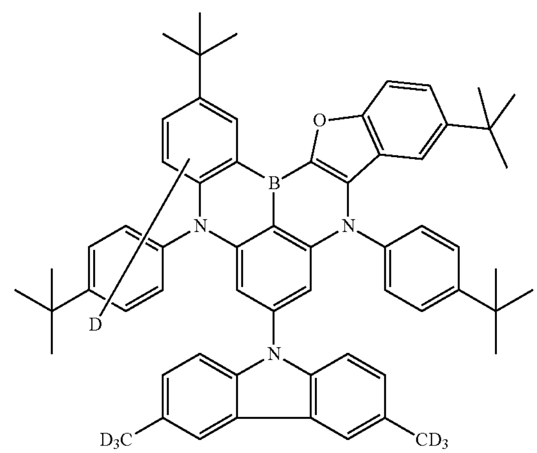
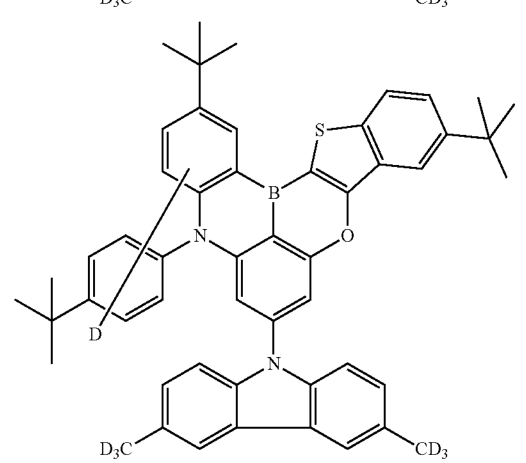

-continued
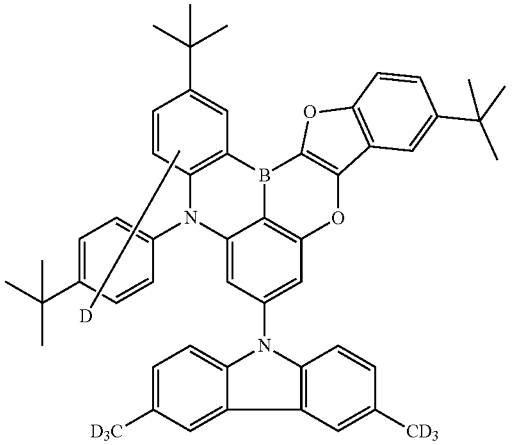
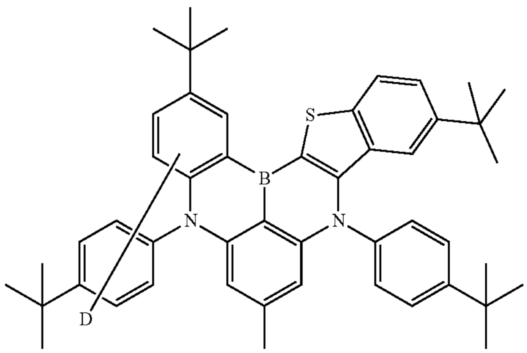
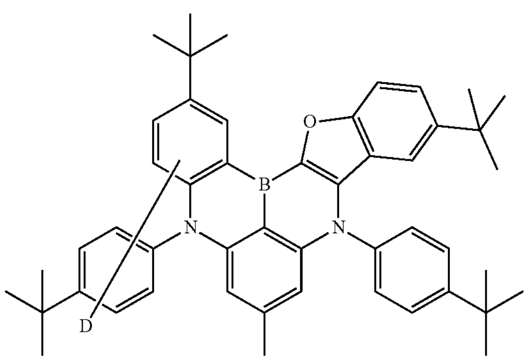
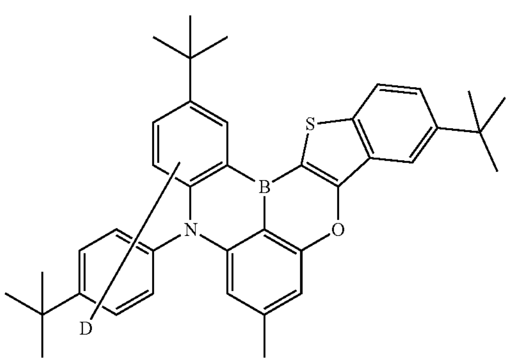
-continued
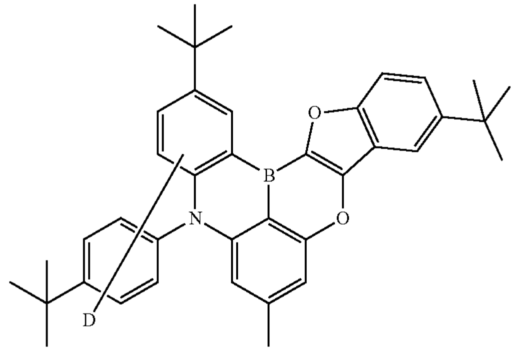
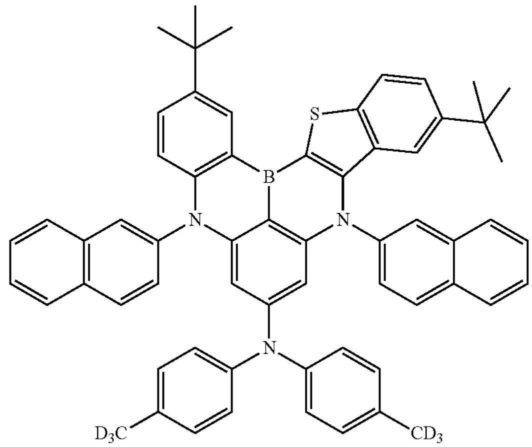
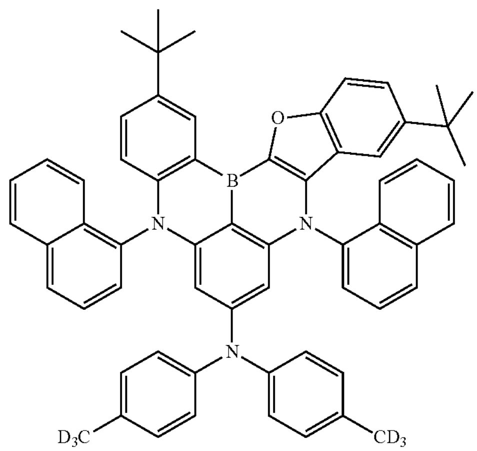
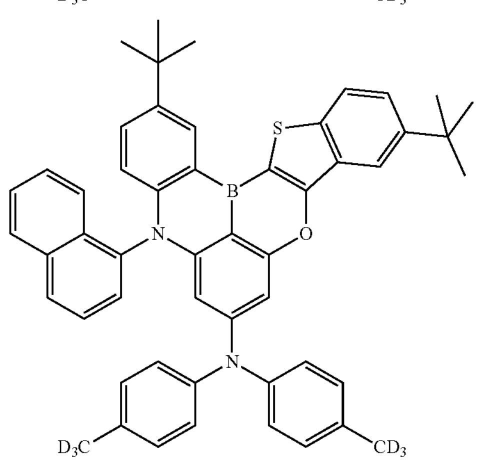

-continued
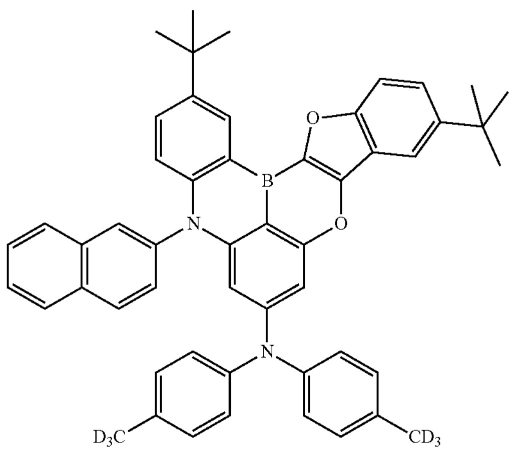
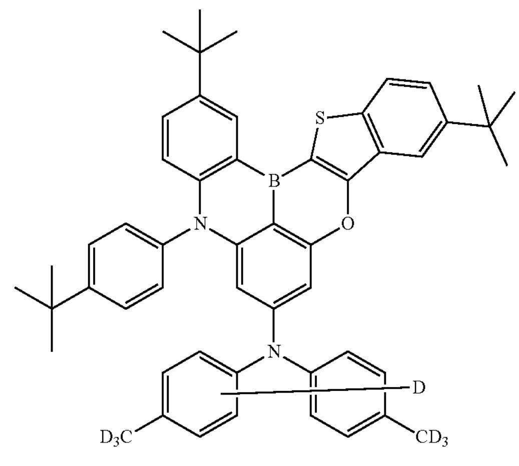
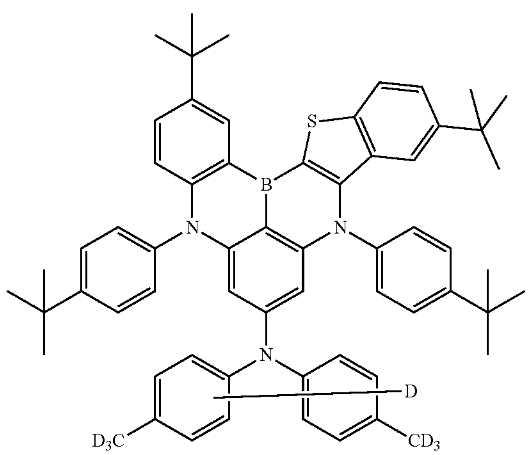
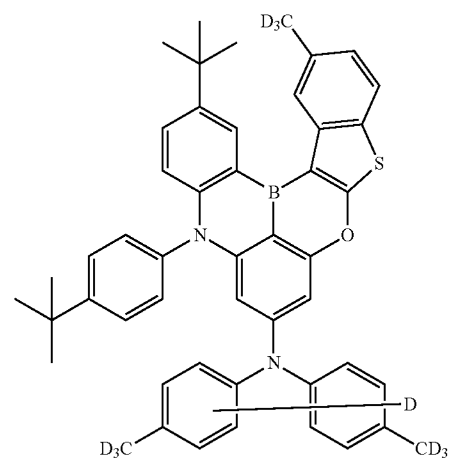
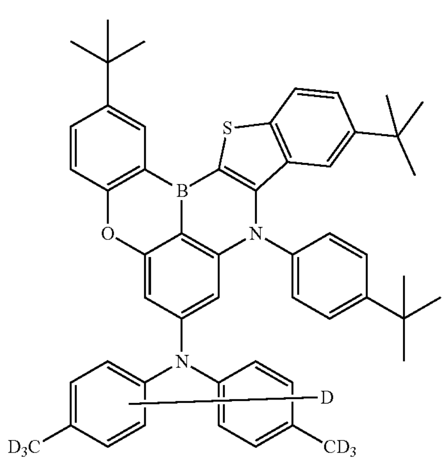
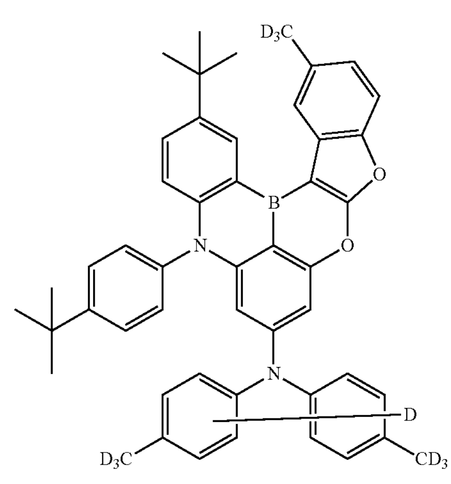

-continued
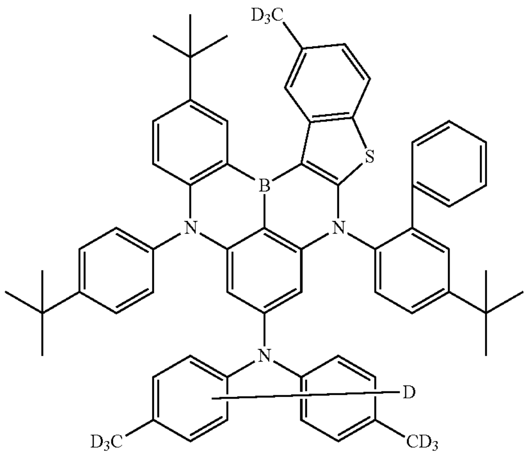
-continued
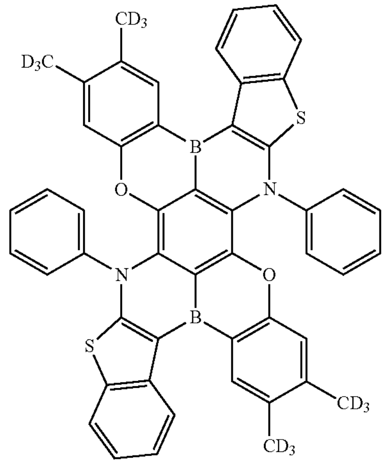
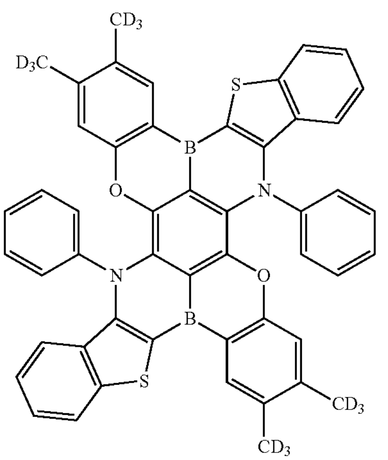
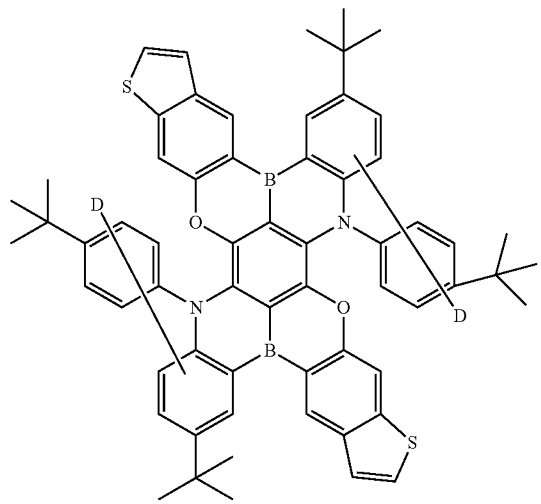
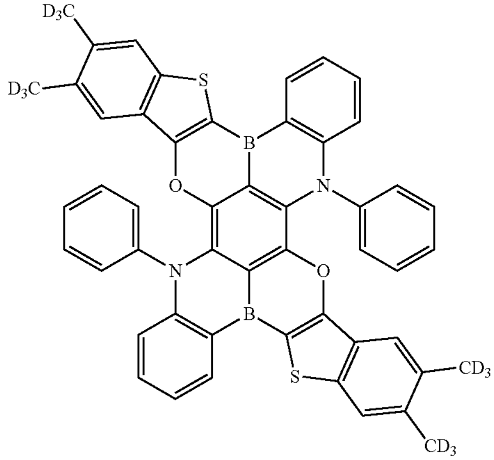
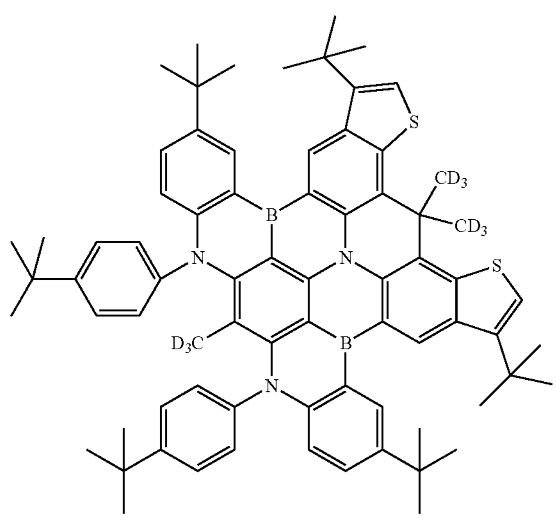

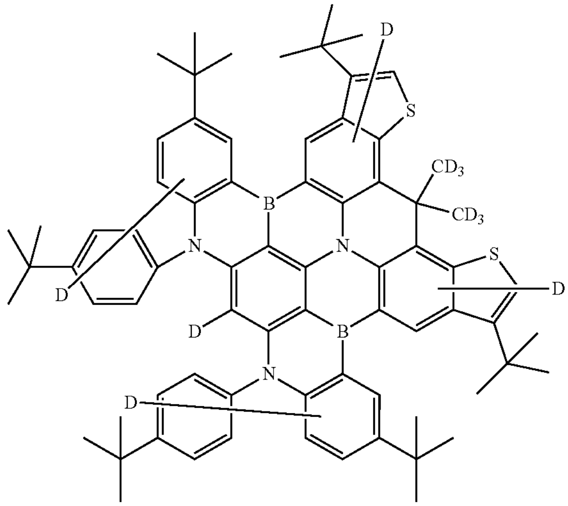
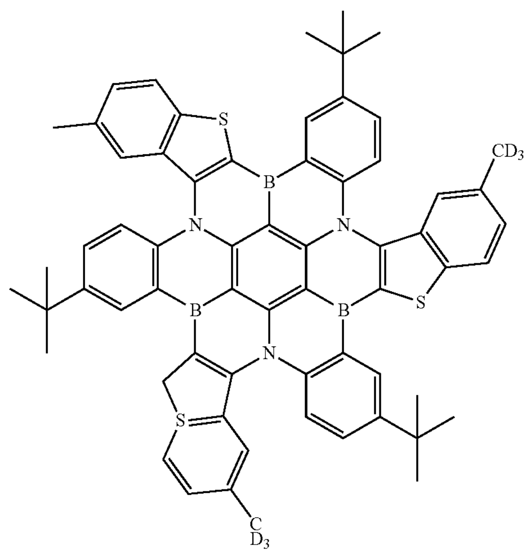
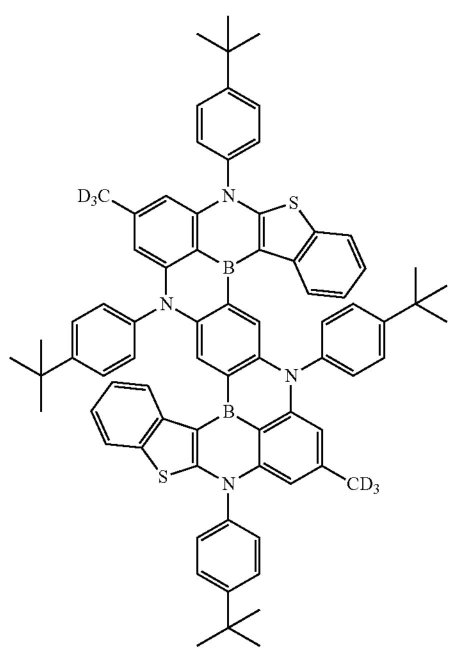
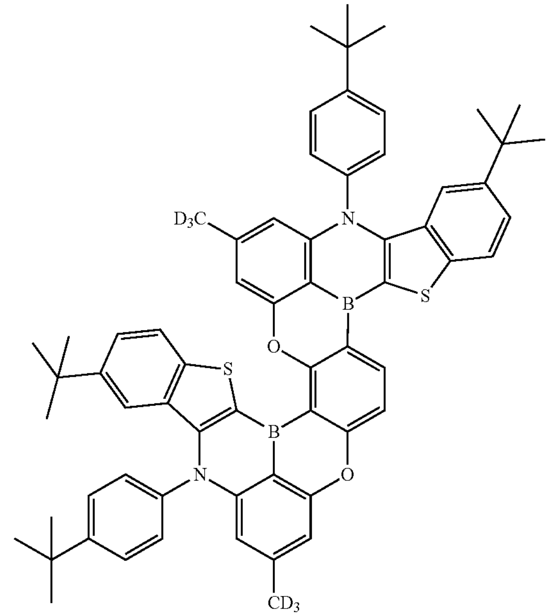
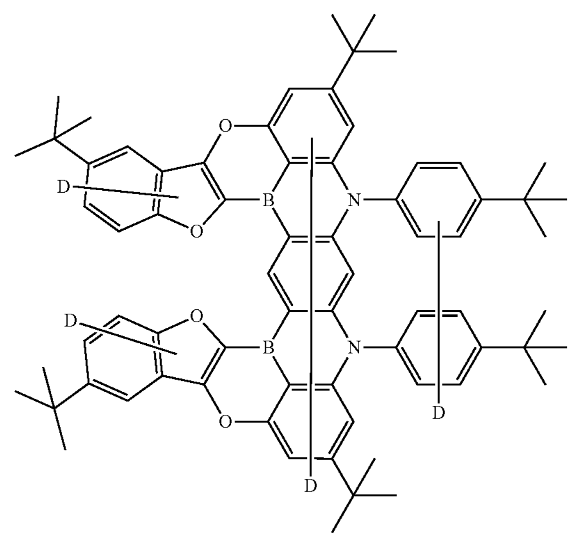
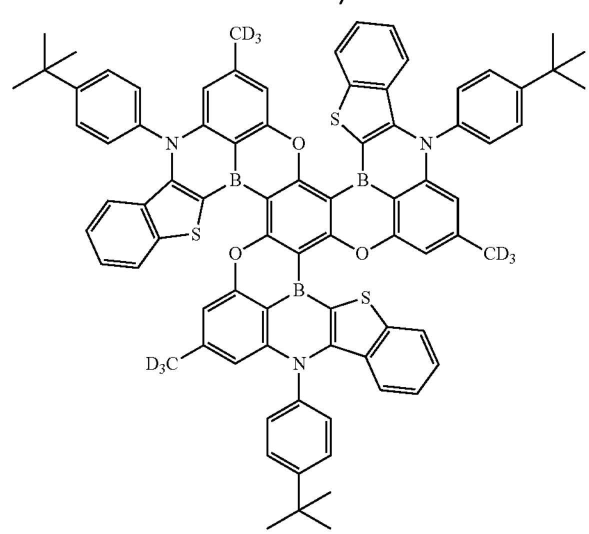

-continued
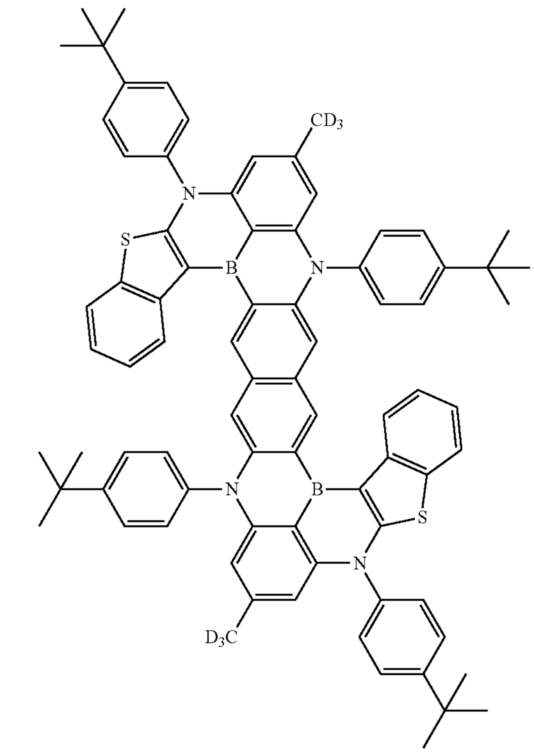
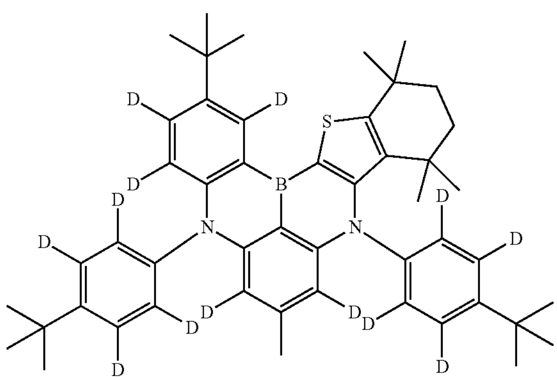
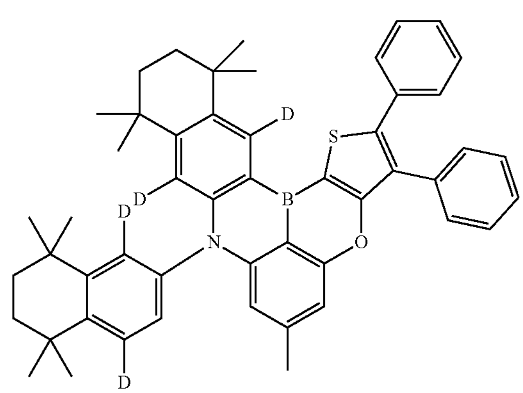
-continued
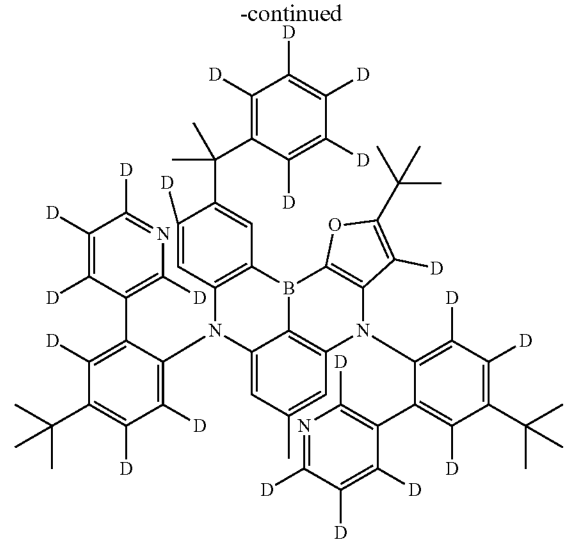
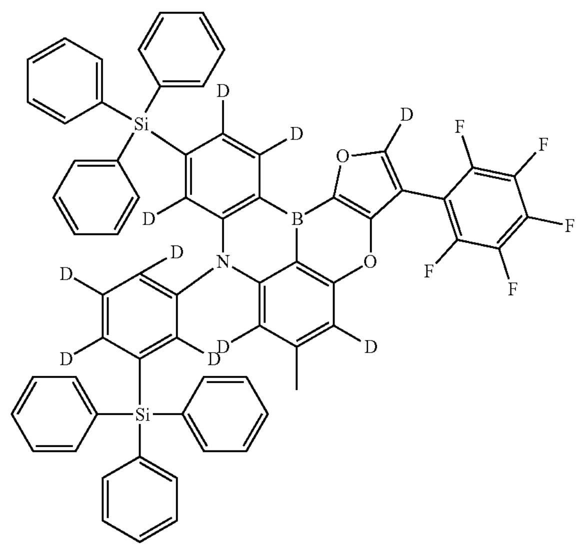
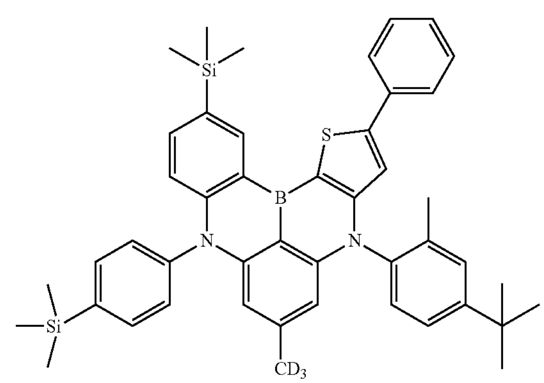

-continued
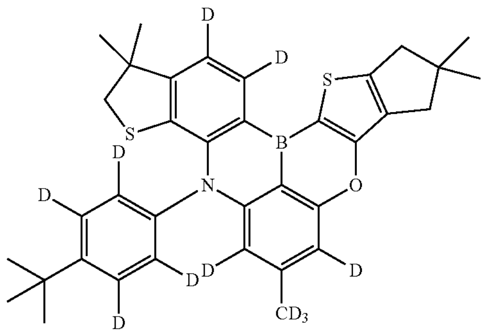
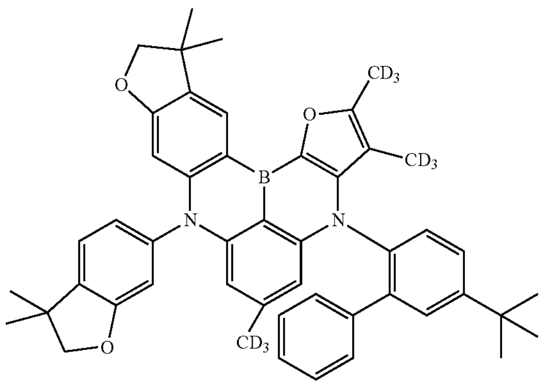
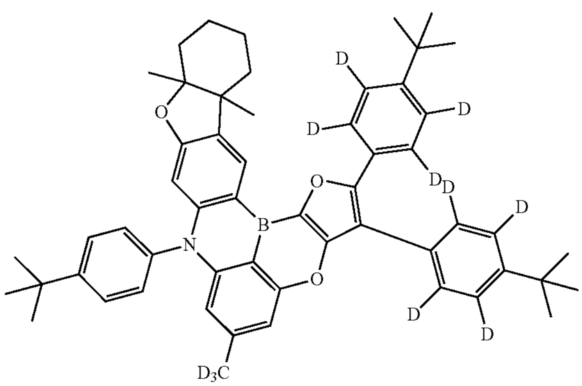
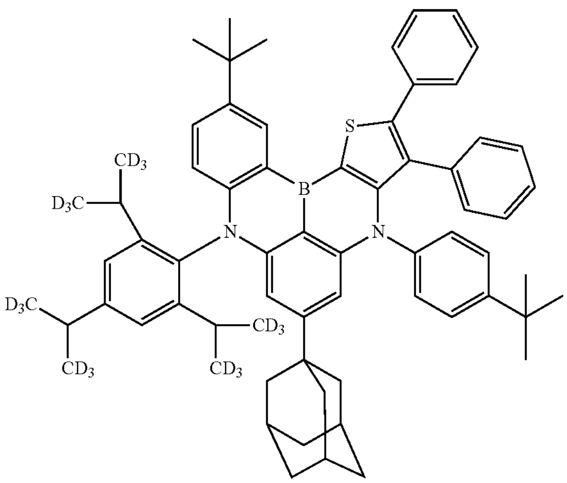
-continued
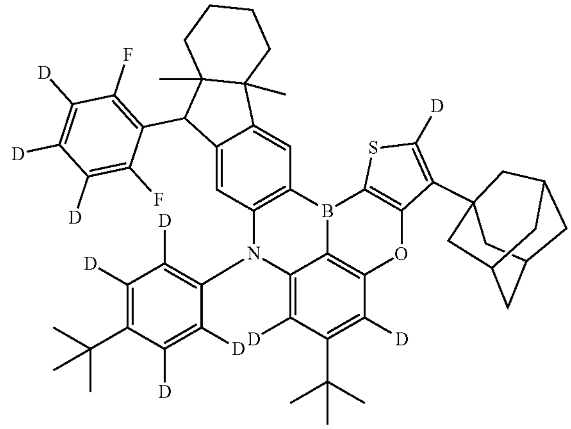
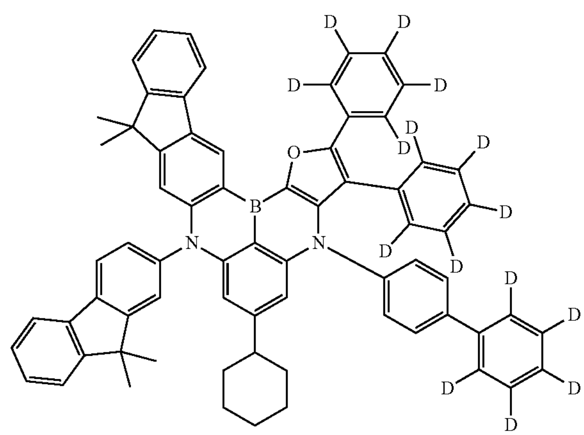
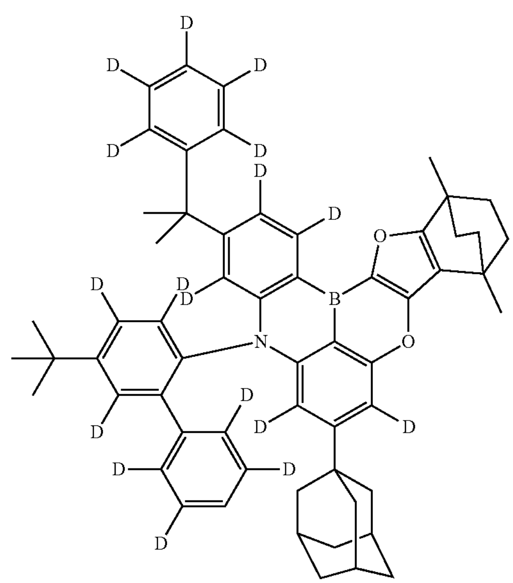

-continued
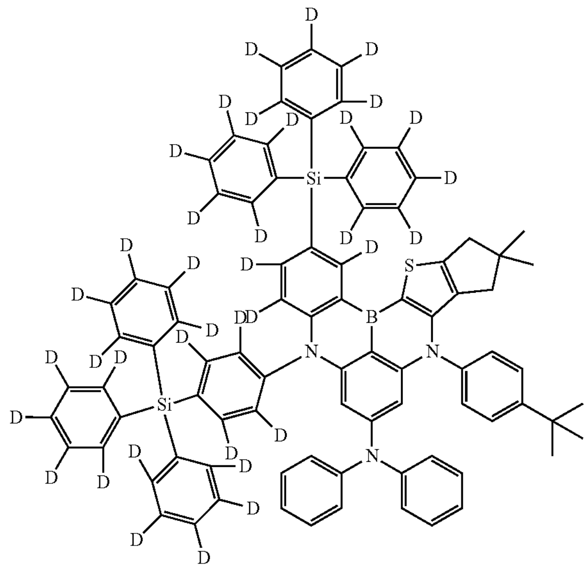
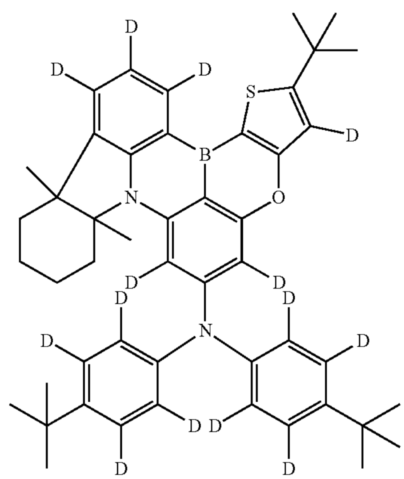
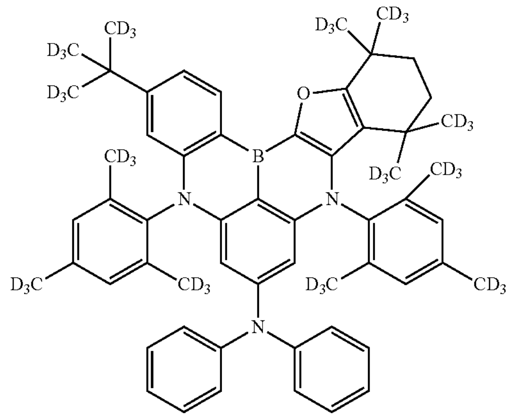
-continued
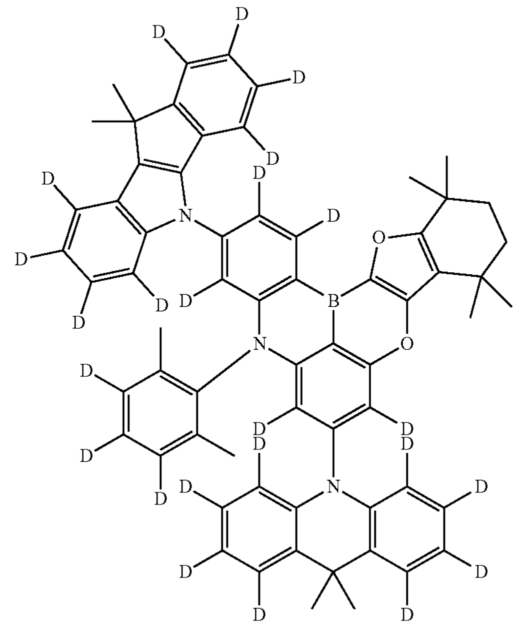
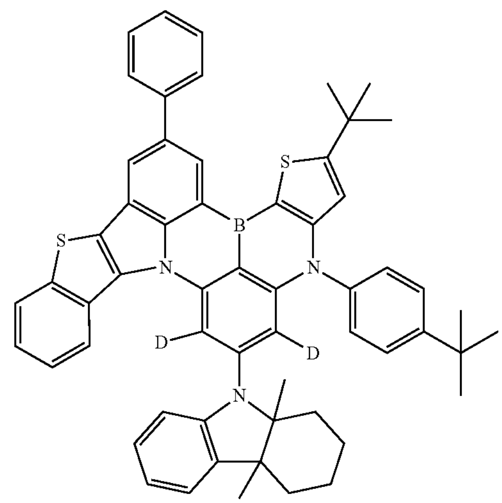
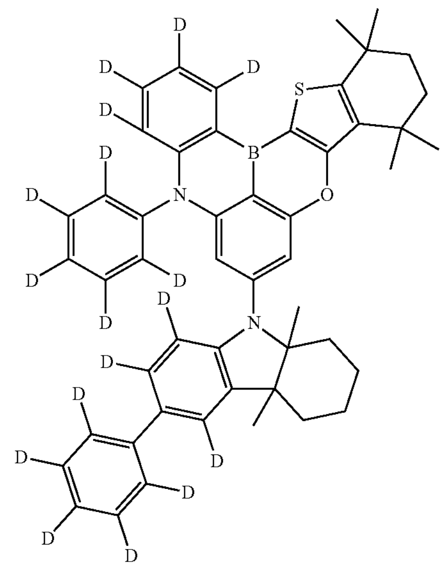

-continued
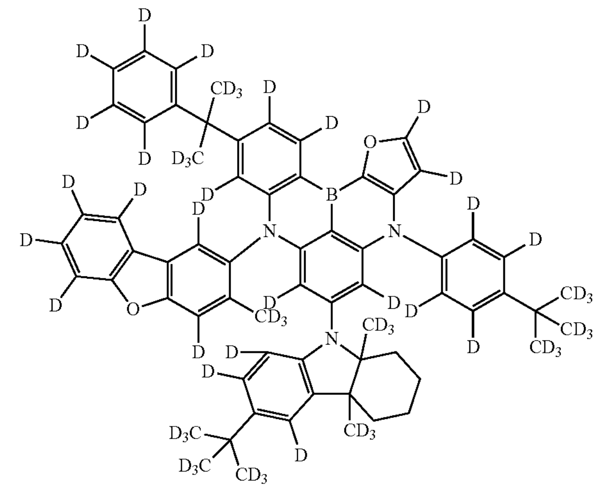
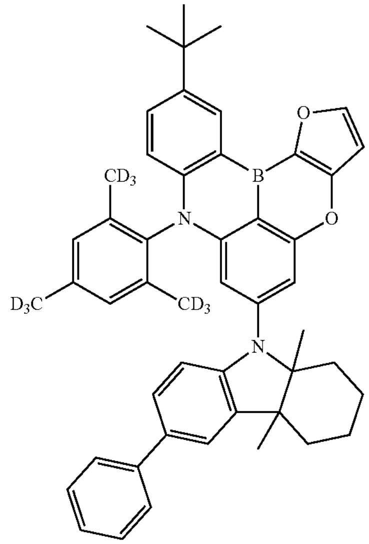
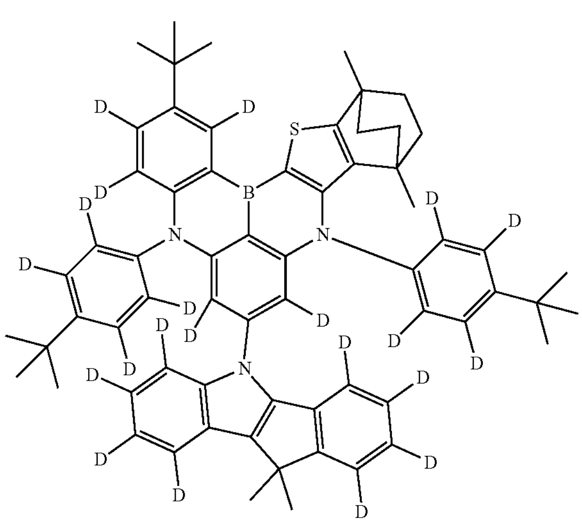
-continued
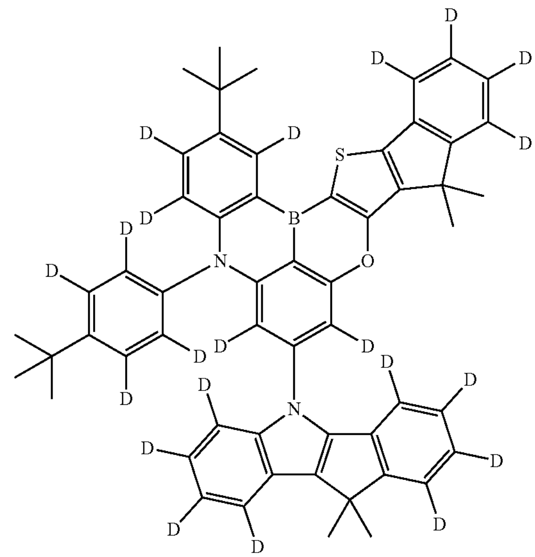
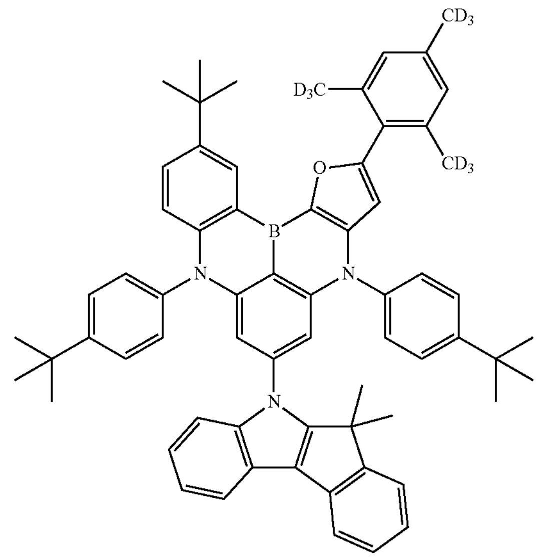
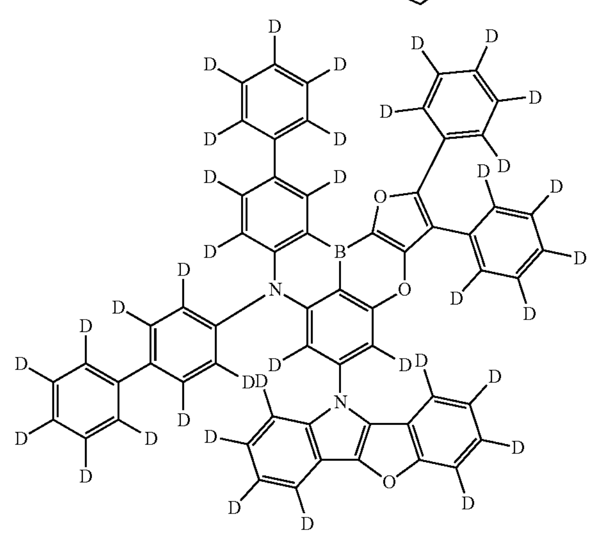

-continued
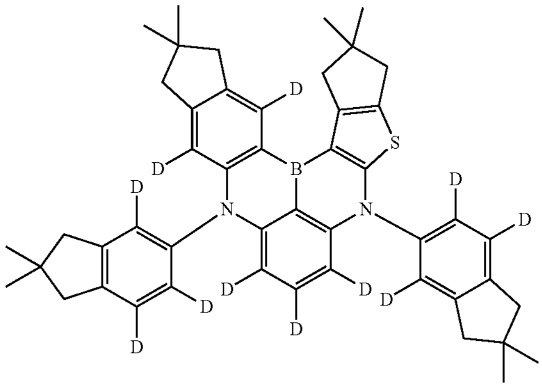
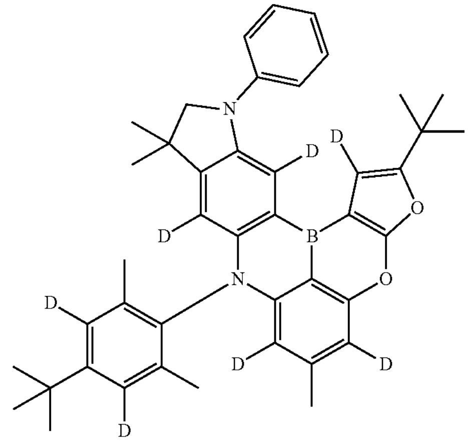
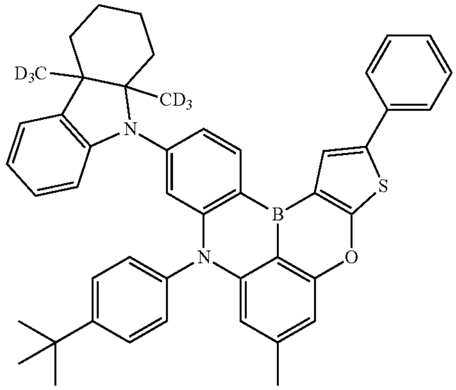
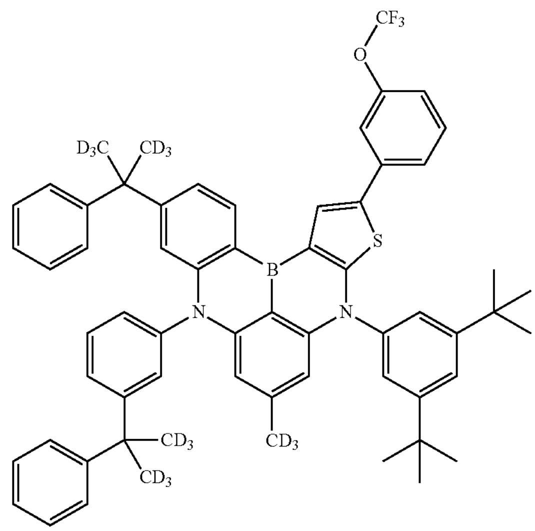
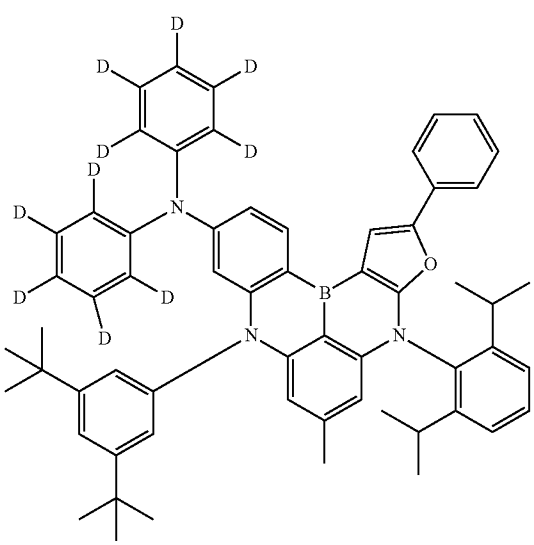
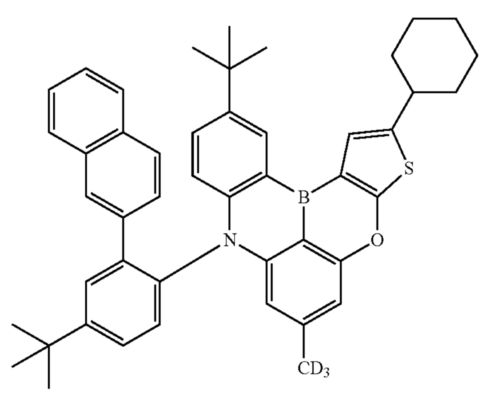

-continued
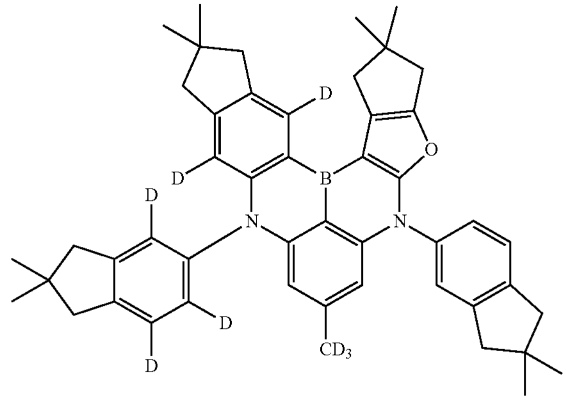
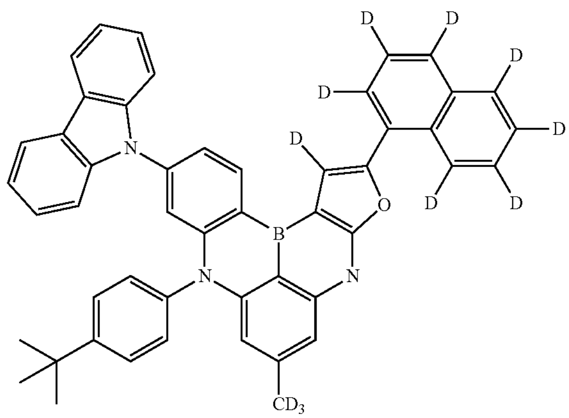
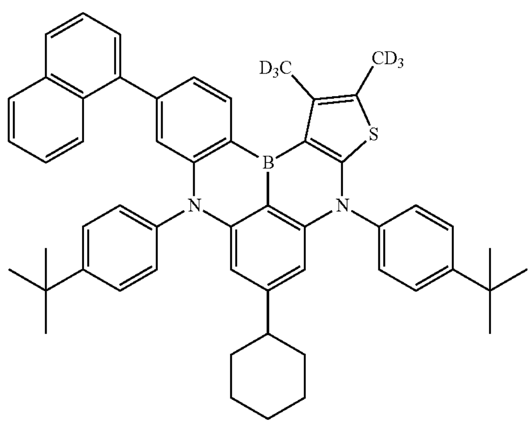
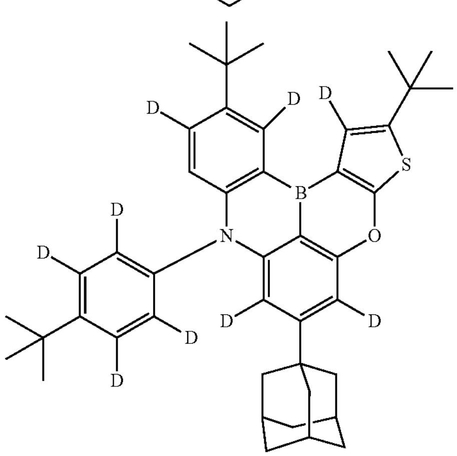
-continued
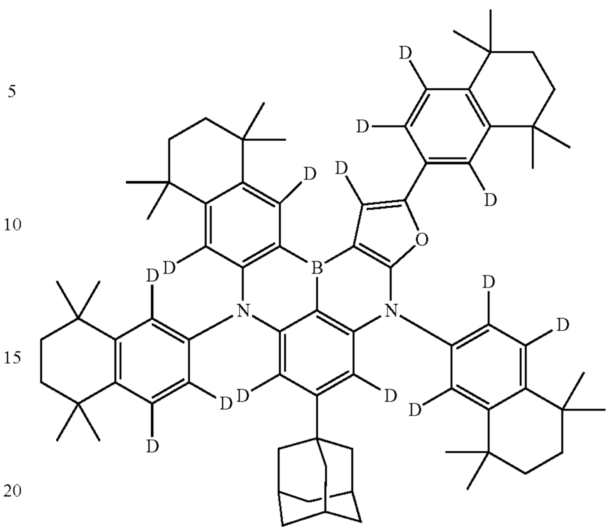
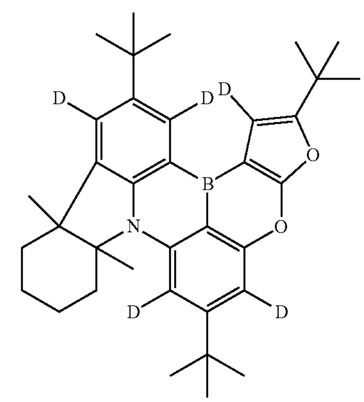
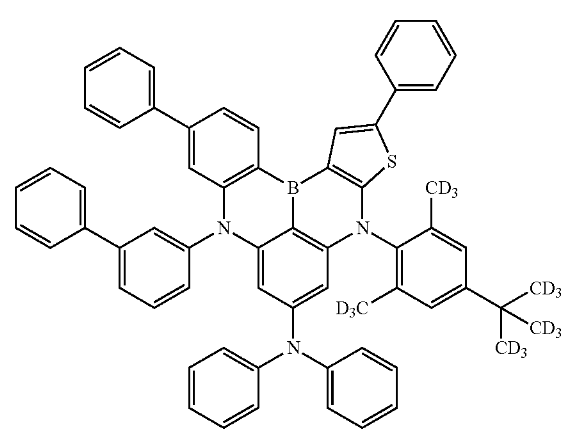

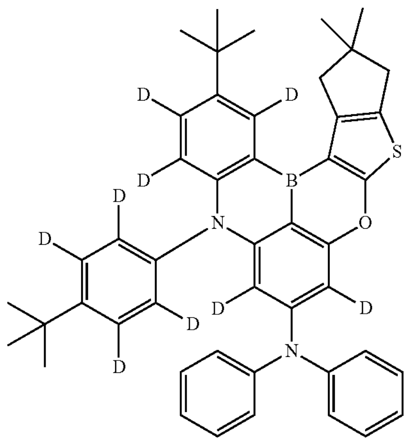
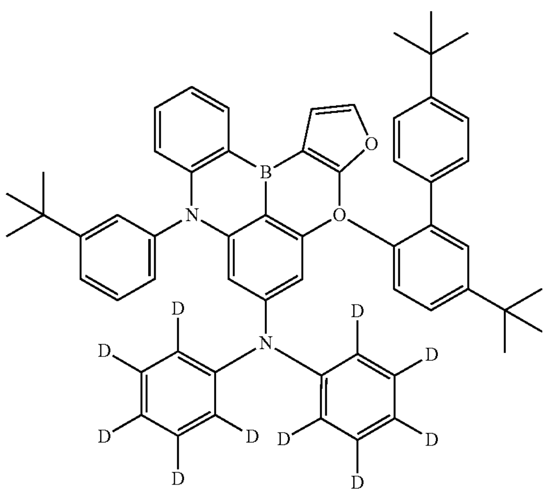
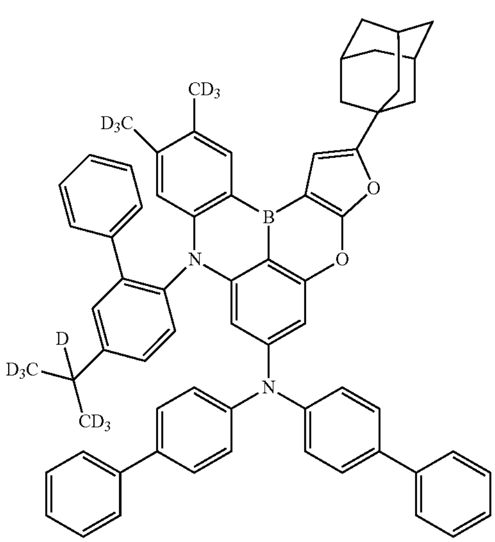
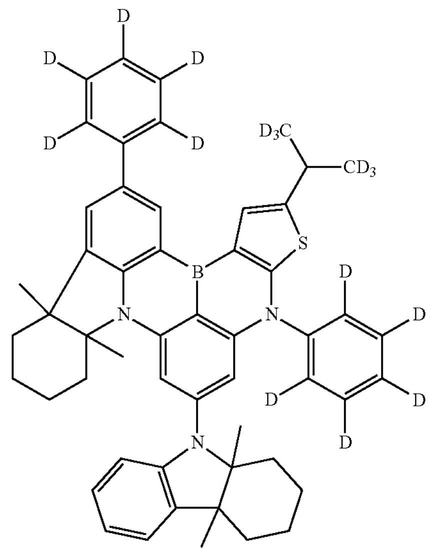
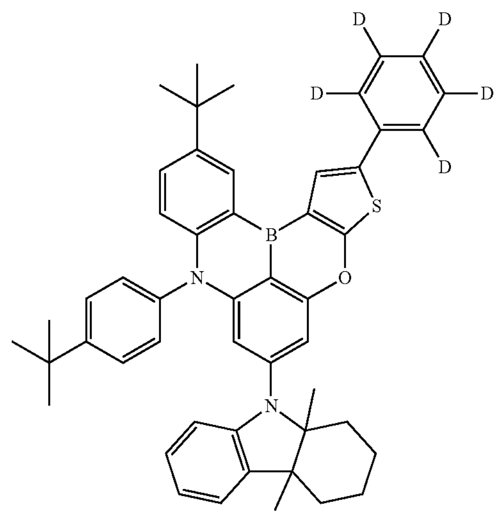
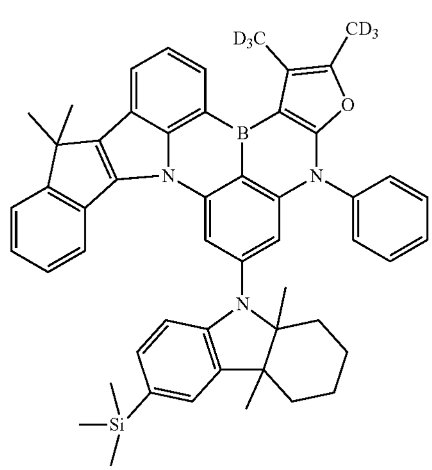

-continued
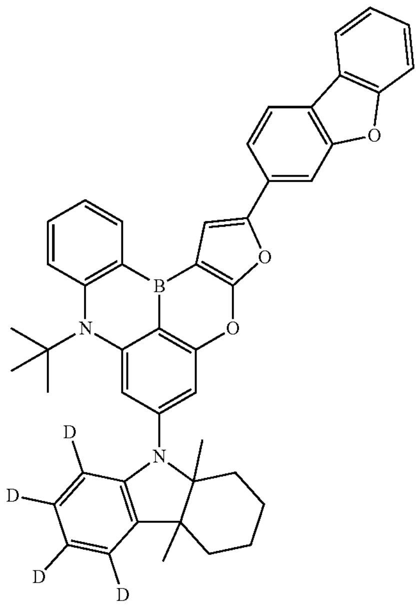
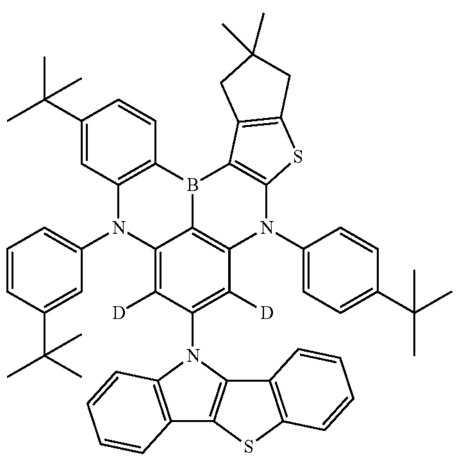
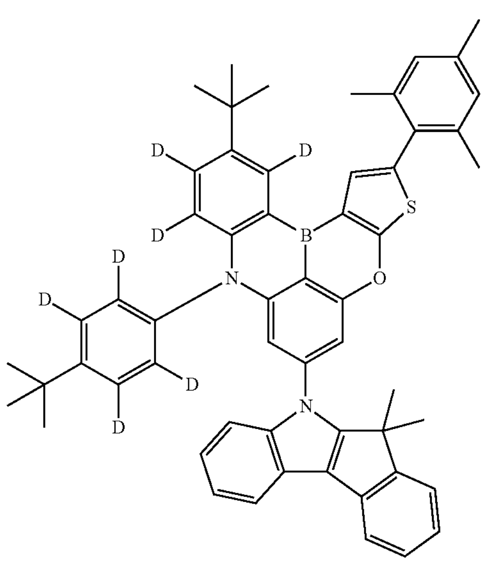
-continued
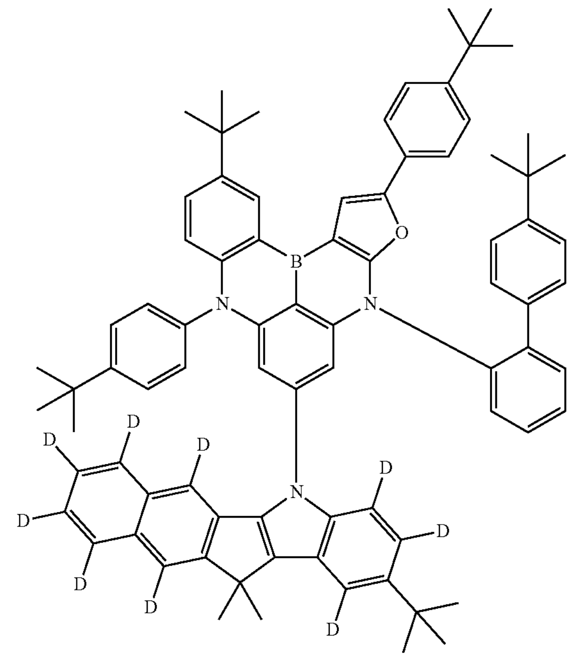
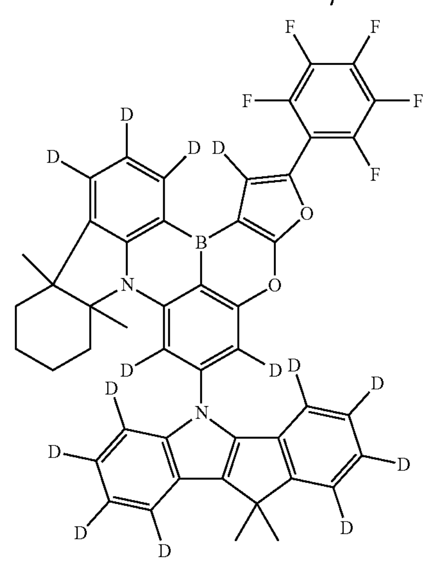
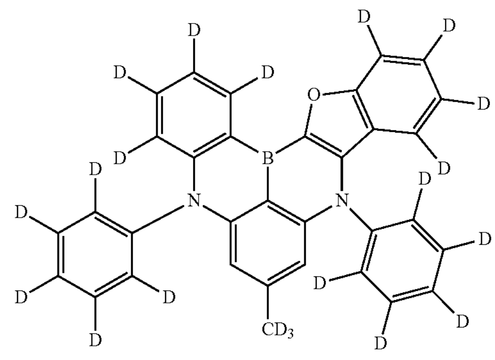

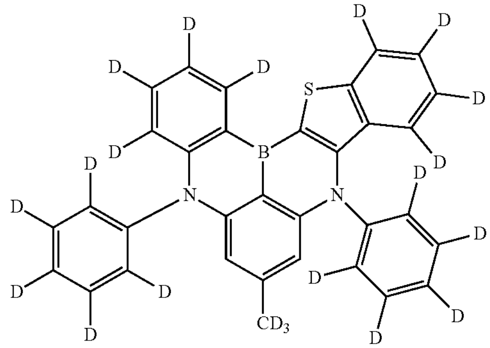
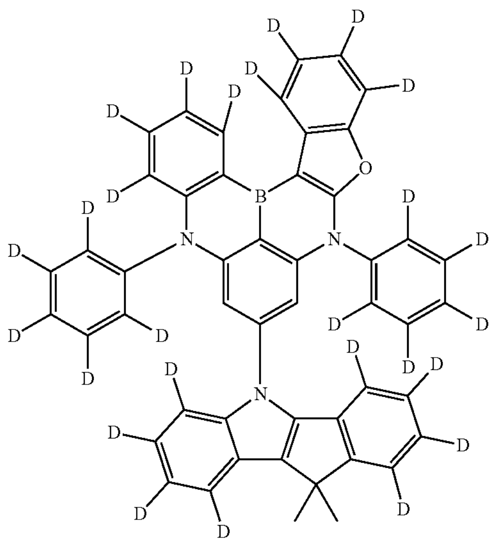
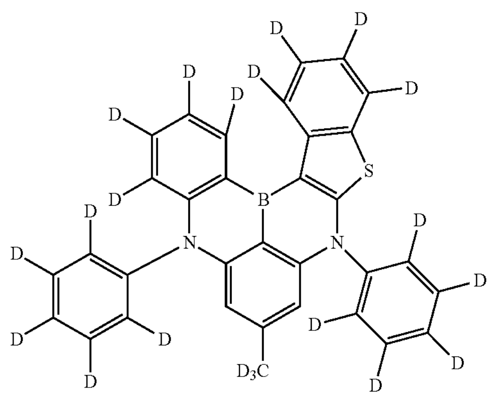
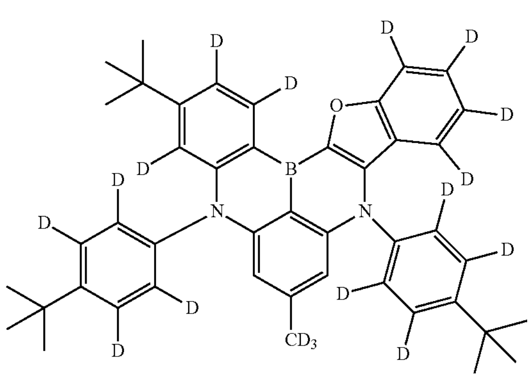
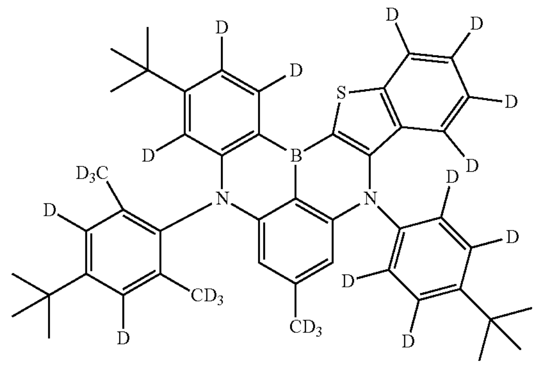
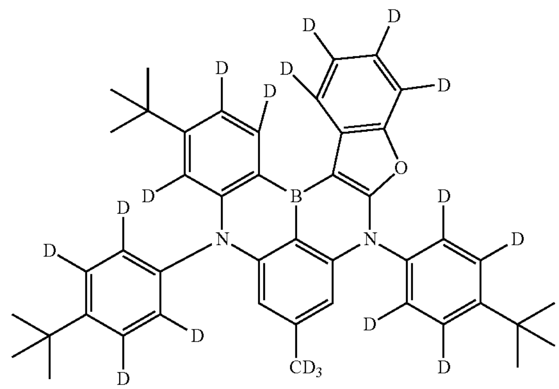
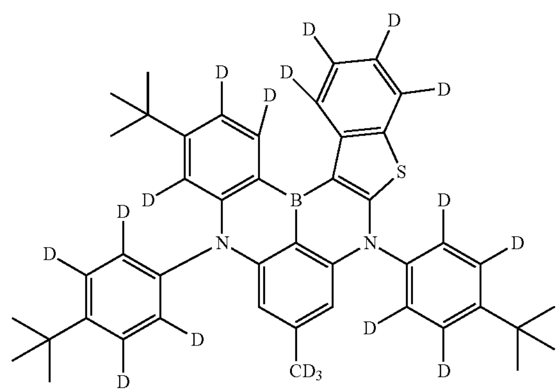
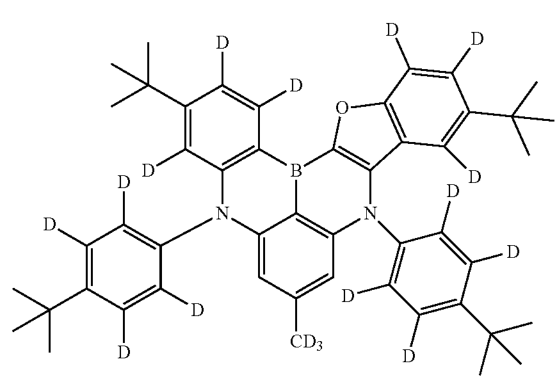

-continued
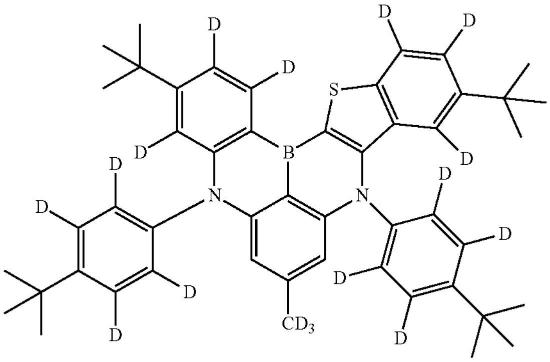
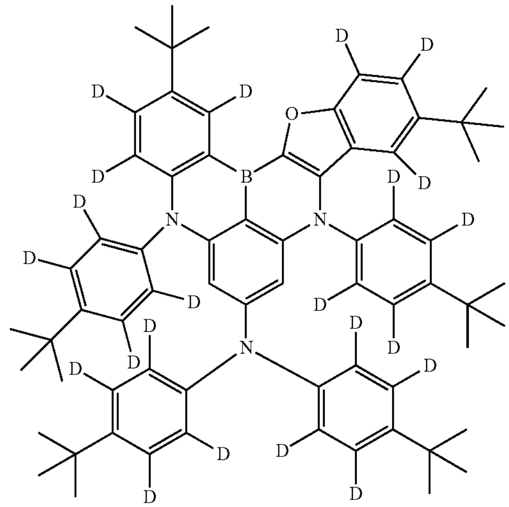
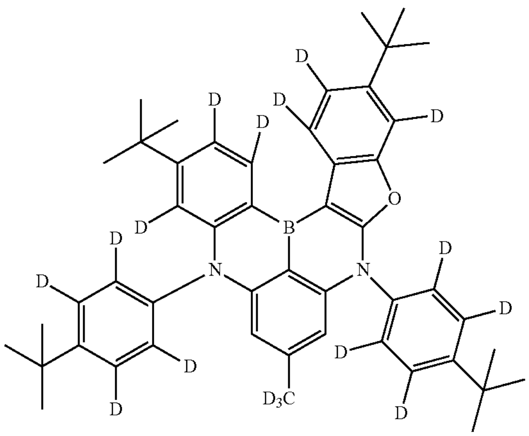
-continued
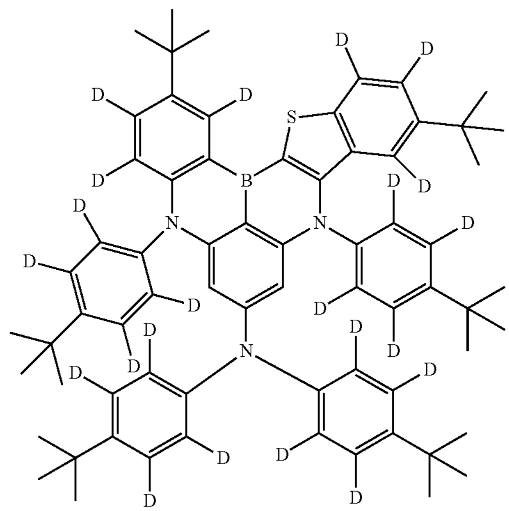
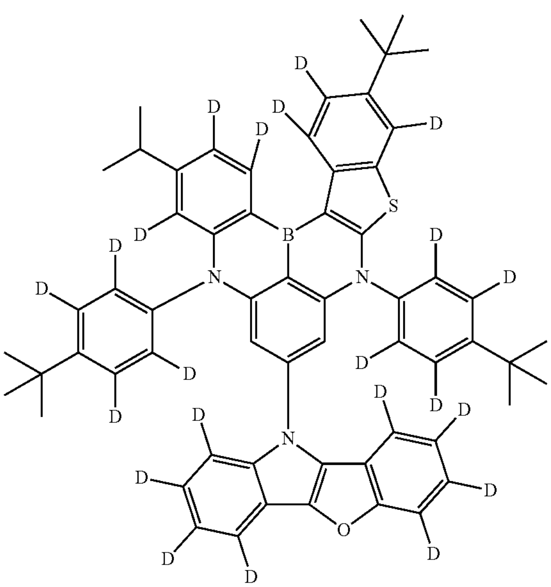
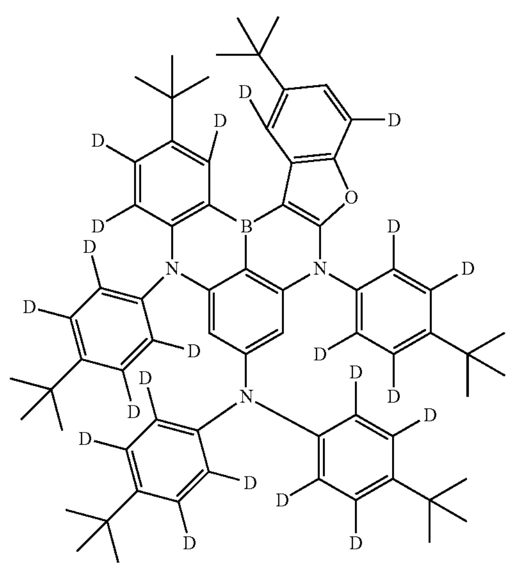

-continued
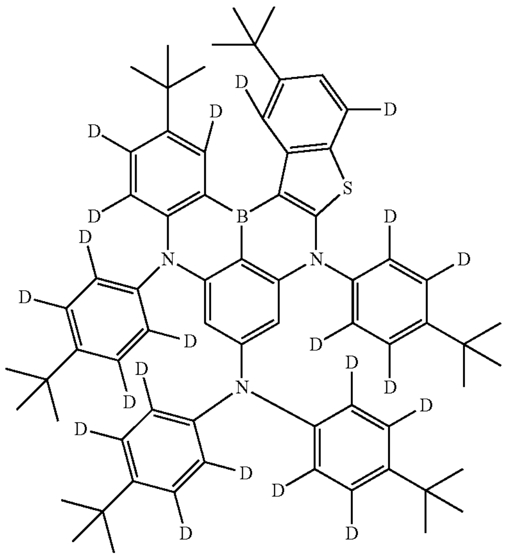
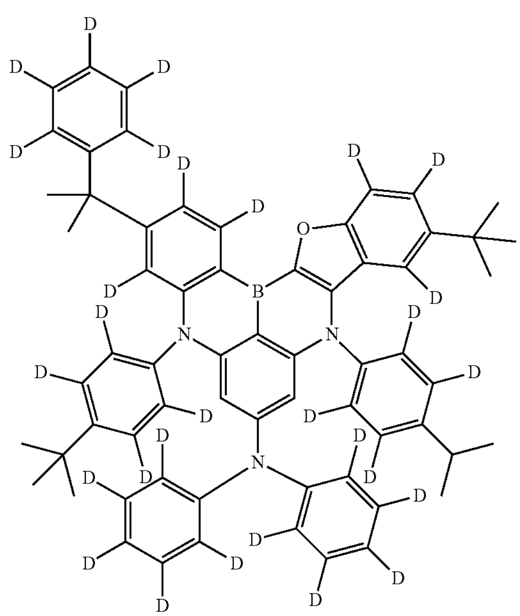
-continued
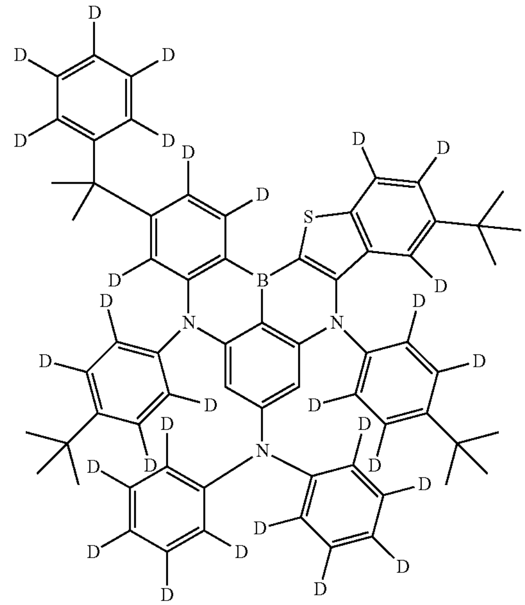
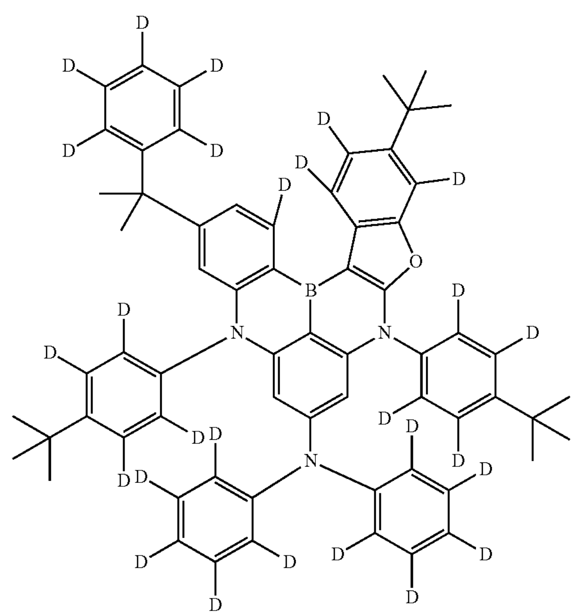

-continued
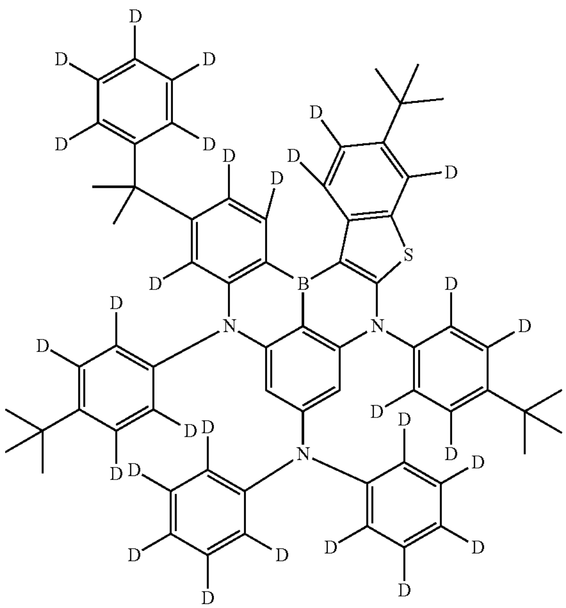
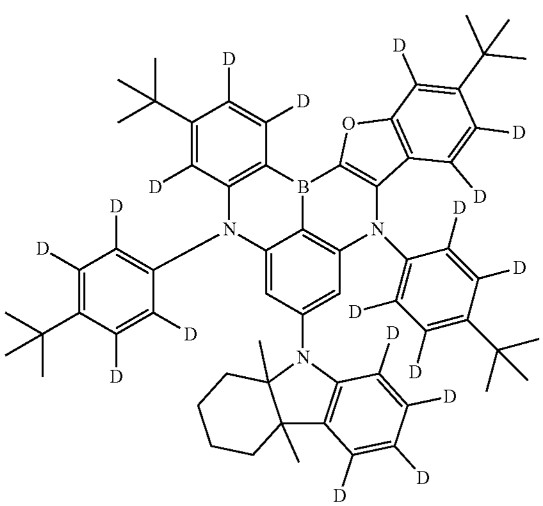
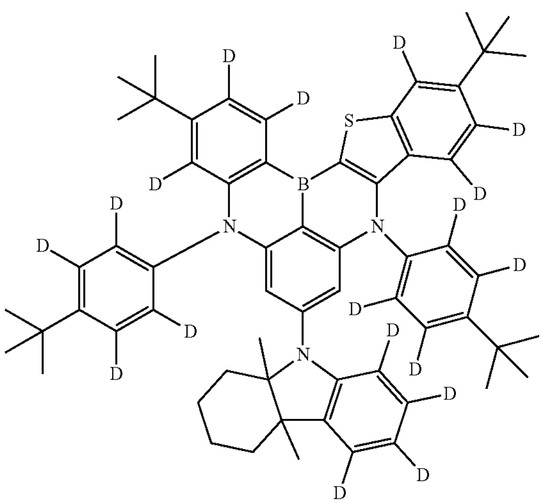
-continued
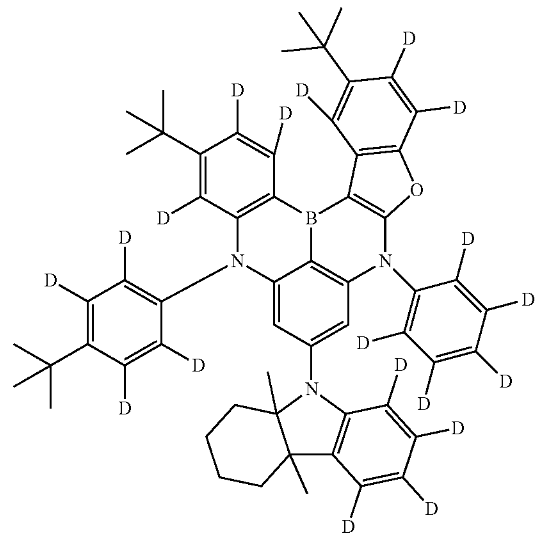
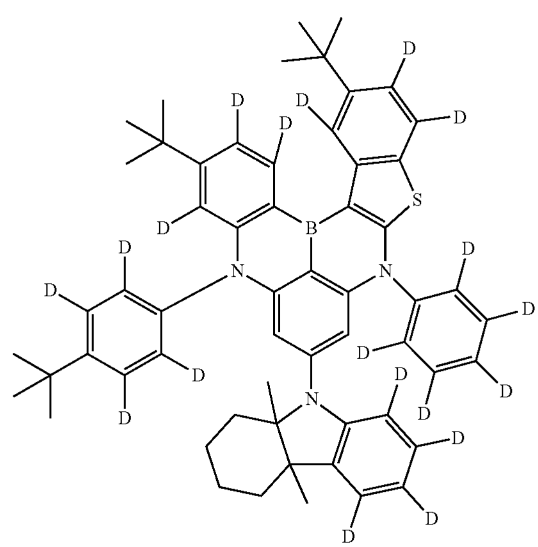

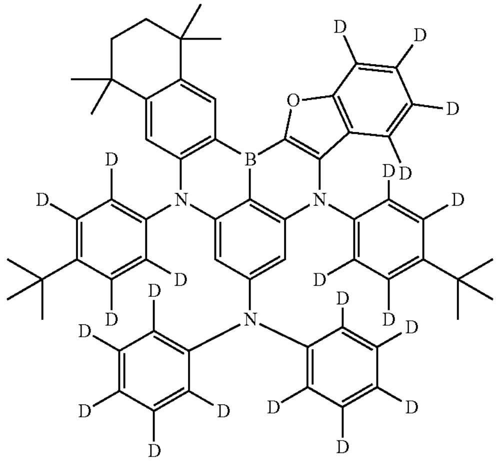
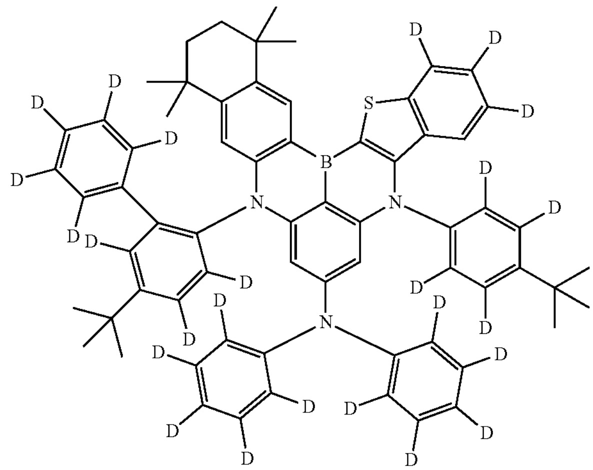
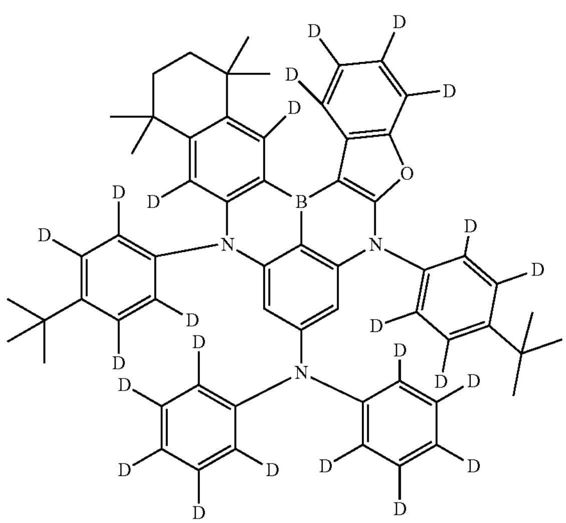
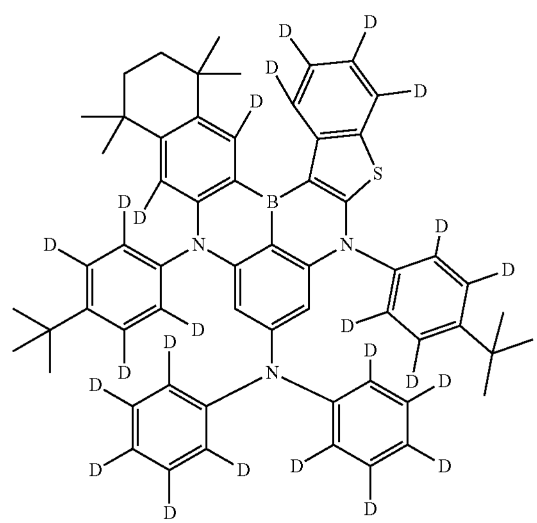
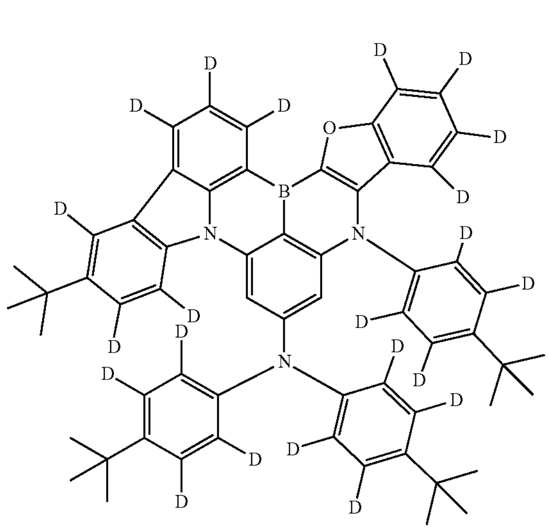
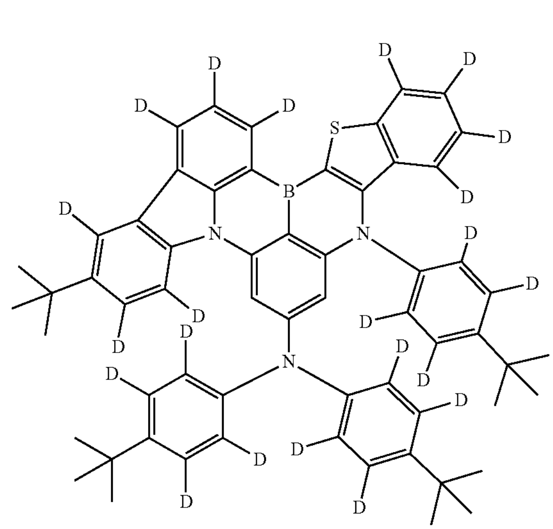

-continued
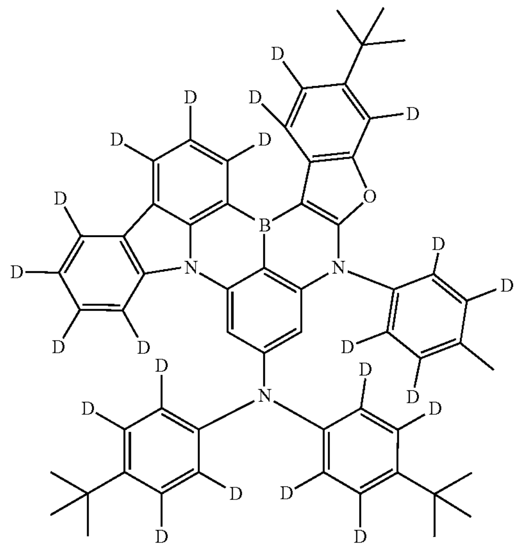
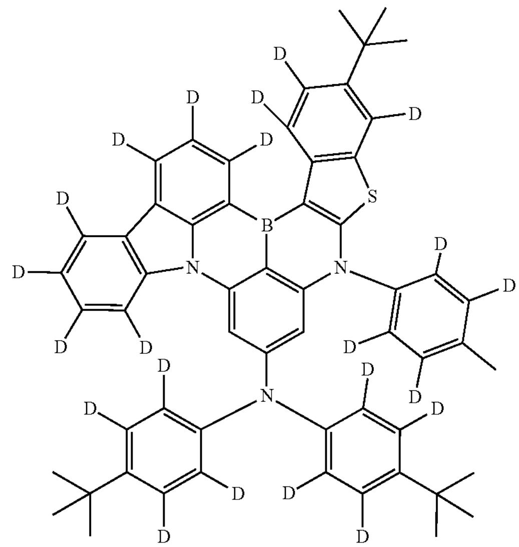
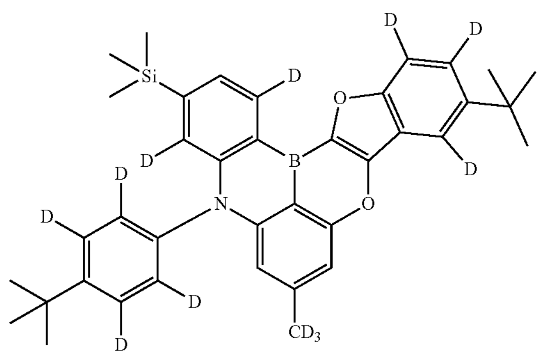
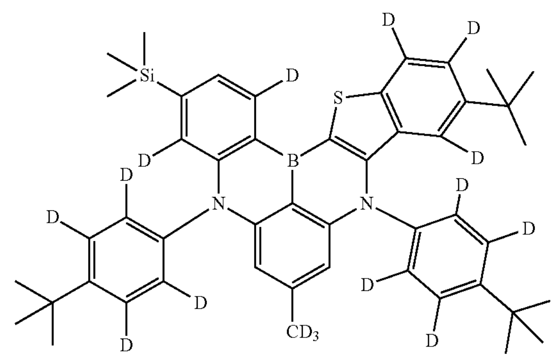
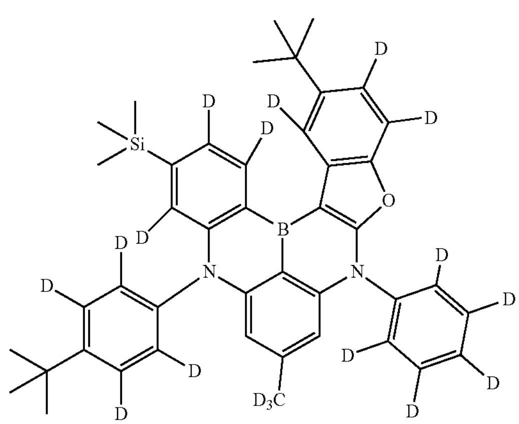
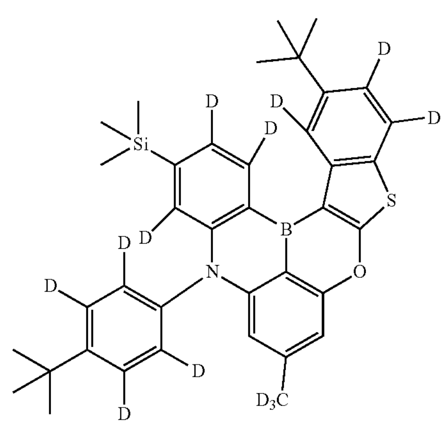

-continued
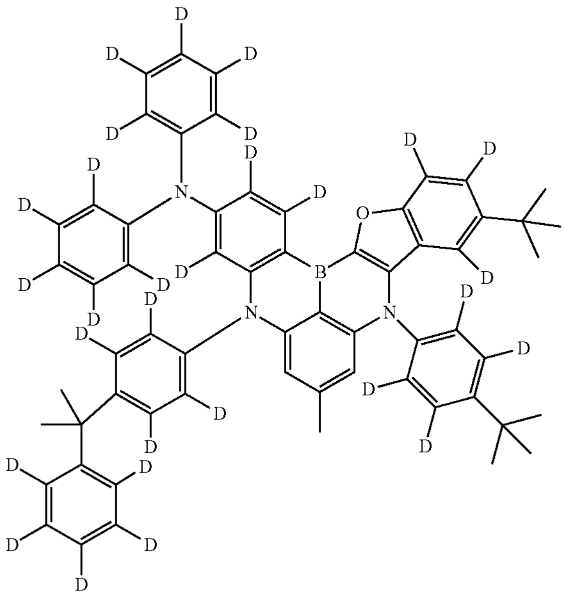
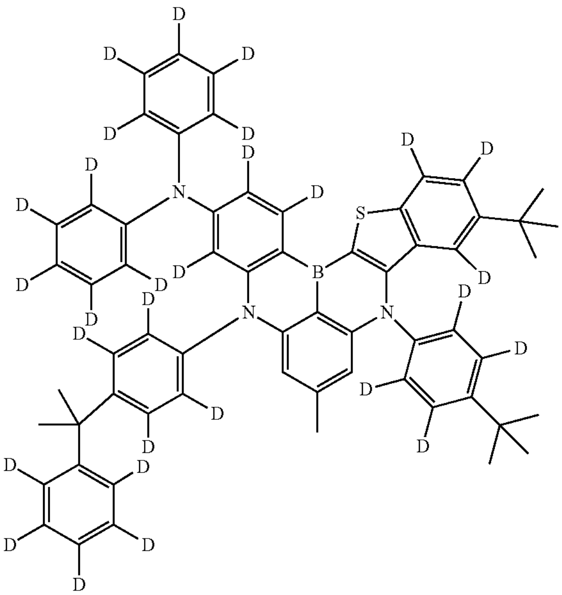
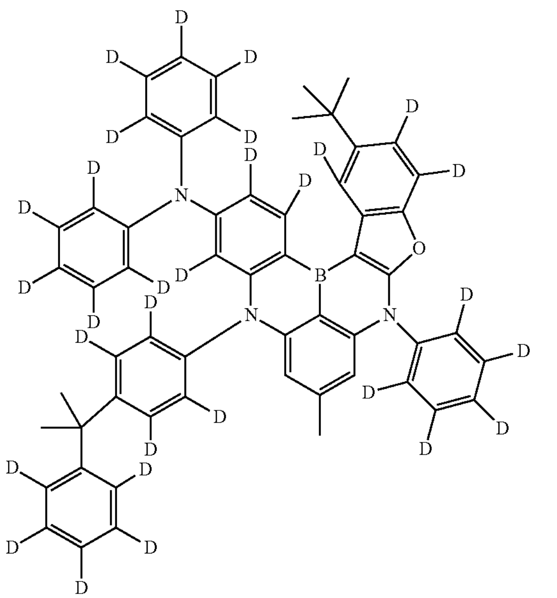
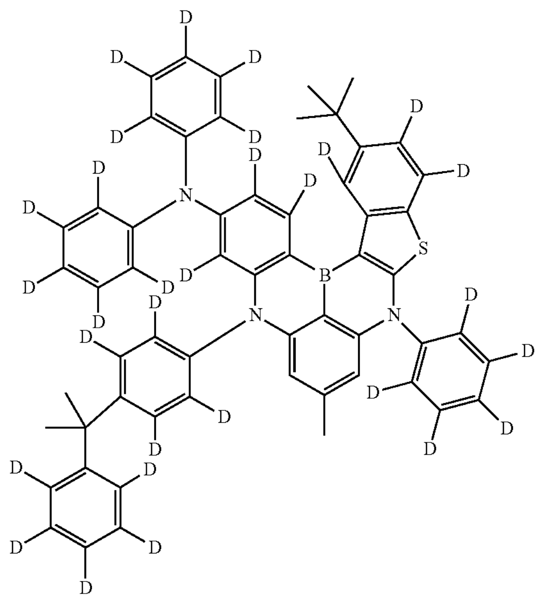
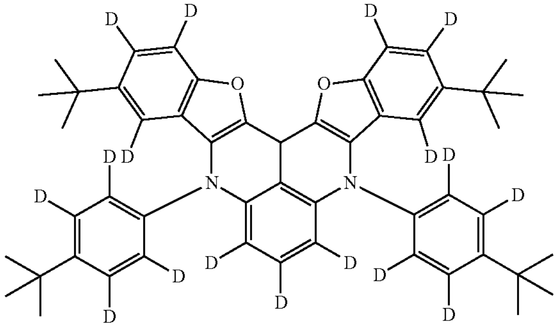
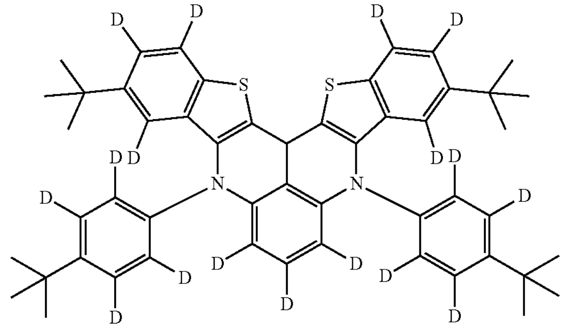

-continued
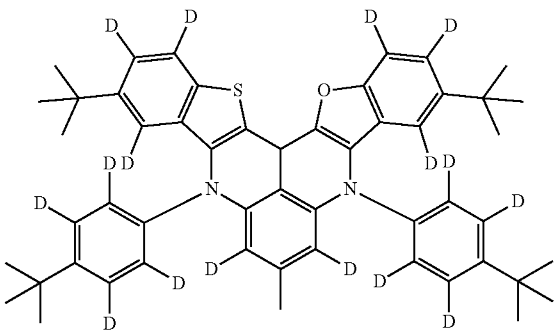
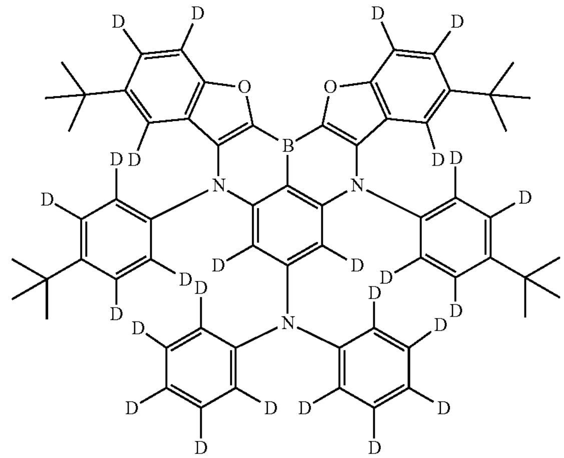
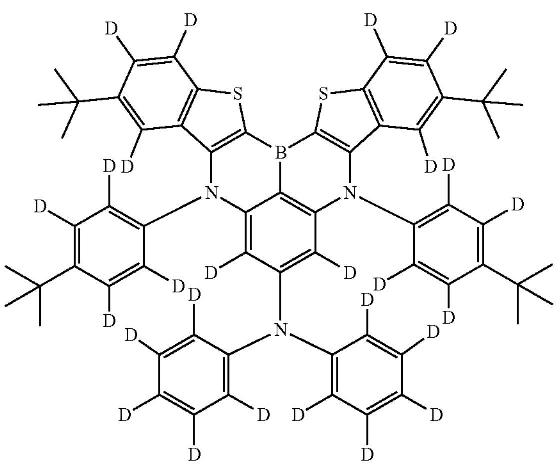
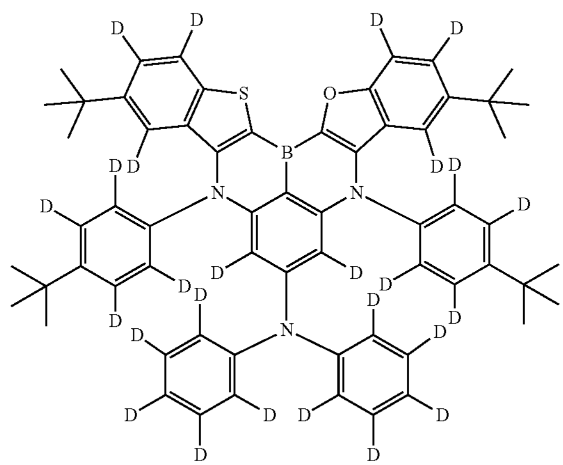
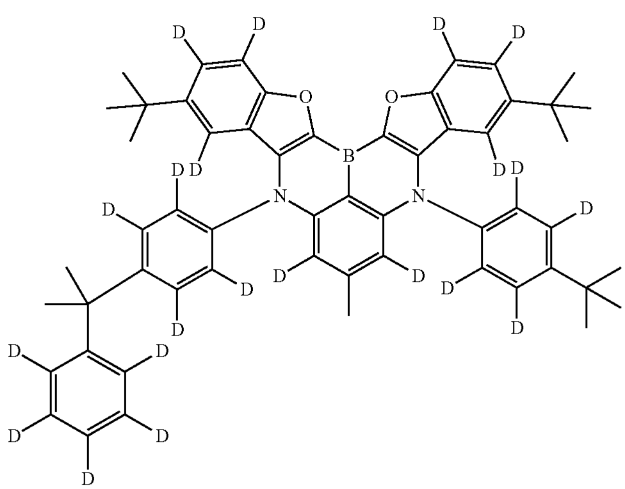

-continued
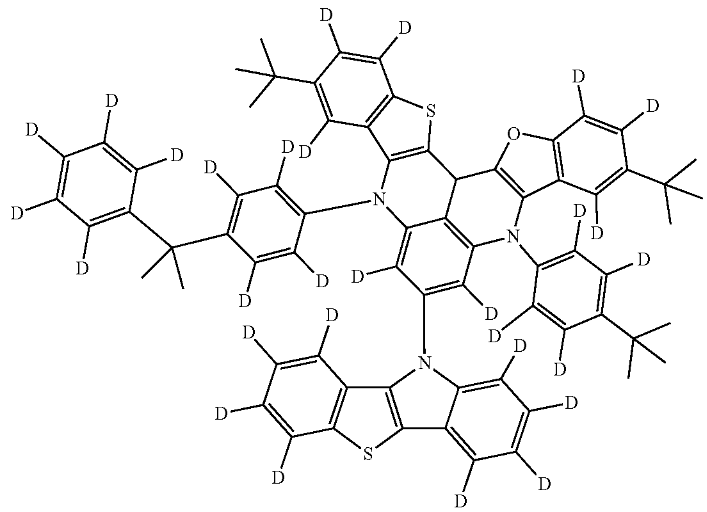
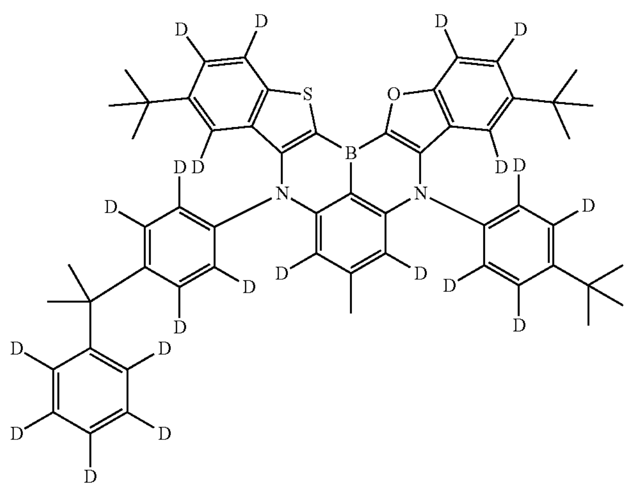
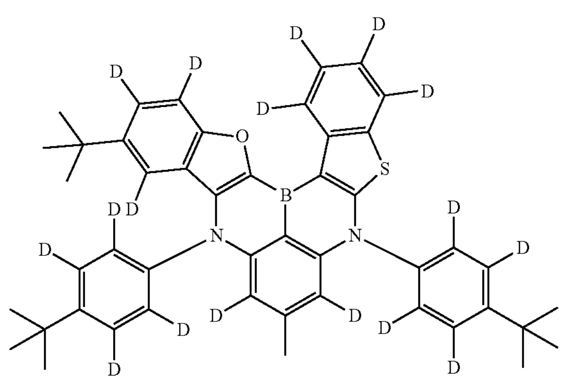
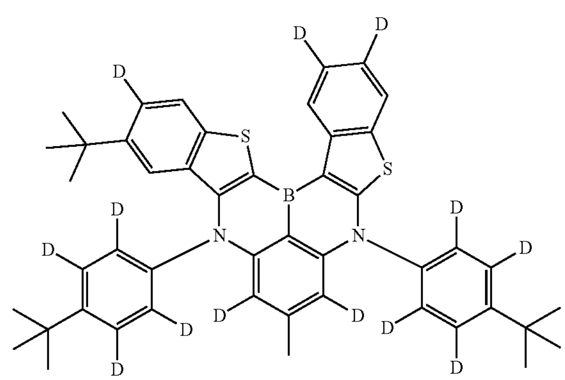

-continued
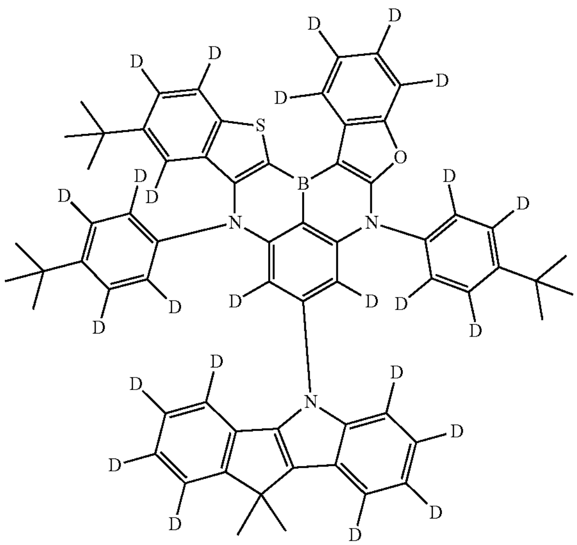
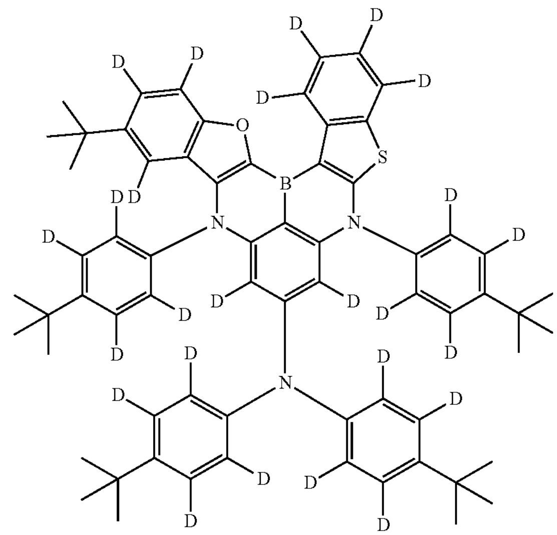
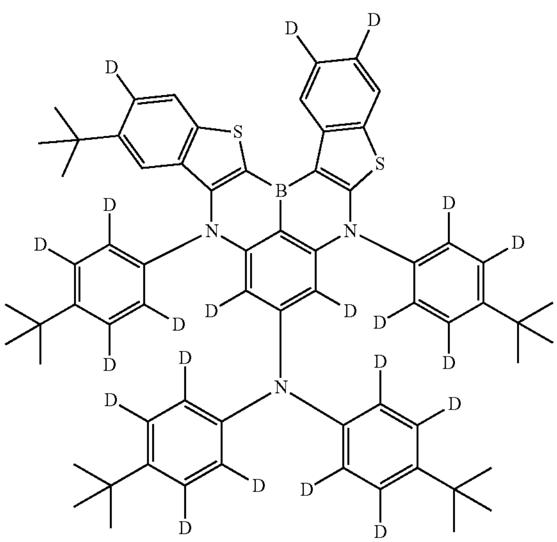
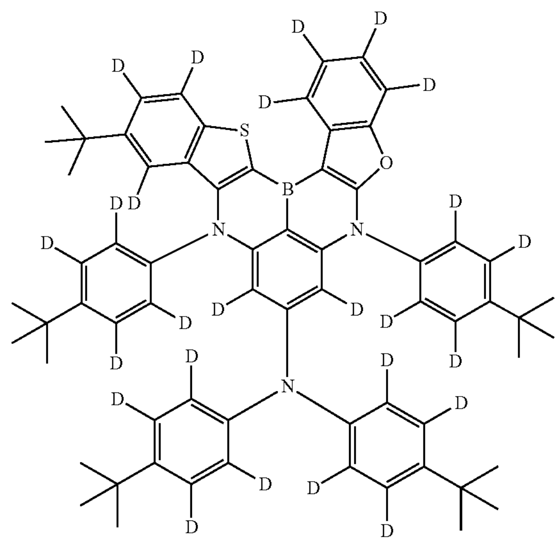
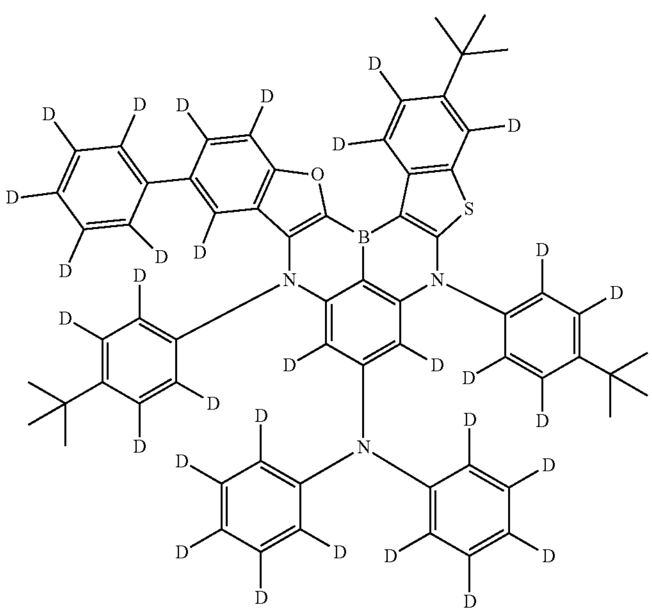

-continued
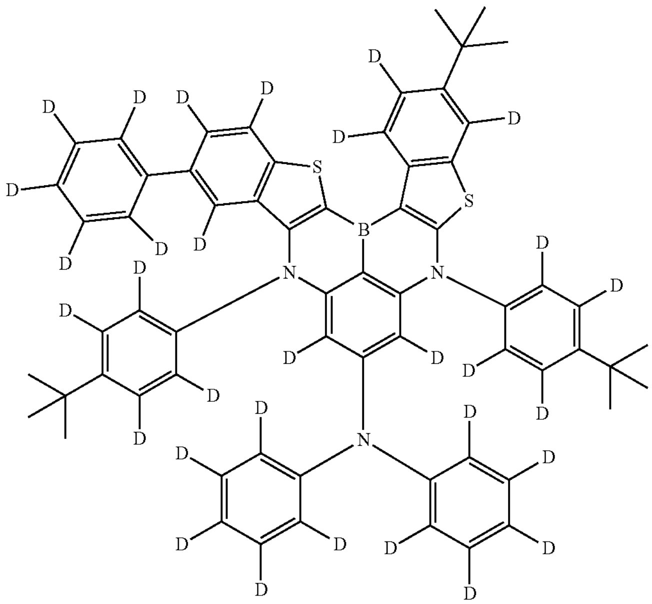
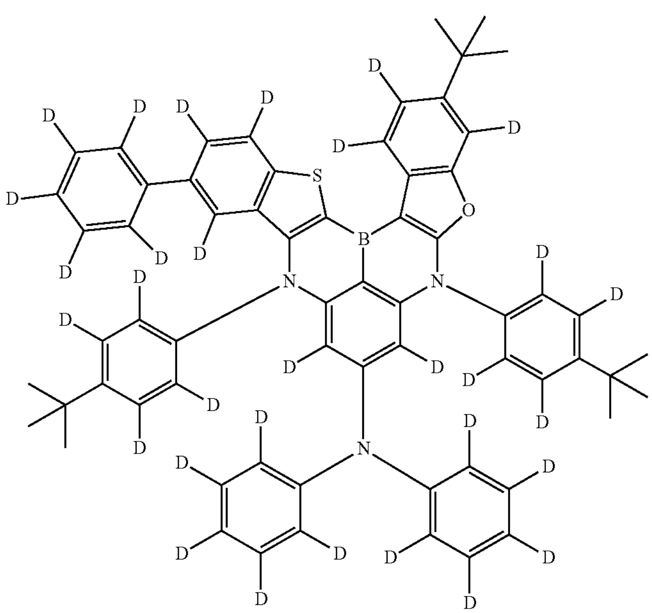

-continued
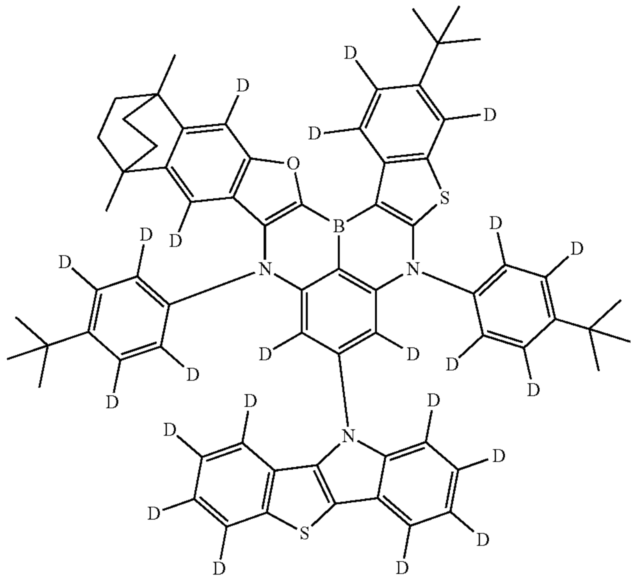
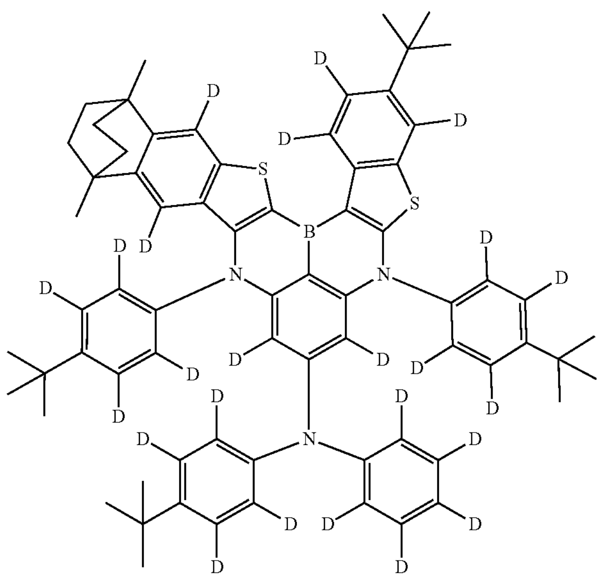
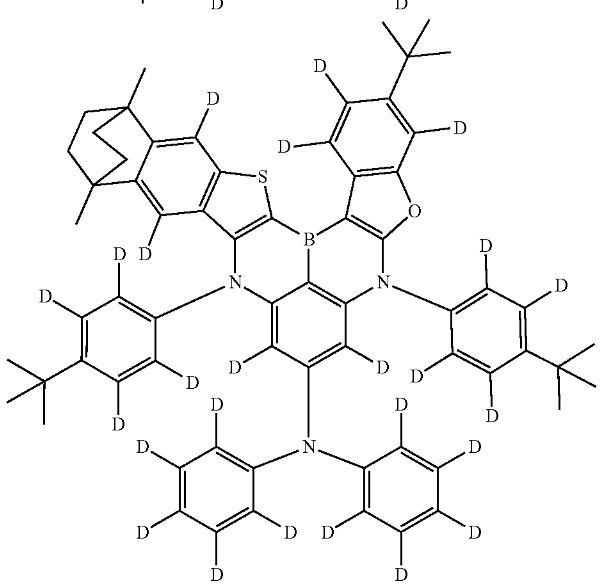

-continued
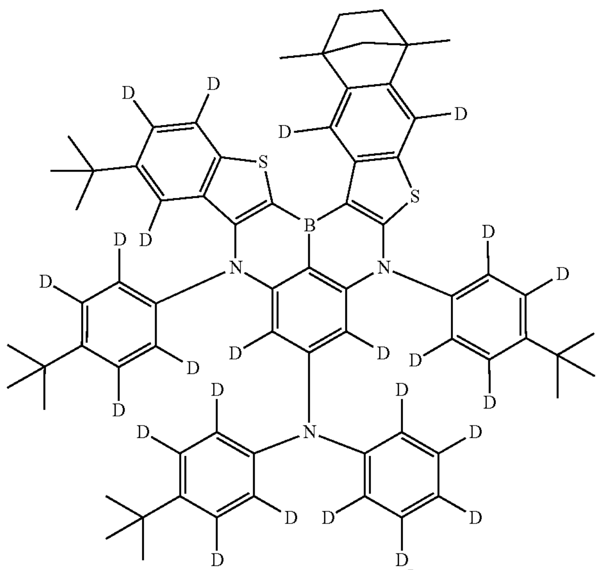
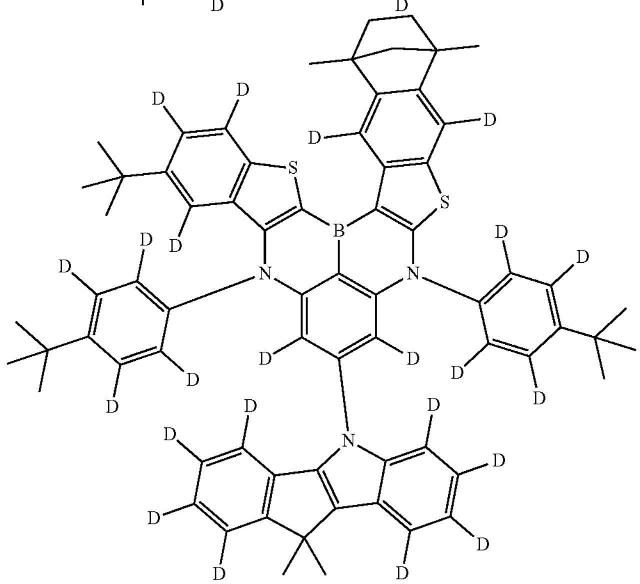
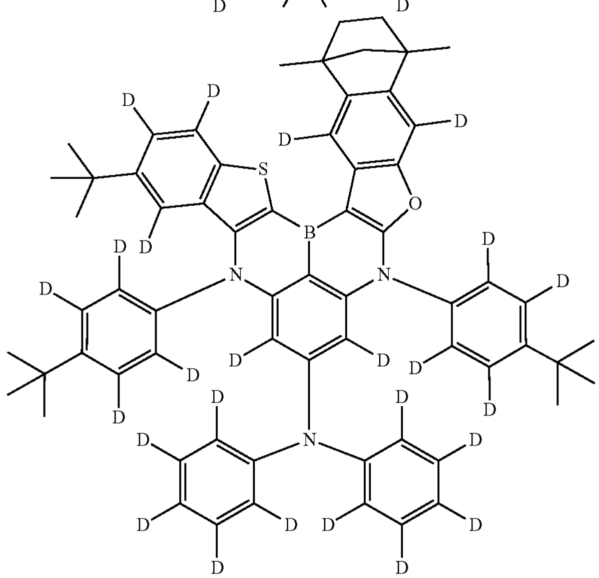

-continued
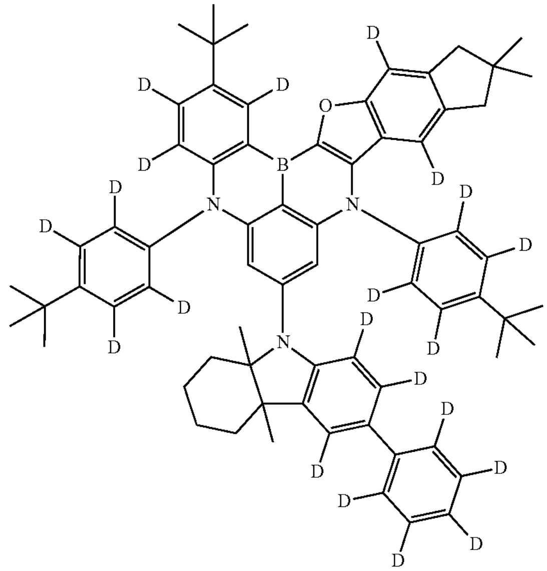
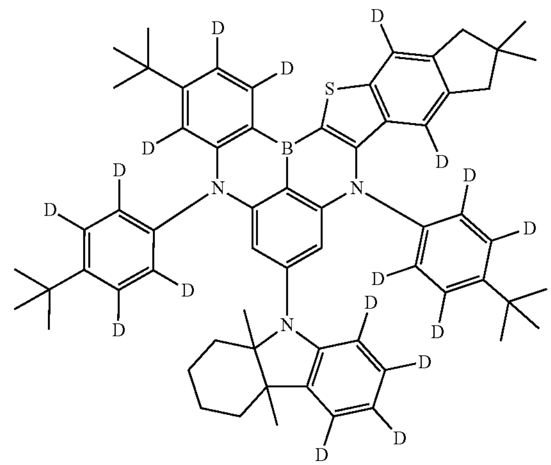
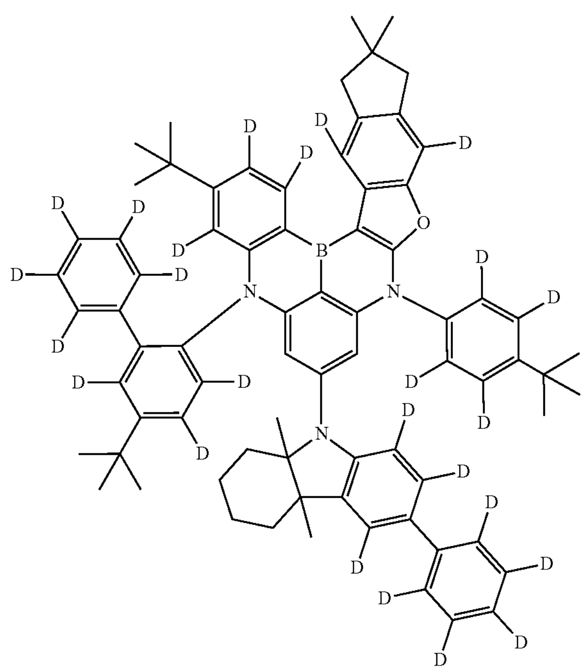
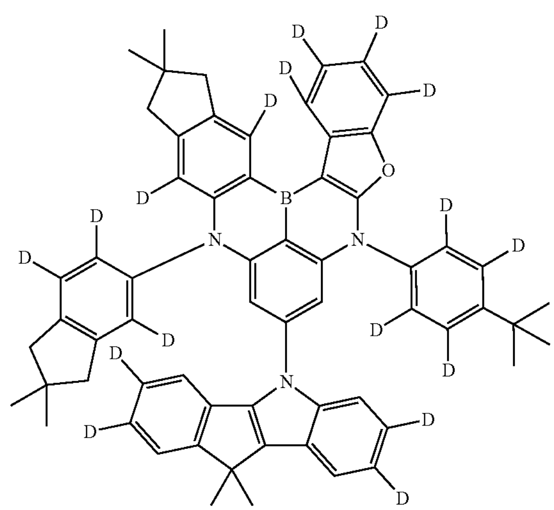

-continued
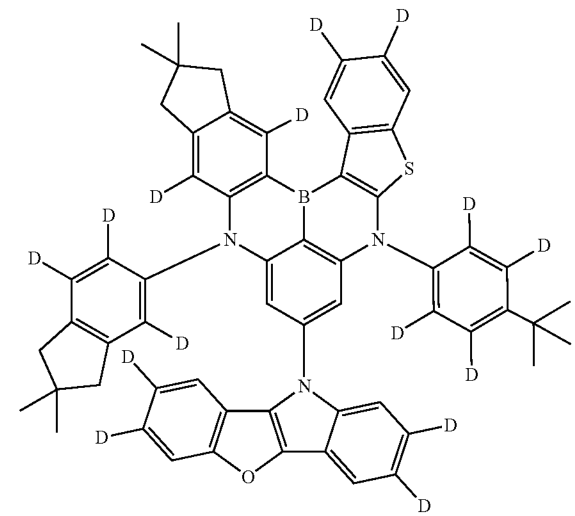
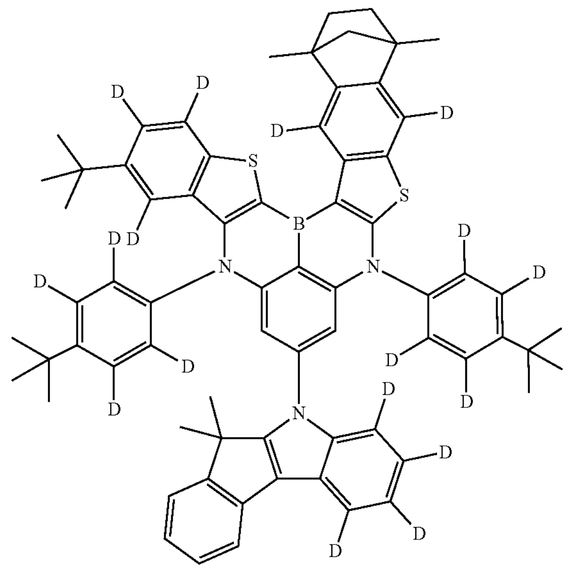
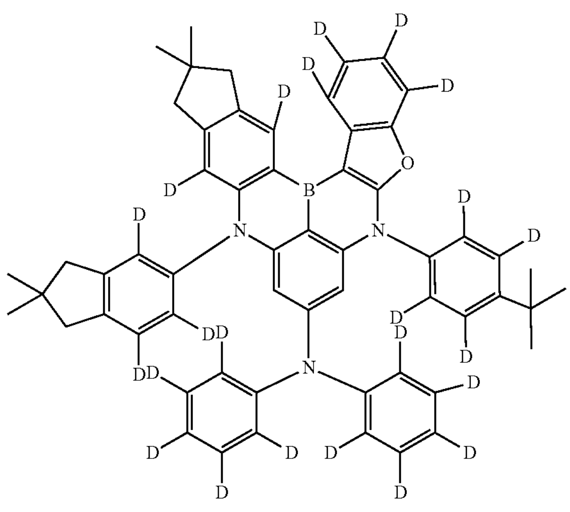
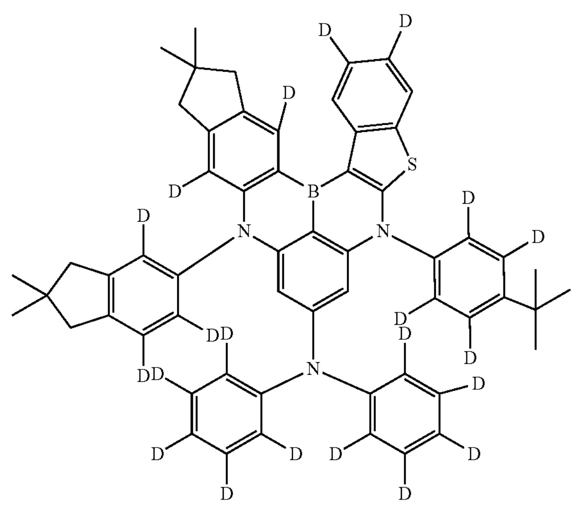
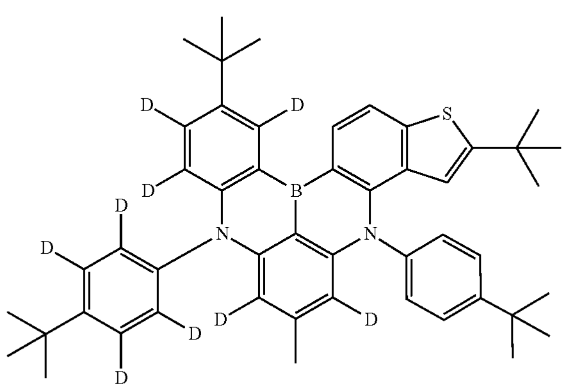

-continued
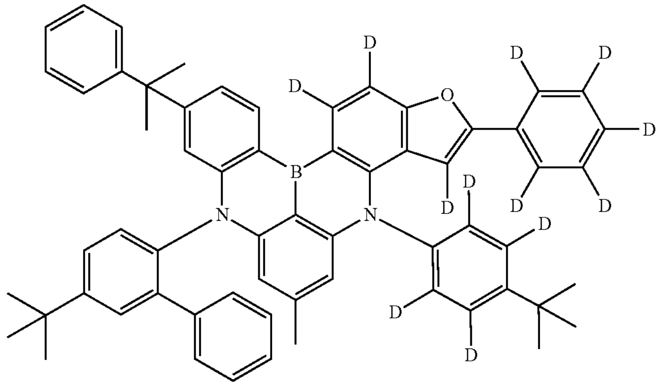
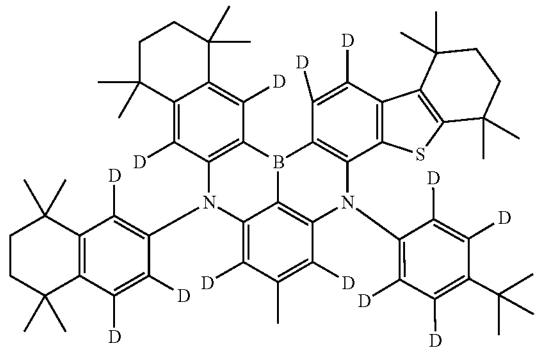
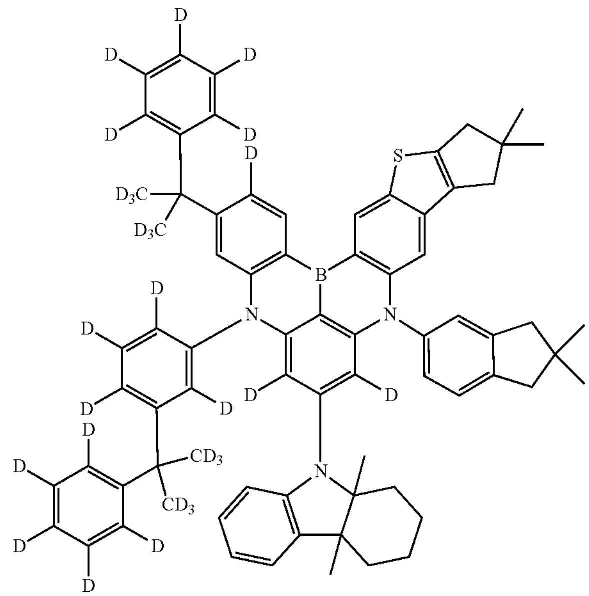
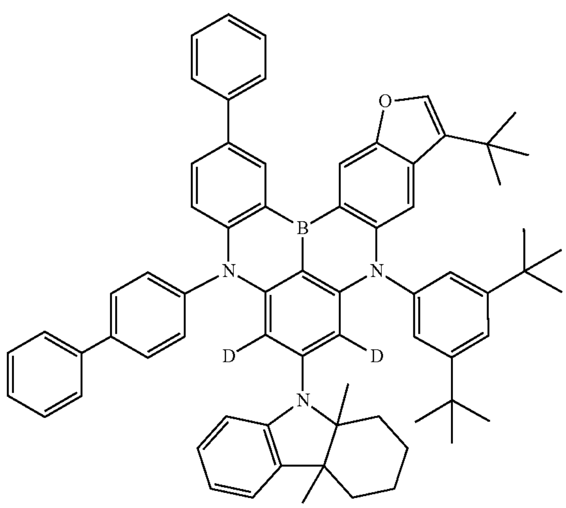
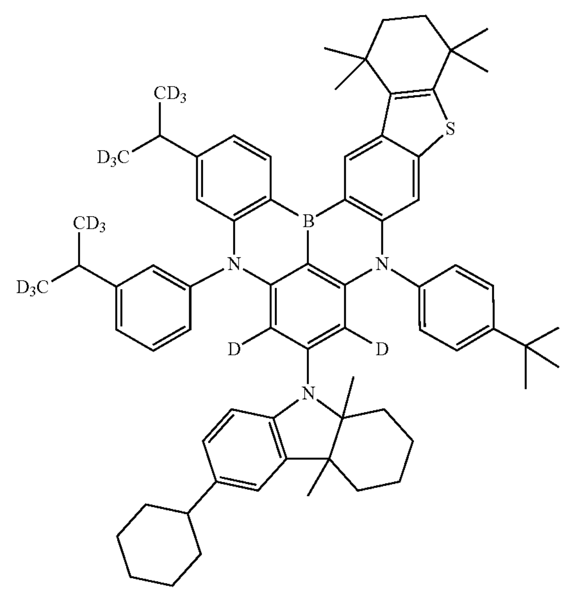

-continued
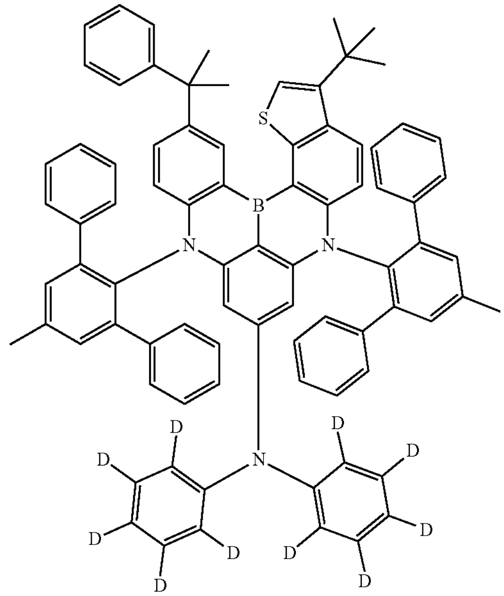
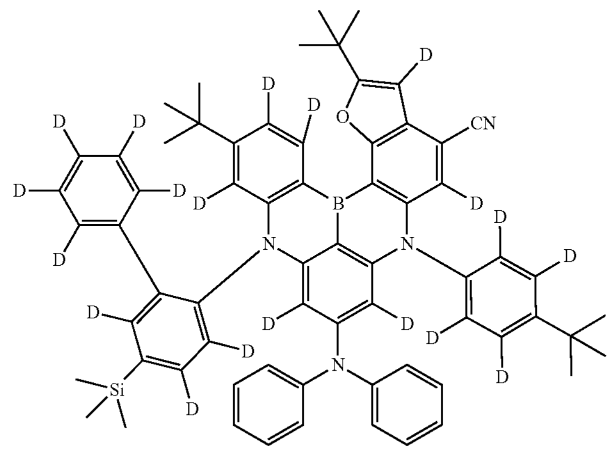
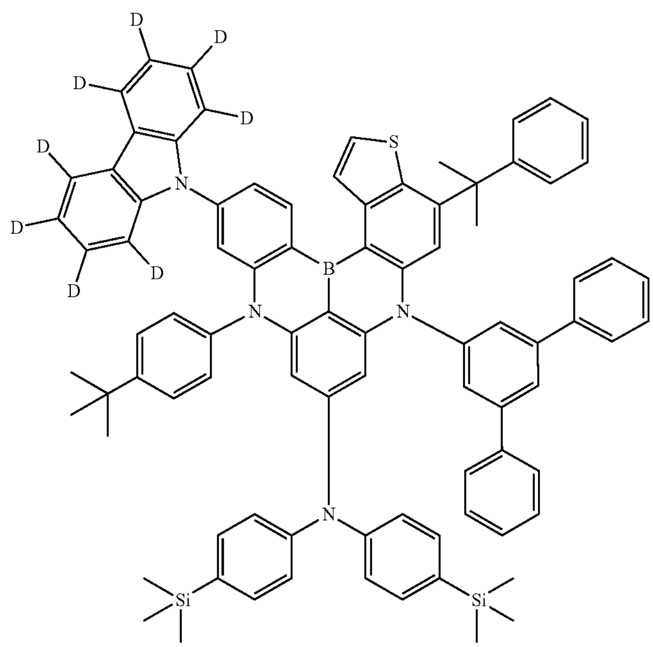
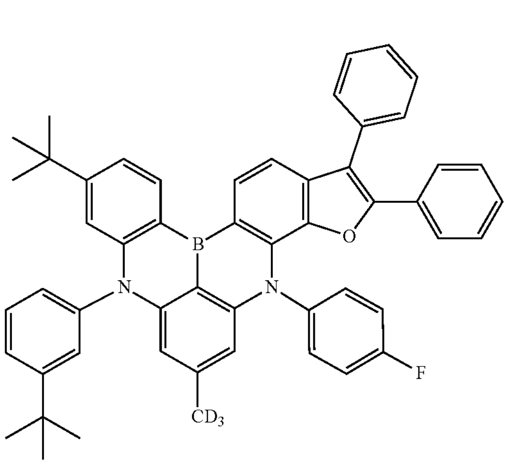
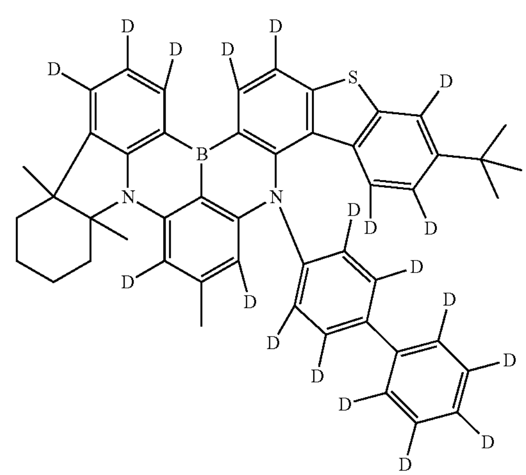

-continued
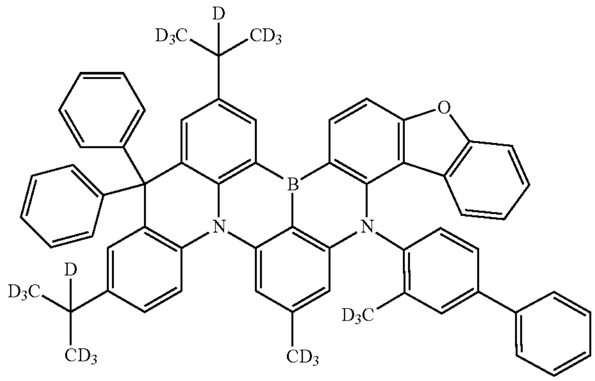
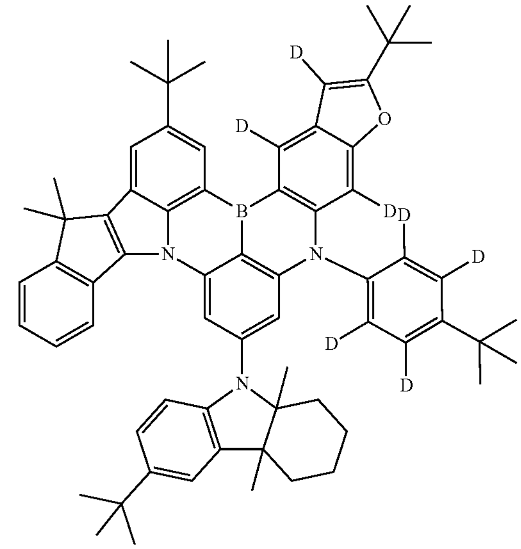
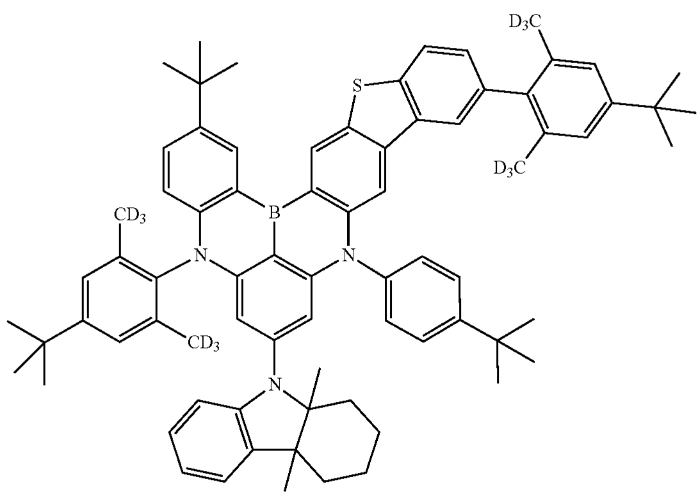
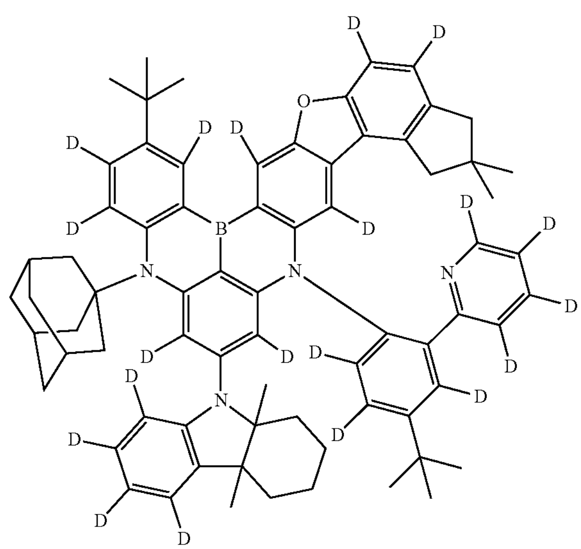
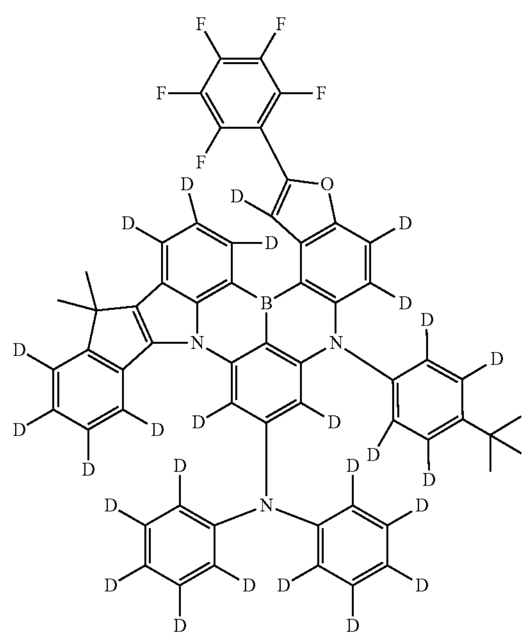

-continued
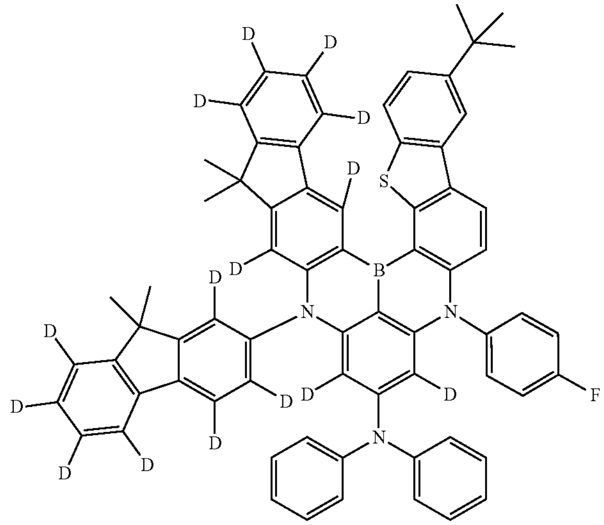
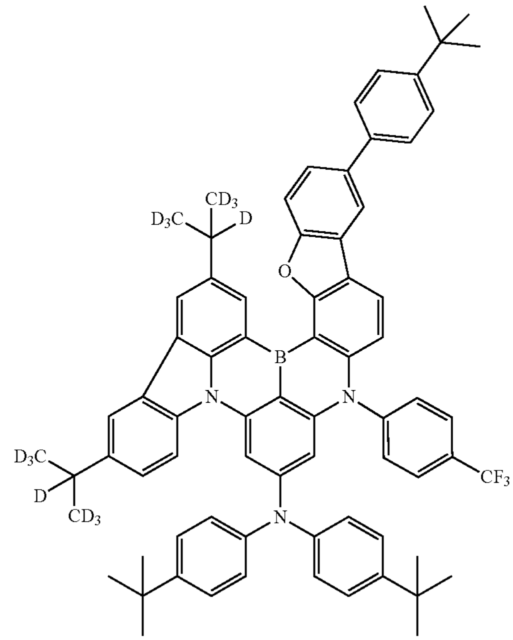
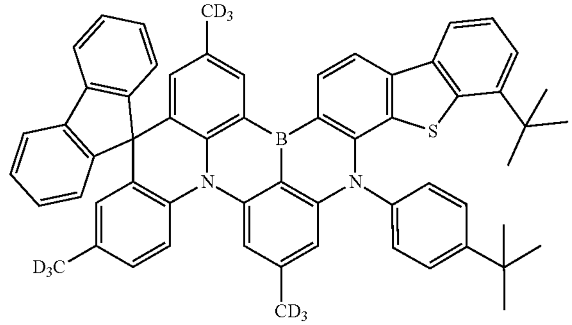
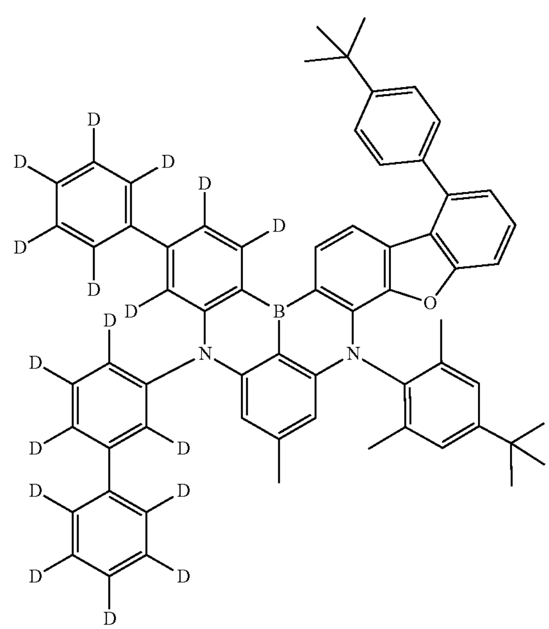

-continued
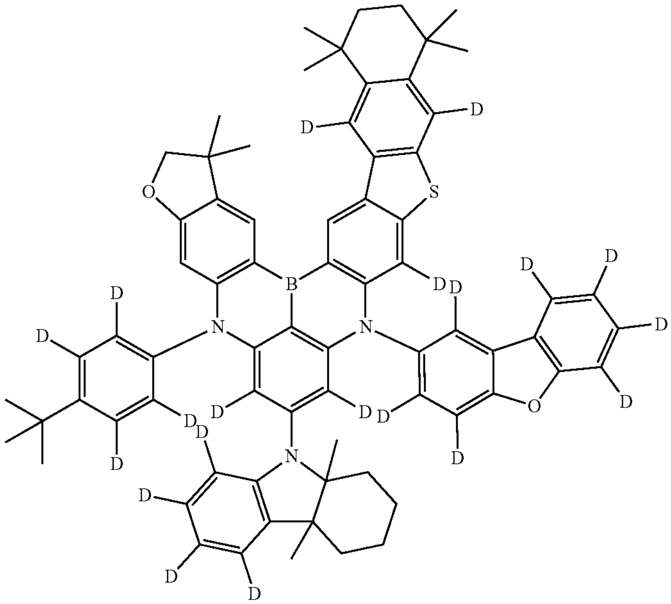
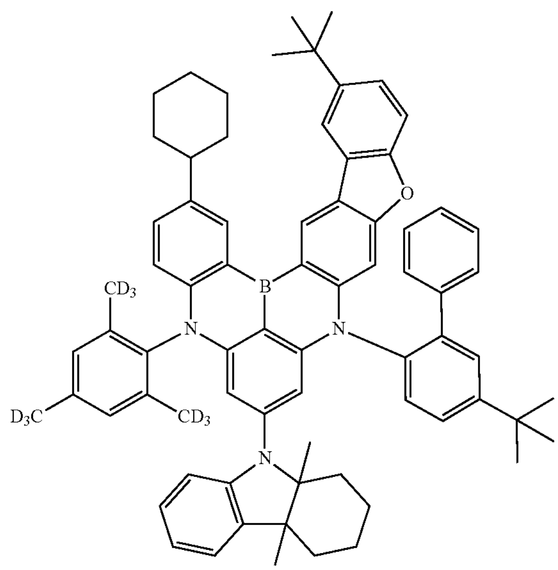
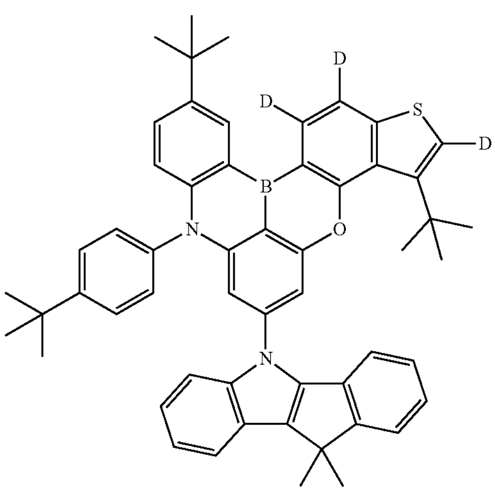
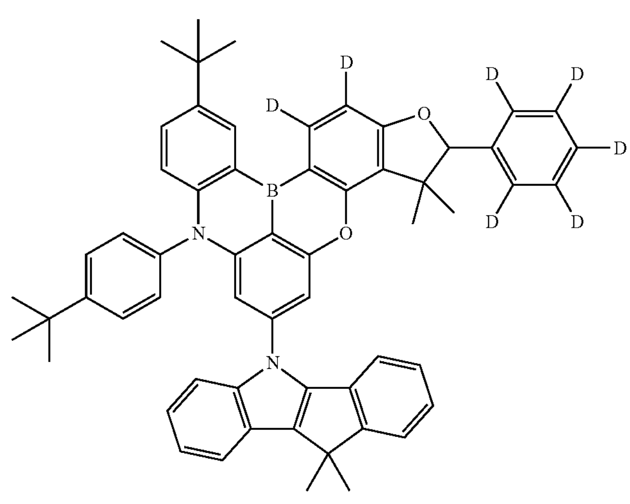

-continued
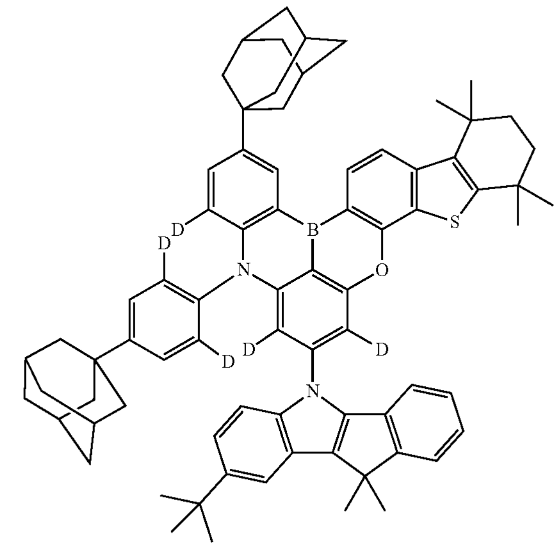
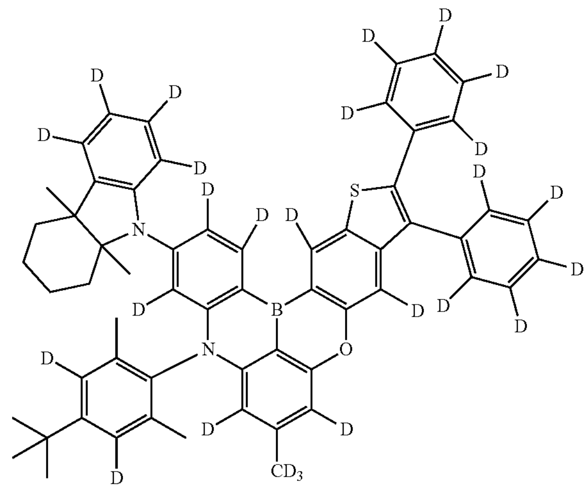
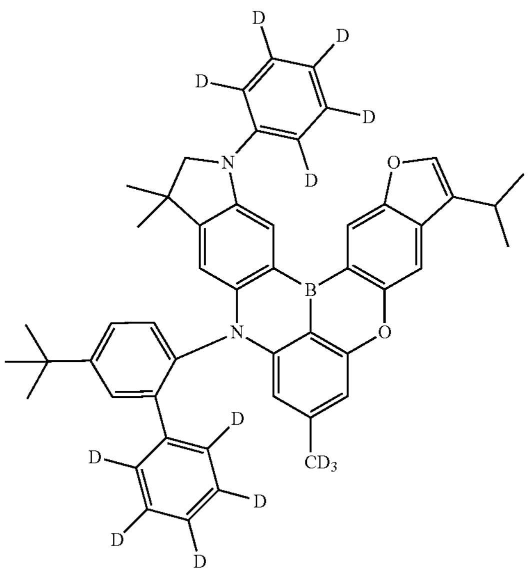
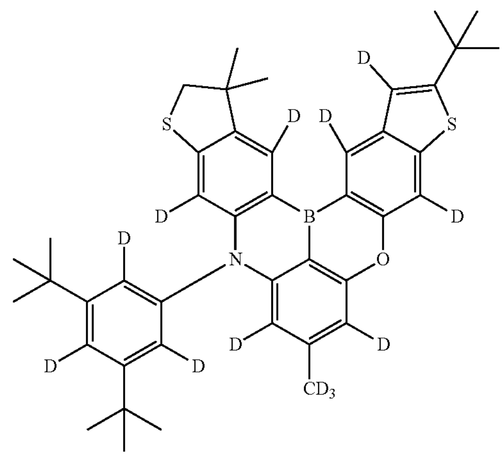
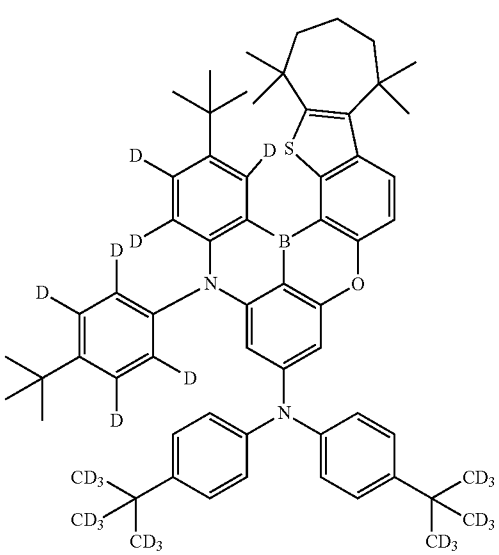
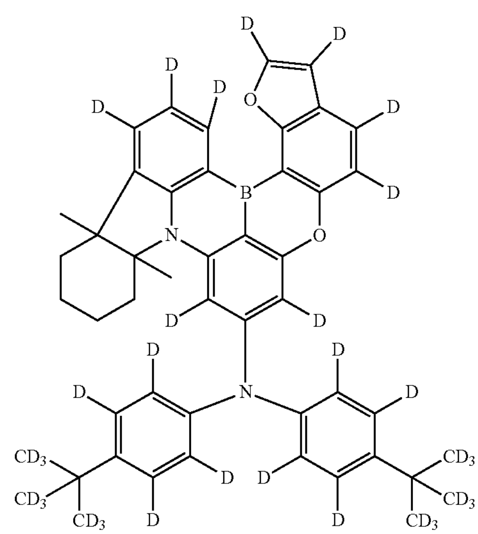

-continued
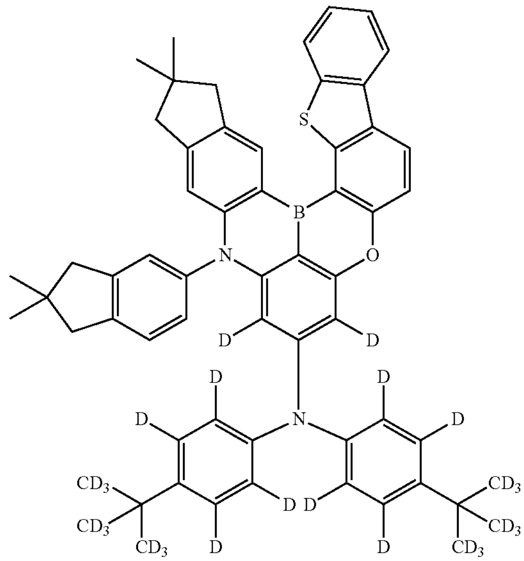
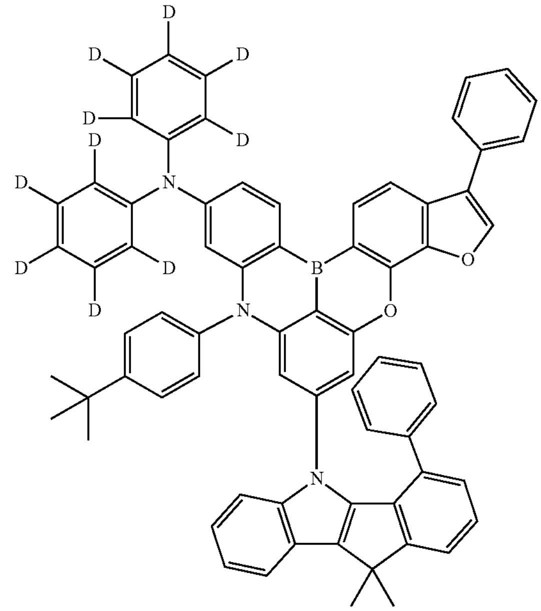
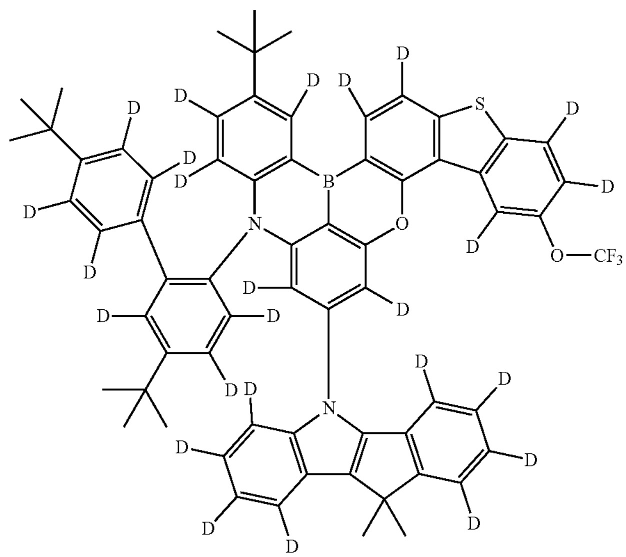
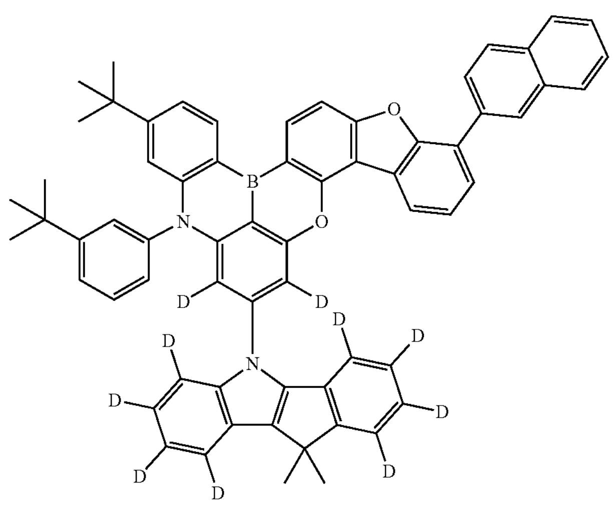
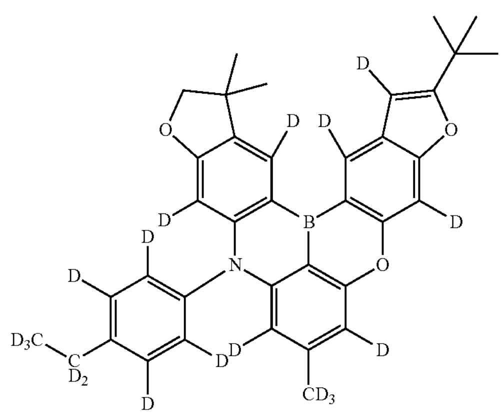

-continued
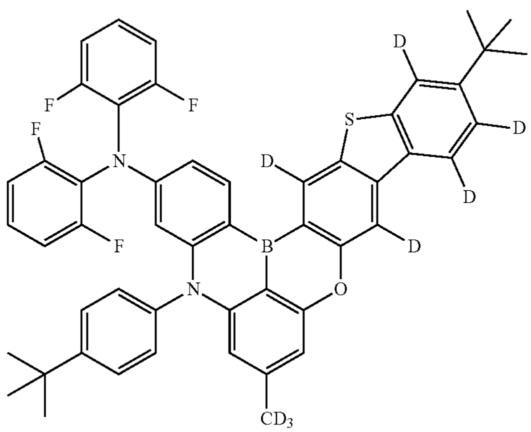
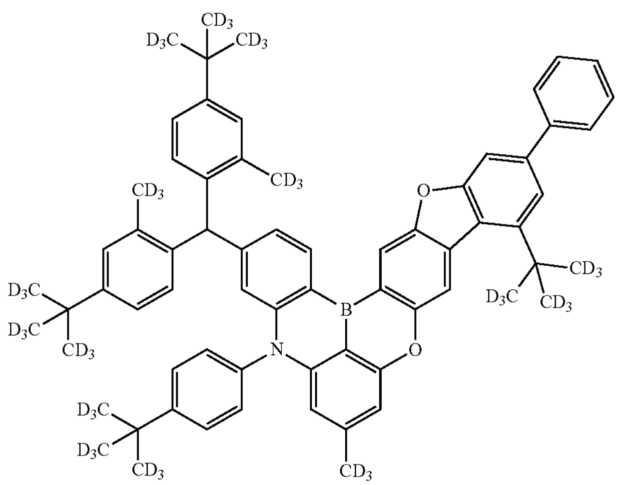
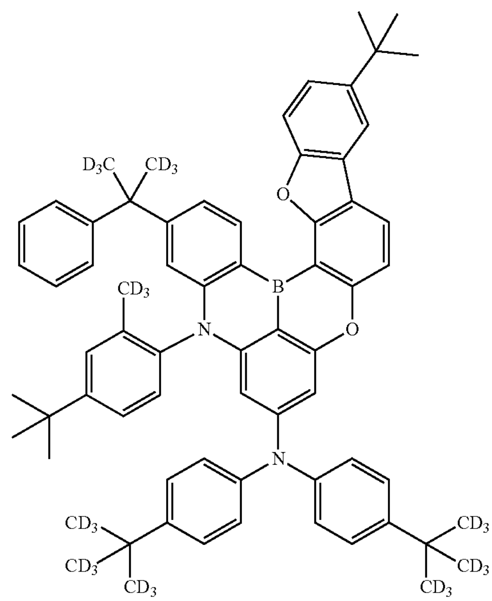
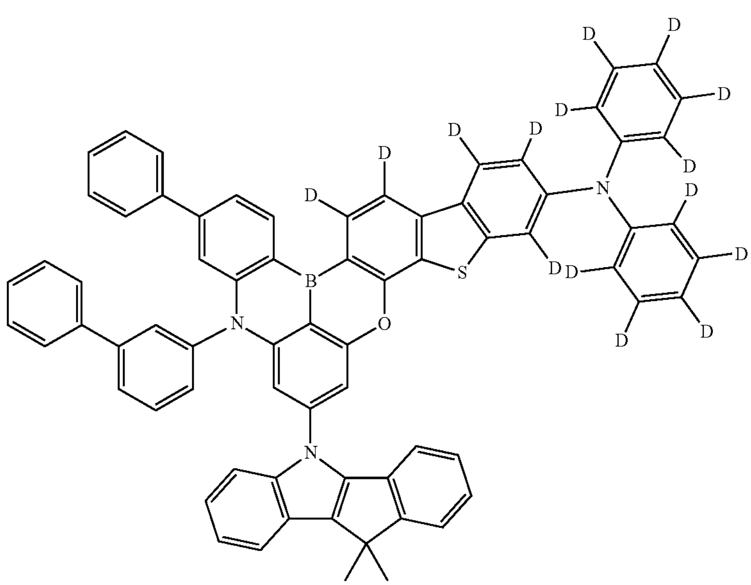

-continued
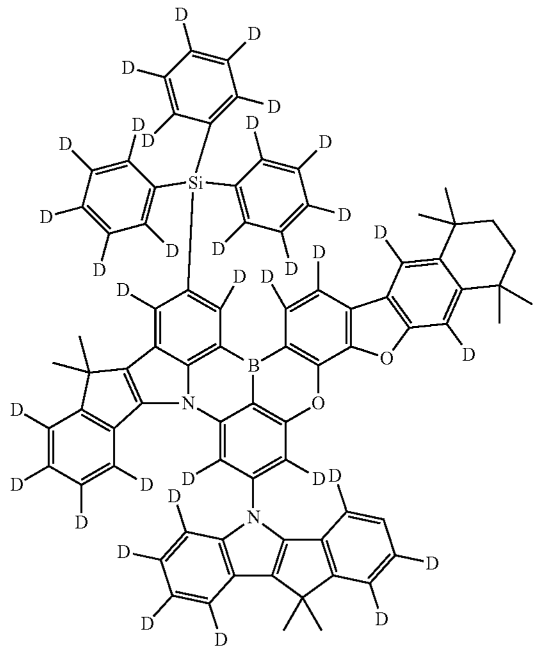
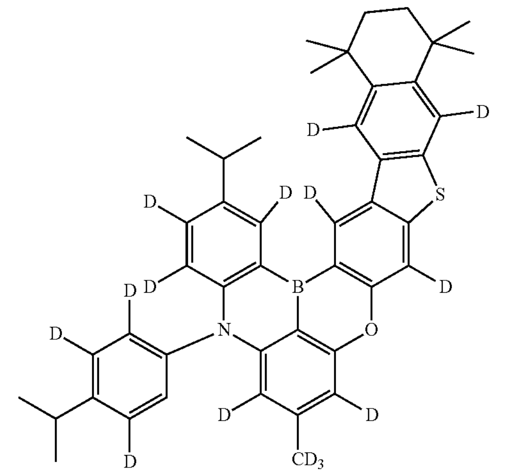
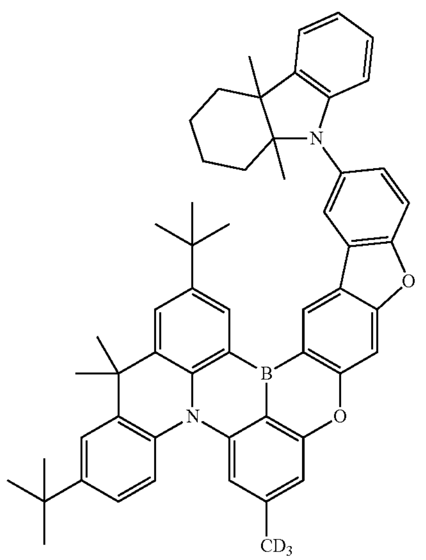
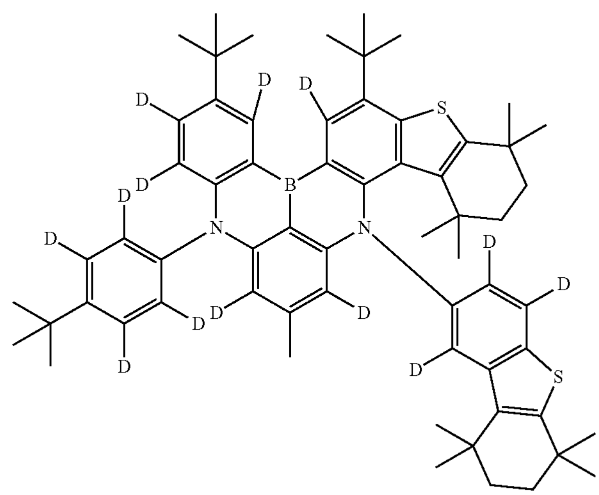
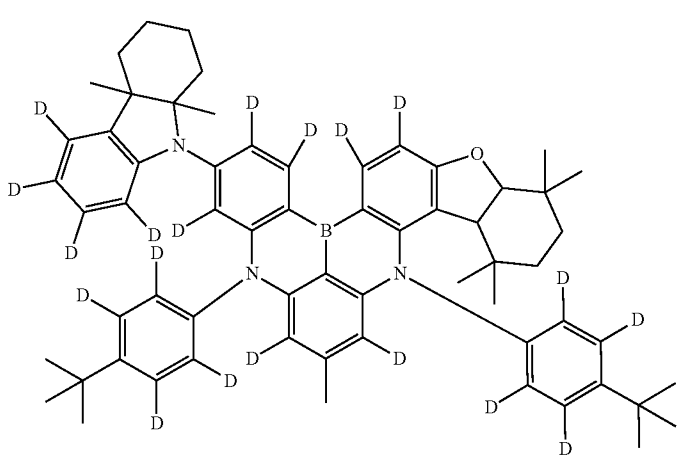

-continued
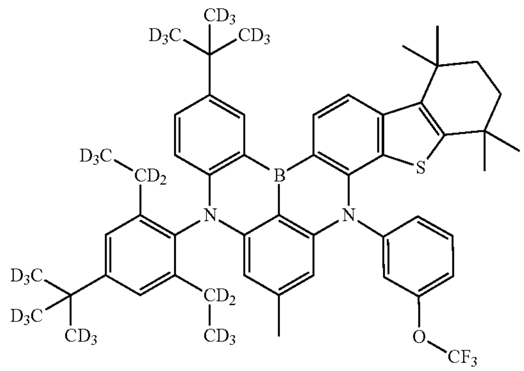
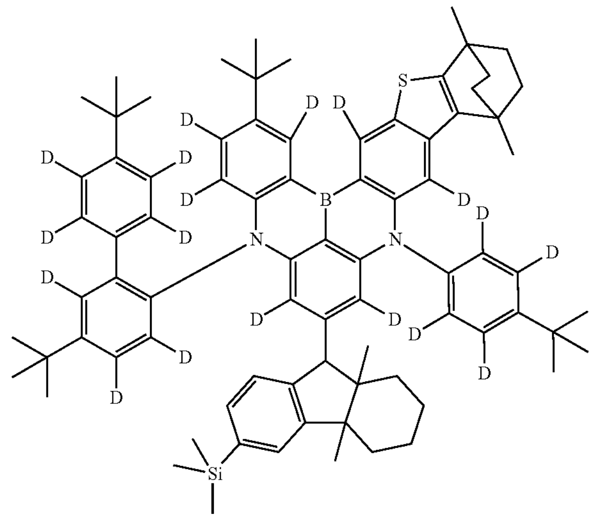
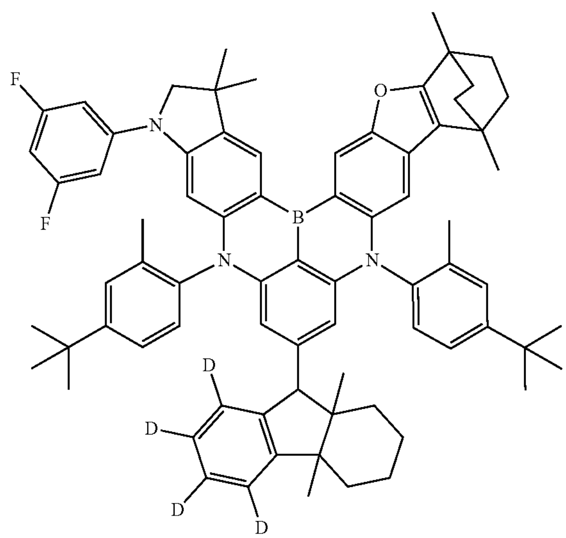
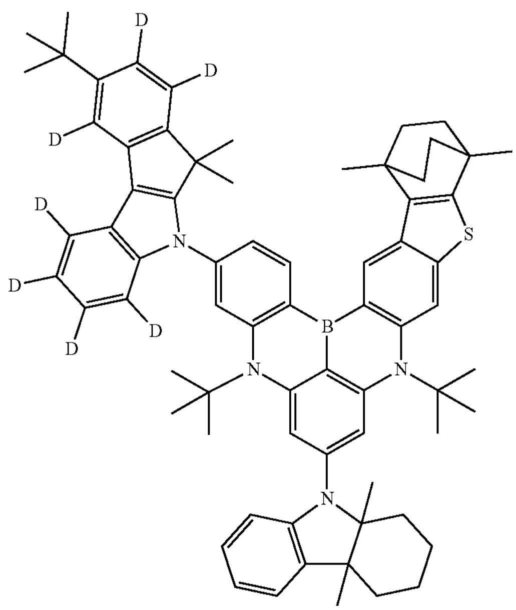
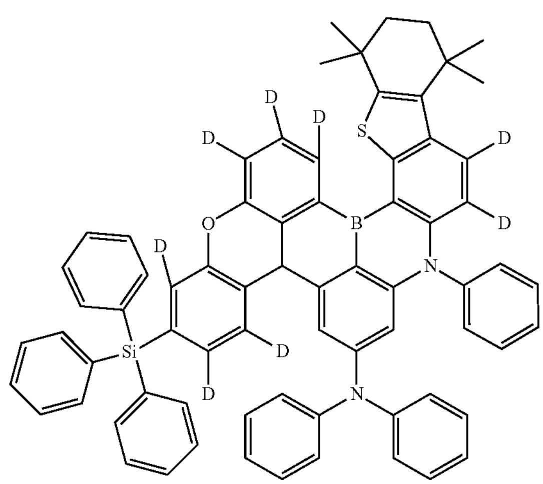
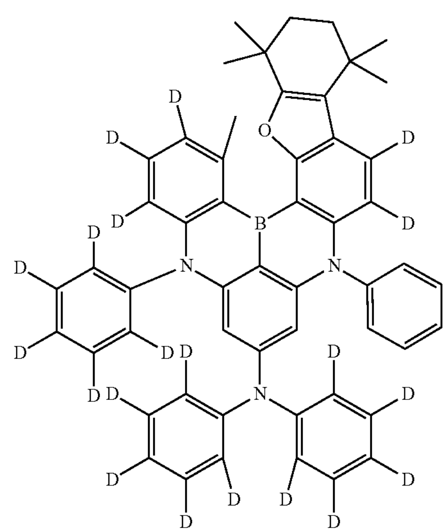

-continued
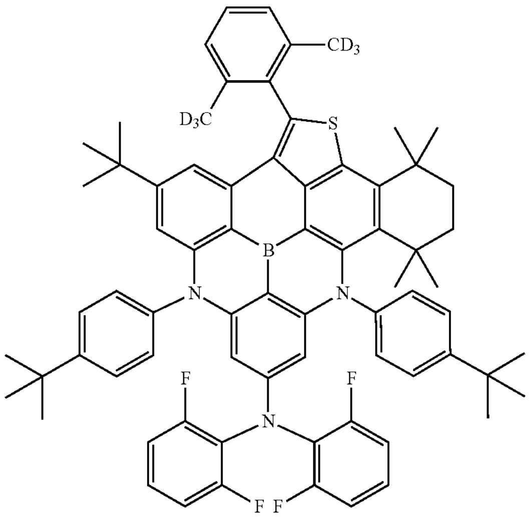
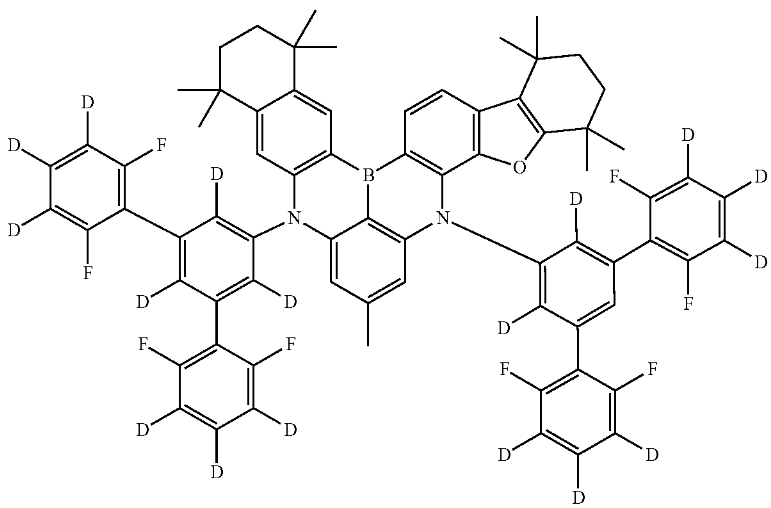
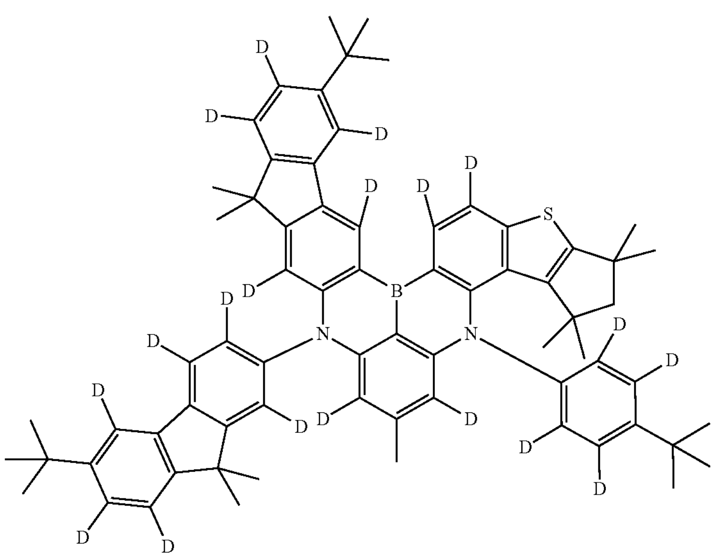

-continued
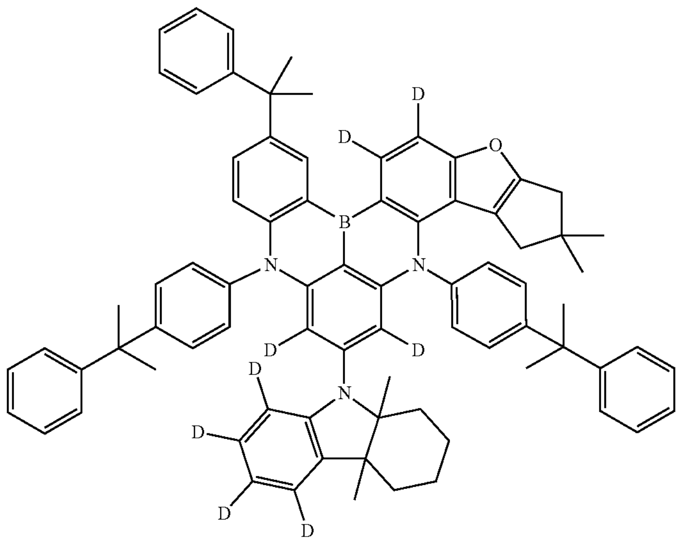
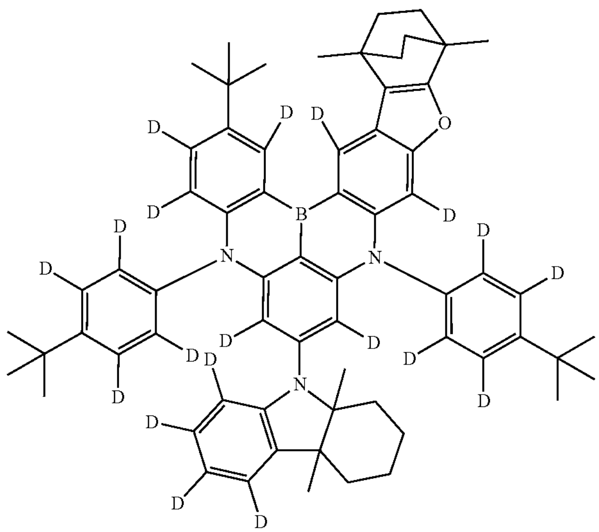
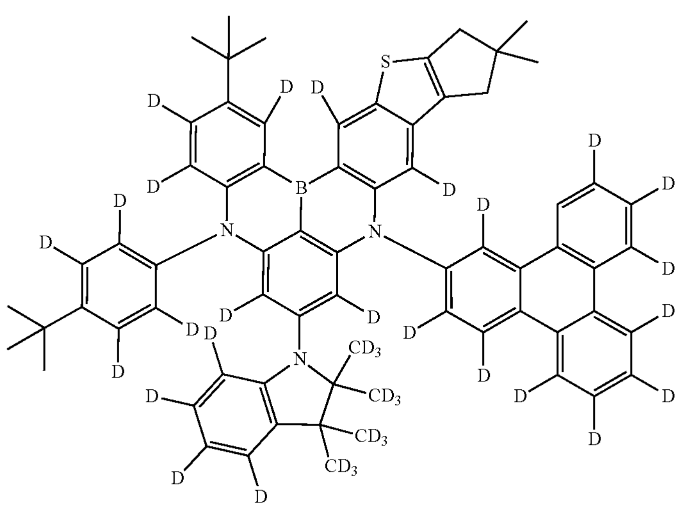

-continued
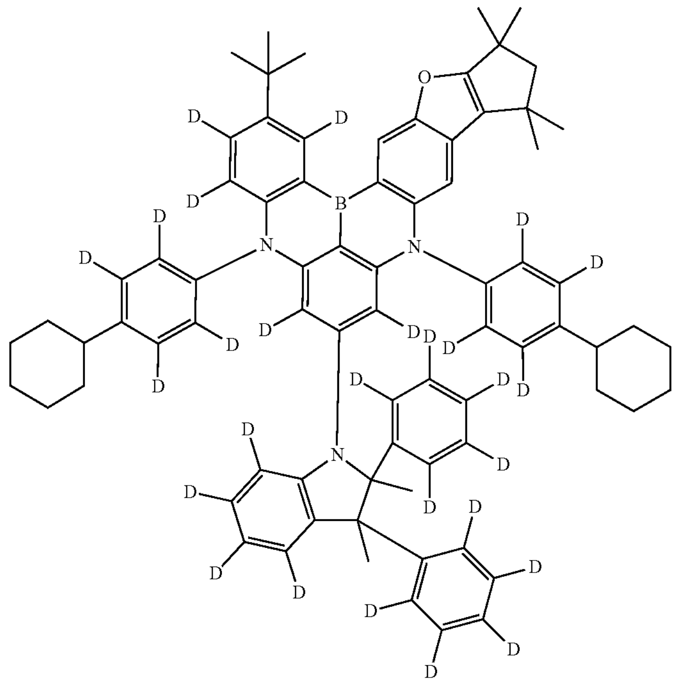
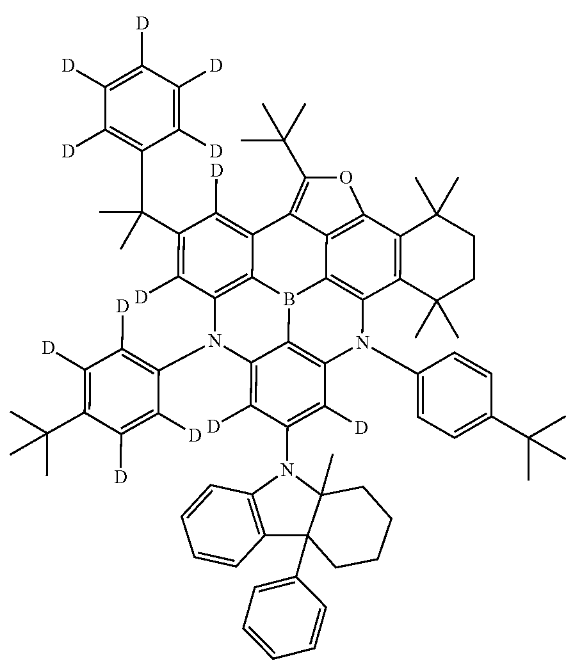

-continued
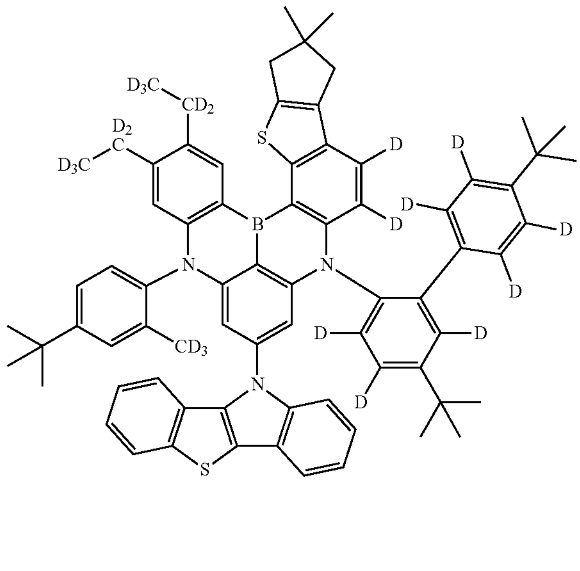
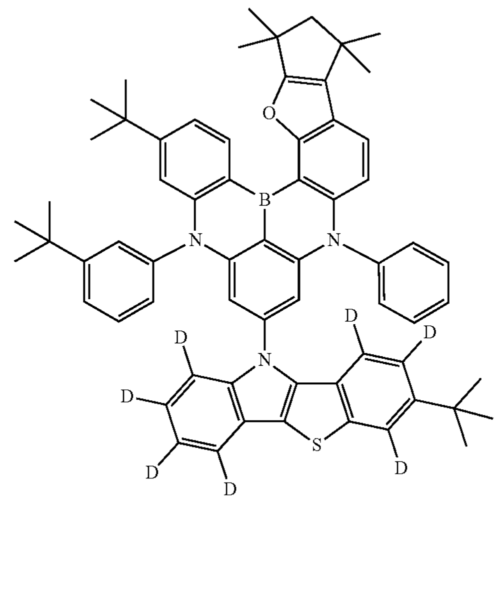
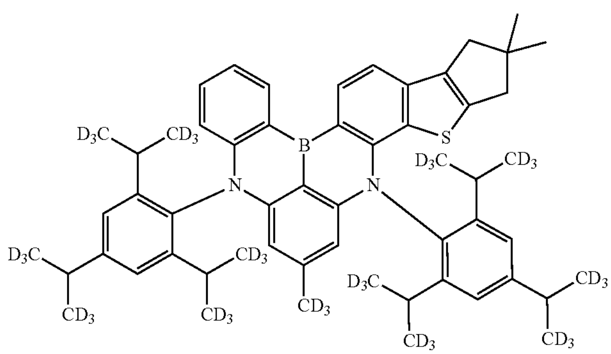
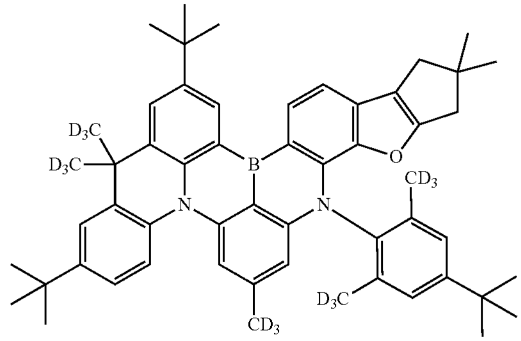
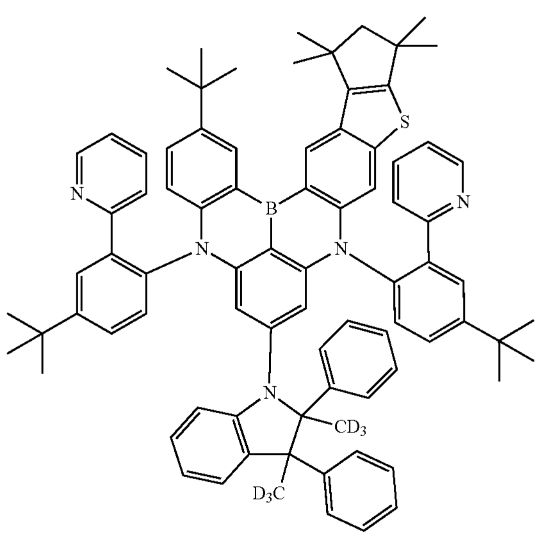
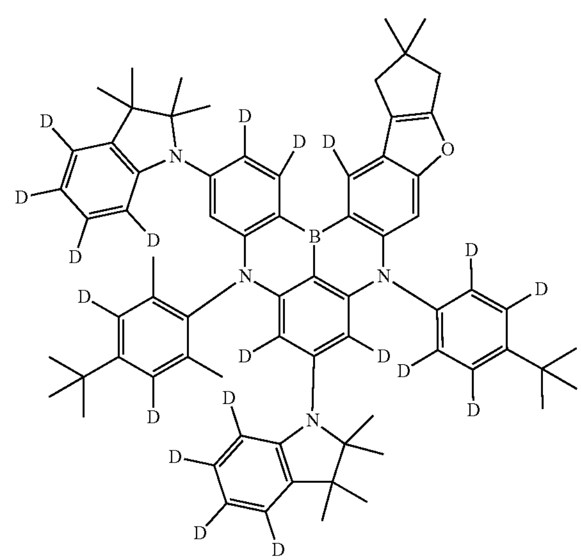

-continued
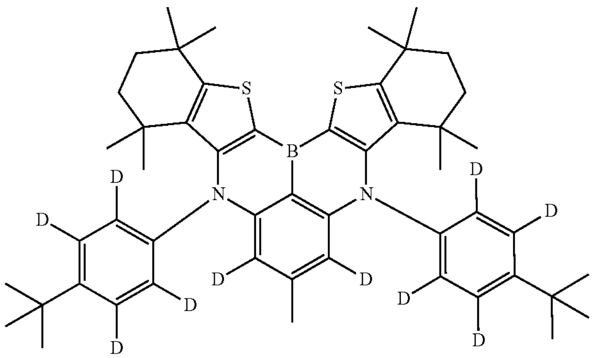
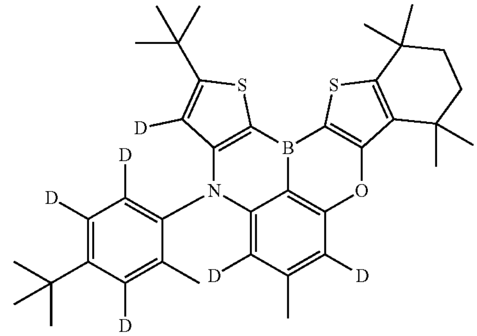
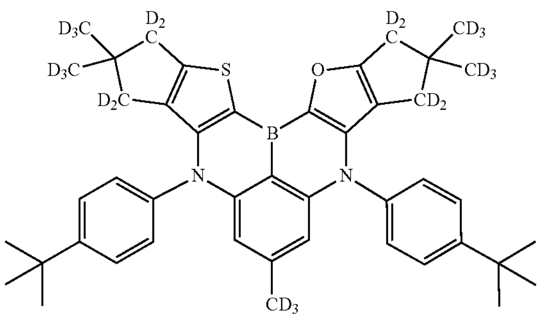
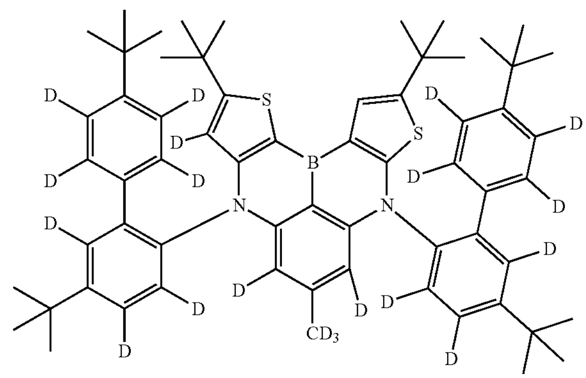
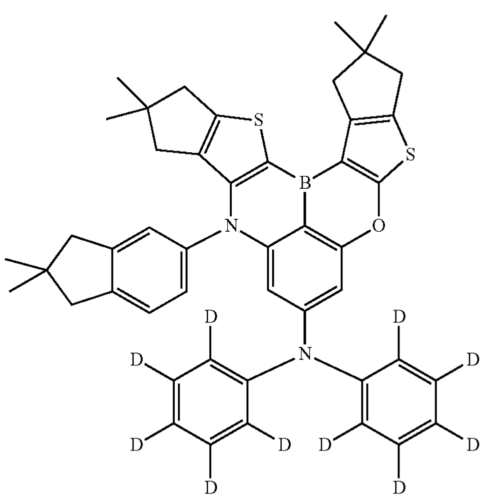
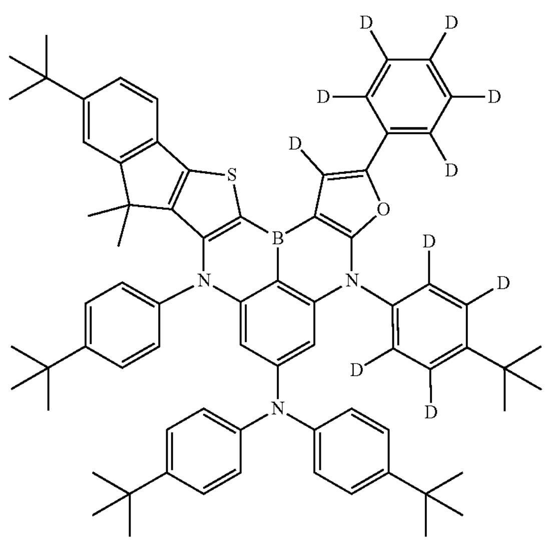

-continued
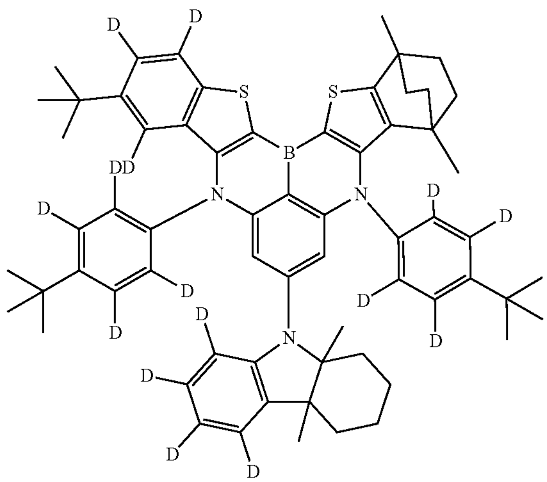
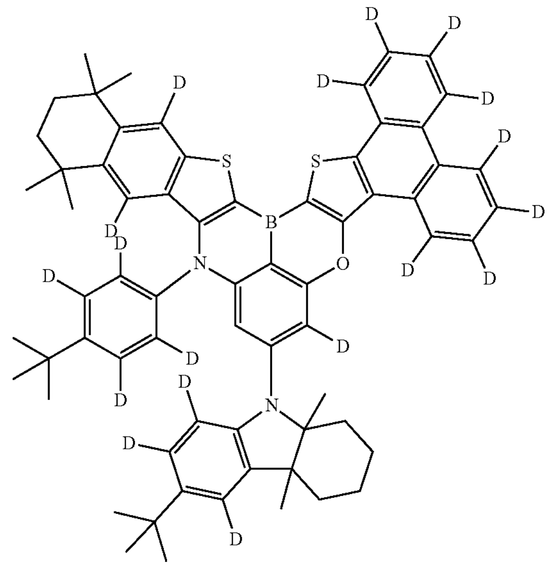
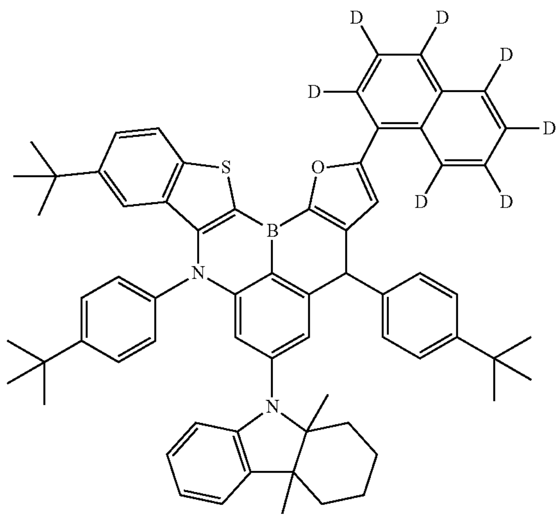
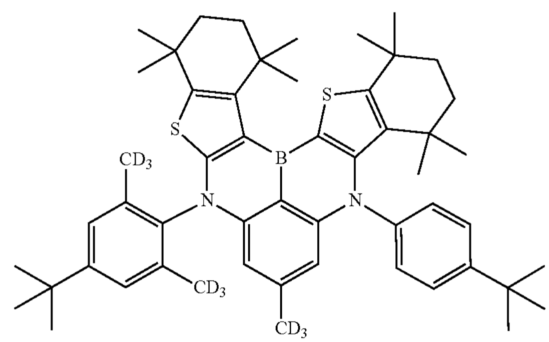
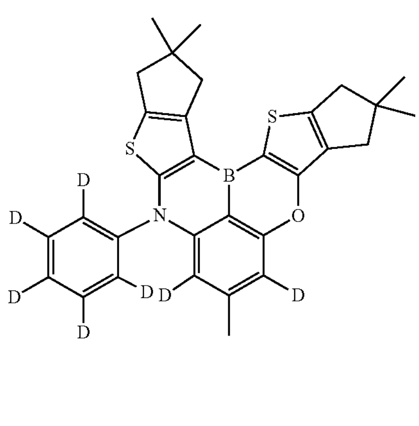
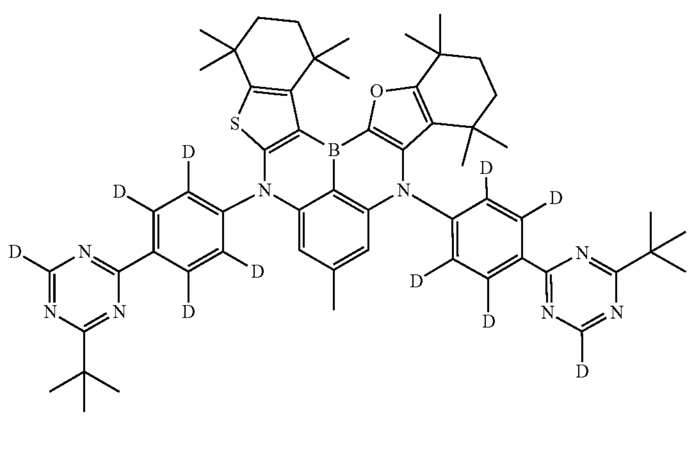

-continued
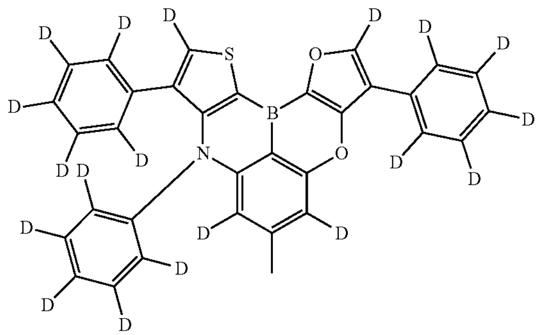
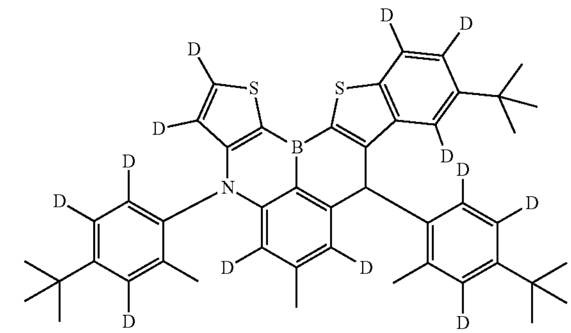
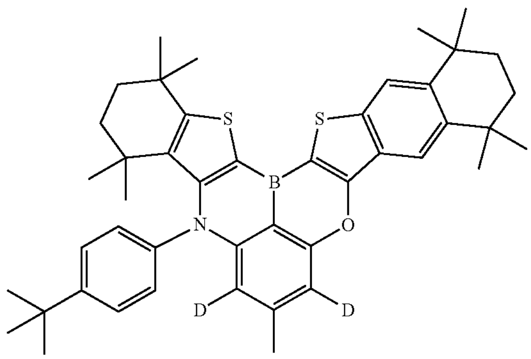
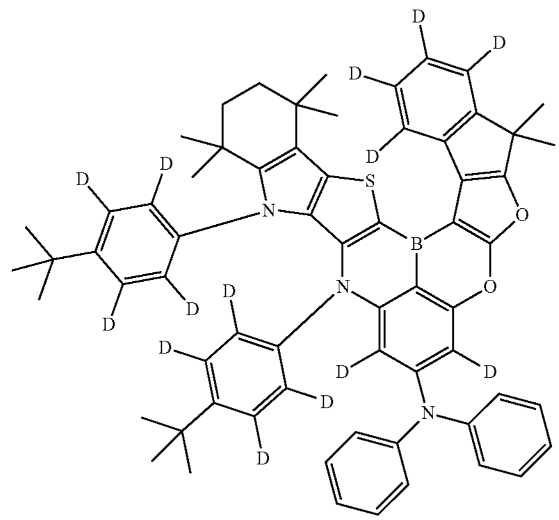
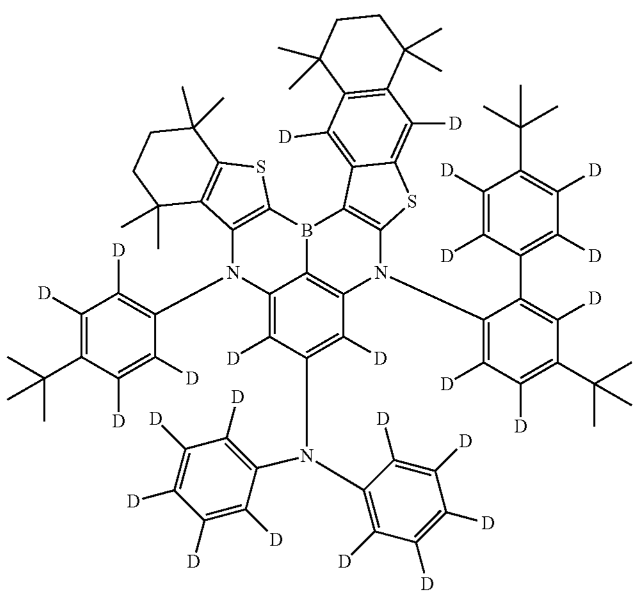
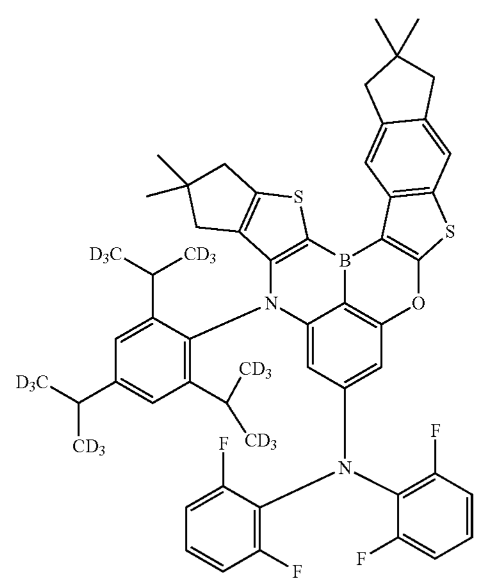

-continued
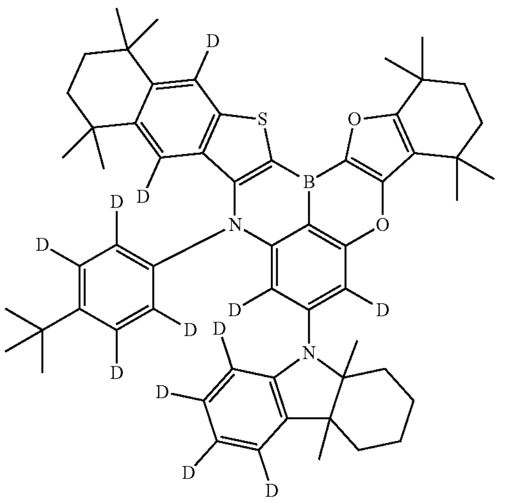
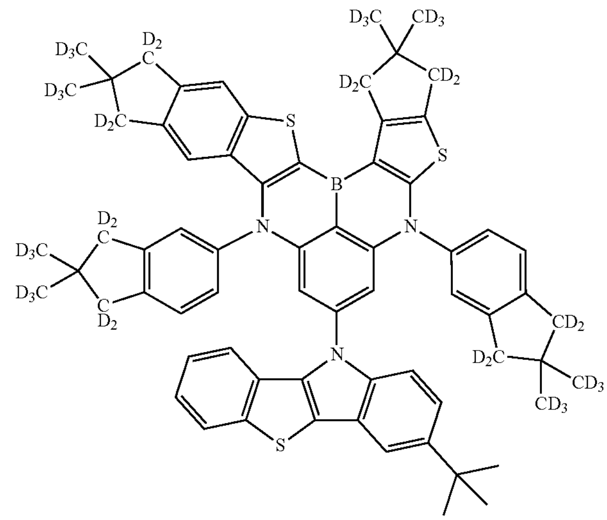
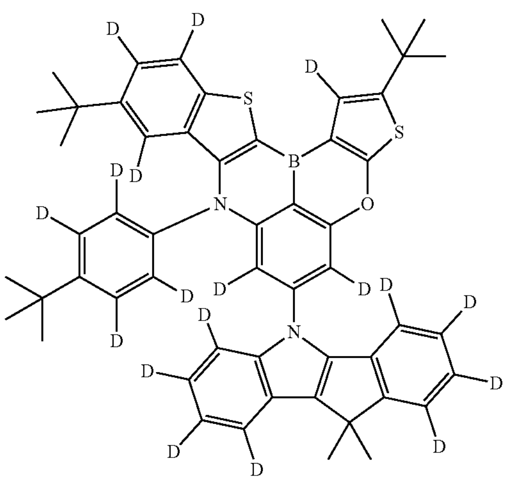
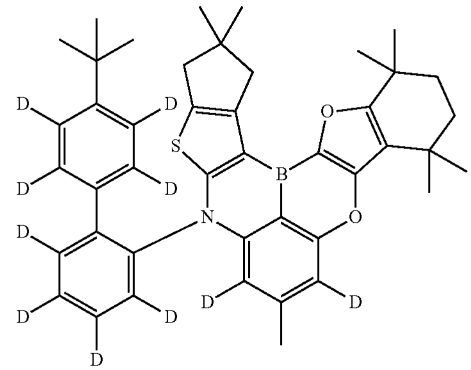
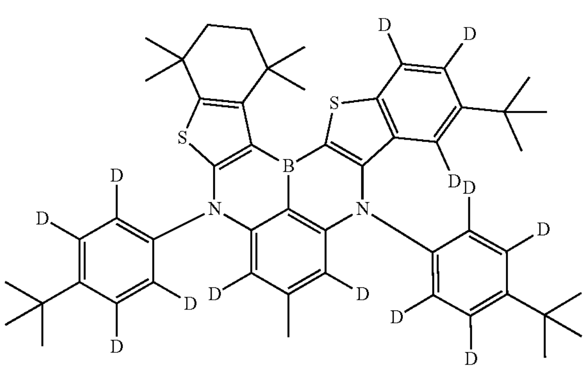
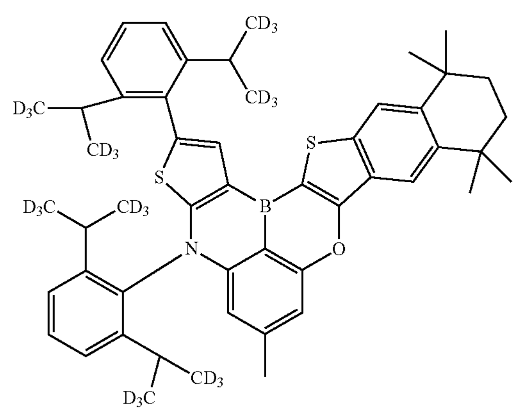

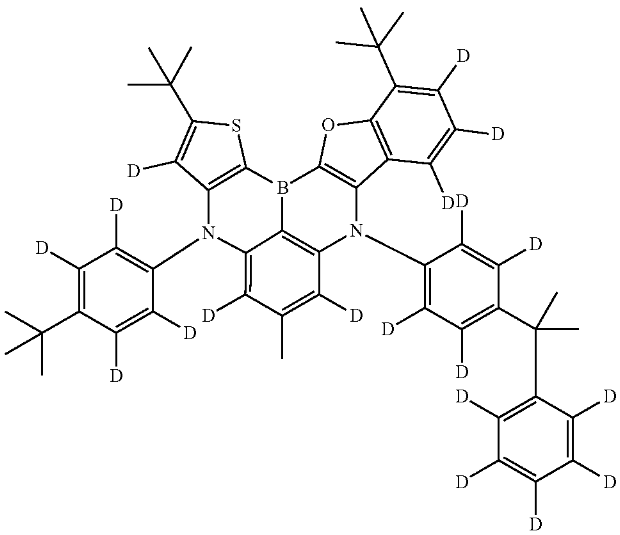
S
O
B
N
N
D
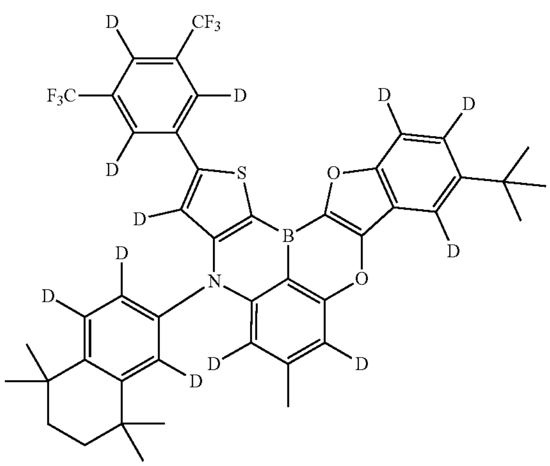
CF3
F3C
D
S
O
B
N
O
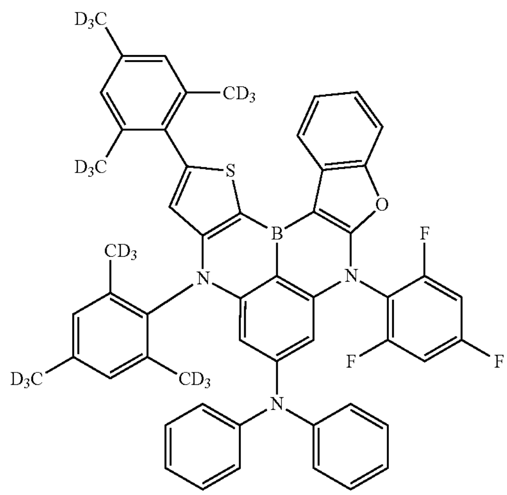
D3C
CD3
S
O
B
N
N
F
F
F
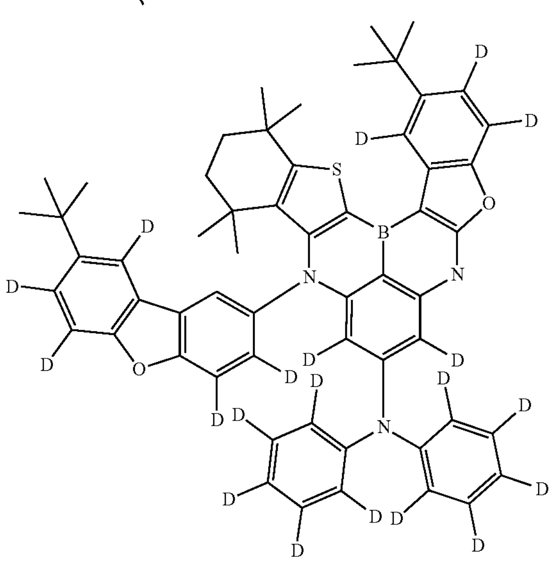
S
O
B
N
N
N
O
D -continued
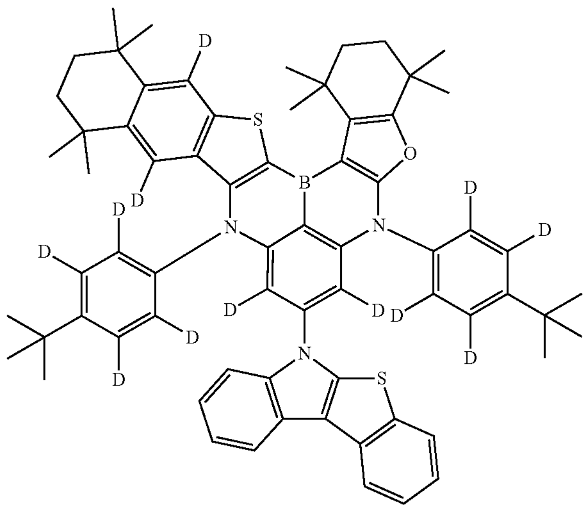
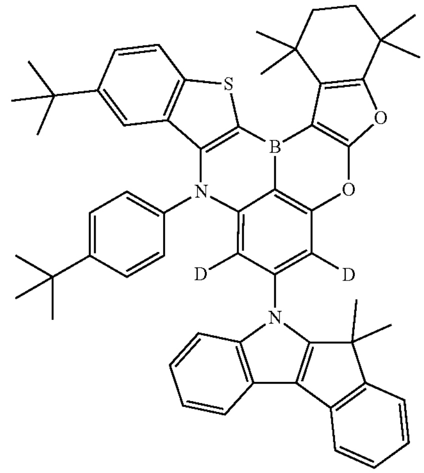
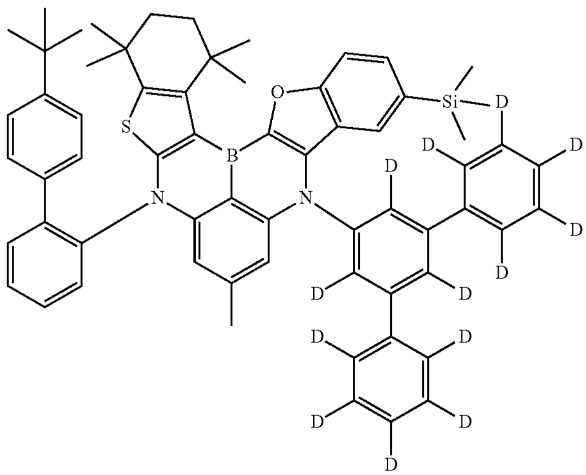
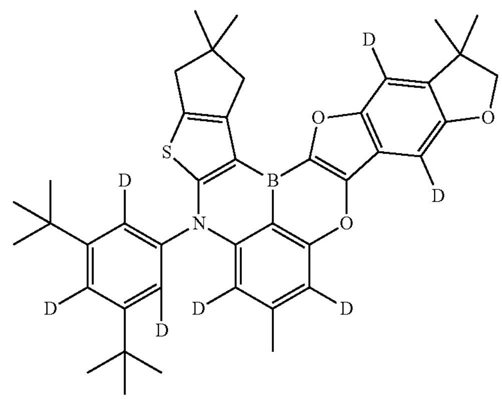
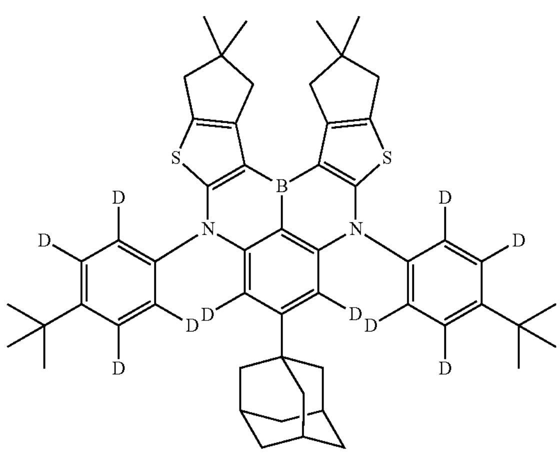
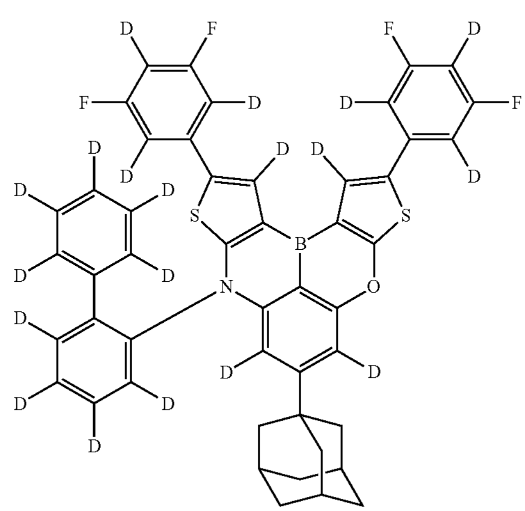

-continued
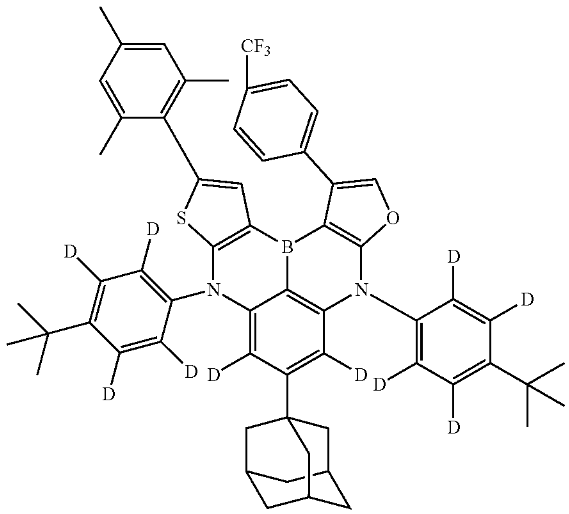
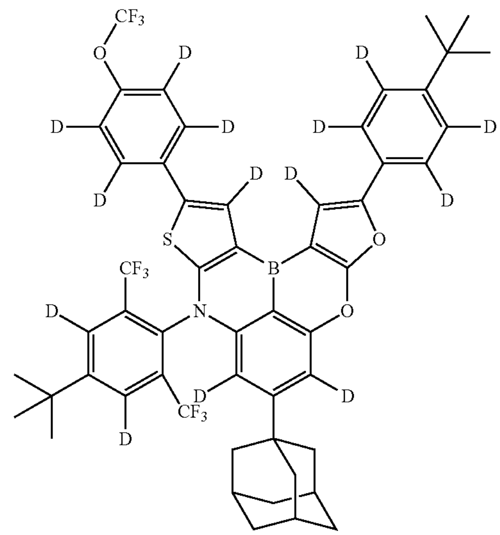
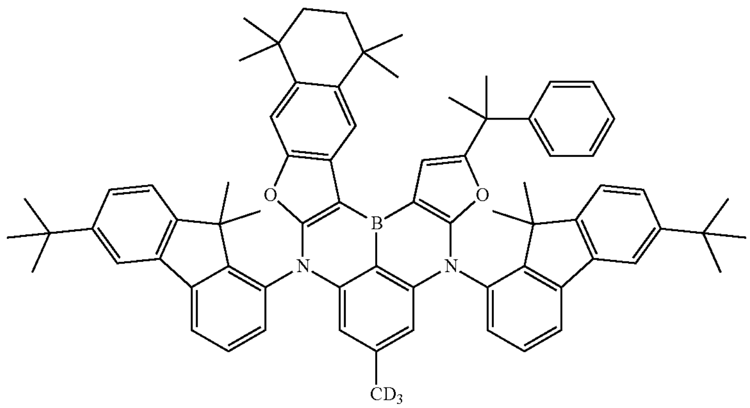
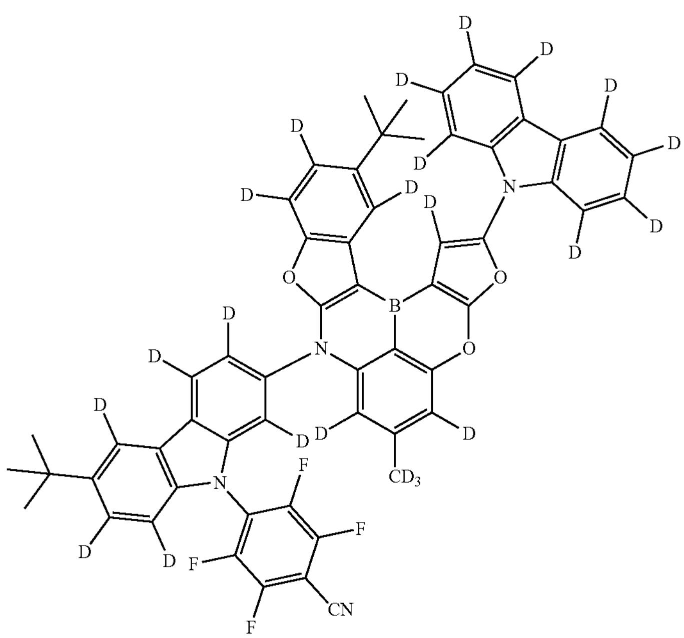

-continued
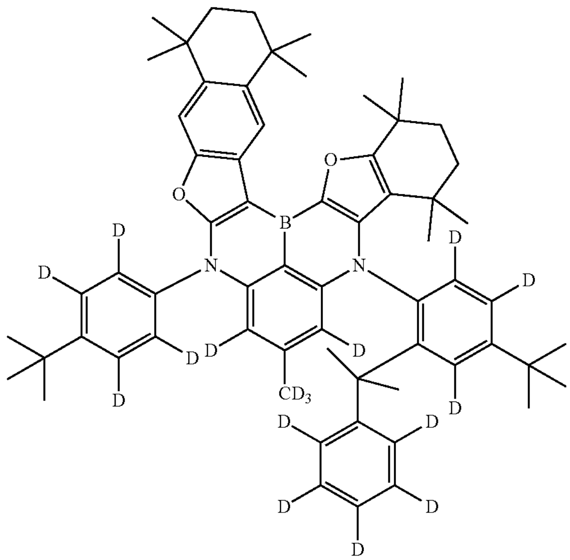
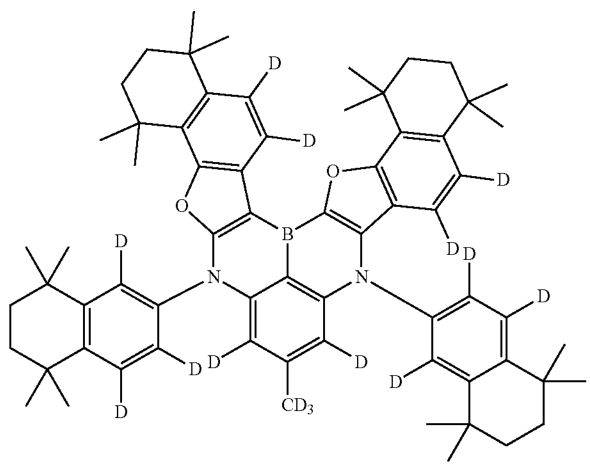
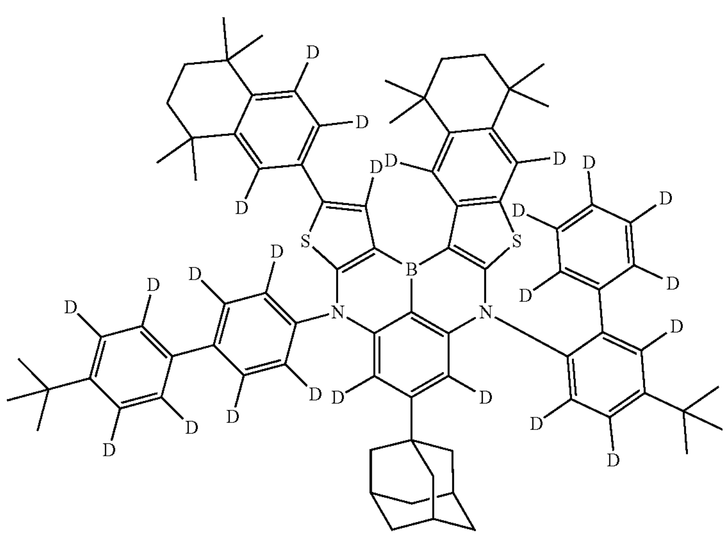

-continued
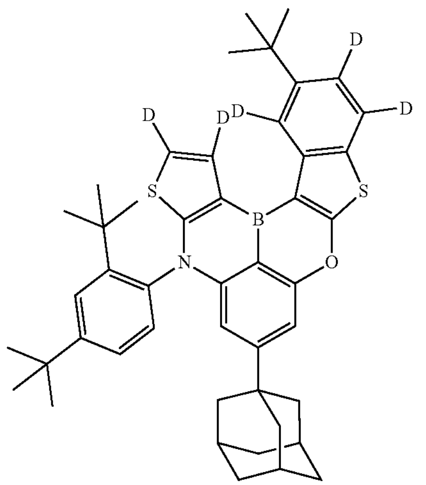
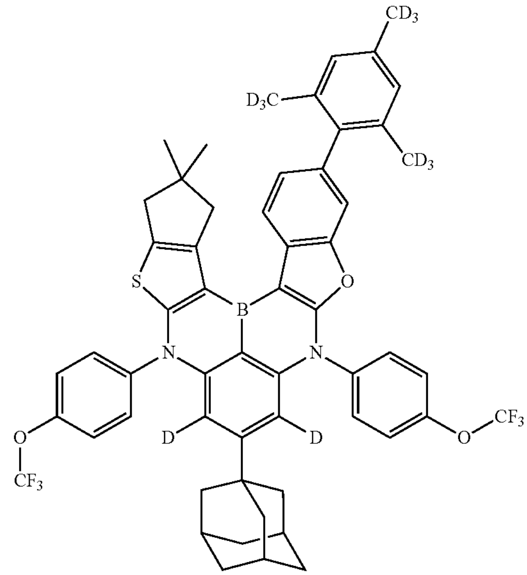
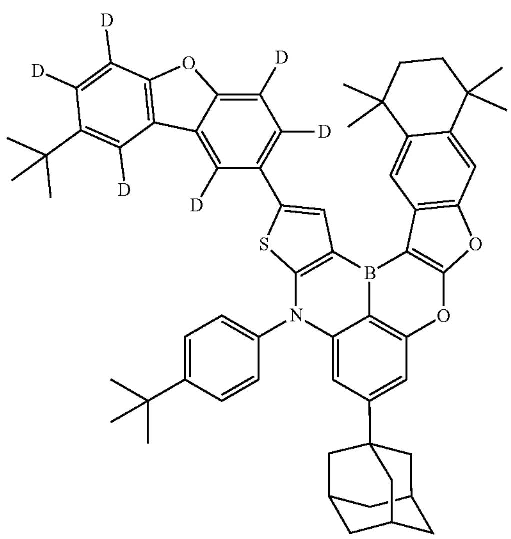
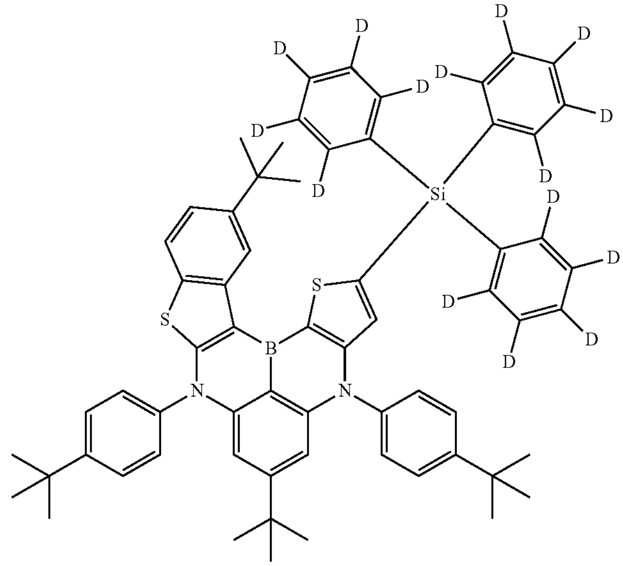
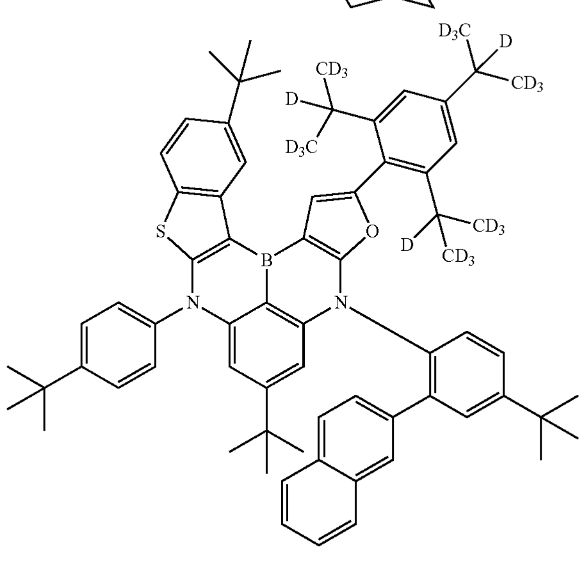
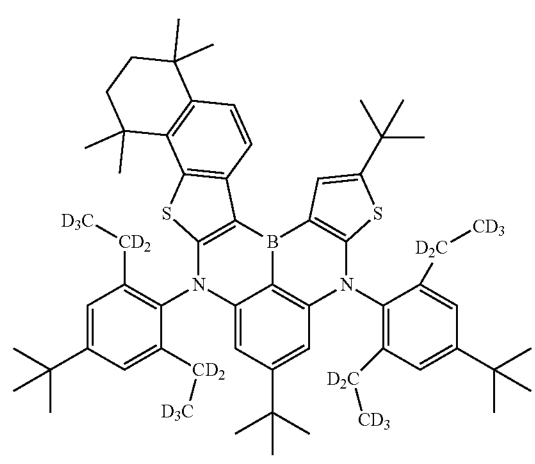

-continued
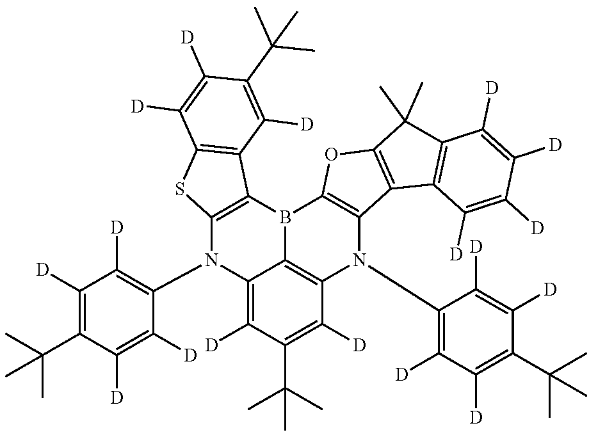
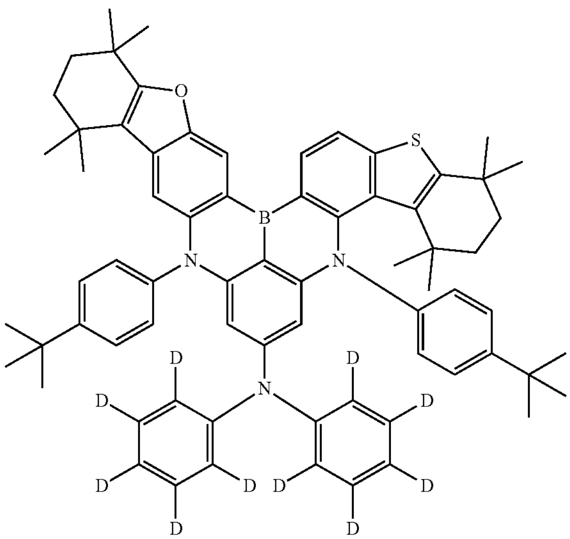
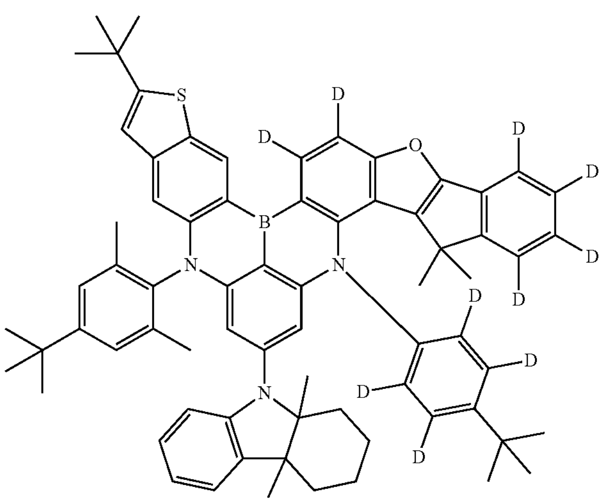

-continued
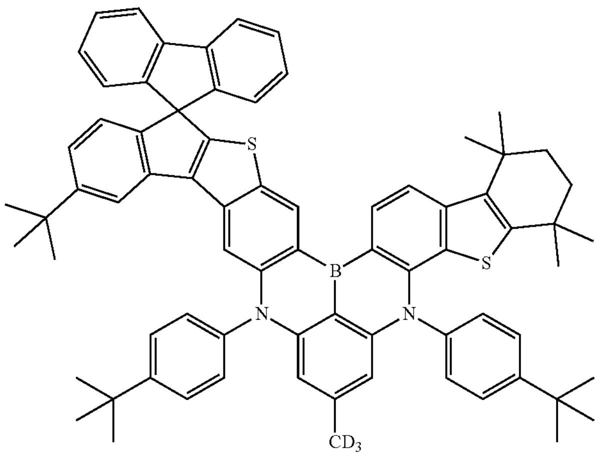
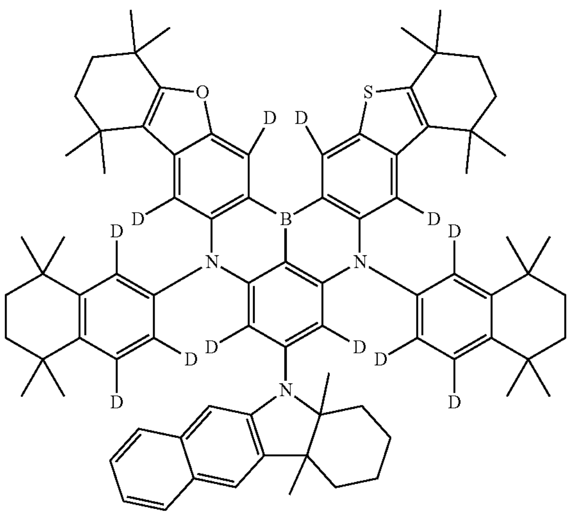
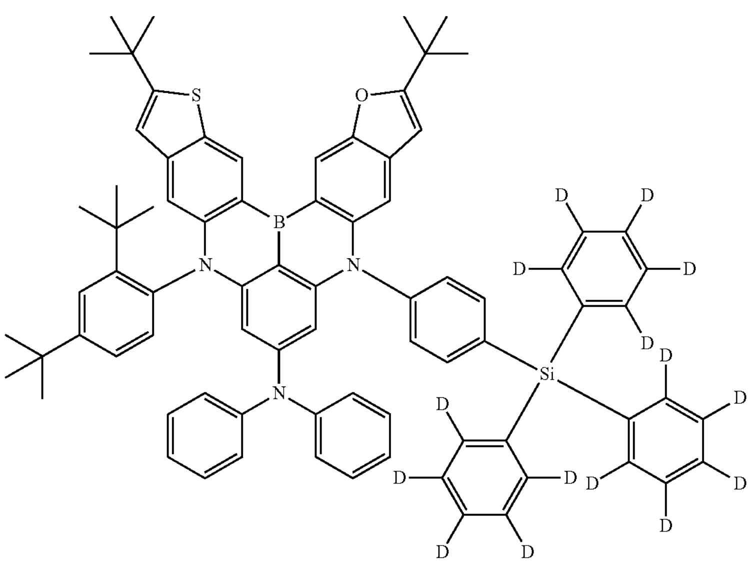

-continued
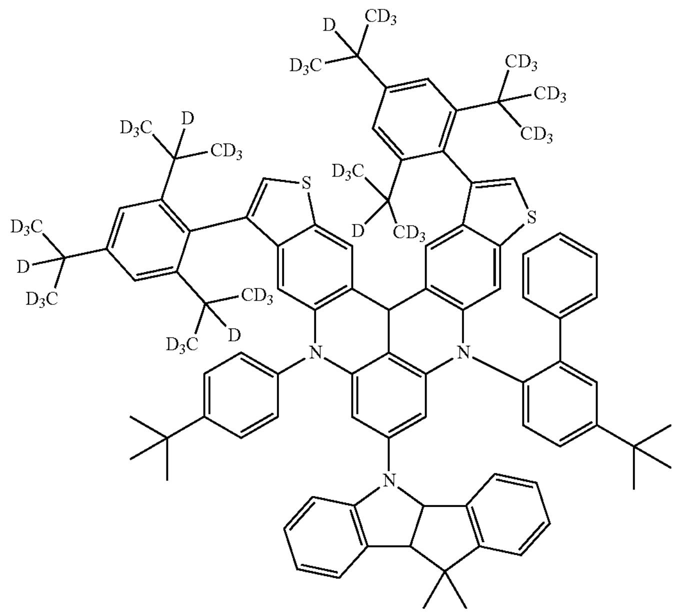
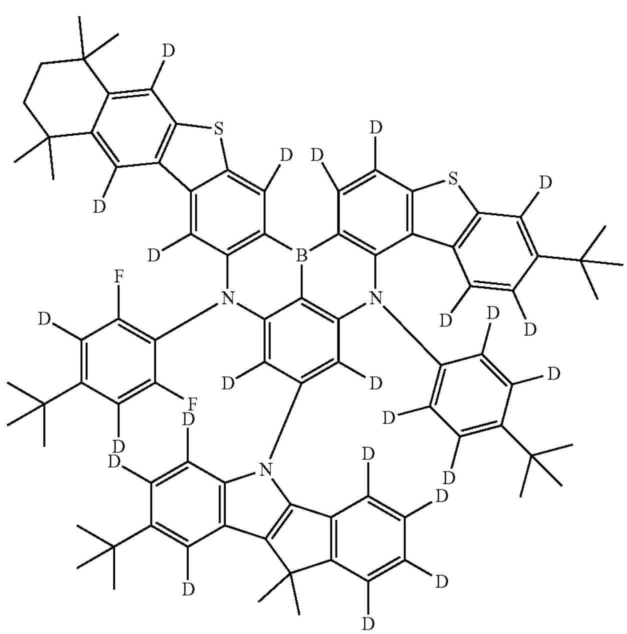

-continued
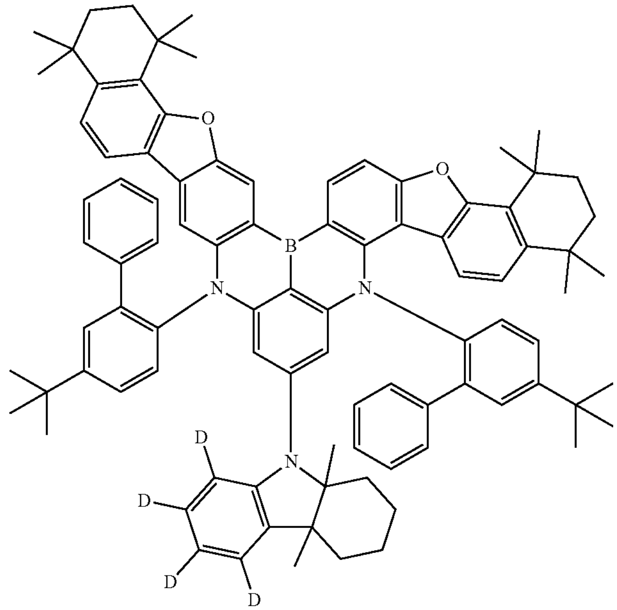
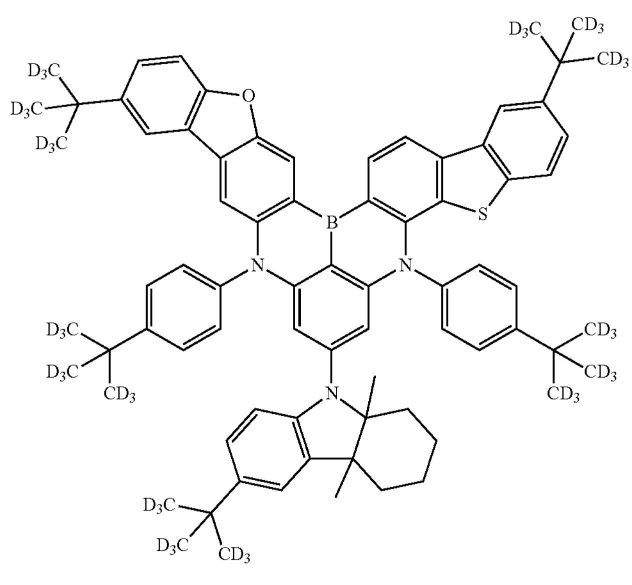

-continued
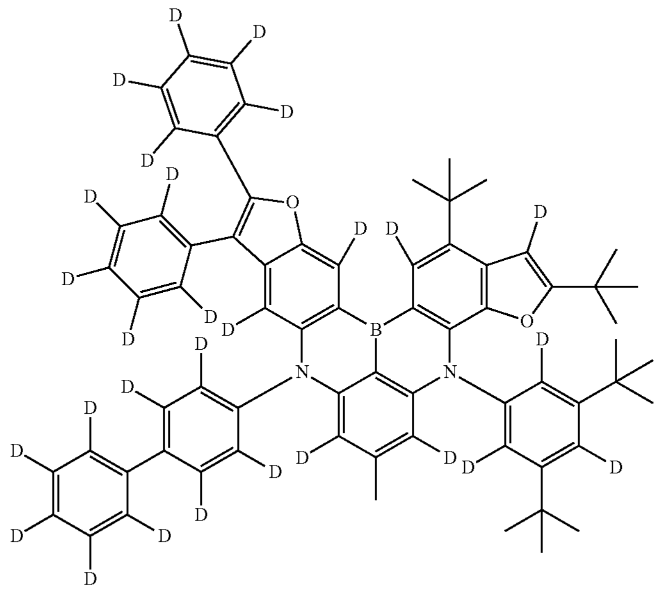
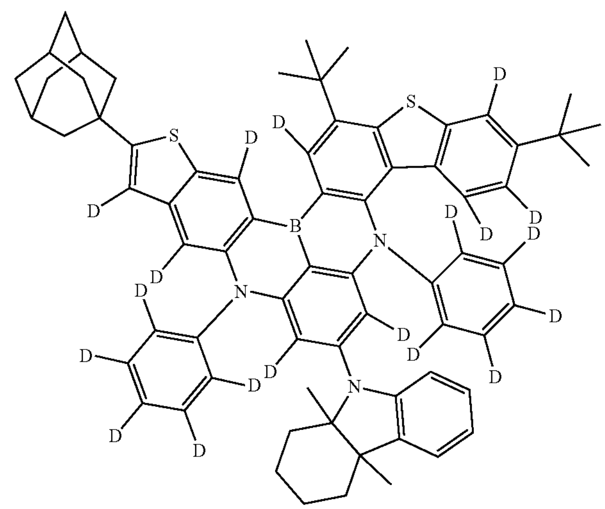
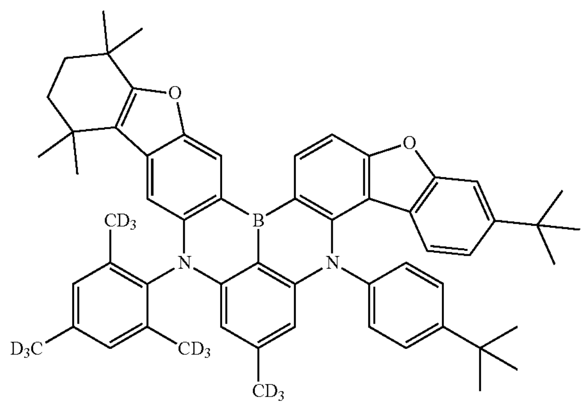

-continued
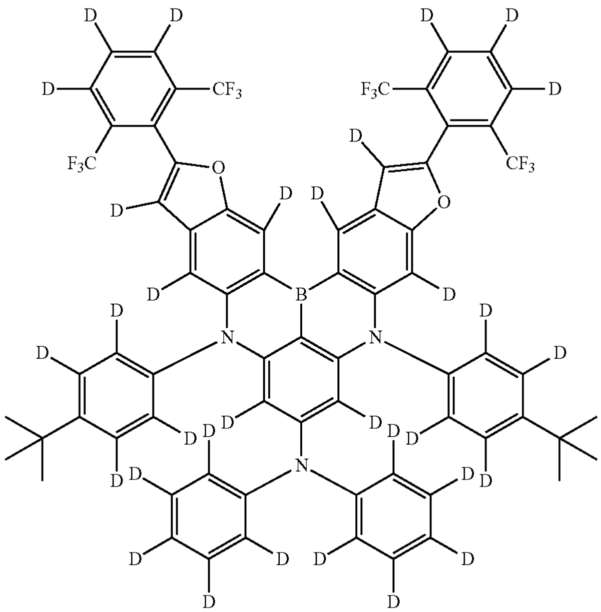
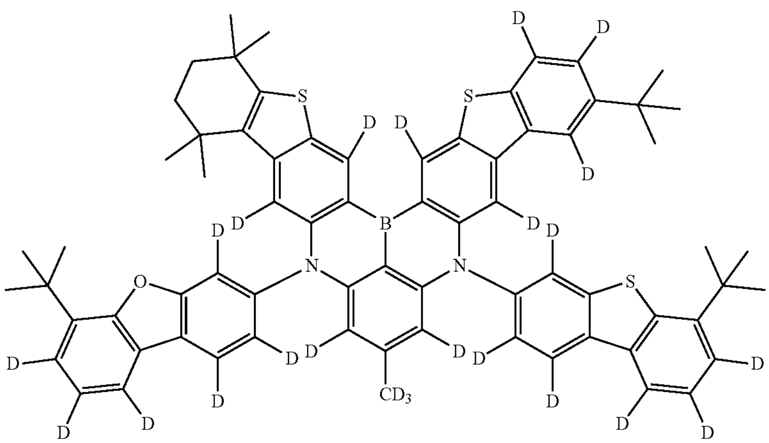
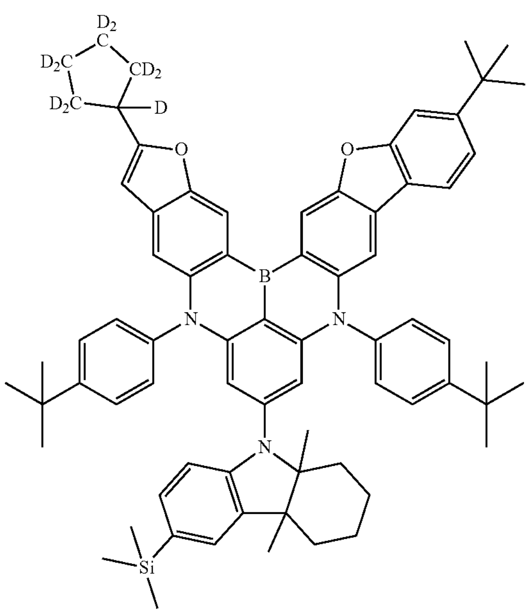

-continued
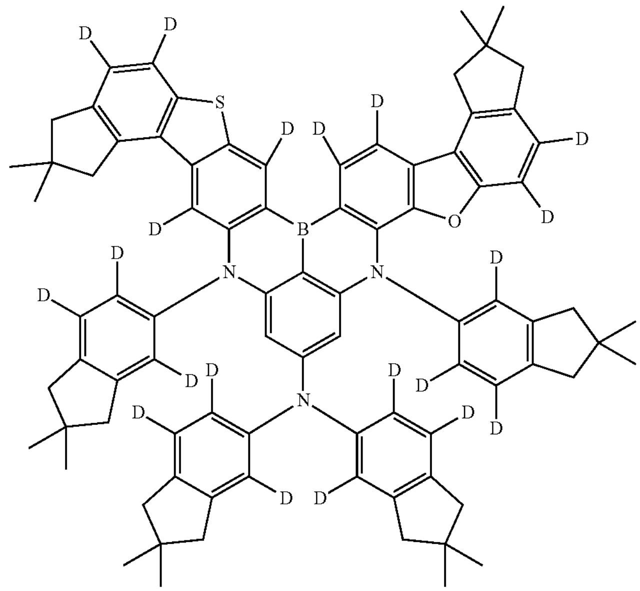
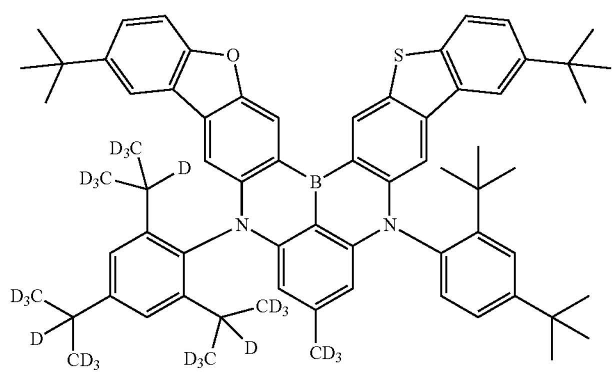
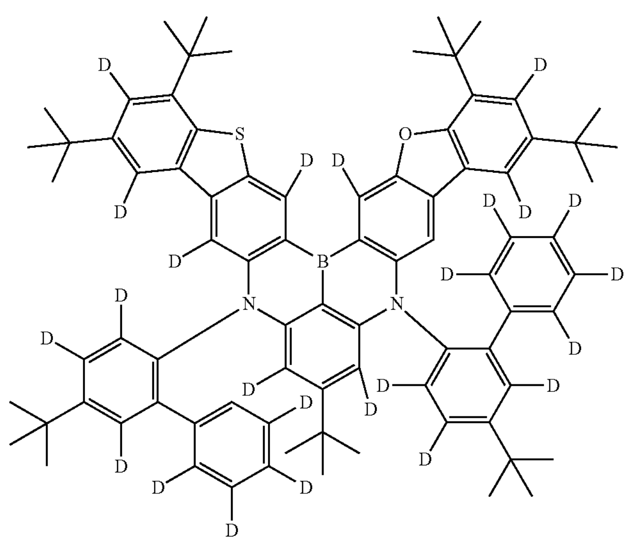

-continued
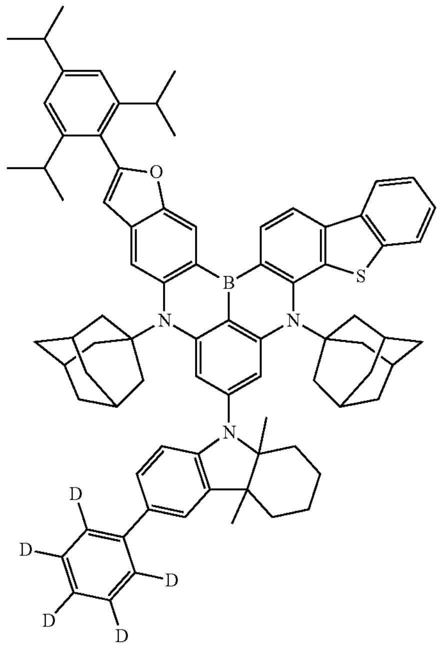
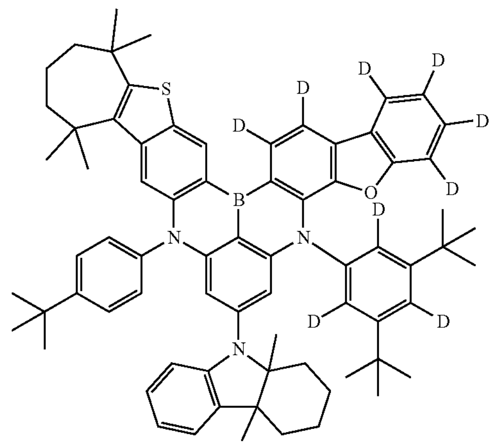
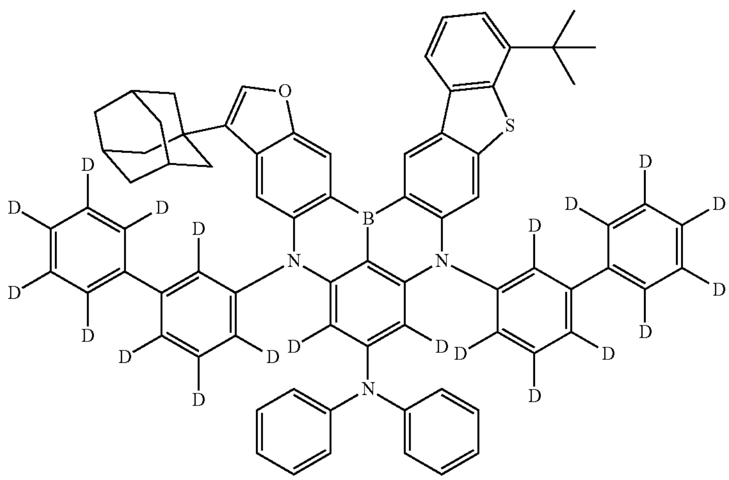
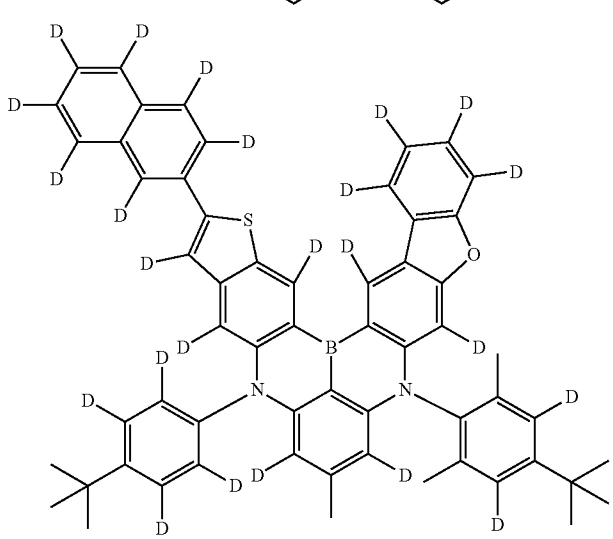

-continued
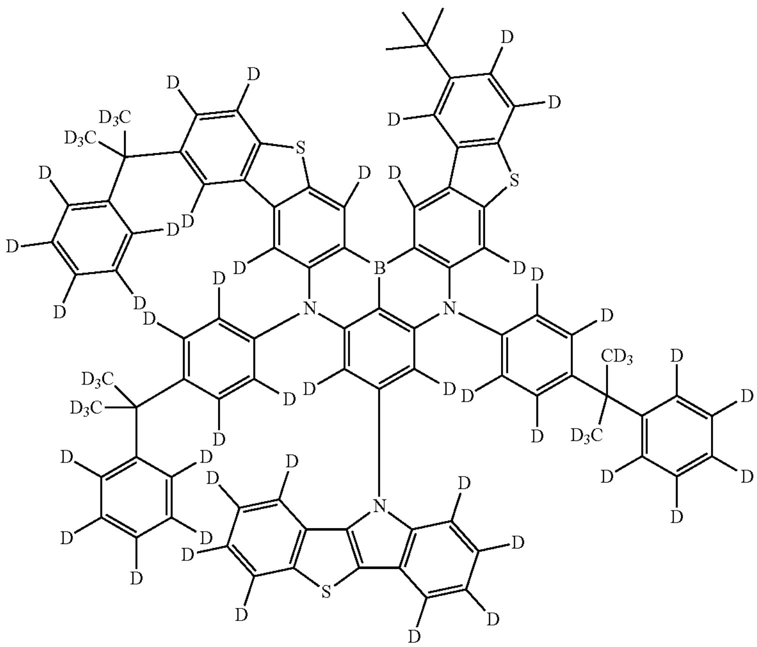
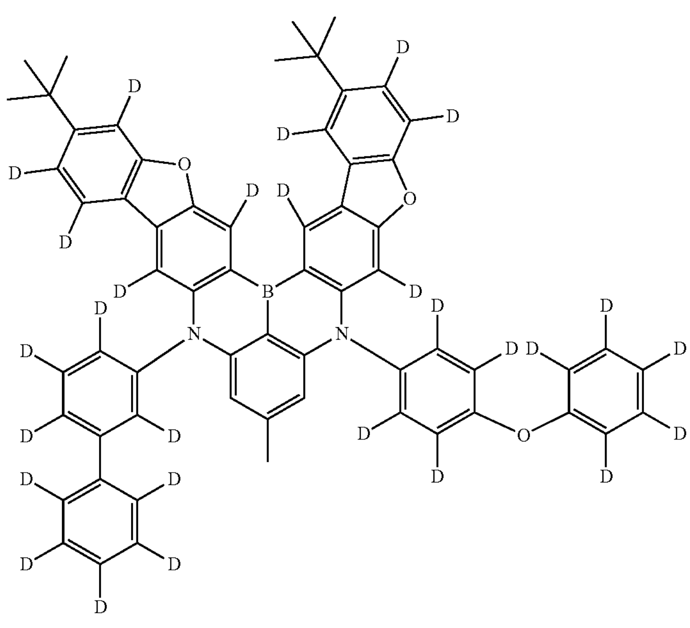

-continued
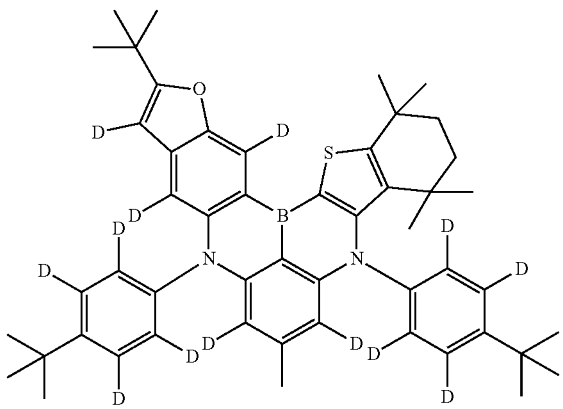
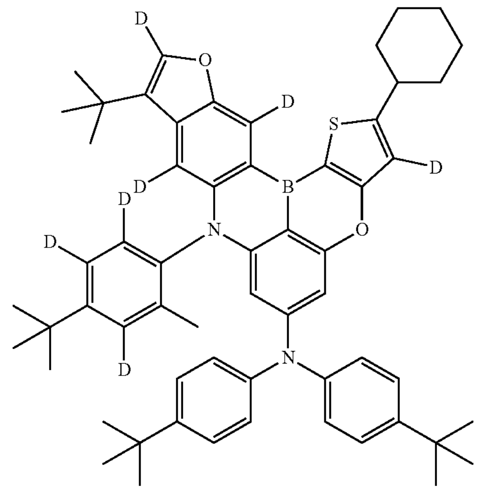
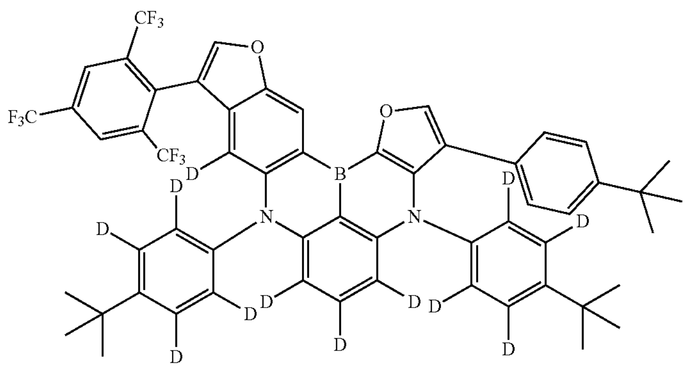
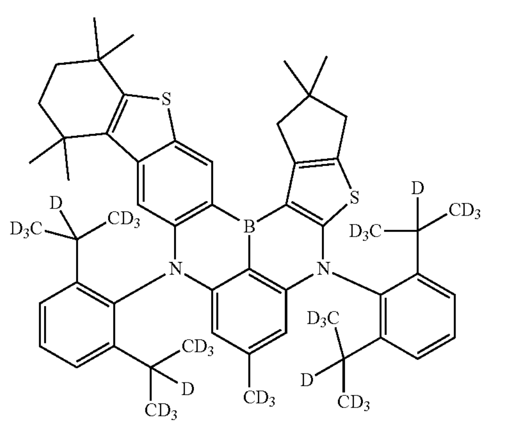
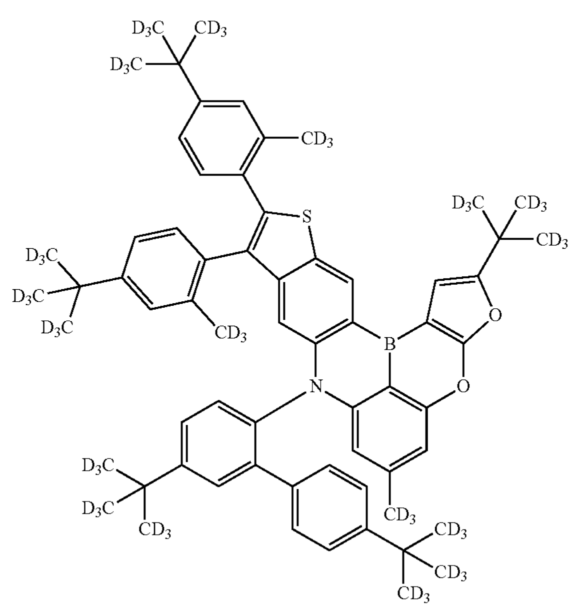

-continued
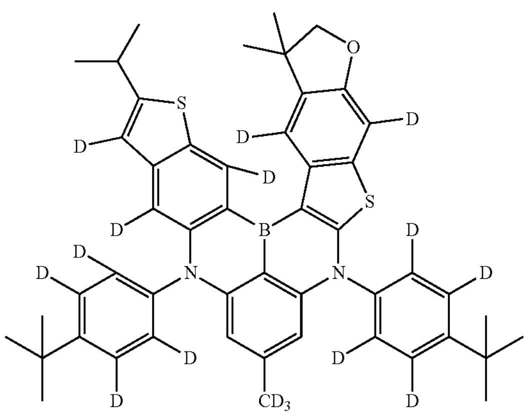
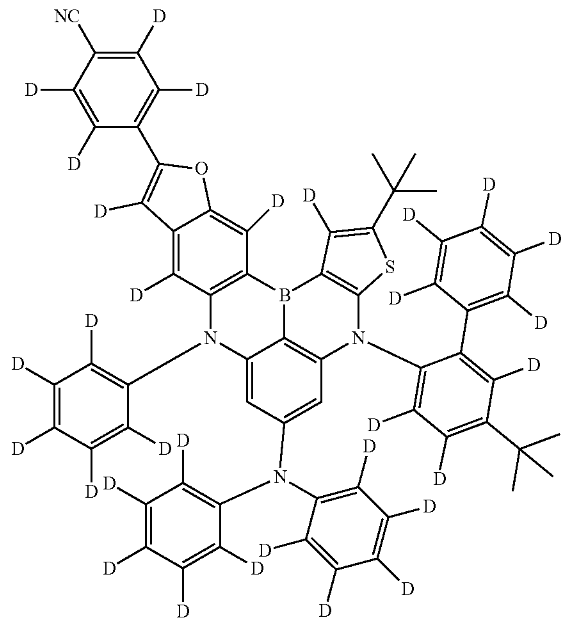
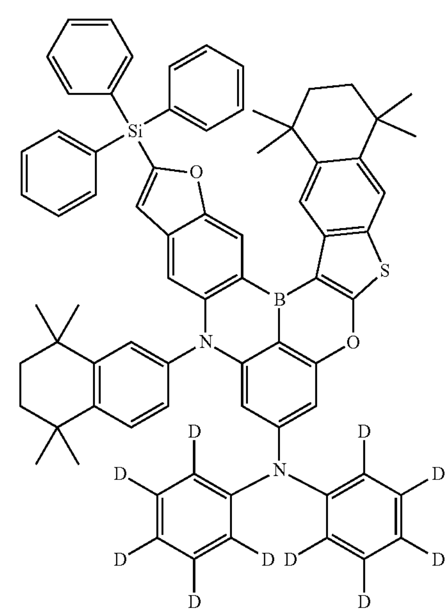
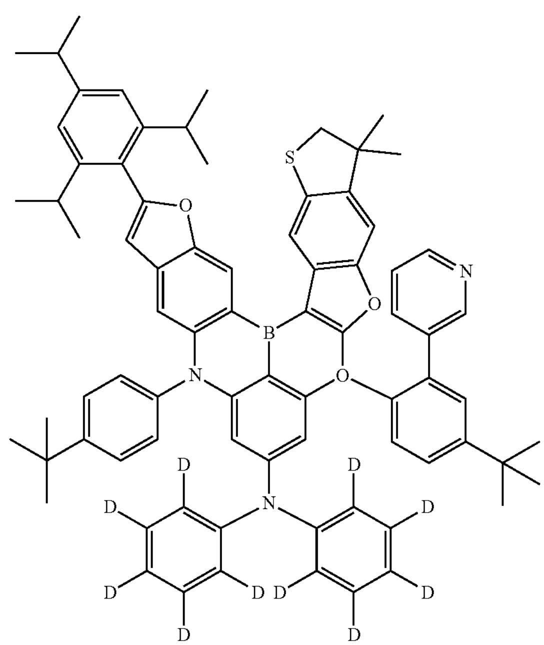

-continued
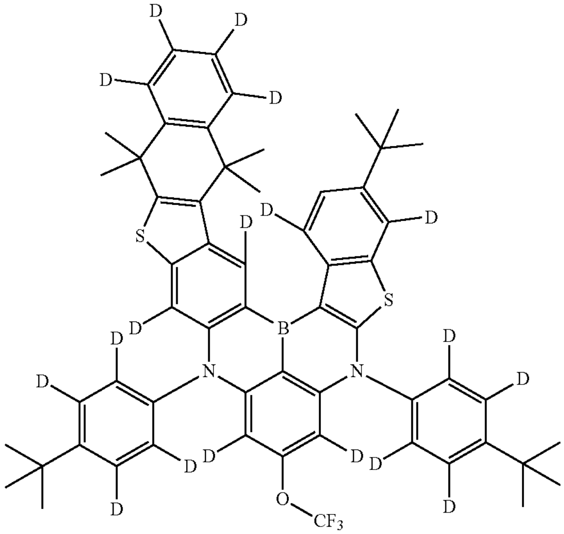
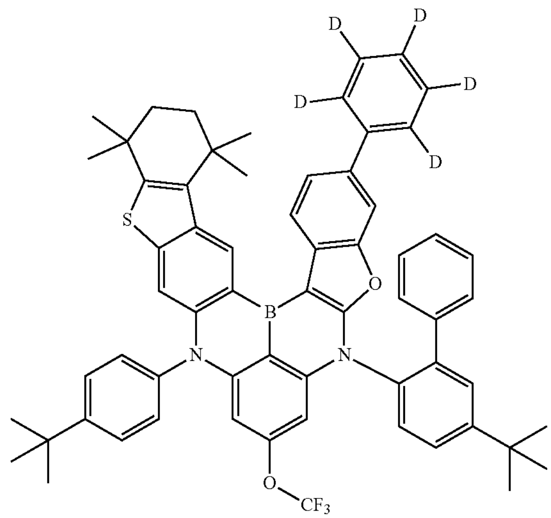
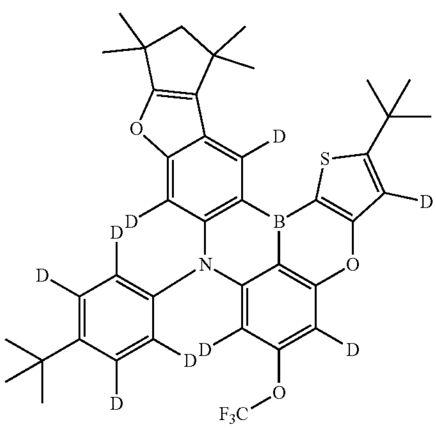
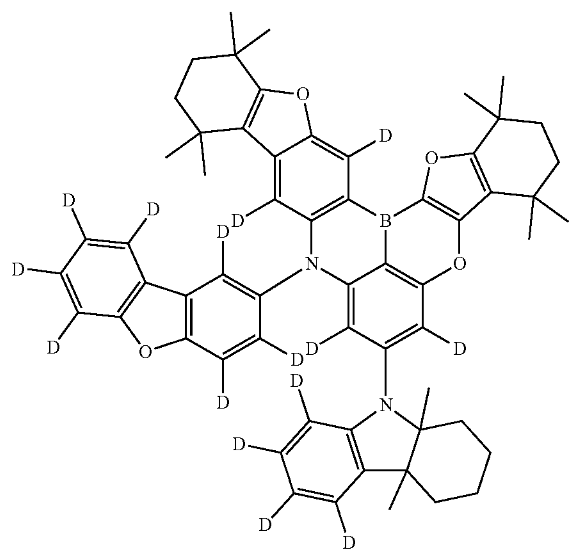
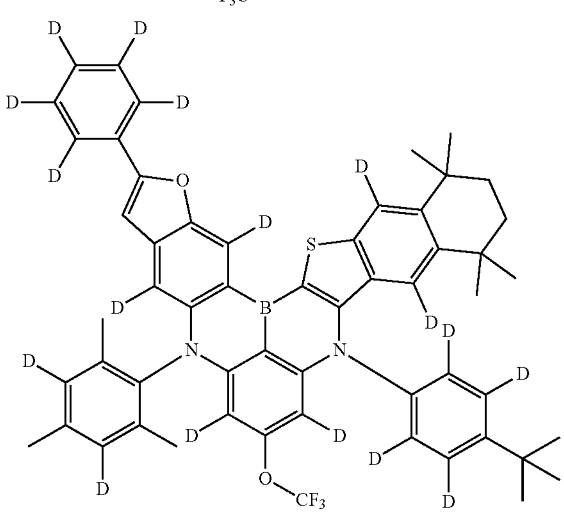
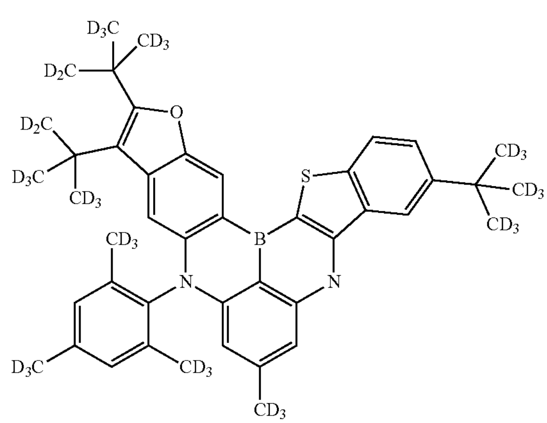

-continued
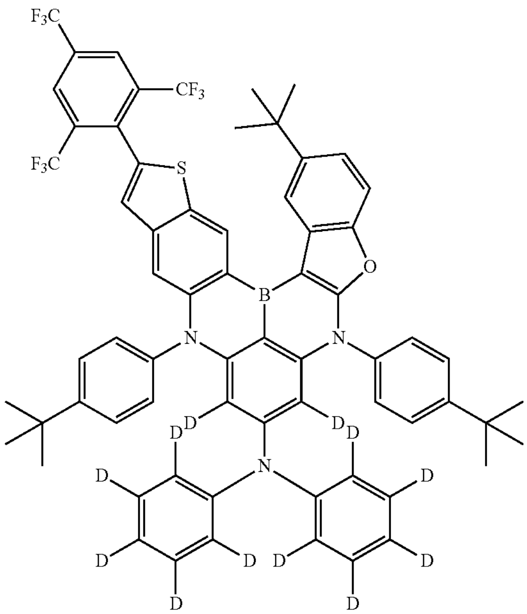
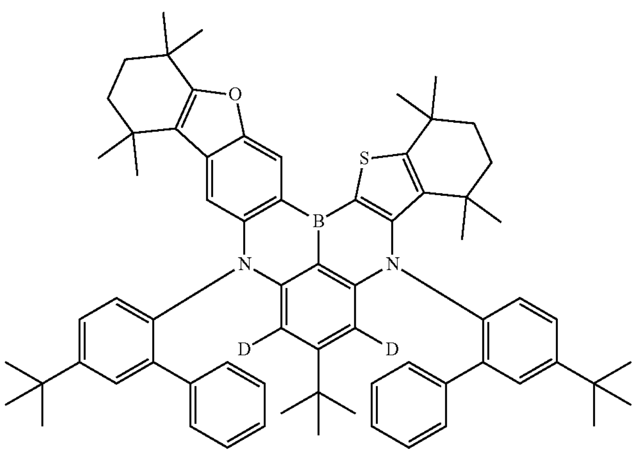
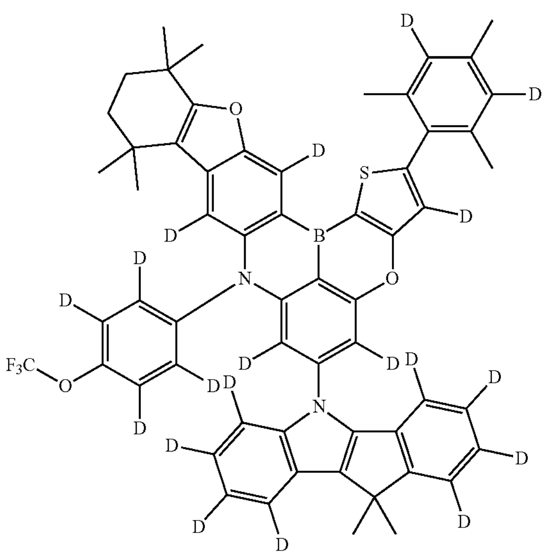
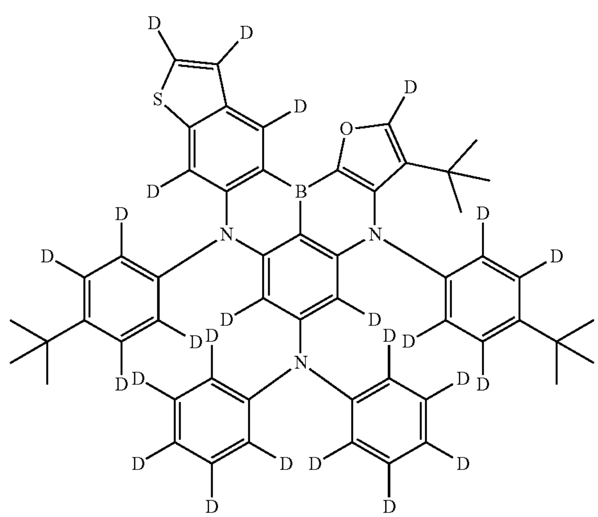

-continued
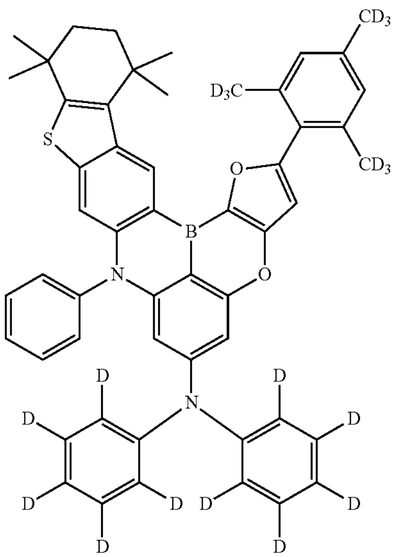
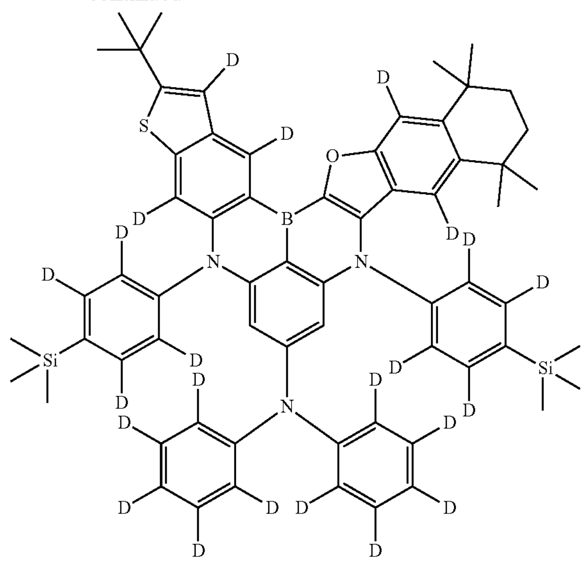
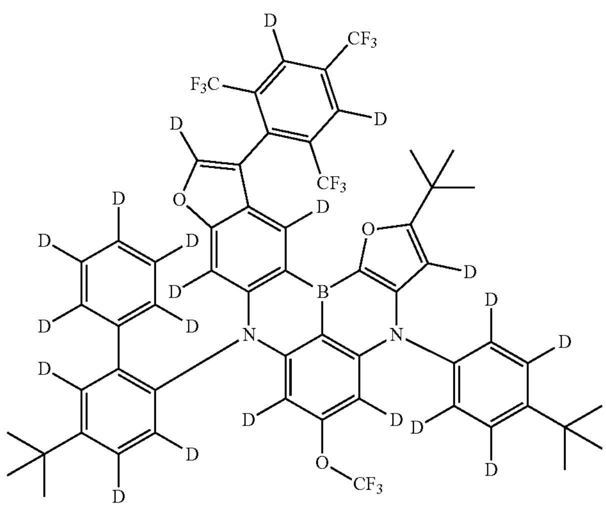
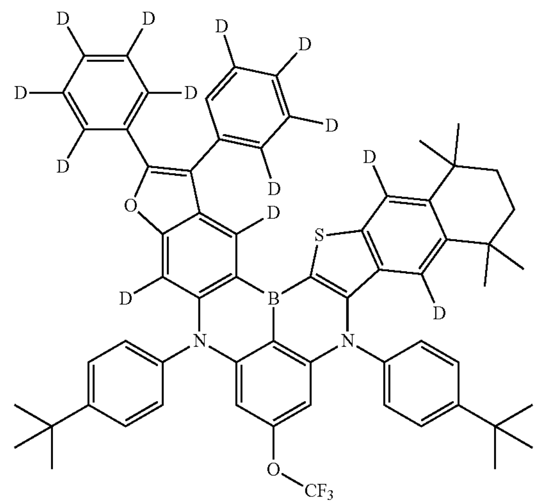
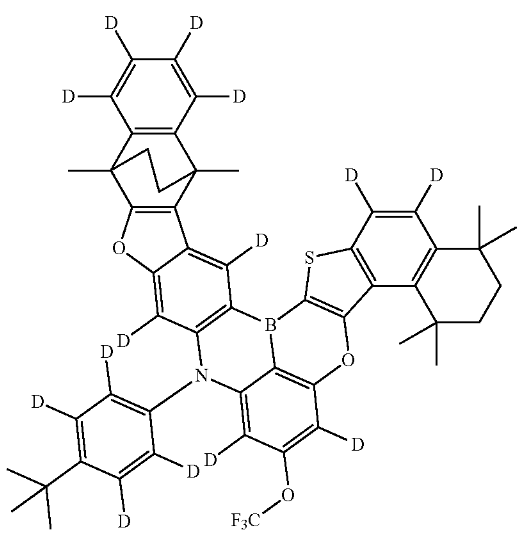
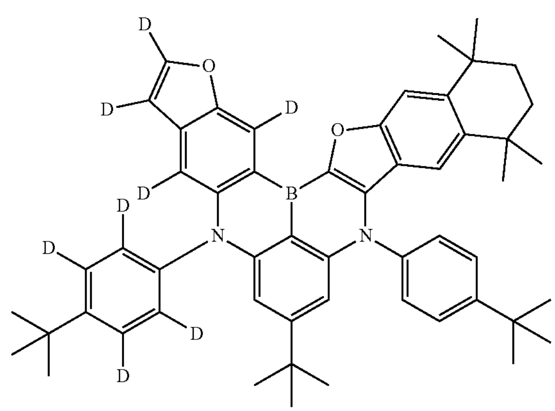

-continued
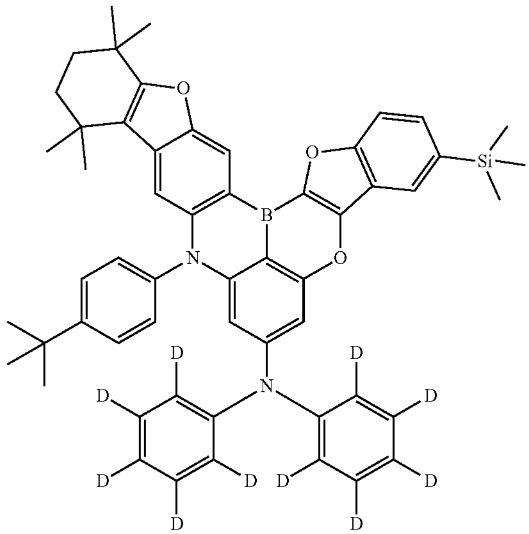
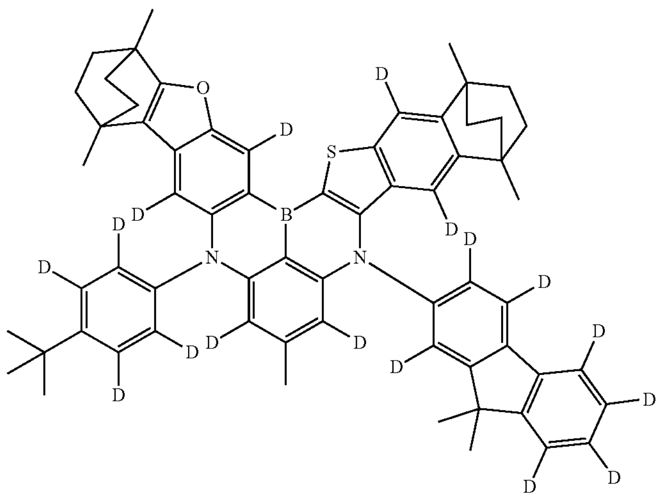
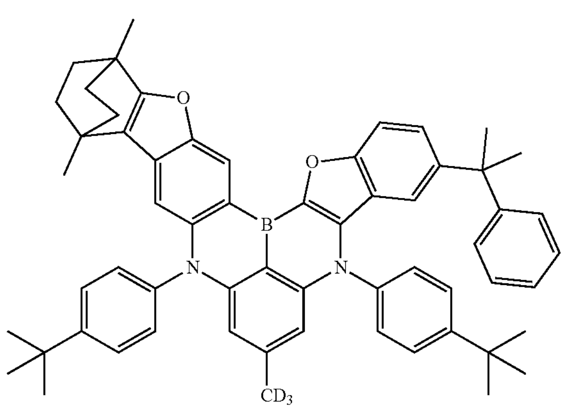
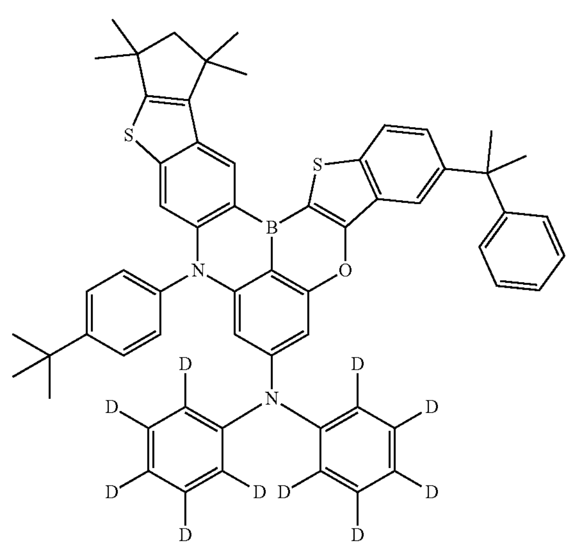

-continued
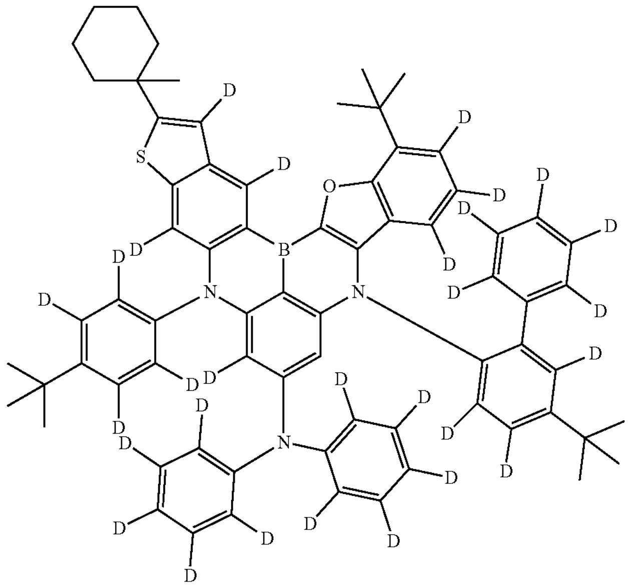
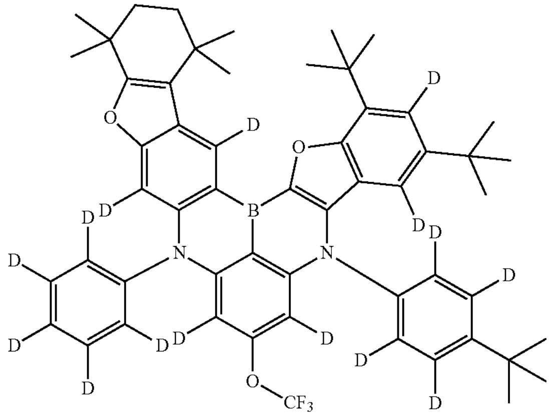
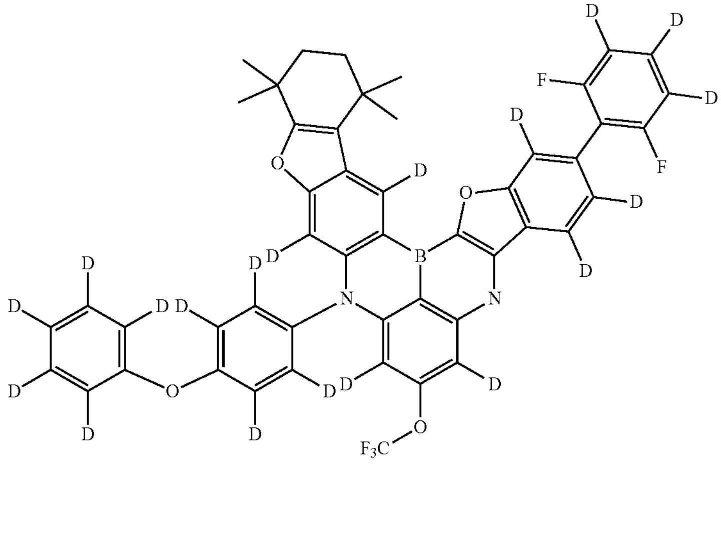

-continued
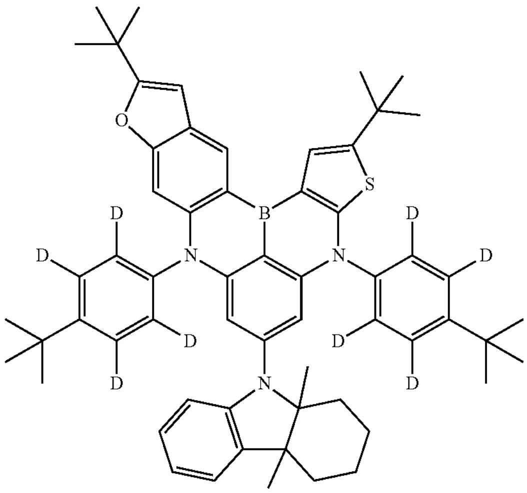
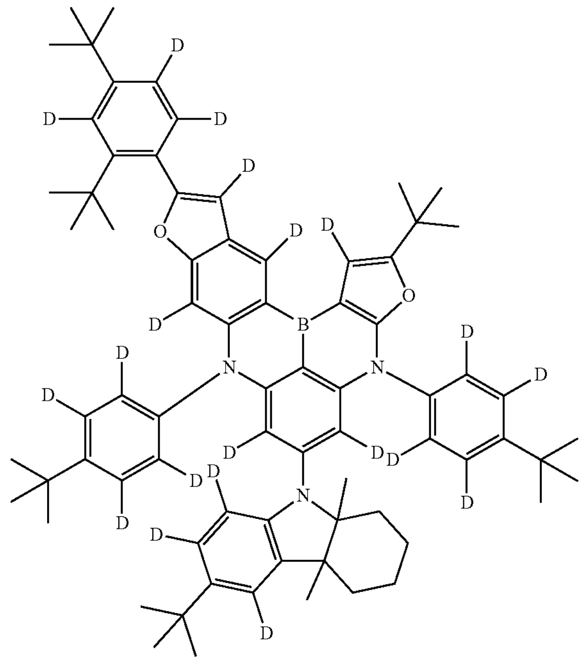
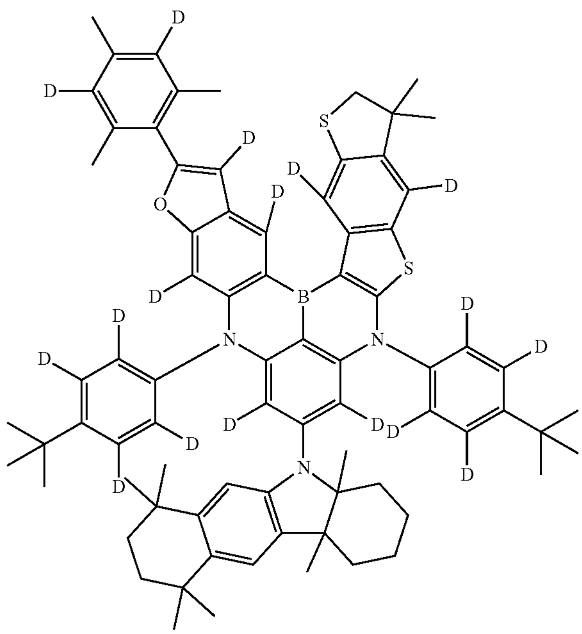
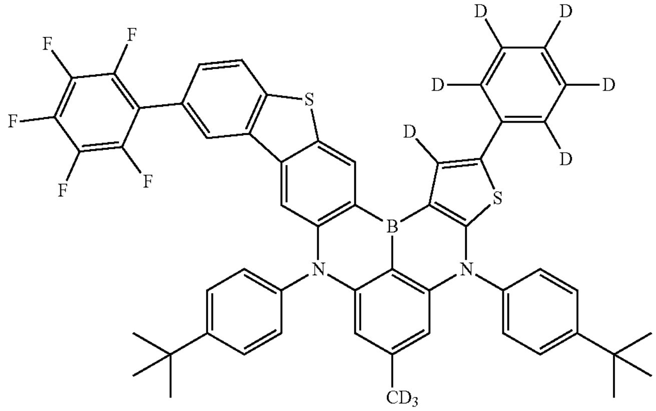

-continued
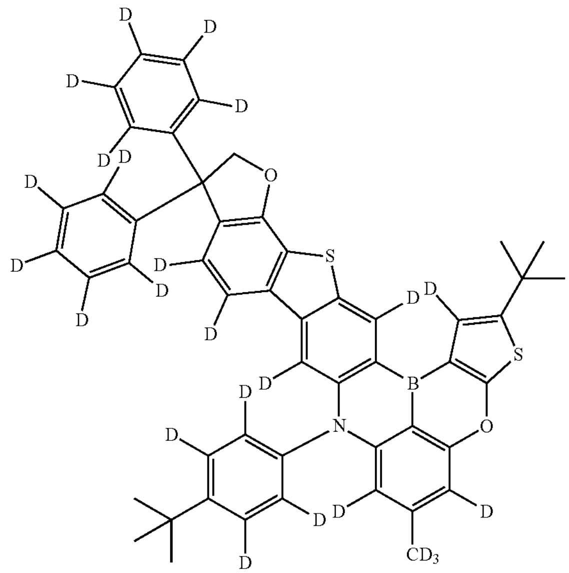
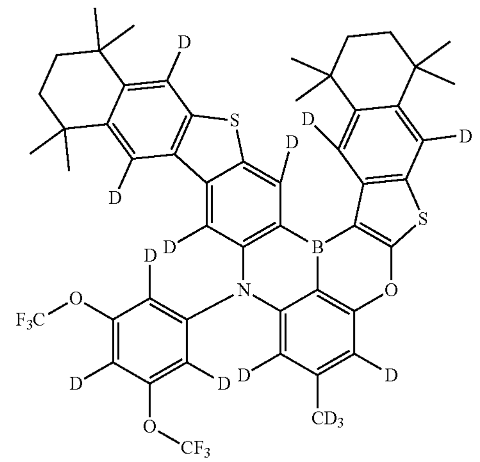
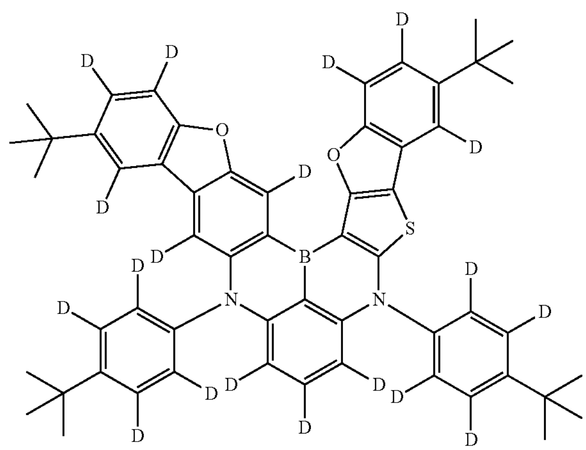
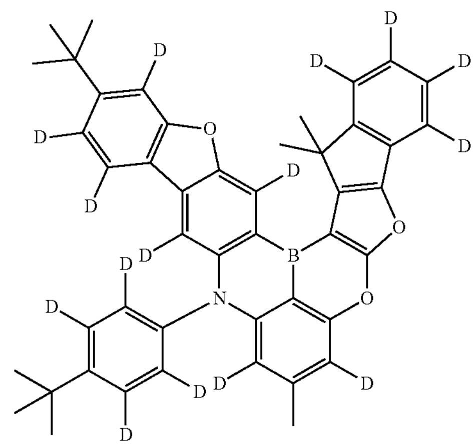
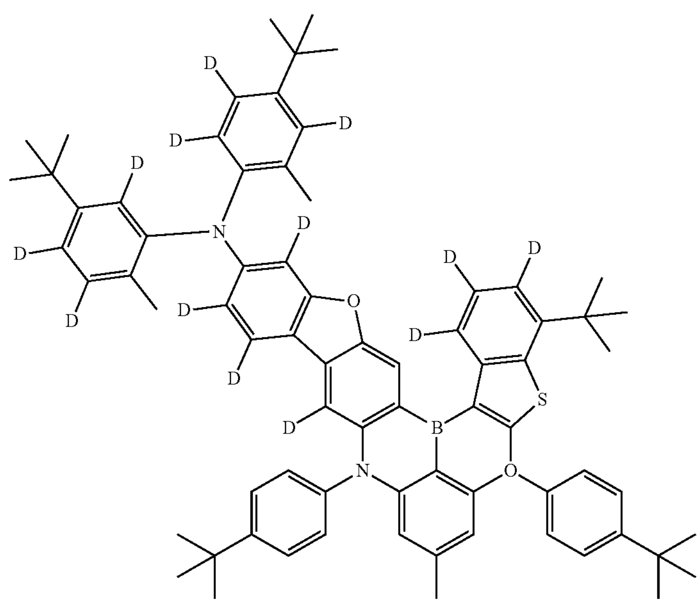

-continued
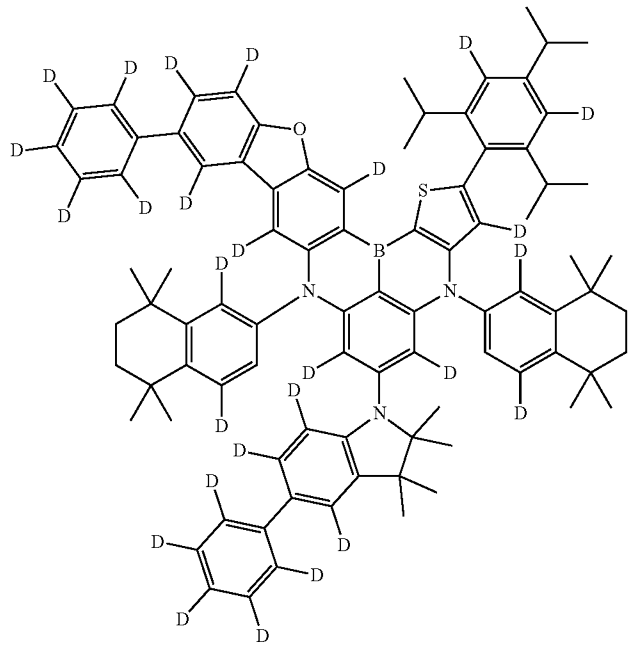
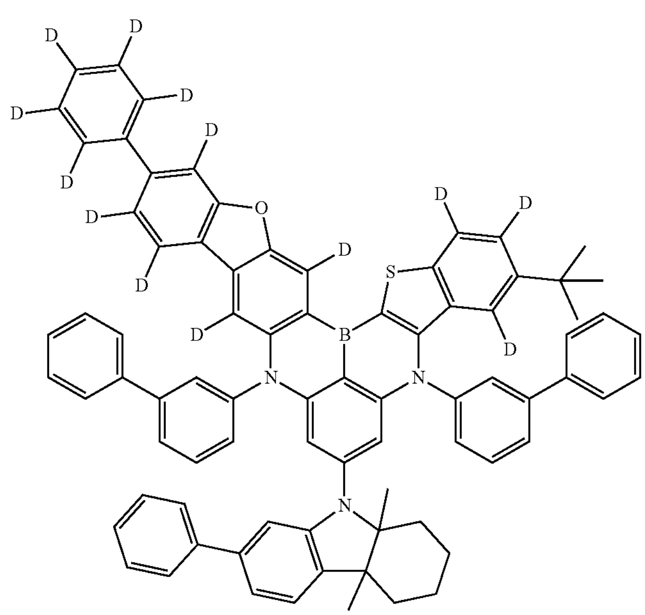

-continued
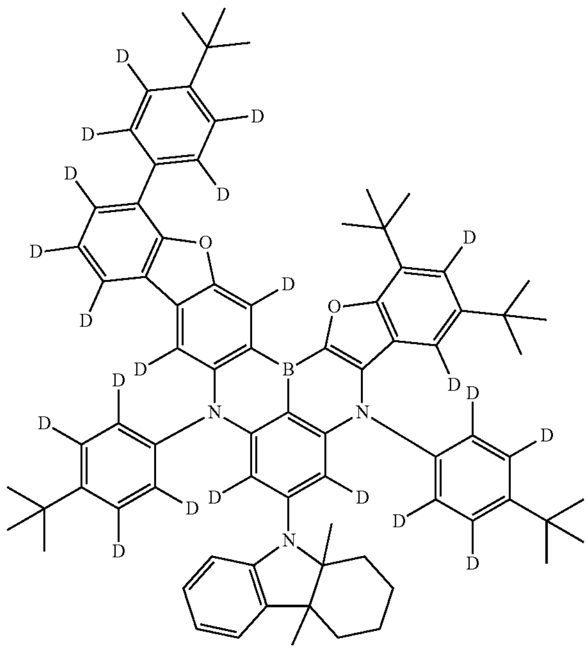
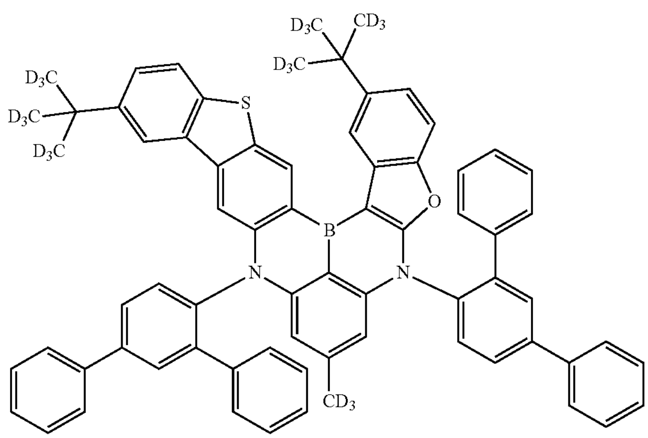
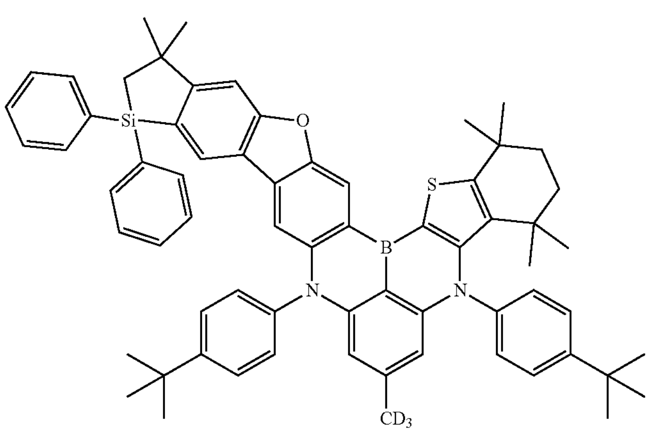

-continued
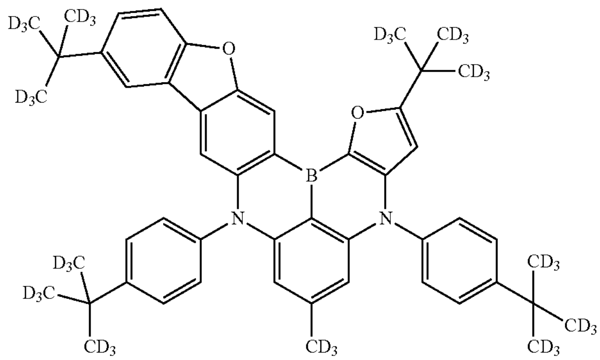
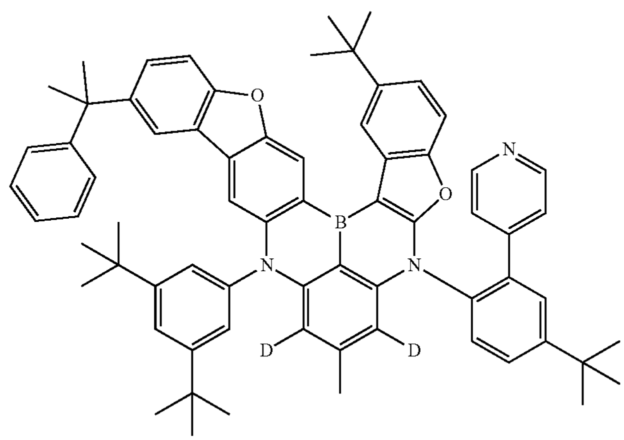
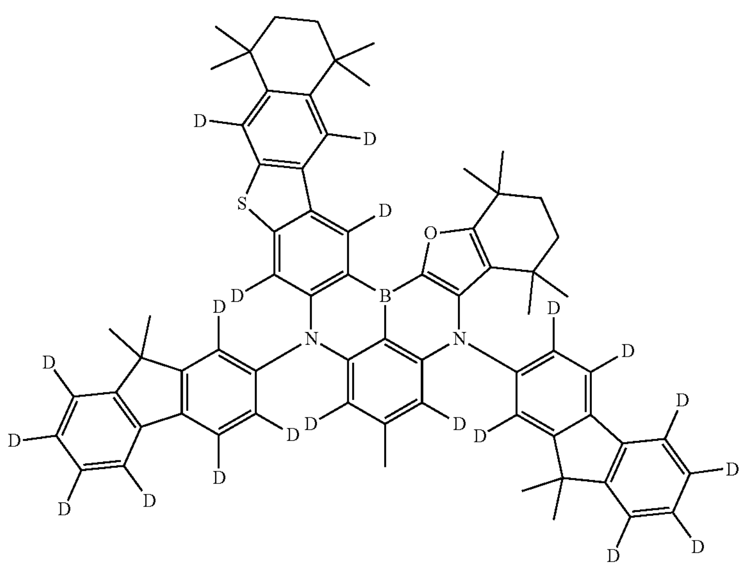

-continued
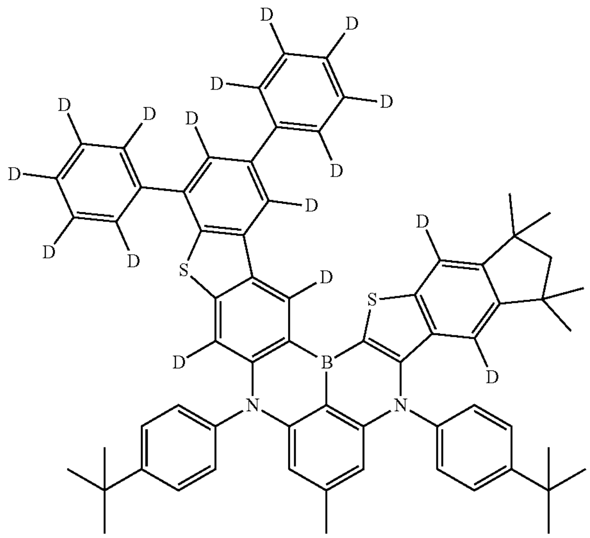
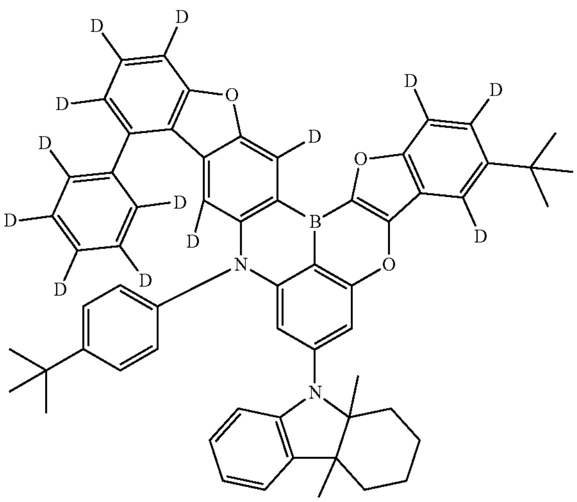
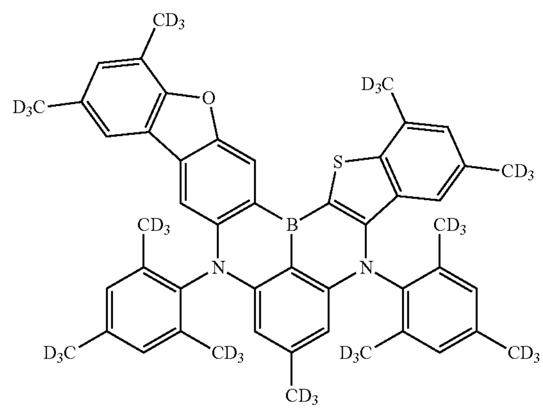
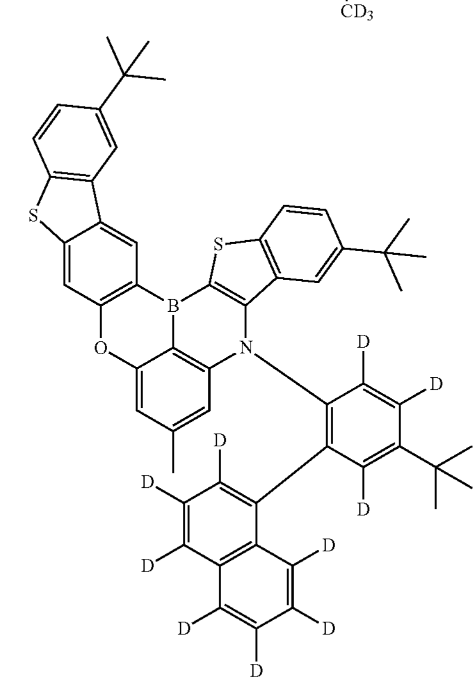
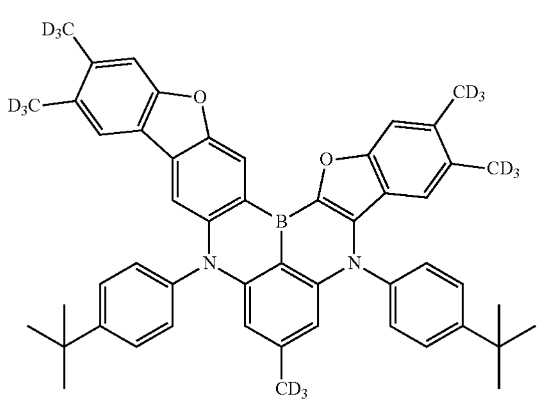

-continued
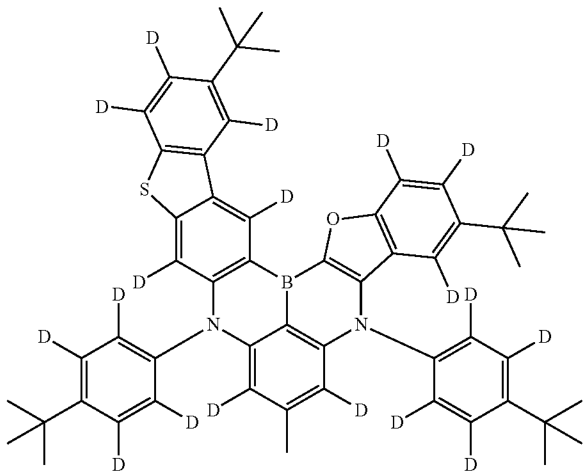
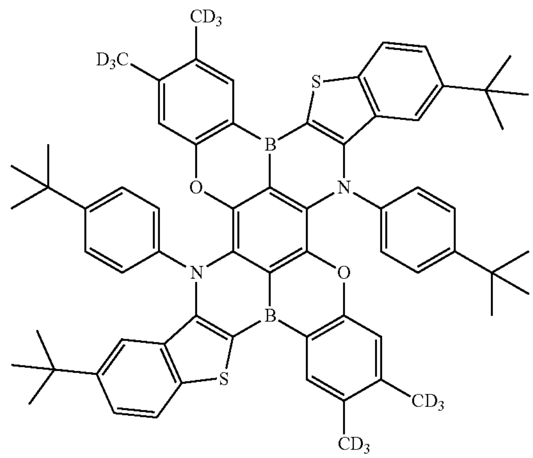
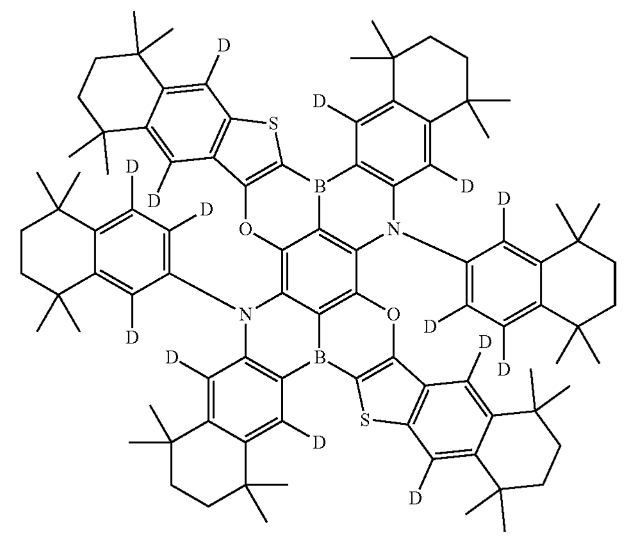
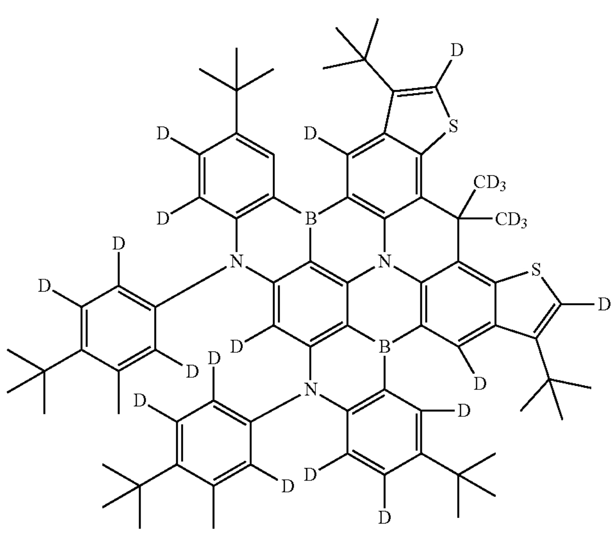

-continued
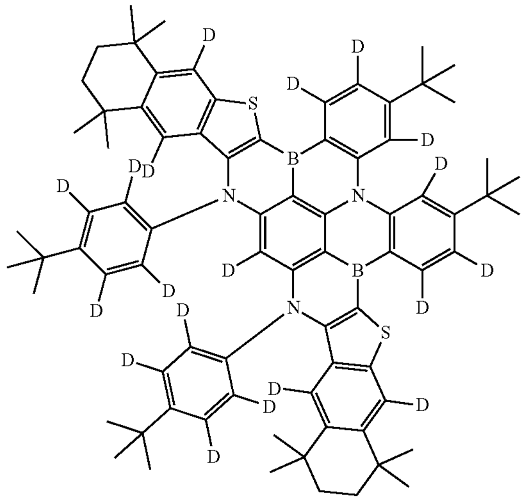
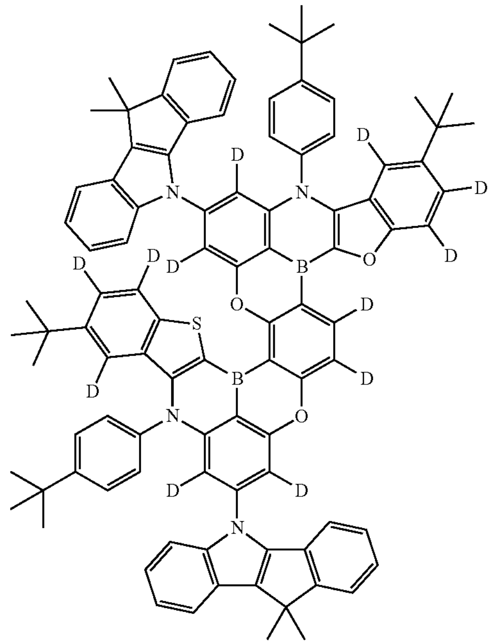
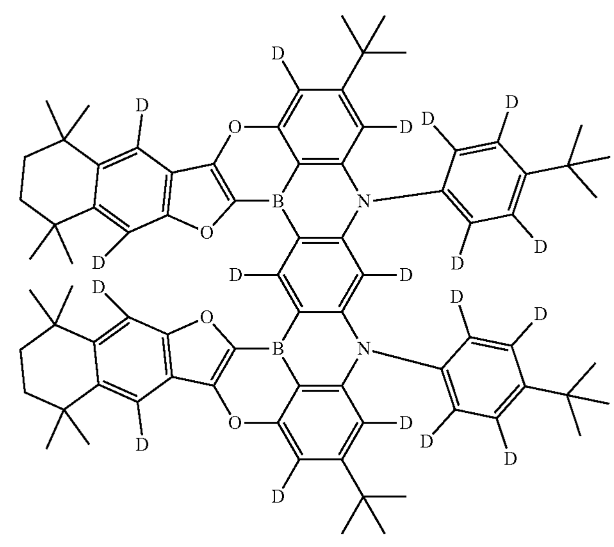

-continued
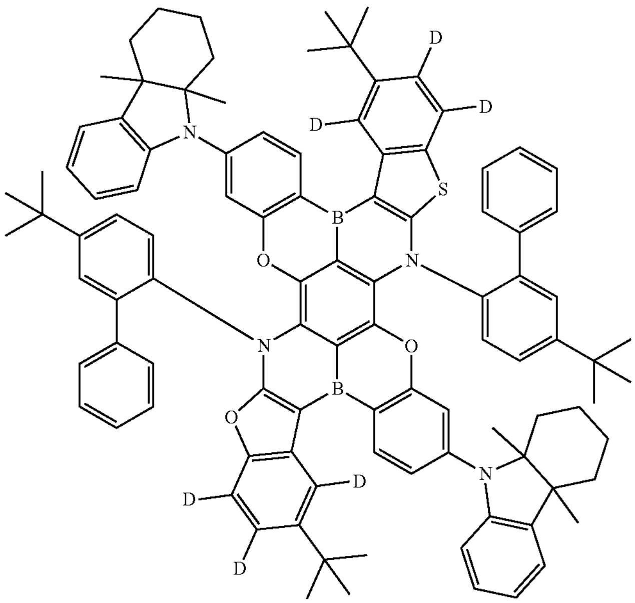
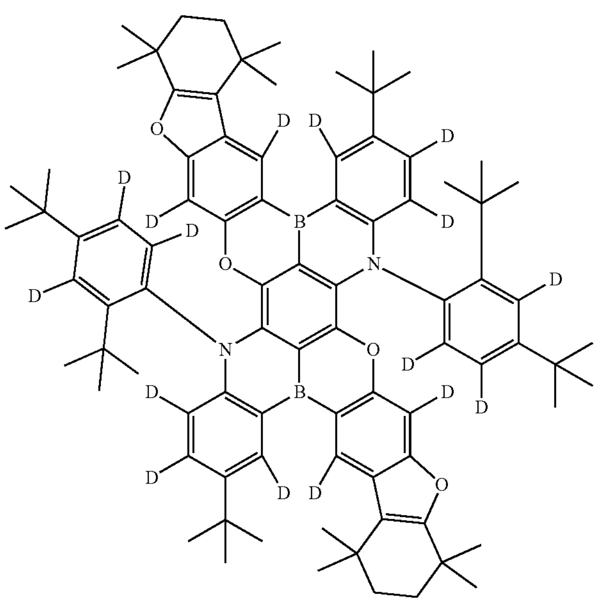

-continued
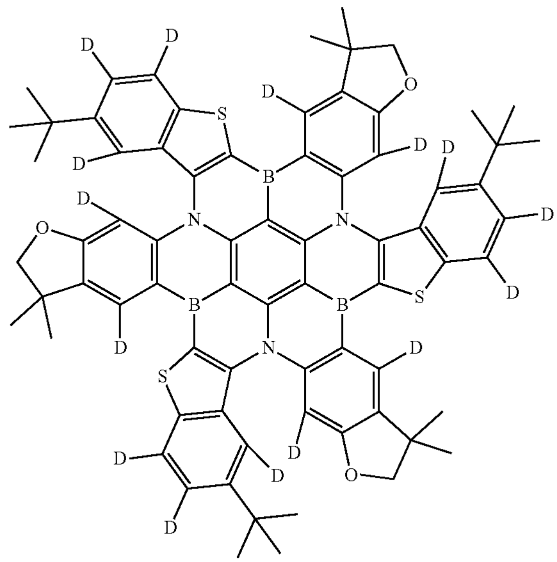
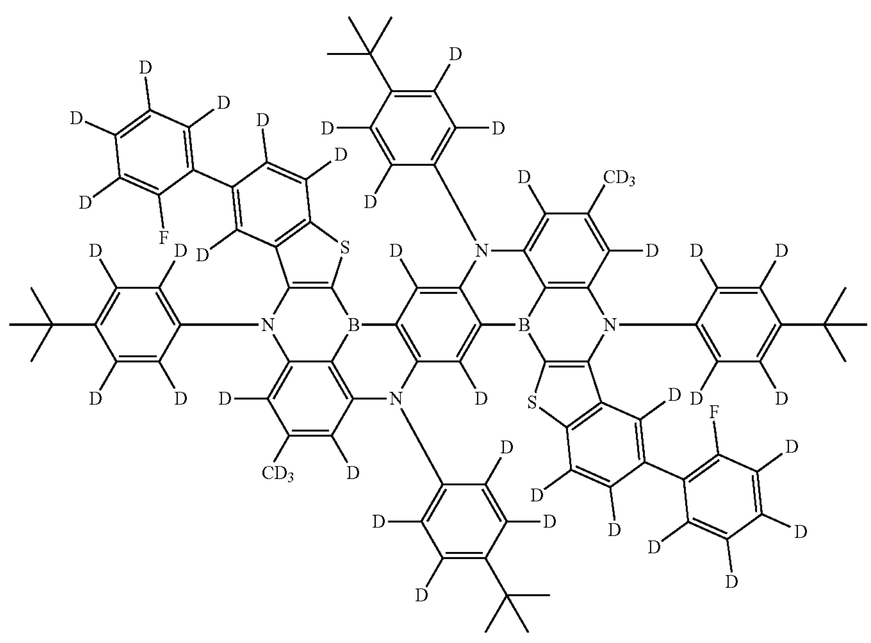

-continued
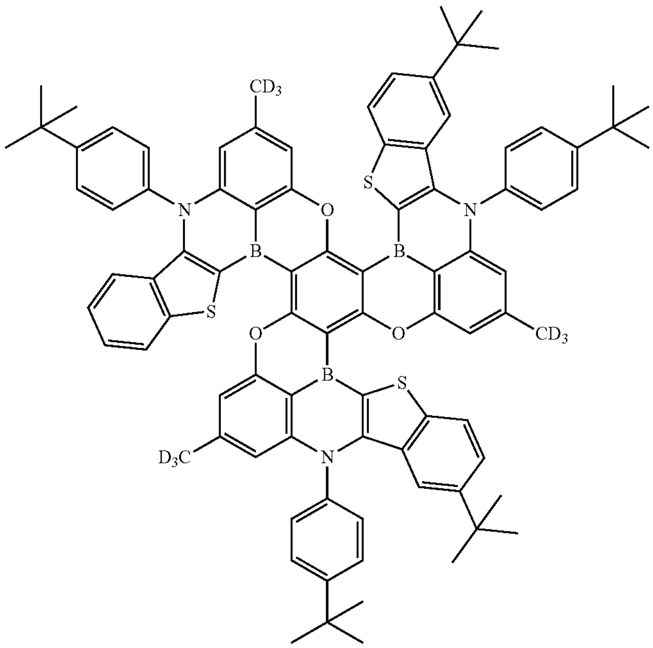
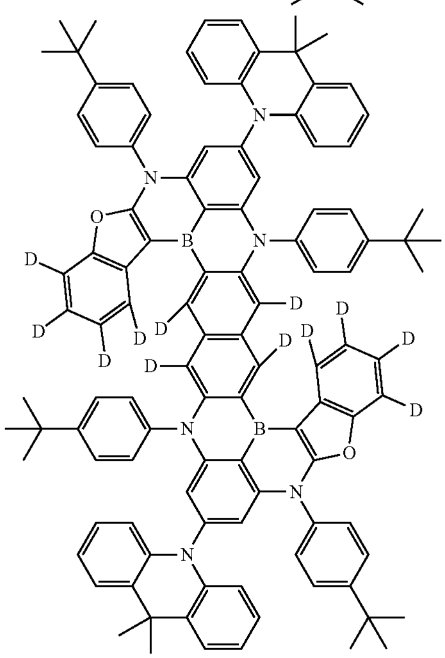
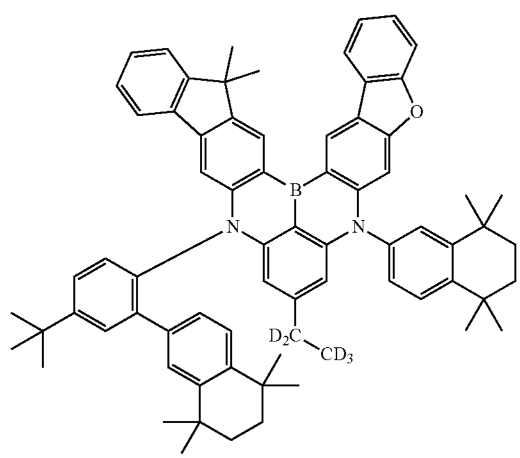
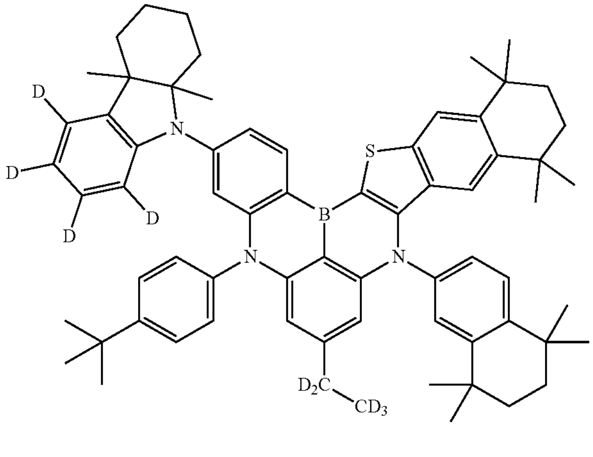

-continued
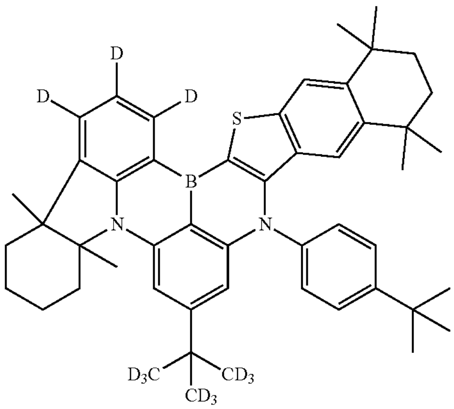
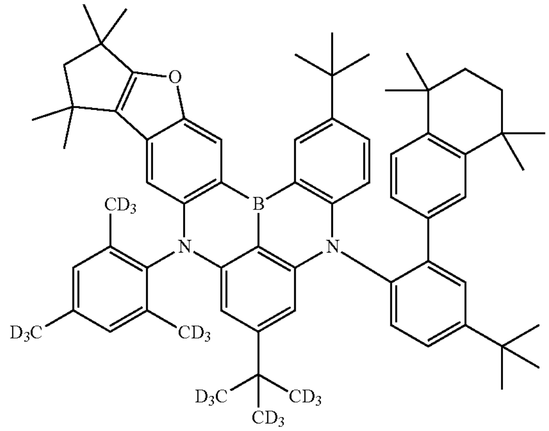
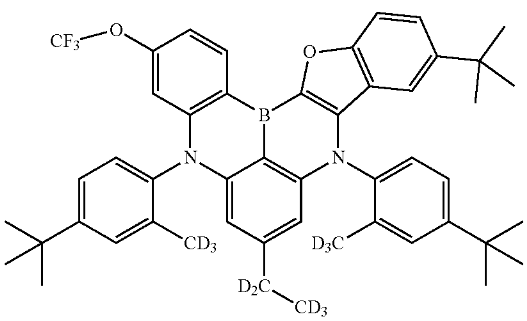
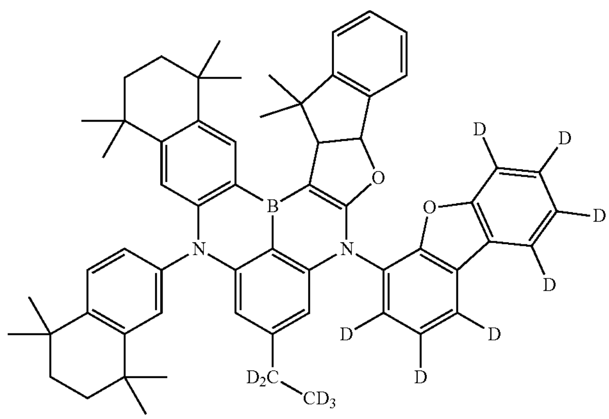
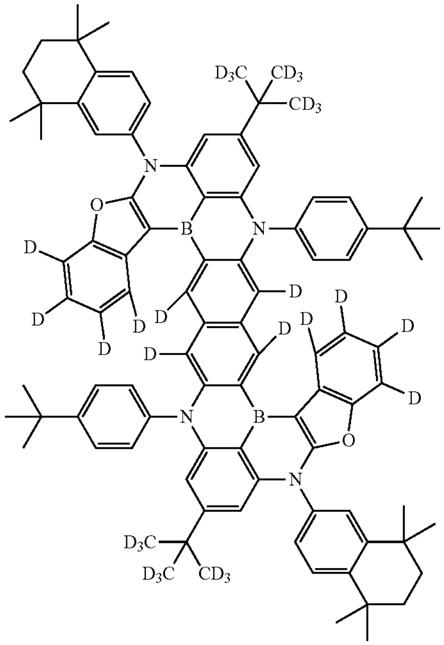

-continued
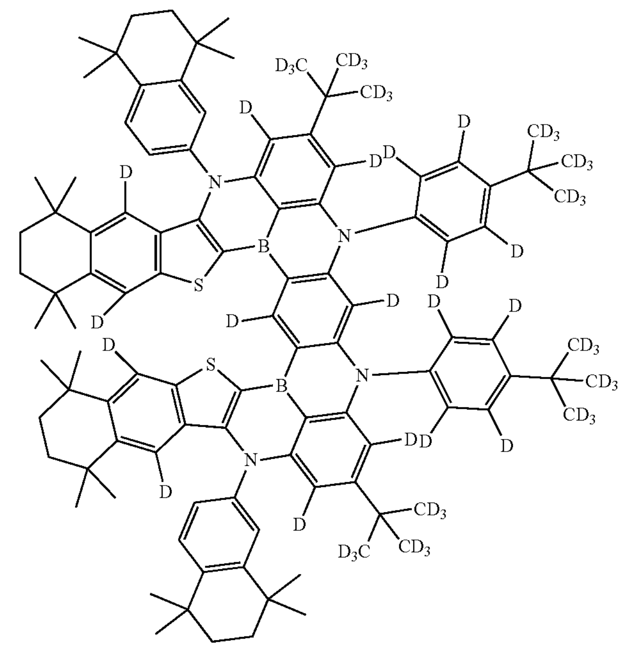
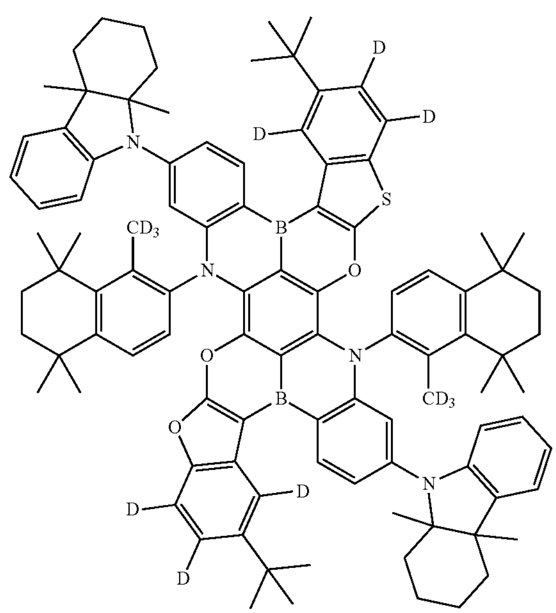

-continued

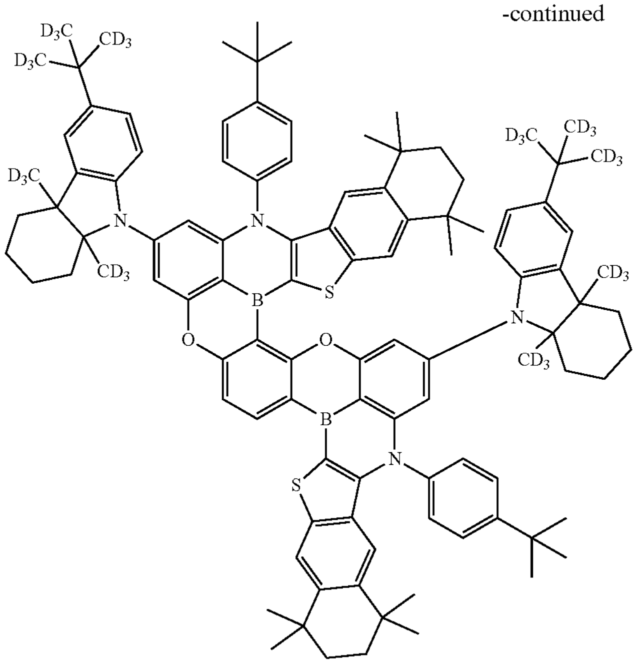

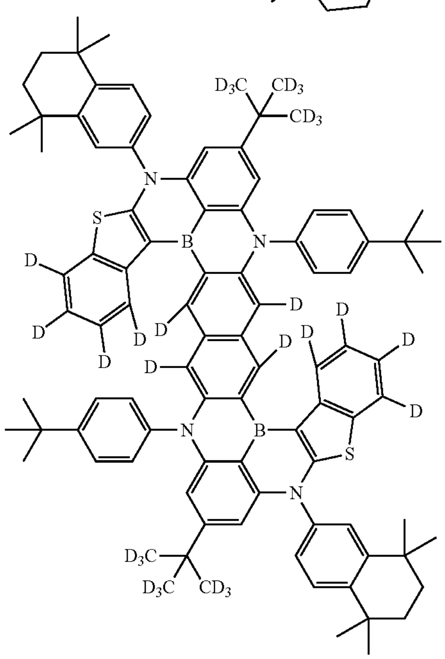

The present specification provides an organic light emitting device including the above-described compound.

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element can be further included.

In the present specification, the 'layer' has a meaning compatible with a 'film' usually used in the art, and means a coating covering a target region. The size of the 'layer' is not limited, and the sizes of the respective 'layers' can be the same as or different from one another. According to an exemplary embodiment, the size of the 'layer' can be the same as that of the entire device, can correspond to the size of a specific functional region, and can also be as small as a single sub-pixel.

In the present specification, when a specific A material is included in a B layer, this means both i) the fact that one or more A materials are included in one B layer and ii) the fact that the B layer is composed of one or more layers, and the A material is included in one or more layers of the multi-layered B layer.

In the present specification, when a specific A material is included in a C layer or a D layer, this means all of i) the fact that the A material is included in one or more layers of the C layer having one or more layers, ii) the fact that the A material is included in one or more layers of the D layer having one or more layers, and iii) the fact that the A material is included in each of the C layer having one or more layers and the D layer having one or more layers.

The present specification provides an organic light emitting device including: a first electrode; a second electrode provided to face the first electrode; and an organic material layer having one or more layers provided between the first electrode and the second electrode, in which one or more layers of the organic material layer include the compound of Chemical Formula 1.

The organic material layer of the organic light emitting device of the present specification can also be composed of a single-layered structure, but can be composed of a multi-layered structure in which an organic material layer having two or more layers is stacked. For example, the organic light emitting device can have a structure including a hole injection layer, a hole transport layer, a light emitting layer, an electron transport layer, an electron injection layer, an electron blocking layer, a hole blocking layer, and the like. However, the structure of the organic light emitting device is not limited thereto, and can include a fewer number of organic layers.

In an exemplary embodiment of the present specification, the organic material layer includes a light emitting layer, and the light emitting layer includes the compound of Chemical Formula 1.

In an exemplary embodiment of the present specification, the organic material layer includes a light emitting layer, and the light emitting layer includes the compound of Chemical Formula 1 as a dopant of the light emitting layer.

In an exemplary embodiment of the present specification, the organic material layer includes a light emitting layer, and the light emitting layer includes the compound of Chemical Formula 1 as a blue fluorescent dopant of the light emitting layer.

In an exemplary embodiment of the present specification, the organic light emitting device further includes one or two or more layers selected from the group consisting of a hole injection layer, a hole transport layer, a light emitting layer, an electron transport layer, an electron injection layer, a hole blocking layer, and an electron blocking layer.

In an exemplary embodiment of the present specification, the light emitting layer further includes a host compound.

In an exemplary embodiment of the present specification, the light emitting layer further includes a host compound, and at least one hydrogen at a substitutable position of the host compound is substituted with deuterium.

In an exemplary embodiment of the present specification, when the host compound is substituted with deuterium, 30% or more of the host compound is substituted with deuterium. In another exemplary embodiment, 40% or more of the host compound is substituted with deuterium. In still another exemplary embodiment, 60% or more of the host compound is substituted with deuterium. In yet another exemplary embodiment, 80% or more of the host compound is substituted with deuterium. In still yet another embodiment, 100% of the host compound is substituted with deuterium.

In an exemplary embodiment of the present specification, the light emitting layer further includes a compound of the following Chemical Formula H:

<Chemical Formula H>

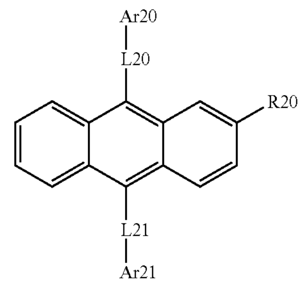

wherein in Chemical Formula H:

L20 and L21 are the same as or different from each other, and are each independently a direct bond, a substituted or unsubstituted arylene group, or a substituted or unsubstituted heteroarylene group;

Ar20 and Ar21 are the same as or different from each other, and are each independently hydrogen; deuterium; a substituted or unsubstituted aryl group; or a substituted or unsubstituted heterocyclic group, and R20 is hydrogen; deuterium; a halogen group; a substituted or unsubstituted alkyl group; a substituted or unsubstituted cycloalkyl group; a substituted or unsubstituted aryl group; or a substituted or unsubstituted heterocyclic group.

In an exemplary embodiment of the present specification, L20 and L21 are the same as or different from each other, and are each independently a direct bond; a monocyclic or polycyclic arylene group having 6 to 30 carbon atoms; or a monocyclic or polycyclic heteroarylene group having 2 to 30 carbon atoms.

In an exemplary embodiment of the present specification, L20 and L21 are the same as or different from each other, and are each independently a direct bond; a monocyclic or polycyclic arylene group having 6 to 20 carbon atoms; or a monocyclic or polycyclic heteroarylene group having 2 to 20 carbon atoms.

In an exemplary embodiment of the present specification, L20 and L21 are the same as or different from each other, and are each independently a direct bond; a phenylene group; a biphenylylene group; a naphthylene group; a divalent dibenzofuran group; or a divalent dibenzothiophene group.

In an exemplary embodiment of the present specification, Ar20 and Ar21 are the same as or different from each other, and are each independently a substituted or unsubstituted monocyclic or polycyclic aryl group having 6 to 30 carbon atoms; or a substituted or unsubstituted monocyclic or polycyclic heterocyclic group having 2 to 30 carbon atoms.

In an exemplary embodiment of the present specification, Ar20 and Ar21 are the same as or different from each other, and are each independently a substituted or unsubstituted monocyclic or polycyclic aryl group having 6 to 20 carbon atoms; or a substituted or unsubstituted monocyclic or polycyclic heterocyclic group having 2 to 20 carbon atoms.

In an exemplary embodiment of the present specification, Ar20 and Ar21 are the same as or different from each other, and are each independently a substituted or unsubstituted monocyclic to tetracyclic aryl group having 6 to 20 carbon atoms; or a substituted or unsubstituted monocyclic to tetracyclic heterocyclic group having 6 to 20 carbon atoms.

In an exemplary embodiment of the present specification, Ar20 and Ar21 are the same as or different from each other, and are each independently a substituted or unsubstituted phenyl group; a substituted or unsubstituted biphenyl group; a substituted or unsubstituted terphenyl group; a substituted or unsubstituted naphthyl group; a substituted or unsubstituted anthracene group; a substituted or unsubstituted phenanthrene group; a substituted or unsubstituted phenalene group; a substituted or unsubstituted fluorene group; a substituted or unsubstituted benzofluorene group; a substituted or unsubstituted furan group; a substituted or unsubstituted thiophene group; a substituted or unsubstituted dibenzofuran group; a substituted or unsubstituted naphthobenzofuran group; a substituted or unsubstituted dibenzothiophene group; or a substituted or unsubstituted naphthobenzothiophene group.

In an exemplary embodiment of the present specification, Ar20 and Ar21 are the same as or different from each other, and are each independently a phenyl group which is unsubstituted or substituted with a monocyclic or polycyclic aryl group having 6 to 20 carbon atoms; a biphenyl group which is unsubstituted or substituted with a monocyclic or polycyclic aryl group having 6 to 20 carbon atoms; a naphthyl group which is unsubstituted or substituted with a monocyclic or polycyclic aryl group having 6 to 20 carbon atoms; a dibenzofuran group which is unsubstituted or substituted with a monocyclic or polycyclic aryl group having 6 to 20 carbon atoms; a naphthobenzofuran group which is unsubstituted or substituted with a monocyclic or polycyclic aryl group having 6 to 20 carbon atoms; a dibenzothiophene group which is unsubstituted or substituted with a monocyclic or polycyclic aryl group having 6 to 20 carbon atoms; or a naphthobenzothiophene group which is unsubstituted or substituted with a monocyclic or polycyclic aryl group having 6 to 20 carbon atoms.

In an exemplary embodiment of the present specification, Ar20 is a substituted or unsubstituted heterocyclic group, and Ar21 is a substituted or unsubstituted aryl group.

In an exemplary embodiment of the present specification, R20 is hydrogen; deuterium; a halogen group; a substituted or unsubstituted straight-chained or branched alkyl group having 1 to 30 carbon atoms; a substituted or unsubstituted monocyclic or polycyclic cycloalkyl group having 3 to 30 carbon atoms; a substituted or unsubstituted monocyclic or polycyclic aryl group having 6 to 30 carbon atoms; or a substituted or unsubstituted monocyclic or polycyclic heterocyclic group having 2 to 30 carbon atoms.

In an exemplary embodiment of the present specification, R20 is hydrogen; deuterium; fluorine; a substituted or unsubstituted straight-chained or branched alkyl group having 1 to 10 carbon atoms; a substituted or unsubstituted monocyclic or polycyclic cycloalkyl group having 3 to 10 carbon atoms; a substituted or unsubstituted monocyclic or polycyclic aryl group having 6 to 30 carbon atoms; or a substituted or unsubstituted monocyclic or polycyclic heterocyclic group having 2 to 30 carbon atoms.

In an exemplary embodiment of the present specification, when the compound of Chemical Formula H is substituted with deuterium, 30% or more of H at a substitutable position is substituted with deuterium. In another exemplary embodiment, in the structure of Chemical Formula H, 40% or more of H at a substitutable position is substituted with deuterium.

In still another exemplary embodiment, in the structure of Chemical Formula H, 60% or more of H at a substitutable position is substituted with deuterium. In yet another exemplary embodiment, in the structure of Chemical Formula H, 80% or more of H at a substitutable position is substituted with deuterium.

In still yet another exemplary embodiment, in the structure of Chemical Formula H, 100% of H at a substitutable position is substituted with deuterium.

In an exemplary embodiment of the present specification, the compound of Chemical Formula H is any one selected from the following compounds.

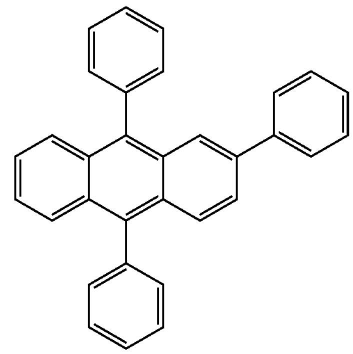

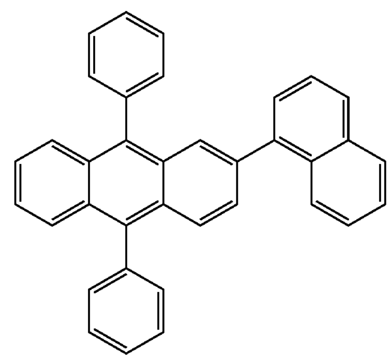

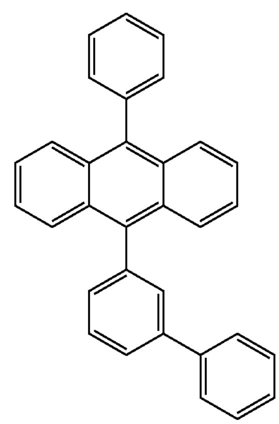

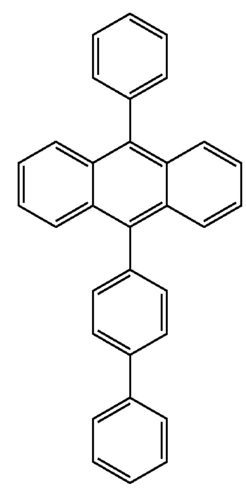

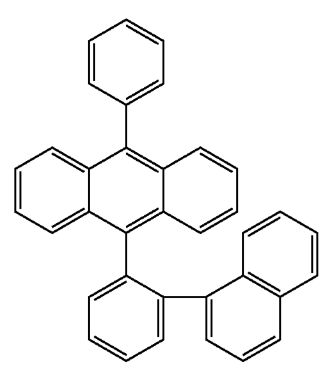

-continued
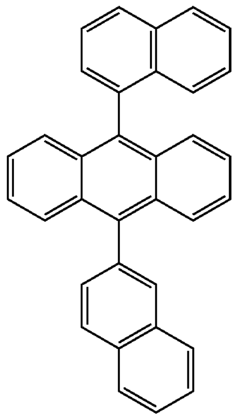
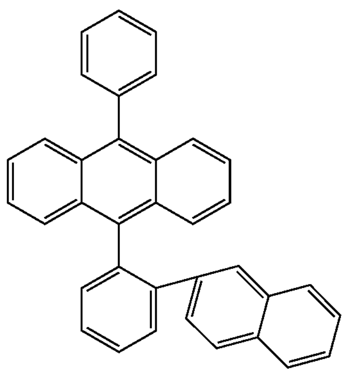
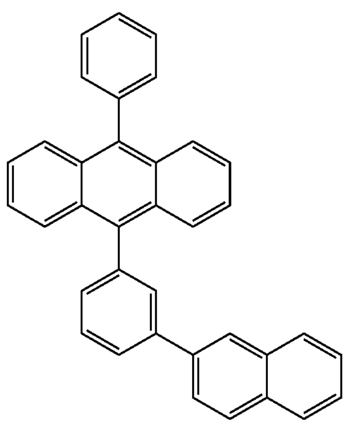
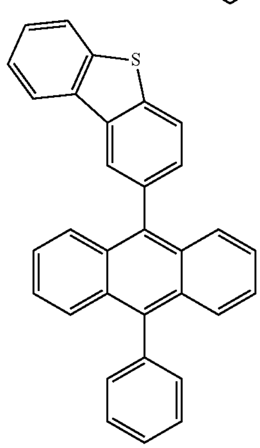
-continued
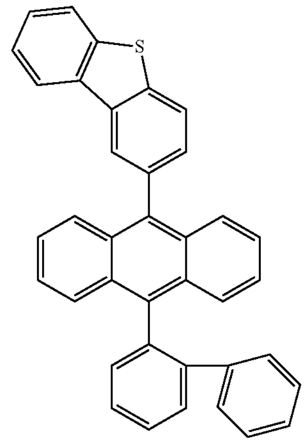
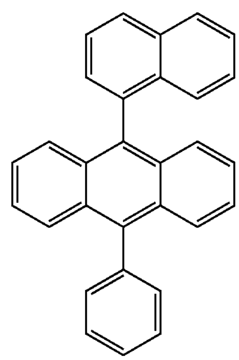
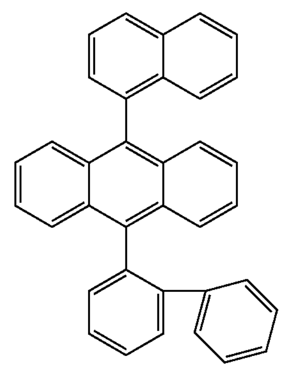
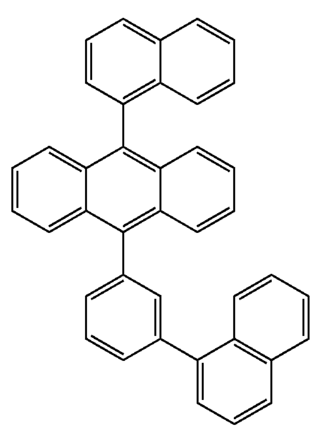

-continued
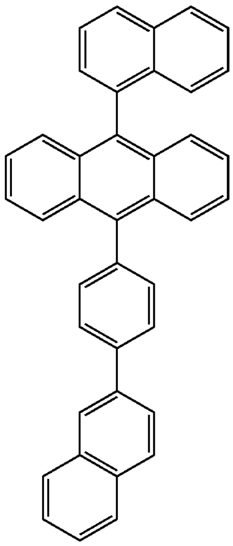
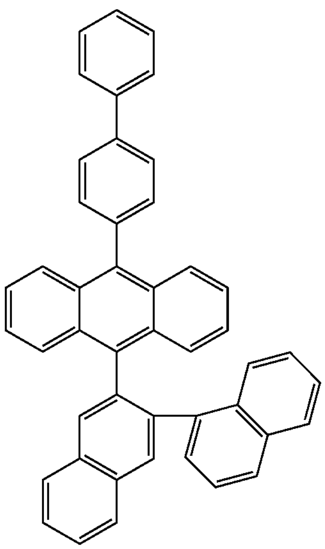
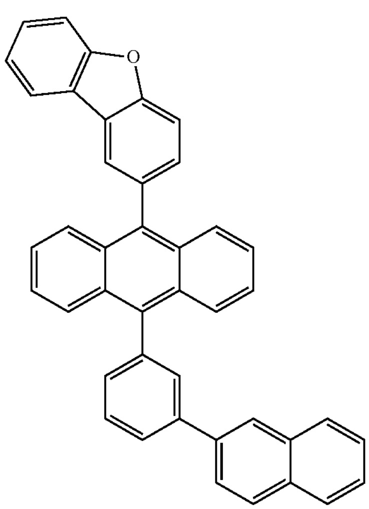
-continued
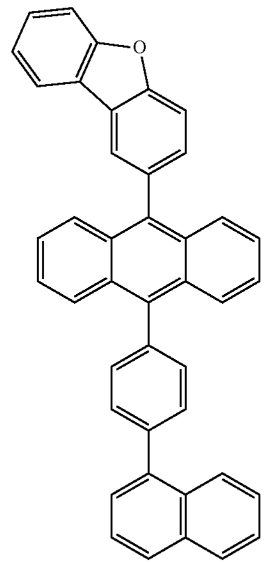
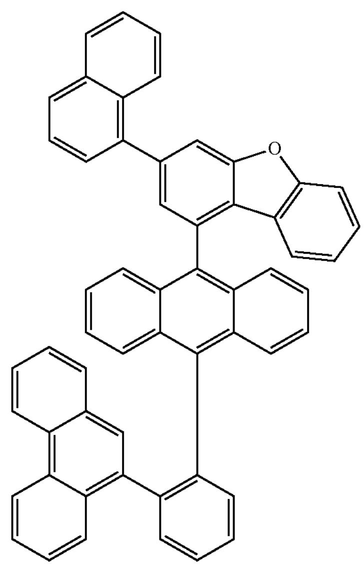
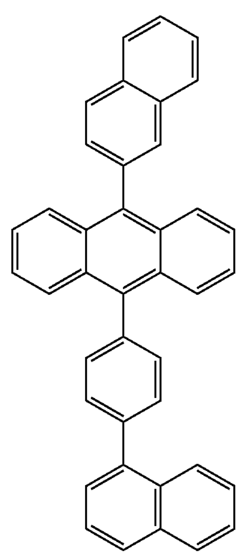

-continued
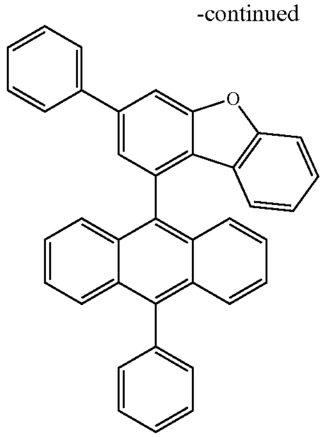
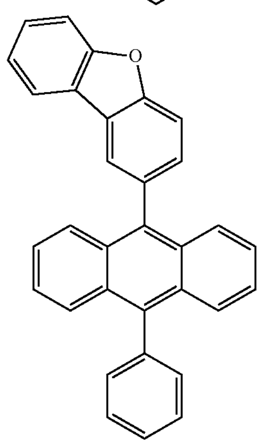
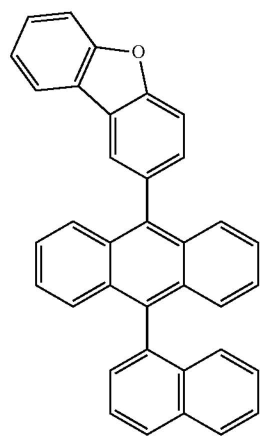
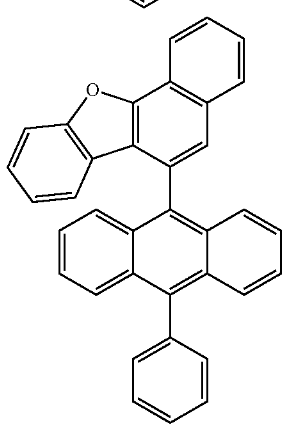
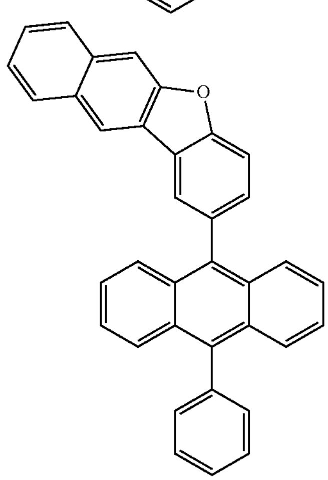
-continued
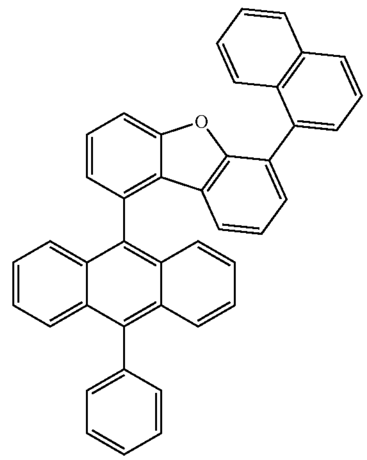
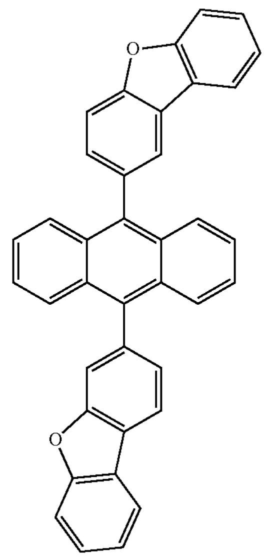
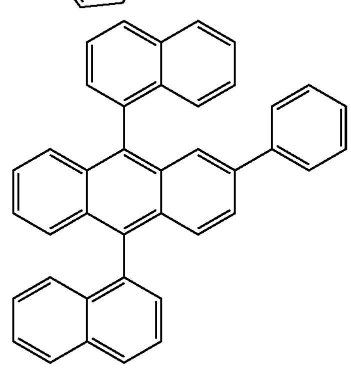
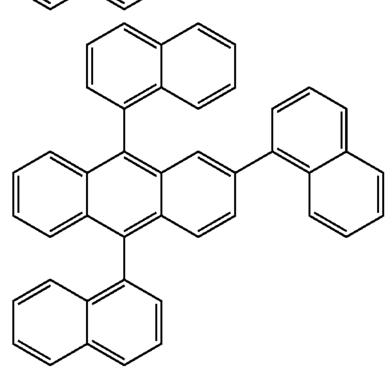

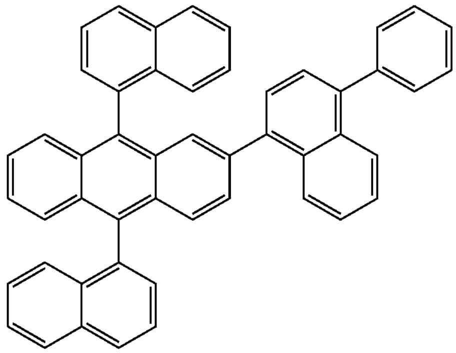
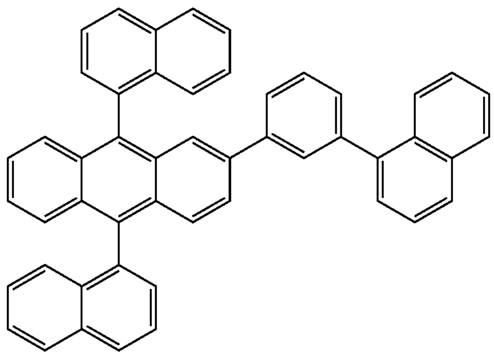
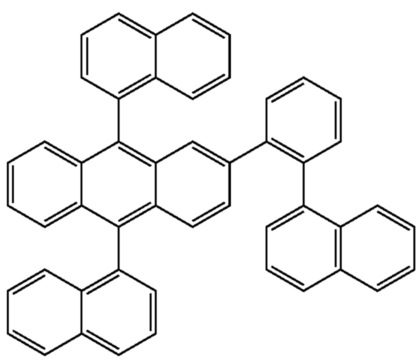
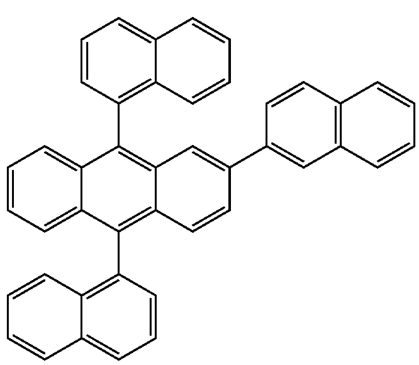
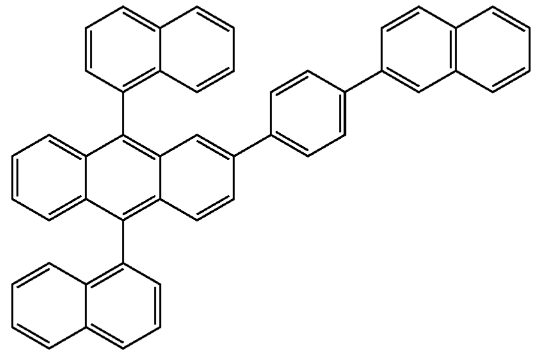
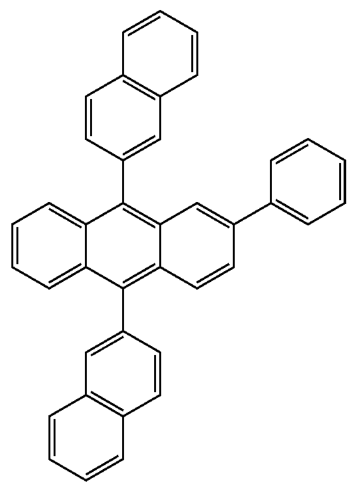
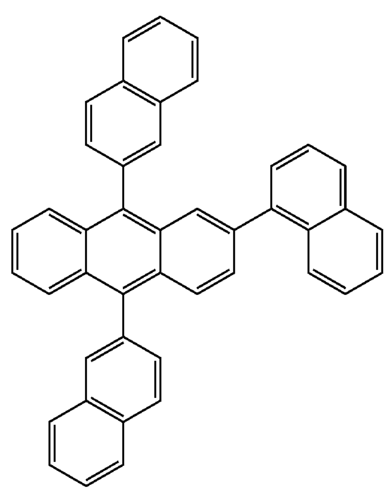

-continued
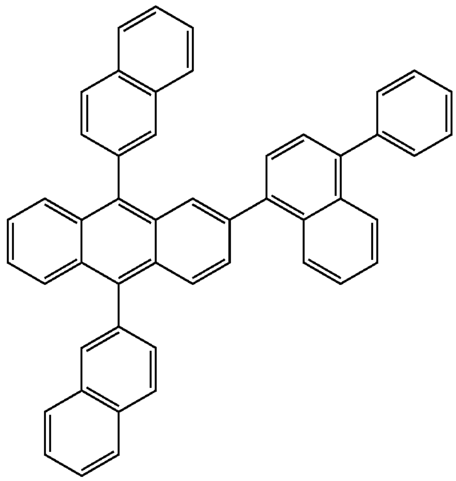
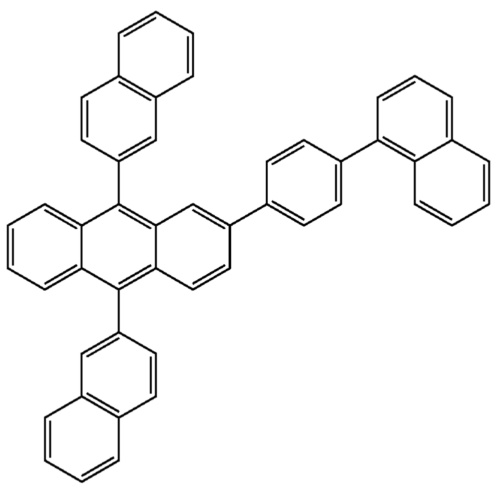
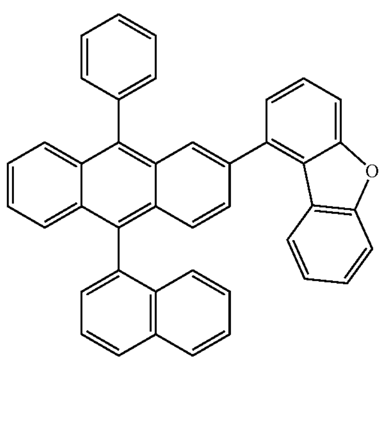
-continued
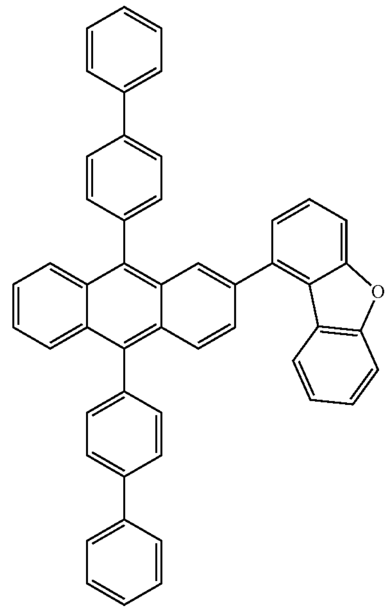
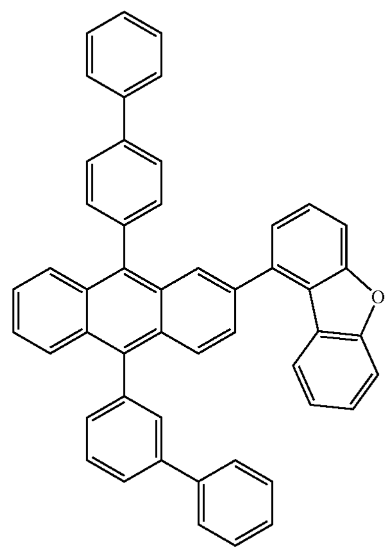
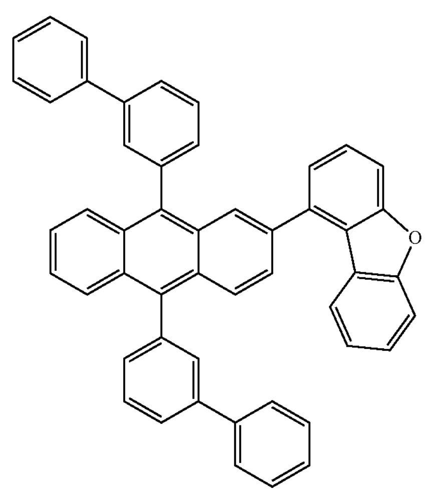

-continued
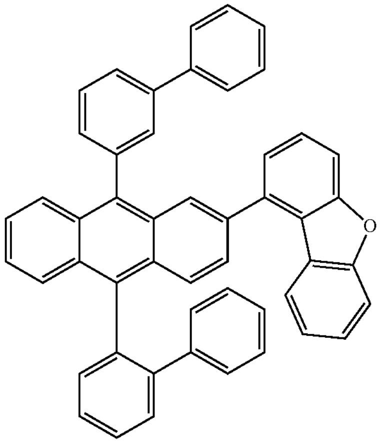
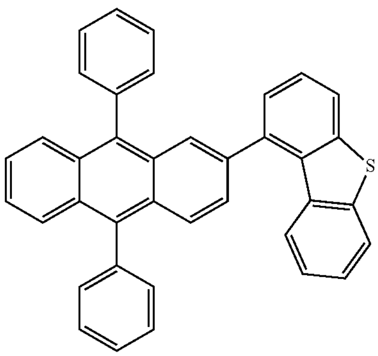
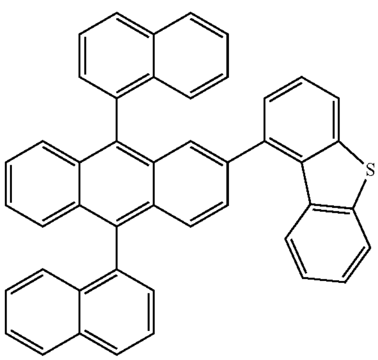
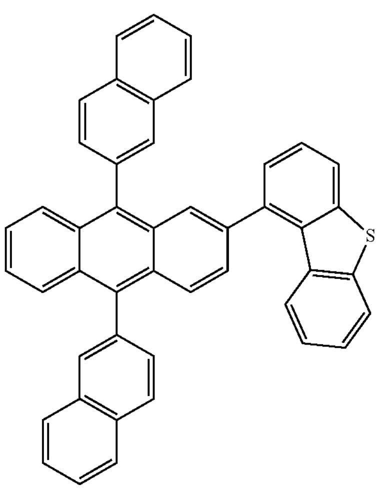
-continued
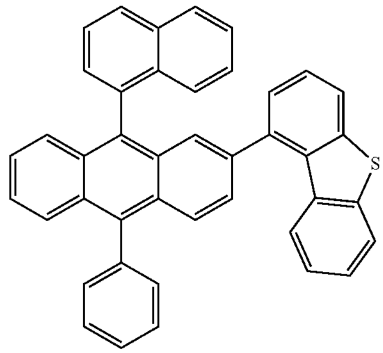
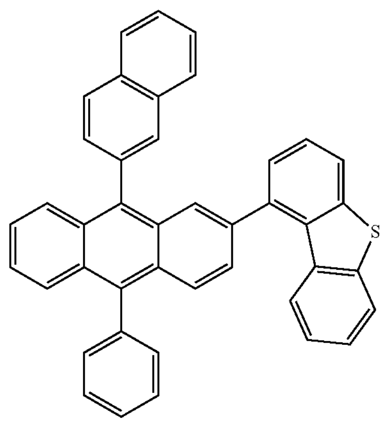
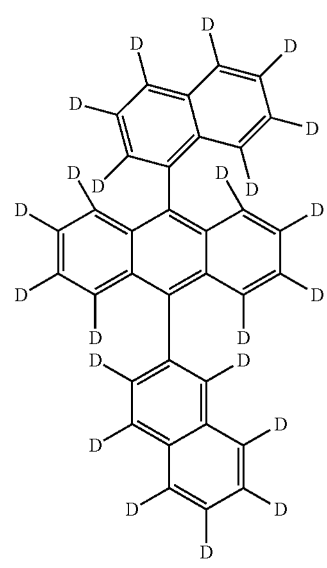

-continued
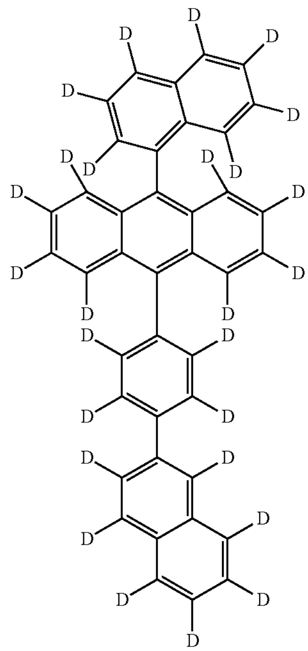
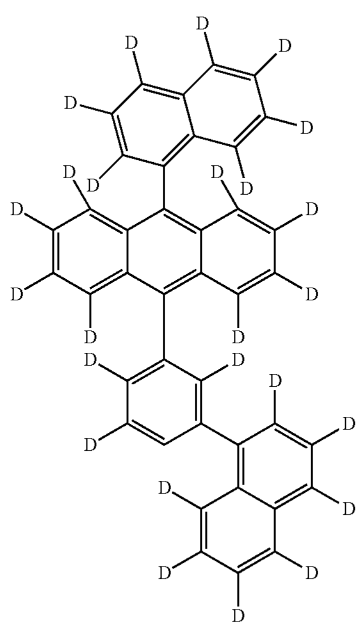
-continued
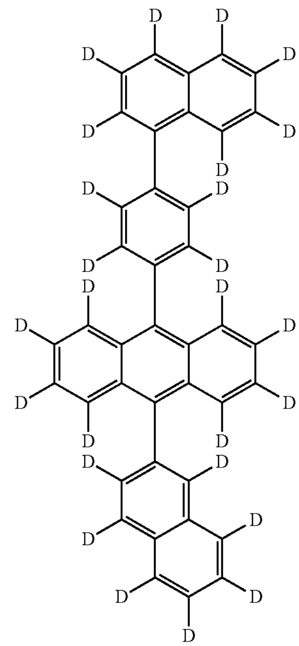
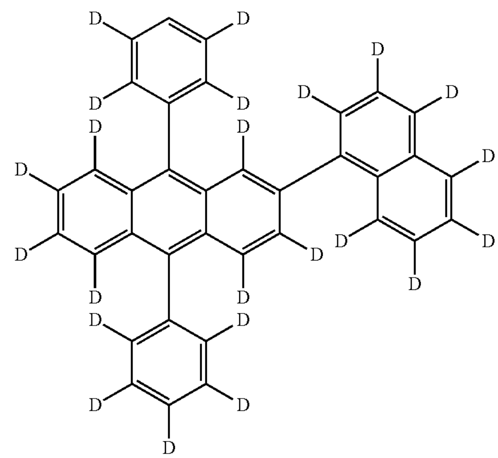
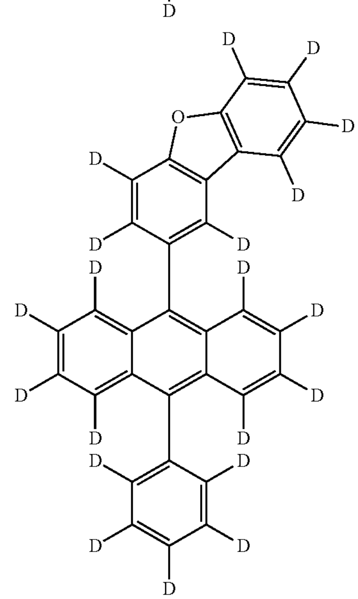

-continued

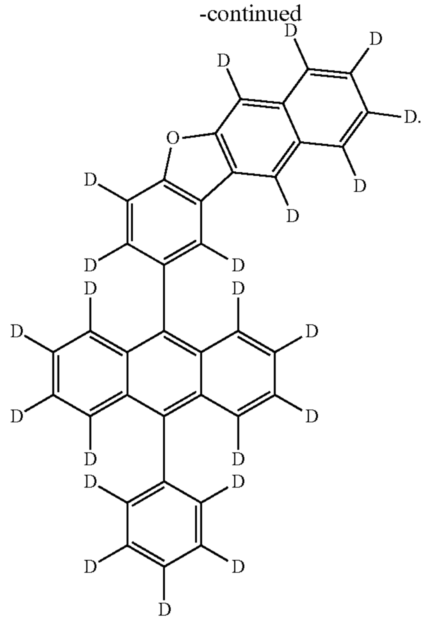

In an exemplary embodiment of the present specification, in the light emitting layer, the compound of Chemical Formula 1 is used as a dopant, and the compound of Chemical Formula H is used as a host.

In an exemplary embodiment of the present specification, when the light emitting layer includes a host and a dopant, a content of the dopant can be selected within a range of 0.01 to 10 parts by weight based on 100 parts by weight of the host, but is not limited thereto.

In an exemplary embodiment of the present specification, the light emitting layer includes a host and a dopant, and the host and the dopant are included at a weight ratio of 99:1 to 1:99, preferably 99:1 to 70:30, and more preferably 99:1 to 90:10.

The light emitting layer can further include a host material, and examples of the host include a fused aromatic ring derivative, a hetero ring-containing compound, and the like. Specifically, examples of the fused aromatic ring derivative include anthracene derivatives, pyrene derivatives, naphthalene derivatives, pentacene derivatives, phenanthrene compounds, fluoranthene compounds, and the like, and examples of the hetero ring-containing compound include carbazole derivatives, dibenzofuran derivatives, ladder-type furan compounds, pyrimidine derivatives, triazine derivatives, or the like, and the examples thereof can be a mixture of two or more thereof, but are not limited thereto.

According to an exemplary embodiment of the present specification, the organic material layer includes a light emitting layer, and the light emitting layer includes two or more mixed dopants and a host.

According to an exemplary embodiment of the present specification, one or more of the two or more mixed dopants include Chemical Formula 1, and the host includes the compound of Chemical Formula H. One or more of the two or more mixed dopants include Chemical Formula 1, and the others can use dopant materials known in the related art, but the present invention is not limited thereto.

According to an exemplary embodiment of the present specification, one or more of the two or more mixed dopants include Chemical Formula 1, and the others can use one or more of a boron-based compound, a pyrene-based compound, and a delayed fluorescence-based compound, which are different from the compounds in Chemical Formula 1, but the present invention is not limited thereto.

According to an exemplary embodiment of the present specification, the organic material layer includes a light emitting layer, and the light emitting layer includes one or more hosts.

According to an exemplary embodiment of the present specification, the organic material layer includes a light emitting layer, and the light emitting layer includes two or more mixed hosts.

According to an exemplary embodiment of the present specification, one or more of the two or more mixed hosts are the compound of Chemical Formula H.

According to an exemplary embodiment of the present specification, the two or more mixed hosts are different from each other, and are each independently the compound of Chemical Formula H.

According to an exemplary embodiment of the present specification, the organic material layer includes a light emitting layer, and the light emitting layer includes two mixed hosts.

According to an exemplary embodiment of the present specification, the organic material layer includes a light emitting layer, the light emitting layer includes two mixed hosts, the two mixed hosts are different from each other, and the two hosts are the compounds of Chemical Formula H.

According to an exemplary embodiment of the present specification, the organic material layer includes a light emitting layer, and includes: a first host of Chemical Formula H; and a second host of Chemical Formula H, and the first host and the second host are different from each other.

According to an exemplary embodiment of the present specification, the first host: the second host are included at a weight ratio of 95:5 to 5:95, preferably at a weight ratio of 70:30 to 30:70.

According to an exemplary embodiment of the present specification, the organic material layer includes a light emitting layer, and the light emitting layer includes one or more hosts, and a dopant.

According to an exemplary embodiment of the present specification, the organic material layer includes a light emitting layer, the light emitting layer includes one or more hosts, and a dopant, the host includes the compound of Chemical Formula H, and the dopant includes the compound of Chemical Formula 1.

According to an exemplary embodiment of the present specification, the organic material layer includes a light emitting layer, and the light emitting layer includes two or more mixed hosts, and a dopant.

According to an exemplary embodiment of the present specification, one or more of the two or more mixed hosts include the compound of Chemical Formula H, and the dopant includes the compound of Chemical Formula 1.

In the present specification, the two or more mixed hosts are different from each other.

According to an exemplary embodiment of the present specification, the organic material layer includes a light emitting layer, and the light emitting layer includes two mixed hosts, and a dopant.

According to an exemplary embodiment of the present specification, the two mixed hosts are different from each other, and each independently include the compound of Chemical Formula H, and the dopant includes the compound of Chemical Formula 1.

According to an exemplary embodiment of the present specification, the organic material layer includes a light emitting layer, and includes: a first host of Chemical Formula H; a second host of Chemical Formula H; and a dopant of Chemical Formula 1, and the first host and the second host are different from each other.

According to an exemplary embodiment of the present specification, one or more hosts and one or more dopants are used in the organic material layer, the one or more hosts include the compound of Chemical Formula H, and the one or more dopants include the compound of Chemical Formula 1.

According to an exemplary embodiment of the present specification, two or more mixed hosts and two or more mixed dopants are used in the organic material layer, the same material as described above can be used in the two or more mixed hosts, and the same material as described above can be used in the two or more mixed dopants.

In an exemplary embodiment of the present specification, the organic light emitting device includes: a first electrode; a second electrode; a light emitting layer provided between the first electrode and the second electrode; and an organic material layer having two or more layers provided between the light emitting layer and the first electrode, or between the light emitting layer and the second electrode, in which at least one of the two or more organic material layers includes the compound of Chemical Formula 1.

In an exemplary embodiment of the present specification, as the organic material layer having two or more layers, two or more can be selected from the group consisting of a light emitting layer, a hole transport layer, a hole injection layer, a layer which simultaneously transports and injects holes, and an electron blocking layer.

In an exemplary embodiment of the present specification, the organic material layer includes an electron transport layer having two or more layers, and at least one of the electron transport layers having two or more layers includes the compound of Chemical Formula 1. Specifically, in an exemplary embodiment of the present specification, the compound of Chemical Formula 1 can also be included in one layer of the electron transport layer having two or more layers, and can be included in each of the electron transport layer having two or more layers.

Further, in an exemplary embodiment of the present specification, when the compound is included in each of the electron transport layer having two or more layers, the other materials except for the compound of Chemical Formula 1 can be the same as or different from each other.

When the organic material layer including the compound of Chemical Formula 1 is an electron transport layer, the electron transport layer can further include an n-type dopant. As the n-type dopant, those known in the art can be used, and for example, a metal or a metal complex can be used. For example, the electron transport layer including the compound of Chemical Formula 1 can further include lithium quinolate (LiQ).

In an exemplary embodiment of the present specification, the organic material layer includes a hole transport layer having two or more layers, and at least one of the hole transport layers having two or more layers includes the compound of Chemical Formula 1. Specifically, in an exemplary embodiment of the present specification, the compound of Chemical Formula 1 can also be included in one layer of the hole transport layer having two or more layers, and can be included in each of the hole transport layers having two or more layers.

In addition, in an exemplary embodiment of the present specification, when the compound of Chemical Formula 1 is included in each of the hole transport layers having two or more layers, the other materials except for the compound of Chemical Formula 1 can be the same as or different from each other.

In an exemplary embodiment of the present specification, the organic material layer can further include a hole injection layer or a hole transport layer, which includes a compound including an arylamine group, a carbazolyl group, or a benzocarbazolyl group, in addition to the organic material layer including the compound of Chemical Formula 1.

In an exemplary embodiment of the present specification, the first electrode is an anode or a cathode.

In an exemplary embodiment of the present specification, the second electrode is a cathode or an anode.

In an exemplary embodiment of the present specification, the organic light emitting device can be a normal type organic light emitting device in which an anode, an organic material layer having one or more layers, and a cathode are sequentially stacked on a substrate.

In an exemplary embodiment of the present specification, the organic light emitting device can be an inverted type organic light emitting device in which a cathode, an organic material layer having one or more layers, and an anode are sequentially stacked on a substrate.

For example, the structure of the organic light emitting device according to an exemplary embodiment of the present specification is exemplified in FIGS. 1 to 3. FIGS. 1 to 3 exemplify an organic light emitting device, and the organic light emitting device is not limited thereto.

FIG. 1 exemplifies a structure of an organic light emitting device in which a substrate 1, a first electrode 2, a light emitting layer 3, and a second electrode 4 are sequentially stacked. In the structure described above, the compound can be included in the light emitting layer 3.

FIG. 2 illustrates an example of an organic light emitting device in which a substrate 1, a first electrode 2, a hole injection layer 5, a hole transport layer 8, an electron blocking layer 9, a light emitting layer 3, a hole blocking layer 6, an electron injection and transport layer 7, and a second electrode 4 are sequentially stacked. In the structure described above, the compound can be included in one or more layers of the light emitting layer 3, the hole blocking layer 6, the electron injection and transport layer 7, and the hole transport layer 8.

FIG. 3 illustrates an example of an organic light emitting device in which a substrate 1, a first electrode 2, a hole injection layer 5, a hole transport layer 8, an electron blocking layer 9, a light emitting layer 3, a first electron transport layer 10, a second electron transport layer 11, an electron injection layer 12, and a second electrode 4 are sequentially stacked. In the structure described above, the compound can be included in the light emitting layer 3.

The organic light emitting device of the present specification can be manufactured by the materials and methods known in the art, except that one or more layers of the organic material layer include the compound, that is, the compound of Chemical Formula 1.

When the organic light emitting device includes a plurality of organic material layers, the organic material layers can be formed of the same material or different materials.

For example, the organic light emitting device of the present specification can be manufactured by sequentially stacking a first electrode, an organic material layer, and a second electrode on a substrate. In this case, the organic light emitting device of the present specification can be manufactured by depositing a metal or a metal oxide having conductivity, or an alloy thereof on a substrate to form a positive electrode, forming an organic material layer including a hole injection layer, a hole transport layer, a light emitting layer, and an electron transport layer thereon, and then depositing a material, which can be used as a cathode, thereon, by using a physical vapor deposition (PVD) method such as sputtering or e-beam evaporation. In addition to the method described above, an organic light emitting device can be manufactured by sequentially depositing a cathode material, an organic material layer, and an anode material on a substrate.

Further, the compound of Chemical Formula 1 can be formed as an organic material layer by not only a vacuum deposition method, but also a solution application method when an organic light emitting device is manufactured. Here, the solution application method means spin coating, dip coating, doctor blading, inkjet printing, screen printing, a spray method, roll coating, and the like, but is not limited thereto.

In addition to the method described above, an organic light emitting device can also be made by sequentially depositing a negative electrode material, an organic material layer, and a positive electrode material on a substrate (International Publication No. 2003/012890). However, the manufacturing method is not limited thereto.

As the first electrode material, materials having a high work function are usually preferred so as to facilitate the injection of holes into an organic material layer. Examples thereof include: a metal, such as vanadium, chromium, copper, zinc, and gold, or an alloy thereof; a metal oxide, such as zinc oxide, indium oxide, indium tin oxide (ITO), and indium zinc oxide (IZO); a combination of a metal and an oxide, such as ZnO:Al or $SnO_2$:Sb; a conductive polymer, such as poly(3-methylthiophene), poly[3,4-(ethylene-1,2-dioxy)thiophene] (PEDOT), polypyrrole, and polyaniline; and the like, but are not limited thereto.

As the second electrode material, materials having a low work function are usually preferred so as to facilitate the injection of electrons into an organic material layer. Examples thereof include: a metal, such as magnesium, calcium, sodium, potassium, titanium, indium, yttrium, lithium, gadolinium, aluminum, silver, tin, and lead, or an alloy thereof; a multi-layer structured material, such as LiF/Al or $LiO_2$/Al; and the like, but are not limited thereto.

The light emitting layer can include a host material and a dopant material. Examples of the host material include fused aromatic ring derivatives, or hetero ring-containing compounds, and the like. Specific examples of the fused aromatic ring derivative include anthracene derivatives, pyrene derivatives, naphthalene derivatives, pentacene derivatives, phenanthrene compounds, fluoranthene compounds, and the like, and specific examples of the hetero ring-containing compound include dibenzofuran derivatives, ladder-type furan compounds, pyrimidine derivatives, and the like, but the examples are not limited thereto.

Examples of the dopant material include aromatic amine derivatives, styrylamine compounds, boron complexes, fluoranthene compounds, metal complexes, and the like, in addition to the compound of Chemical Formula 1. Specifically, the aromatic amine derivative is a fused aromatic ring derivative having a substituted or unsubstituted arylamine group, and examples thereof include pyrene, anthracene, chrysene, periflanthene, and the like having an arylamine group. Further, the styrylamine compound is a compound in which a substituted or unsubstituted arylamine is substituted with at least one arylvinyl group, and one or two or more substituents selected from the group consisting of an aryl group, a silyl group, an alkyl group, a cycloalkyl group, and an arylamine group are substituted or unsubstituted. Specific examples thereof include styrylamine, styryldiamine, styryltriamine, styryltetramine, and the like, but are not limited thereto. Further, examples of the metal complex include an iridium complex, a platinum complex, and the like, but are not limited thereto.

In the present specification, when the compound of Chemical Formula 1 is included in an organic material layer other than a light emitting layer or an additional light emitting layer is provided, a light emitting material of the light emitting layer is a material which can emit light in a visible light region by accepting and combining holes and electrons from a hole transport layer and an electron transport layer, respectively, and is preferably a material having high quantum efficiency for fluorescence or phosphorescence. Examples thereof include: an 8-hydroxy-quinoline aluminum complex ($Alq_3$); a carbazole-based compound; a dimerized styryl compound; BAlq; a 10-hydroxybenzoquinoline-metal compound; benzoxazole-based, benzothiazole-based and benzimidazole-based compounds; a poly(p-phenylene-vinylene) (PPV)-based polymer; a spiro compound; polyfluorene; rubrene; and the like, but are not limited thereto.

The hole injection layer is a layer which injects holes from an electrode. A hole injection material has an ability to transport holes, so that it is preferred that the hole injection material has a hole injection effect in a first electrode and an excellent hole injection effect for a light emitting layer or a light emitting material. Further, the hole injection material is preferably a material which is excellent in ability to prevent excitons produced from a light emitting layer from moving to an electron injection layer or an electron injection material. In addition, the hole injection material is preferably a material which is excellent in ability to form a thin film. Furthermore, the highest occupied molecular orbital (HOMO) of the hole injection material is preferably a value between the work function of the first electrode material and the HOMO of the neighboring organic material layer. Specific examples of the hole injection material include: metal porphyrin, oligothiophene, and arylamine-based organic materials; carbazole-based organic materials; nitrile-based organic materials; hexanitrile hexaazatriphenylene-based organic materials; quinacridone-based organic materials; perylene-based organic materials; polythiophene-based conductive polymers such as anthraquinone and polyaniline; and the like, or a mixture of two or more of the examples, and the like, but are not limited thereto.

The hole transport layer is a layer which accepts holes from a hole injection layer and transports the holes to a light emitting layer. A hole transport material is preferably a material having high hole mobility which can receive holes from a first electrode or a hole injection layer and transfer the holes to a light emitting layer. Specific examples thereof include arylamine-based organic materials, carbazole-based organic materials, conductive polymers, block copolymers having both conjugated portions and non-conjugated portions, and the like, but are not limited thereto.

The electron transport layer is a layer which accepts electrons from an electron injection layer and transports the electrons to a light emitting layer. An electron transport material is preferably a material having high electron mobility which can proficiently receive electrons from a second electrode and transfer the electrons to a light emitting layer. Specific examples thereof include: Al complexes of 8-hydroxy-quinoline; complexes including $Alq_3$; organic radical compounds; hydroxyflavone-metal complexes; triazine derivatives; LiQ, and the like, but are not limited thereto. The electron transport layer can be used with any desired first electrode material, as used according to the related art. In particular, appropriate examples of the first electrode material are a typical material which has a low work function, followed by an aluminum layer or a silver layer. Specific examples thereof include cesium, barium, calcium, ytterbium, and samarium, in each case followed by an aluminum layer or a silver layer.

The electron injection layer is a layer which injects electrons from an electrode. It is preferred that an electron injection material is excellent in ability to transport electrons and has an electron injection effect from the second electrode and an excellent electron injection effect for a light emitting layer or a light emitting material. Further, the electron injection material is preferably a material which prevents excitons produced from a light emitting layer from moving to a hole injection layer and is excellent in ability to form a thin film. Specific examples thereof include fluorenone, anthraquinodimethane, diphenoquinone, thiopyran dioxide, oxazole, oxadiazole, triazole, triazine, imidazole, perylenetetracarboxylic acid, fluorenylidene methane, anthrone, and the like, and derivatives thereof, metal complex compounds, nitrogen-containing 5-membered ring derivatives, two or more mixtures of the example, and the like, but are not limited thereto.

Examples of the metal complex compounds include 8-hydroxyquinolinato lithium, bis(8-hydroxyquinolinato) zinc, bis(8-hydroxyquinolinato) copper, bis(8-hydroxyquinolinato) manganese, tris(8-hydroxyquinolinato) aluminum, tris (2-methyl-8-hydroxyquinolinato) aluminum, tris(8-hydroxyquinolinato) gallium, bis(10-hydroxybenzo[h] quinolinato) beryllium, bis(10-hydroxybenzo[h]-quinolinato) zinc, bis(2-methyl-8-quinolinato) chlorogallium, bis(2-methyl-8-quinolinato) (o-cresolato) gallium, bis(2-methyl-8-quinolinato) (1-naphtholato) aluminum, bis(2-methyl-8-quinolinato) (2-naphtholato) gallium, and the like, but are not limited thereto.

The electron blocking layer is a layer which can improve the service life and efficiency of a device by preventing electrons injected from an electron injection layer from passing through a light emitting layer and entering a hole injection layer. As the electron blocking layer, the publicly-known material can be used without limitation, and the electron blocking layer can be formed between a light emitting layer and a hole injection layer, or between a light emitting layer and a layer which simultaneously injects and transports holes.

The hole blocking layer is a layer which blocks holes from passing through a light emitting layer and reaching a negative electrode, and can be generally formed under the same conditions as those of the electron injection layer. Specific examples thereof include oxadiazole derivatives or triazole derivatives, phenanthroline derivatives, aluminum complexes, pyridine, pyrimidine or triazine derivatives, and the like, but are not limited thereto.

The organic light emitting device according to the present specification can be a top emission type, a bottom emission type, or a dual emission type according to the materials to be used.

In an exemplary embodiment of the present specification, the compound of Chemical Formula 1 can be included in an organic solar cell or an organic transistor in addition to the organic light emitting device.

The compound according to the present specification can be operated by a principle which is similar to the principle applied to an organic light emitting device, even in an organic light emitting device including an organic phosphorescent device, an organic solar cell, an organic photoconductor, an organic transistor, and the like. For example, the organic solar cell can have a structure including a negative electrode, a positive electrode, and a photoactive layer provided between the negative electrode and the positive electrode, and the photoactive layer can include the compound.

The organic light emitting device of the present specification can be manufactured using typical manufacturing methods and materials of an organic light emitting device, except that the above-described compound is used to form an organic material layer having one or more layers.

EXAMPLES

Hereinafter, the present specification will be described in detail with reference to Examples, Comparative Examples, and the like for specifically describing the present specification. However, the Examples and the Comparative Examples according to the present specification can be modified in various forms, and it is not interpreted that the scope of the present specification is limited to the Examples and the Comparative Examples described below in detail. The Examples and the Comparative Examples of the present specification are provided to more completely explain the present specification to a person with ordinary skill in the art.

Synthesis Example 1. Synthesis of Compound 1

<1-a> Preparation of Compound 1-a

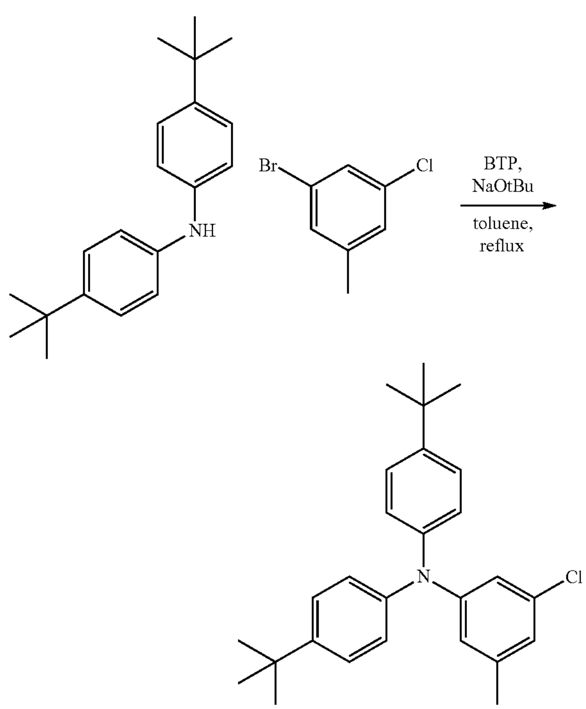

1-a

After 1-bromo-3-chloro-5-methylbenzene (1 eq.) and bis (4-tert-butylphenyl)amine (1 eq.) were dissolved in toluene (0.3 M) in a three-neck flask and sodium tert-butoxide (1.2 eq.) and bis(tri-tert-butylphosphine)-palladium(0) (0.01 eq.) were added thereto, the resulting mixture was stirred under reflux conditions in an argon atmosphere for 2 hours. When the reaction was completed, the flask was cooled to room temperature, $H_2O$ was added thereto, and the reaction solution was transferred to a separatory funnel for extraction. The extract was dried over $MgSO_4$ and concentrated, and the sample was purified with silica gel column chromatography to obtain Compound 1-a. (Yield 86%, MS[M+H]$^+$=407)

<1-b> Preparation of Compound 1-b

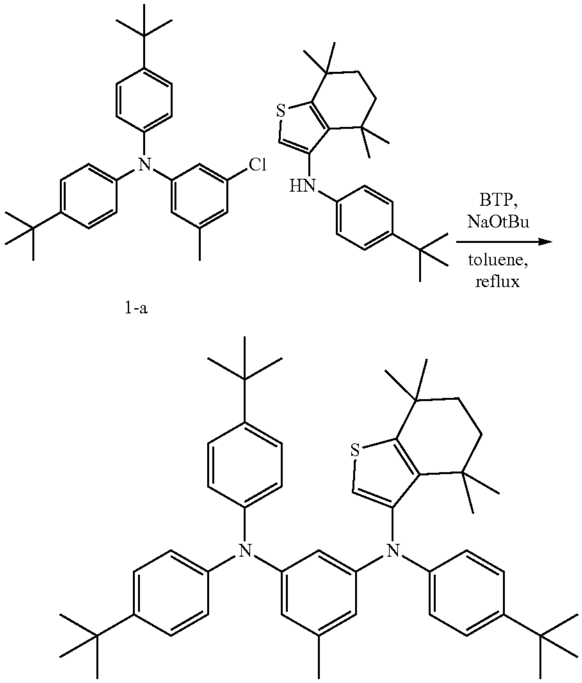

1-a 1-b

Compound 1-b was obtained by performing the preparation in the same manner as in Synthesis Example <1-a>, except that Compound 1-a and N-(4-tert-butyl-phenyl)-4,4,7,7-tetramethyl-4,5,6,7-tetrahydrobenzo[b]-thiophen-3-amine were used instead of 1-bromo-3-chloro-5-methylbenzene and bis(4-tert-butylphenyl)amine. (Yield 68%, MS[M+H]$^+$=712)

<1-c> Preparation of Compound 1-c

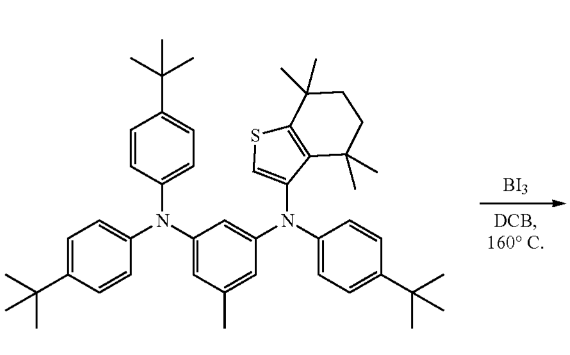

1-b

-continued

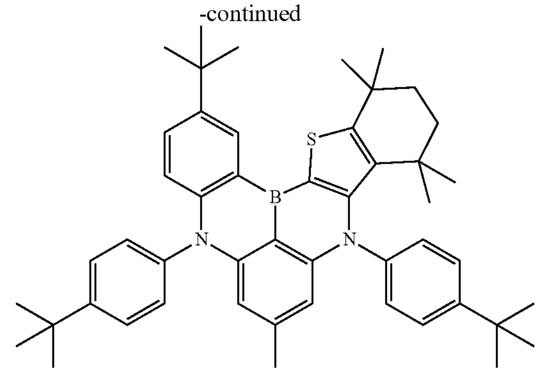

1-c

After Compound 1-b was dissolved in 1,2-dichlorobenzene (0.1 M) in a three-neck flask and boron triiodide (2 eq.) was added thereto, the resulting mixture was stirred in an argon atmosphere at 160° C. for 5 hours. The reaction product was cooled to 0° C., N,N-diisopropylethylamine (20 eq.) was added thereto, and then the resulting mixture was stirred for 1 hour. Extraction was performed in a separatory funnel using toluene and $H_2O$. The extract was dried over $MgSO_4$ and concentrated, and the sample was purified with silica gel column chromatography to obtain Compound 1-c. (Yield 22%, MS[M+H]$^+$=719)

<1-d> Preparation of Compound 1

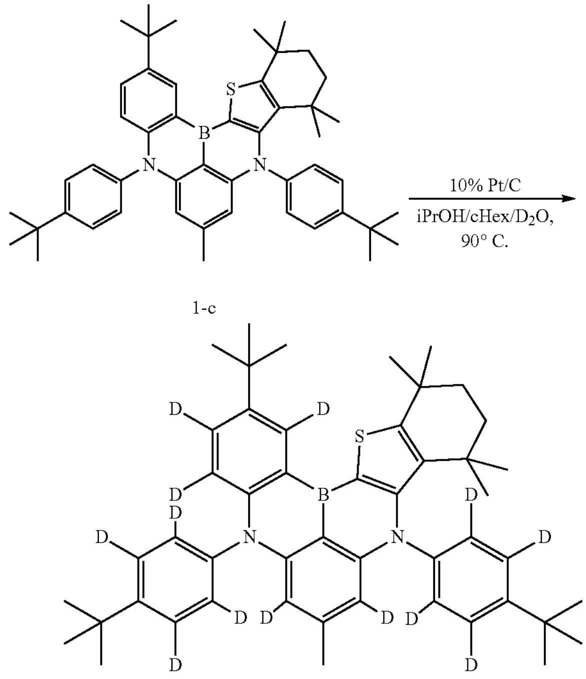

1-c

1

Compound 1-c (1 eq.), 10% Pt/C (0.05 eq.), isopropanol (2.5 M), cyclohexane (0.3 M), and $D_2O$ (0.15 M) were put into a two-neck flask, and the resulting mixture was stirred under reflux conditions in an argon atmosphere for 24 hours. When the reaction was completed, the flask was cooled to room temperature, and then the reaction product was filtered with celite. The filtrate was transferred to a separatory funnel, extraction was performed using toluene, the extract was dried over $MgSO_4$ and concentrated, and then the sample was subjected to sublimation purification with silica gel chromatography to obtain Compound 1. (Yield 69%, MS[M+H]$^+$=732)

Synthesis Example 2. Synthesis of Compound 2

<2-a> Preparation of Compound 2-a

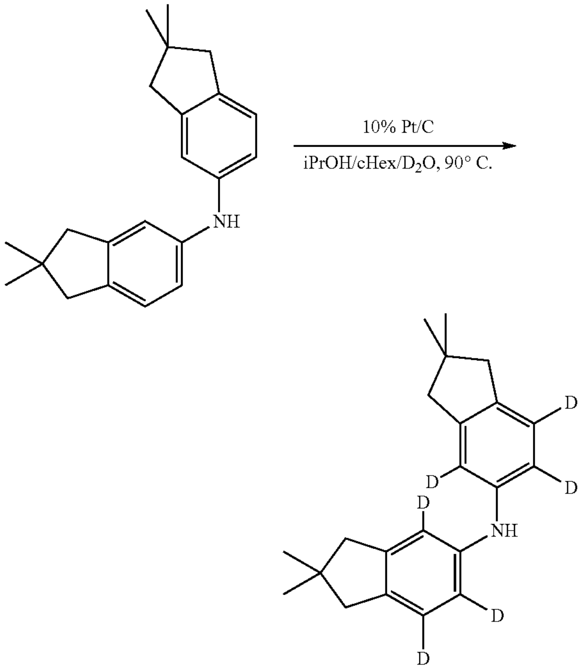

2-a

Bis(2,2-dimethyl-2,3-dihydro-1H-inden-5-yl)amine (1 eq.), 10% Pt/C (0.05 eq.), isopropanol (2.5 M), cyclohexane (0.3 M), and $D_2O$ (0.15 M) were put into a two-neck flask, and the resulting mixture was stirred under reflux conditions in an argon atmosphere for 24 hours. When the reaction was completed, the flask was cooled to room temperature, and then the reaction product was filtered with celite. The filtrate was transferred to a separatory funnel, extraction was performed using toluene, the extract was dried over $MgSO_4$ and concentrated, and then the sample was purified with silica gel chromatography to obtain Compound 2-a. (Yield 82%, MS[M+H]$^+$=306)

<2-b> Preparation of Compound 2-b

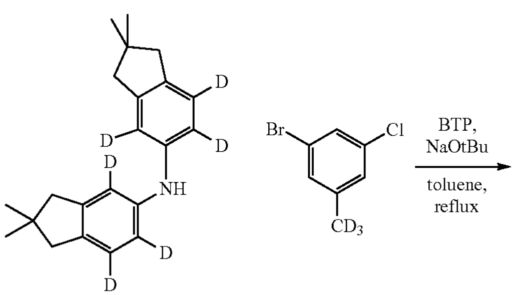

2-a

-continued

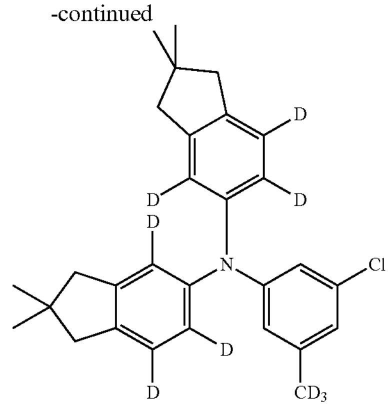

2-b

Compound 2-b was obtained by performing the preparation in the same manner as in Synthesis Example <1-a>, except that Compound 2-a and 1-bromo-3-chloro-5-(methyl-$d_3$)benzene were used instead of 1-bromo-3-chloro-5-methylbenzene and bis(4-tert-butylphenyl)-amine. (Yield 79%, MS[M+H]$^+$=440)

<2-c> Preparation of Compound 2-c

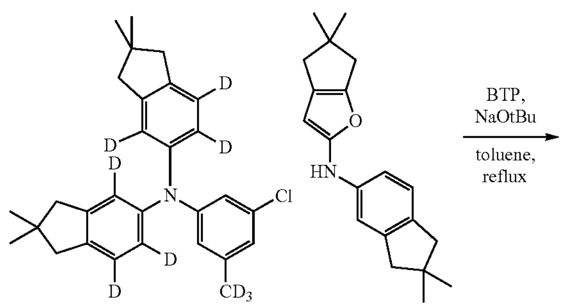

2-b

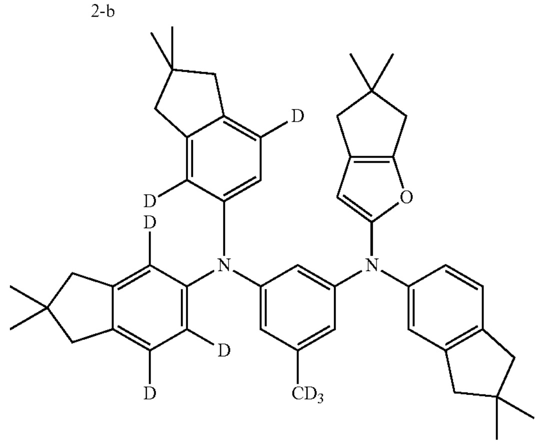

2-c

Compound 2-c was obtained by performing the preparation in the same manner as in Synthesis Example <1-a>, except that Compound 2-b and N-(2,2-dimethyl-2,3-dihydro-1H-inden-5-yl)-5,5-dimethyl-5,6-dihydro-4-H-cyclopenta[b]furan-2-amine were used instead of 1-bromo-3-chloro-5-methylbenzene and bis(4-tert-butylphenyl)amine. (Yield 81%, MS[M+H]$^+$=698)

<2-d> Preparation of Compound 2

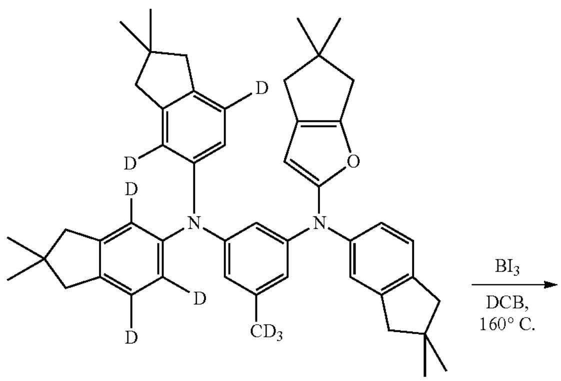

2-c

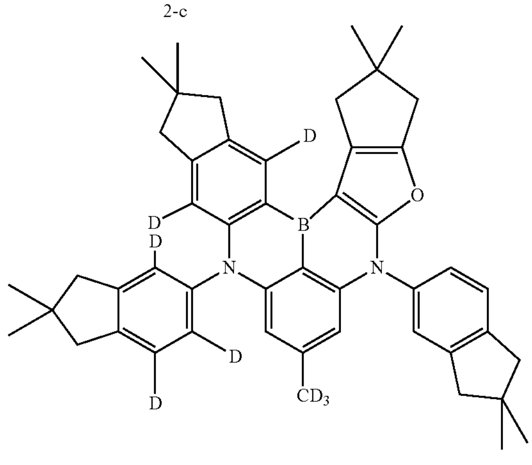

2

After Compound 2-c was dissolved in 1,2-dichlorobenzene (0.1 M) in a three-neck flask and boron triiodide (2 eq.) was added thereto, the resulting mixture was stirred in an argon atmosphere at 160° C. for 5 hours. The reaction product was cooled to 0° C., N,N-diisopropylethylamine (20 eq.) was added thereto, and then the resulting mixture was stirred for 1 hour. Extraction was performed in a separatory funnel using toluene and $H_2O$. The extract was dried over $MgSO_4$ and concentrated, and the sample was subjected to sublimation purification with silica gel column chromatography to obtain Compound 2. (Yield 16%, MS[M+H]$^+$=705)

Synthesis Example 3. Synthesis of Compound 3

<3-a> Preparation of Compound 3-a

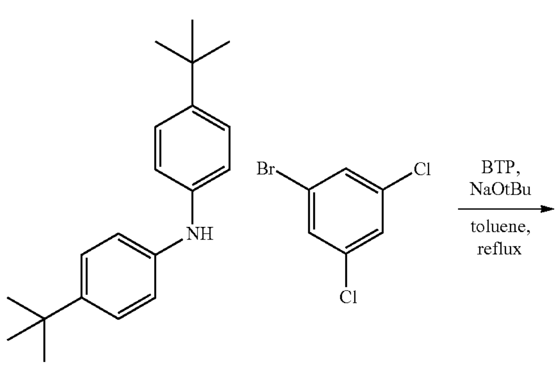

-continued

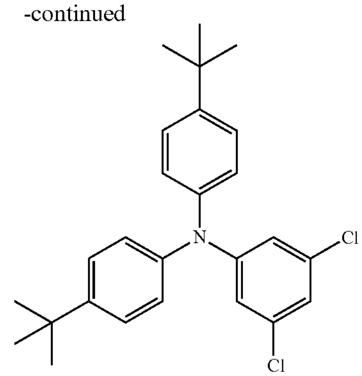

3-a

Compound 3-a was obtained by performing the preparation in the same manner as in Synthesis Example <1-a>, except that 1-bromo-3,5-dichlorobenzene was used instead of 1-bromo-3-chloro-5-methylbenzene. (Yield 92%, MS[M+H]$^+$=427)

<3-b> Preparation of Compound 3-b

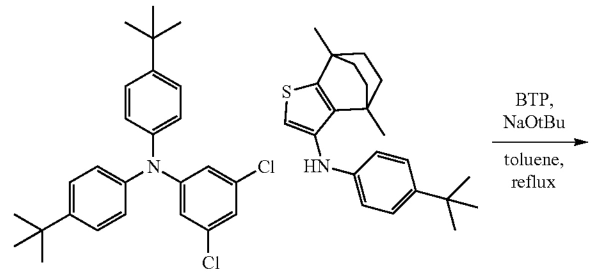

3-a

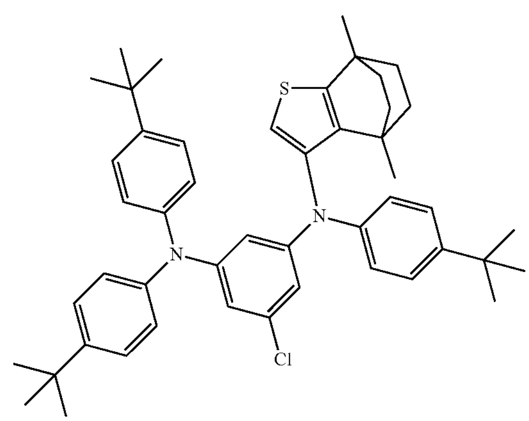

3-b

Compound 3-b was obtained by performing the preparation in the same manner as in Synthesis Example <1-a>, except that Compound 3-a and N-(4-tert-butyl-phenyl)-4,7-dimethyl-4,5,6,7-tetrahydro-4,7-ethano-benzo[b]thiophen-3-amine were used instead of 1-bromo-3-chloro-5-methylbenzene and bis(4-tert-butylphenyl)-amine. (Yield 74%, MS[M+H]$^+$=730)

<3-c> Preparation of Compound 3-c

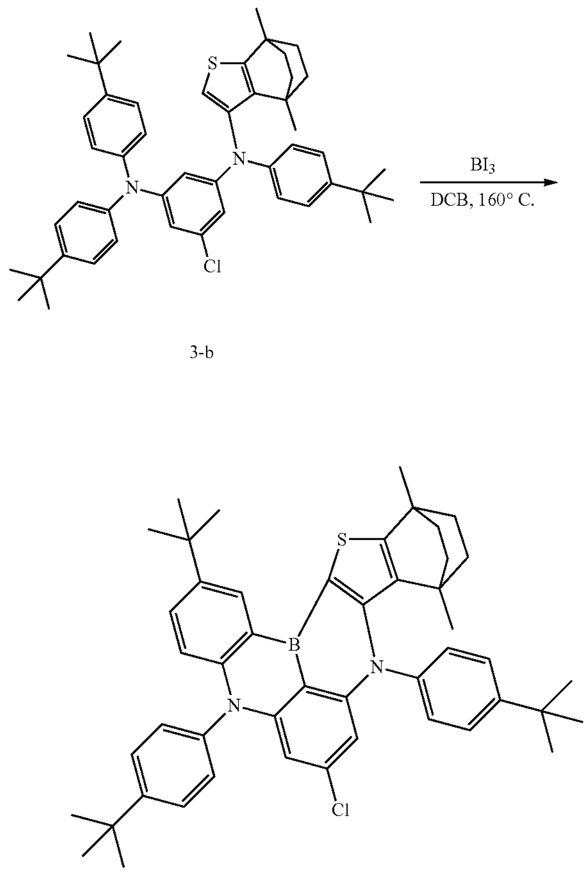

3-b 3-c

Compound 3-c was obtained by performing the preparation in the same manner as in Synthesis Example <1-c>, except that Compound 3-b was used instead of Compound 1-b. (Yield 31%, MS[M+H]$^+$=738)

<3-d> Preparation of Compound 3-d

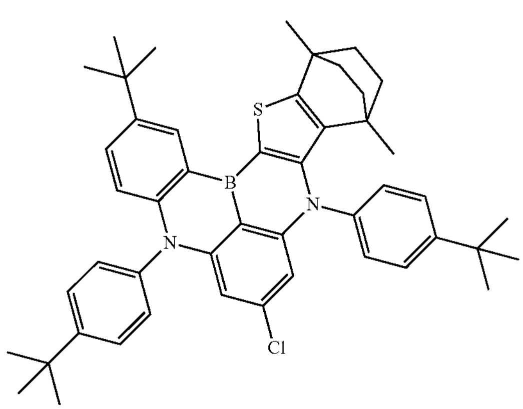

3-c

-continued

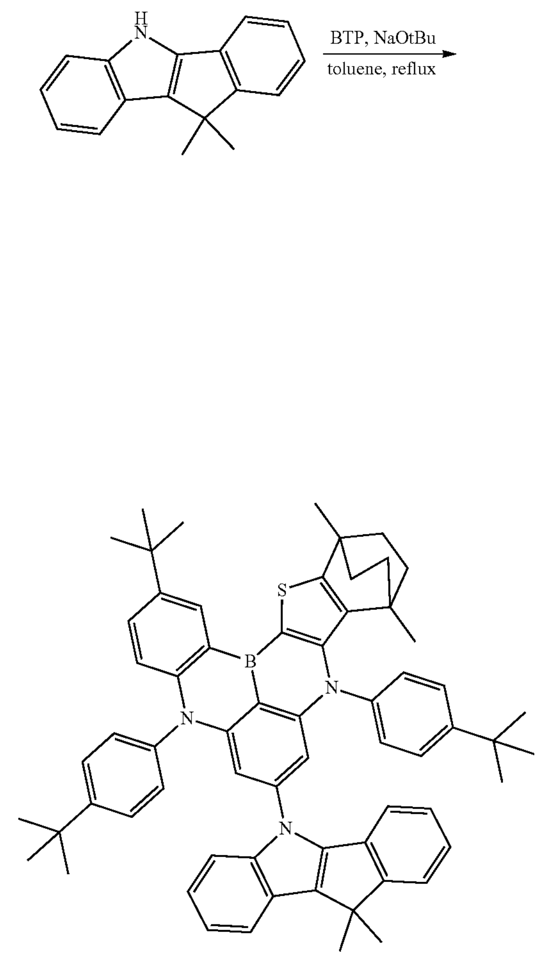

3-d

Compound 3-d was obtained by performing the preparation in the same manner as in Synthesis Example <1-a>, except that Compound 3-c and 10,10-dimethyl-5,10-dihydroindeno[1,2-b]indole were used instead of 1-bromo-3-chloro-5-methylbenzene and bis(4-tert-butyl-phenyl)amine. (Yield 83%, MS[M+H]$^+$=935)

<3-e> Preparation of Compound 3
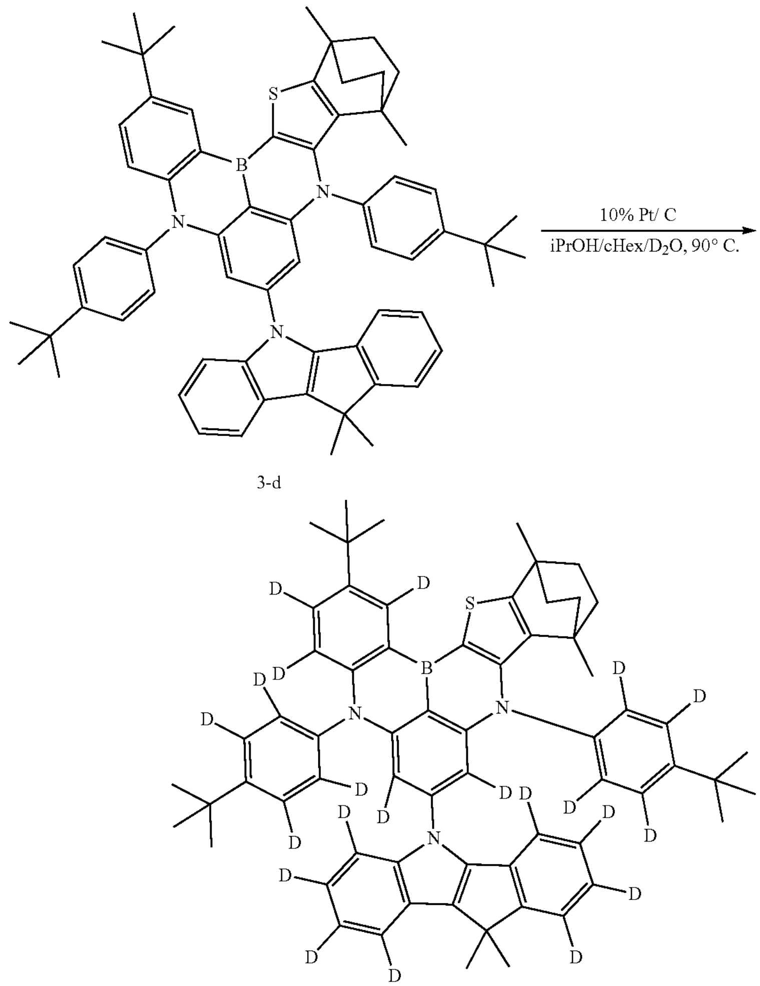
3-d
3
Compound 3 was obtained by performing the preparation in the same manner as in Synthesis Example <1-d>, except that Compound 3-d was used instead of Compound 1-c. (Yield 59%, MS[M+H]$^+$=956)
Synthesis Example 4. Synthesis of Compound 4
<4-a> Preparation of Compound 4-a
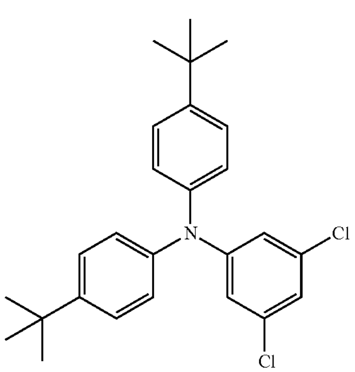
3-a
-continued
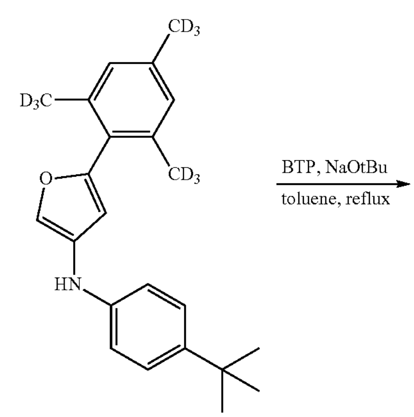

-continued

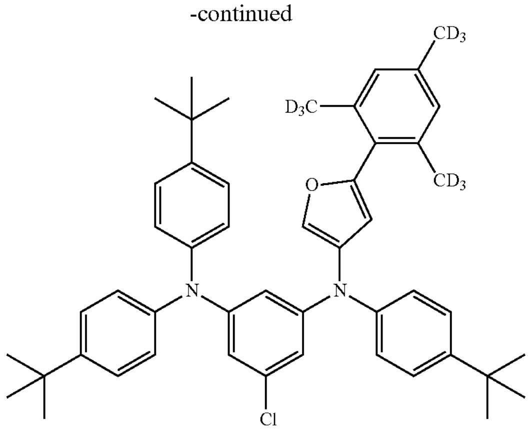

4-a

Compound 4-a was obtained by performing the preparation in the same manner as in Synthesis Example <1-a>, except that Compound 3-a and N-(4-tert-butyl-phenyl)-5-(2,4,6-tris(methyl-$d_3$)phenyl)furan-3-amine were used instead of 1-bromo-3-chloro-5-methylbenzene and bis(4-tert-butylphenyl)amine. (Yield 55%, MS[M+H]$^+$=733)

<4-b> Preparation of Compound 4-b

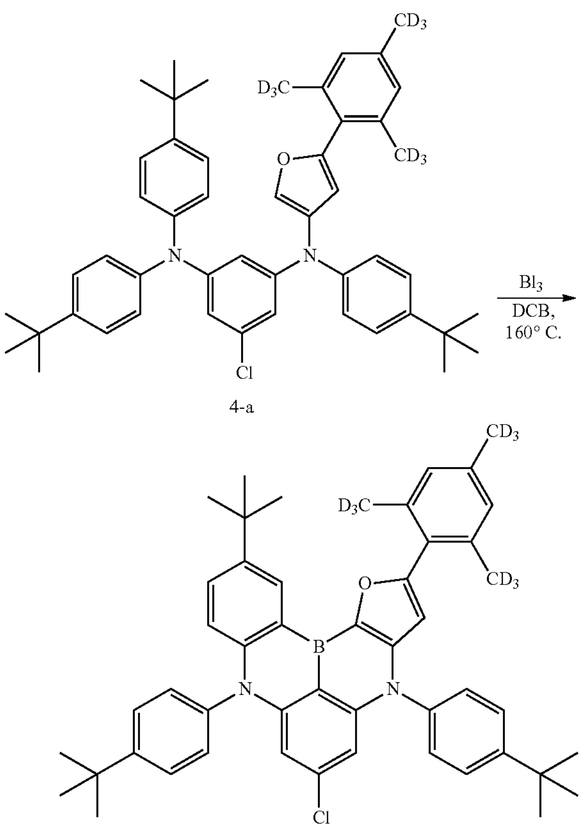

4-b

Compound 4-b was obtained by performing the preparation in the same manner as in Synthesis Example <1-c>, except that Compound 4-a was used instead of Compound 1-b. (Yield 25%, MS[M+H]$^+$=741)

<4-c> Preparation of Compound 4

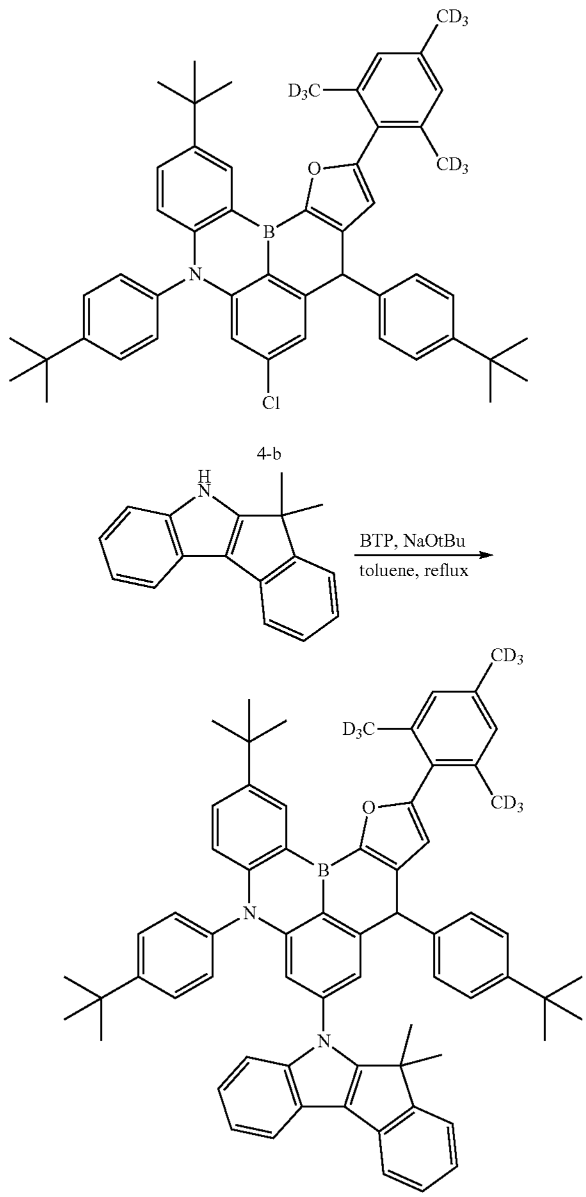

4

After Compound 4-b (1 eq.) and 6,6-dimethyl-5,6-dihydroindeno[2,1-b]indole (1 eq.) were dissolved in toluene (0.3 M) in a three-neck flask and sodium tert-butoxide (1.2 eq.) and bis(tri-tert-butylphosphine)-palladium(0) (0.01 eq.) were added thereto, the resulting mixture was stirred under reflux conditions in an argon atmosphere for 6 hours. When the reaction was completed, the flask was cooled to room temperature, $H_2O$ was added thereto, and the reaction solution was transferred to a separatory funnel for extraction. The extract was dried over $MgSO_4$ and concentrated, and the sample was subjected to sublimation purification with silica gel column chromatography to obtain Compound 4. (Yield 66%, MS[M+H]$^+$=938)

Synthesis Example 5. Synthesis of Compound 5

<5-a> Preparation of Compound 5-a

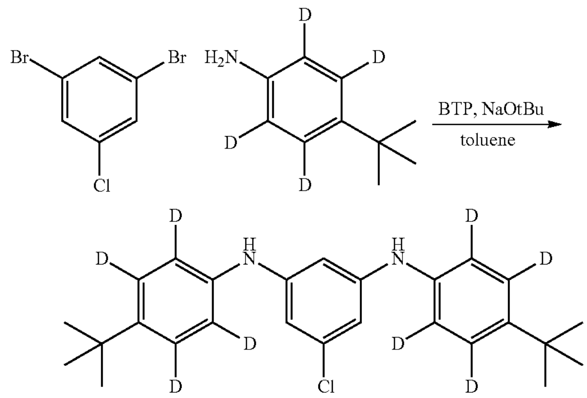

5-a

After 1,3-dibromo-5-chlorobenzene (1 eq.) and 4-tert-butylbenzene-2,3,5,6-$d_{-4}$-amine (2 eq.) were dissolved in toluene (0.2 M) in a three-neck flask and sodium tert-butoxide (2.5 eq.) and bis(tri-tert-butylphosphine)palladium (0) (0.015 eq.) were added thereto, the resulting mixture was stirred under reflux conditions in an argon atmosphere for 3 hours. When the reaction was completed, the flask was cooled to room temperature, $H_2O$ was added thereto, and the reaction solution was transferred to a separatory funnel for extraction. The extract was dried over $MgSO_4$ and concentrated, and the sample was purified with silica gel column chromatography to obtain Compound 5-a. (Yield 93%, $MS[M+H]^+=416$)

<5-b> Preparation of Compound 5-b

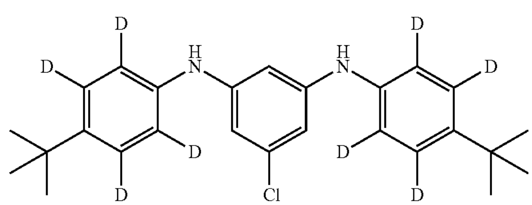

5-a

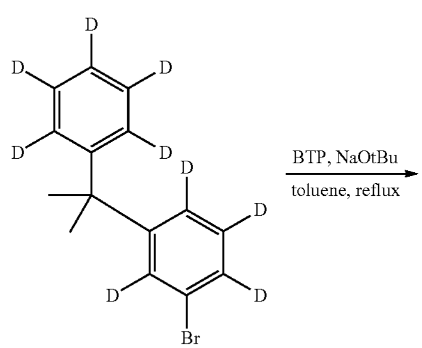

-continued

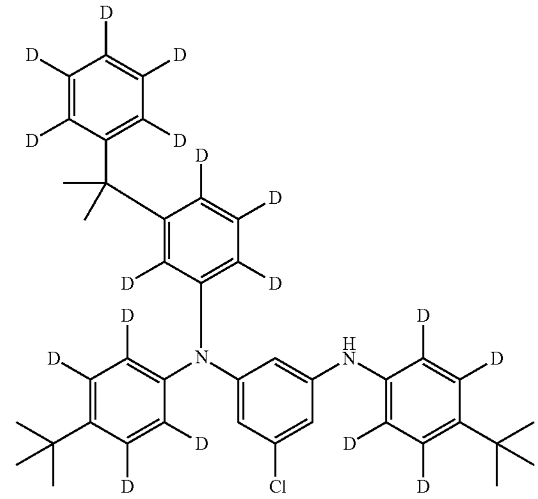

5-b

Compound 5-b was obtained by performing the preparation in the same manner as in Synthesis Example <1-a>, except that Compound 5-a and 1-(2-(3-bromo-phenyl-2,4,5,6-$d_4$) propan-2-yl)benzene-2,3,4,5,6-$d_5$ were used instead of 1-bromo-3-chloro-5-methylbenzene and bis(4-tert-butylphenyl)amine. (Yield 65%, $MS[M+H]^+=619$)

<5-c> Preparation of Compound 5-c

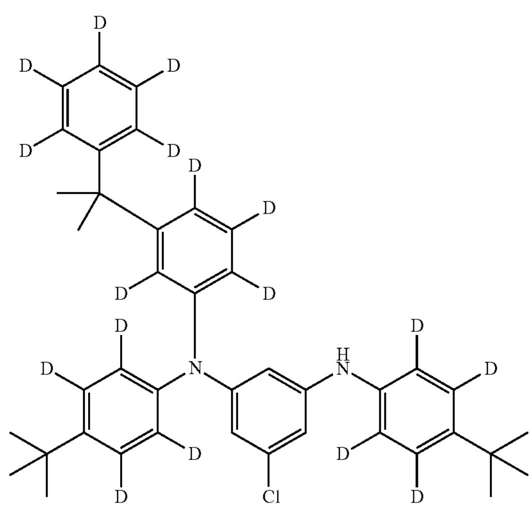

5-b

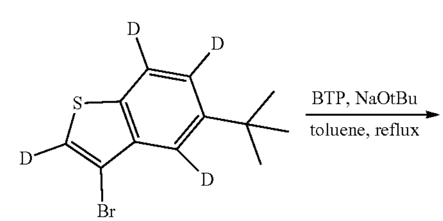

-continued

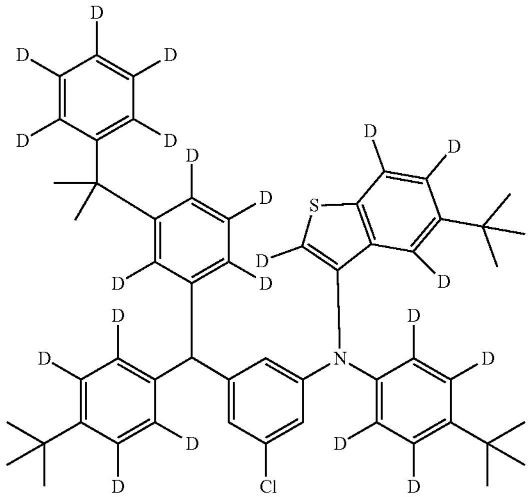

5-c

Compound 5-c was obtained by performing the preparation in the same manner as in Synthesis Example <1-a>, except that Compound 5-b and 3-bromo 5-tert-butylbenzo [b]thiophen-2,4,6,7-$d_4$ were used instead of 1-bromo-3-chloro-5-methylbenzene and bis(4-tert-butylphenyl)amine. (Yield 79%, MS$[M+H]^+$=811)

<5-d> Preparation of Compound 5-d

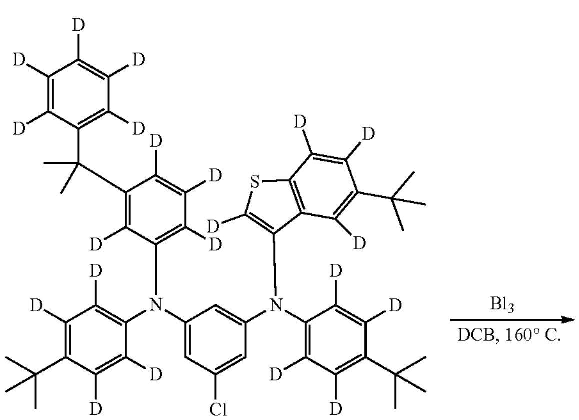

5-c

-continued

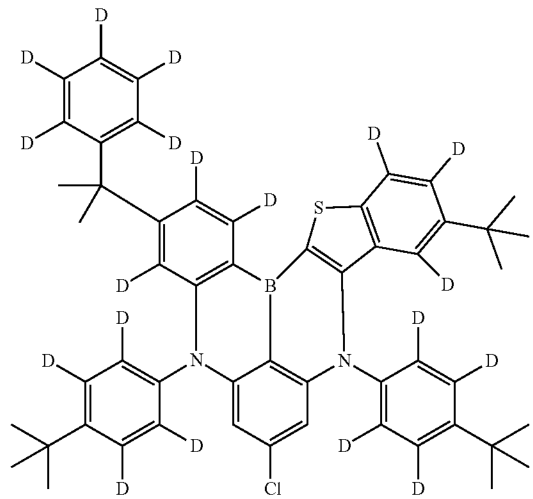

5-d

Compound 5-d was obtained by performing the preparation in the same manner as in Synthesis Example <1-c>, except that Compound 5-c was used instead of Compound 1-b. (Yield 24%, MS$[M+H]^+$=817)

<5-e> Preparation of Compound 5

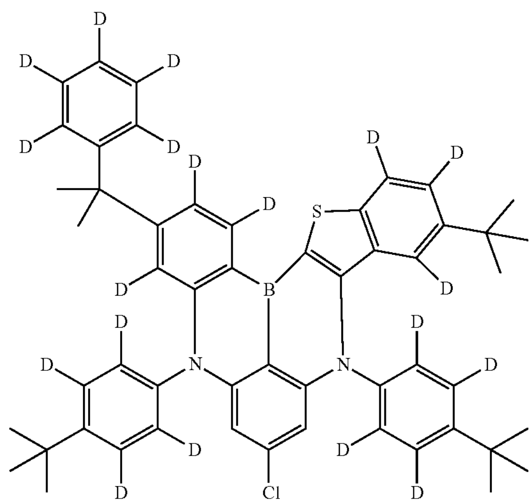

5-d

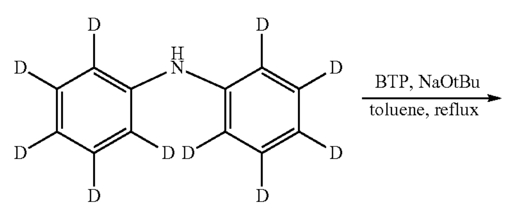

-continued

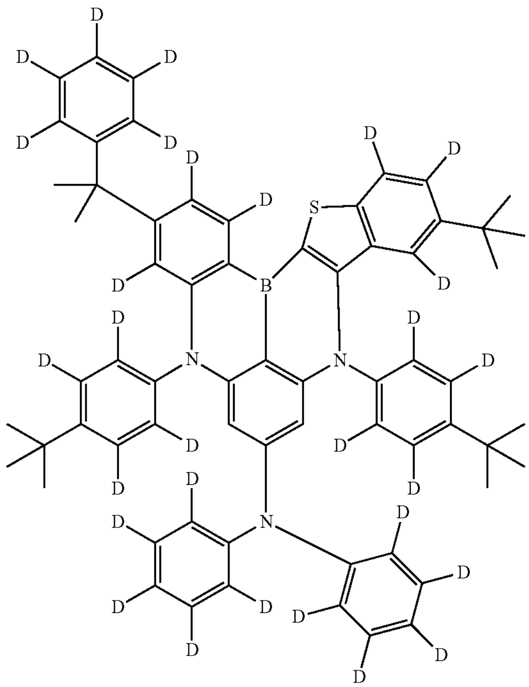

5-d

Compound 5 was obtained by performing the preparation in the same manner as in Synthesis Example <4-c>, except that Compound 5-d and bis(phenyl-$d_5$)amine were used instead of Compound 4-b and 6,6-dimethyl-5,6-dihydroindeno[2,1-b]indole. (Yield 49%, MS$[M+H]^+$=960)

Synthesis Example 6. Synthesis of Compound 6

<6-a> Preparation of Compound 6-b

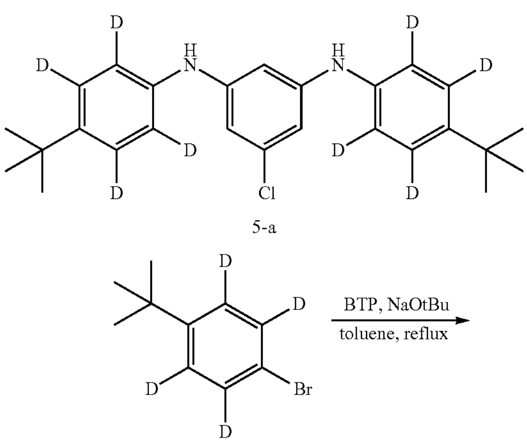

5-a

-continued

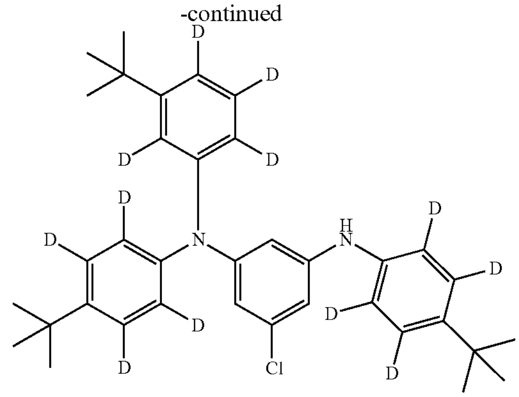

6-b

Compound 6-b was obtained from Compound 5-a and 1-bromo-4-tert-butylbenzene-2,4,5,6-$d_4$ in the same manner as in Synthesis Example <1-a>. (Yield 83%, MS$[M+H]^+$=552)

<6-b> Preparation of Compound 6-c

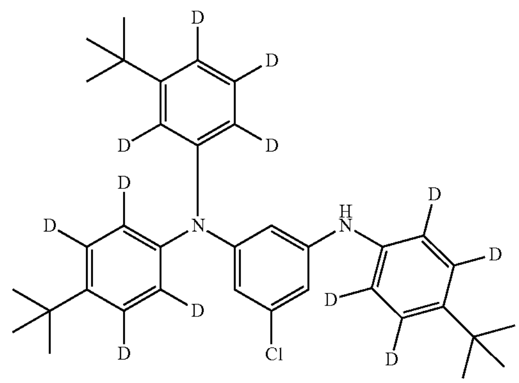

6-b

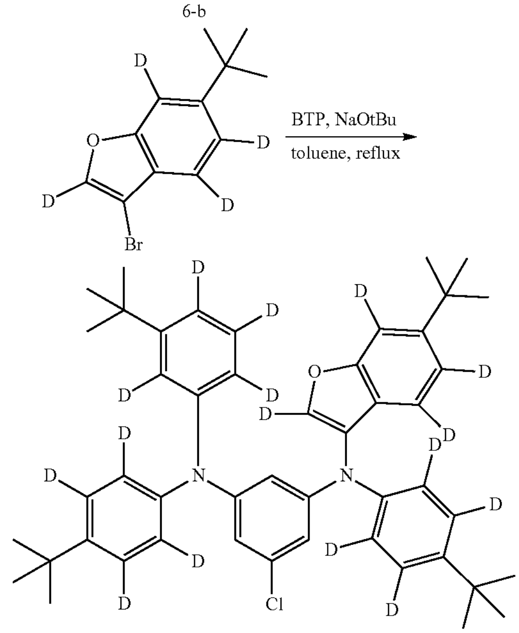

6-c

Compound 6-c was obtained by performing the preparation in the same manner as in Synthesis Example <1-a>, except that Compound 6-b and 3-bromo 5-tert-butylbenzo[b]thiophen-2,4,6,7-$d_4$ were used instead of 1-bromo-3-chloro-5-methylbenzene and bis(4-tert-butyl-phenyl)amine. (Yield 79%, MS$[M+H]^+$=811)

<6-c> Preparation of Compound 6-d

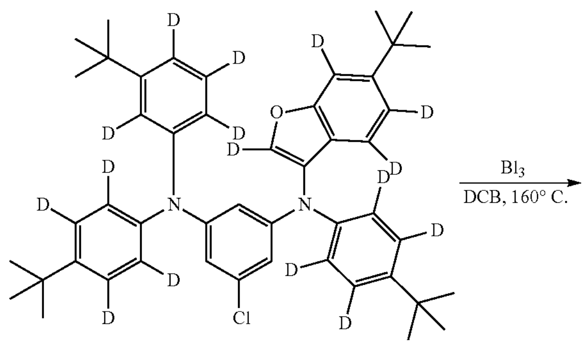

6-c

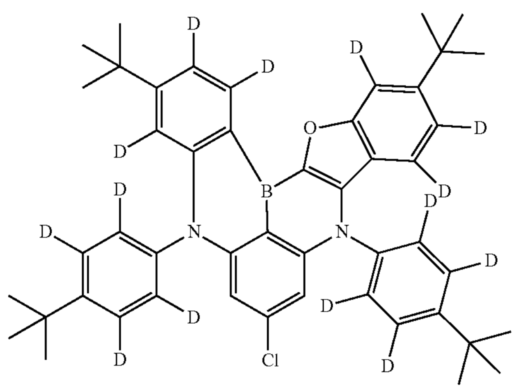

6-d

Compound 6-d was obtained from Compound 6-c instead of Compound 1-b in the same manner as in Synthesis Example <1-c>. (Yield 24%, MS$[M+H]^+$=817)

<6-d> Preparation of Compound 6

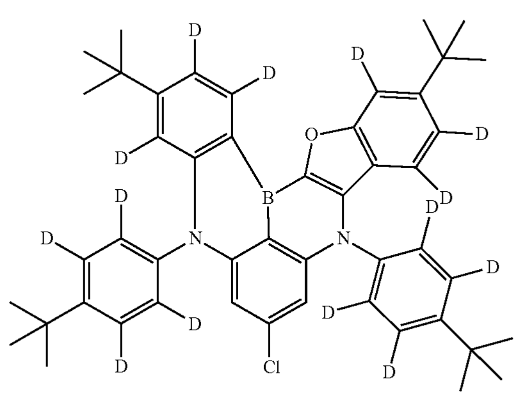

6-d

-continued

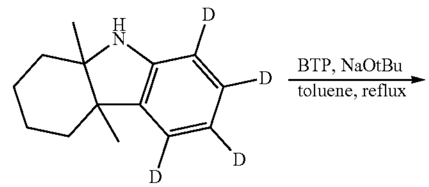

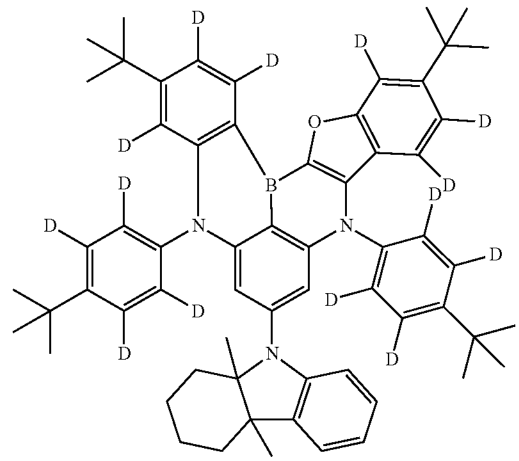

6

Compound 6 was obtained by performing the preparation in the same manner as in Synthesis Example <4-c>, except that Compound 6-d and 4a,9a-dimethyl-2,3,4,4a,9,9a-hexahydro-1H-carbazole-5,6,7,8-$d_4$ were used instead of Compound 4-b and 6,6-dimethyl-5,6-dihydroindeno[2,1-b]indole. (Yield 49%, MS$[M+H]^+$=902)

Synthesis Example 7. Synthesis of Compound 7

<7-a> Preparation of Compound 7-a

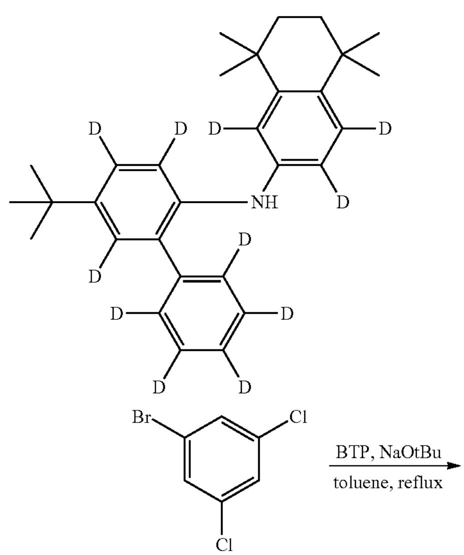

-continued

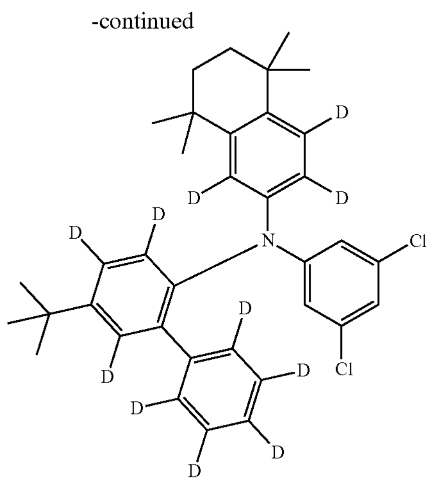

7-a

Compound 7-a was obtained by performing the preparation in the same manner as in Synthesis Example <1-a>, except that 1-bromo-3,5-dichlorobenzene and 1V-(5-tert-butyl-[1,1'-biphenyl]-2-yl-2',3,3',4,4',5',6,6'-$d_8$)-5,5,8,8-tetramethyl-5,6,7,8-tetrahydronaphthalen-1,3,4-$d_{3-2}$-amine were used instead of 1-bromo-3-chloro-5-methylbenzene and bis(4-tert-butylphenyl)amine. (Yield 88%, MS[M+H]$^+$=568)

<7-b> Preparation of Compound 7-b

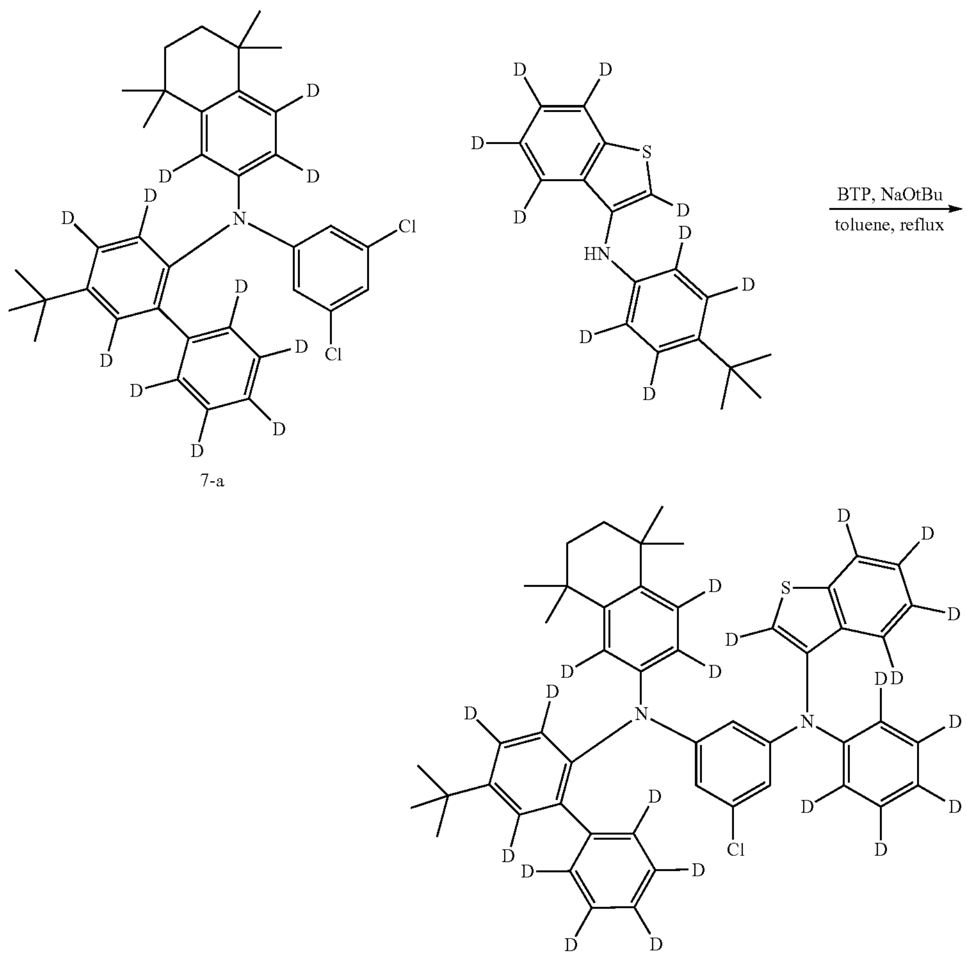

7-a 7-b

Compound 7-b was obtained by performing the preparation in the same manner as in Synthesis Example <1-a>, except that Compound 7-a and N-(4-tert-butyl-phenyl-2,3,5,6-$d_4$)benzo[b]thiophen-$d_5$-3-amine were used instead of 1-bromo-3-chloro-5-methylbenzene and bis(4-tert-butylphenyl)amine. (Yield 51%, MS[M+H]$^+$=822)

<7-c> Preparation of Compound 7-c

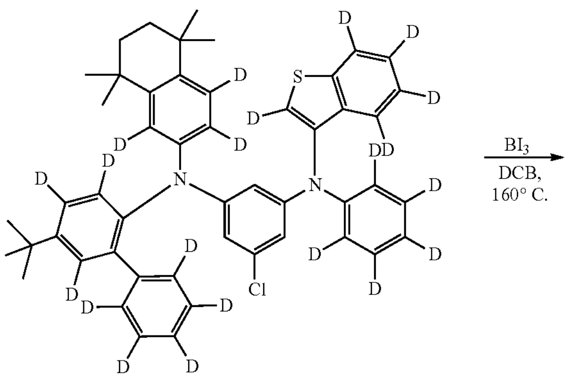

7-b

-continued

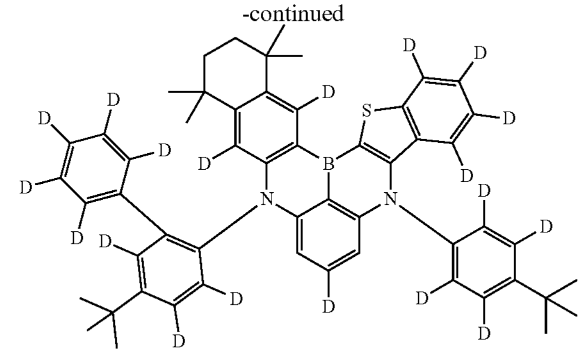

7-c

Compound 7-c was obtained by performing the preparation in the same manner as in Synthesis Example <1-c>, except that Compound 7-b was used instead of Compound 1-b. (Yield 29%, MS[M+H]$^+$=828)

<7-d> Preparation of Compound 7

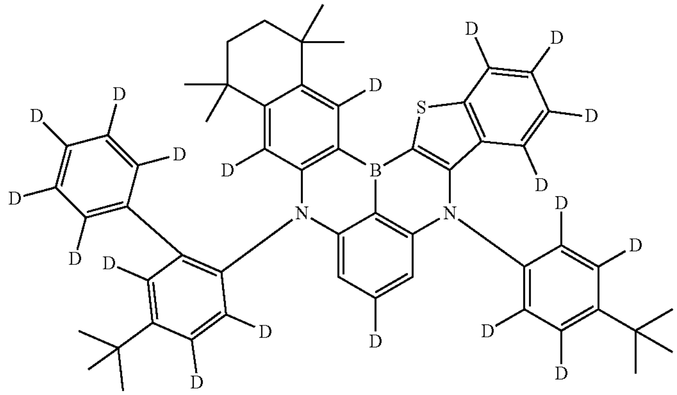

7-c

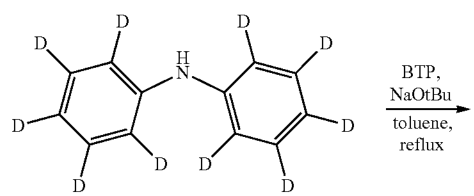

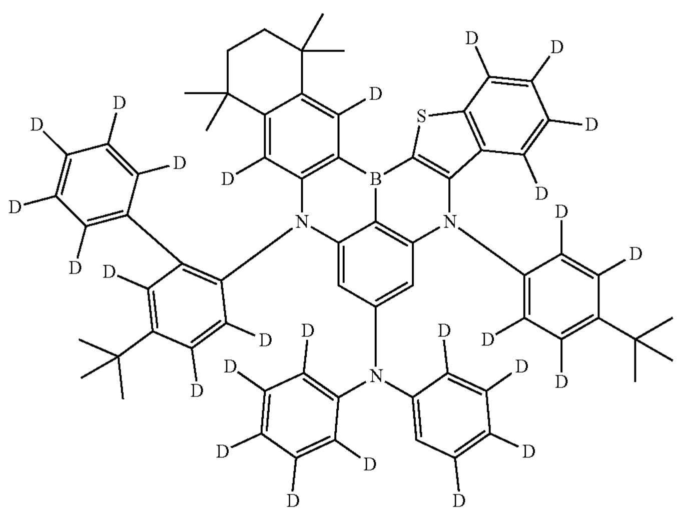

7

Compound 7 was obtained by performing the preparation in the same manner as in Synthesis Example <4-c>, except that Compound 7-c and bis(phenyl-$d_5$)amine were used instead of Compound 4-b and 6,6-dimethyl-5,6-dihydroindeno[2,1-b]indole. (Yield 49%, MS[M+H]$^+$=971)

Synthesis Example 8. Synthesis of Compound 8

<8-a> Preparation of Compound 8-a

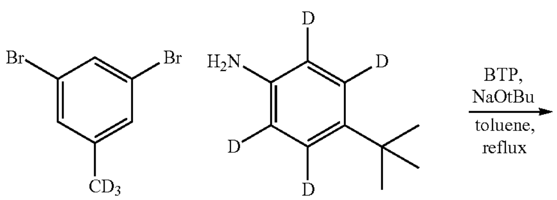

-continued

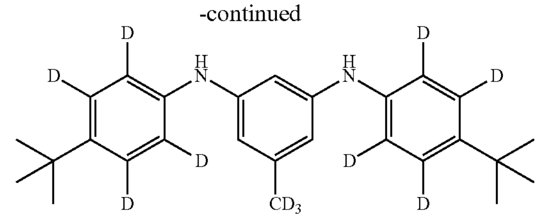

8-a

Compound 8-a was obtained by performing the preparation in the same manner as in Synthesis Example <5-a>, except that 1,3-dibromo-5-(methyl-$d_3$)benzene was used instead of 1,3-dibromo-5-chlorobenzene. (Yield 95%, MS[M+H]$^+$=398)

<8-b> Preparation of Compound 8-b

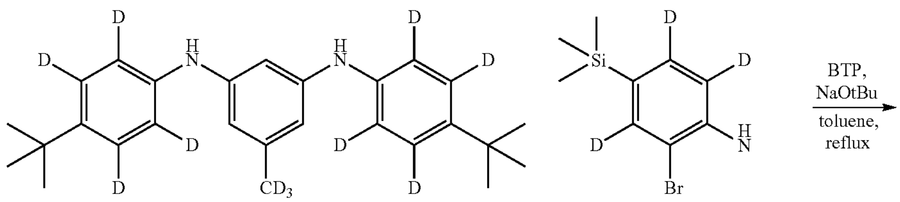

8-a

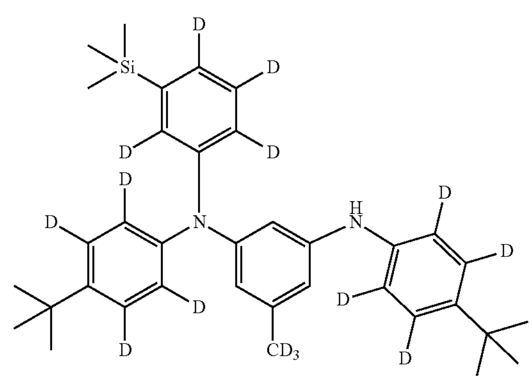

8-b

Compound 8-b was obtained by performing the preparation in the same manner as in Synthesis Example <1-a>, except that Compound 8-a and (3-bromophenyl-2,4,5,6-$d_4$)trimethylsilane were used instead of 1-bromo-3-chloro-5-methylbenzene and bis(4-tert-butylphenyl)-amine. (Yield 82%, MS[M+H]$^+$=550)

<8-c> Preparation of Compound 8-c

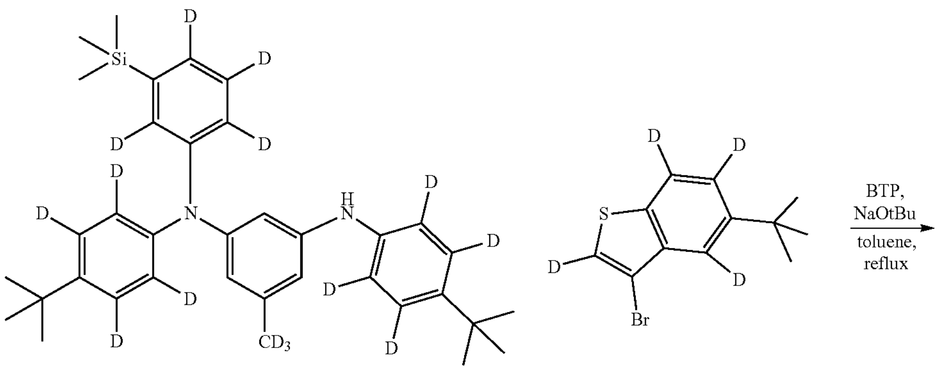

8-b

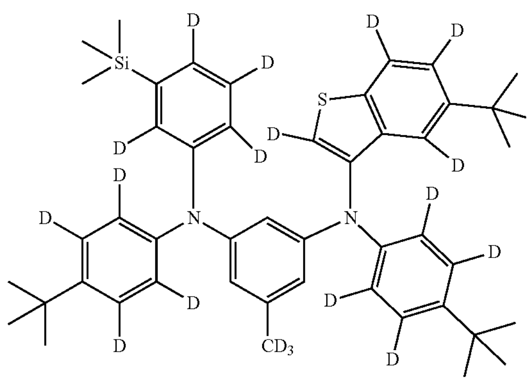

8-c

Compound 8-c was obtained by performing the preparation in the same manner as in Synthesis Example <1-a>, except that Compound 8-b and 3-bromo-5-tert-butylbenzo[b]thiophen-2,4,6,7-$d_4$ were used instead of 1-bromo-3-chloro-5-methylbenzene and bis(4-tert-butyl-phenyl)amine. (Yield 81%, MS$[M+H]^+$=742)

<8-d> Preparation of Compound 8

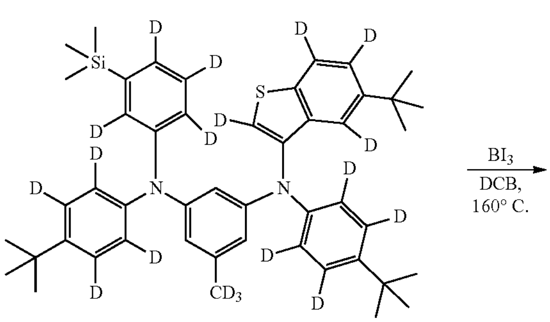

8-c

-continued

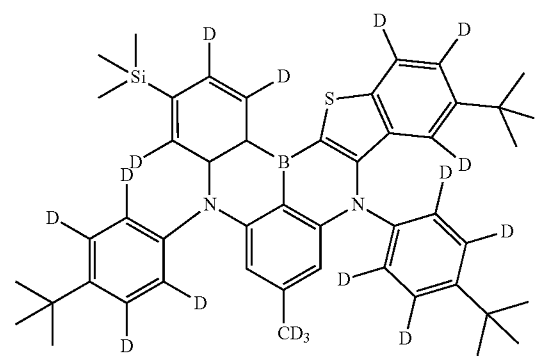

8

Compound 8 was obtained by performing the preparation in the same manner as in Synthesis Example <2-d>, except that Compound 8-c was used instead of Compound 2-c. (Yield 15%, MS$[M+H]^+$=748)

Synthesis Example 9. Synthesis of Compound 9

<9-a> Preparation of Compound 9-a

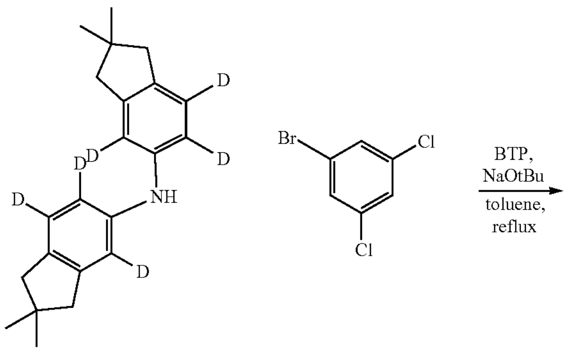

-continued

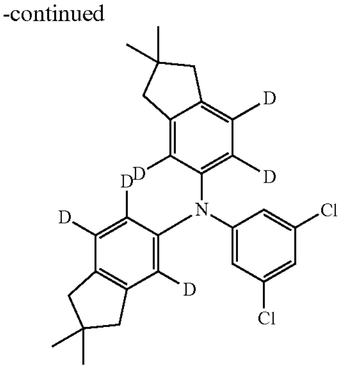

9-a

Compound 9-a was obtained by performing the preparation in the same manner as in Synthesis Example <1-a>, except that 1-bromo-3,5-dichlorobenzene and bis(2,2-dimethyl-2,3-dihydro-1H-inden-5-yl-4,6,7-$d_3$)amine were used instead of 1-bromo-3-chloro-5-methylbenzene and bis(4-tert-butylphenyl)amine. (Yield 88%, MS$[M+H]^+$=456)

<9-b> Preparation of Compound 9-b

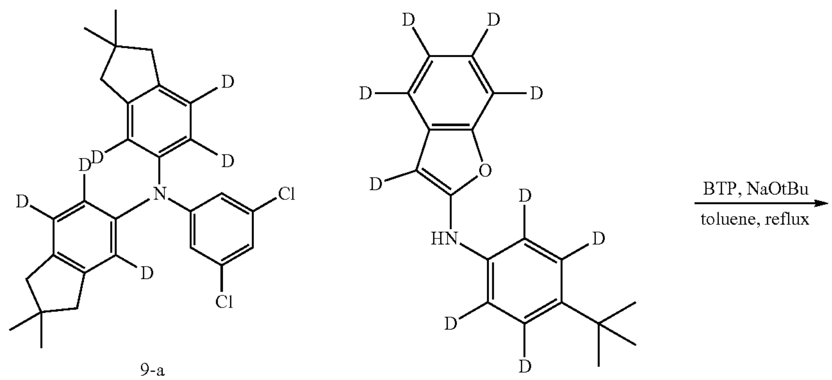

9-a

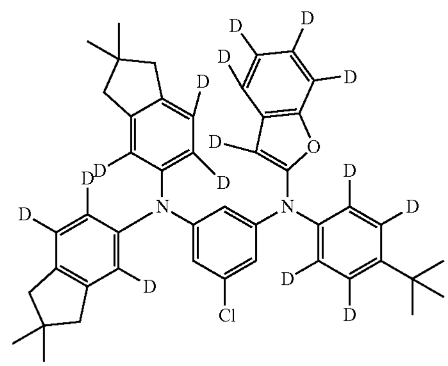

9-b

Compound 9-b was obtained by performing the preparation in the same manner as in Synthesis Example <1-a>, except that Compound 9-a and N-(4-tert-butyl-phenyl-2,3,5,6-$d_4$)benzofuran-$d_5$-2-amine were used instead of 1-bromo-3-chloro-5-methylbenzene and bis(4-tert-butylphenyl)amine. (Yield 62%, MS[M+H]$^+$=694)

<9-c> Preparation of Compound 9-c

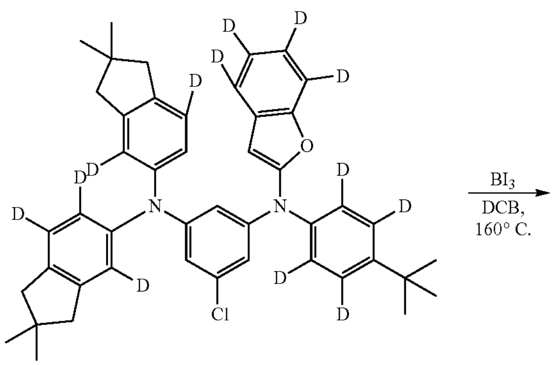

9-b

-continued

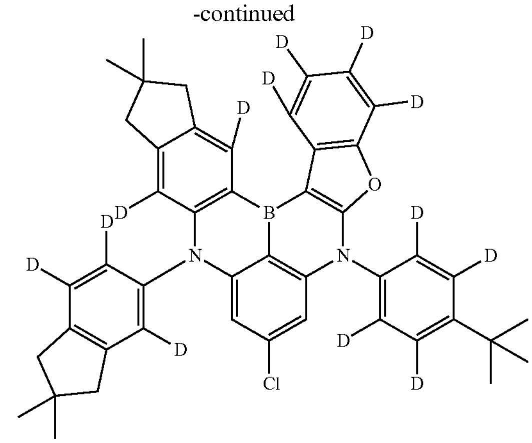

9-c

Compound 9-c was obtained by performing the preparation in the same manner as in Synthesis Example <1-c>, except that Compound 9-b was used instead of Compound 1-b. (Yield 25%, MS[M+H]$^+$=700)

<9-d> Preparation of Compound 9

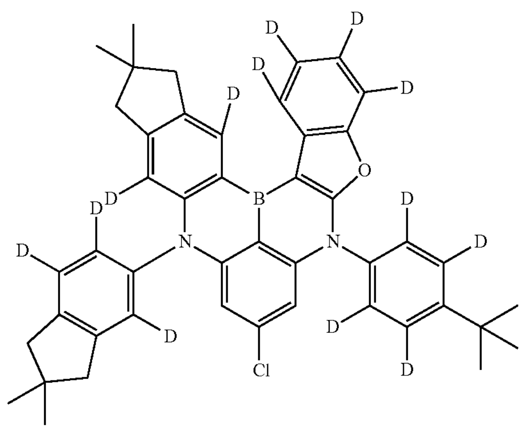

9-c

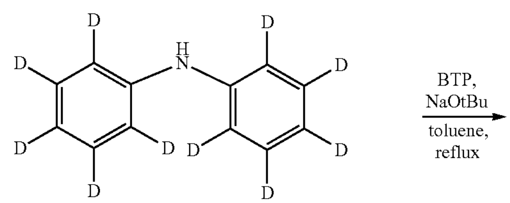

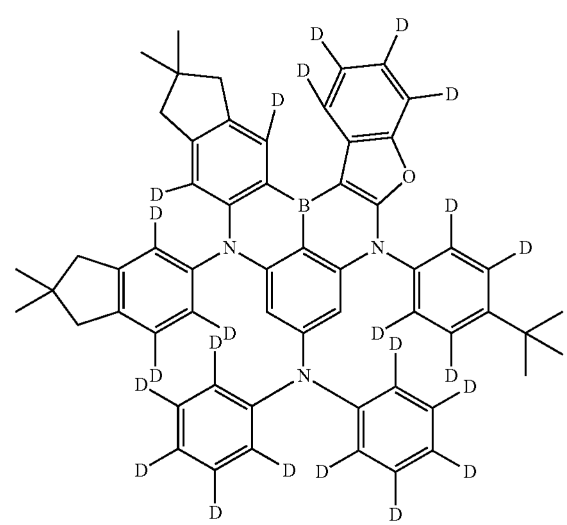

9

Compound 9 was obtained by performing the preparation in the same manner as in Synthesis Example <4-c>, except that Compound 9-c and bis(phenyl-$d_5$)amine were used instead of Compound 4-b and 6,6-dimethyl-5,6-dihydroindeno[2,1-b]indole. (Yield 65%, MS$[M+H]^+$=843)

Synthesis Example 10. Synthesis of Compound 10

<10-a> Preparation of Compound 10-a

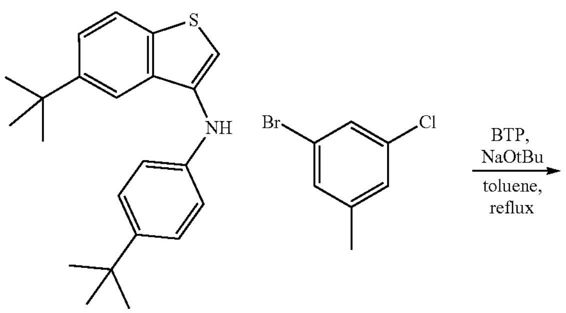

10-a

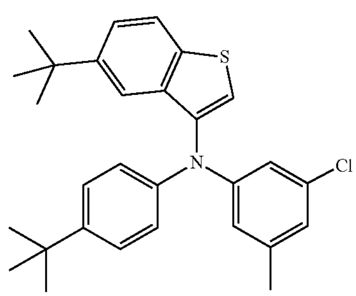

10-a

Compound 10-a was obtained by performing the preparation in the same manner as in Synthesis Example <1-a>, except that 1-bromo-3-chloro-5-methylbenzene and 5-tert-butyl-N-(4-tert-butylphenyl)benzo[b]thiophen-3-amine were used instead of 1-bromo-3-chloro-5-methylbenzene and bis(4-tert-butylphenyl)amine. (Yield 67%, MS$[M+H]^+$=462)

<10-b> Preparation of Compound 10-b

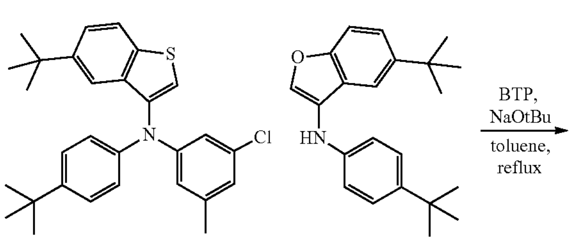

10-a

-continued

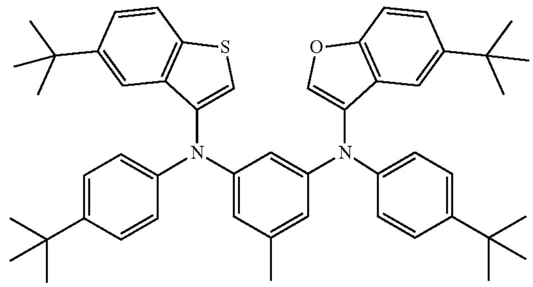

10-b

Compound 10-b was obtained by performing the preparation in the same manner as in Synthesis Example <1-a>, except that Compound 10-a and 5-tert-butyl-N-(4-tert-butylphenyl)benzofuran-3-amine were used instead of 1-bromo-3-chloro-5-methylbenzene and bis(4-tert-butylphenyl)amine. (Yield 52%, MS$[M+H]^+$=747)

<10-c> Preparation of Compound 10-c

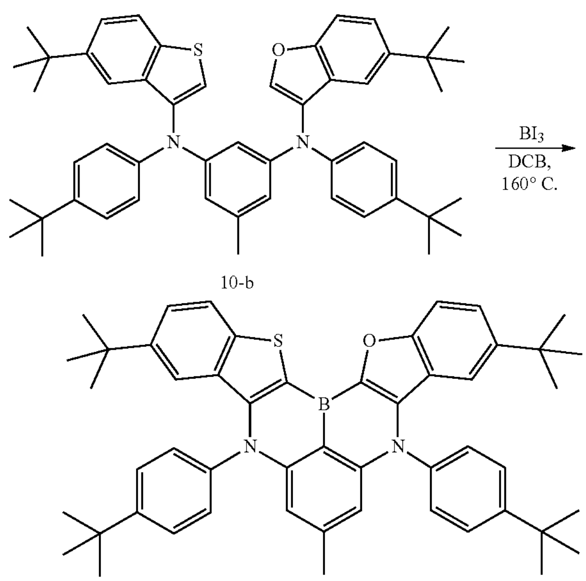

10-c

Compound 10-c was obtained by performing the preparation in the same manner as in Synthesis Example <1-c>, except that Compound 10-b was used instead of Compound 1-b. (Yield 29%, MS$[M+H]^+$=755)

<10-d> Preparation of Compound 10

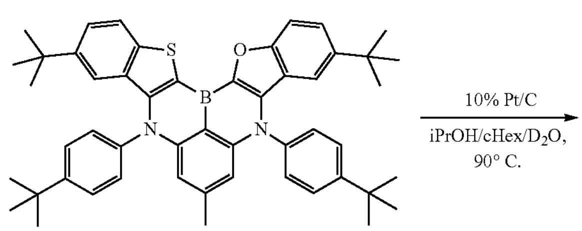

10-c

-continued

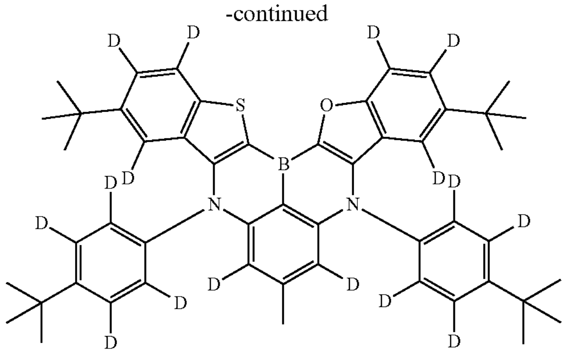

10

Compound 10 was obtained by performing the preparation in the same manner as in Synthesis Example <1-d>, except that Compound 10-c was used instead of Compound 1-c. (Yield 59%, MS[M+H]+=771)

Synthesis Example 11. Synthesis of Compound 11

<11-a> Preparation of Compound 11-a

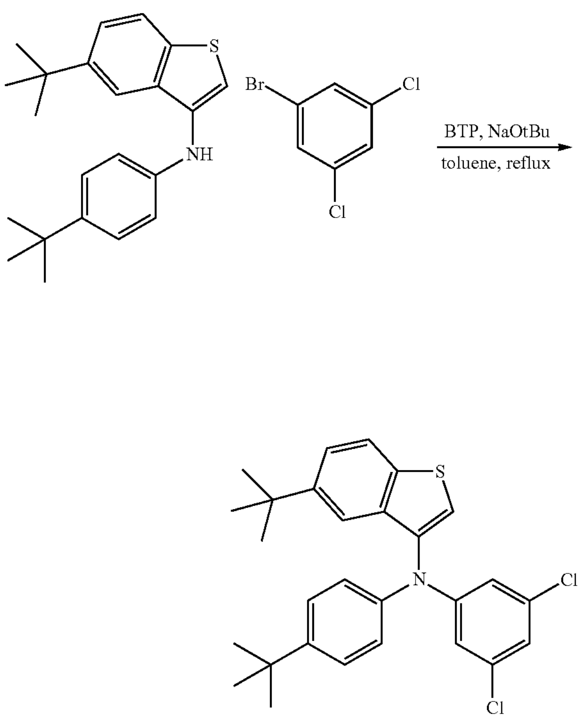

11-a

Compound 11-a was obtained by performing the preparation in the same manner as in Synthesis Example <1-a>, except that 1-bromo-3,5-dichlorobenzene and 5-tert-butyl-N-(4-tert-butylphenyl)benzo[b]thiophen-3-amine were used instead of 1-bromo-3-chloro-5-methylbenzene and bis(4-tert-butylphenyl)amine. (Yield 83%, MS[M+H]+=482)

<11-b> Preparation of Compound 11-b

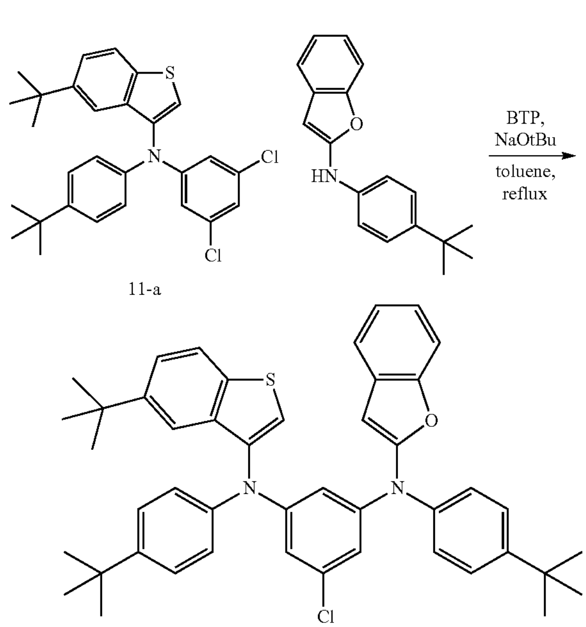

11-b

Compound 11-b was obtained by performing the preparation in the same manner as in Synthesis Example <1-a>, except that Compound 11-a and N-(4-tert-butylphenyl)benzofuran-2-amine were used instead of 1-bromo-3-chloro-5-methylbenzene and bis(4-tert-butylphenyl)amine. (Yield 62%, MS[M+H]+=711)

<11-c> Preparation of Compound 11-c

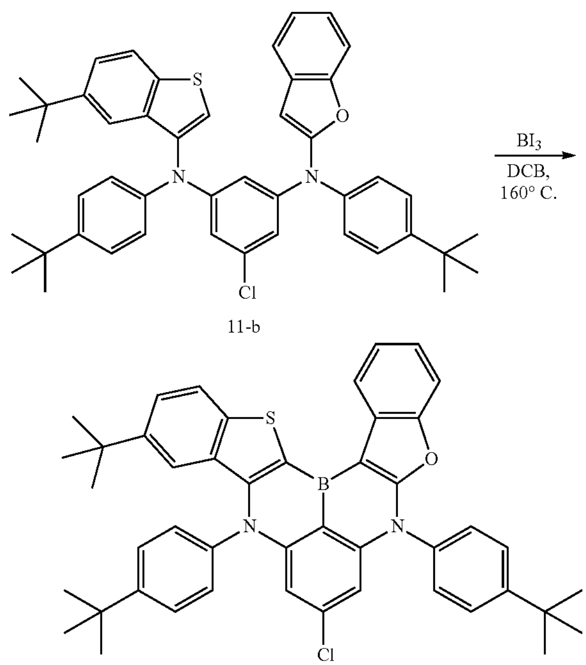

11-c

Compound 11-c was obtained by performing the preparation in the same manner as in Synthesis Example <1-c>, except that Compound 11-b was used instead of Compound 1-b. (Yield 23%, MS[M+H]+=719)

<11-d> Preparation of Compound 11-d

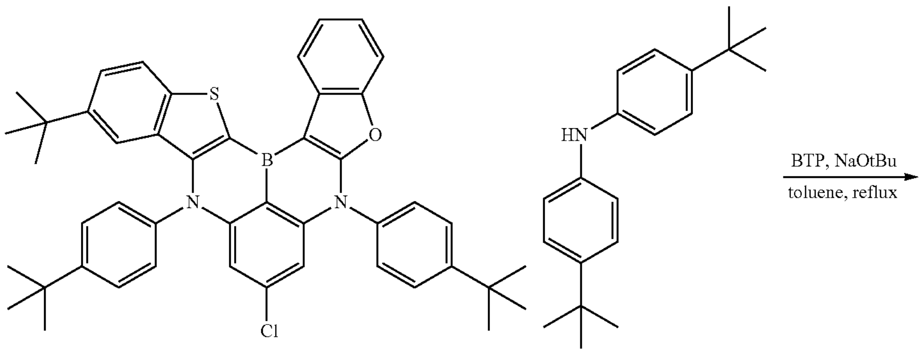

11-c

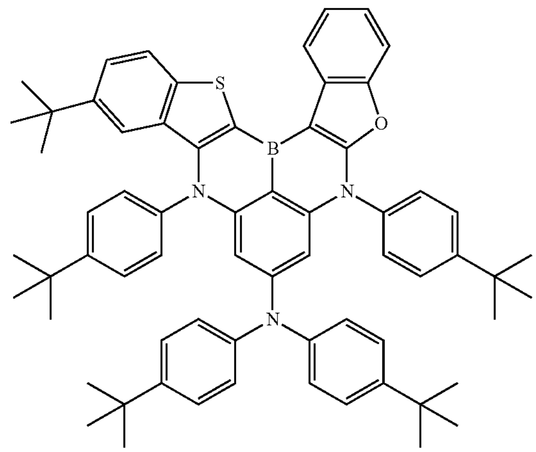

11-d

Compound 11-d was obtained by performing the preparation in the same manner as in Synthesis Example <1-a>, except that Compound 11-c and bis(4-tert-butylphenyl) amine were used instead of 1-bromo-3-chloro-5-methylbenzene and bis(4-tert-butylphenyl)amine. (Yield 67%, MS[M+H]$^+$=964)

<11-e> Preparation of Compound 11

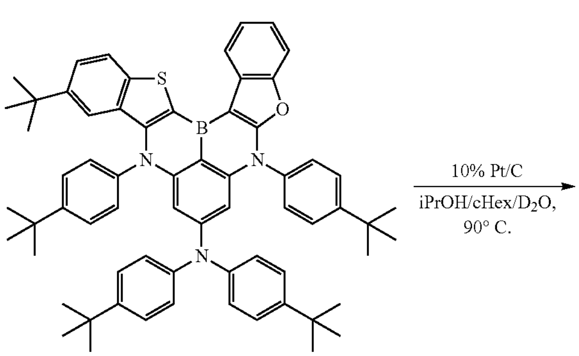

11-d

-continued

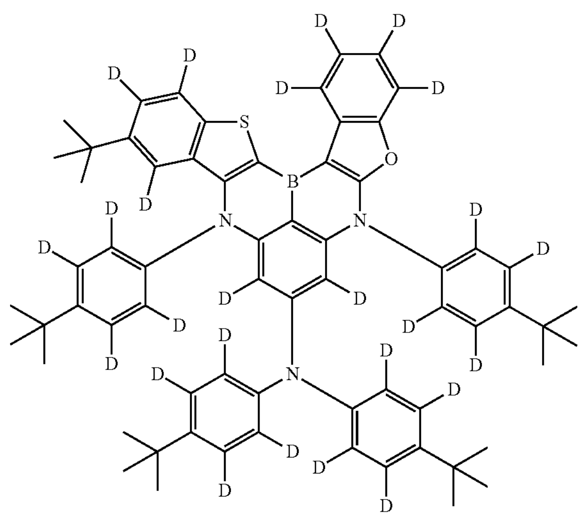

11

Compound 11 was obtained by performing the preparation in the same manner as in Synthesis Example <1-d>, except that Compound 11-d was used instead of Compound 1-c. (Yield 47%, MS[M+H]$^+$=989)

Synthesis Example 12. Synthesis of Compound 12

<12-a> Preparation of Compound 12-a

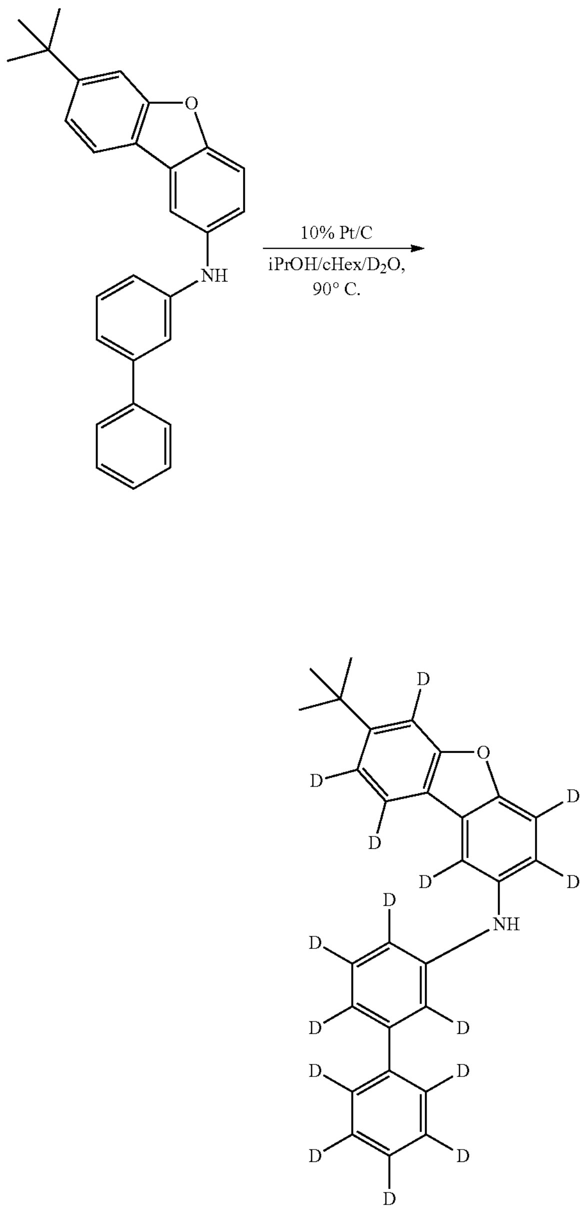

12-a

Compound 12-a was obtained by performing the preparation in the same manner as in Synthesis Example <2-a>, except that N-([1,1'-biphenyl]-3-yl)-7-tert-butyldibenzo[b,d]furan-2-amine was used instead of bis(2,2-dimethyl-2,3-dihydro-1H-inden-5-yl)amine. (Yield 73%, MS[M+H]$^+$=407)

<12-b> Preparation of Compound 12-b

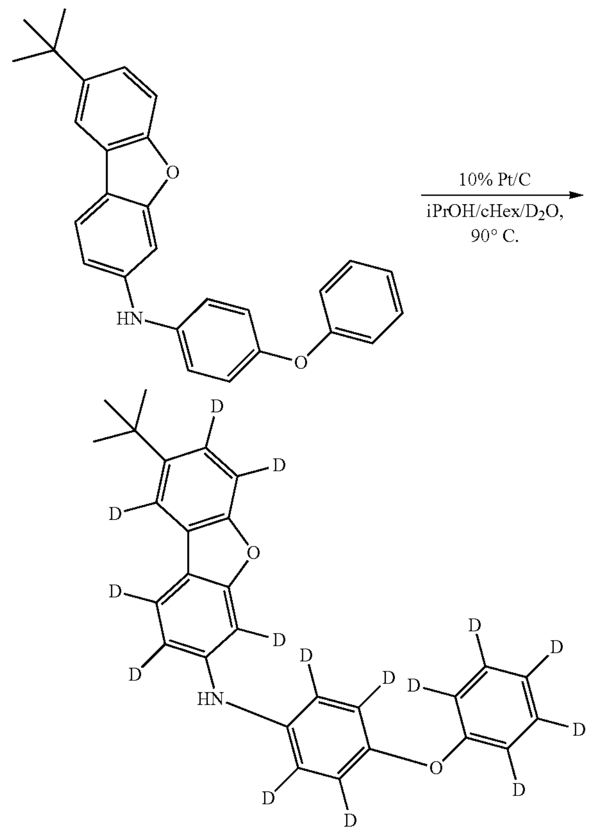

12-b

Compound 12-b was obtained by performing the preparation in the same manner as in Synthesis Example <2-a>, except that 8-tert-butyl-N-(4-phenoxyphenyl)-dibenzo[b,d]furan-3-amine was used instead of bis(2,2-dimethyl-2,3-dihydro-1H-inden-5-yl)amine. (Yield 68%, MS[M+H]$^+$=423)

<12-c> Preparation of Compound 12-c

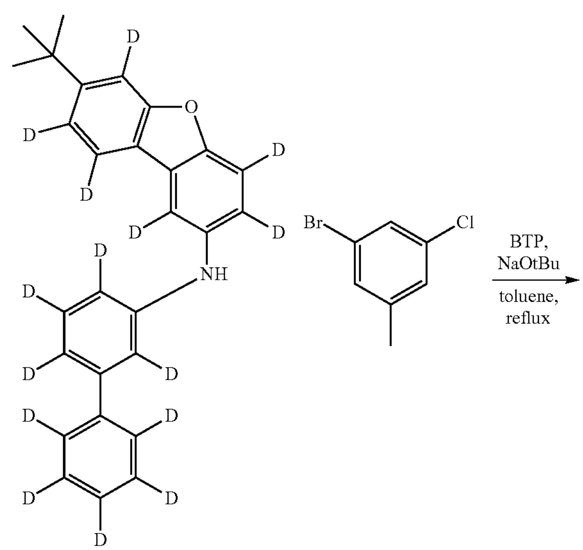

12-a

-continued
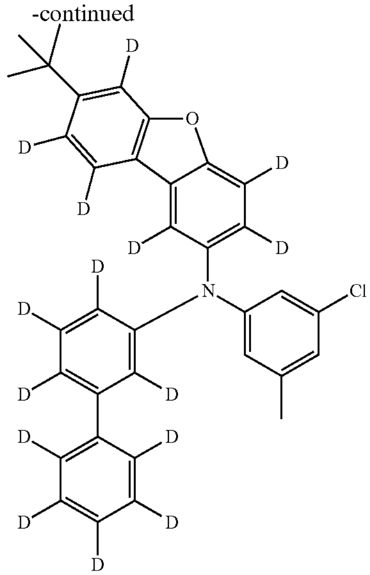
12-c
Compound 12-c was obtained by performing the preparation in the same manner as in Synthesis Example <1-a>, except that Compound 12-a and 1-bromo-3-chloro-5-methylbenzene were used instead of 1-bromo-3-chloro-5-methylbenzene and bis(4-tert-butylphenyl)amine. (Yield 84%, MS$[M+H]^+$=531)
<12-d> Preparation of Compound 12-d
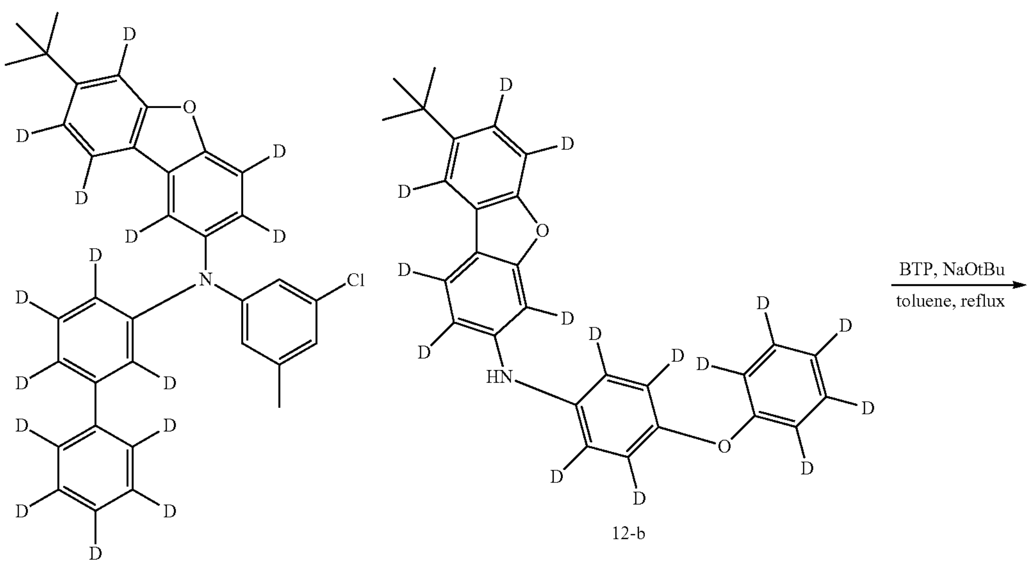
12-c 12-b -continued
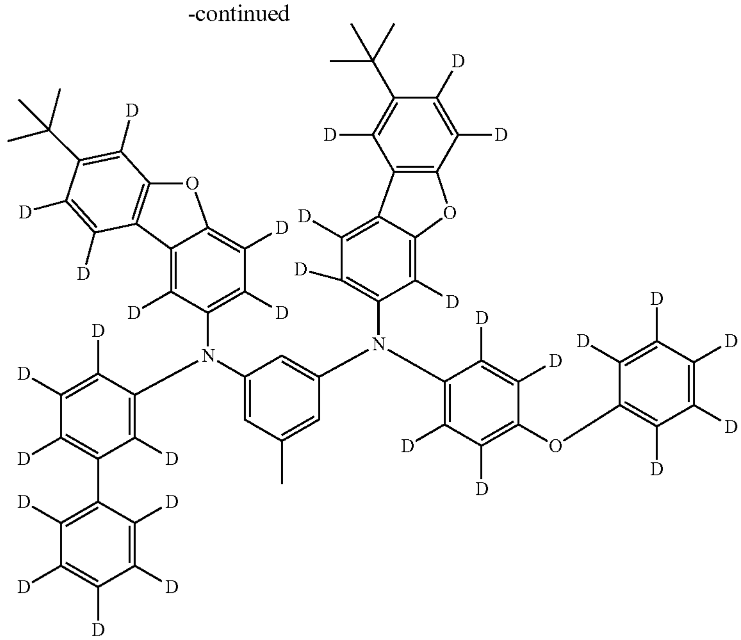
12-d
Compound 12-d was obtained by performing the preparation in the same manner as in Synthesis Example <1-a>, except that Compound 12-c and Compound 12-b were used instead of 1-bromo-3-chloro-5-methylbenzene and bis(4-tert-butylphenyl)amine. (Yield 71%, $MS[M+H]^+=917$)
<12-e> Preparation of Compound 12
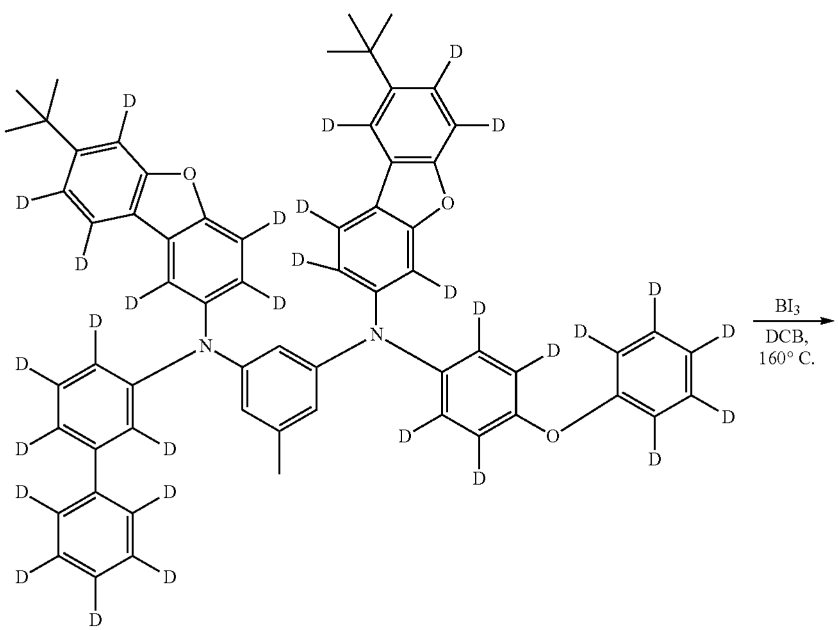
12-d -continued

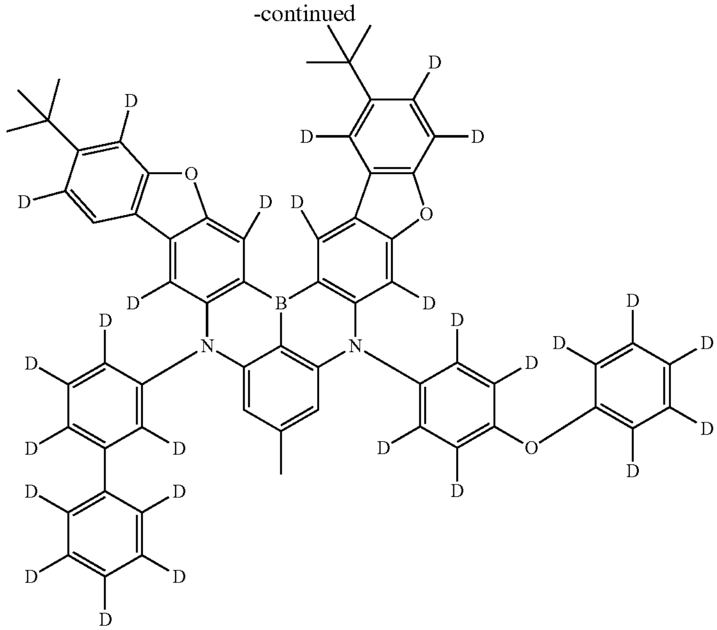

12

Compound 12 was obtained by performing the preparation in the same manner as in Synthesis Example <2-d>, except that Compound 12-d was used instead of Compound 2-c. (Yield 16%, MS$[M+H]^+$=923)

Synthesis Example 13. Synthesis of Compound 13

<13-a> Preparation of Compound 13-a

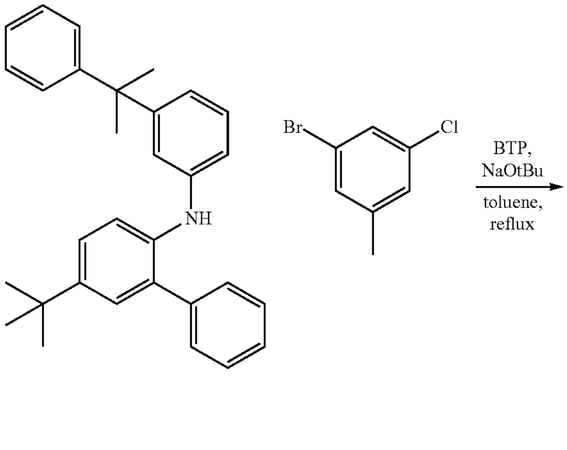

-continued

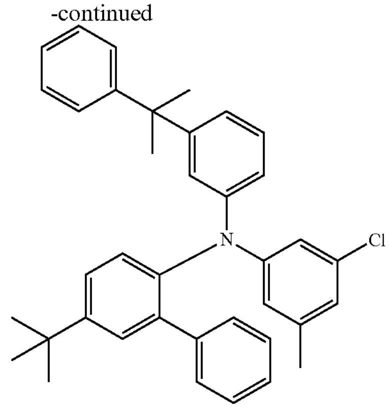

13-a

Compound 13-a was obtained by performing the preparation in the same manner as in Synthesis Example <1-a>, except that 5-tert-butyl-N-(3-(2-phenylpropan-2-yl)phenyl)-[1,1'-biphenyl]-2-amine was used instead of bis(4-tert-butylphenyl)amine. (Yield 90%, MS$[M+H]^+$=544)

<13-b> Preparation of Compound 13-b
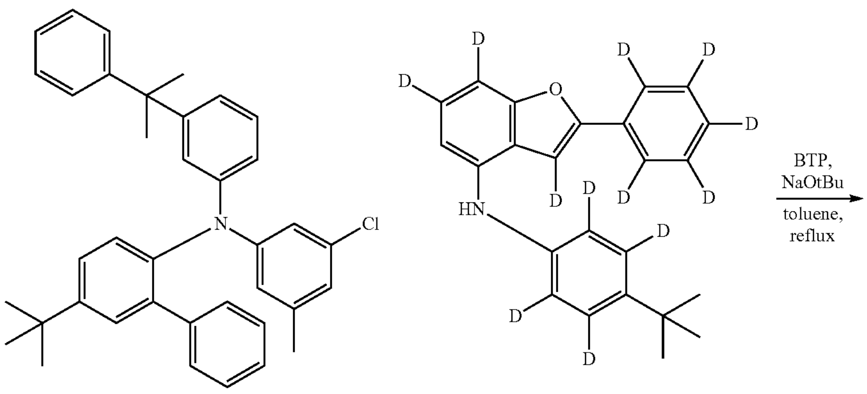
13-a
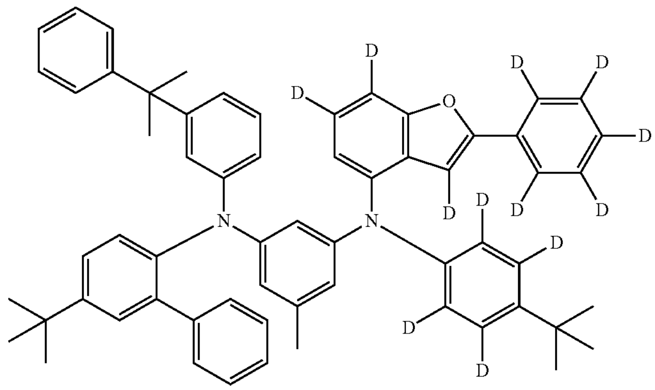
13-b
Compound 13-b was obtained by performing the preparation in the same manner as in Synthesis Example <1-a>, except that Compound 13-a and N-(4-tert-butylphenyl-2,3,5,6-$d_4$)-2-(phenyl-$d_5$)benzofuran-3,6,7-$d_3$-4-amine were used instead of 1-bromo-3-chloro-5-methylbenzene and bis(4-tert-butylphenyl)amine. (Yield 72%, MS[M+H]$^+$=861)
<13-c> Preparation of Compound 13
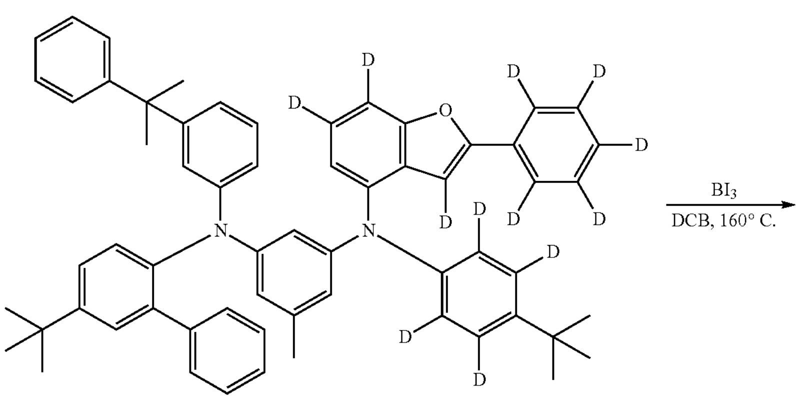
13-b -continued

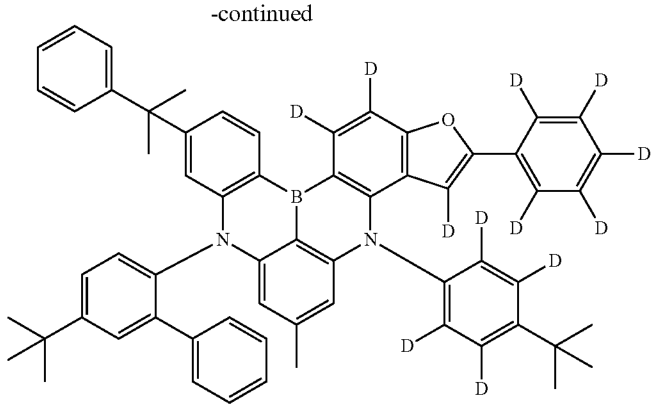

13

Compound 13 was obtained by performing the preparation in the same manner as in Synthesis Example <2-d>, except that Compound 13-b was used instead of Compound 2-c. (Yield 22%, MS[M+H]$^+$=869)

Synthesis Example 14. Synthesis of Compound 14

<14-a> Preparation of Compound 14-a

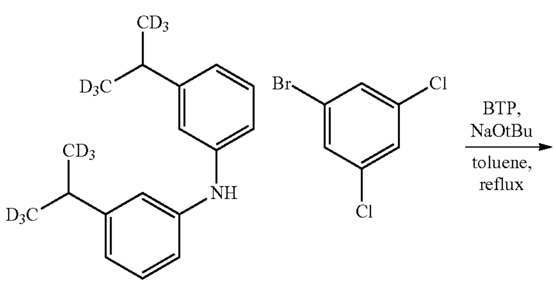

-continued

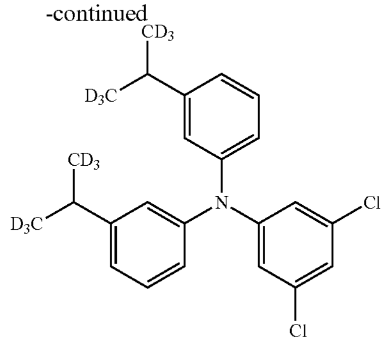

14-a

Compound 14-a was obtained by performing the preparation in the same manner as in Synthesis Example <1-a>, except that 1-bromo-3,5-dichlorobenzene and bis((3-propan-2-yl-$d_6$)phenyl)amine were used instead of 1-bromo-3-chloro-5-methylbenzene and bis(4-tert-butylphenyl)amine. (Yield 93%, MS[M+H]$^+$=410)

<14-b> Preparation of Compound 14-b

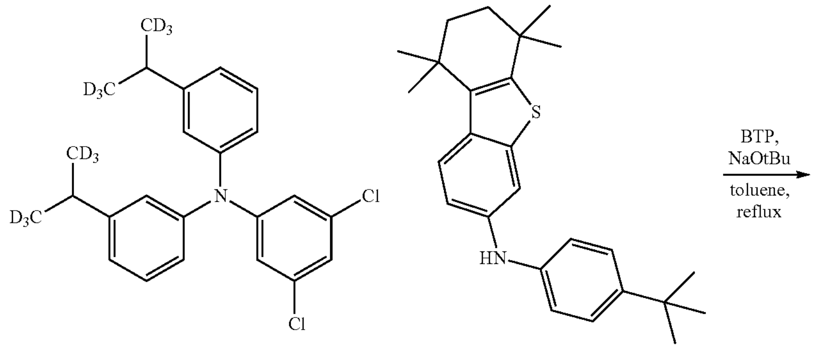

14-a

-continued

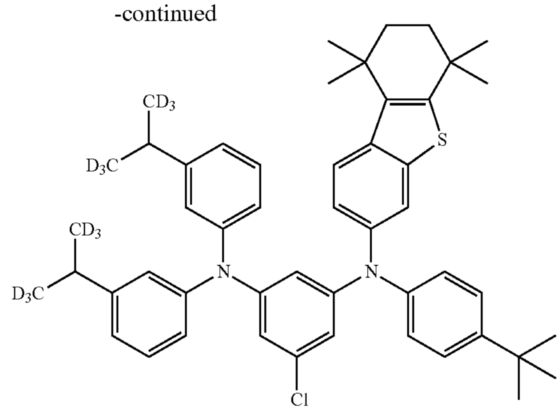

14-b

Compound 14-b was obtained by performing the preparation in the same manner as in Synthesis Example <1-a>, except that Compound 14-a and N-(4-tert-butylphenyl)-6,6,9,9-tetramethyl-6,7,8,9-tetrahydrodibenzo[b,d]thiophen-3-amine were used instead of 1-bromo-3-chloro-5-methylbenzene and bis(4-tert-butylphenyl)amine. (Yield 78%, MS[M+H]$^+$=765)

<14-c> Preparation of Compound 14-c

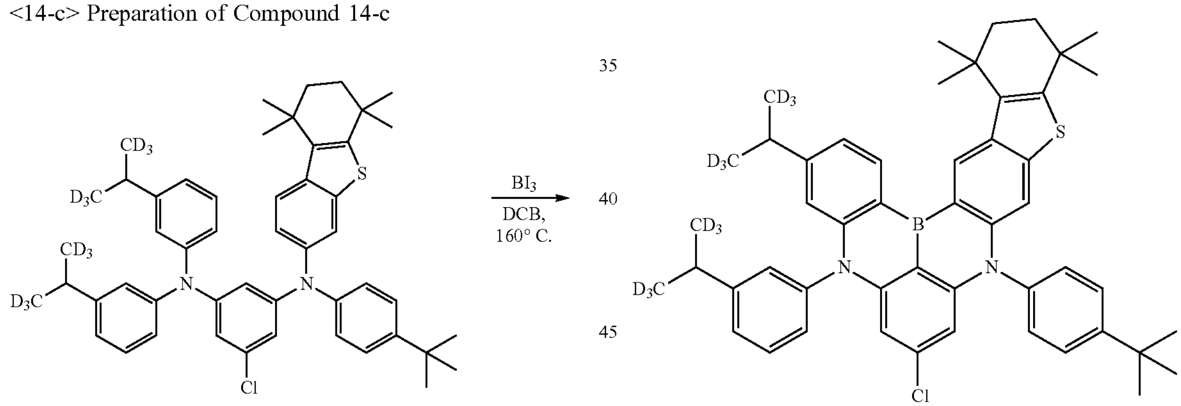

14-b 14-c

Compound 14-c was obtained by performing the preparation in the same manner as in Synthesis Example <1-c>, except that Compound 14-b was used instead of Compound 1-b. (Yield 84%, MS[M+H]$^+$=529)

<14-d> Preparation of Compound 14

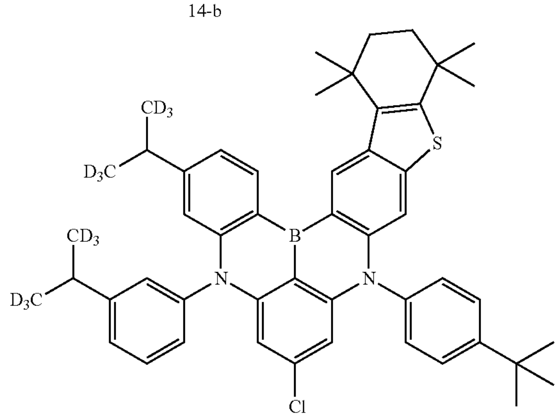

14-c

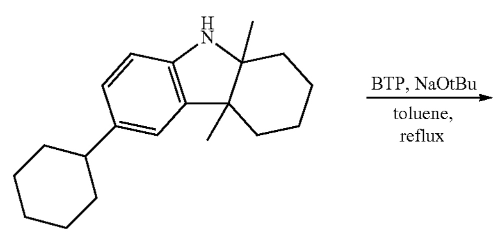

-continued

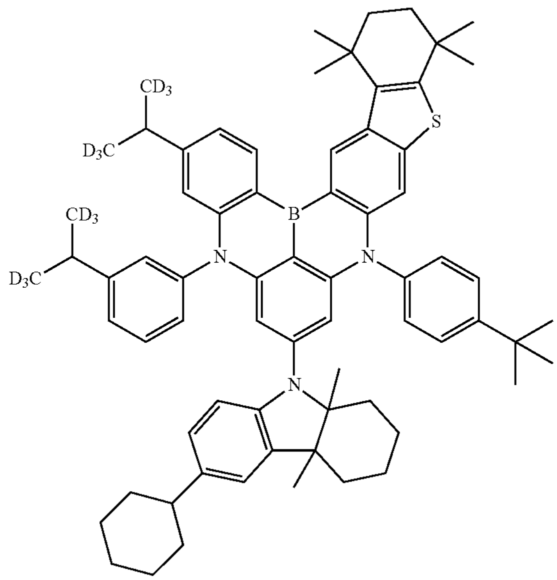

14

Compound 14 was obtained by performing the preparation in the same manner as in Synthesis Example <4-c>, except that Compound 14-c and 6-cyclohexyl-4a,9a-dimethyl-2,3,4,4a,9,9a-hexahydro-1H-carbazole were used instead of Compound 4-b and 6,6-dimethyl-5,6-dihydroindeno[2,1-b]indole. (Yield 64%, MS[M+H]$^+$=1020)

Synthesis Example 15. Synthesis of Compound 15

<15-a> Preparation of Compound 15-a

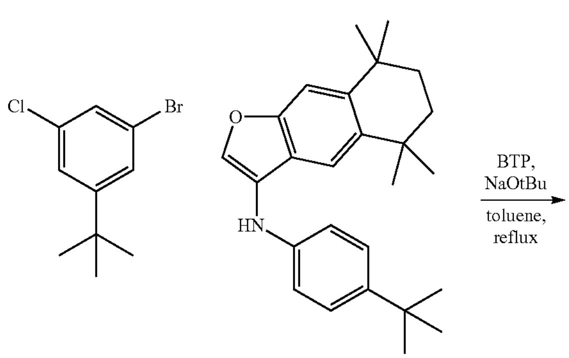

-continued

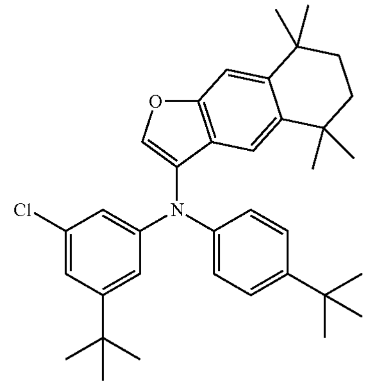

15-a

Compound 15-a was obtained by performing the preparation in the same manner as in Synthesis Example <1-a>, except that 1-bromo-3-chloro-5-tert-butylbenzene and N-(4-tert-butylphenyl)-5,5,8,8-tetramethyl-5,6,7,8-tetrahydronaphtho[2,3-b]furan-3-amine were used instead of 1-bromo-3-chloro-5-methylbenzene and bis(4-tert-butylphenyl)amine. (Yield 88%, MS[M+H]$^+$=542)

<15-b> Preparation of Compound 15-b

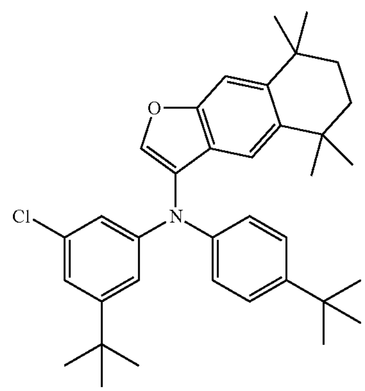

15-a

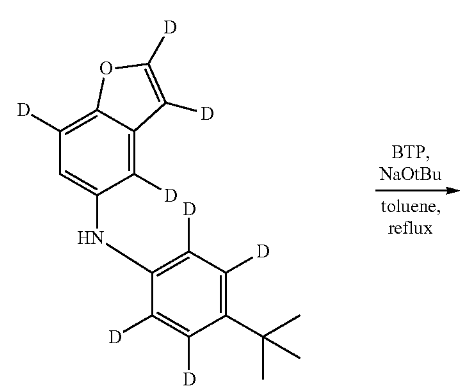

-continued

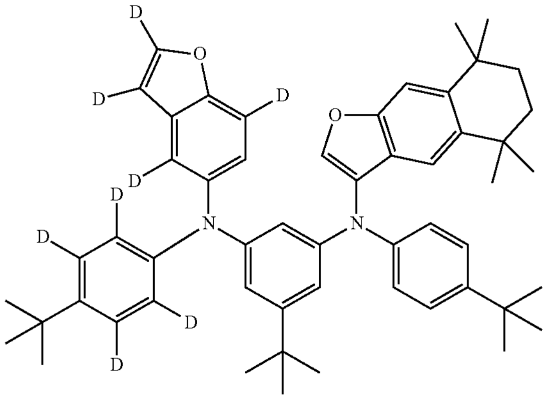

15-b

Compound 15-b was obtained by performing the preparation in the same manner as in Synthesis Example <1-a>, except that Compound 15-a and N-(4-tert-butylphenyl-2,3,5,6-$d_4$)benzofuran-2,3,4,7-$d_4$-5-amine were used instead of 1-bromo-3-chloro-5-methylbenzene and bis(4-tert-butylphenyl)amine. (Yield 76%, MS[M+H]$^+$=779)

<15-c> Preparation of Compound 15

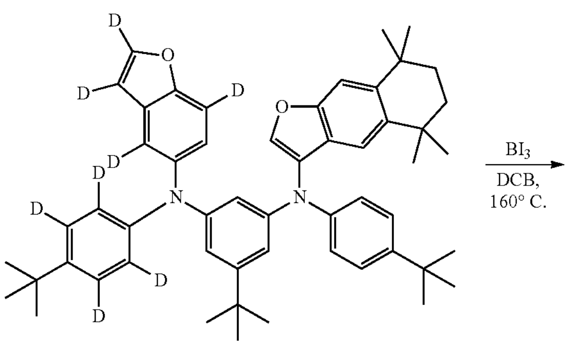

15-b

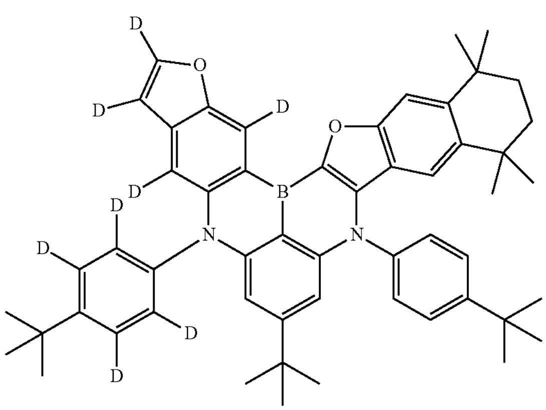

15

Compound 15 was obtained by performing the preparation in the same manner as in Synthesis Example <2-d>, except that Compound 15-b was used instead of Compound 2-c. (Yield 17%, MS[M+H]$^+$=787)

Synthesis Example 16. Synthesis of Compound 16

<16-a> Preparation of Compound 16-a

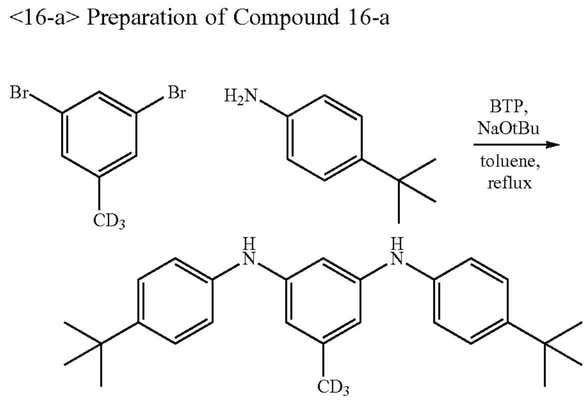

16-a

Compound 16-a was obtained by performing the preparation in the same manner as in Synthesis Example <5-a>, except that 1,3-dibromo-5-(methyl-$d_3$)benzene and 4-tert-butylaniline were used instead of 1,3-dibromo-5-chlorobenzene and 4-tert-butylbenzene-2,3,5,6-$d_{-4}$-amine. (Yield 92%, MS[M+H]$^+$=390)

<16-b> Preparation of Compound 16-b

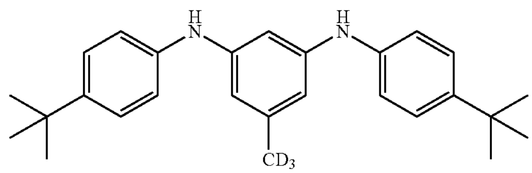

16-a

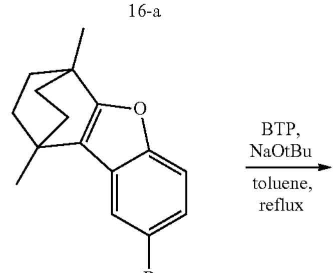

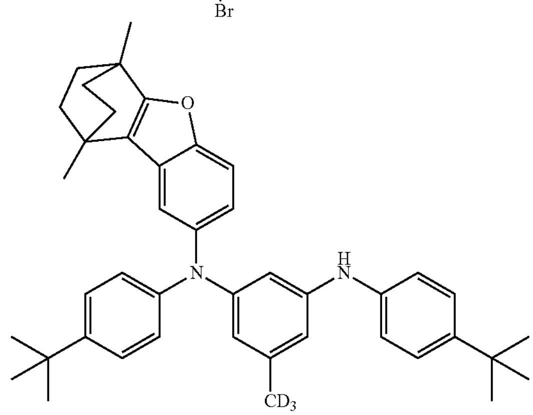

16-b

Compound 16-b was obtained by performing the preparation in the same manner as in Synthesis Example <1-a>, except that Compound 16-a and 8-bromo-1,4-dimethyl-1,2,3,4-tetrahydro-1,4-ethanodibenzo[b,d]furan were used instead of 1-bromo-3-chloro-5-methylbenzene and bis(4-tert-butylphenyl)amine. (Yield 85%, MS[M+H]$^+$=614)

<16-c> Preparation of Compound 16-c

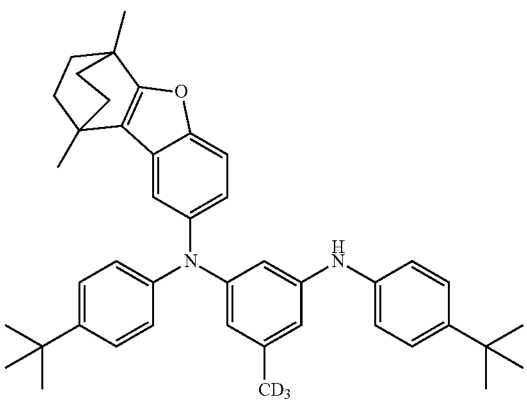

16-b

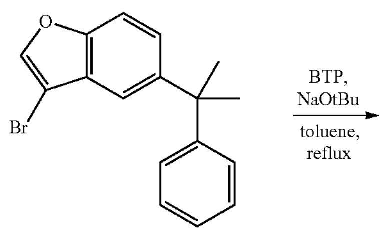

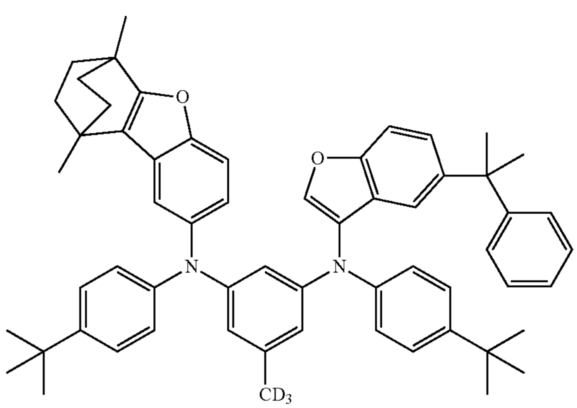

16-c

Compound 16-c was obtained by performing the preparation in the same manner as in Synthesis Example <1-a>, except that Compound 16-b and 3-bromo-5-(2-phenylpropan-2-yl)benzofuran were used instead of 1-bromo-3-chloro-5-methylbenzene and bis(4-tert-butylphenyl)amine. (Yield 65%, MS[M+H]$^+$=848)

<16-d> Preparation of Compound 16

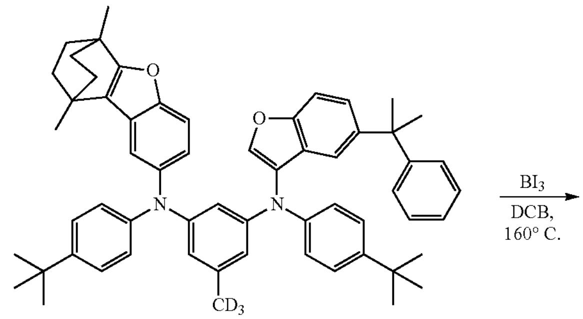

16-c

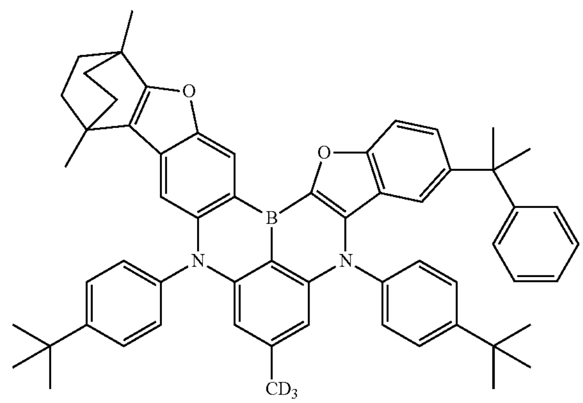

16

Compound 16 was obtained by performing the preparation in the same manner as in Synthesis Example <2-d>, except that Compound 16-c was used instead of Compound 2-c. (Yield 18%, MS[M+H]$^+$=856)

Synthesis Example 17. Synthesis of Compound 17

<17-a> Preparation of Compound 17-a

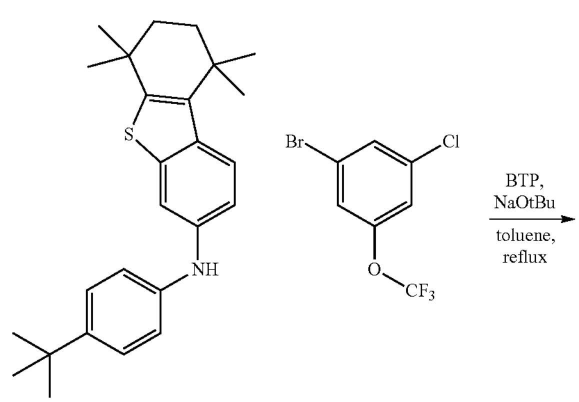

-continued

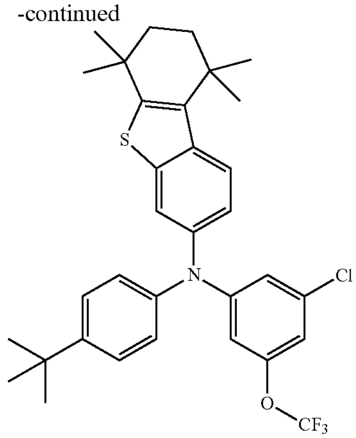

17-a

Compound 17-a was obtained by performing the preparation in the same manner as in Synthesis Example <1-a>, except that 1-bromo-3-chloro-5-(trifluoromethoxy)benzene and N-(4-tert-butylphenyl)-6,6,9,9-tetramethyl-6,7,8,9-tetrahydrodibenzo[b,d]-thiophen-3-amine were used instead of 1-bromo-3-chloro-5-methylbenzene and bis(4-tert-butylphenyl)amine. (Yield 72%, MS[M+H]$^+$=586)

<17-b> Preparation of Compound 17-b

-continued

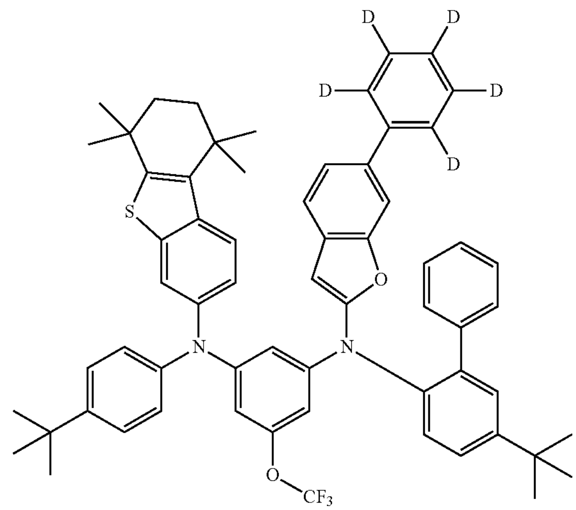

17-b

Compound 17-b was obtained by performing the preparation in the same manner as in Synthesis Example <1-a>, except that Compound 17-a and N-(5-tert-butyl-[1,1'-biphenyl]-2-yl)-6-(phenyl-d$_5$)benzofuran-2-amine were used instead of 1-bromo-3-chloro-5-methylbenzene and bis(4-tert-butylphenyl)amine. (Yield 81%, MS[M+H]$^+$=972)

<17-c> Preparation of Compound 17

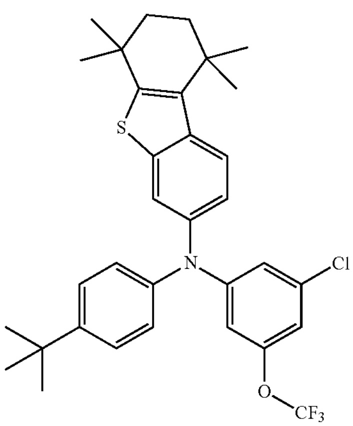

17-a

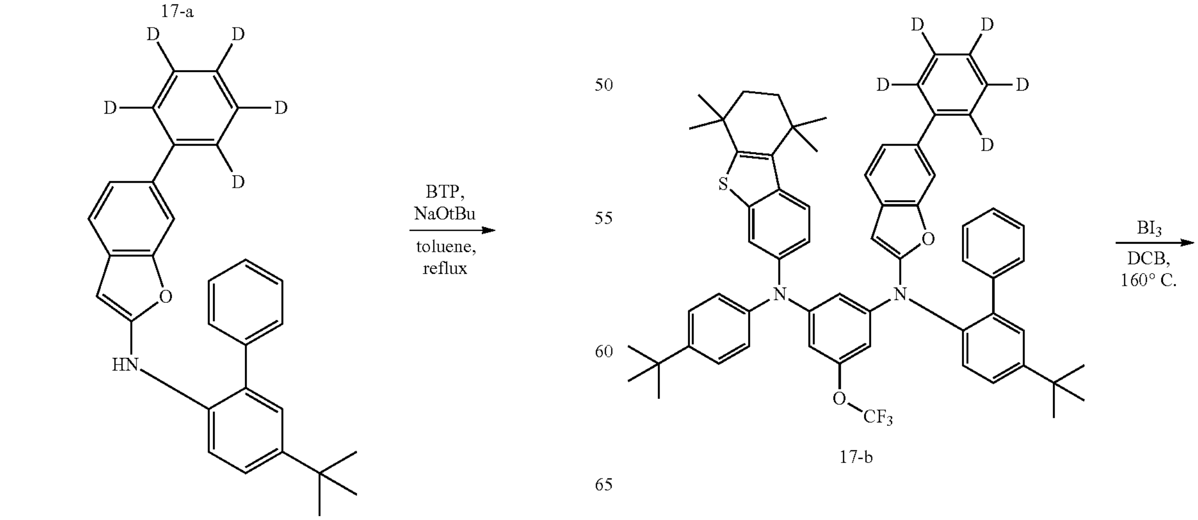

-continued

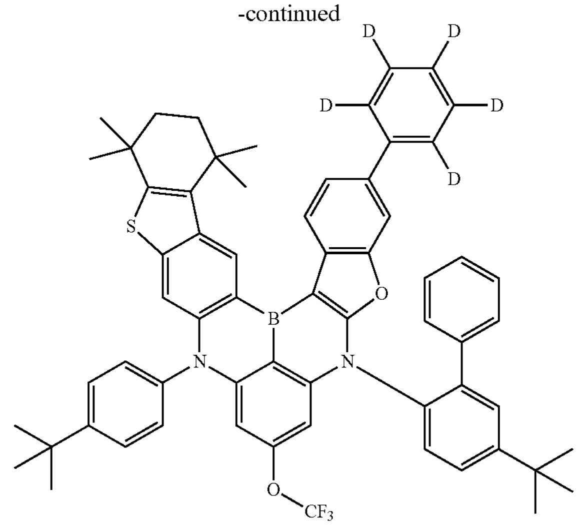

17

Compound 17 was obtained by performing the preparation in the same manner as in Synthesis Example <2-d>, except that Compound 17-b was used instead of Compound 2-c. (Yield 17%, MS[M+H]$^+$=980)

Synthesis Example 18. Synthesis of Compound 18

<18-a> Preparation of Compound 18-a

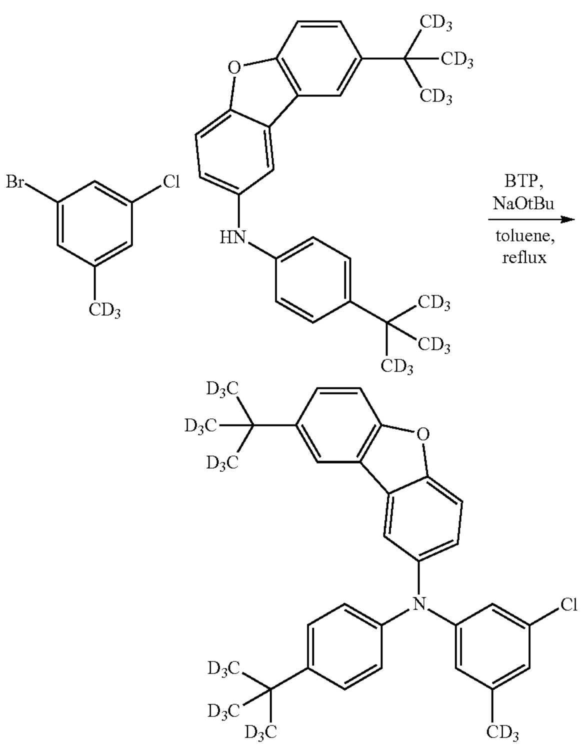

18-a

Compound 18-a was obtained by performing the preparation in the same manner as in Synthesis Example <1-a>, except that 1-bromo-3-chloro-5-(methyl-d$_3$)benzene and 8-(2-(methyl-d$_3$) propan-2-yl-1,1,1,3,3,3-d$_6$)-N-(4-(2-(methyl-d$_3$) propan-2-yl-1,1,1,3,3,3-d$_6$)phenyl)dibenzo-[b,d]furan-2-amine were used instead of 1-bromo-3-chloro-5-methylbenzene and bis(4-tert-butyl-phenyl)amine. (Yield 87%, MS[M+H]$^+$=517)

<18-b> Preparation of Compound 18-b

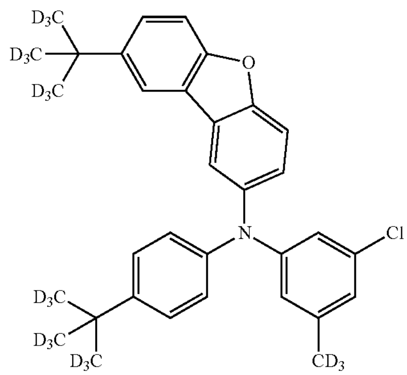

18-a

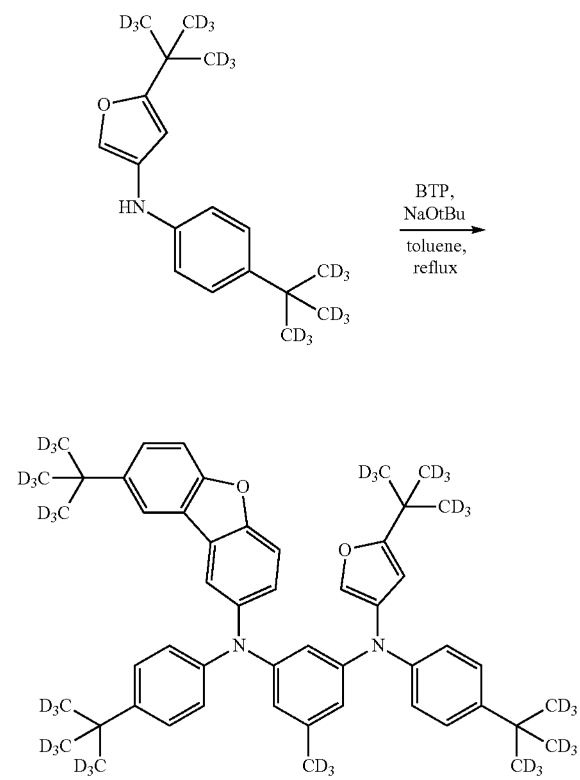

18-b

Compound 18-b was obtained by performing the preparation in the same manner as in Synthesis Example <1-a>, except that Compound 18-a and 5-(2-(methyl-d$_3$)-propan-2-yl-1,1,1,3,3,3-d$_6$)-N-(4-(2-(methyl-d$_3$)-propan-2-yl-1,1,1,3,3,3-d$_6$)phenyl)furan-3-amine were used instead of 1-bromo-3-chloro-5-methylbenzene and bis(4-tert-butylphenyl) amine. (Yield 74%, MS[M+H]$^+$=770)

<18-c> Preparation of Compound 18

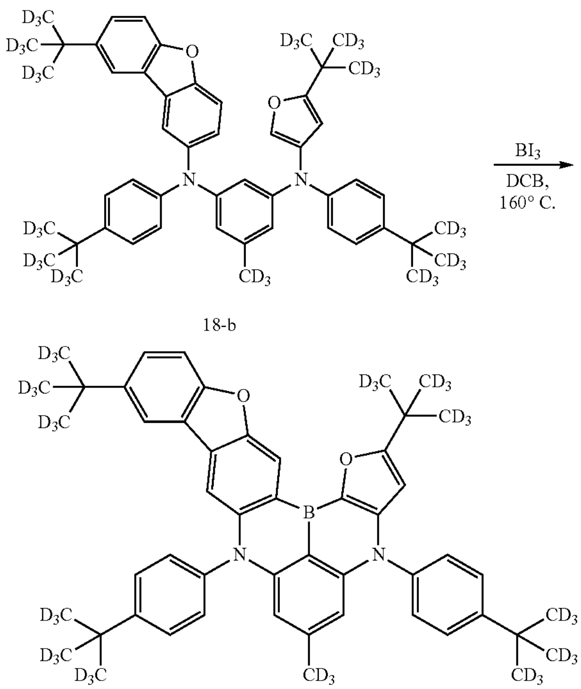

18-b

18

Compound 18 was obtained by performing the preparation in the same manner as in Synthesis Example <2-d>, except that Compound 18-b was used instead of Compound 2-c. (Yield 22%, MS[M+H]$^+$=778)

Synthesis Example 19. Synthesis of Compound 19

<19-a> Preparation of Compound 19-a

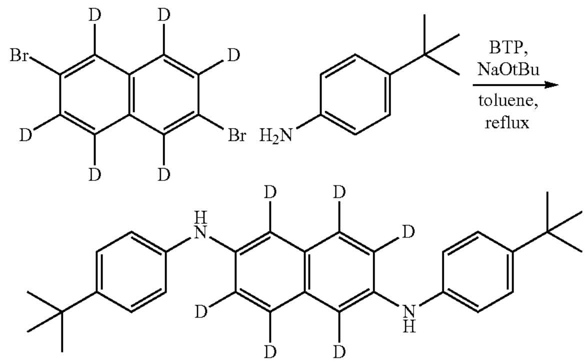

19-a

Compound 19-a was obtained by performing the preparation in the same manner as in Synthesis Example <5-a>, except that $N^2$,$N^6$-bis(4-tert-butylphenyl)-naphthalen-$d_6$-2,6-diamine and 4-tert-butylaniline were used instead of 1,3-dibromo-5-chlorobenzene and 4-tert-butylbenzene-2,3,5,6-$d_{-4}$-amine. (Yield 86%, MS[M+H]$^+$=429)

<19-b> Preparation of Compound 19-b

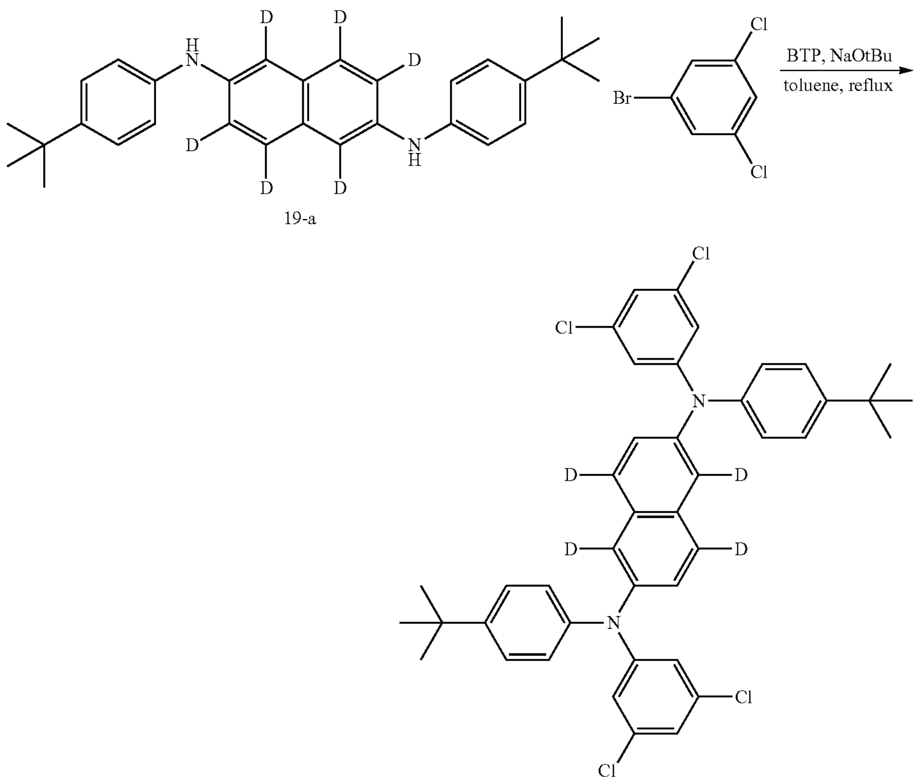

19-a 19-b

Compound 19-b was obtained by performing the preparation in the same manner as in Synthesis Example <5-a>, except that Compound 19-a and 1-bromo-3,5-dichlorobenzene were used instead of 1,3-dibromo-5-chlorobenzene and 4-tert-butylbenzene-2,3,5,6-$d_{-4}$-amine. (Yield 79%, MS[M+H]$^+$=715)
<19-c> Preparation of Compound 19-c
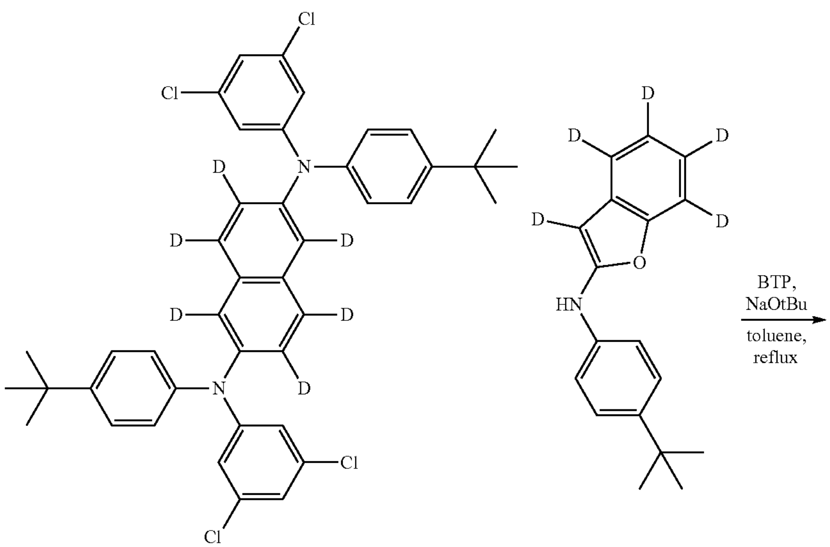
19-b
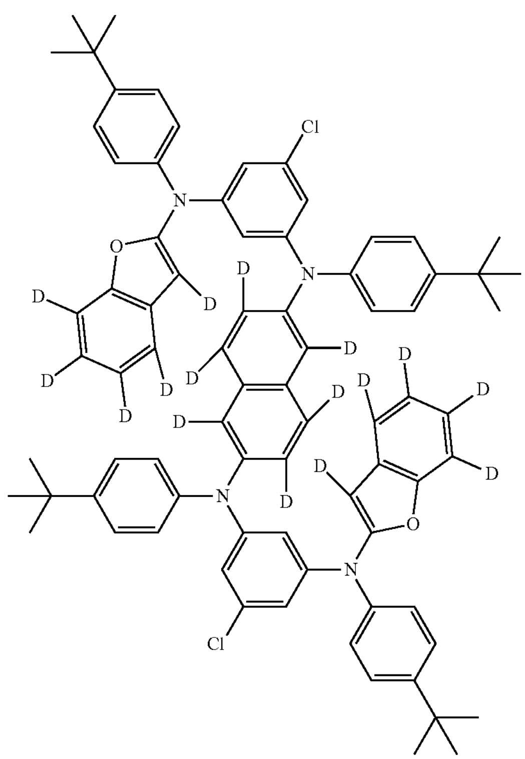
19-c Compound 19-c was obtained by performing the preparation in the same manner as in Synthesis Example <5-a>, except that Compound 19-b and N-(4-tert-butylphenyl)benzofuran-$d_5$-2-amine were used instead of 1,3-dibromo-5-chlorobenzene and 4-tert-butylbenzene-2,3,5,6-$d_4$-amine. (Yield 85%, MS$[M+H]^+$=1185)

<19-d> Preparation of Compound 19-d

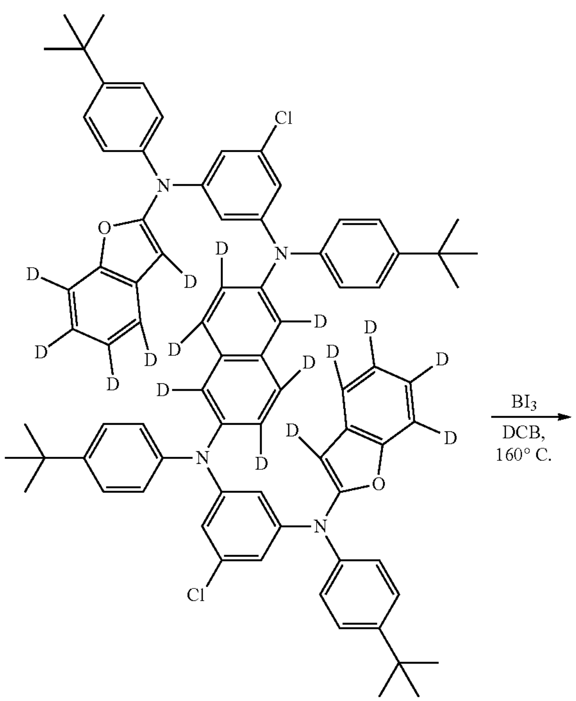

19-c

-continued

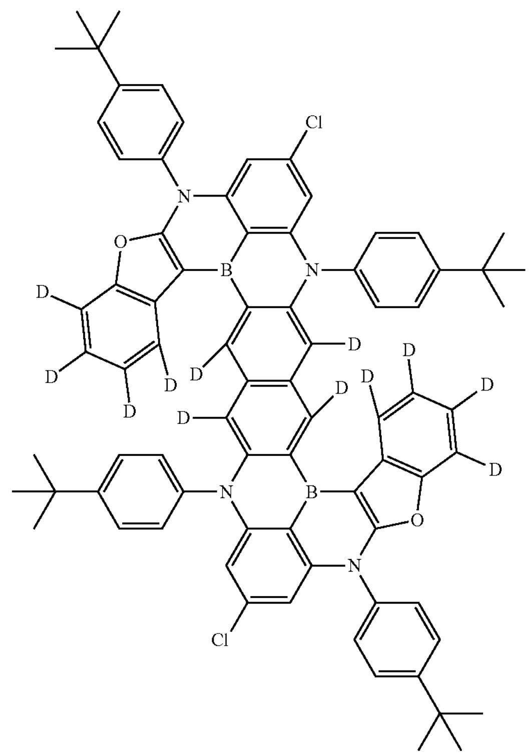

19-d

After Compound 19-c was dissolved in 1,2-dichlorobenzene (0.1 M) in a three-neck flask and boron triiodide (4 eq.) was added thereto, the resulting mixture was stirred in an argon atmosphere at 160° C. for 5 hours. The reaction product was cooled to 0° C., N,N-diisopropylethylamine (40 eq.) was added thereto, and then the resulting mixture was stirred for 1 hour. Extraction was performed in a separatory funnel using toluene and $H_2O$. The extract was dried over $MgSO_4$ and concentrated, and the sample was purified with silica gel column chromatography to obtain Compound 19-d. (Yield 12%, MS$[M+H]^+$=1197)

<19-e> Preparation of Compound 19
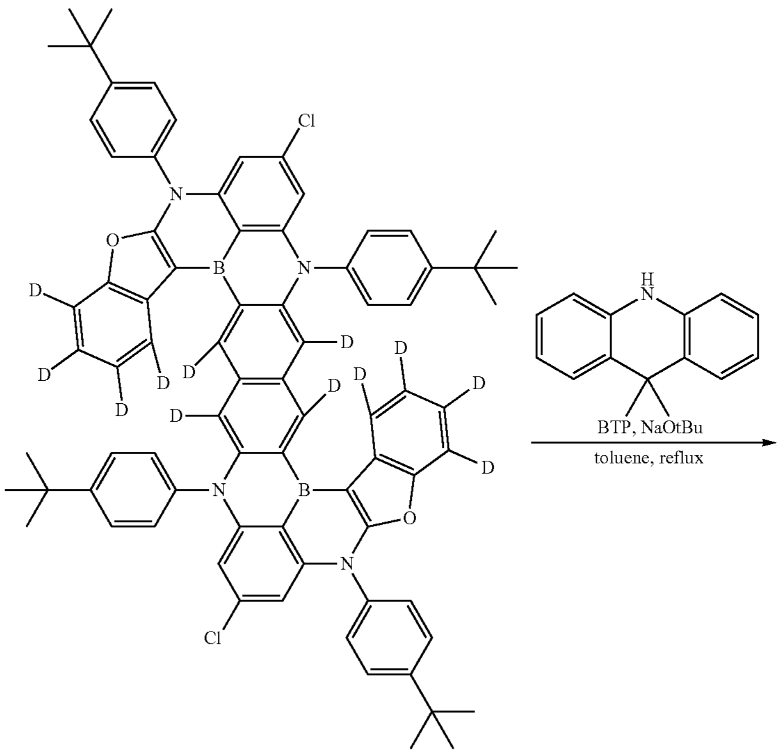
19-d
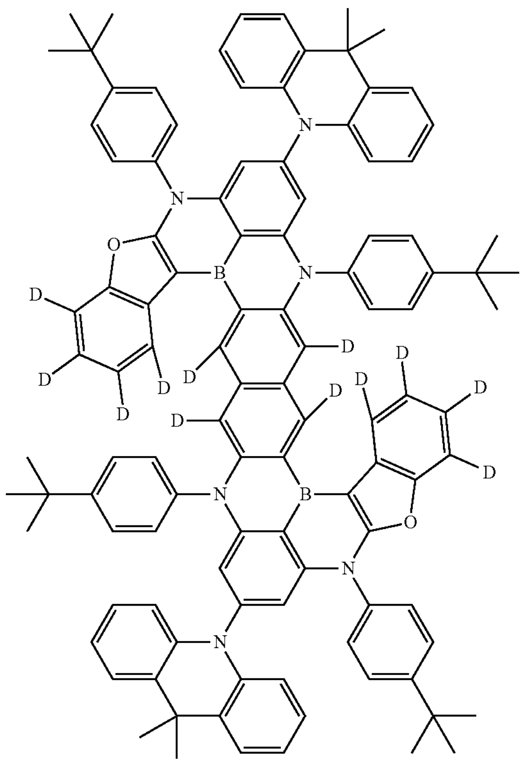
19
After Compound 19-d (1 eq.) and 9,9-dimethyl-9,10-dihydroacridine (2.2 eq.) were dissolved in toluene (0.3 M) in a three-neck flask and sodium tert-butoxide (3 eq.) and bis(tri-tert-butylphosphine)palladium(0) (0.015 eq.) were added thereto, the resulting mixture was stirred under reflux conditions in an argon atmosphere for 6 hours. When the reaction was completed, the flask was cooled to room temperature, $H_2O$ was added thereto, and the reaction solution was transferred to a separatory funnel for extraction. The extract was dried over $MgSO_4$ and concentrated, and the sample was subjected to sublimation purification with silica gel column chromatography to obtain Compound 19. (Yield 57%, MS[M+H]$^+$=1543)

Synthesis Example 20. Synthesis of Compound 20

<20-a> Preparation of Compound 20-a

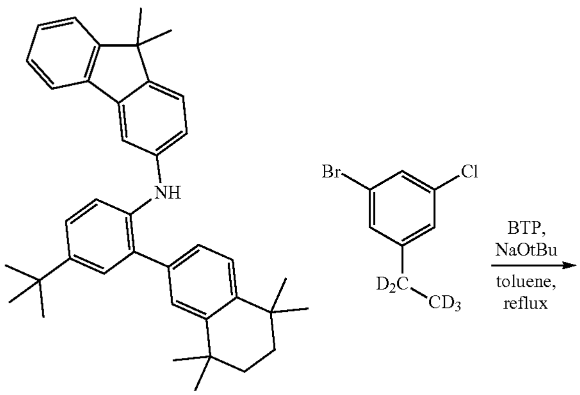

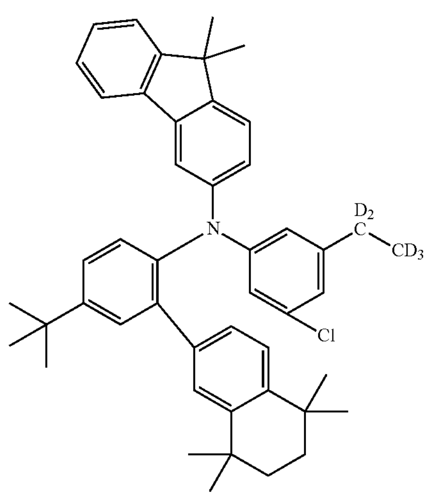

20-a

Compound 20-a was obtained from 1-bromo-3-chloro-5-(ethyl-$d_5$)benzene and N-(4-tert-butyl-2-(5,5,8,8-tetramethyl-5,6,7,8-tetrahydronaphthalen-2-yl)phenyl)-9,9-dimethyl-9H-fluoren-3-amine in the same manner as in Synthesis Example <1-a>. (Yield 84%, MS[M+H]$^+$=671)

<20-b> Preparation of Compound 20-b

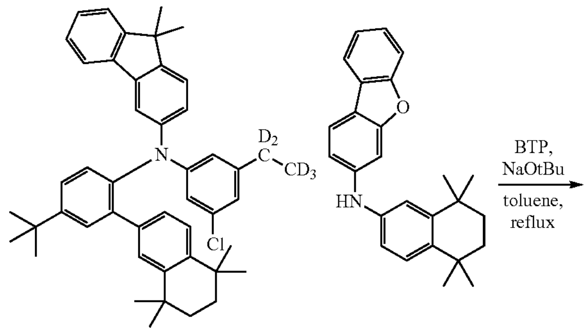

20-a

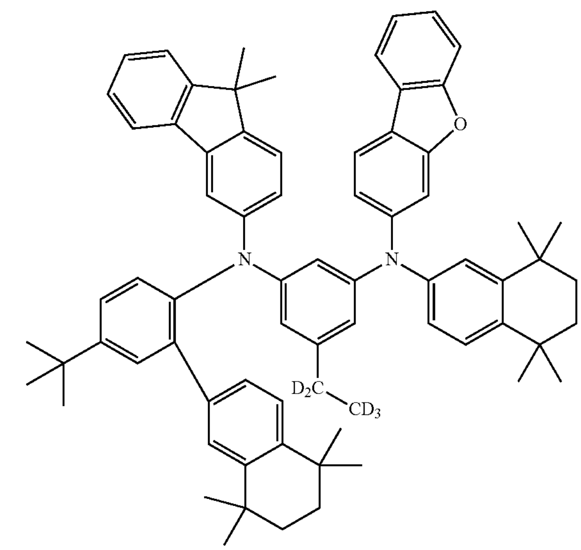

20-b

Compound 20-b was obtained from Compound 20-a and N-(5,5,8,8-tetramethyl-5,6,7,8-tetrahydronaphthalen-2-yl)dibenzo[b,d]furan-3-amine in the same manner as in Synthesis Example <1-a>. (Yield 84%, MS[M+H]$^+$=1004)

<20-c> Preparation of Compound 20

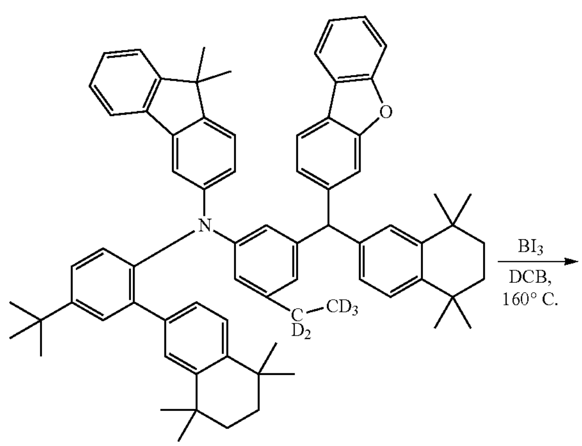

20-b

-continued

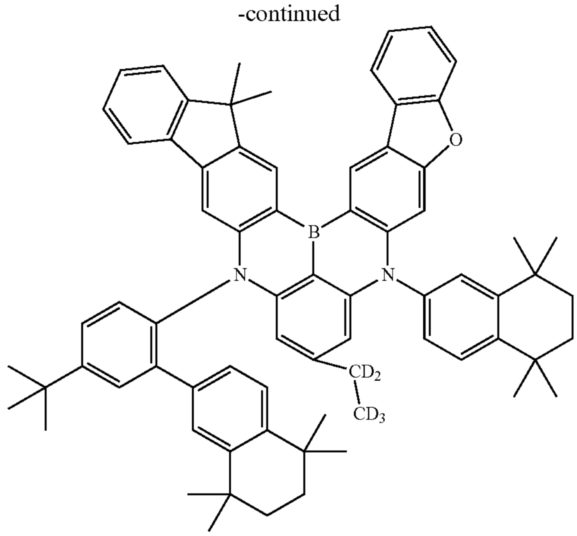

20

Compound 20 was obtained from Compound 20-b in the same manner as in Synthesis Example <2-d>. (Yield 15%, MS[M+H]$^+$=1012)

Synthesis Example 21. Synthesis of Compound 21

<21-a> Preparation of Compound 21-a

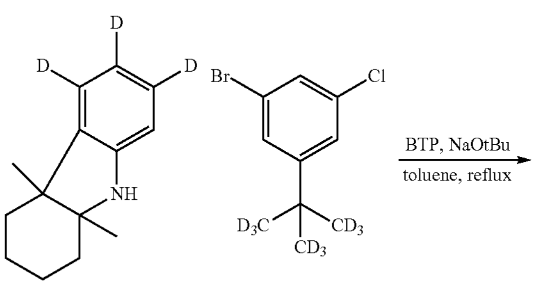

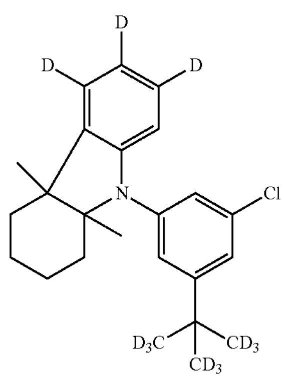

21-a

Compound 21-a was obtained from 1-bromo-3-chloro-5-(tert-butyl-$d_9$)benzene and 4a,9a-dimethyl-2,3,4,4a,9,9a-hexahydro-1H-carbazole-5,6,7-$d_3$ in the same manner as in Synthesis Example <1-a>. (Yield 84%, MS[M+H]$^+$=380)

<21-b> Preparation of Compound 21-b

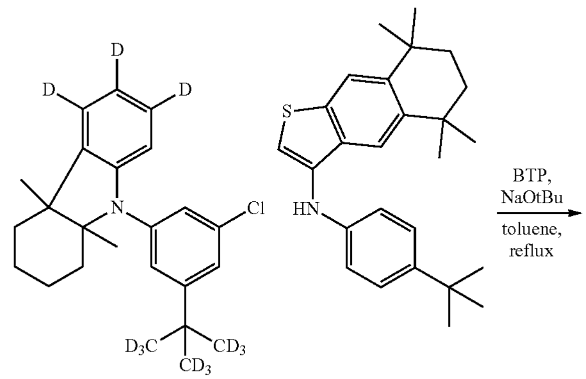

21-a

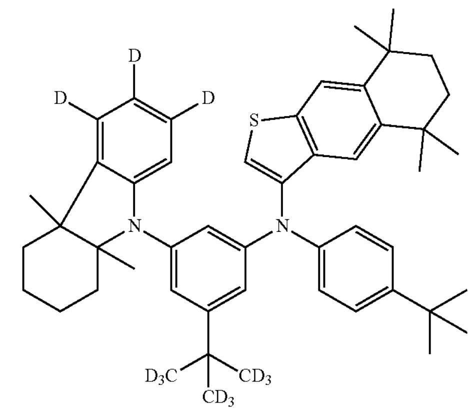

21-b

Compound 21-b was obtained from Compound 21-a and N-(4-tert-butylphenyl)-5,5,8,8-tetramethyl-5,6,7,8-tetrahydronaphtho [2,3-b]thiophen-3-amine in the same manner as in Synthesis Example <1-a>. (Yield 77%, MS[M+H]$^+$=735)

<21-c> Preparation of Compound 21

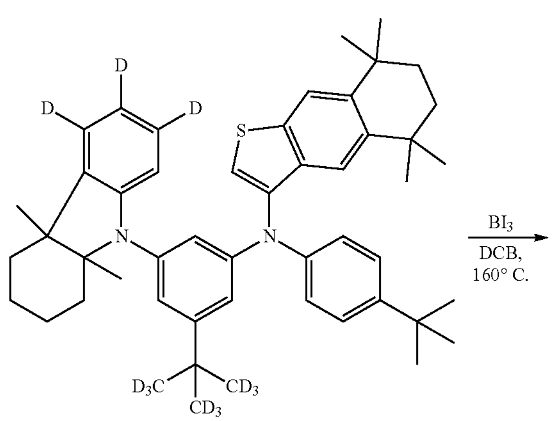

21-b

-continued

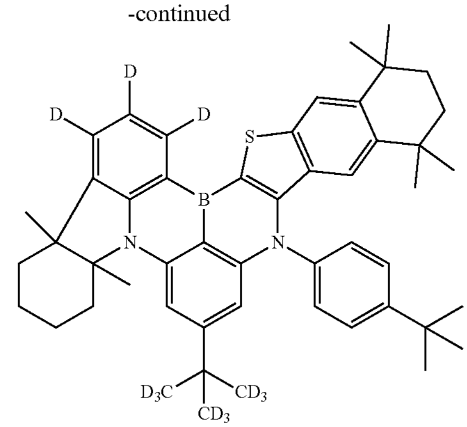

21

Compound 21 was obtained from Compound 21-b in the same manner as in Synthesis Example <2-d>. (Yield 20%, MS[M+H]+=743)

Synthesis Example 22. Synthesis of Compound 22

<22-a> Preparation of Compound 22-a

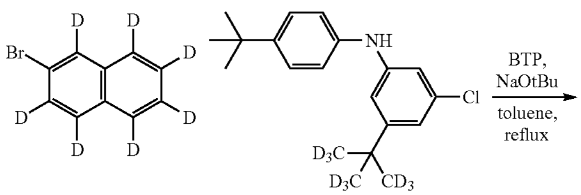

-continued

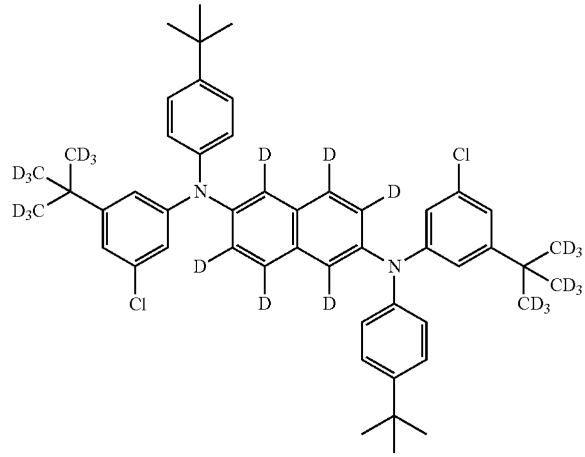

22-a

Compound 22-a was obtained from 2,6-dibromonaphthalen-1,3,4,5,7,8-$d_6$ and N-(4-tert-butylphenyl)-3-chloro-5-(tert-butyl-$d_9$)aniline in the same manner as in Synthesis Example <5-a>. (Yield 72%, MS[M+H]+=779)

<22-b> Preparation of Compound 22-b

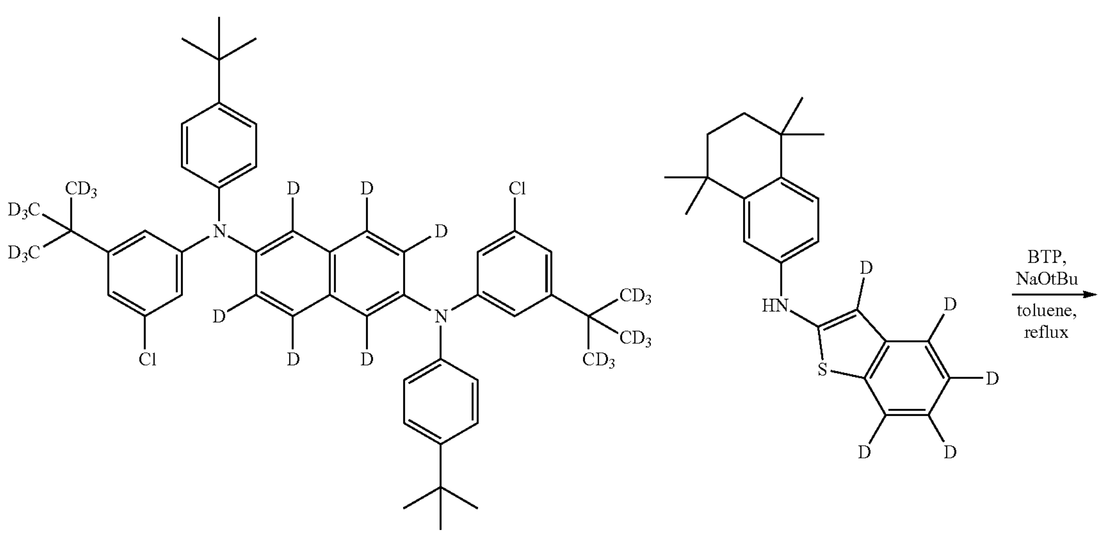

22-a

-continued
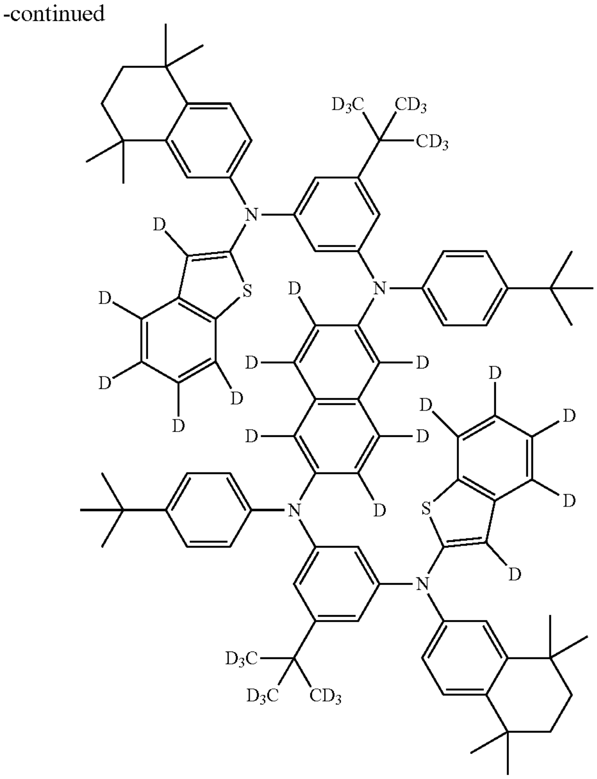
22-b
Compound 22-b was obtained from Compound 22-a and N-(5,5,8,8-tetramethyl-5,6,7,8-tetrahydronaphthalen-2-yl) benzo[b]thiophen-$d_5$-2-amine in the same manner as in Synthesis Example <5-a>. (Yield 59%, MS[M+H]$^+$=1387)
<22-c> Preparation of Compound 22
-continued
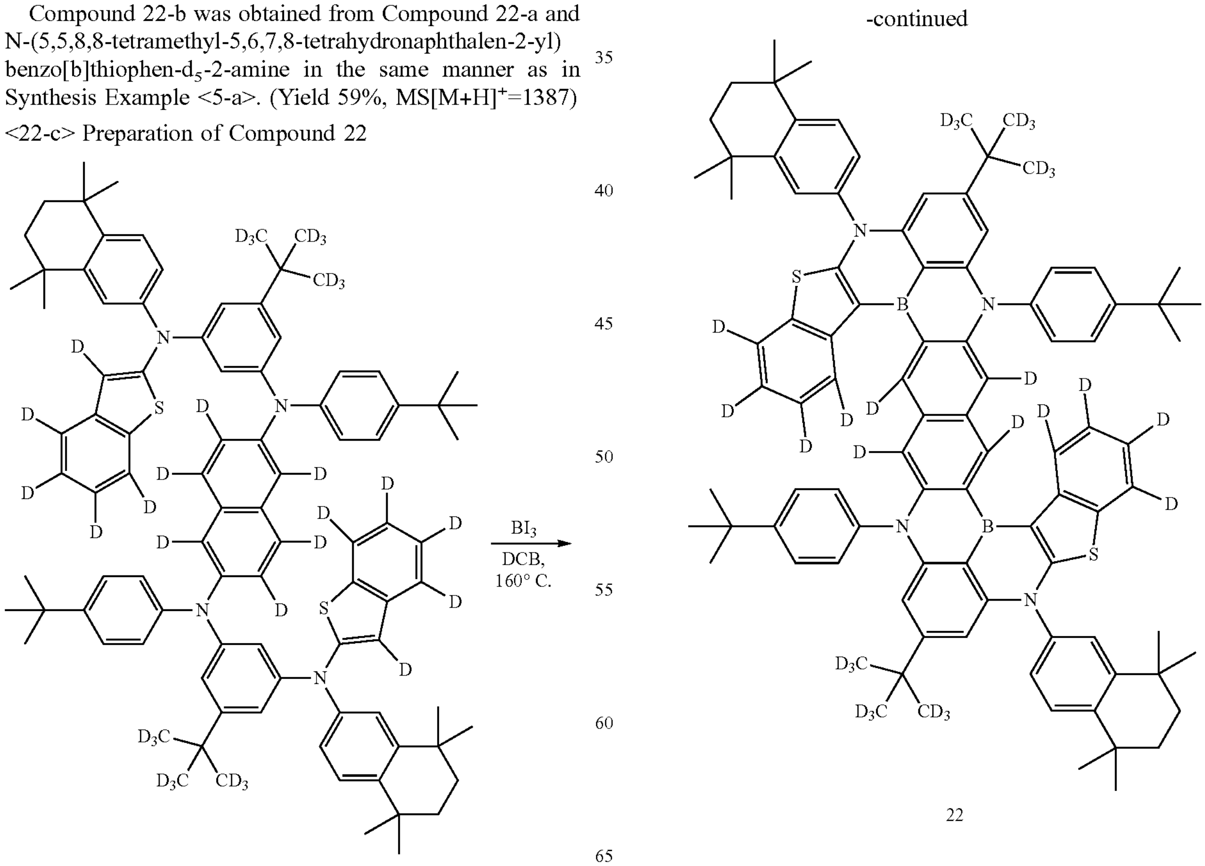
22-b
22

After the same method as in Synthesis Example <19-d> was used, Compound 22 was obtained from Compound 22-b through sublimation purification. (Yield 6%, $MS[M+H]^+$ =1399)

Experimental Example 2. Manufacture of Organic Light Emitting Device

Example 1

A glass substrate thinly coated with indium tin oxide (ITO) to have a thickness of 1,400 Å was put into distilled water in which a detergent was dissolved, and ultrasonically washed. In this case, a product manufactured by Fischer Co. was used as the detergent, and distilled water, which had been filtered twice with a filter manufactured by Millipore Co., was used as the distilled water. After the ITO was washed for 30 minutes, ultrasonic washing was conducted twice repeatedly using distilled water for 10 minutes. After the washing using distilled water was completed, ultrasonic washing was conducted by using isopropyl alcohol, acetone, and methanol solvents, and the resulting product was dried and then transported to a plasma washing machine. The substrate was cleaned by using oxygen plasma for 5 minutes, and then was transported to a vacuum deposition machine.

The following compound HI-A and compound LG-101 were thermally vacuum deposited to have a thickness of 650 Å and 50 Å, respectively, on the ITO transparent electrode prepared as described, thereby forming a hole injection layer. The following compound HT-A was vacuum deposited to have a thickness of 600 Å on the hole injection layer, thereby forming a hole transport layer. The following compound HT-B was vacuum deposited to have a thickness of 50 Å on the hole transport layer, thereby forming an electron blocking layer. Subsequently, 4 parts by weight of Compound 1 of Synthesis Example 1 as a blue light emitting dopant based on 100 parts by weight of the light emitting layer were used and the following compound BH-A was vacuum deposited to have a thickness of 200 Å as a host on the electron blocking layer, thereby forming a light emitting layer. Next, the following compound ET-A as a first electron transport layer was vacuum deposited to have a thickness of 50 Å on the light emitting layer, and subsequently, the following compound ET-B and compound LiQ were vacuum deposited at a weight ratio of 1:1, thereby forming a second electron transport layer having a thickness of 360 Å. Compound LiQ was vacuum deposited to have a thickness of 5 Å on the second electron transport layer, thereby forming an electron injection layer. Aluminum and silver were deposited at a weight ratio of 10:1 to have a thickness of 220 Å on the electron injection layer, and aluminum was deposited to have a thickness of 1,000 Å thereon, thereby forming a negative electrode.

In the aforementioned procedure, the deposition rate of the organic materials were maintained at 0.4 to 0.9 Å/sec, the deposition rate of aluminum of the negative electrode was maintained at 2 Å/sec, and the degree of vacuum during the deposition was maintained at $1\times10^{-7}$ to $5\times10^{-8}$ torr, thereby manufacturing an organic light emitting device.

HI-A

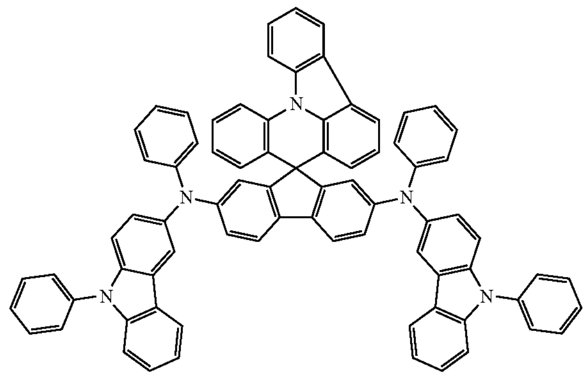

LG-101

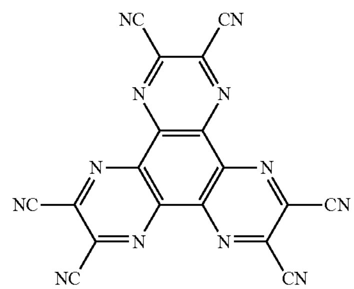

HT-A

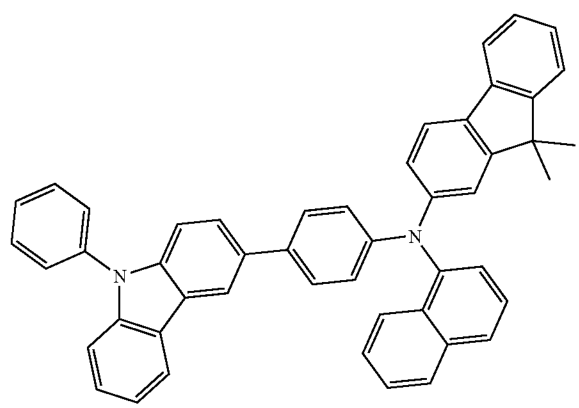

HT-B

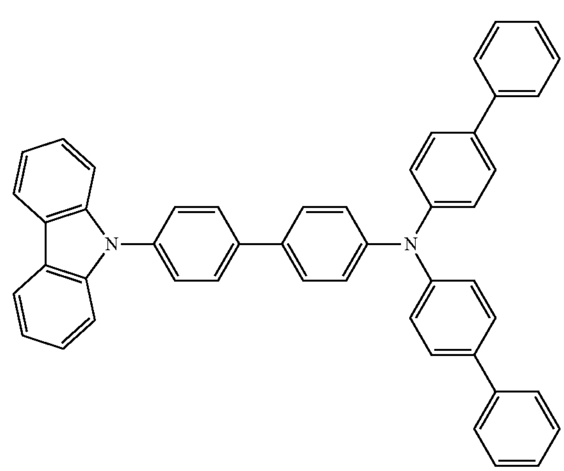

-continued

BH-A

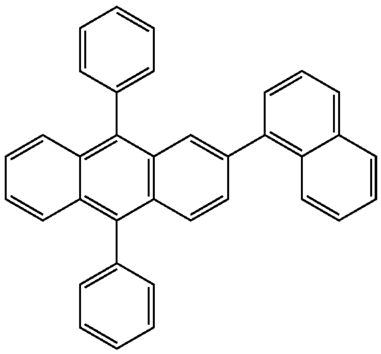

1

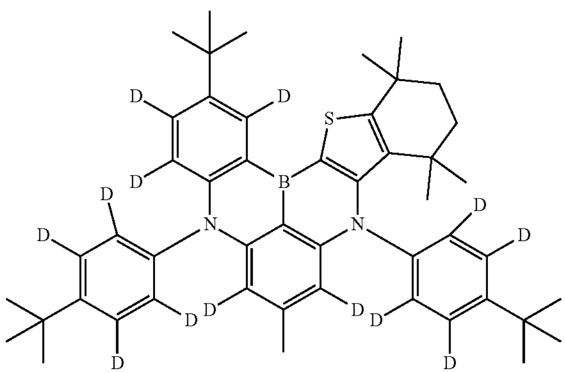

ET-A

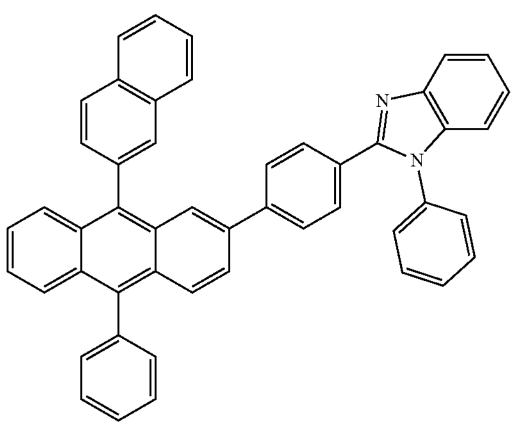

ET-B

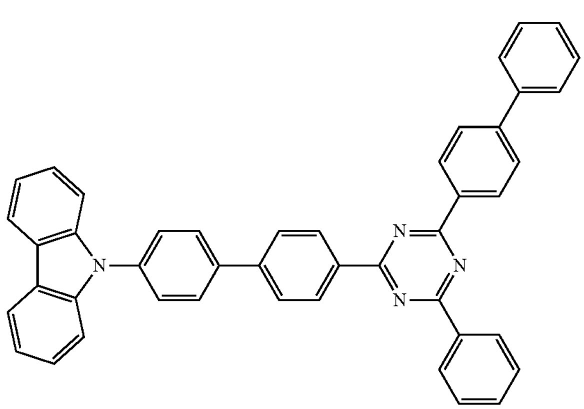

-continued

LiQ

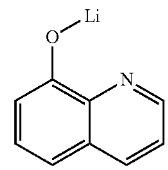

Examples 2 to 22 and Comparative Examples 1 to 3

Organic light emitting devices of Examples 2 to 22 and Comparative Examples 1 to 3 were manufactured in the same manner as in Example 1, except that compounds described in the following Table 5 were used respectively as dopants of the light emitting layer instead of Compound 1 in Example 1.

BD-A

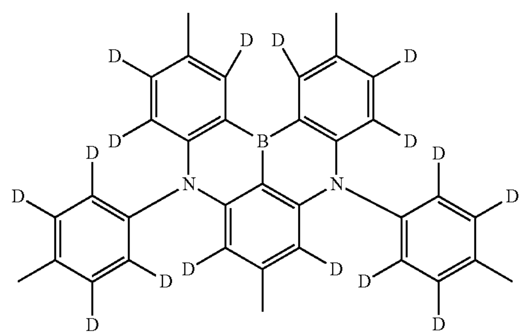

BD-B

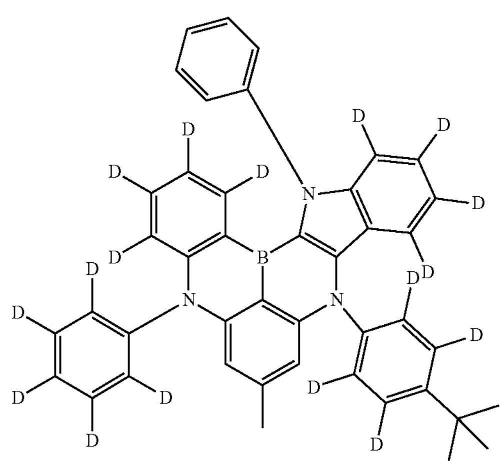

-continued 1-c

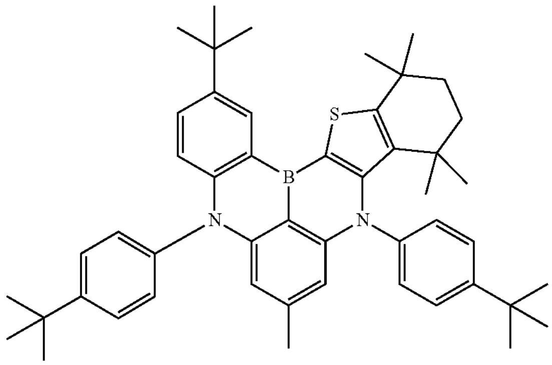

Voltages and efficiencies when a current density of 10 mA/cm$^2$ was applied to the organic light emitting devices in Examples 1 to 22 and Comparative Examples 1 to 3 and service lives (T95) when a current density of 20 mA/cm$^2$ was applied to the devices were measured, and the results are shown in the following Table 1. In this case, LT95 means time taken for the luminance to decrease to 95% when the initial luminance at the current density of 20 mA/cm2 is set to 100%, and the ratio is shown based on Comparative Example 1 (100%).

TABLE 1

| | | 10 mA/cm$^2$ | | |
|---|---|---|---|---|
| Entry | Dopant | Driving voltage (V) | Conversion efficiency (cd/A/y) | 20 mA/cm$^2$ LT95 (%) |
| Example 1 | 1 | 3.82 | 37.1 | 262 |
| Example 2 | 2 | 3.75 | 38.5 | 296 |
| Example 3 | 3 | 3.84 | 38.0 | 378 |
| Example 4 | 4 | 3.72 | 36.7 | 337 |
| Example 5 | 5 | 3.83 | 38.5 | 385 |
| Example 6 | 6 | 3.80 | 36.8 | 311 |
| Example 7 | 7 | 3.85 | 38.4 | 344 |
| Example 8 | 8 | 3.90 | 37.2 | 337 |
| Example 9 | 9 | 3.75 | 37.5 | 272 |
| Example 10 | 10 | 3.85 | 38.3 | 381 |
| Example 11 | 11 | 3.83 | 37.2 | 384 |
| Example 12 | 12 | 3.81 | 37.3 | 283 |
| Example 13 | 13 | 3.85 | 37.0 | 274 |
| Example 14 | 14 | 3.93 | 37.7 | 265 |
| Example 15 | 15 | 3.84 | 38.6 | 351 |
| Example 16 | 16 | 3.74 | 38.2 | 370 |
| Example 17 | 17 | 3.78 | 37.1 | 309 |
| Example 18 | 18 | 3.83 | 38.3 | 320 |
| Example 19 | 19 | 3.81 | 36.6 | 306 |
| Example 20 | 20 | 3.80 | 36.9 | 276 |
| Example 21 | 21 | 3.82 | 38.2 | 319 |
| Example 22 | 22 | 3.78 | 37.5 | 301 |
| Comparative Example 1 | BD-A | 3.83 | 34.8 | 100 |
| Comparative Example 2 | BD-B | 3.82 | 37.1 | 188 |
| Comparative Example 3 | 1-c | 3.82 | 37.1 | 172 |

In Table 1, it can be seen that Examples 1 to 22 including Chemical Formula 1 according to an exemplary embodiment of the present specification, that is, a boron compound including a hetero ring which includes O or S and including deuterium in an organic light emitting device have better efficiencies than Comparative Examples 1 and 2 including a boron compound which does not include a hetero ring including O or S, and exhibit long service life effects, and that Examples 1 to 22 exhibit longer service life effects than Comparative Example 3 including a hetero ring boron compound which does not include deuterium. These long service life effects are shown to be maximized by a carbon-deuterium bond of a hetero ring compound including O or S at the central core of Chemical Formula 1 of the present specification. In addition, the boron compound having a hetero ring including 0 or S of Chemical Formula 1 exhibits a characteristic of having a lower triplet state energy than the boron compound in the related art. Unlike the singlet state which rapidly returns to the ground state by the light emitting process, the triplet state slowly returns to the ground state while eliminating energy by heat or vibration energy, so that there occurs a problem in that the boron compound in the related art deteriorates through intramolecular or intermolecular interaction in a state having a high triplet state energy. Furthermore, a process in which the compound is decomposed by light or electric current is performed while a carbon-hydrogen bond, which is a weak bond in the molecule, is dissociated to form radicals and ions, but the compound of Chemical Formula 1 can effectively prevent the decomposition of the compound by including a stronger carbon-deuterium bond.

The invention claimed is:

1. A compound of any one of the following Chemical Formulae 1-3 to 1-26:

<Chemical Formula 1-3>

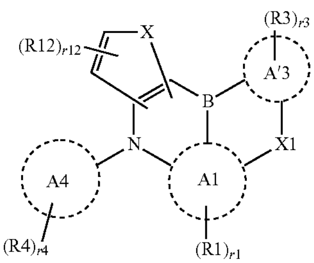

<Chemical Formula 1-4>

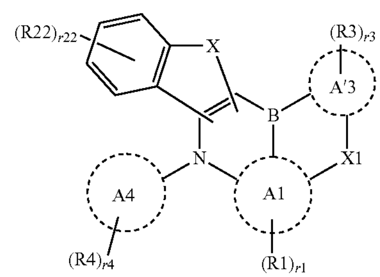

<Chemical Formula 1-5>

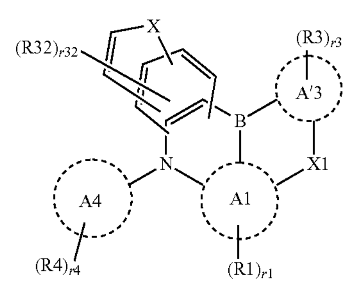

-continued
<Chemical Formula 1-6>
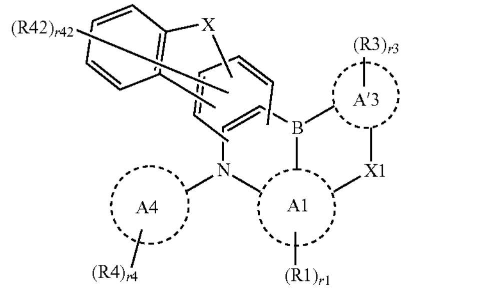
<Chemical Formula 1-7>
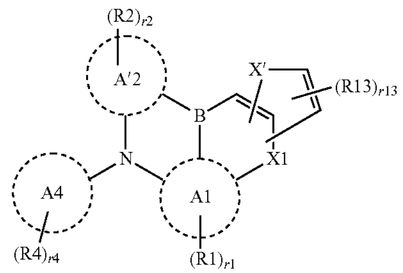
<Chemical Formula 1-8>
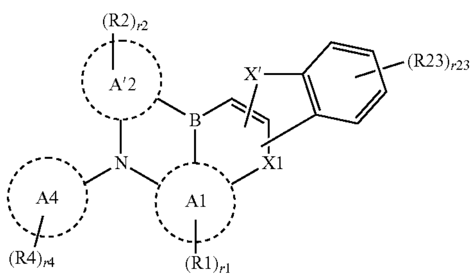
<Chemical Formula 1-9>
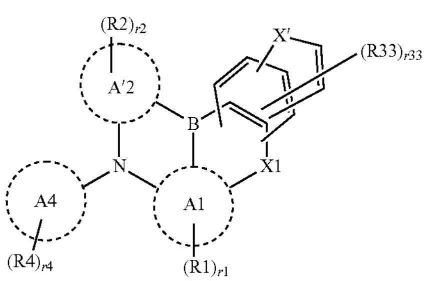
<Chemical Formula 1-10>
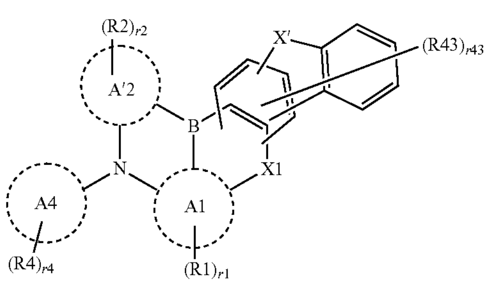
-continued
<Chemical Formula 1-11>
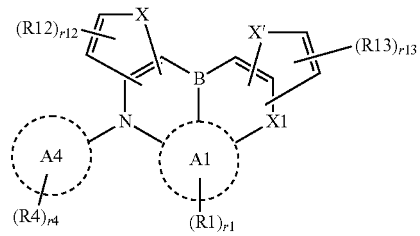
<Chemical Formula 1-12>
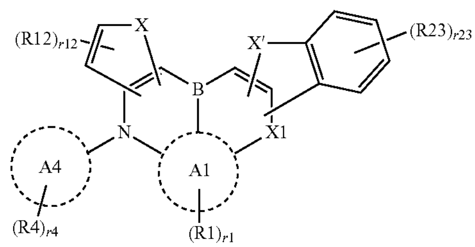
<Chemical Formula 1-13>
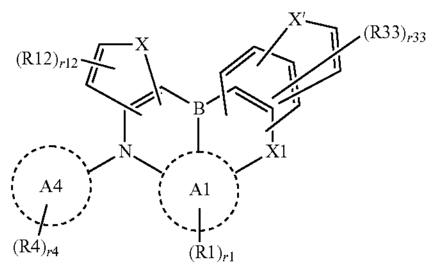
<Chemical Formula 1-14>
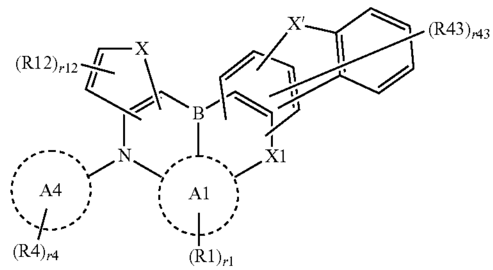
<Chemical Formula 1-15>
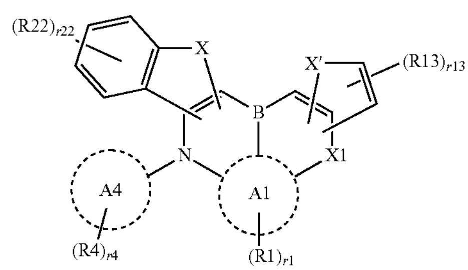

-continued
<Chemical Formula 1-16>
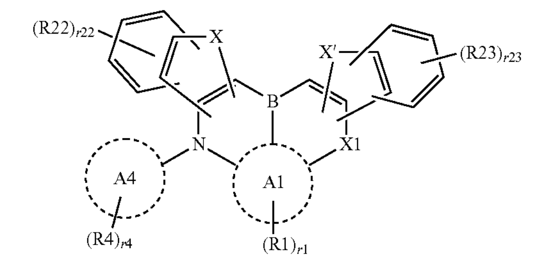
<Chemical Formula 1-17>
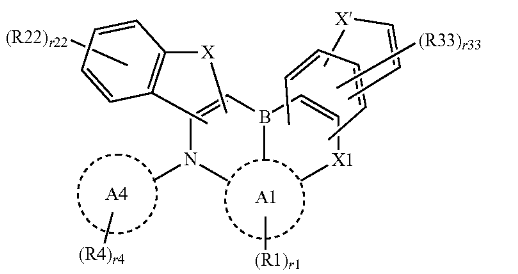
<Chemical Formula 1-18>
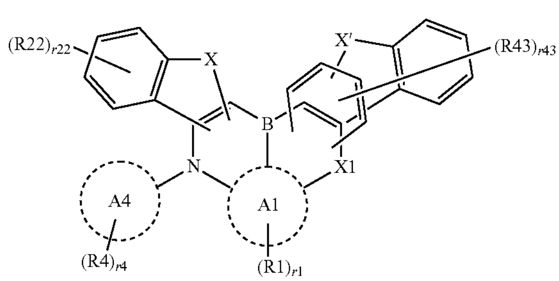
<Chemical Formula 1-19>
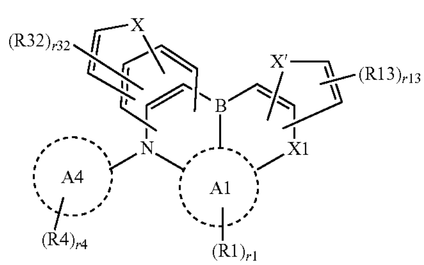
<Chemical Formula 1-20>
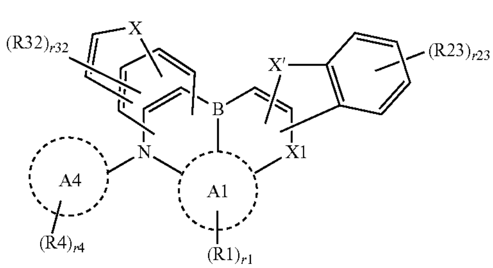
-continued
<Chemical Formula 1-21>
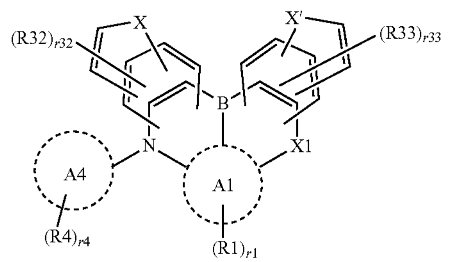
<Chemical Formula 1-22>
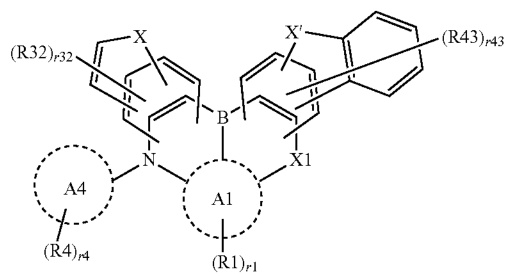
<Chemical Formula 1-23>
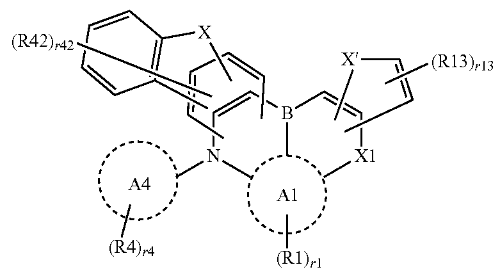
<Chemical Formula 1-24>
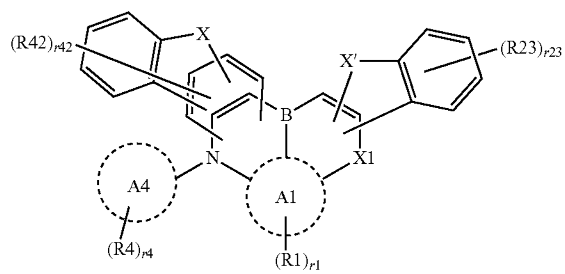
<Chemical Formula 1-25>
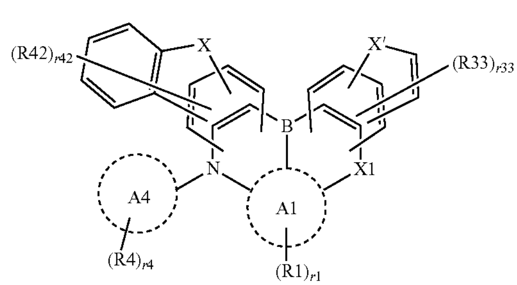

-continued

<Chemical Formula 1-26>

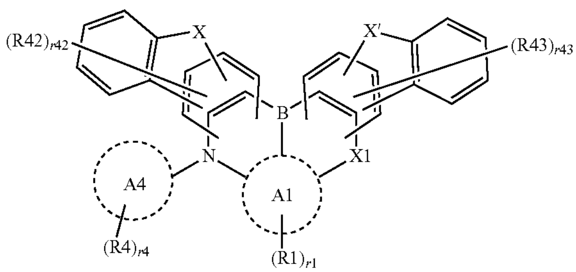

wherein in Chemical Formulae 1-3 to 1-26:

X1 is O;

A1 is an aromatic hydrocarbon ring or a hetero ring;

at least one of A2 and A3 is a hetero ring comprising S or O, and the other is an aromatic hydrocarbon ring;

when each of A2 and A3 is a hetero ring comprising S or O, A2 and A3 are the same as or different from each other;

A4 is an alkyl group, a cycloalkyl group, an aryl group, or a heterocyclic group;

adjacent two or more of A1 to A4 are optionally bonded to each other to form a substituted or unsubstituted ring;

R1 is a substituted or unsubstituted alkyl group, a substituted or unsubstituted heterocyclic group, or a group of the following Chemical Formula 2, or is bonded to an adjacent group to form a substituted or unsubstituted ring;

R2 to R4 are the same as or different from each other, and are each independently hydrogen, deuterium, a halogen group, a cyano group; a substituted or unsubstituted alkyl group, a substituted or unsubstituted aryloxy group, a substituted or unsubstituted alkoxy group, a substituted or unsubstituted alkylthioxy group, a substituted or unsubstituted arylthioxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, a substituted or unsubstituted heterocyclic group, or a group of the following Chemical Formula 2, or adjacent groups are bonded to each other to form a substituted or unsubstituted ring;

r1 to r4 are each an integer from 1 to 15;

when r1 to r4 are each 2 to 15, two or more substituents in the parentheses are the same as or different from each other;

R12, R13, R22, R23, R32, R33, R42, and R43 are the same as each other, and are each independently hydrogen, deuterium, a halogen group, a cyano group, a substituted or unsubstituted alkyl group, a substituted or unsubstituted alkoxy group, a substituted or unsubstituted aryloxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted heterocyclic group, or the group of Chemical Formula 2, or adjacent groups are bonded to each other to form a substituted or unsubstituted ring;

r12 and r13 are each 1 or 2;

r22, r23, r32, and r33 are each an integer from 1 to 4;

r42 and r43 are each an integer from 1 to 6;

when r12 and r13 are each 2, two structures in the parentheses are the same as or different from each other;

when r22, r23, r32, r33, r42, and r43 are each 2 or higher, two or more structures in the parentheses are the same as or different from each other;

X and X' are the same as or different from each other, and are each independently O or S;

A'2 and A'3 are the same as or different from each other, and are each independently an aromatic hydrocarbon ring;

<Chemical Formula 2>

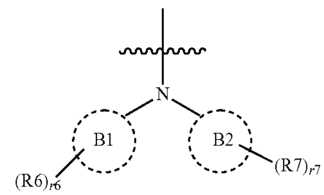

wherein in Chemical Formula 2:

B1 and B2 are the same as or different from each other, and are each independently an alkyl group, a cycloalkyl group, an aryl group, or a heterocyclic group;

R6 and R7 are the same as or different from each other, and are each independently hydrogen, deuterium, a halogen group, a cyano group, a substituted or unsubstituted alkyl group, a substituted or unsubstituted alkoxy group, a substituted or unsubstituted aryloxy group, a substituted or unsubstituted haloalkoxy group, a substituted or unsubstituted alkenyl group, a substituted or unsubstituted silyl group, a substituted or unsubstituted arylalkyl group, a substituted or unsubstituted boron group, a substituted or unsubstituted aryl group, or a substituted or unsubstituted heterocyclic group, or adjacent groups are bonded to each other to form a substituted or unsubstituted ring;

r6 and r7 are each an integer from 1 to 10;

when r6 and r7 are each 2 to 10, two or more substituents in the parentheses are the same as or different from each other; and at least one hydrogen at a substitutable position of any one of the Chemical Formulae 1-3 to 1-26 is substituted with deuterium.

2. The compound of claim 1, wherein A1 is a benzene ring.

3. The compound of claim 1, wherein R1 is a straight-chained or branched alkyl group having 1 to 30 carbon atoms, which is unsubstituted or substituted with deuterium; a straight-chained or branched haloalkyl group having 1 to 30 carbon atoms; a monocyclic or polycyclic cycloalkyl group having 3 to 30 carbon atoms; a polycyclic heterocyclic group having 2 to 30 carbon atoms, which is substituted or unsubstituted and comprises N; or the group of Chemical Formula 2.

4. The compound of claim 1, wherein R2 to R4, R6, and R7 are the same as or different from each other, and are each independently hydrogen, deuterium, a halogen group, a cyano group, a straight-chained or branched alkyl group having 1 to 30 carbon atoms, a monocyclic or polycyclic cycloalkyl group having 3 to 30 carbon atoms, a straight-chained or branched alkylsilyl group having 1 to 30 carbon atoms, a monocyclic or polycyclic arylsilyl group having 6 to 30 carbon atoms, a monocyclic or polycyclic aryl group having 6 to 30 carbon atoms, a straight-chained or branched arylalkyl group having 6 to 30 carbon atoms, a monocyclic or polycyclic heterocyclic group having 2 to 30 carbon atoms, and the substituent is substituted with one or more selected from the group consisting of deuterium, a halogen group, a straight-chained or branched alkyl group having 1 to 30 carbon atoms, which is unsubstituted or substituted with deuterium, and a straight-chained or branched haloalkyl group having 1 to 30 carbon atoms.

5. The compound of claim 1, wherein any one or more of adjacent two of R2s, adjacent two of R3s, adjacent two of R4s, adjacent two of R6s, and adjacent two of R7s are bonded to each other to form a substituted or unsubstituted monocyclic or polycyclic hydrocarbon ring having 3 to 30 carbon atoms, or a substituted or unsubstituted monocyclic or polycyclic hetero ring having 2 to 30 carbon atoms.

6. The compound of claim 1, wherein at least one of RI to R4, R6, and R7 is a polycyclic hetero ring having 2 to 30 carbon atoms, which is substituted or unsubstituted and comprises N.

7. Any one compound selected from among the following compounds:

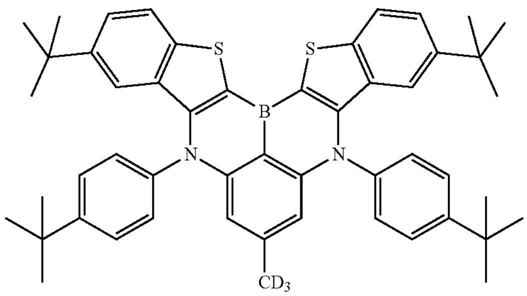

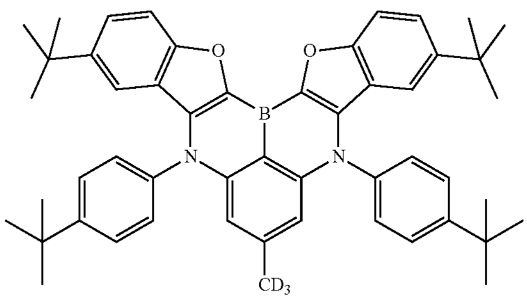

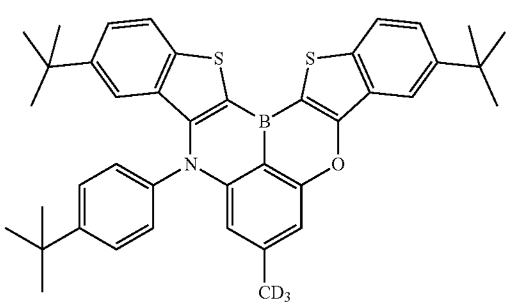

-continued

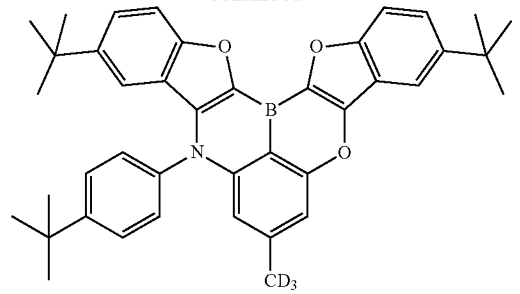

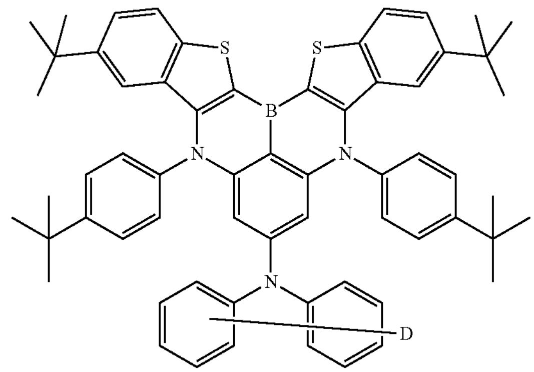

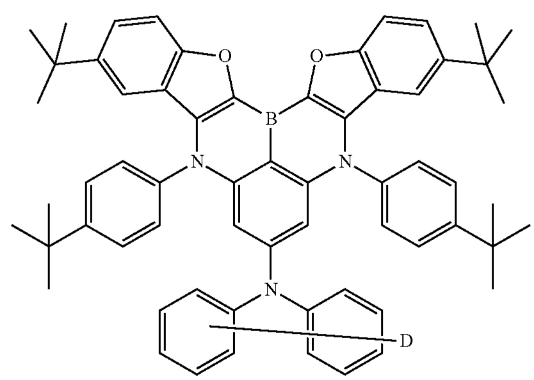

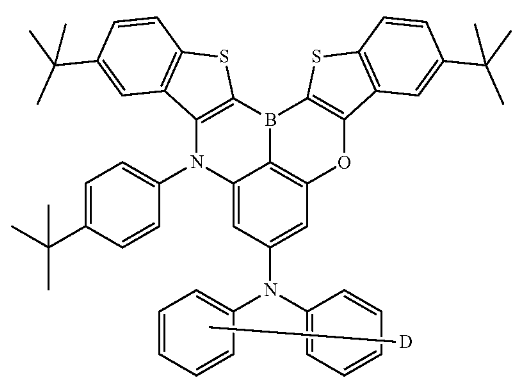

-continued
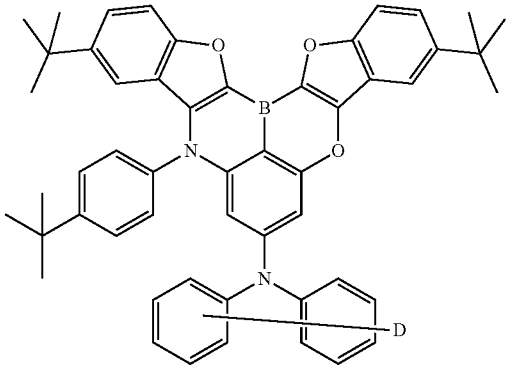
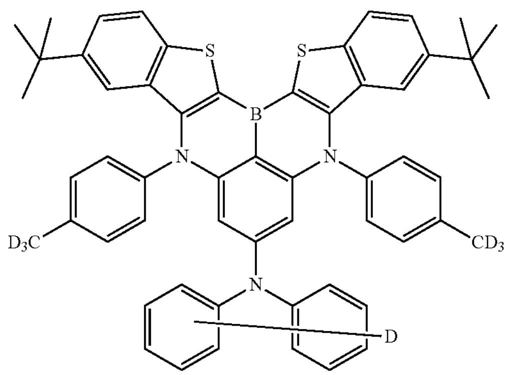
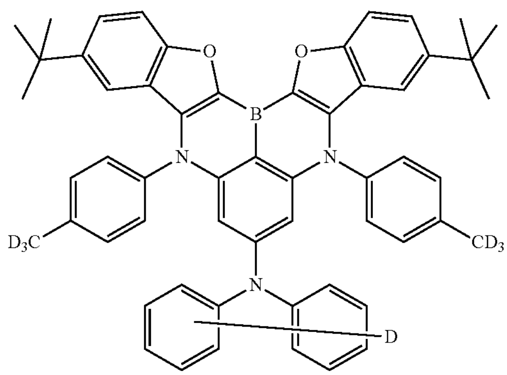
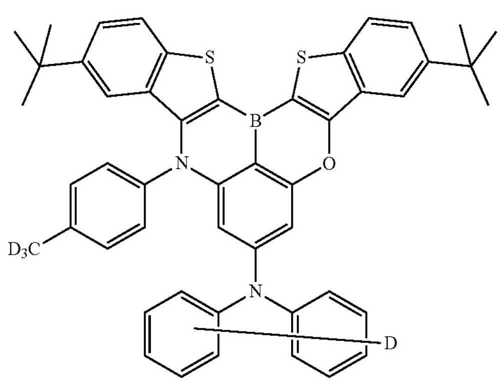
-continued
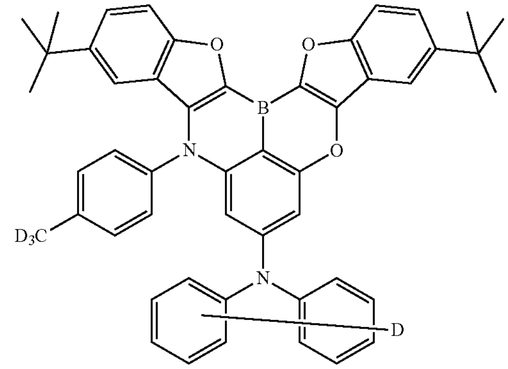
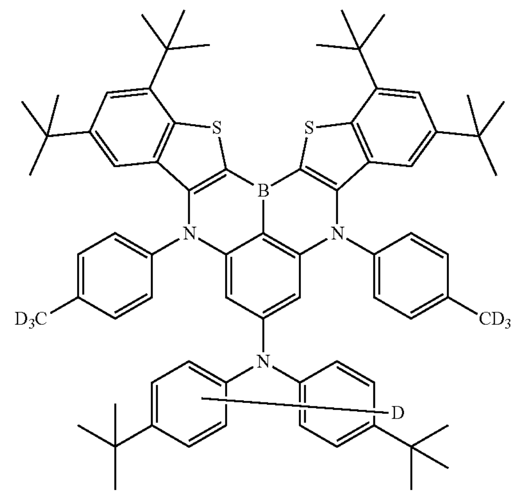
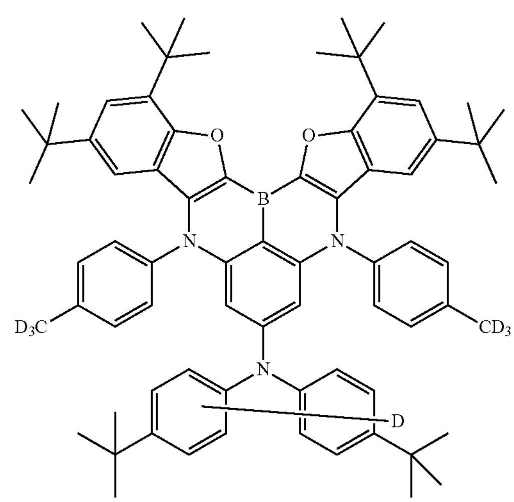

-continued
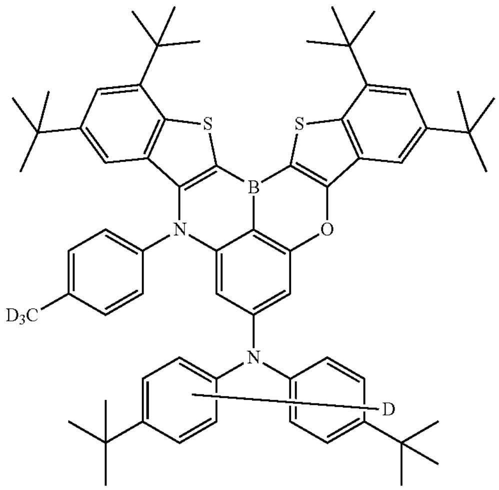
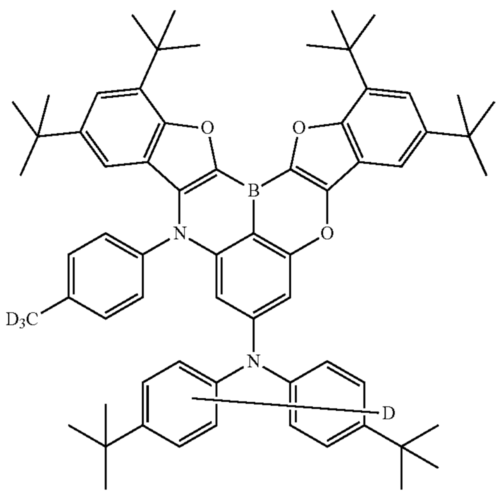
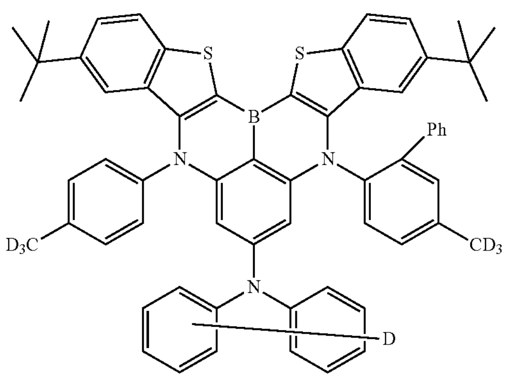
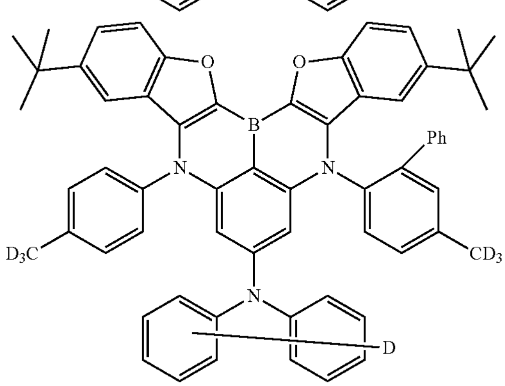
-continued
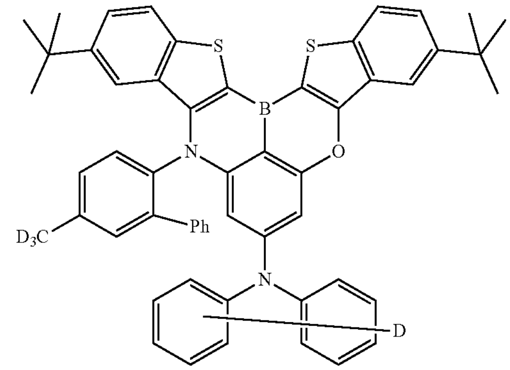
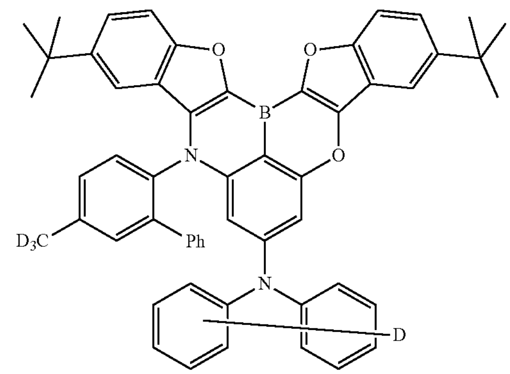
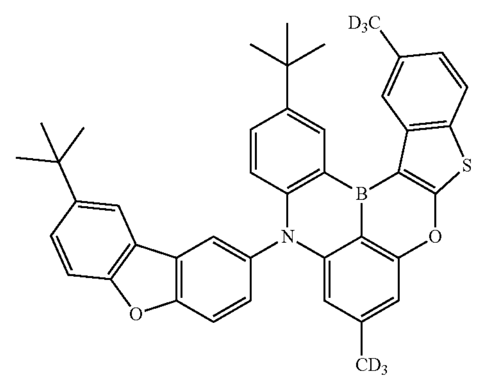
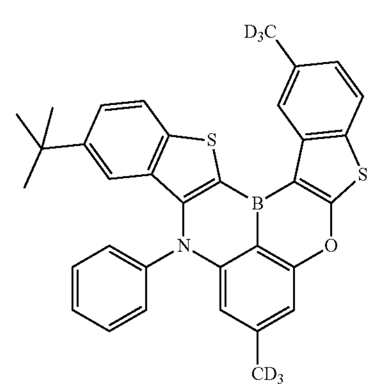

-continued
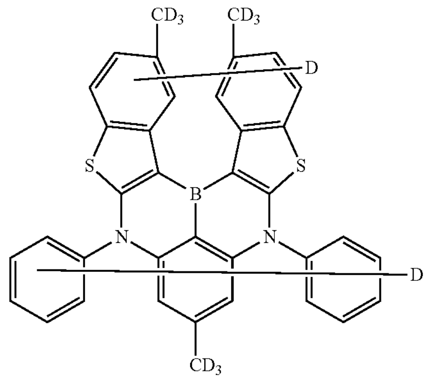
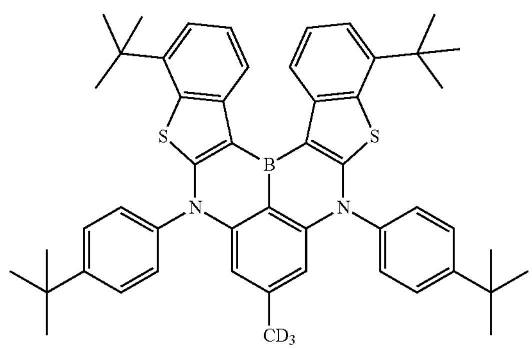
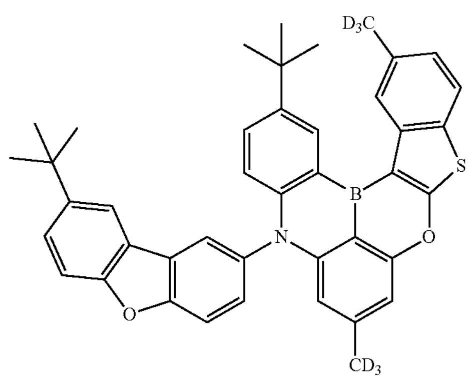
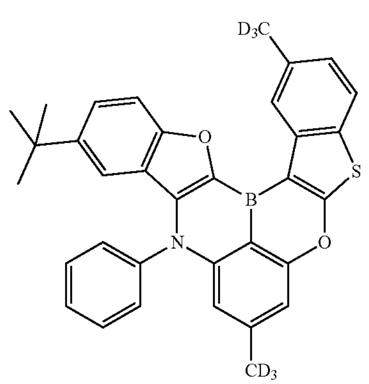
-continued
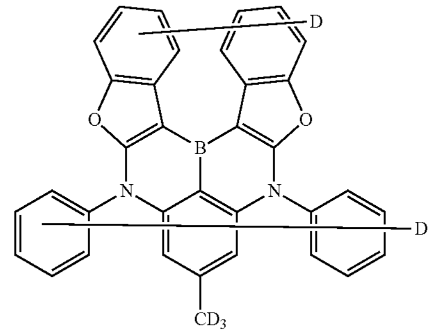
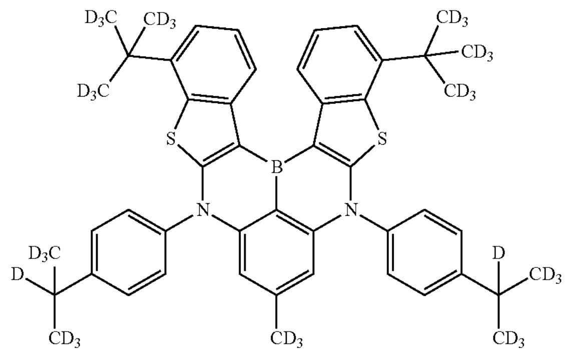
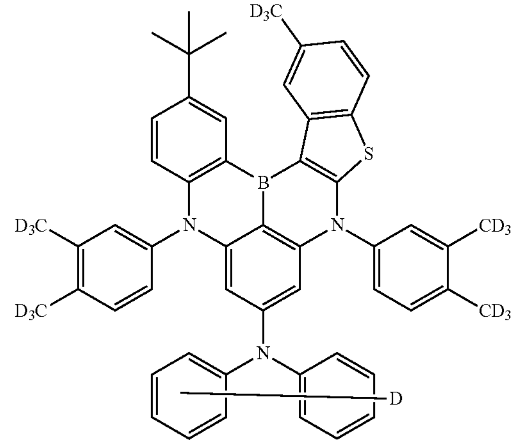
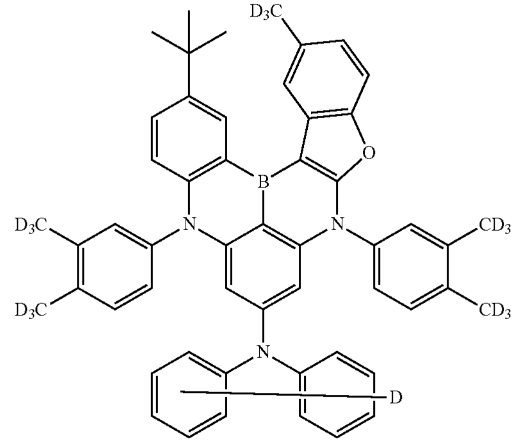

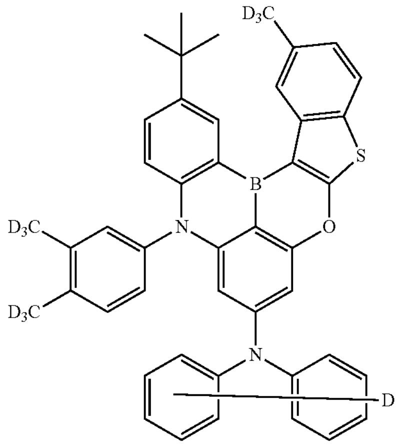
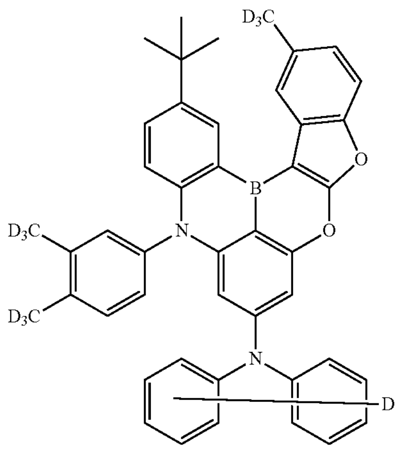
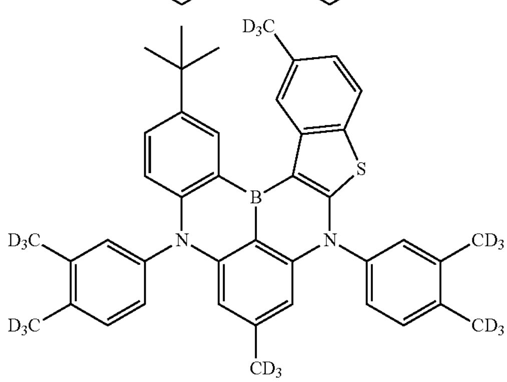
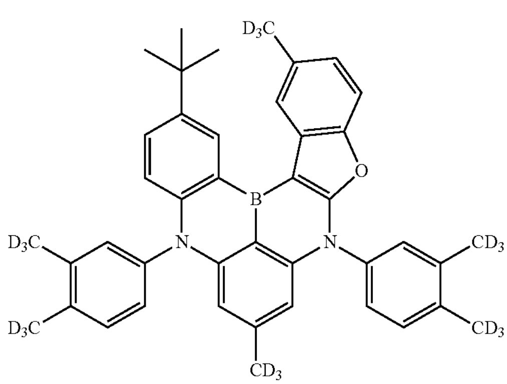
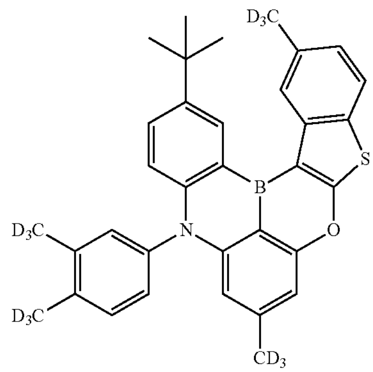
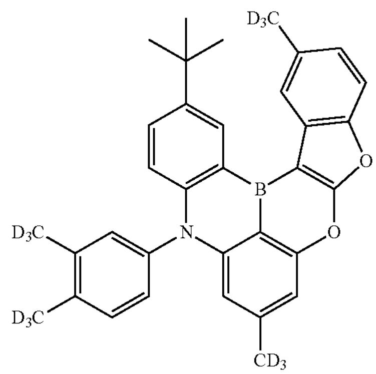
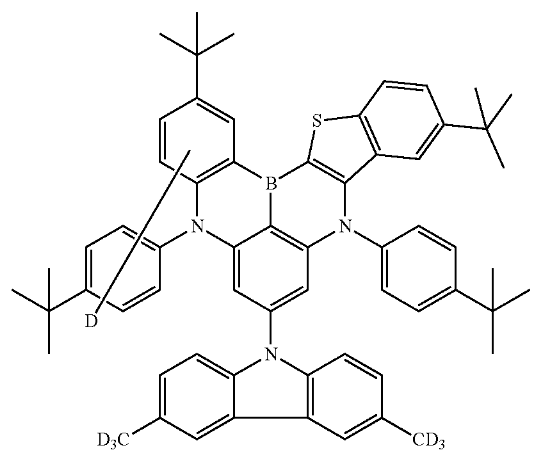
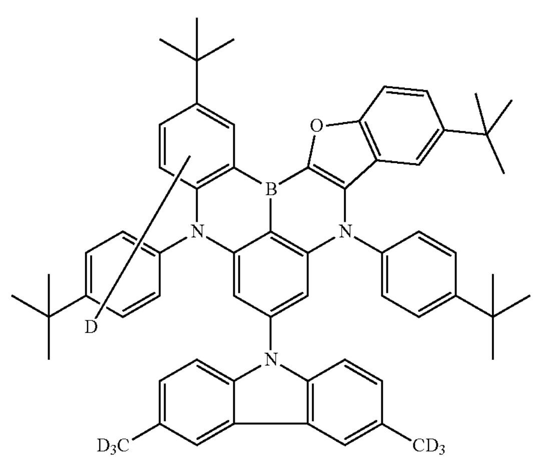

-continued
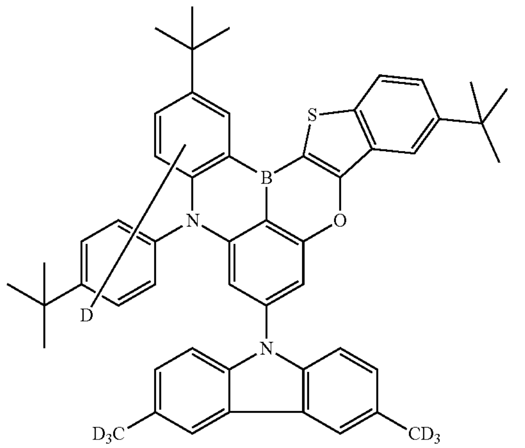
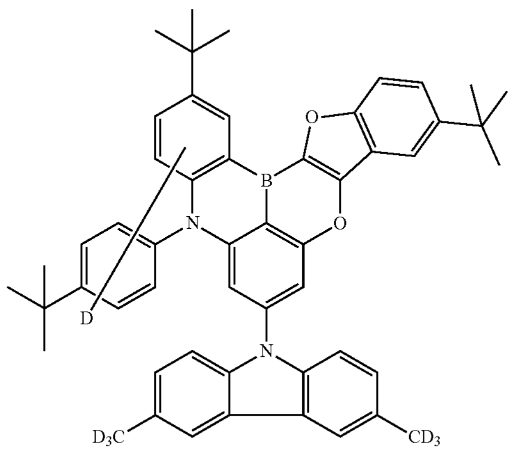
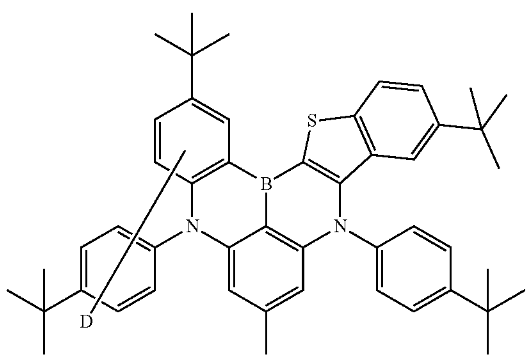
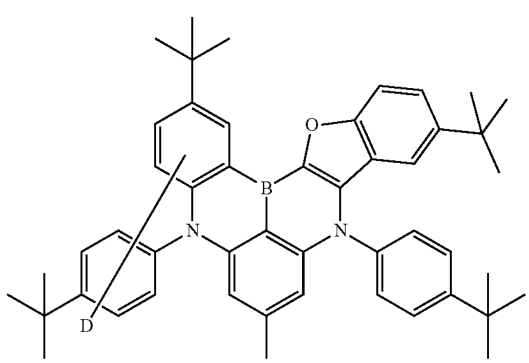
-continued
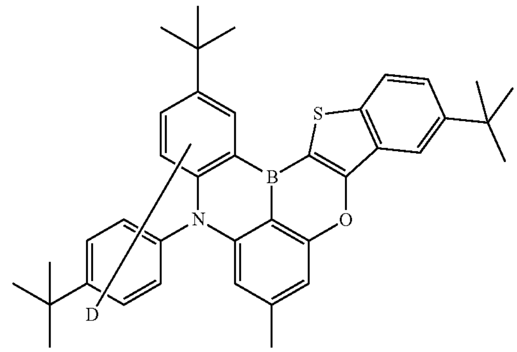
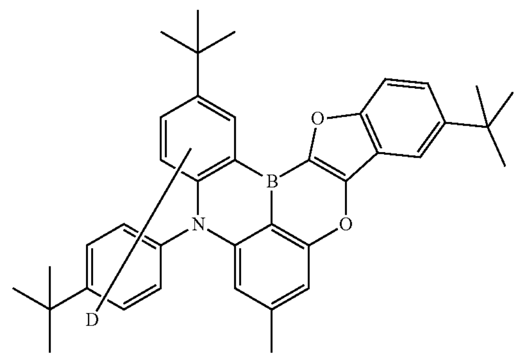
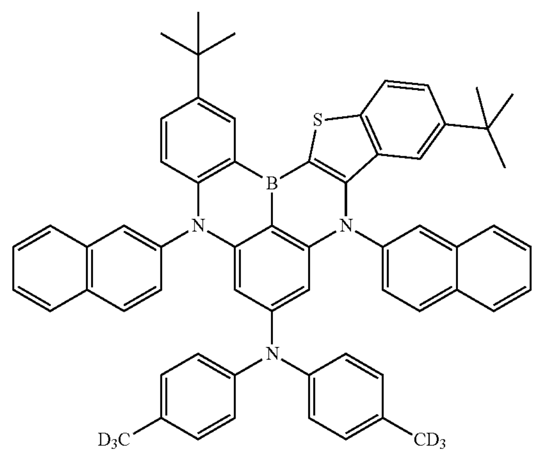
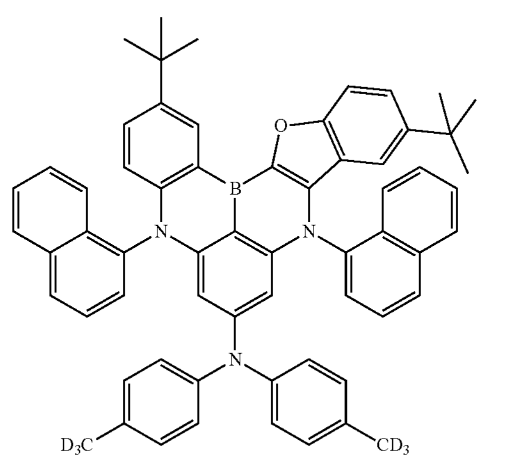

-continued
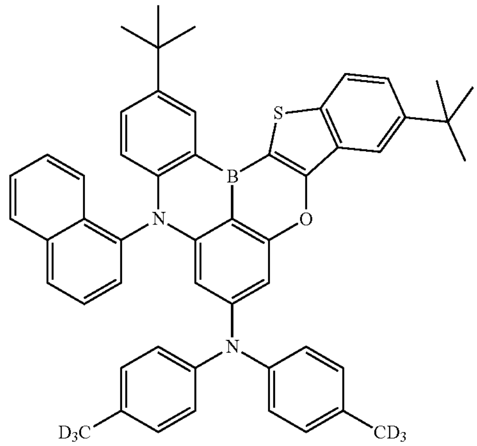
-continued
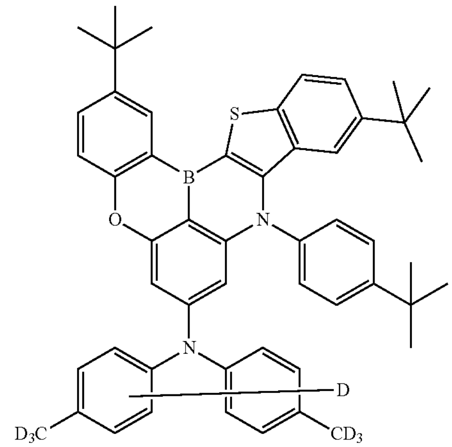
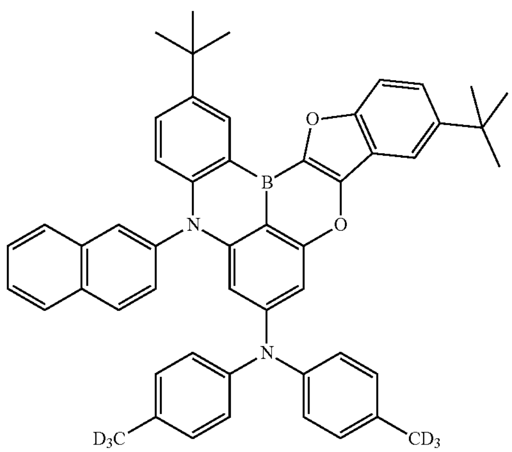
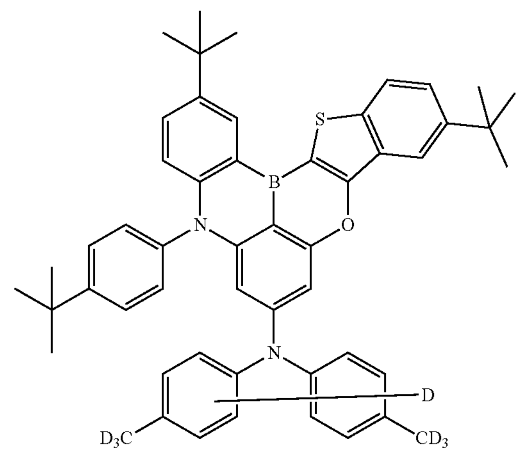
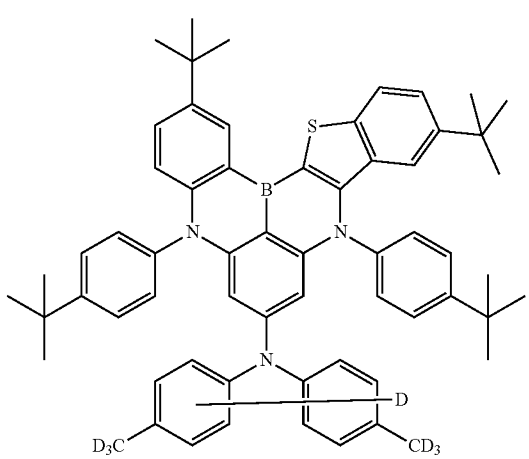
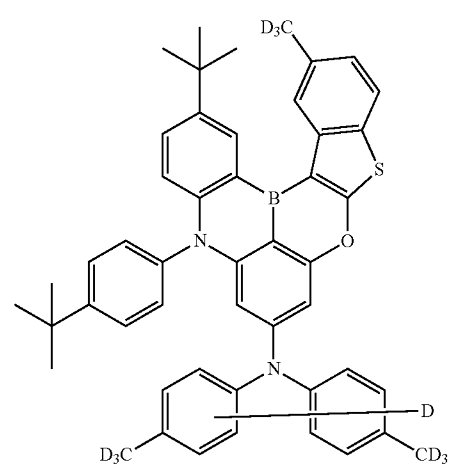

-continued
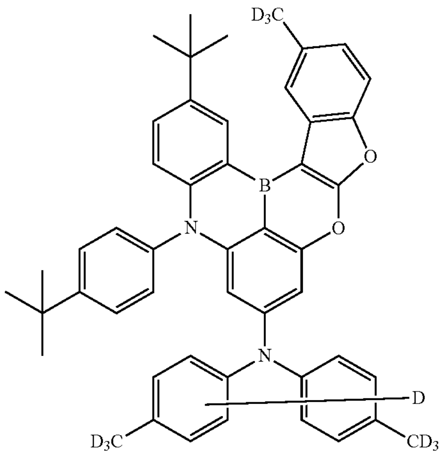
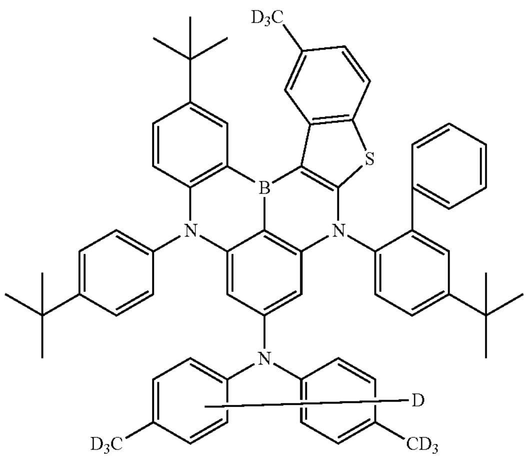
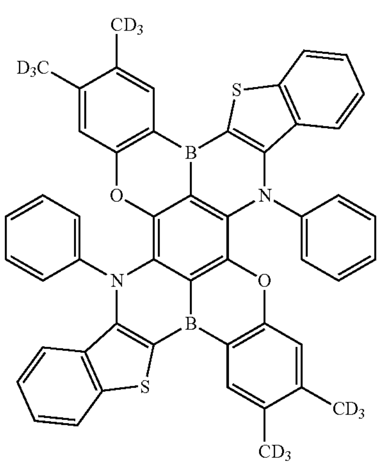
-continued
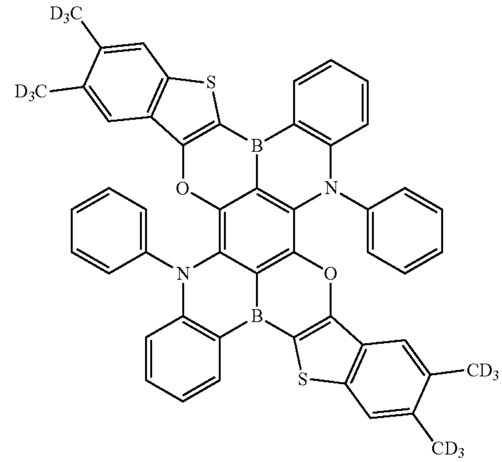
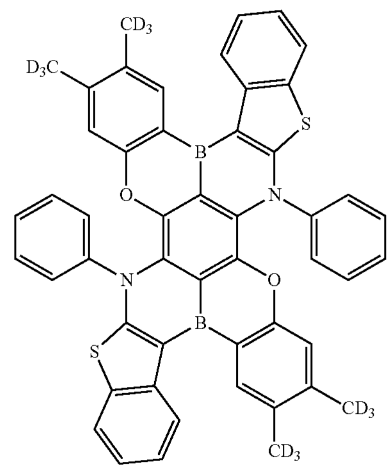
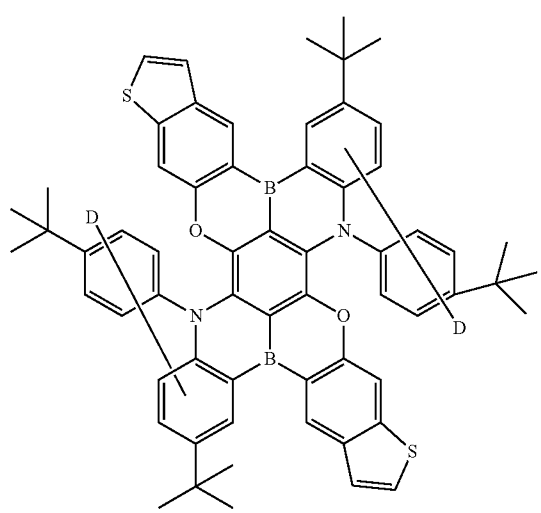

-continued
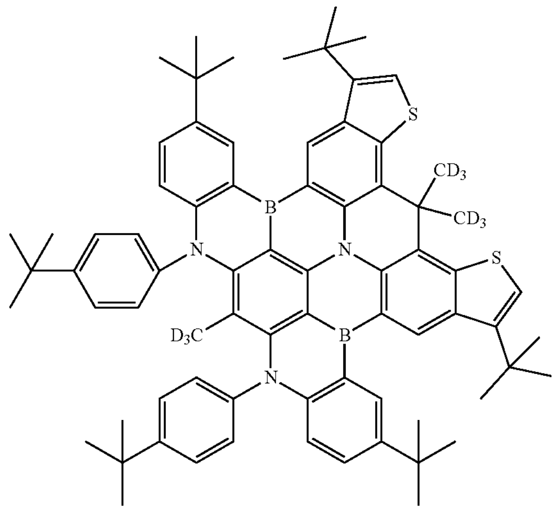
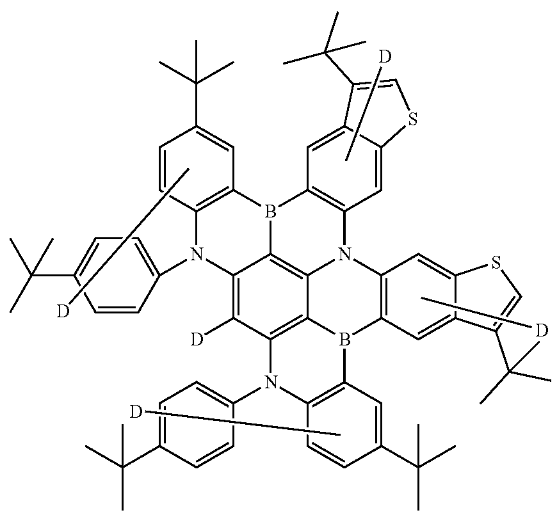
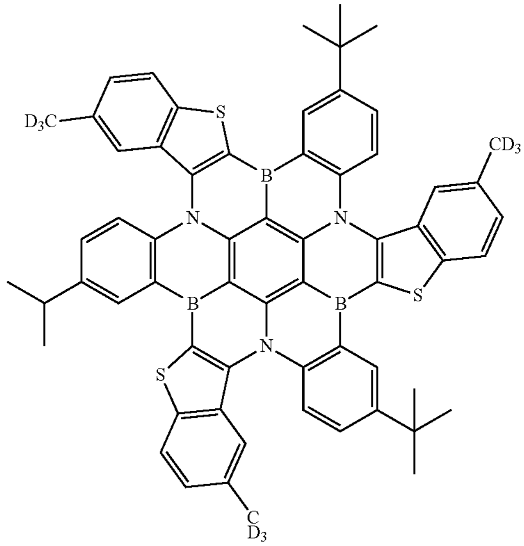
-continued
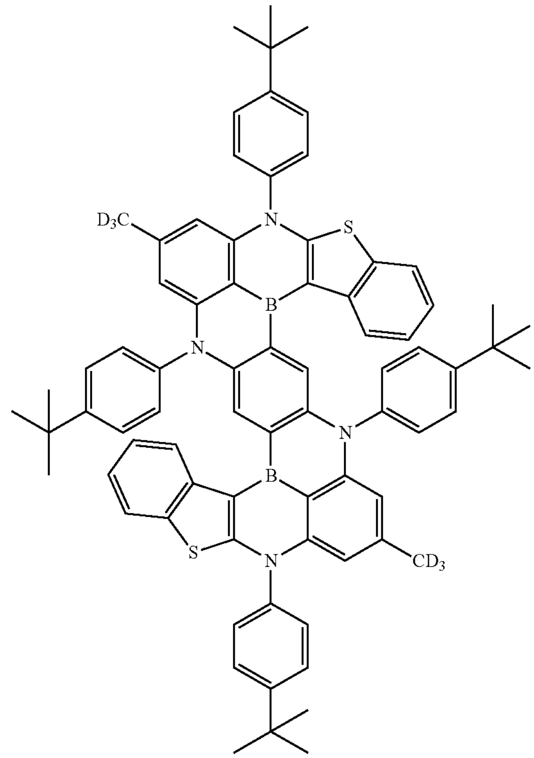
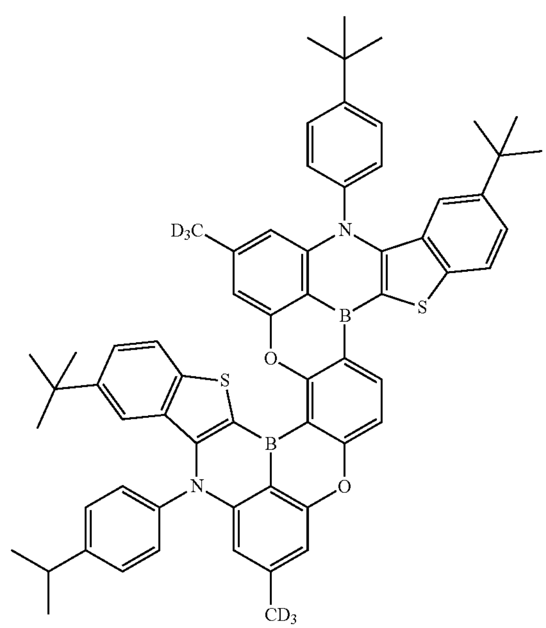

-continued
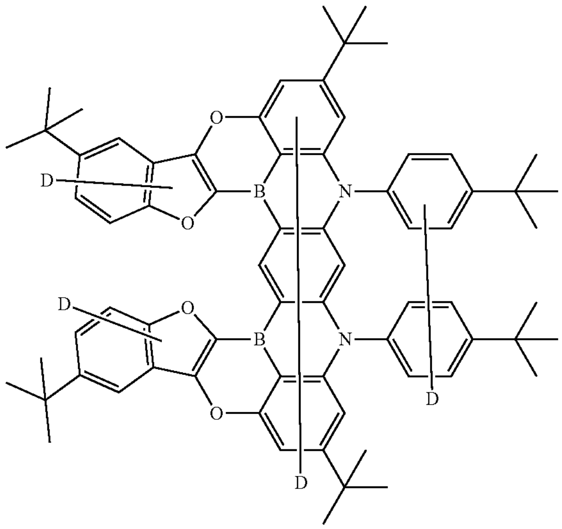
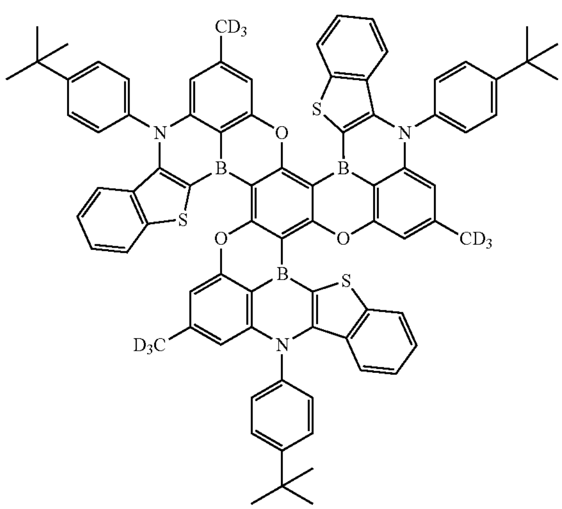
-continued
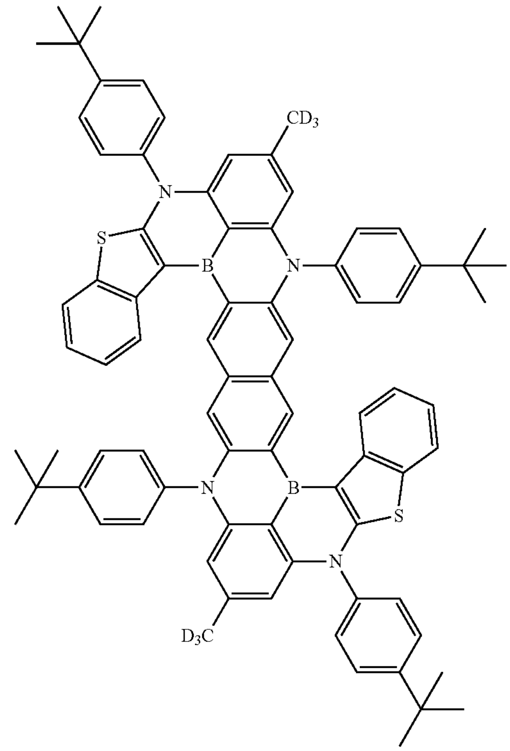
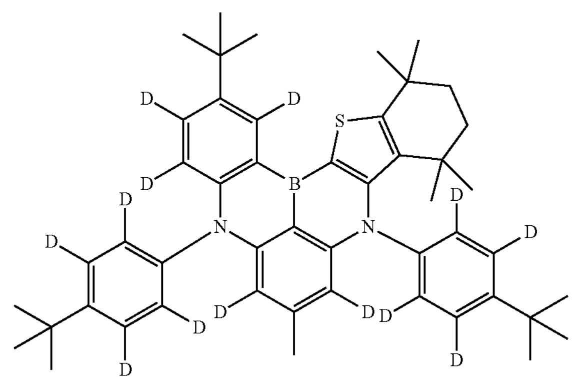
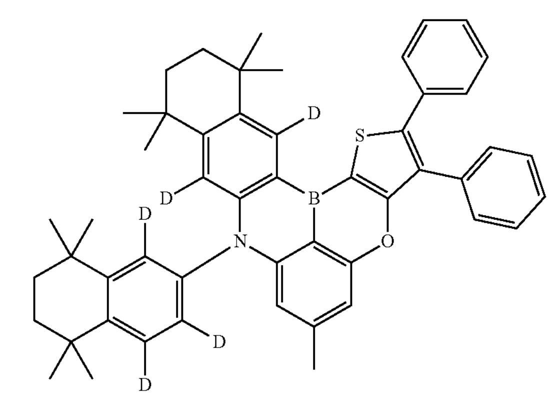

-continued
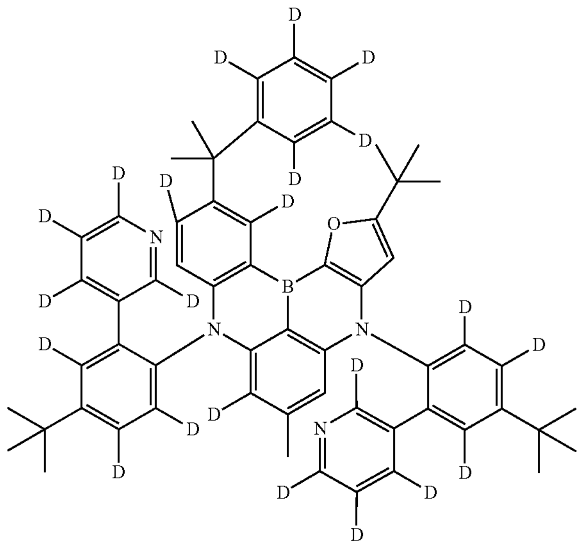
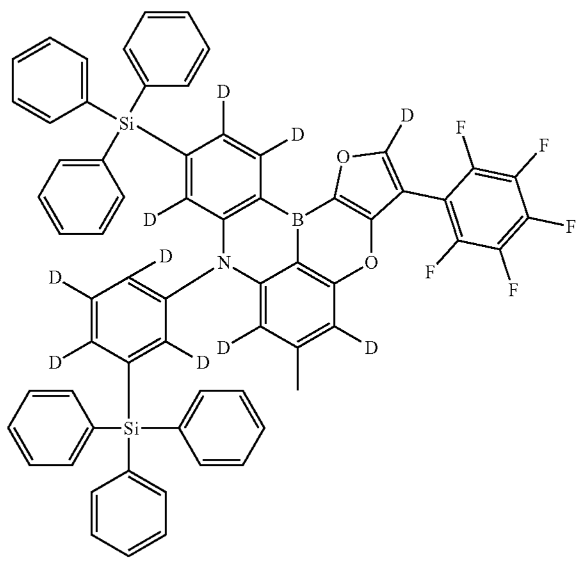
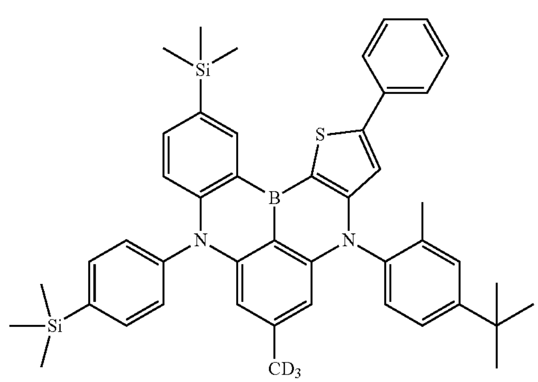
-continued
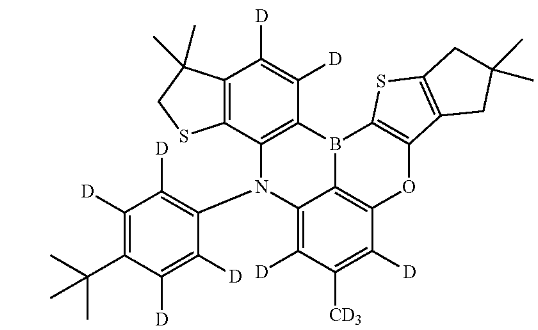
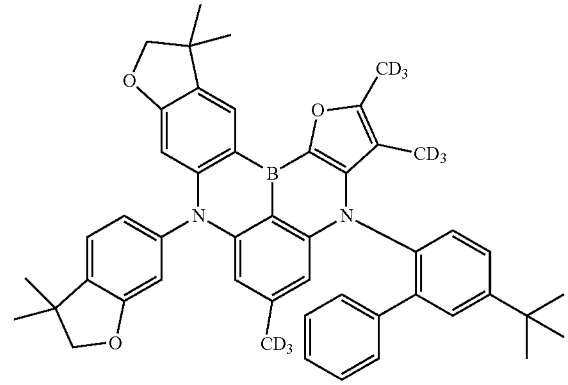
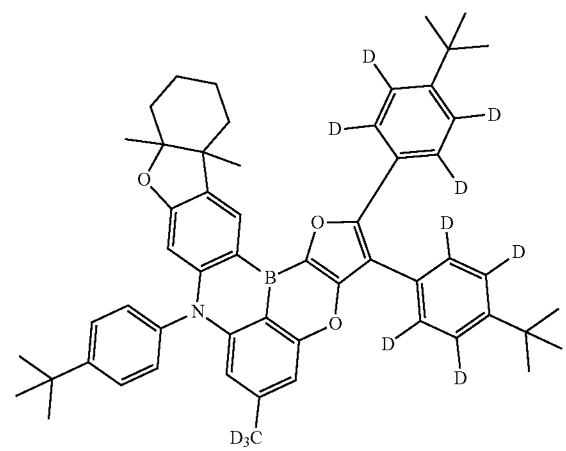
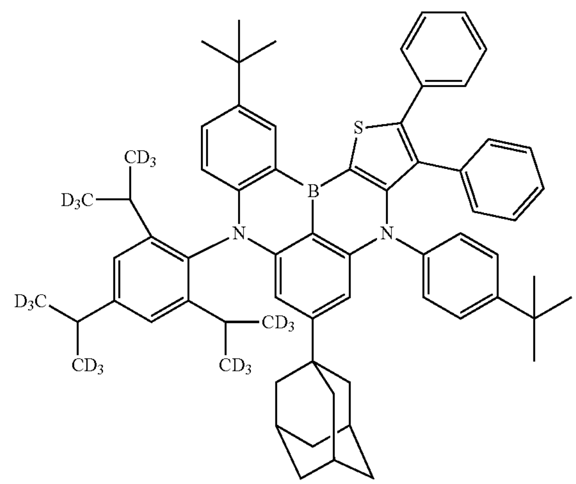

-continued
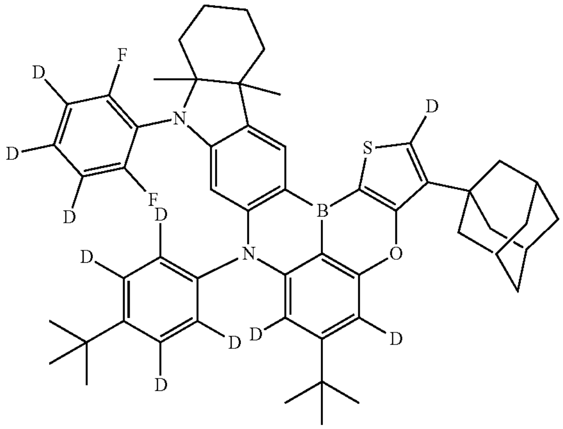
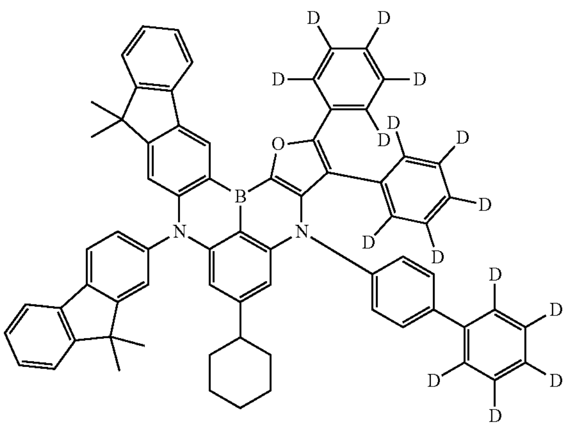
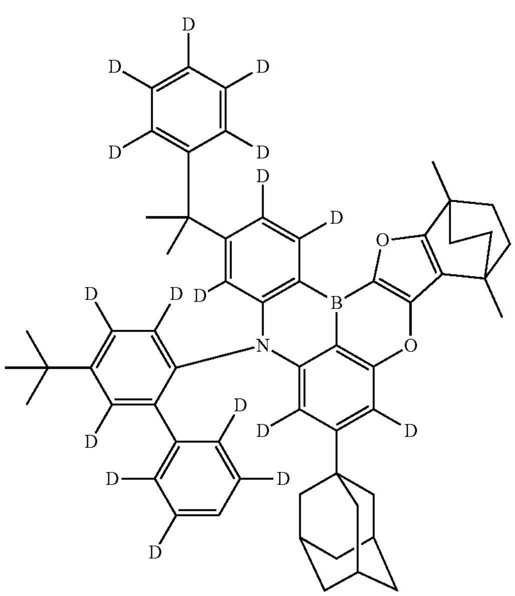
-continued
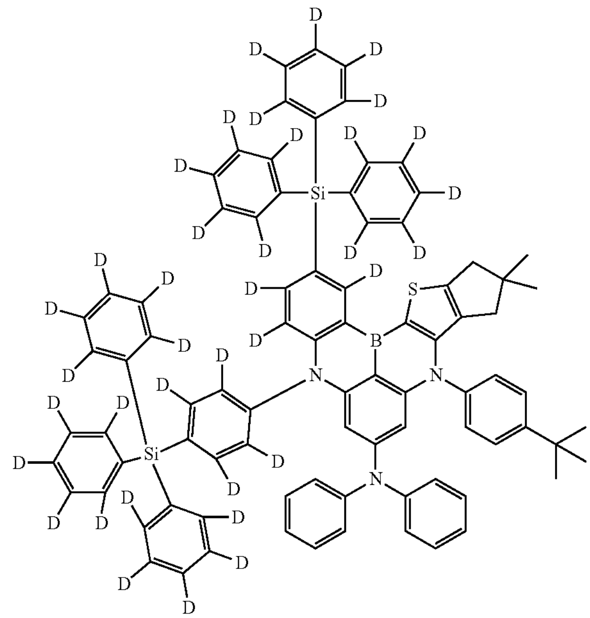
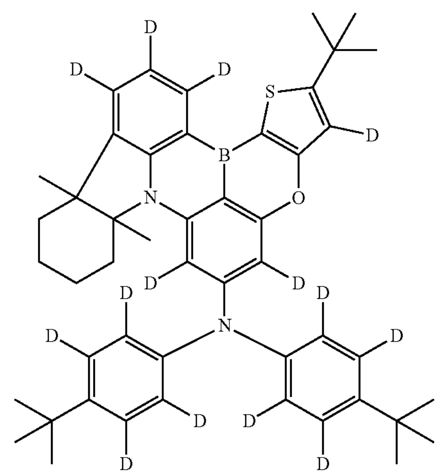
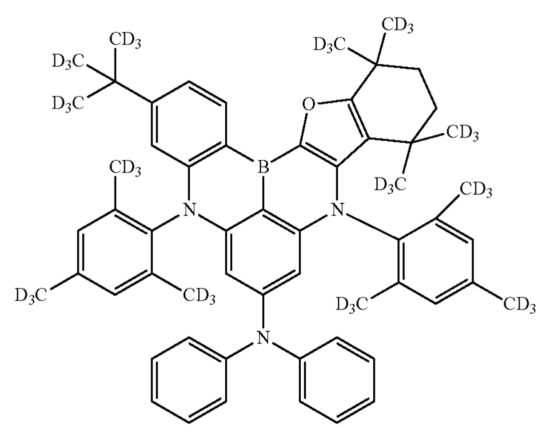

-continued
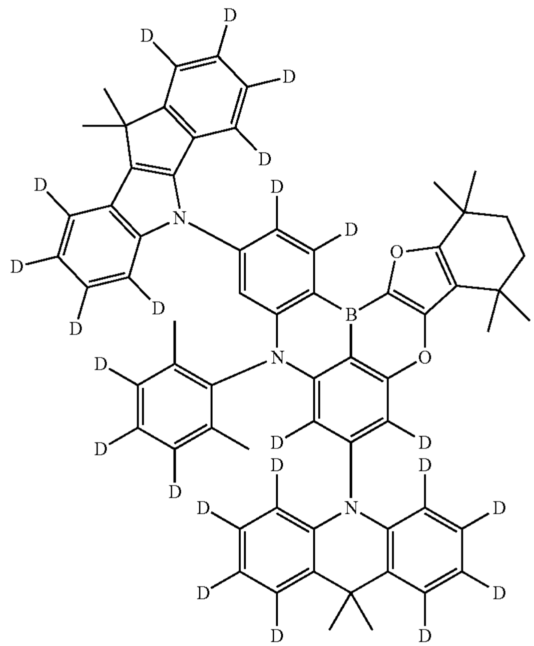
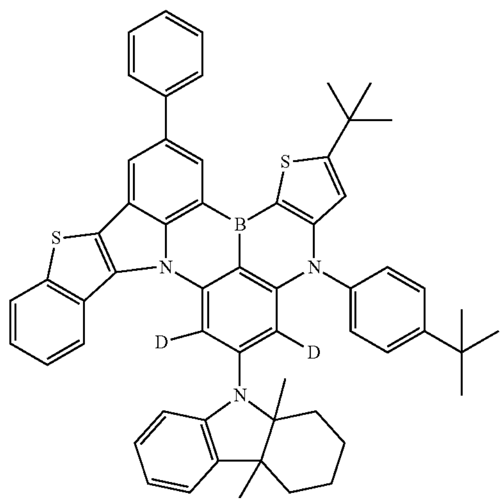
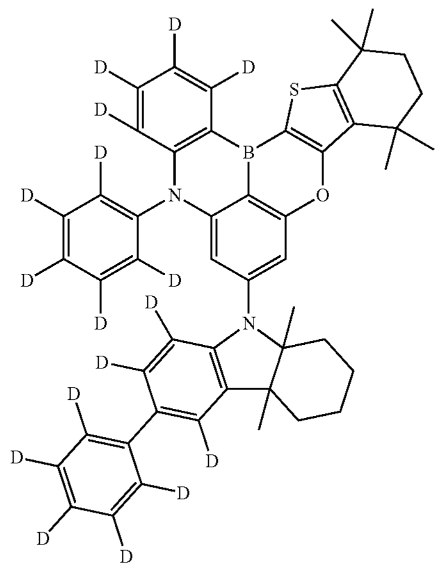
-continued
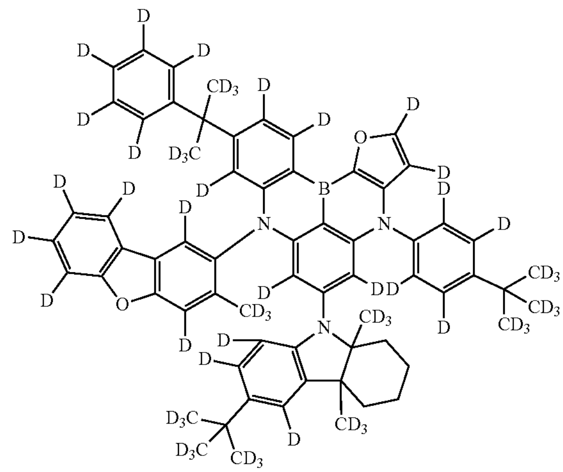
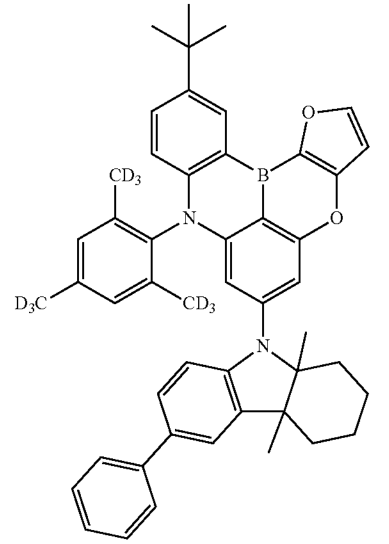
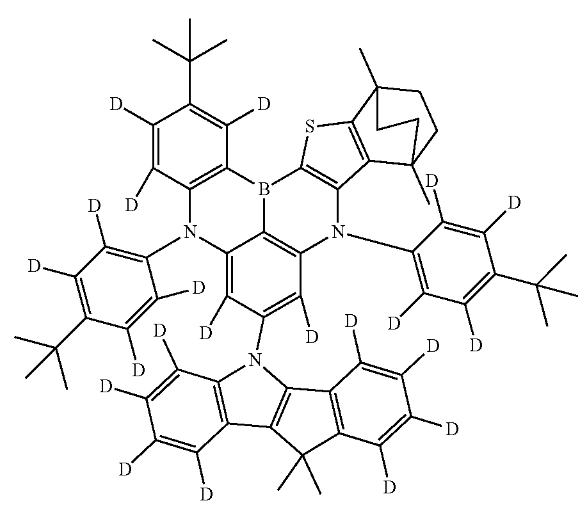

-continued
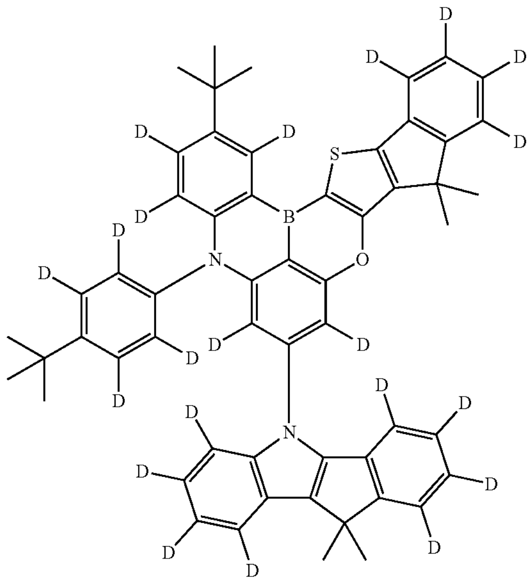
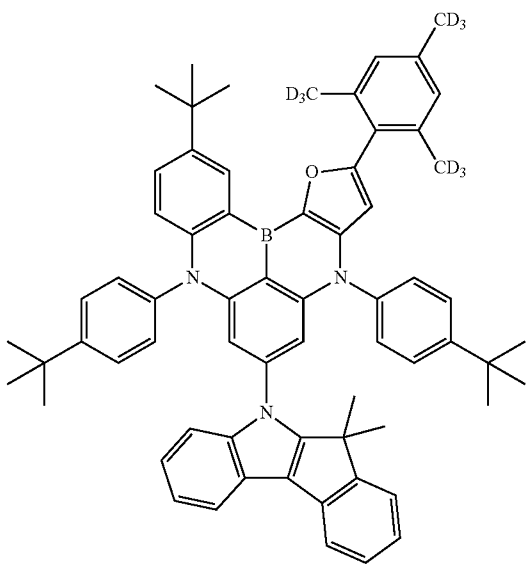
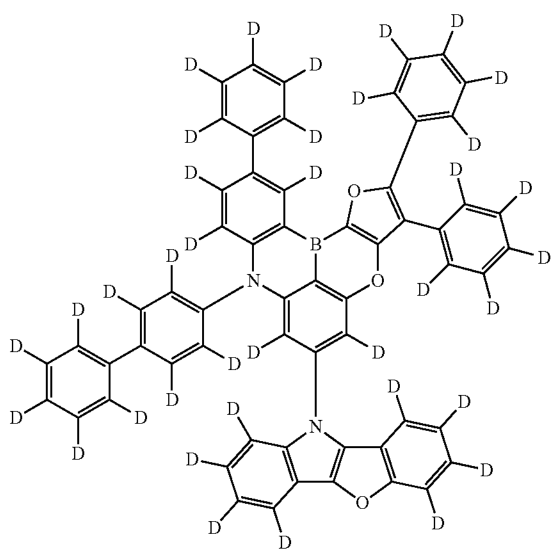
-continued
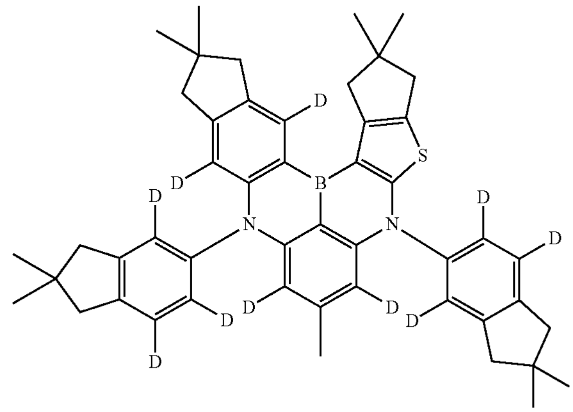
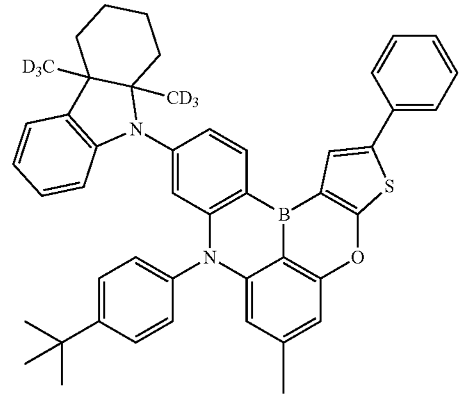
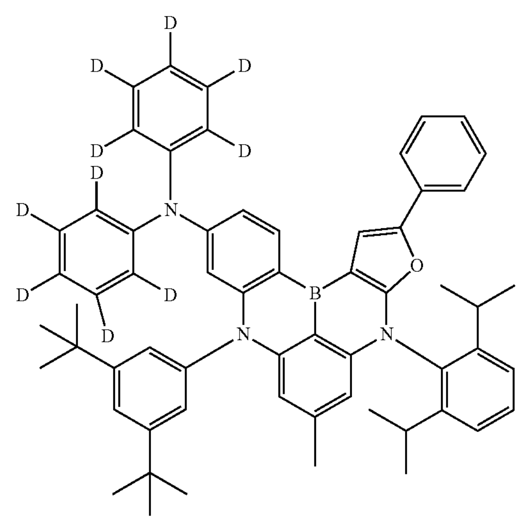

-continued
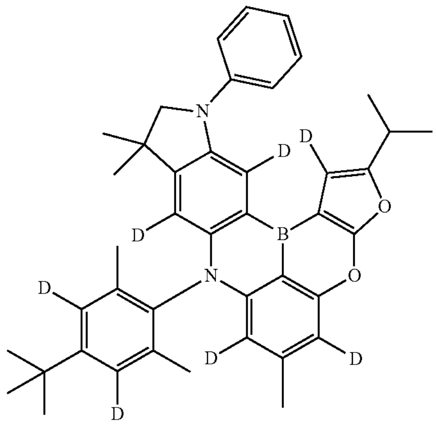
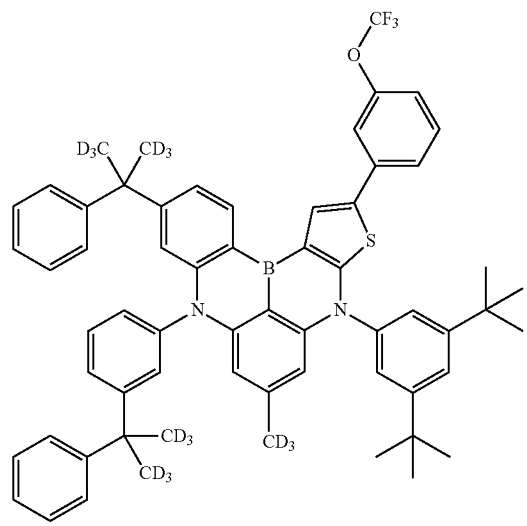
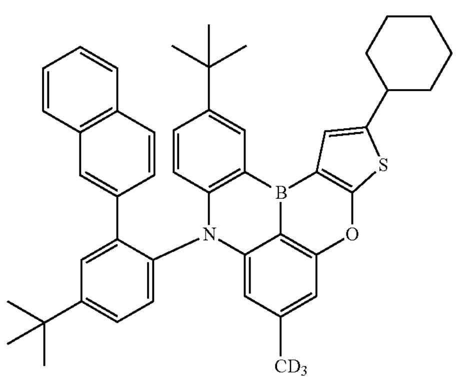
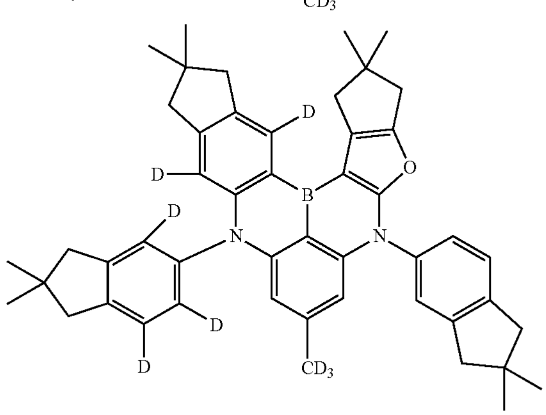
-continued
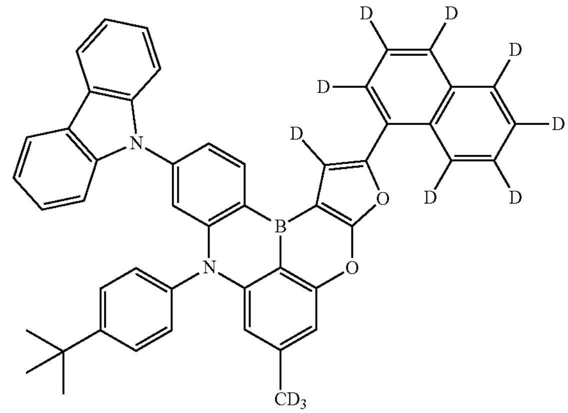
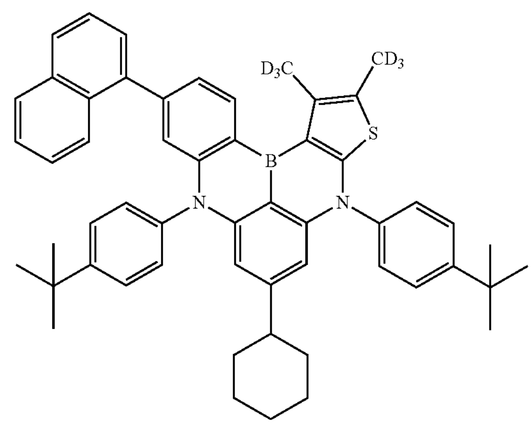
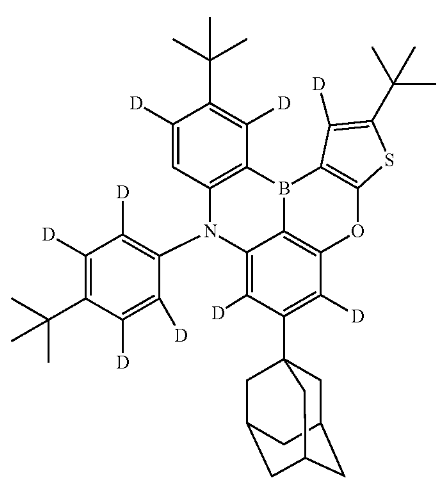

-continued
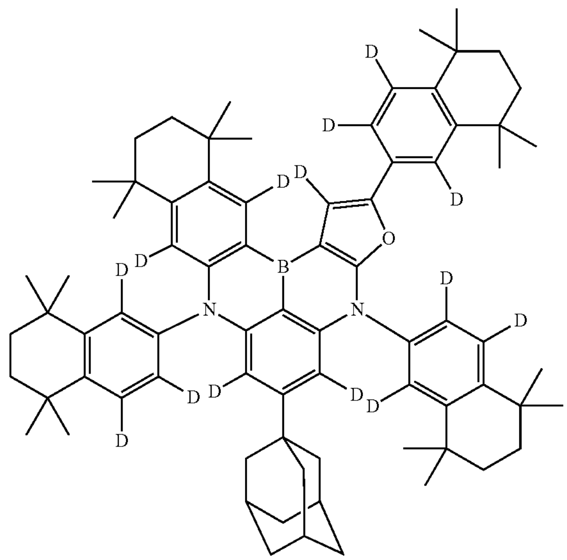
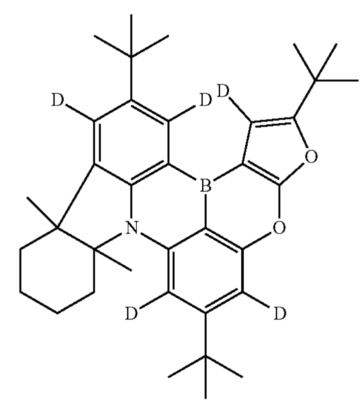
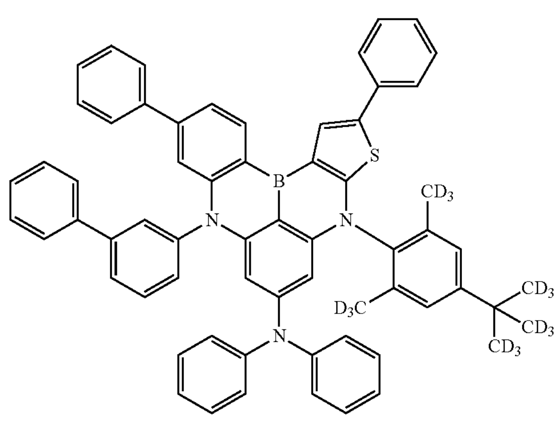
-continued
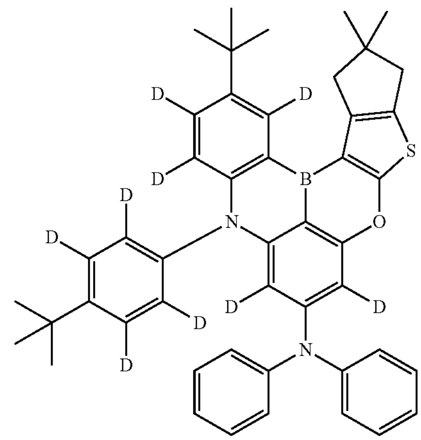
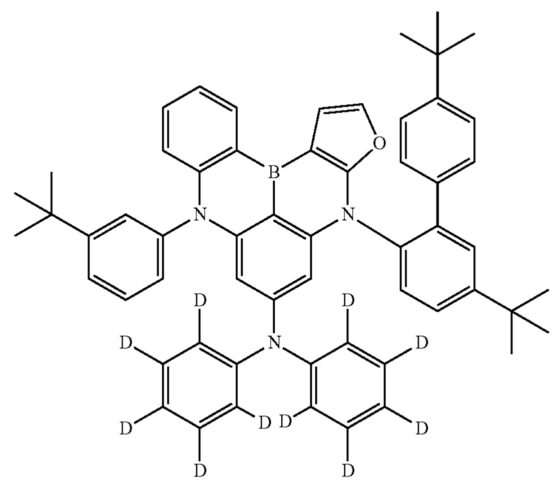
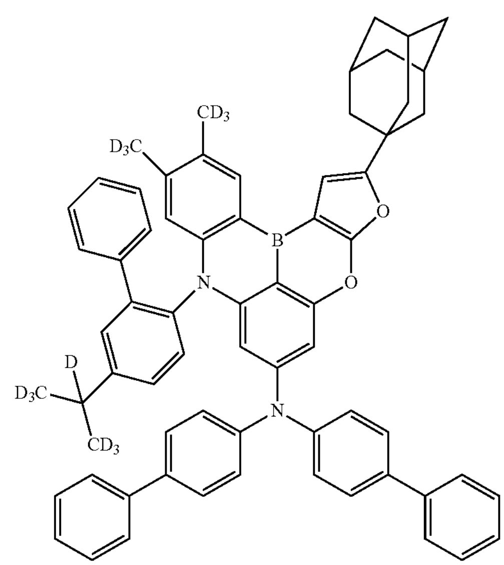

-continued
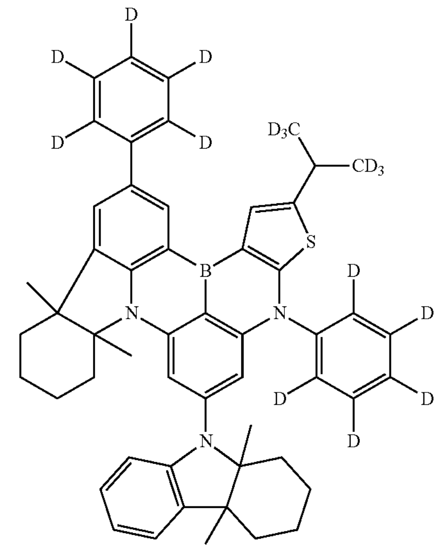
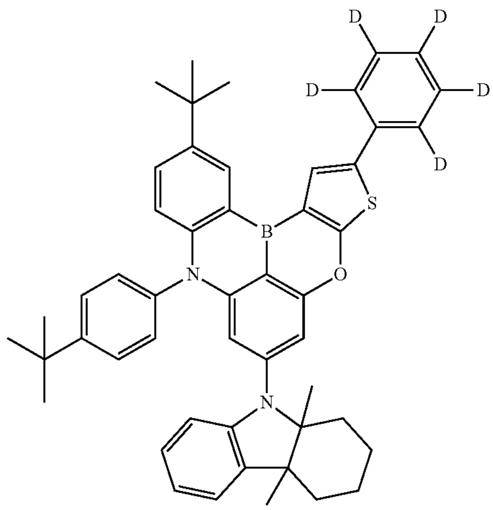
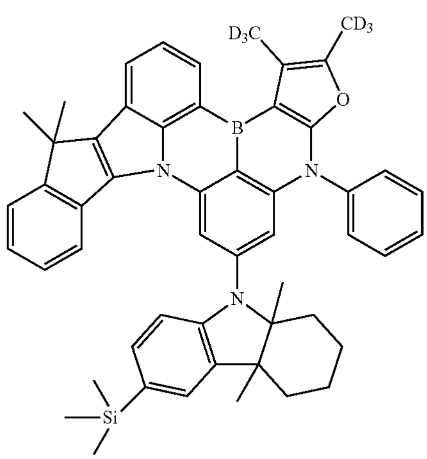
-continued
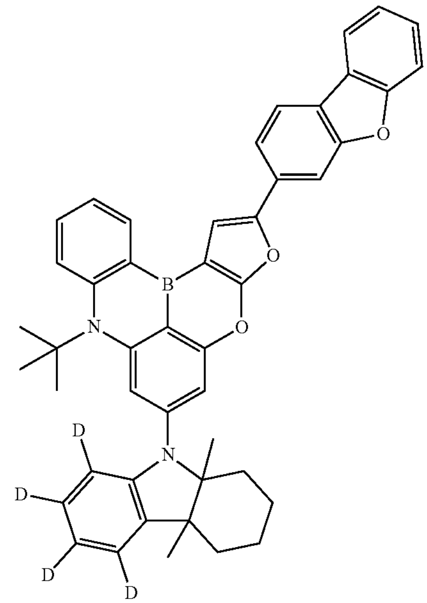
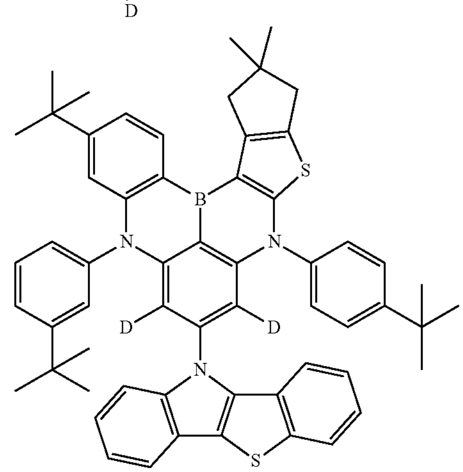
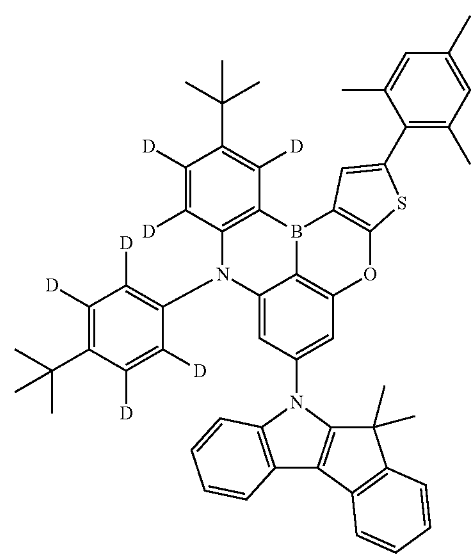

-continued
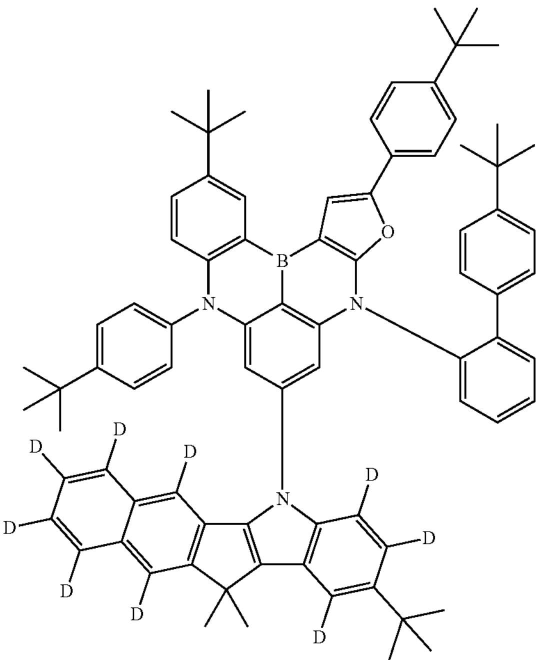
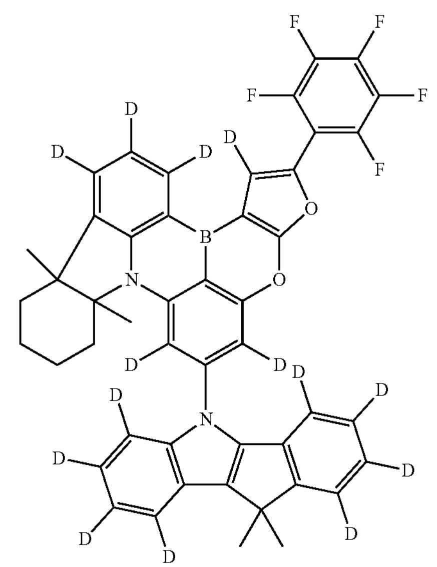
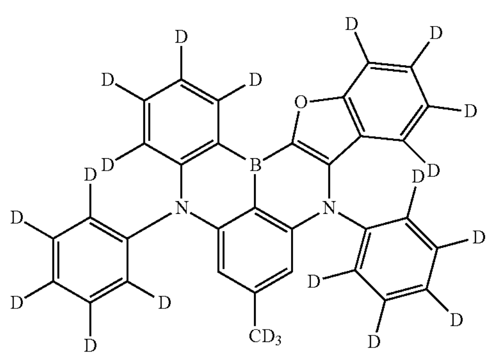
-continued
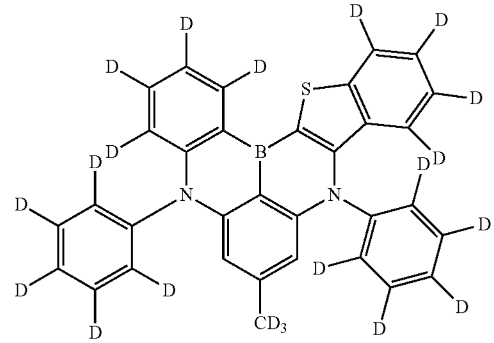
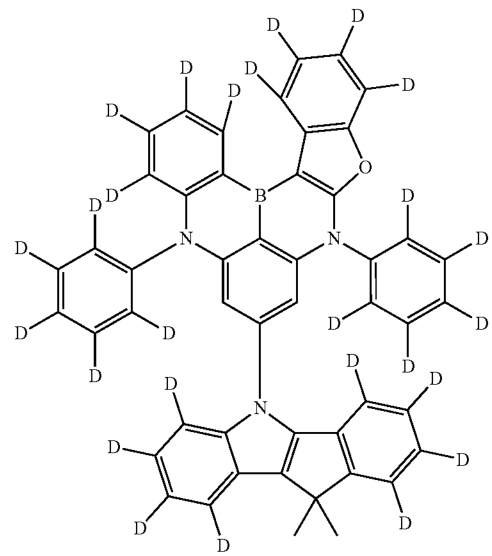
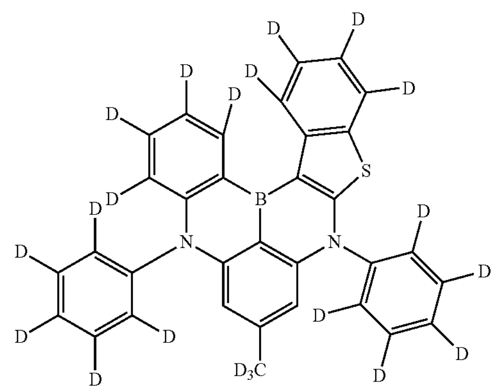
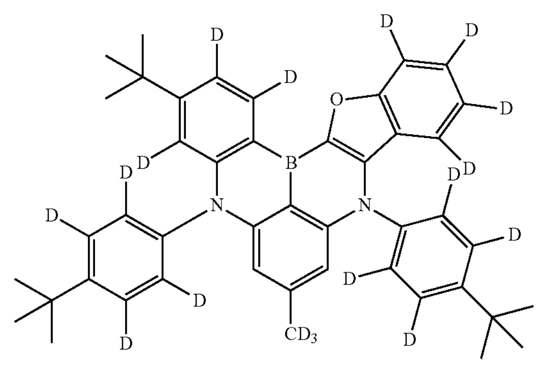

-continued
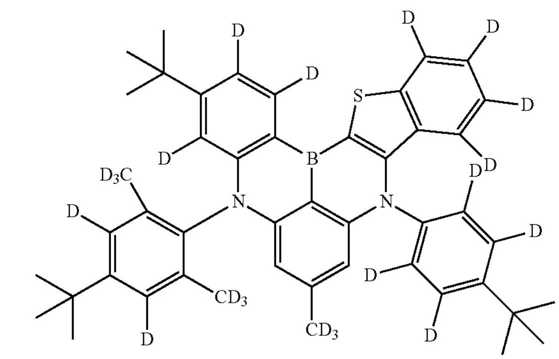
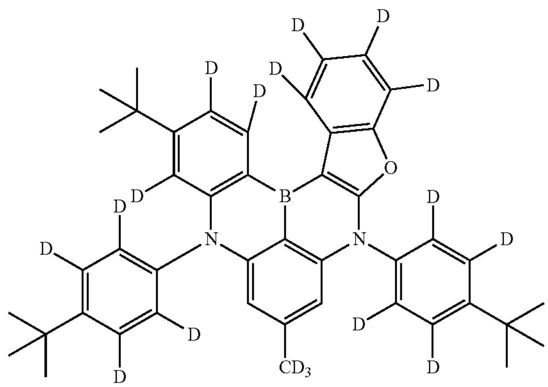
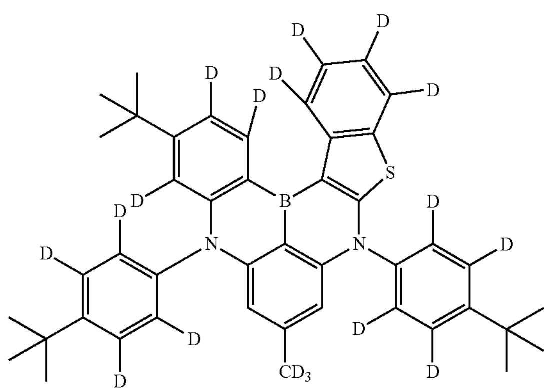
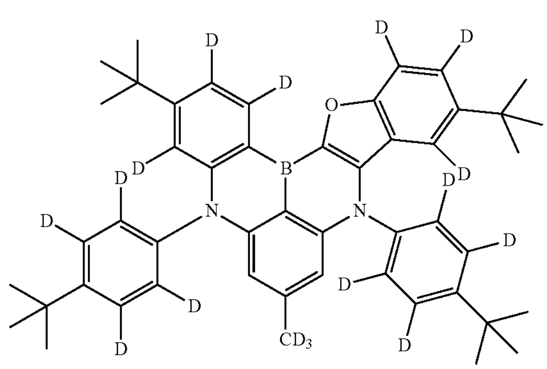
-continued
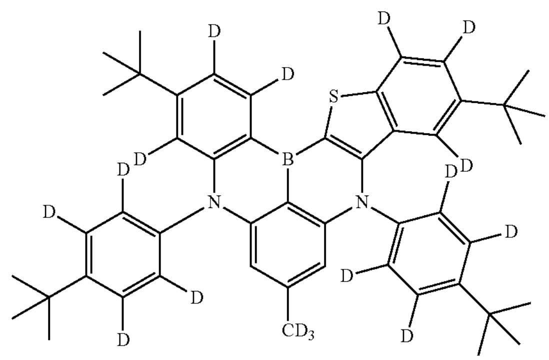
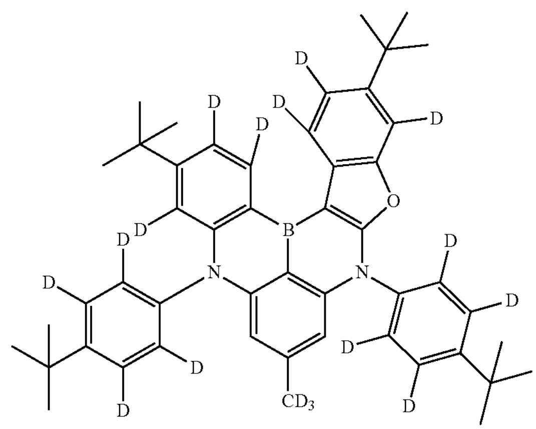
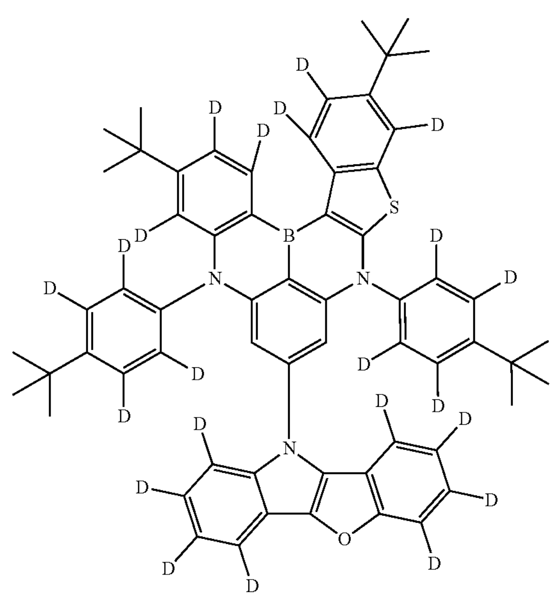

-continued
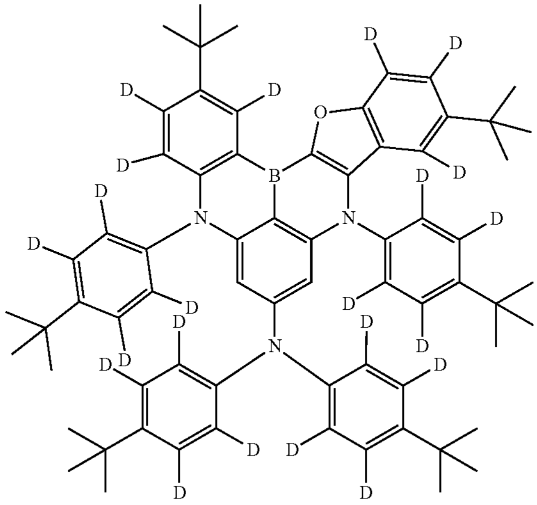
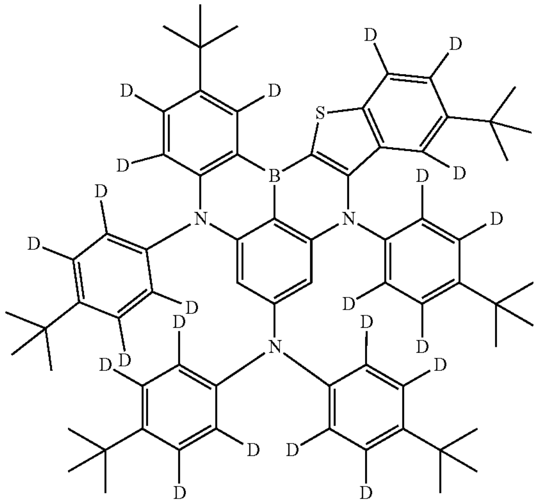
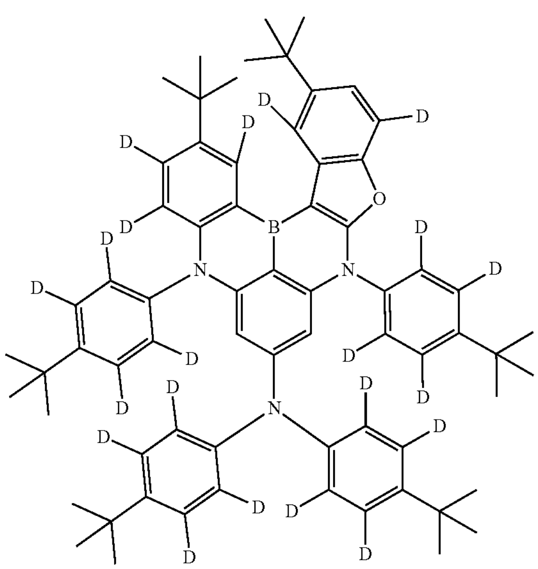
-continued
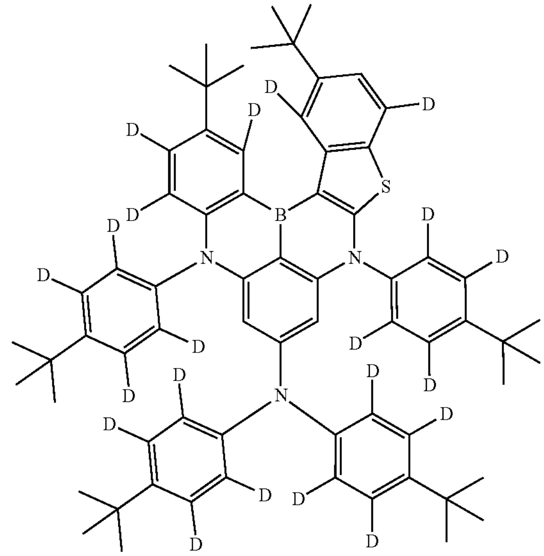
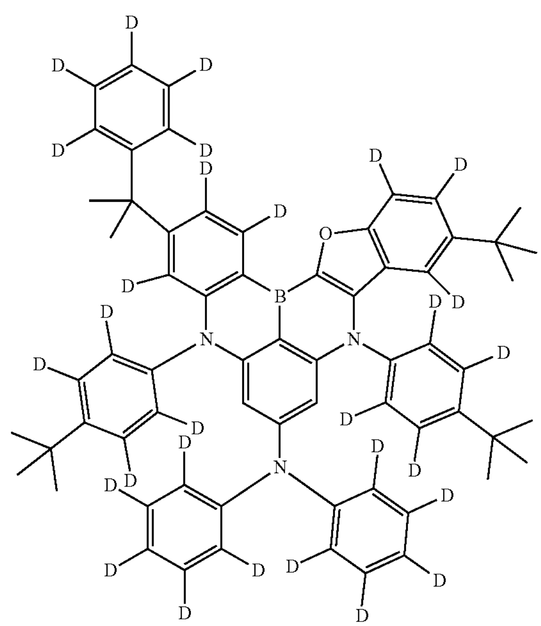

-continued
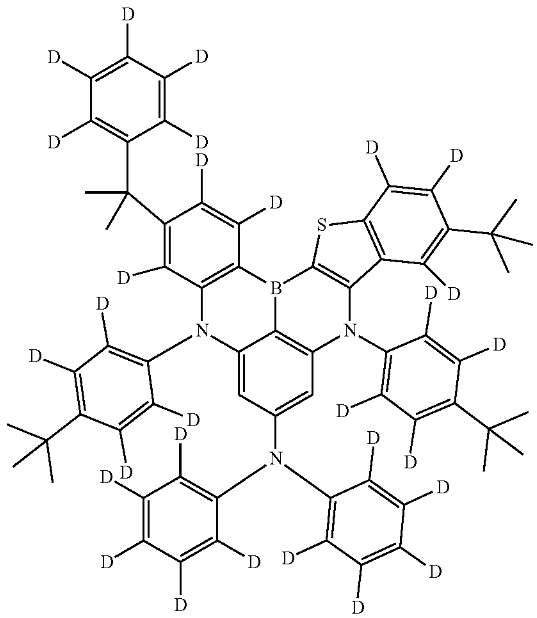
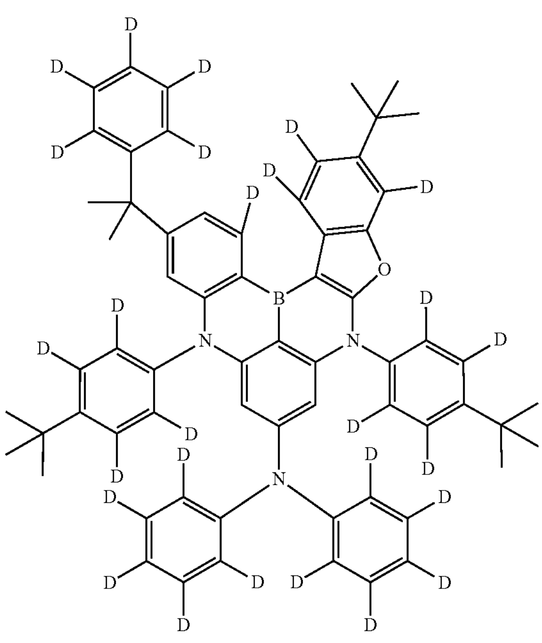
-continued
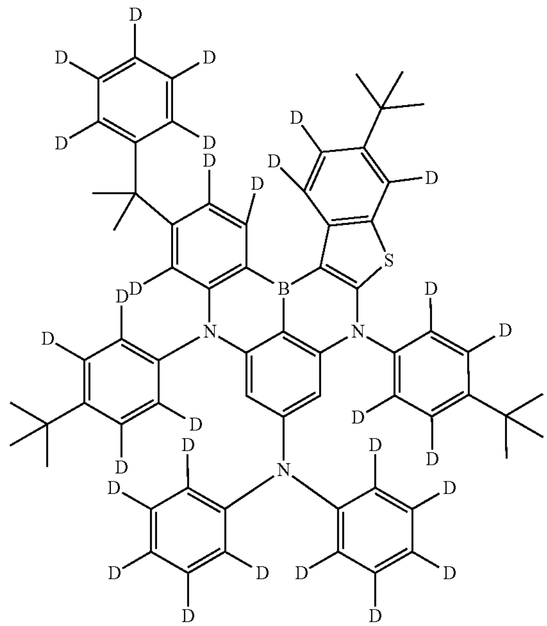
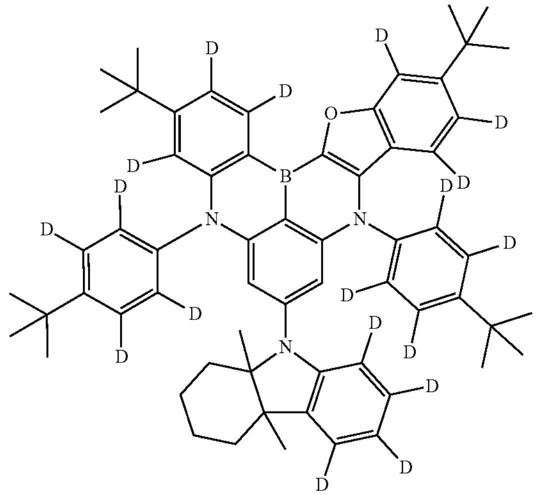
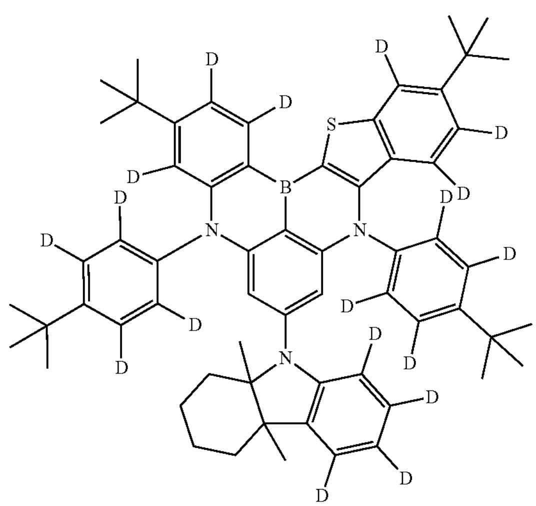

-continued
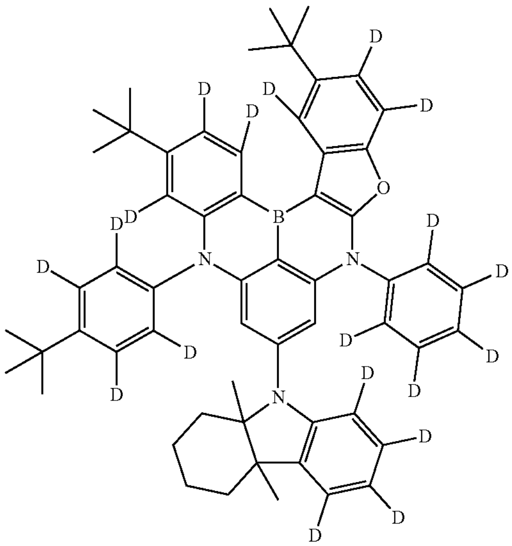
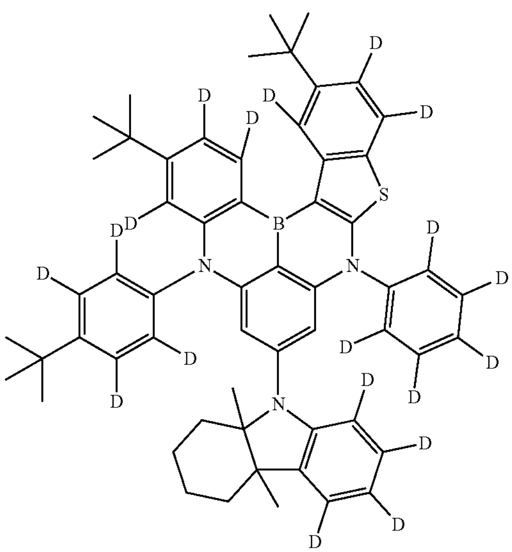
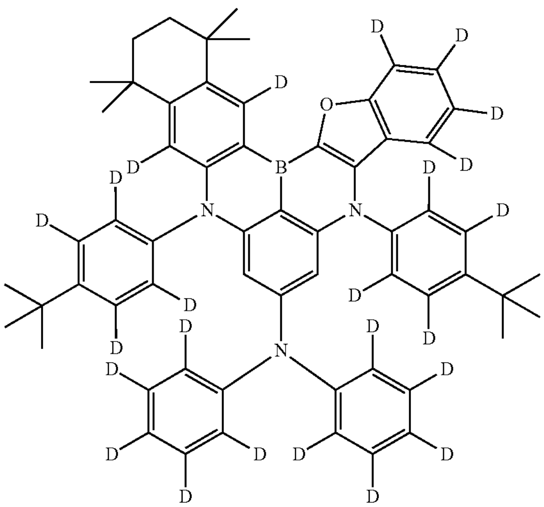
-continued
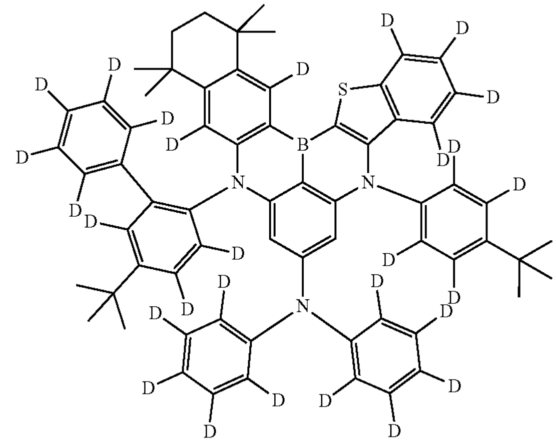
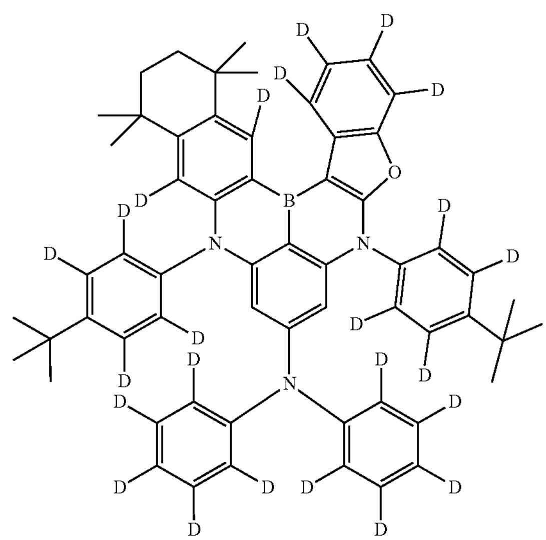
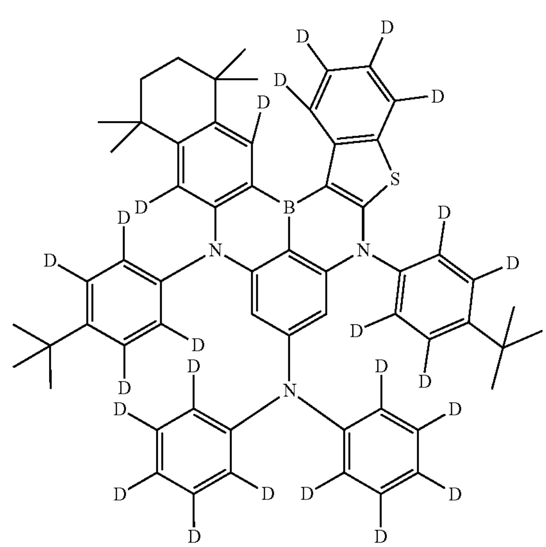

-continued
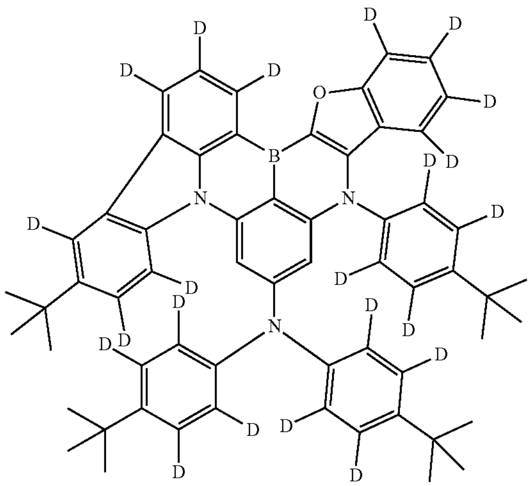
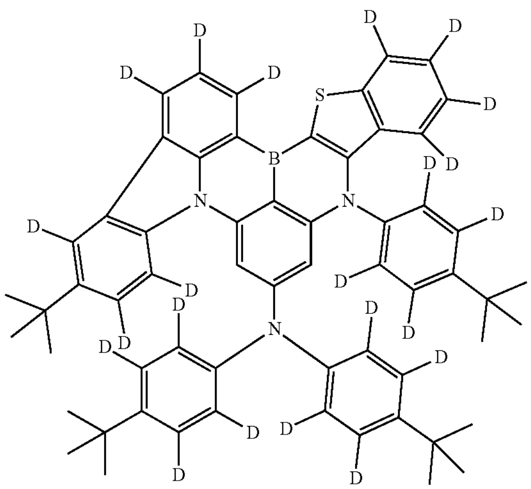
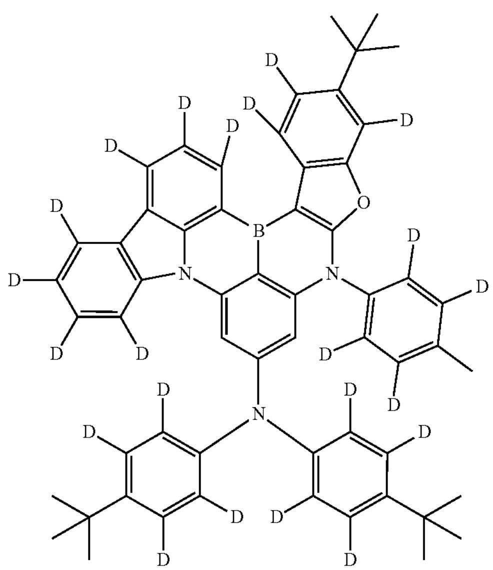
-continued
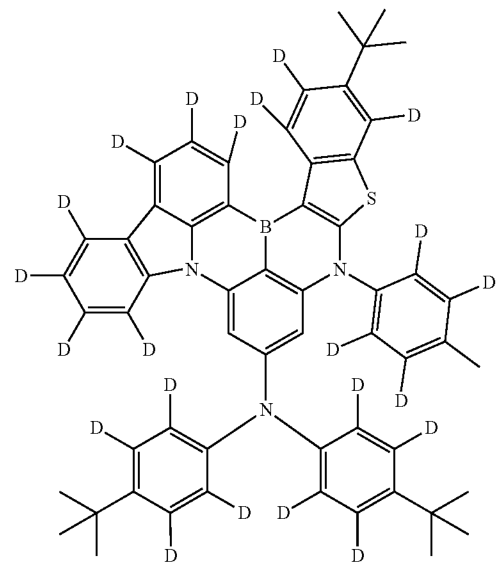
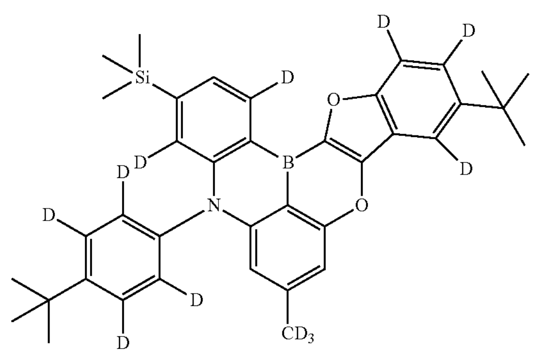
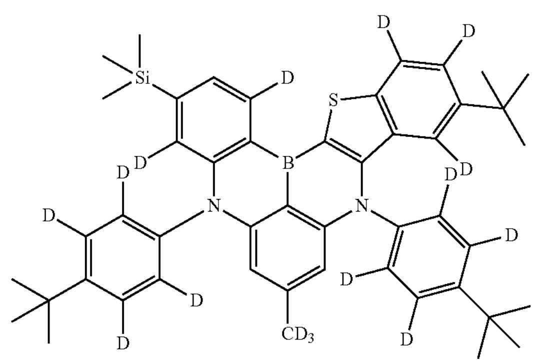
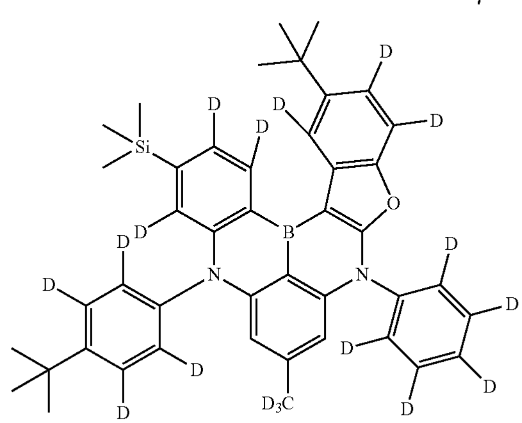

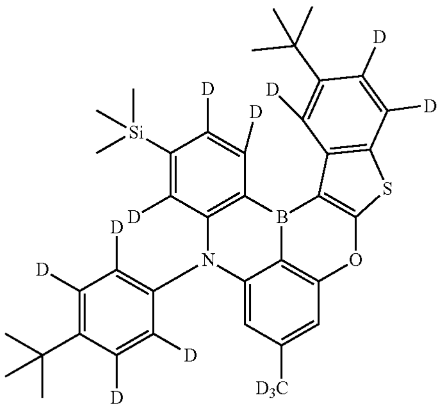
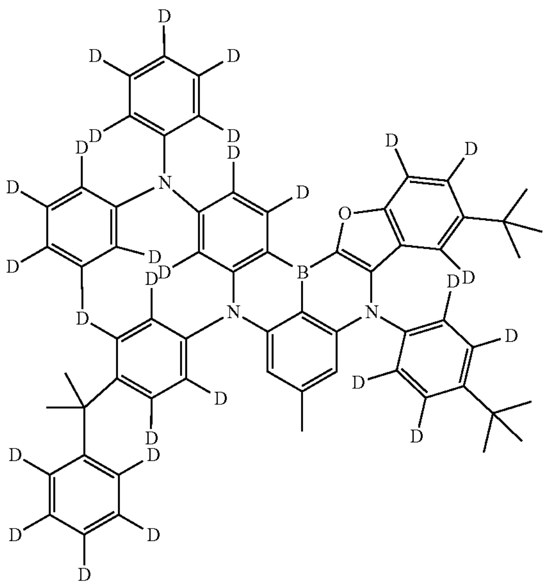
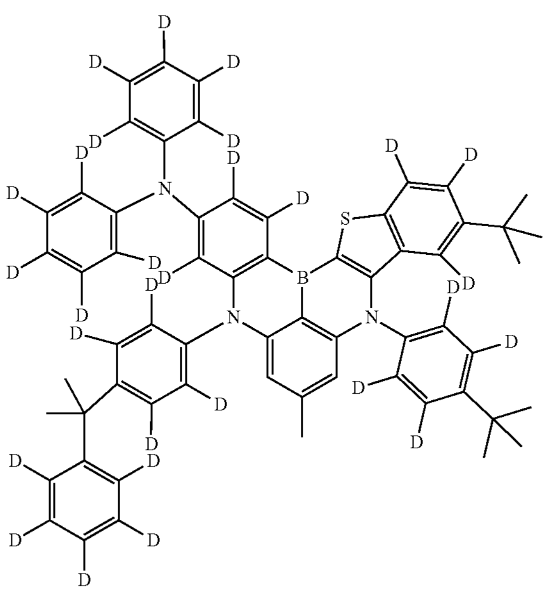
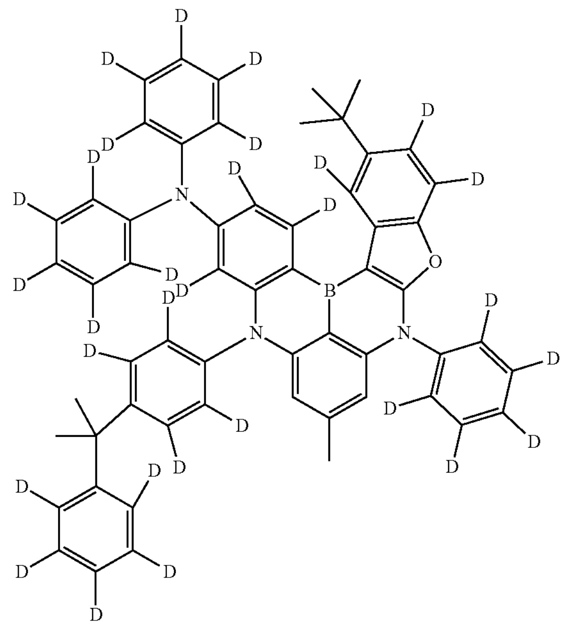
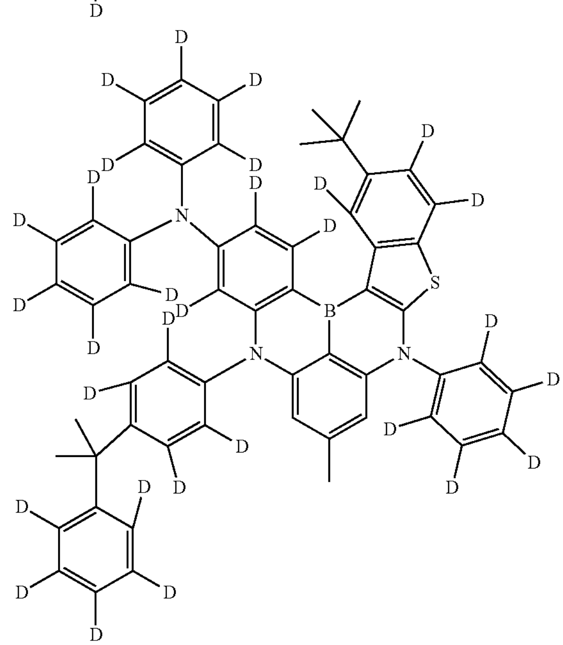
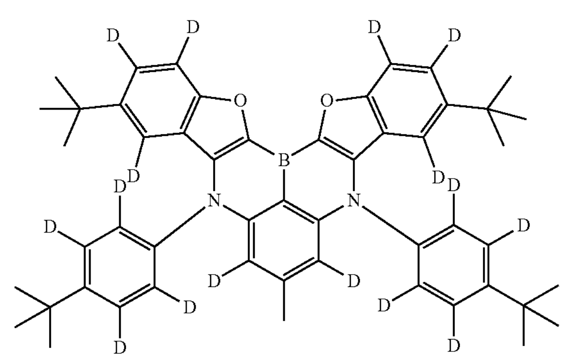

-continued
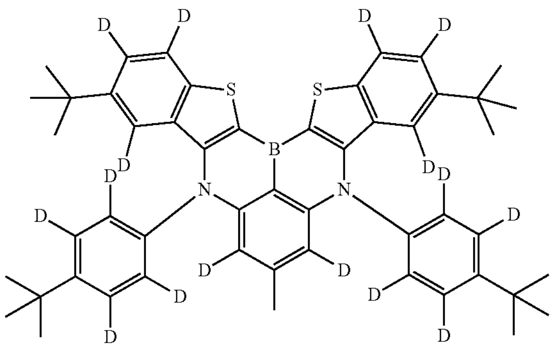
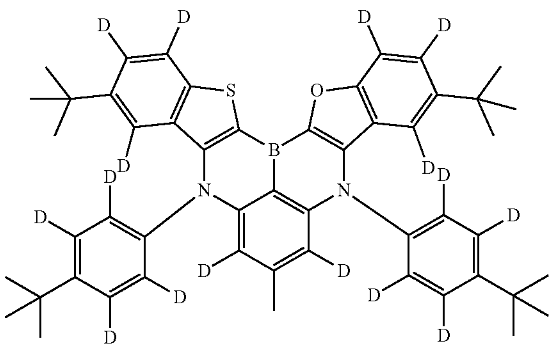
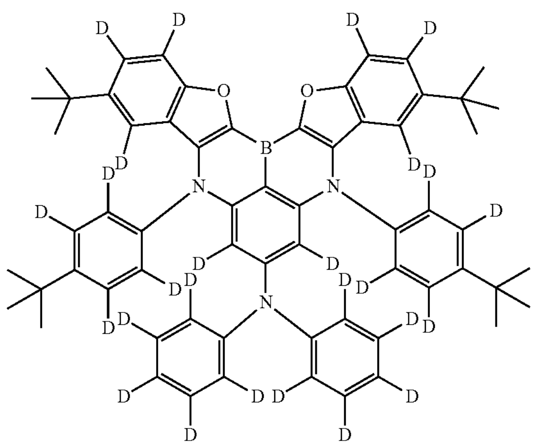
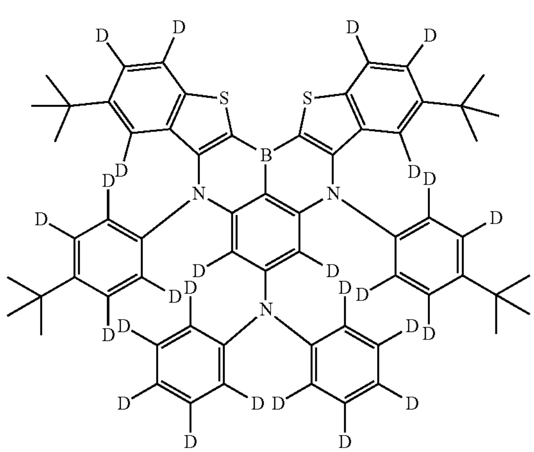
-continued
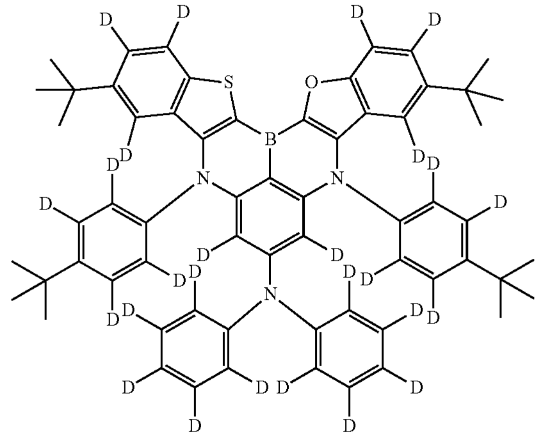
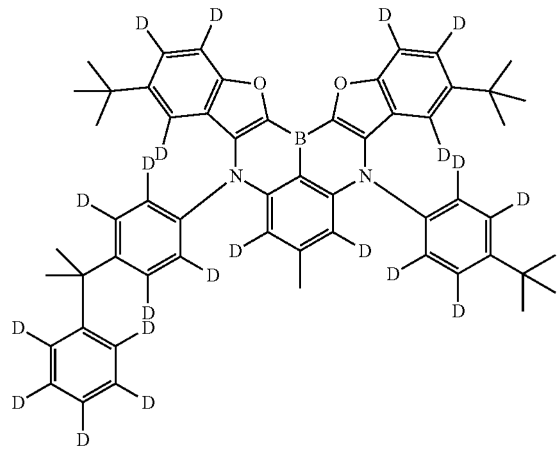
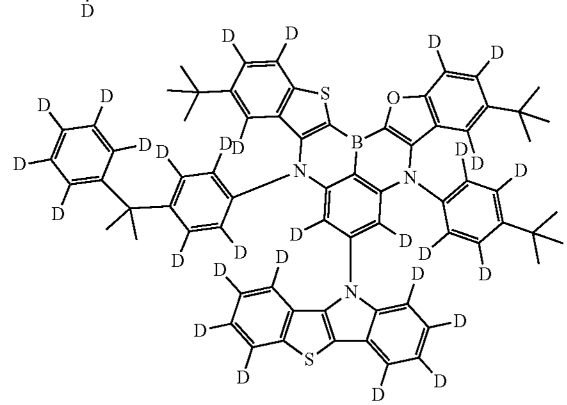
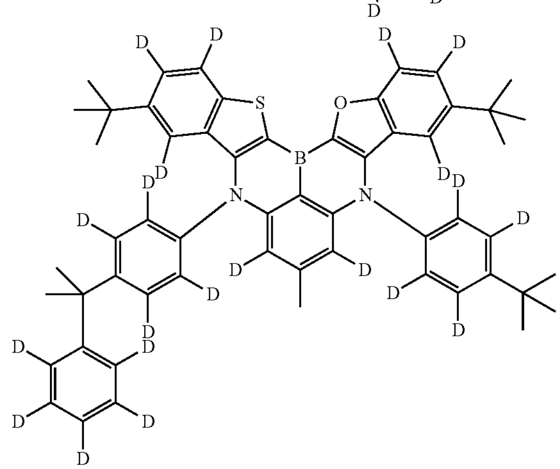

-continued
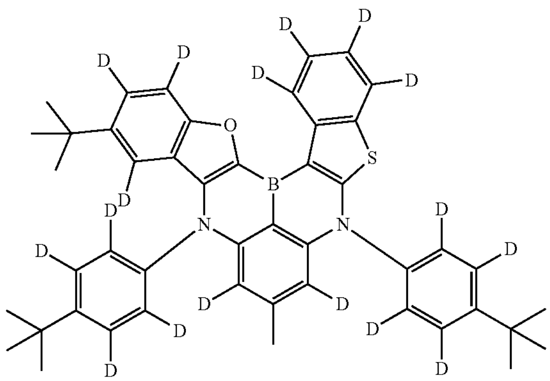
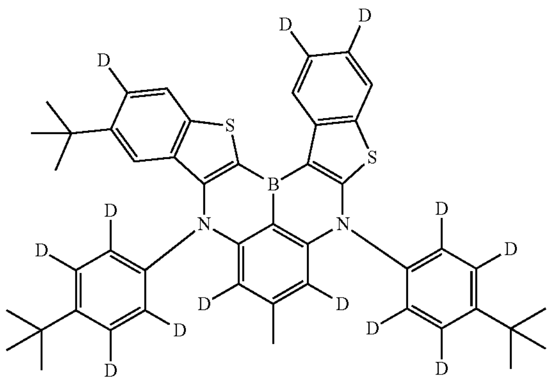
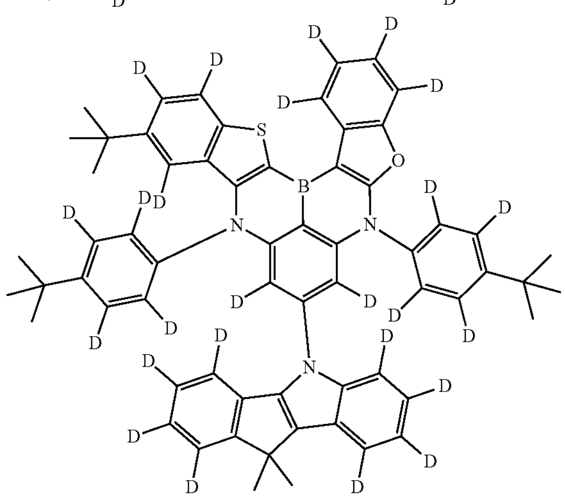
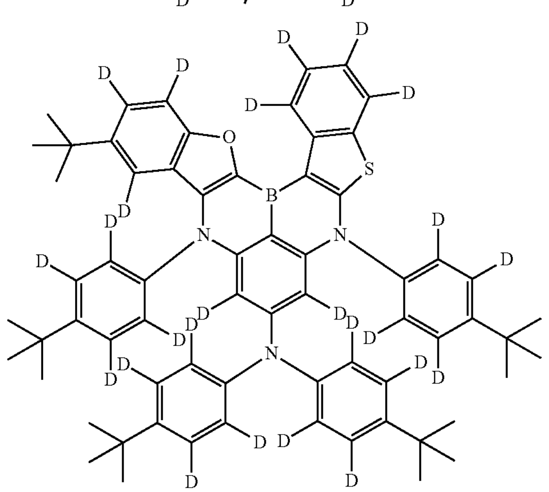
-continued
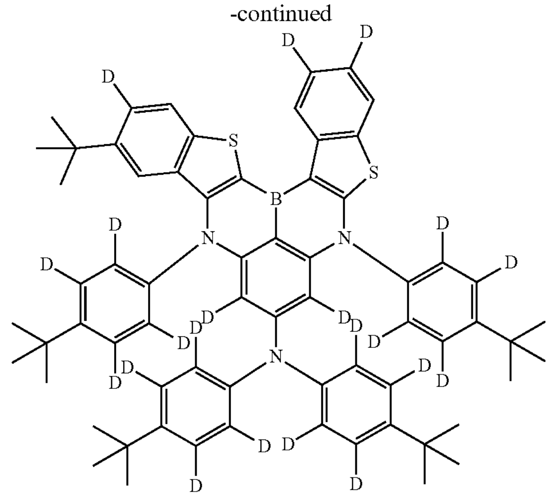
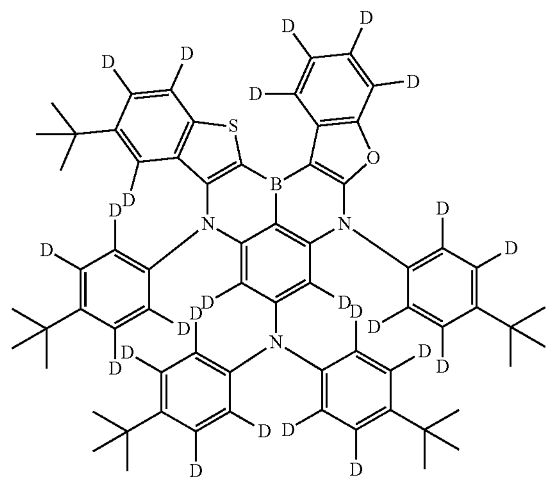
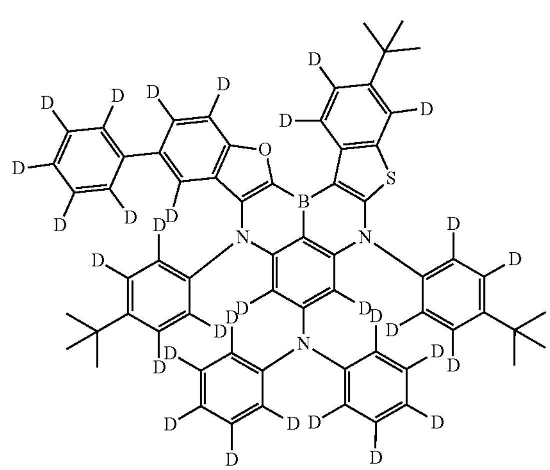

-continued
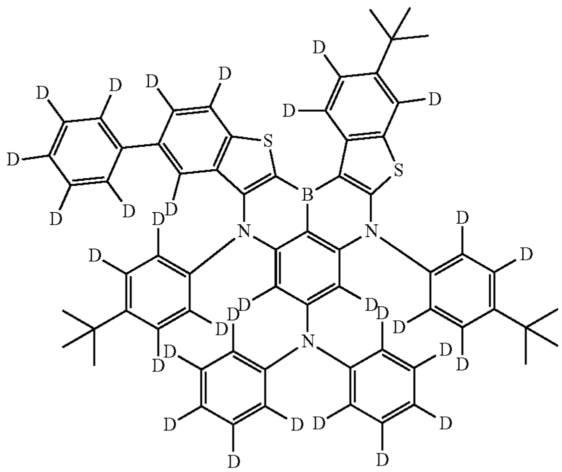
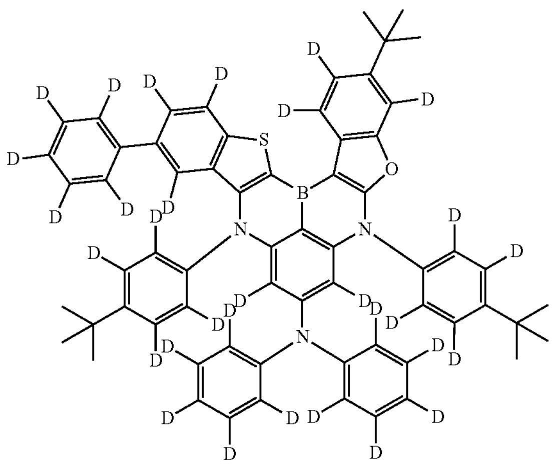
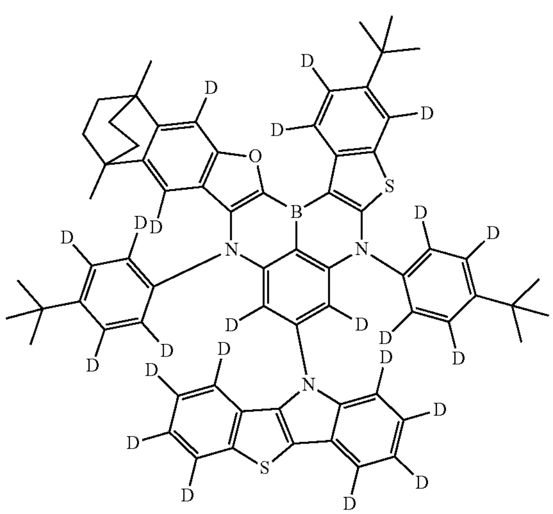
-continued
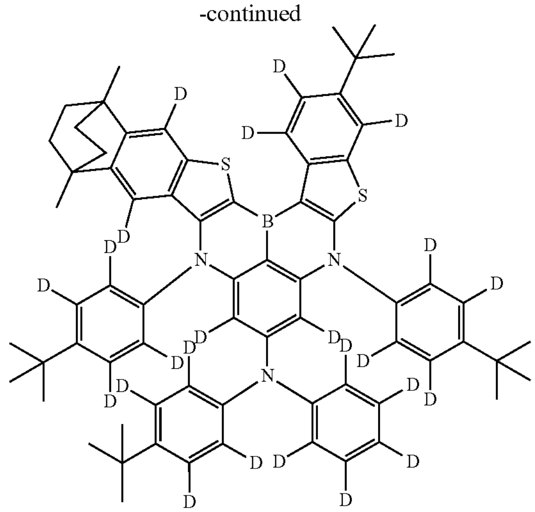
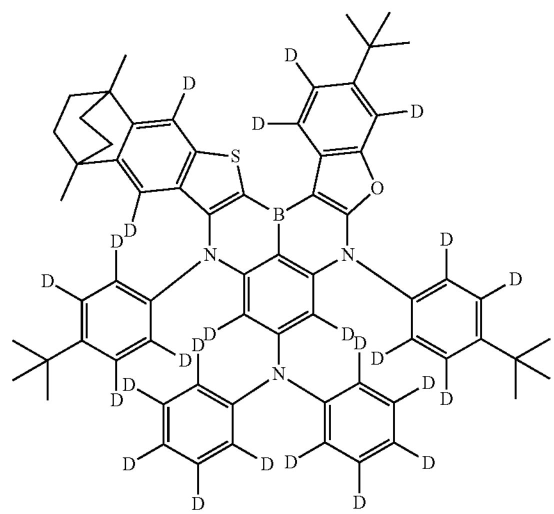
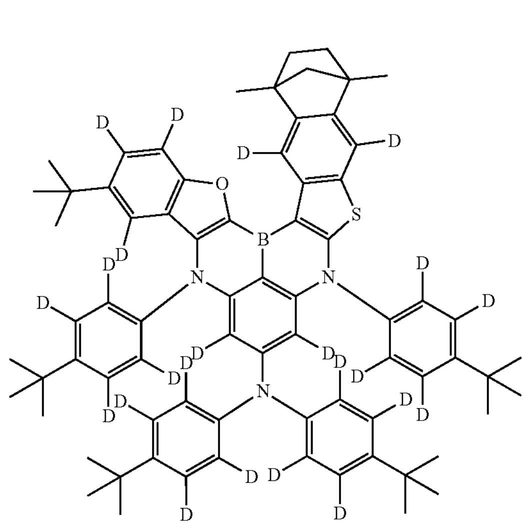

-continued
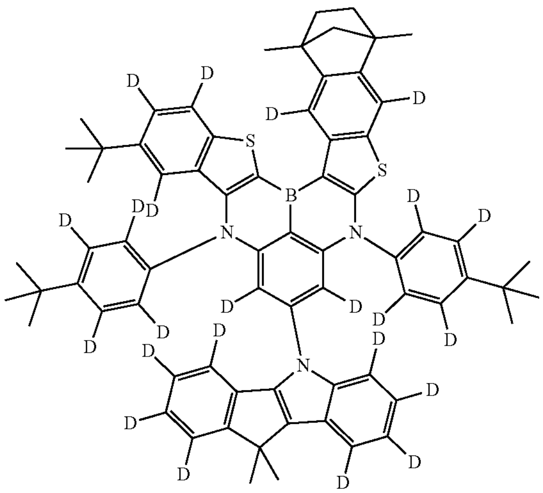
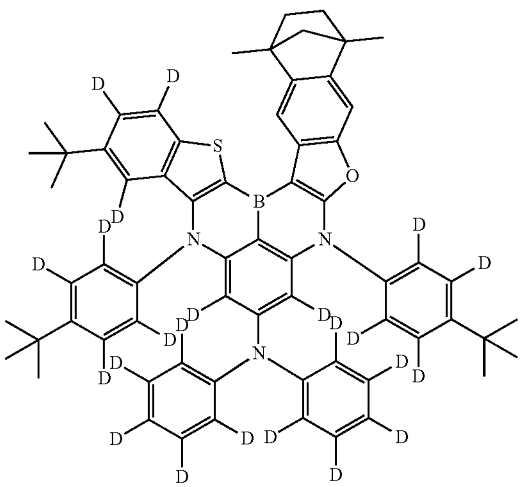
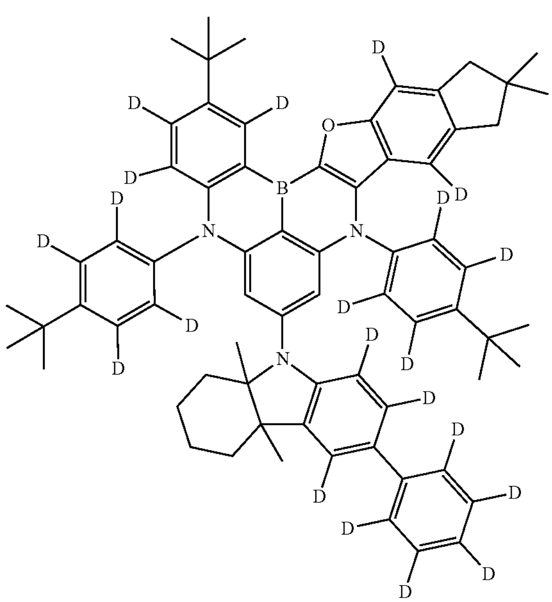
-continued
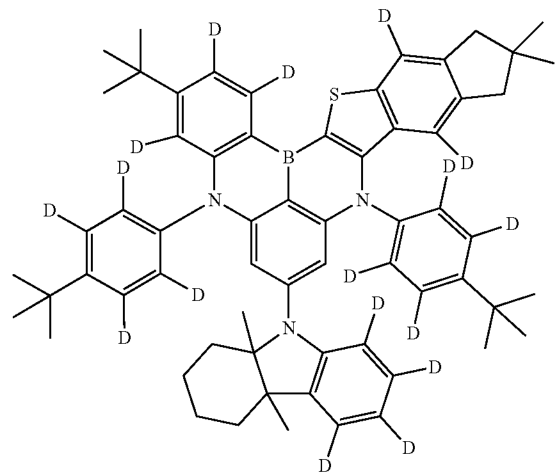
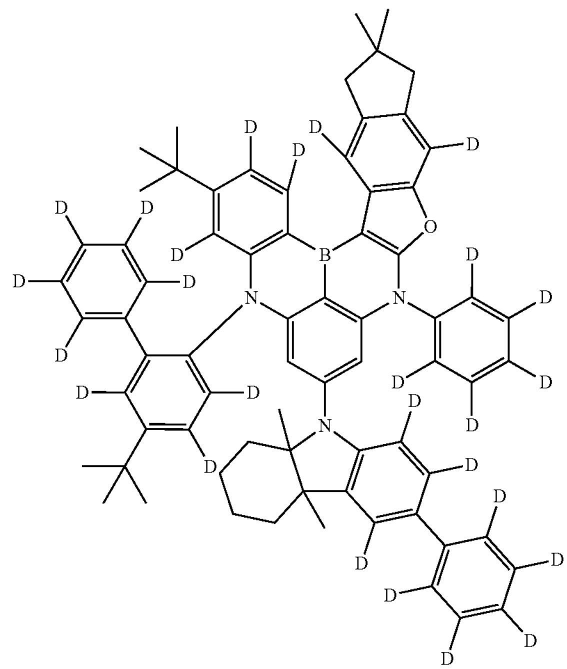
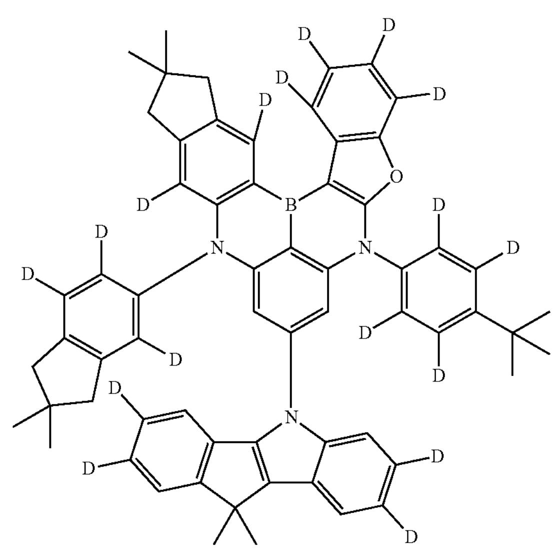

-continued
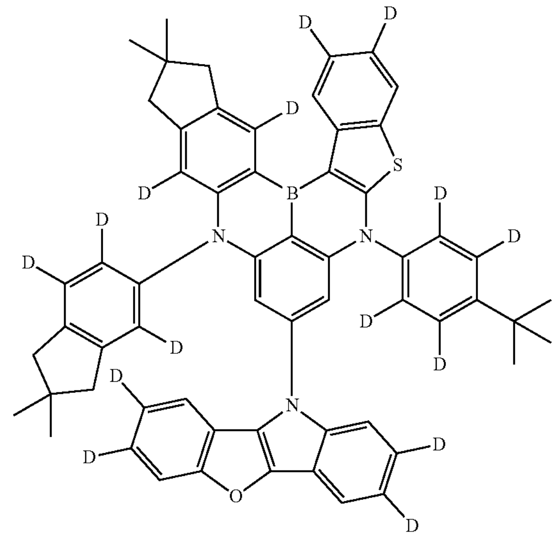
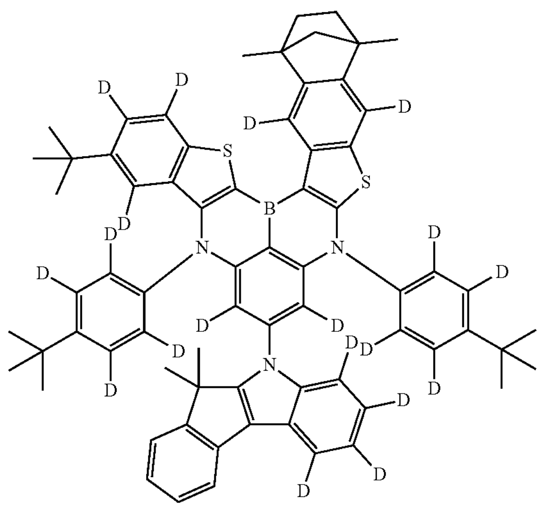
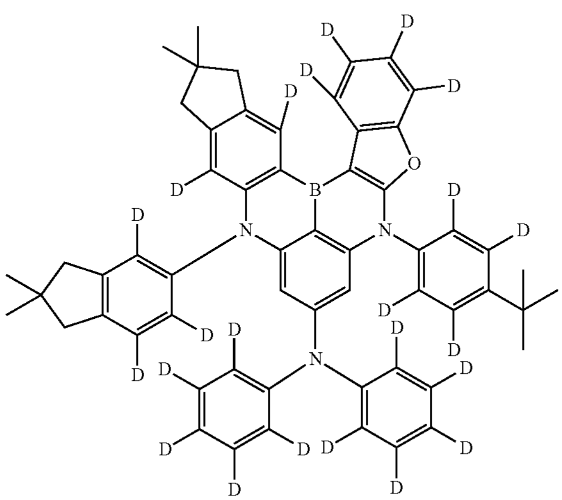
-continued
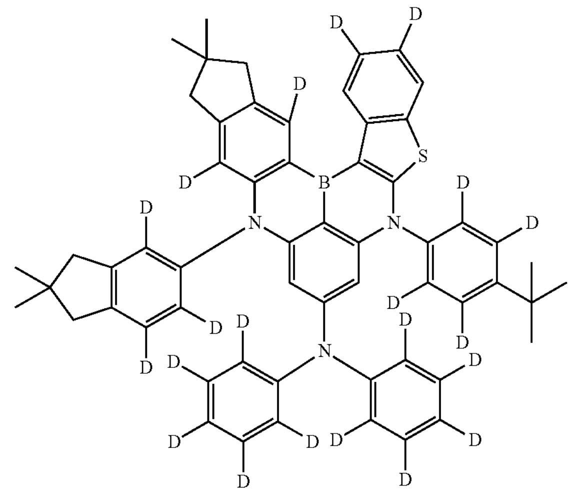
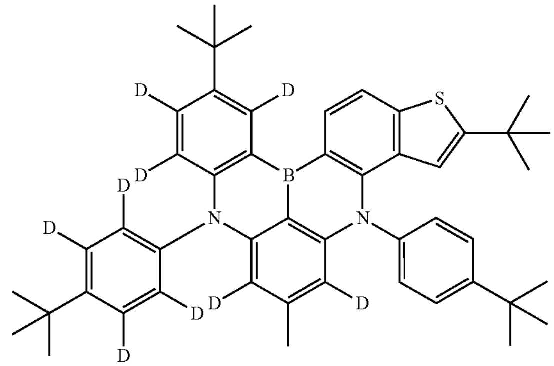
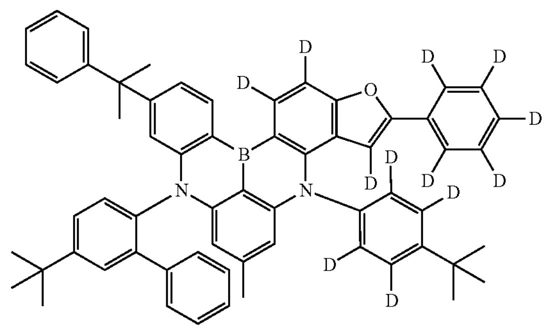
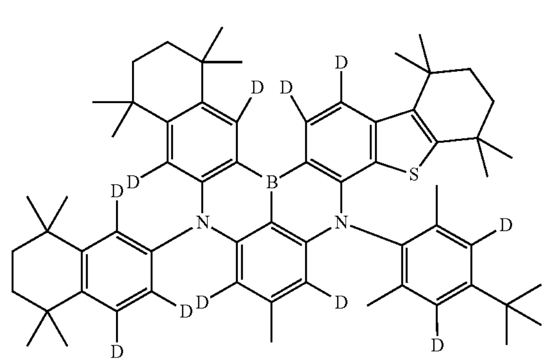

-continued
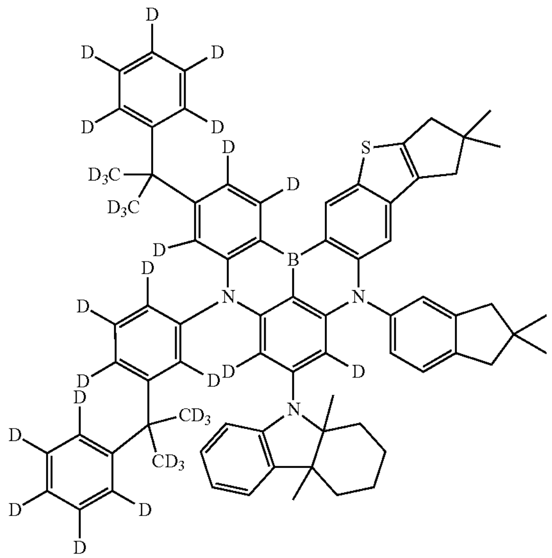
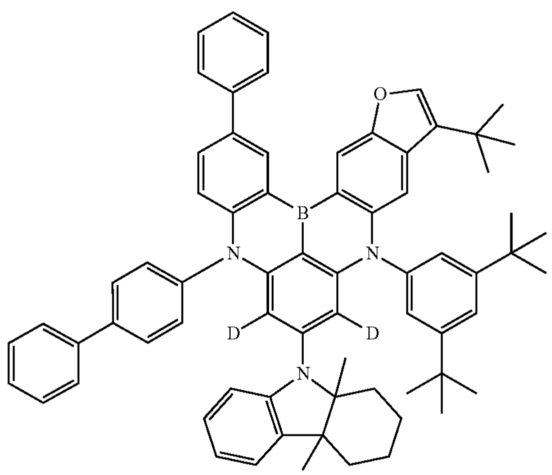
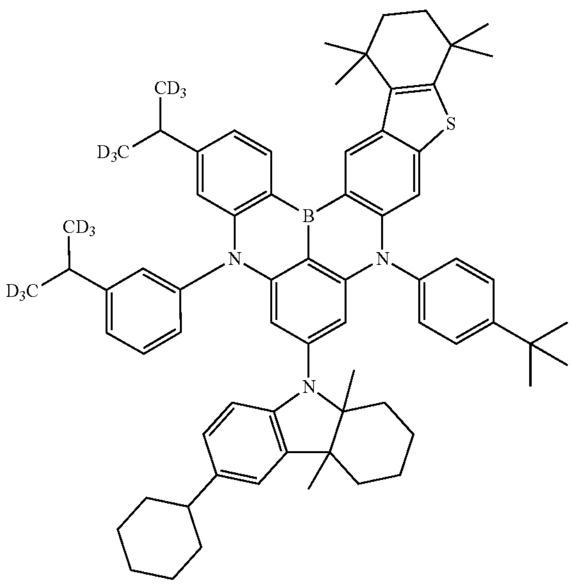
-continued
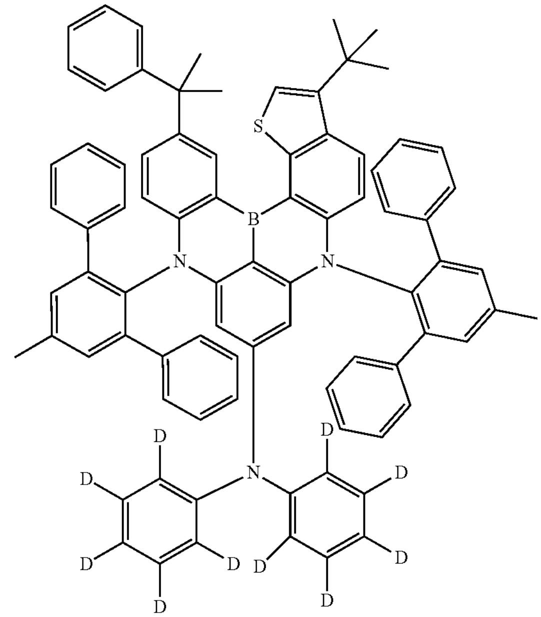
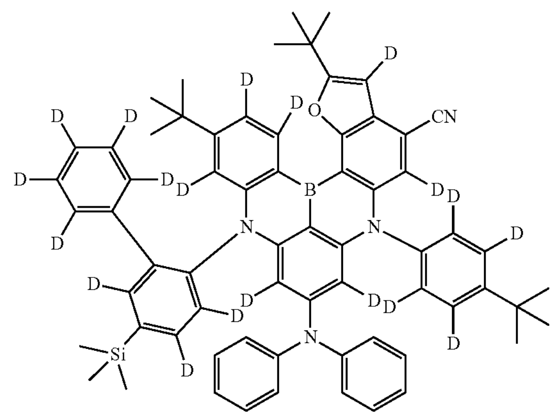
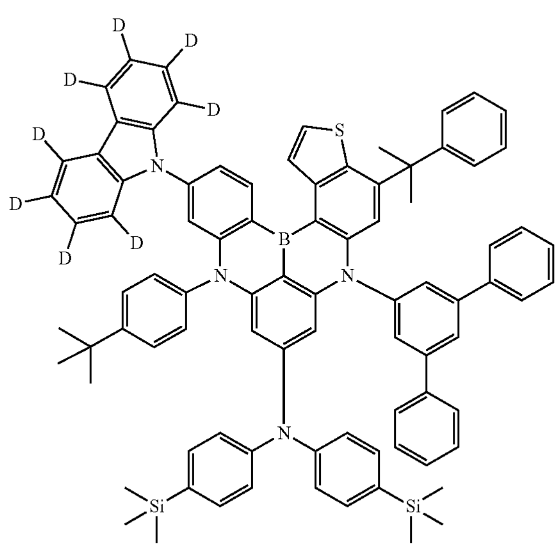

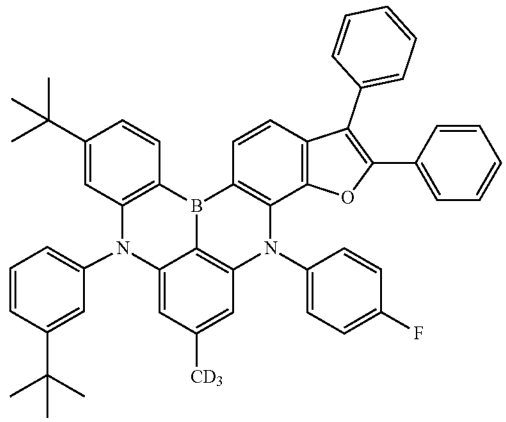
B
N
N
O
F
CD3
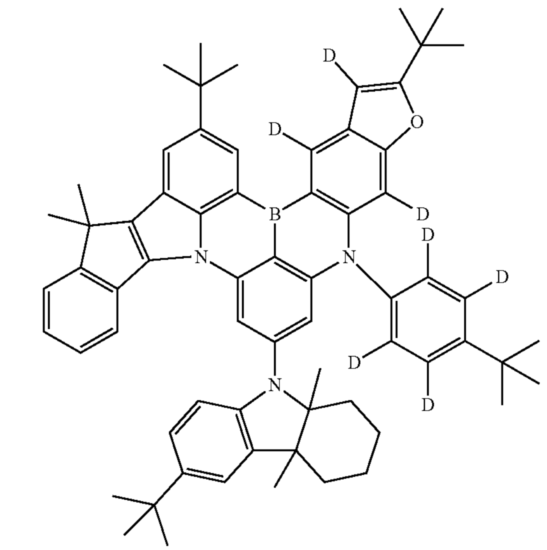
D
O
D
B
D
N
N
D
D
D
D
D
N
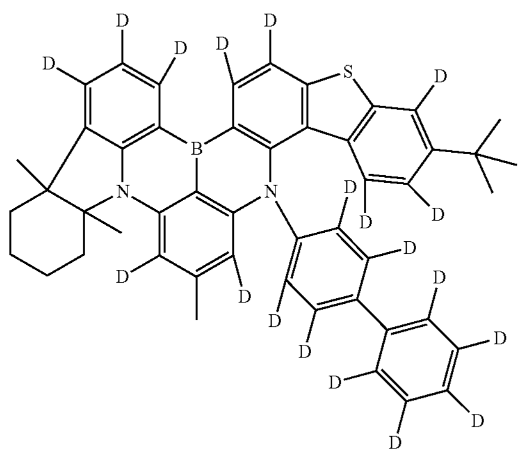
D
D
D
D
S
D
B
N
N
D
D
D
D
D
D
D
D
D
D
D
D
D
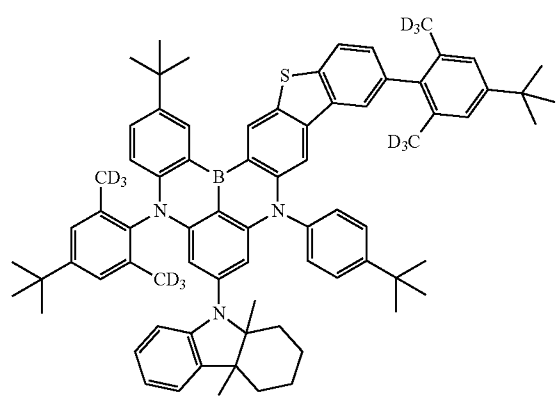
D3C
S
D3C
B
CD3
N
N
CD3
N
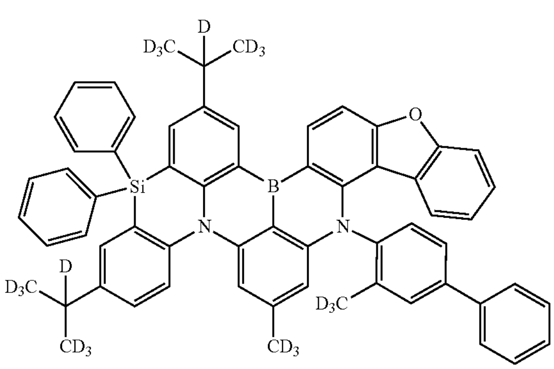
D
D3C
CD3
O
Si
B
N
N
D
D3C
CD3
CD3
D3C
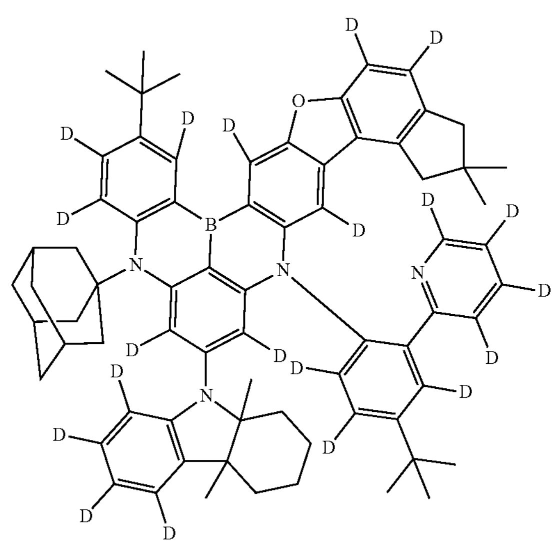
D
D
O
D
D
D
D
B
D
D
D
N
N
N
D
D
D
D
D
D
D
N
D
D
D
D
D -continued
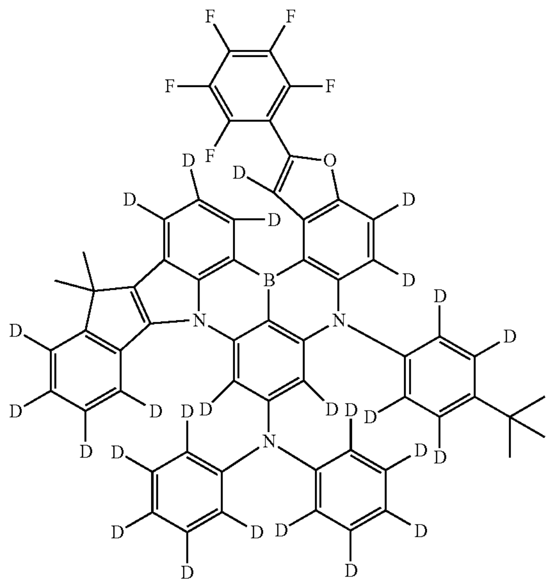
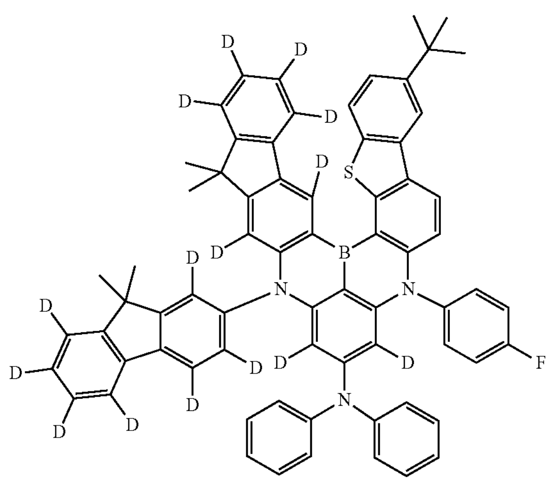
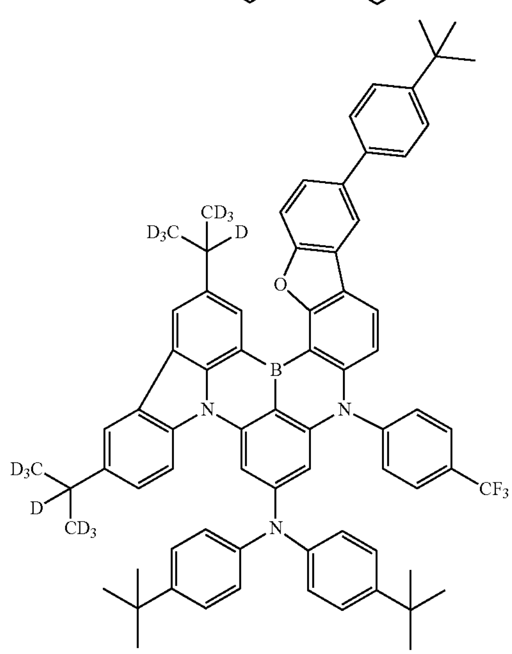
-continued
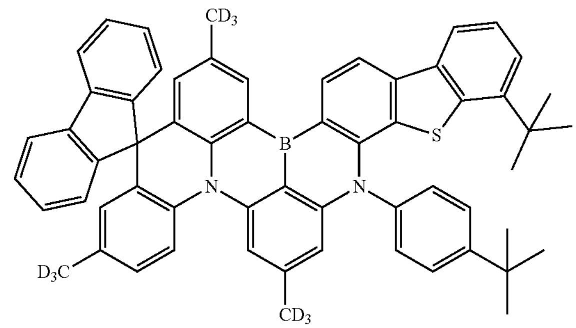
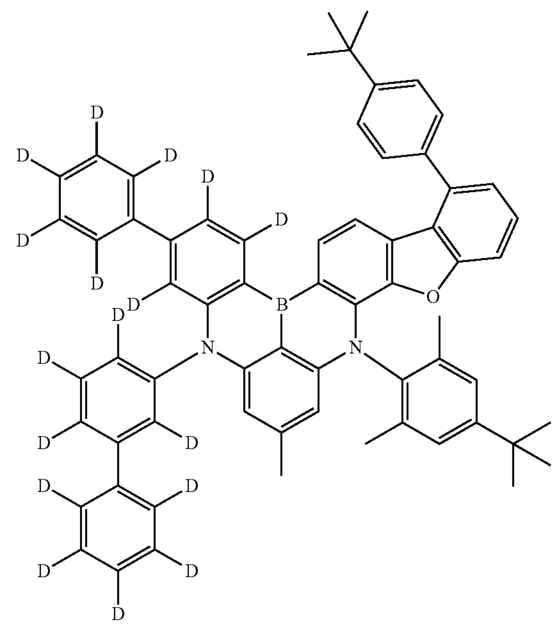
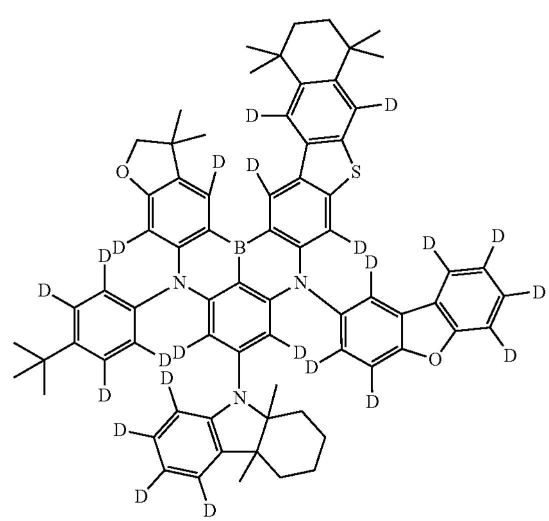

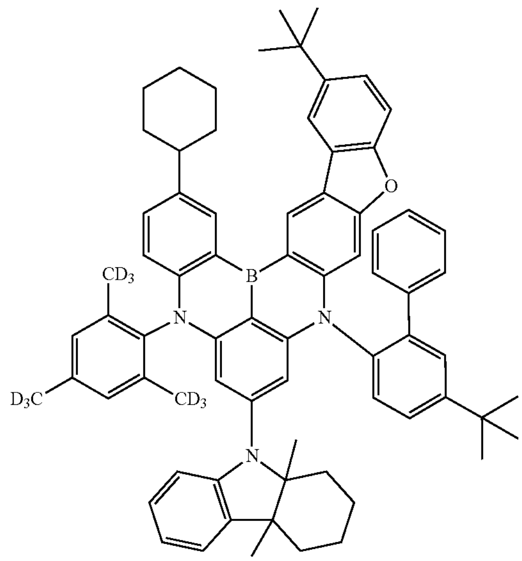
CD3
N
B
N
O
D3C
CD3
N
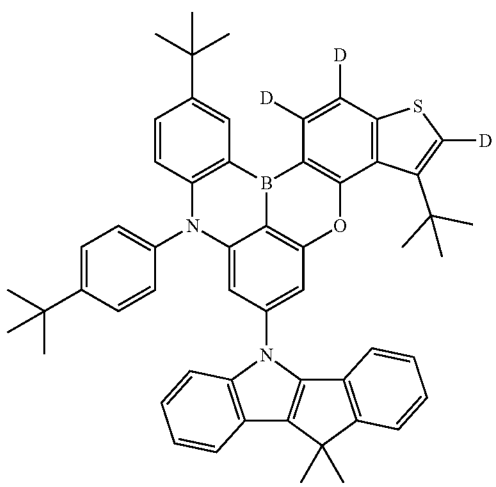
D
D
S
D
B
N
O
N
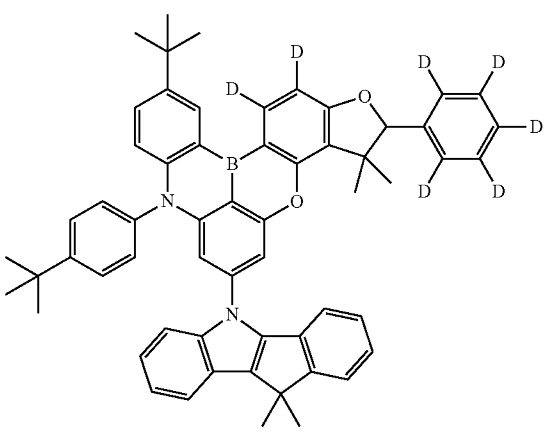
D
D
O
D
D
D
B
D
D
N
O
N
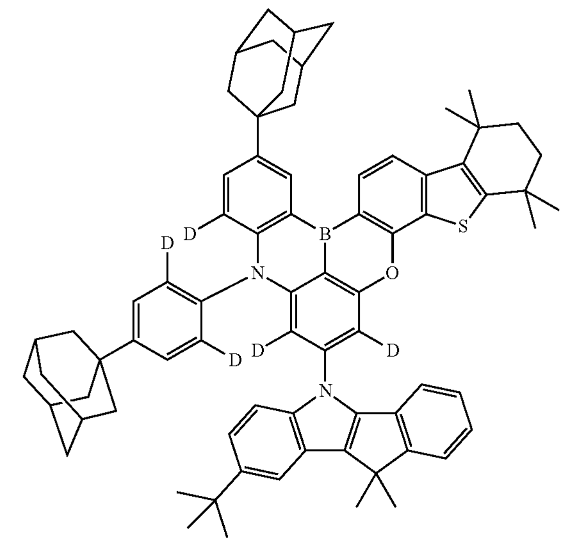
D
D
B
S
N
O
D
D
D
N
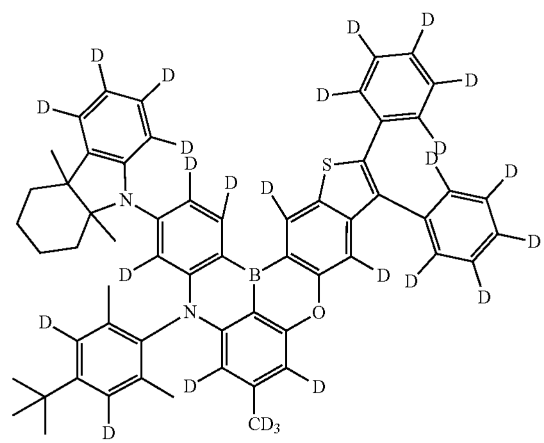
D
D
D
D
D
D
D
N
S
D
D
D
B
D
D
N
O
D
D
D
D
CD3
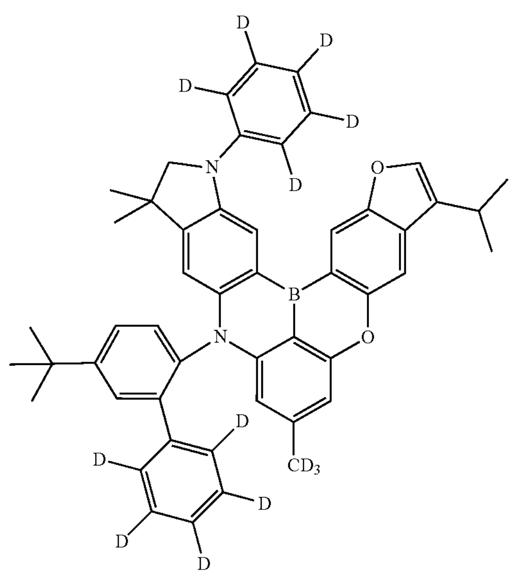
D
D
D
D
D
N
O
B
N
O
D
D
D
D
D
CD3

-continued
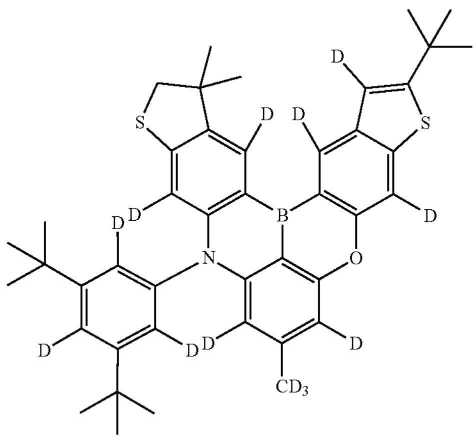
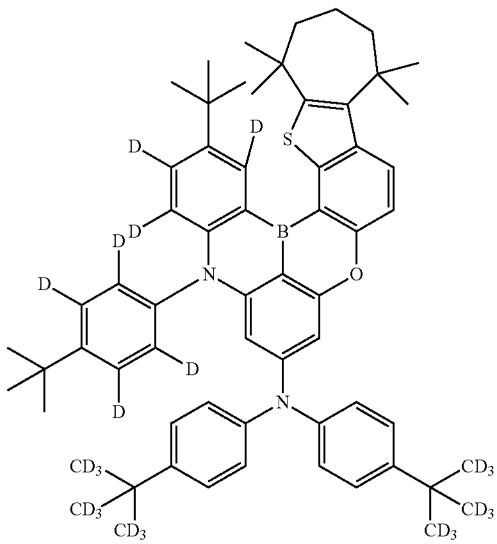
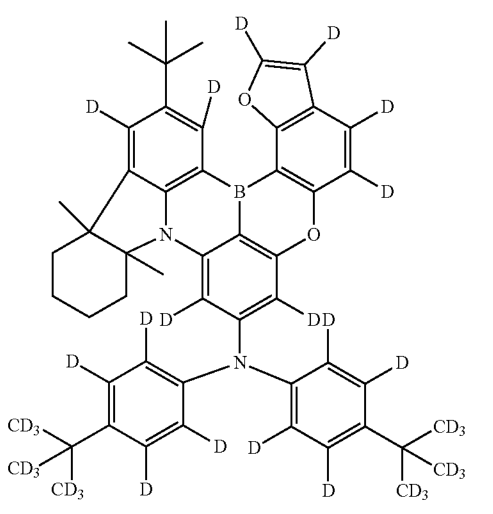
-continued
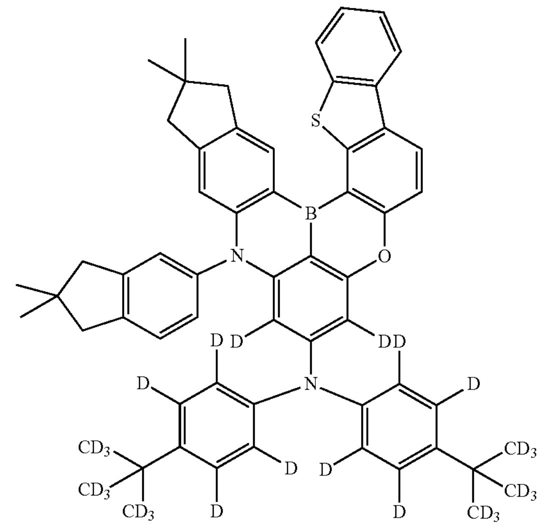
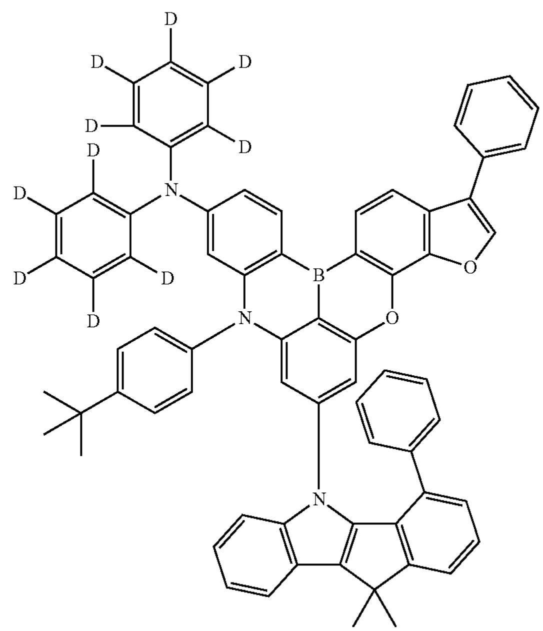
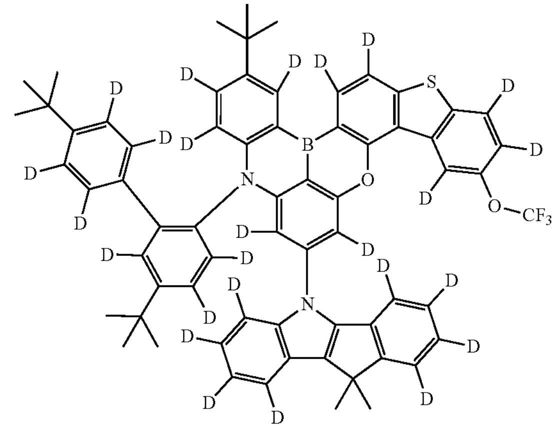

-continued
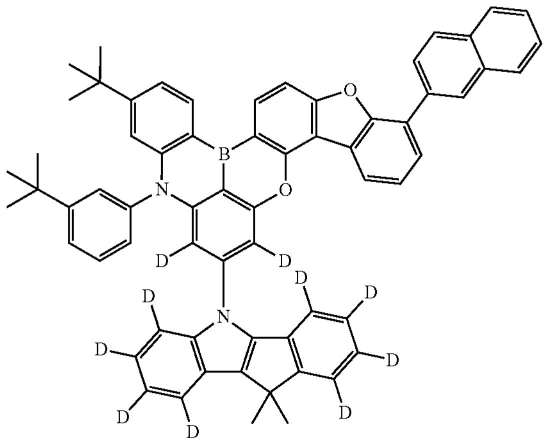
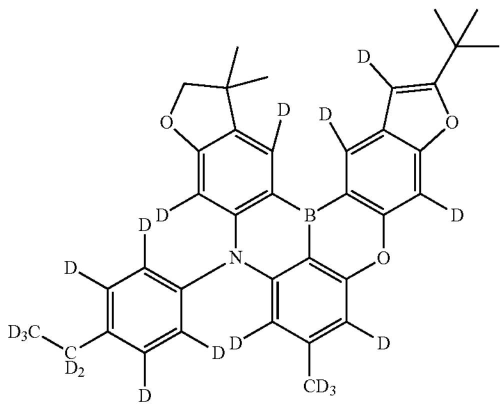
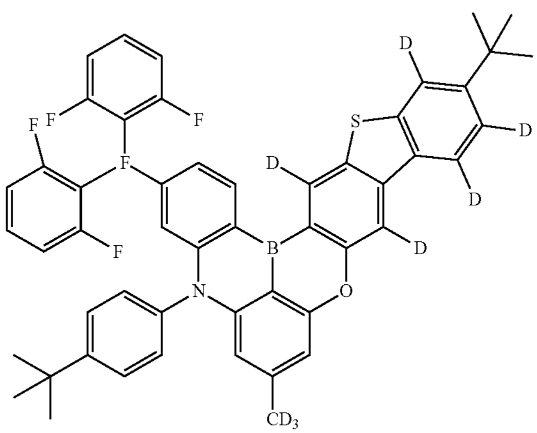
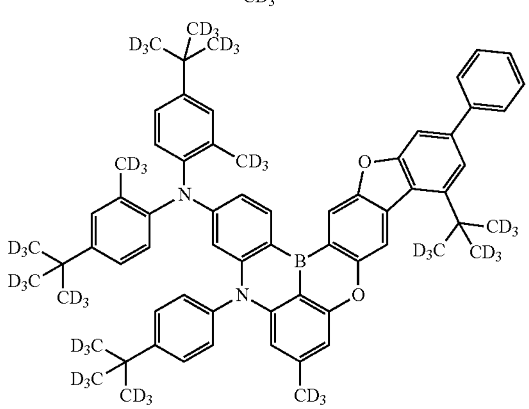
-continued
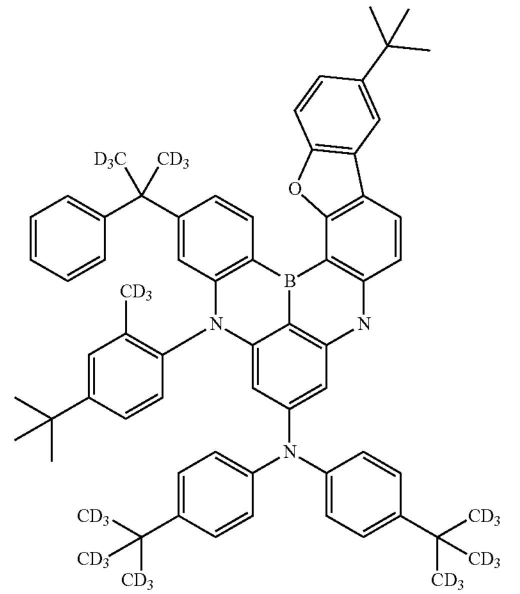
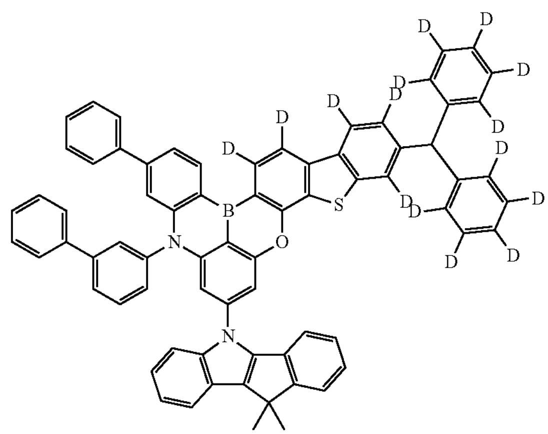
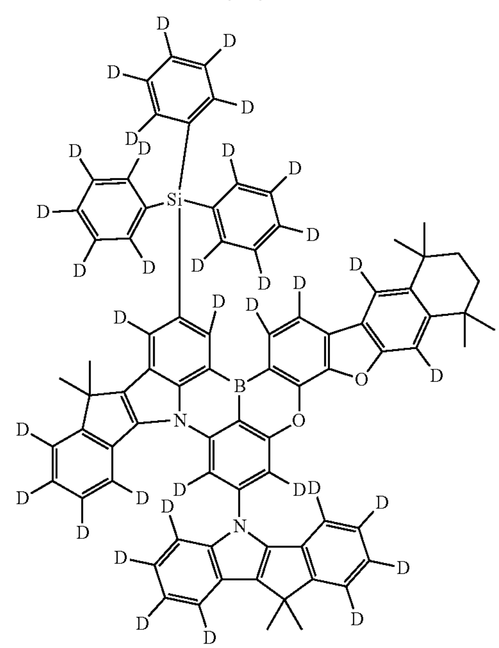

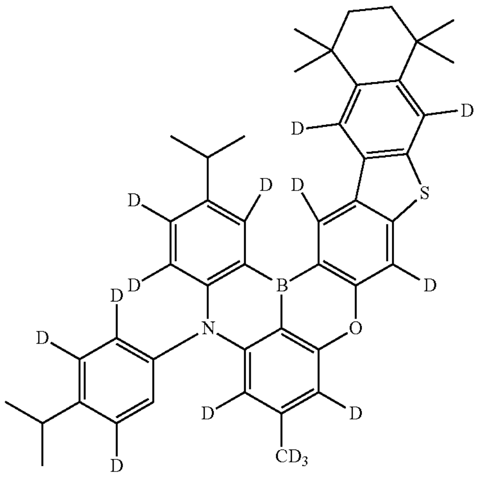
D
D
D
D
D
D
D
D
D
D
D
D
S
B
O
N
CD3
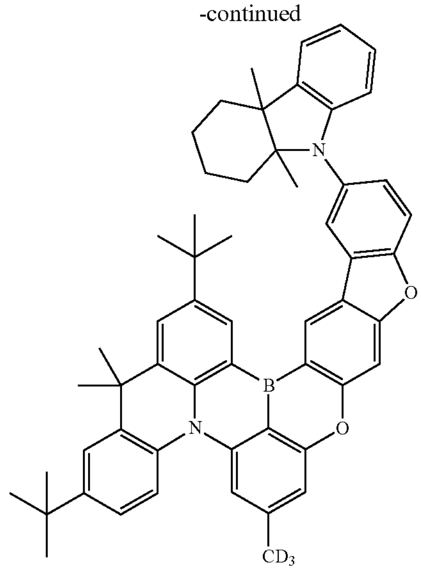
N
O
O
B
N
CD3
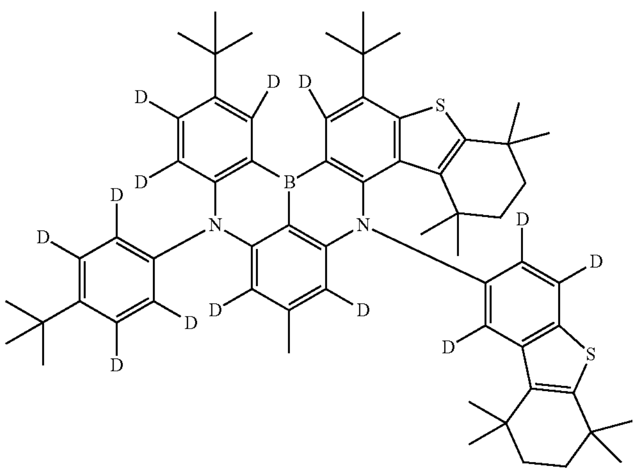
S
B
N
N
S
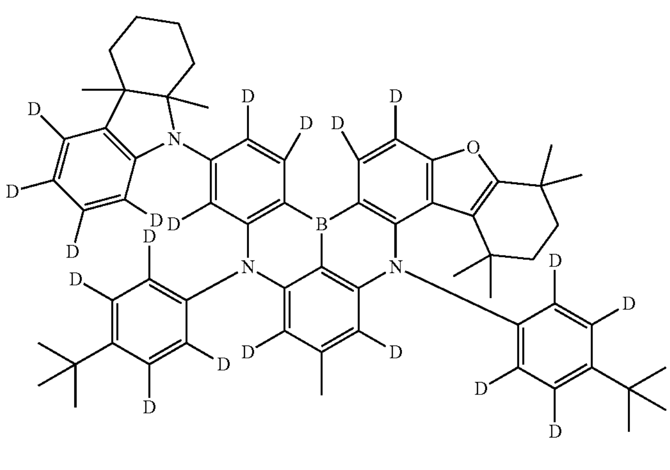
N
O
B
N
N -continued
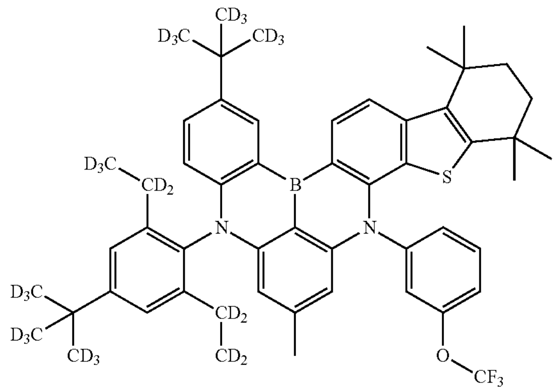
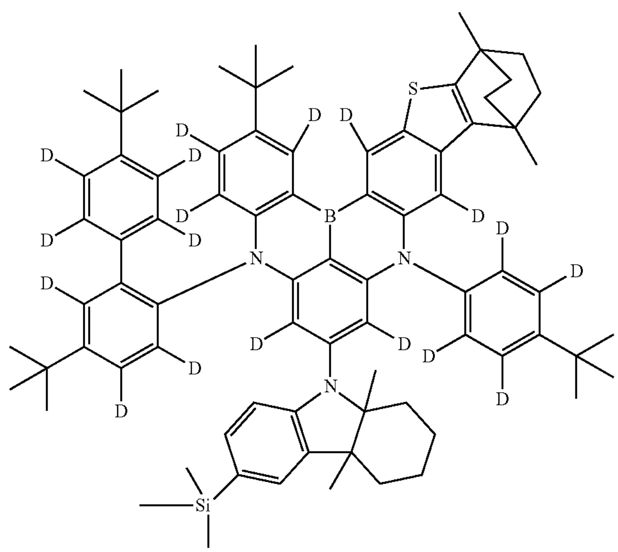
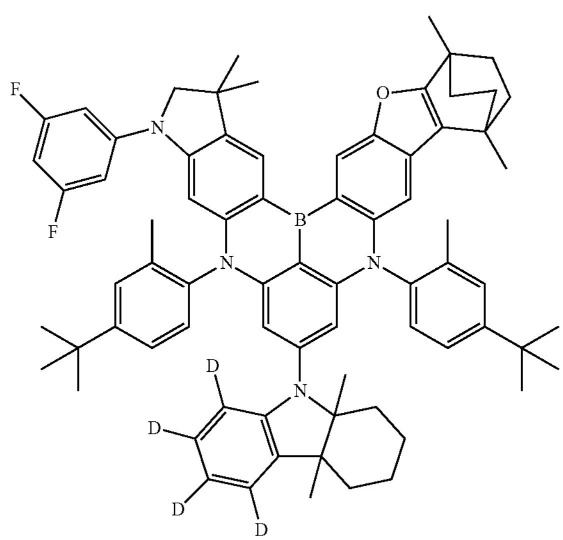
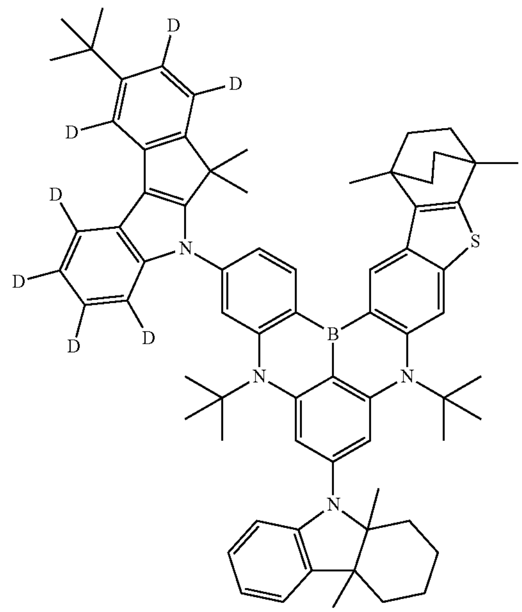

-continued
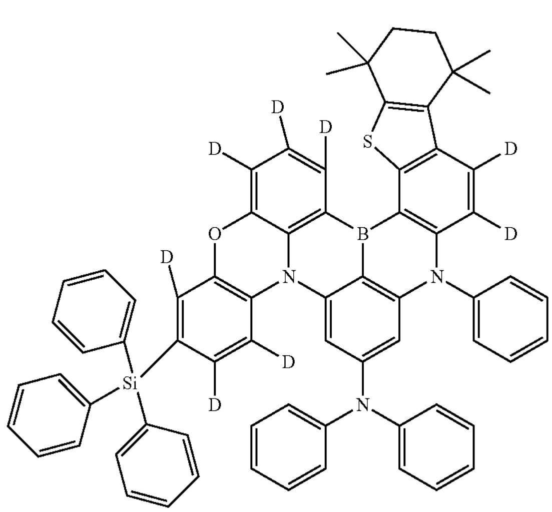
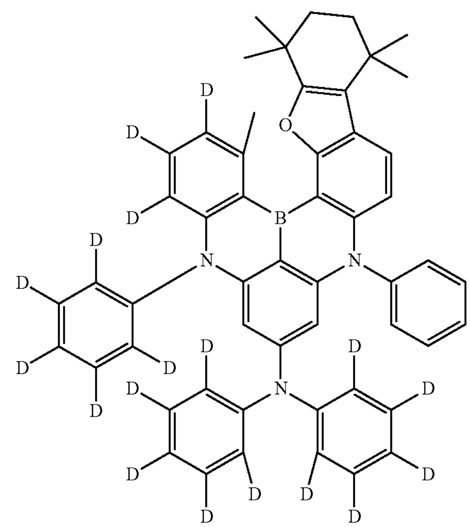
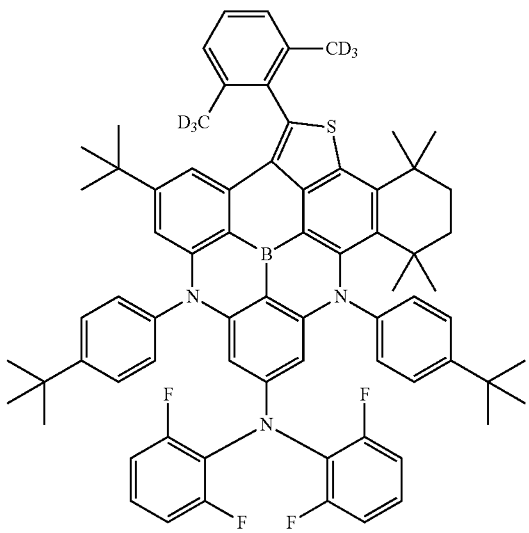
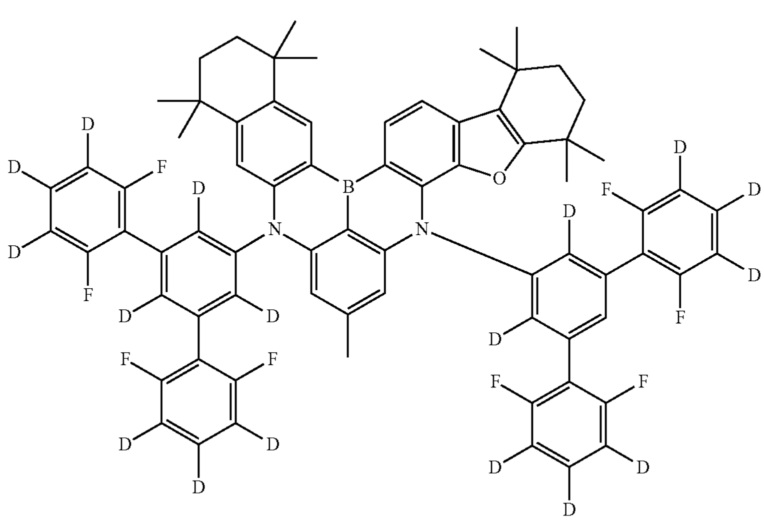

-continued
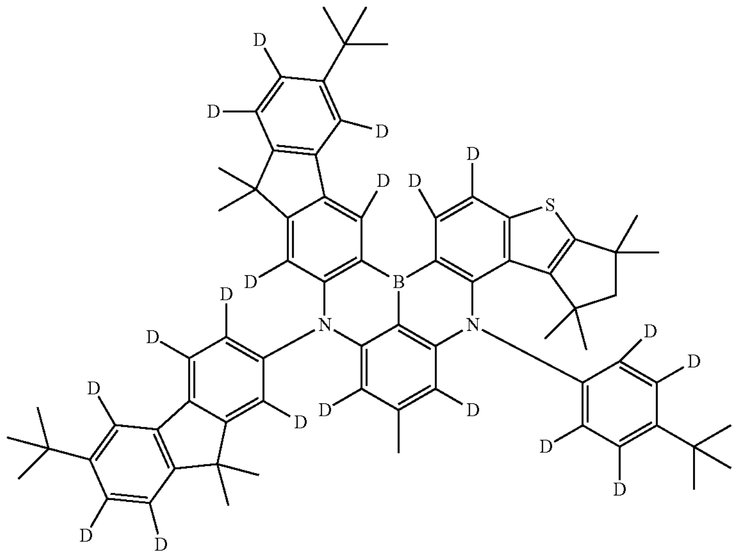
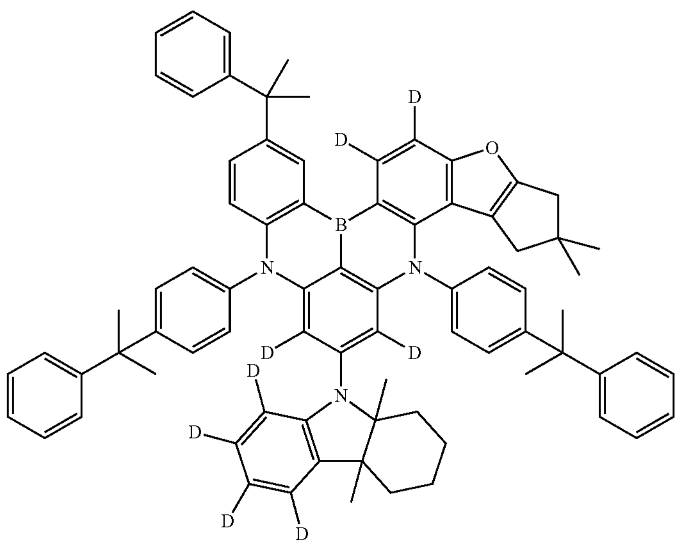
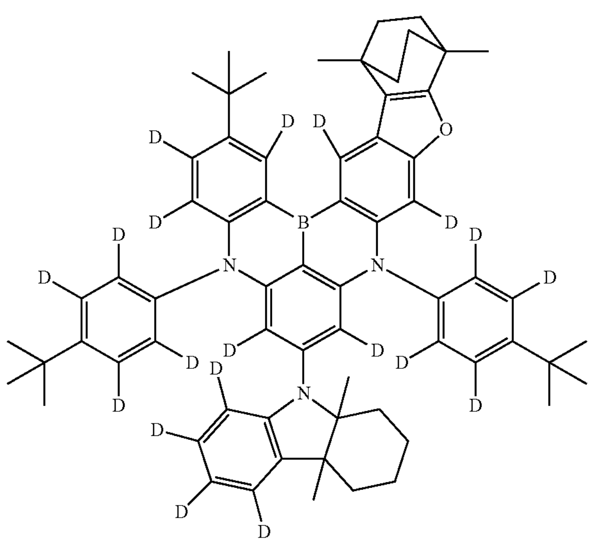

-continued
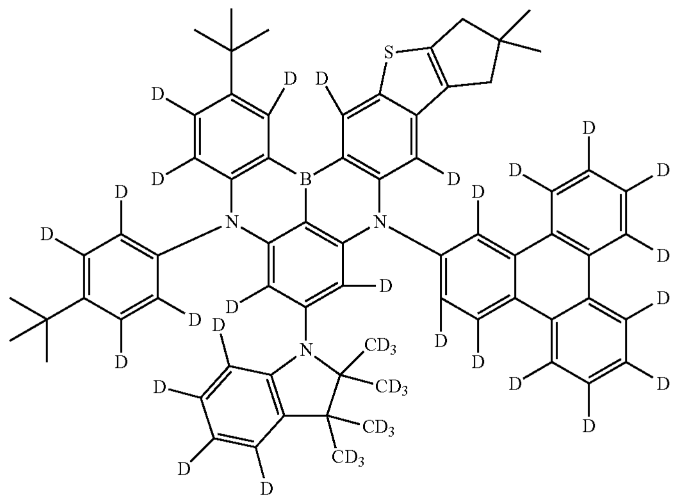
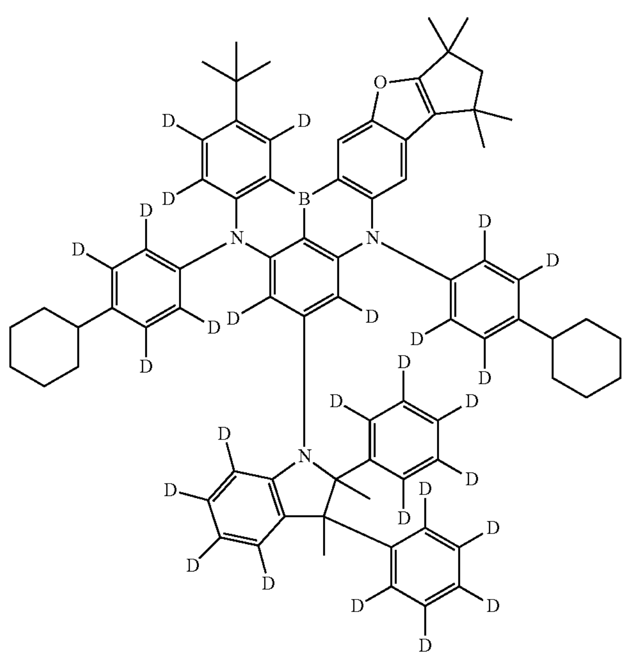

-continued
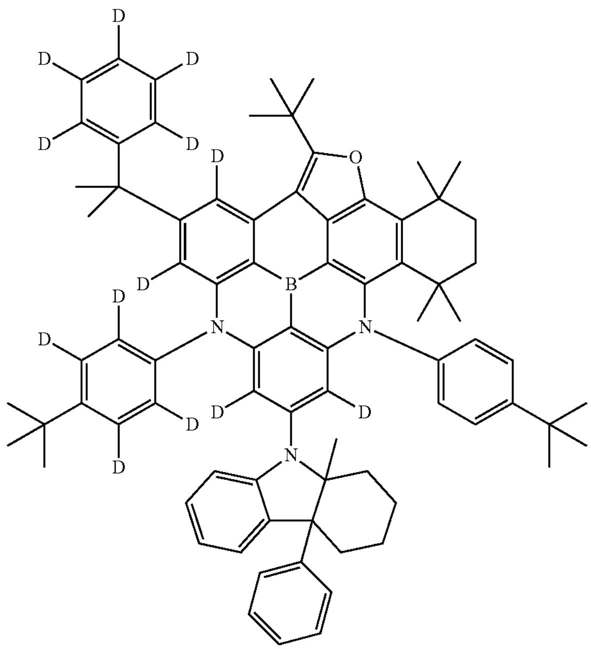
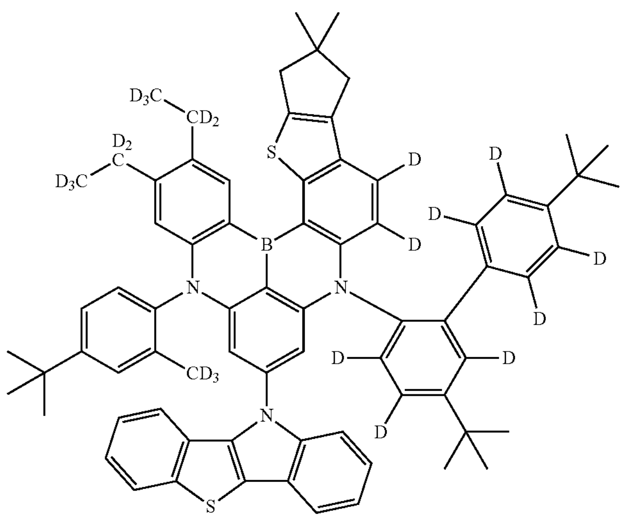
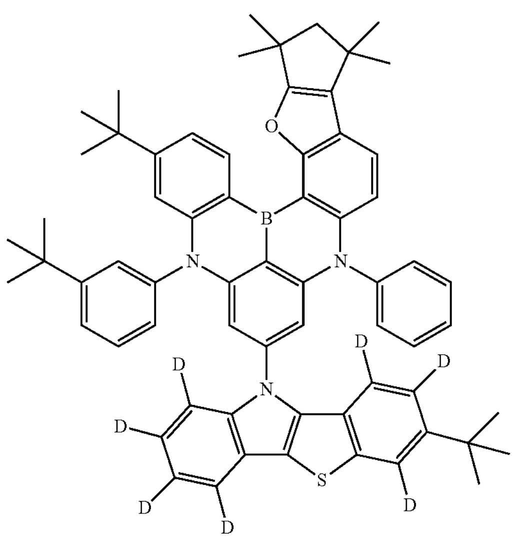

-continued
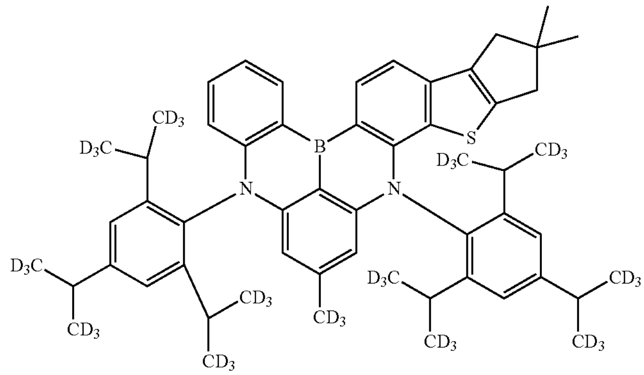
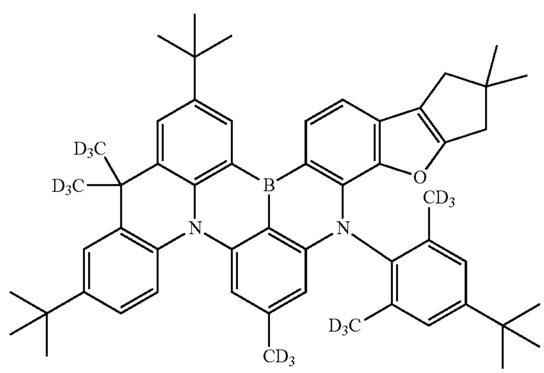
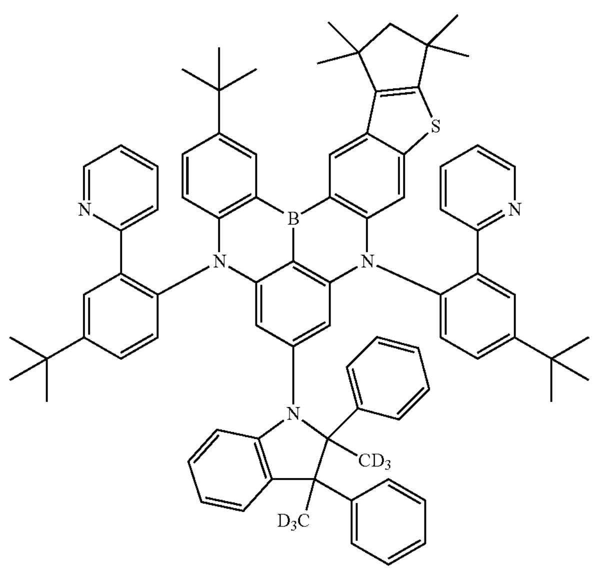

-continued
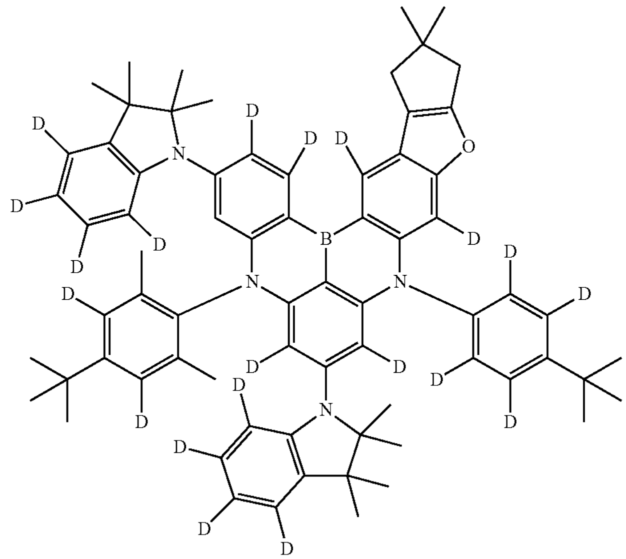
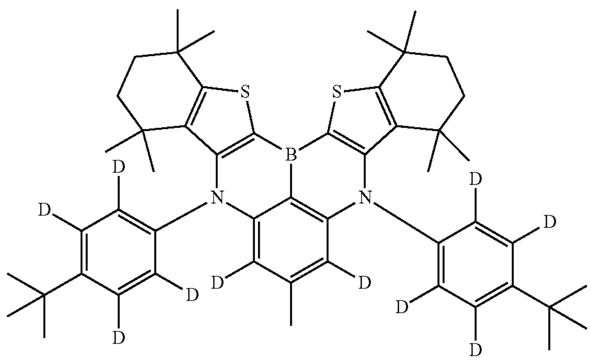
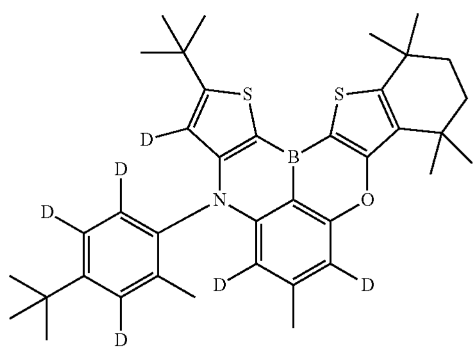
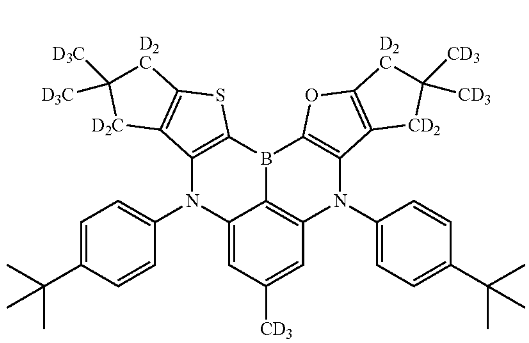
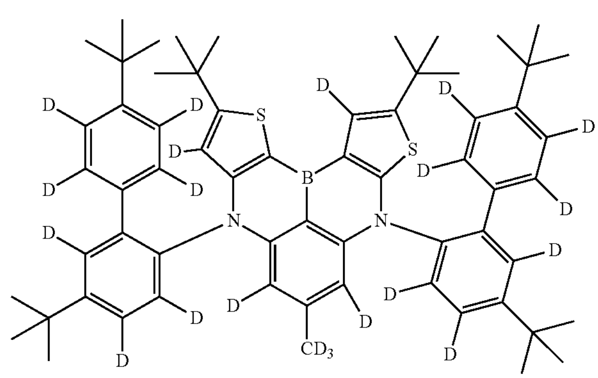

-continued
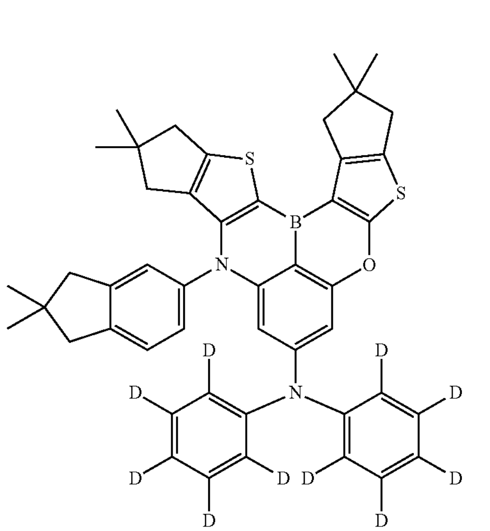
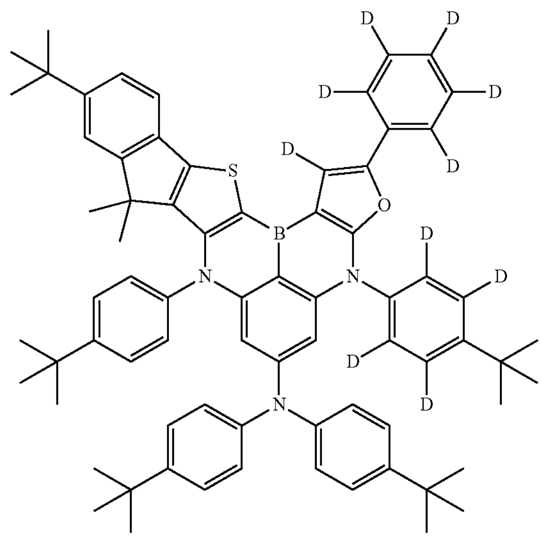
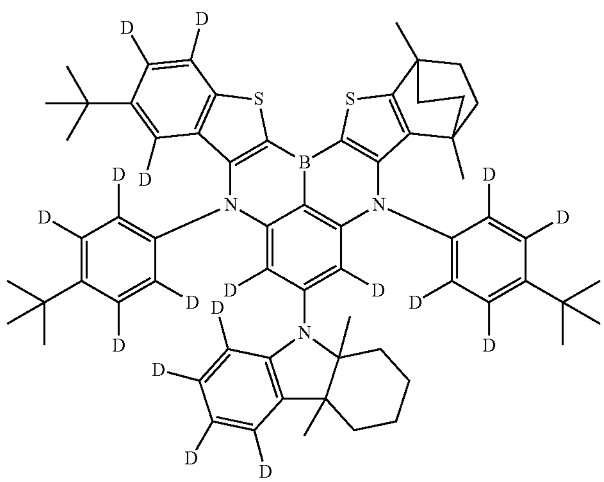
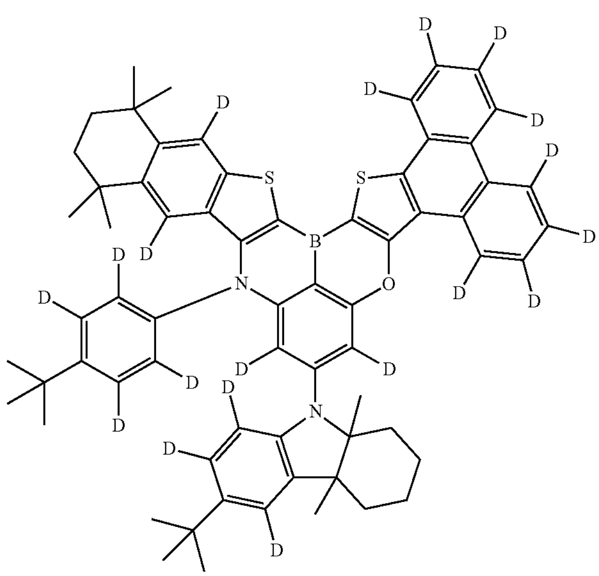

-continued
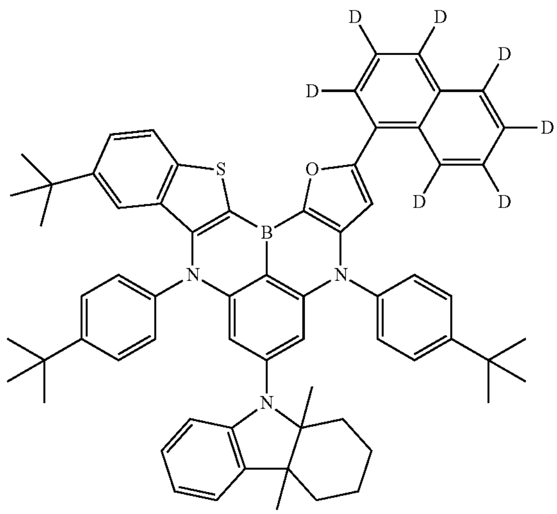
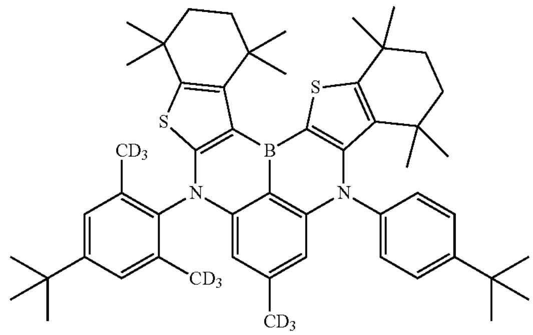
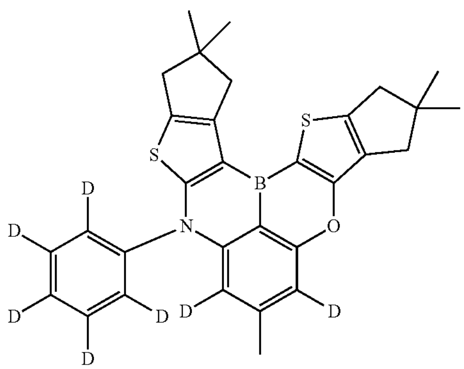
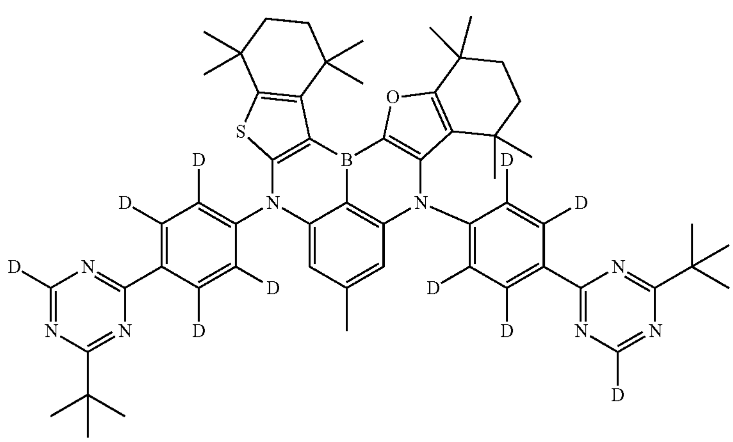
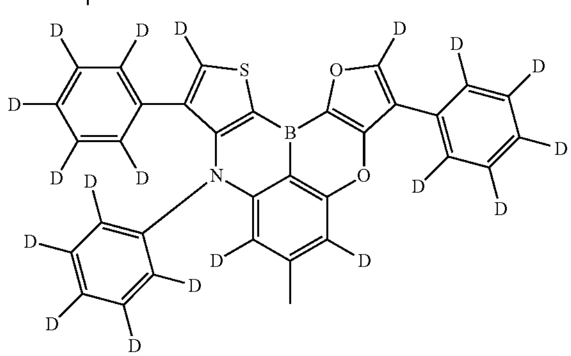

-continued
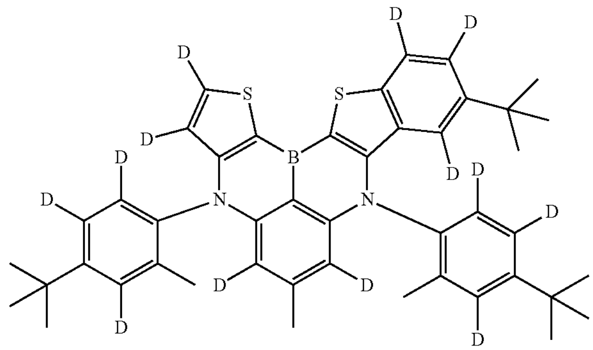
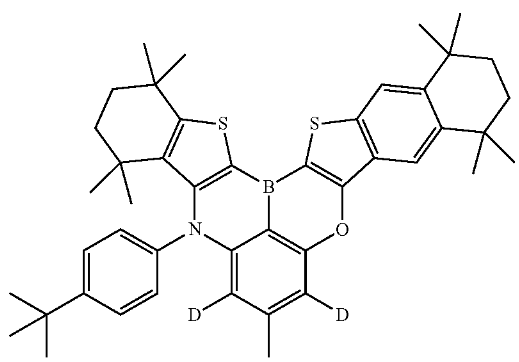
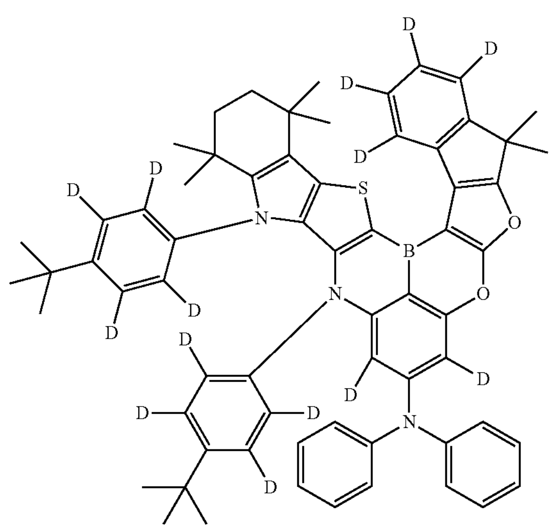

-continued
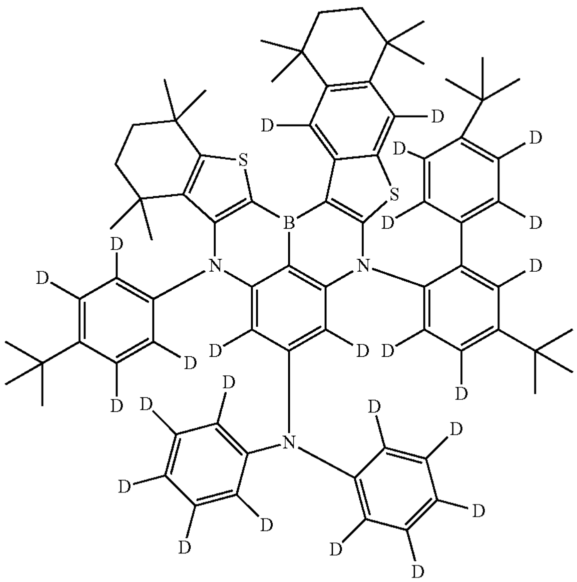
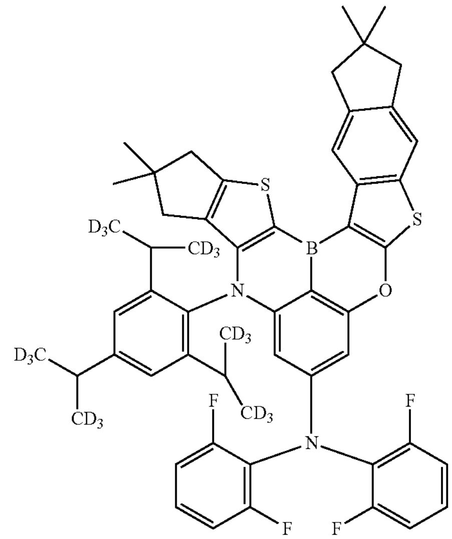
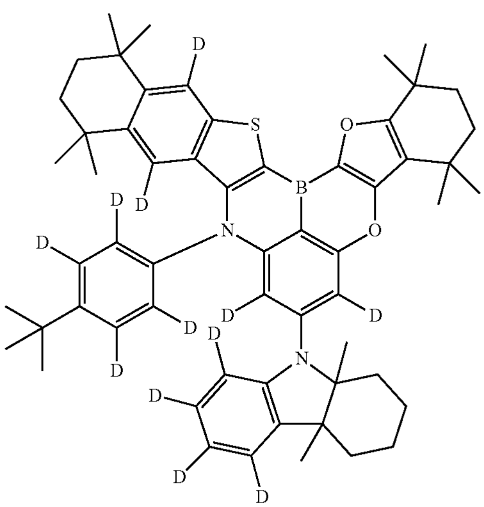
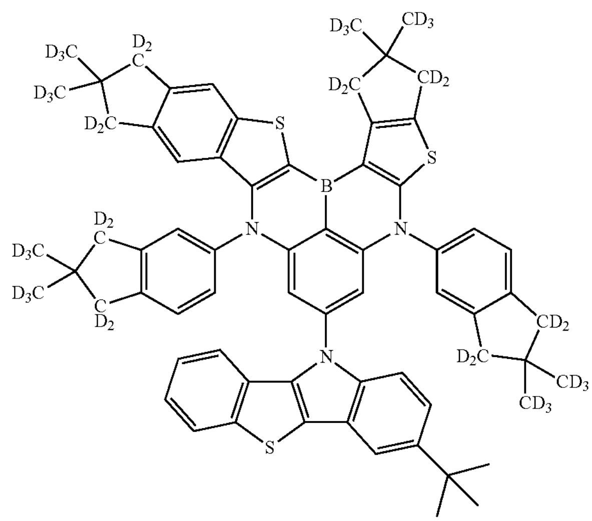
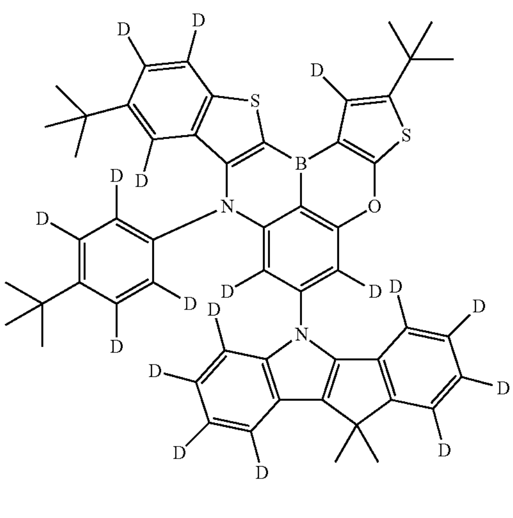
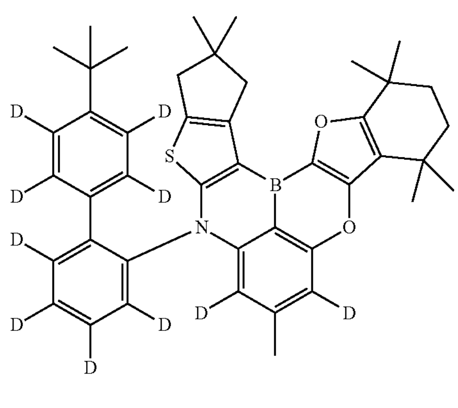

-continued
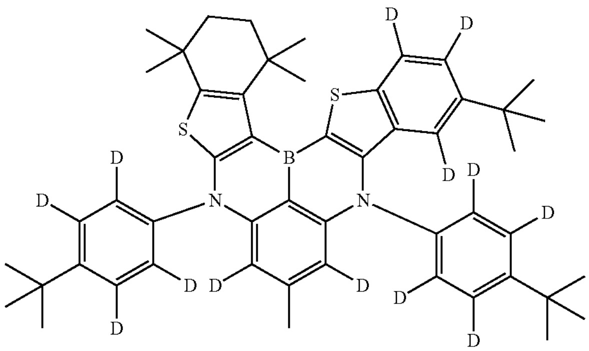
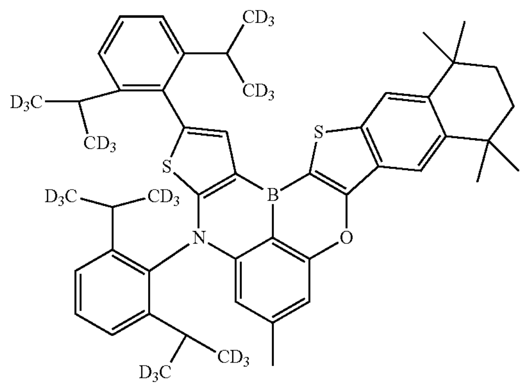
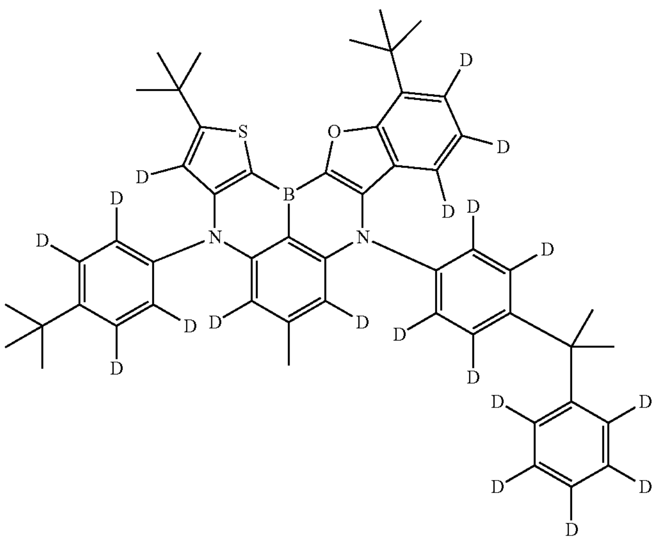
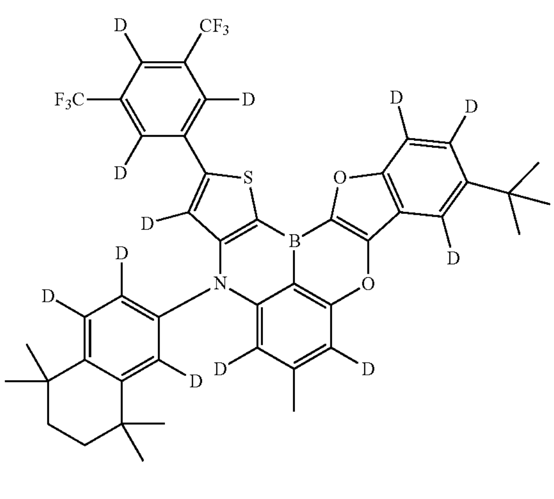
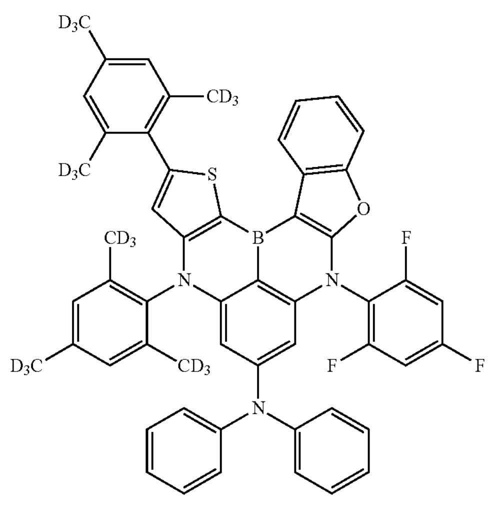

-continued
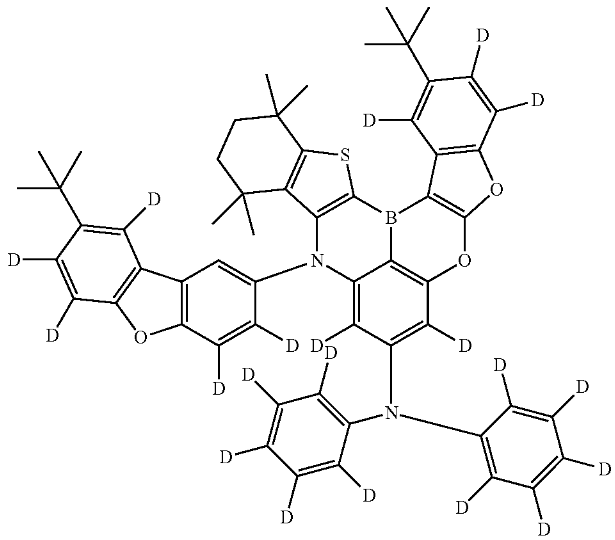
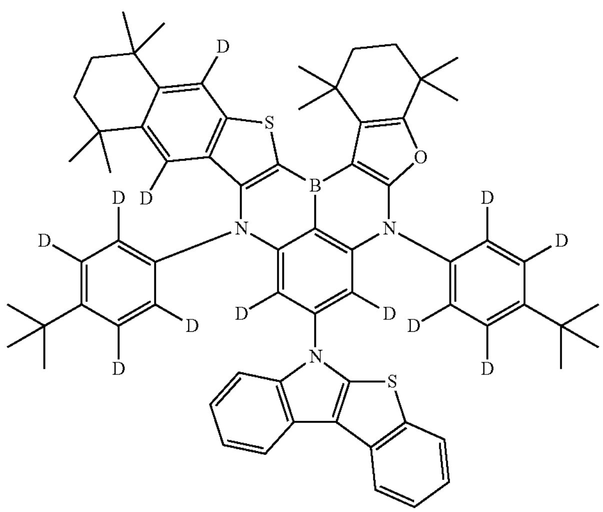
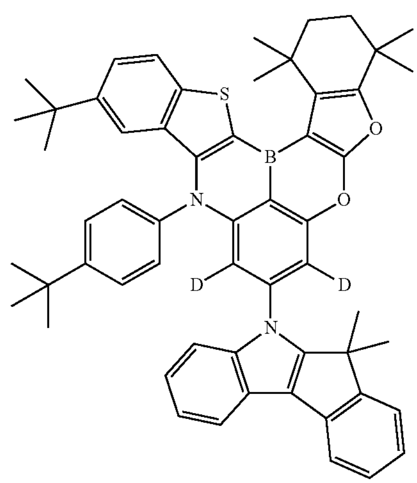
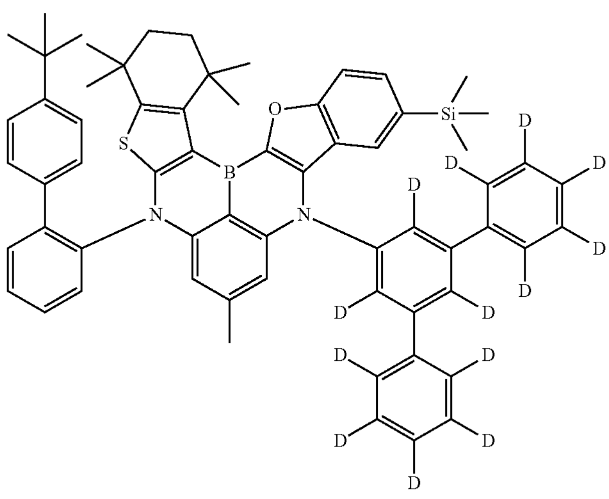

-continued
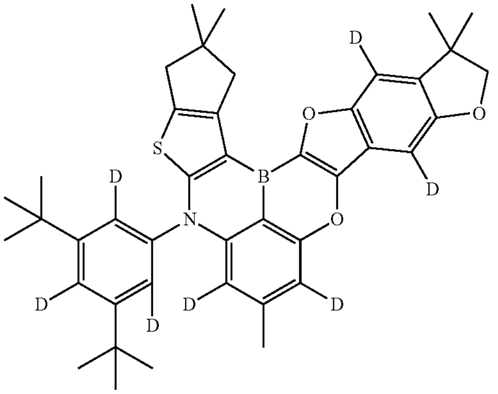
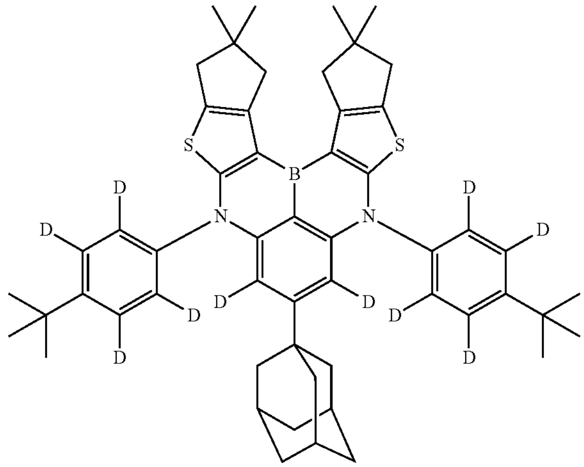
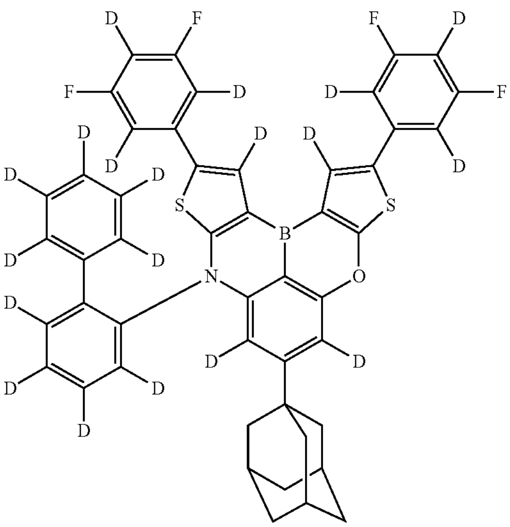
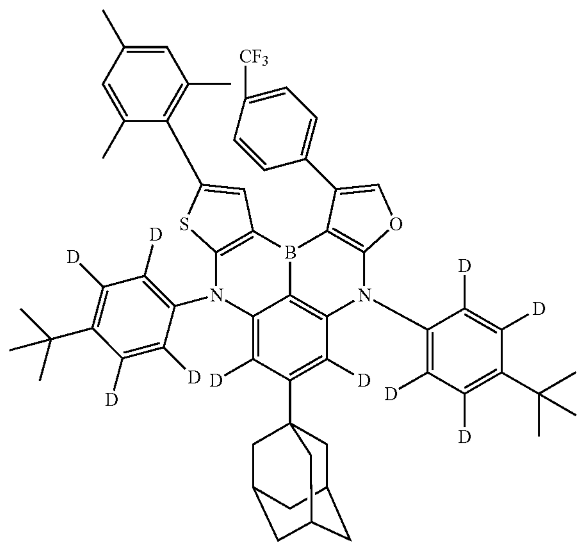
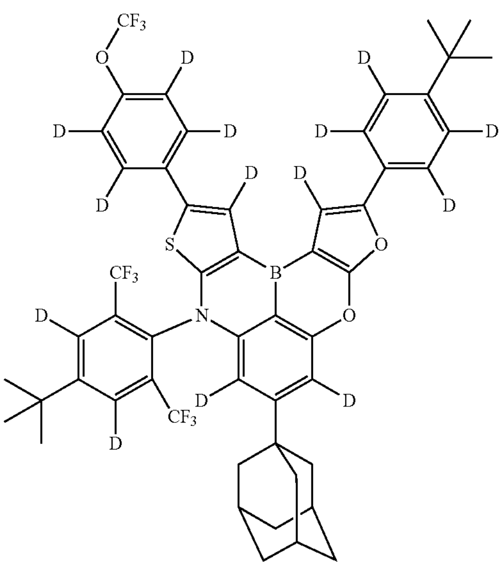

-continued
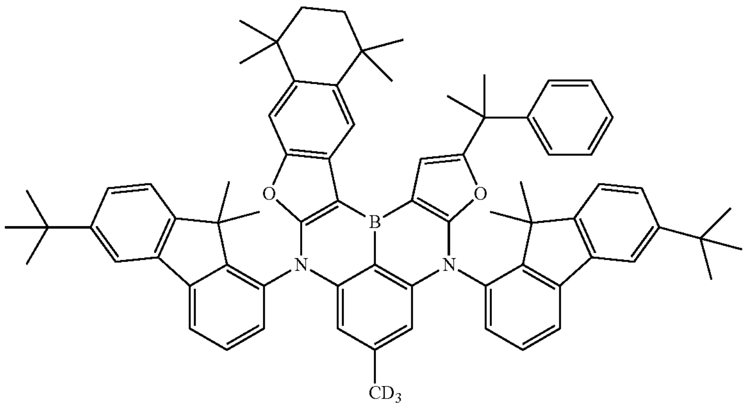
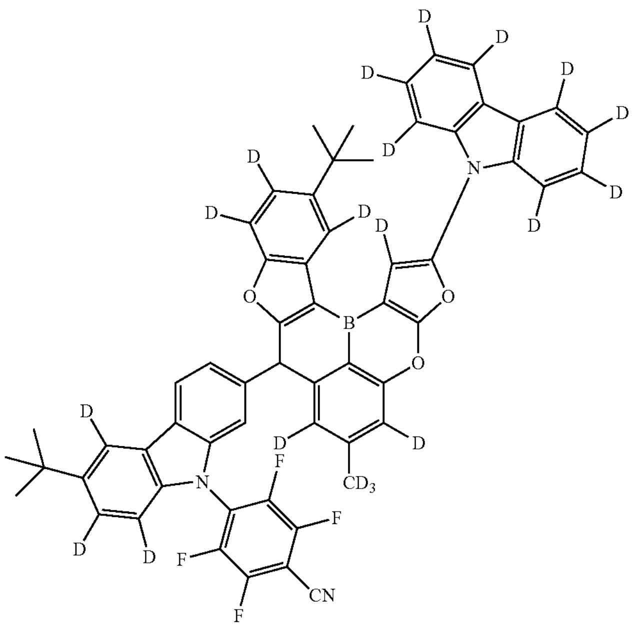
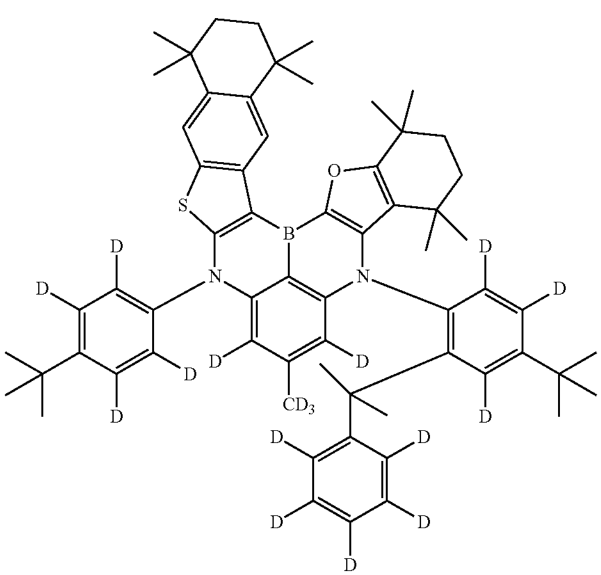

-continued
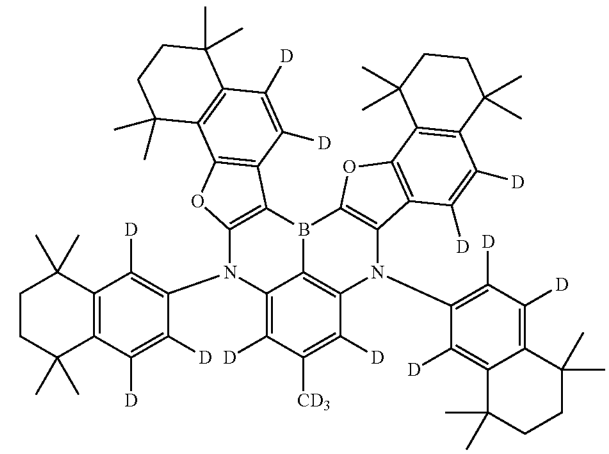
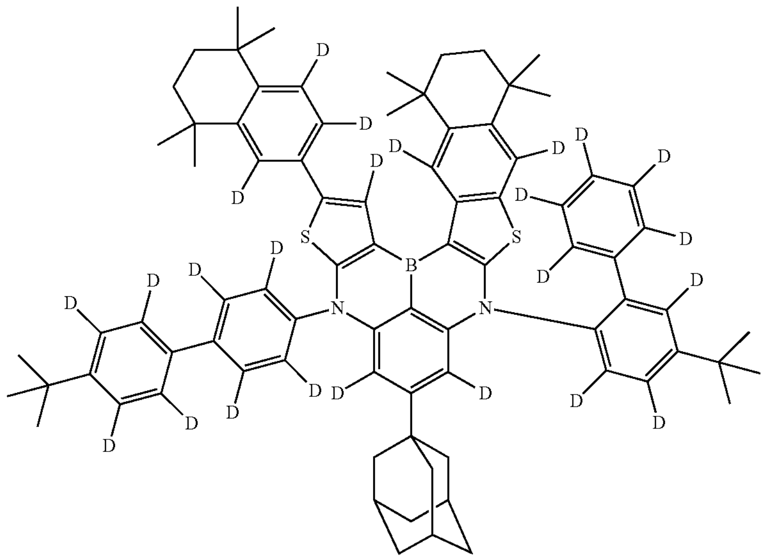
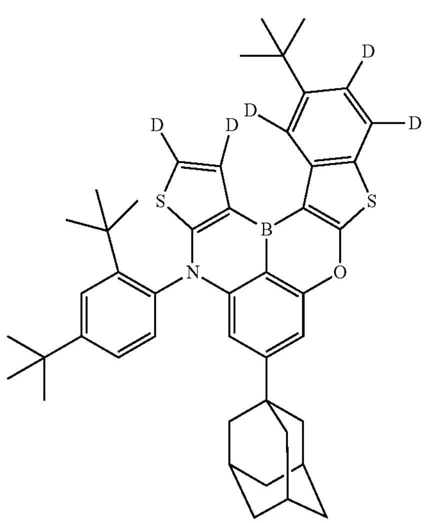
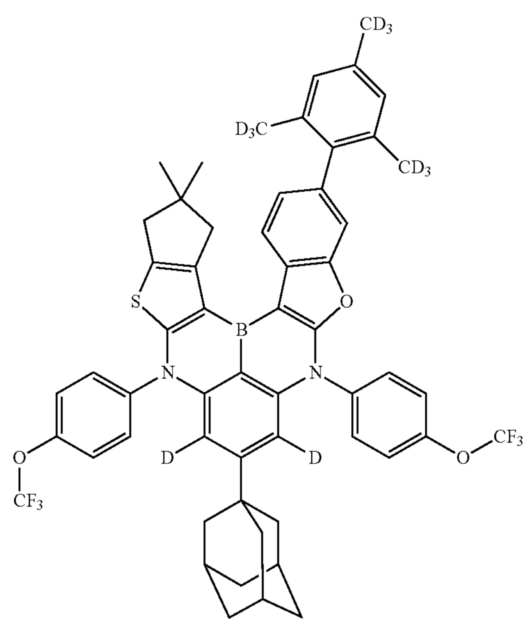

-continued
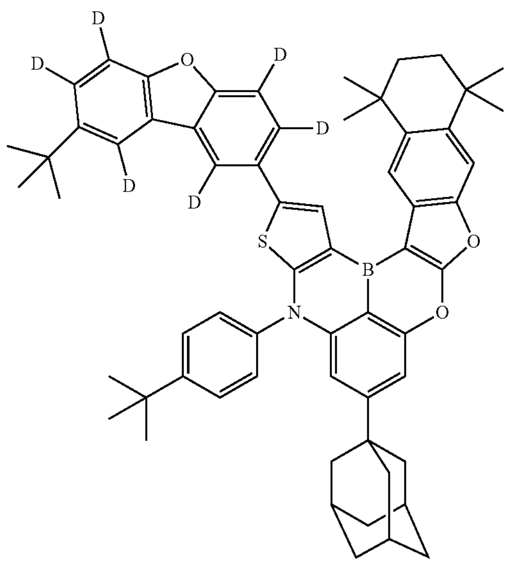
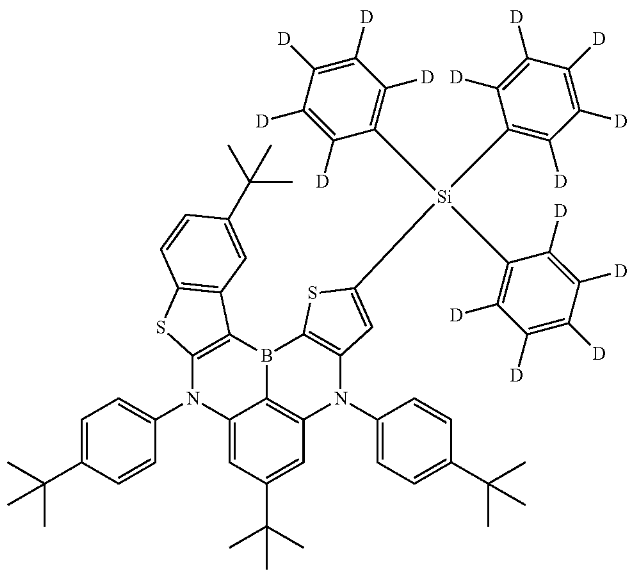
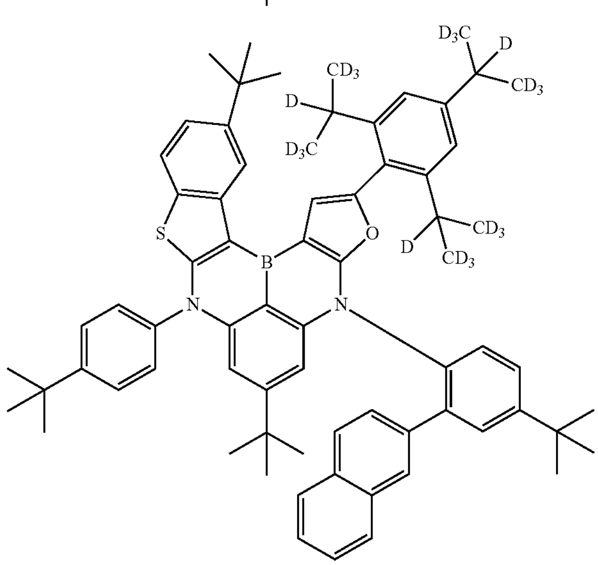
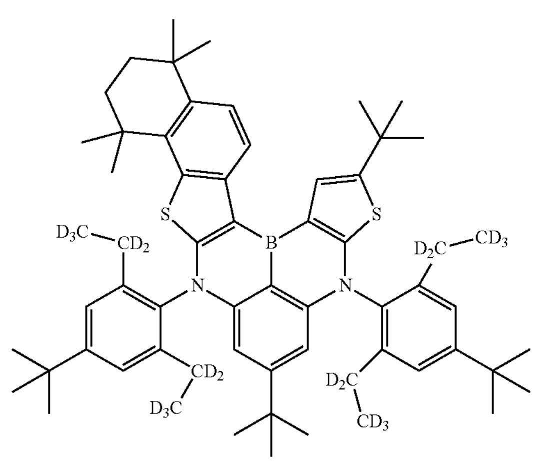

-continued
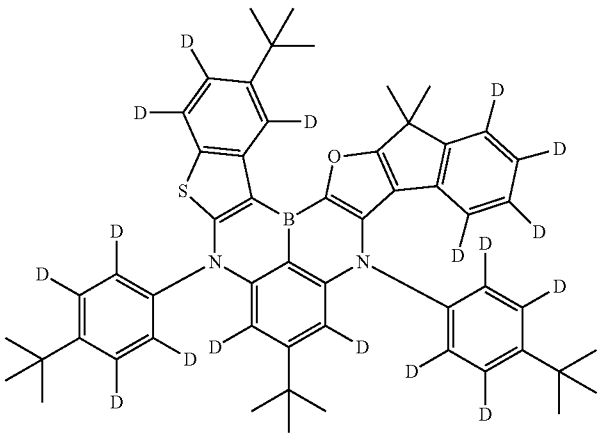
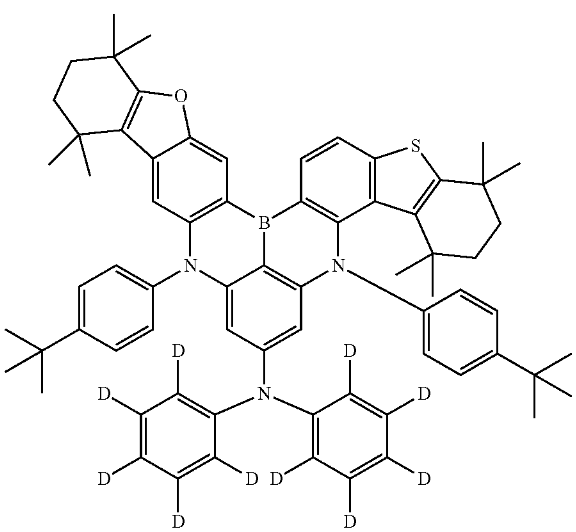
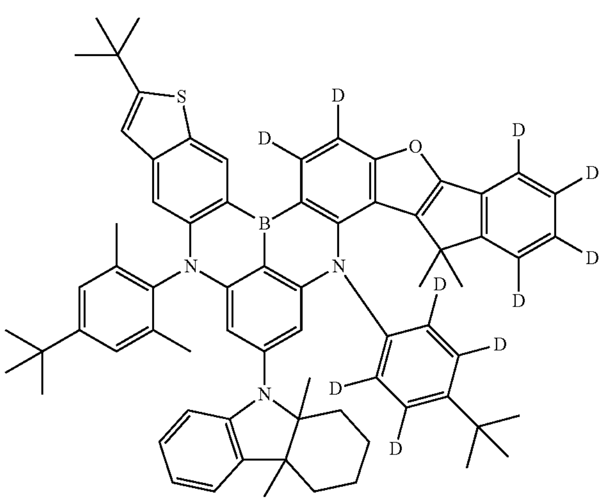

-continued
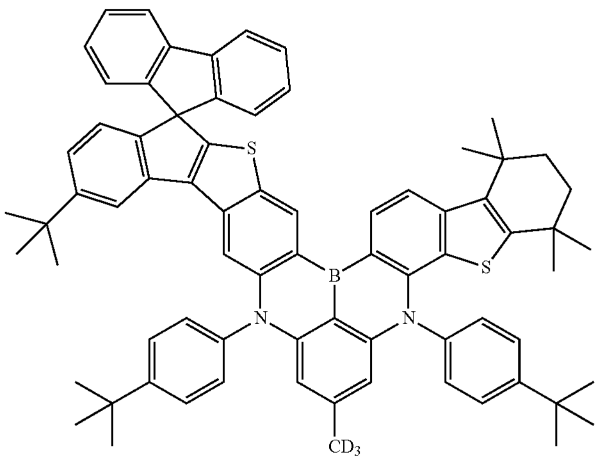
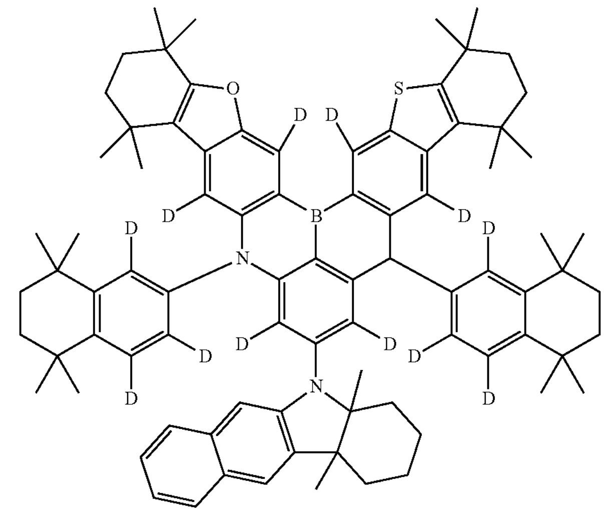
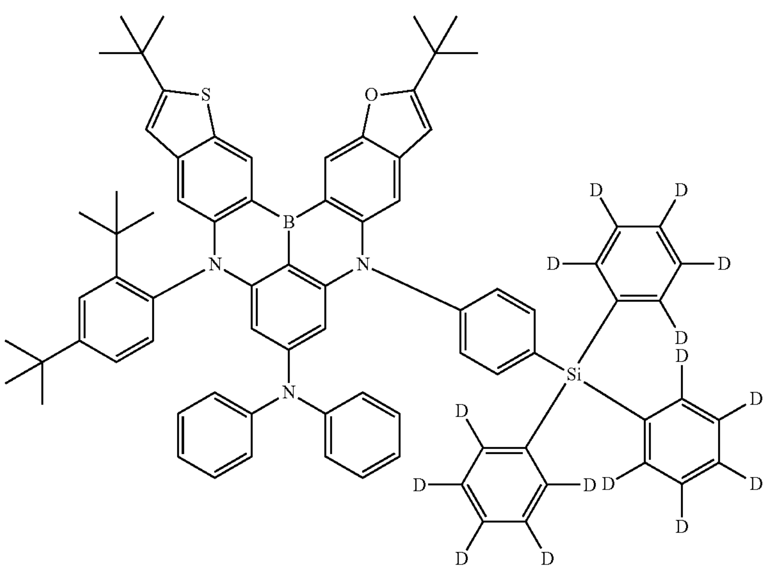

-continued
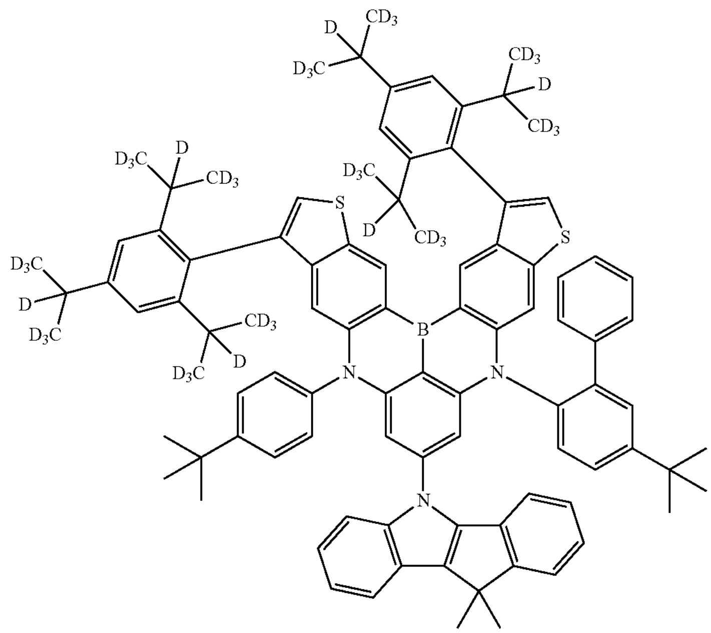
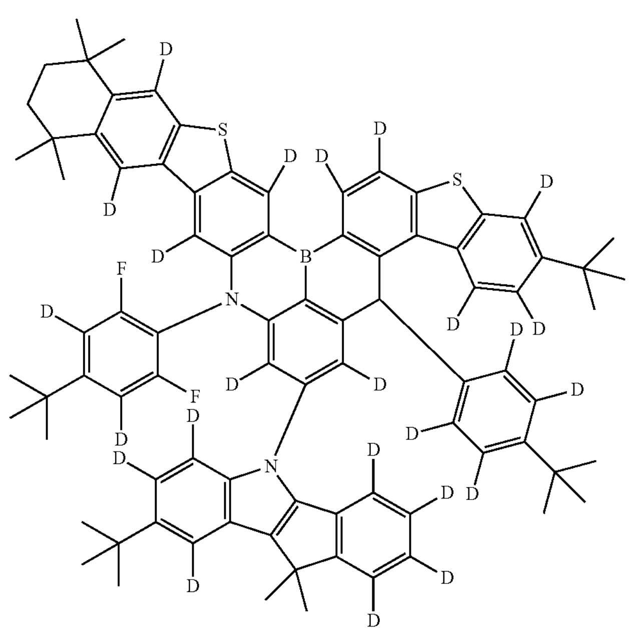

-continued
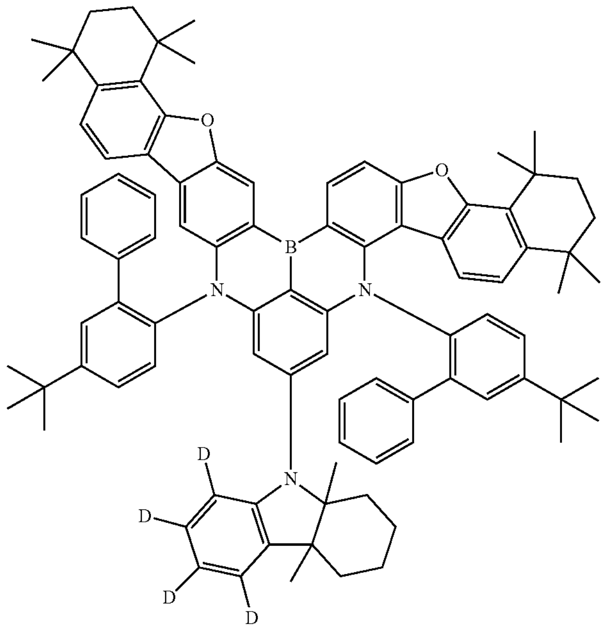
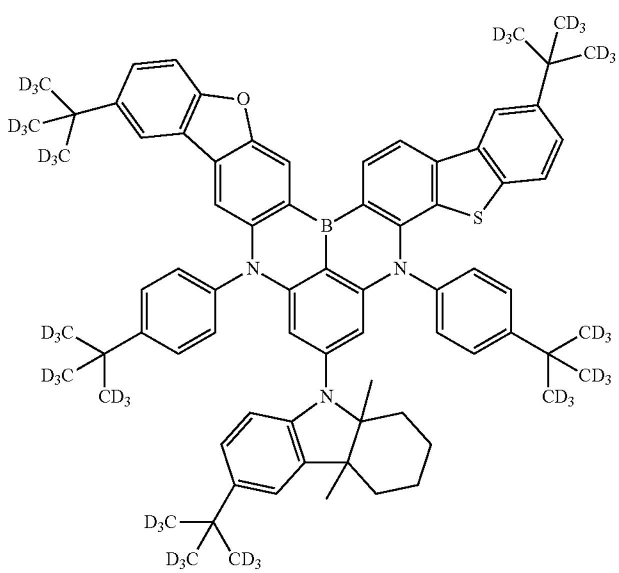

-continued
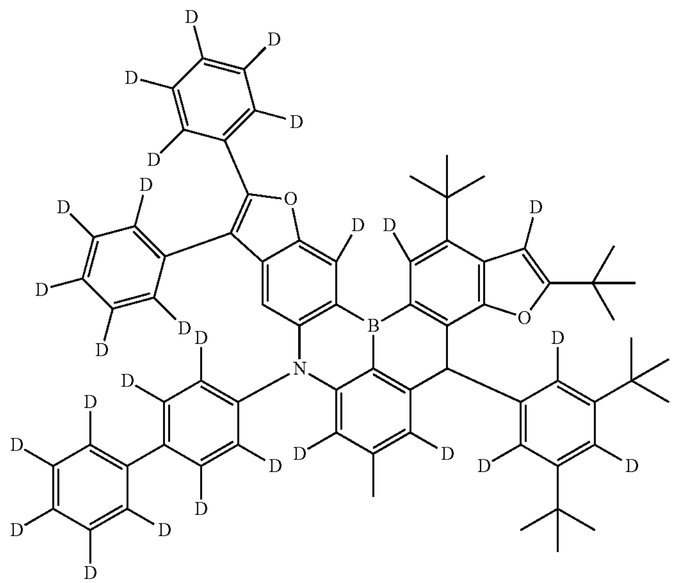
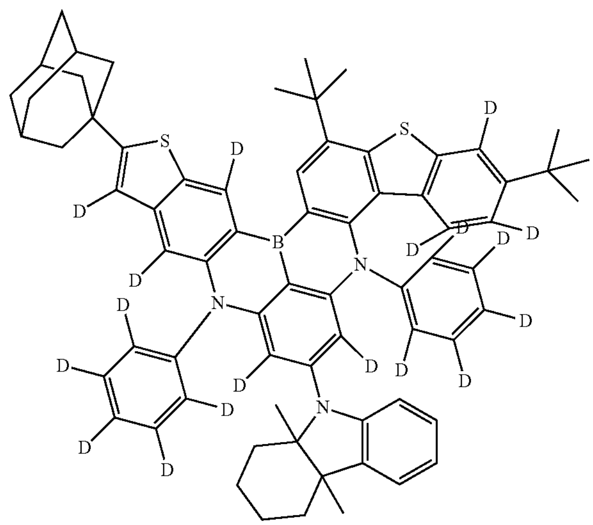
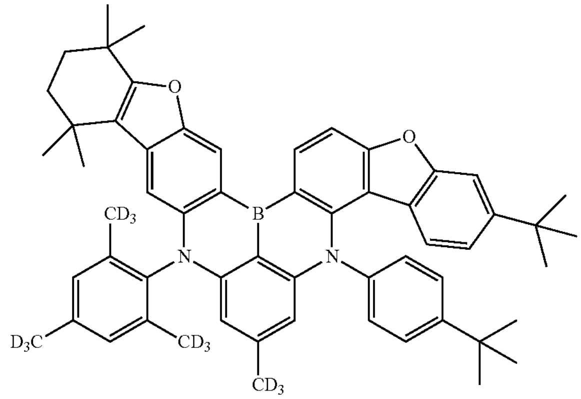

-continued
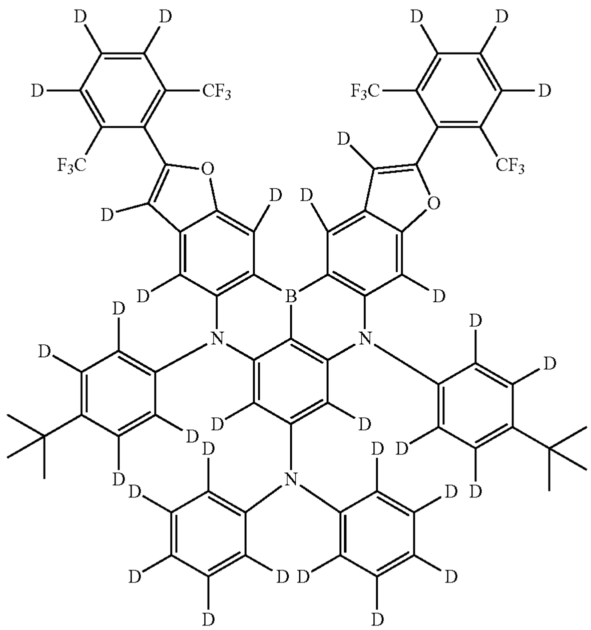
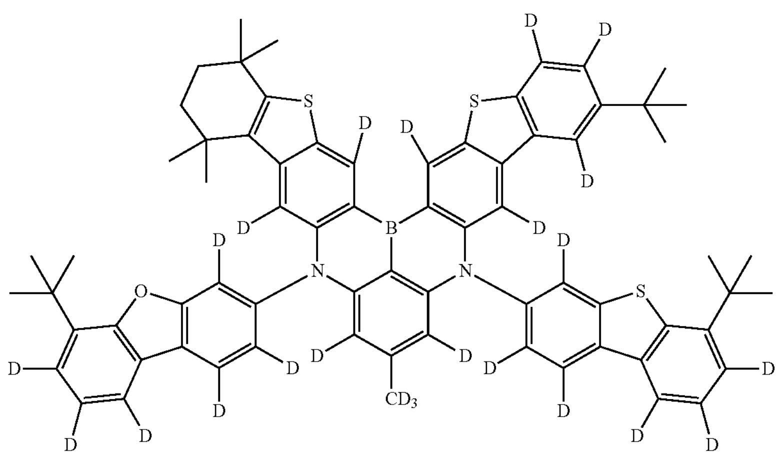 [SMILES: [2H]c1c2c3c(c([2H])c1C([2H])([2H])[2H])N(c1c([2H])c([2H])c4c(sc5c(C(C)(C)C)c([2H])c([2H])c([2H])c54)c1[2H])c1c(c([2H])c4sc5c([2H])c([2H])c(C(C)(C)C)c([2H])c5c4c1[2H])B3c1c(c([2H])c3c4c(sc3c1[2H])C(C)(C)CCC4(C)C)N2c1c([2H])c([2H])c2c(oc3c(C(C)(C)C)c([2H])c([2H])c([2H])c32)c1[2H]]
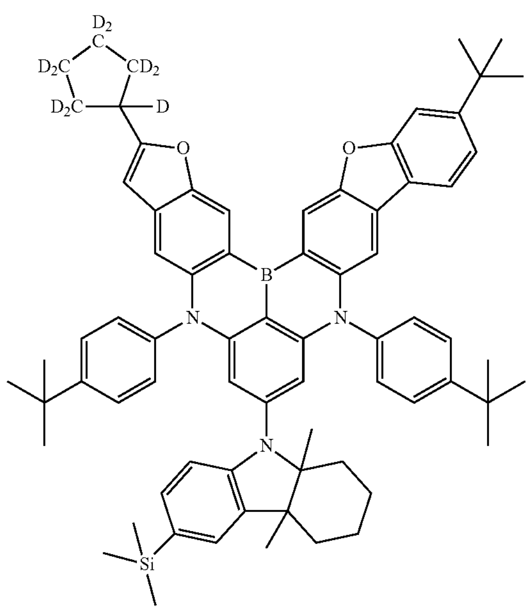

-continued
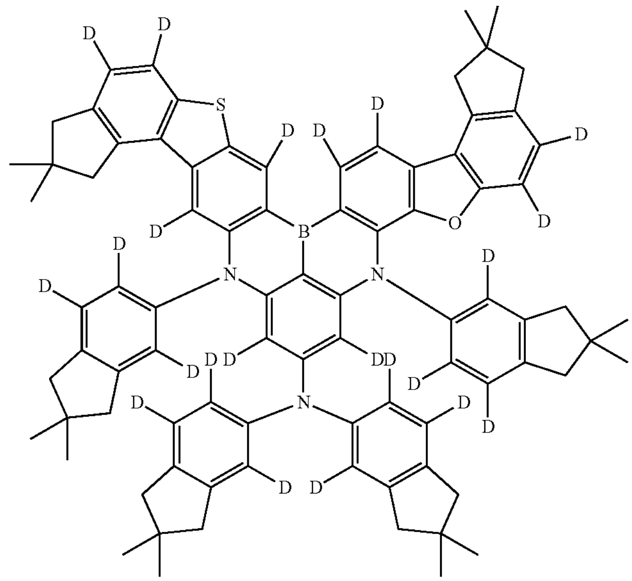
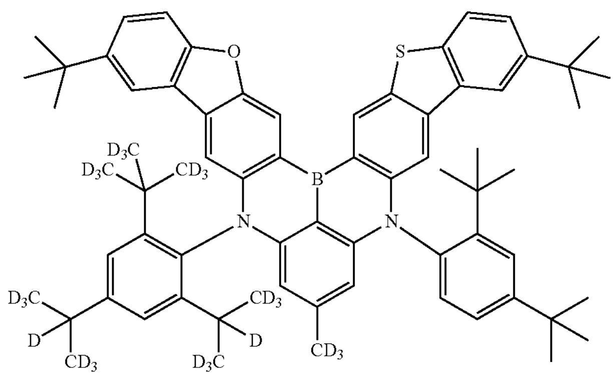
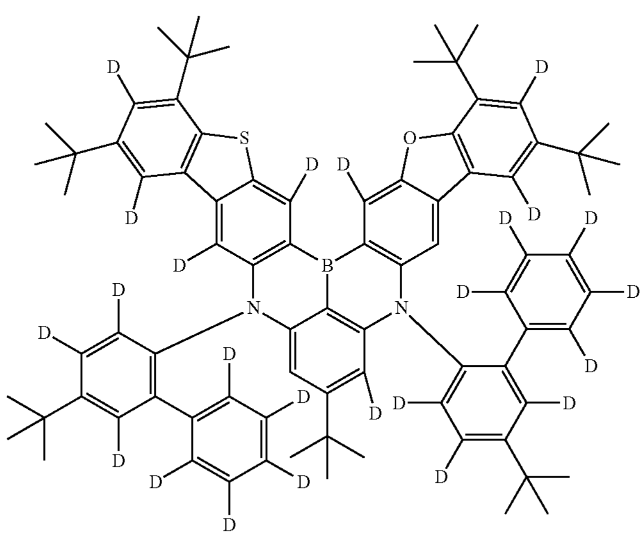
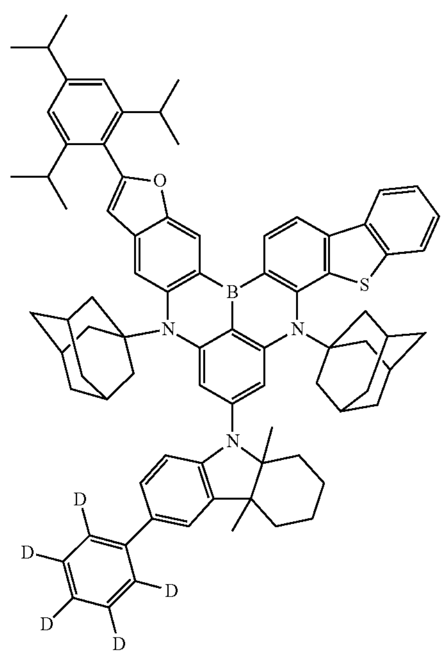

-continued
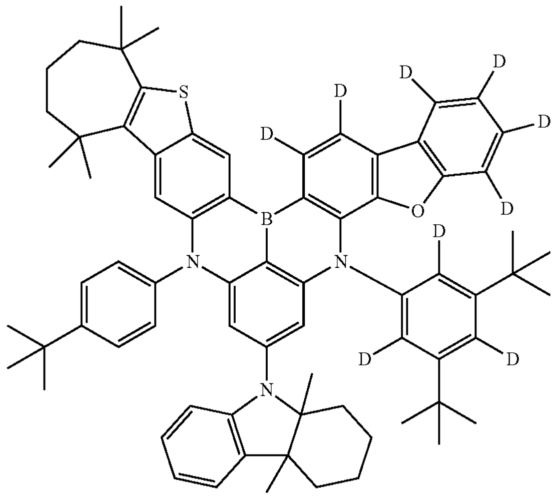
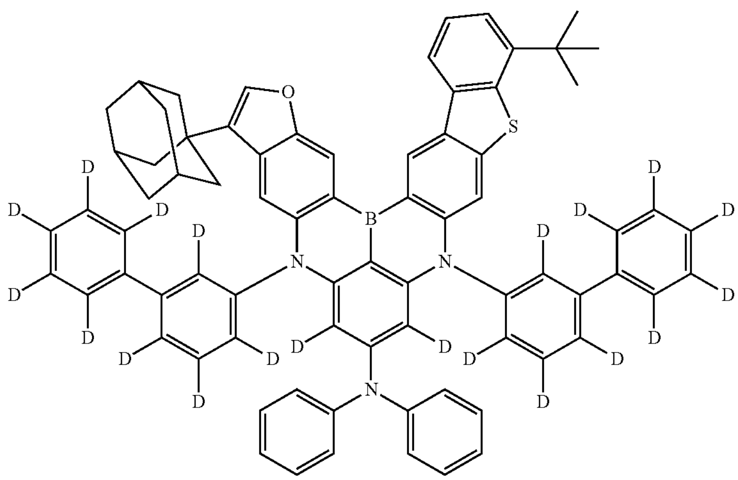
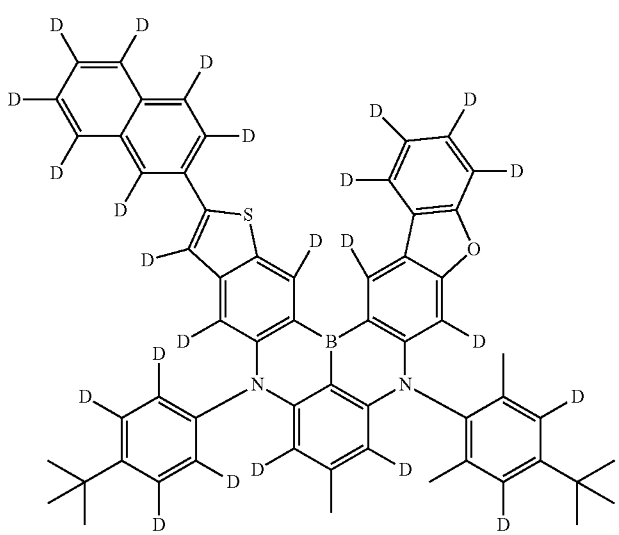

-continued
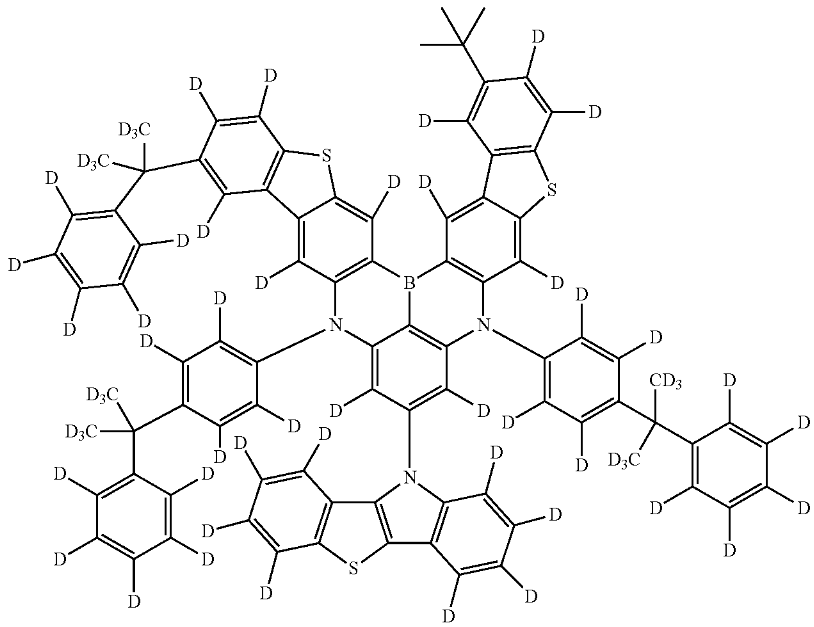
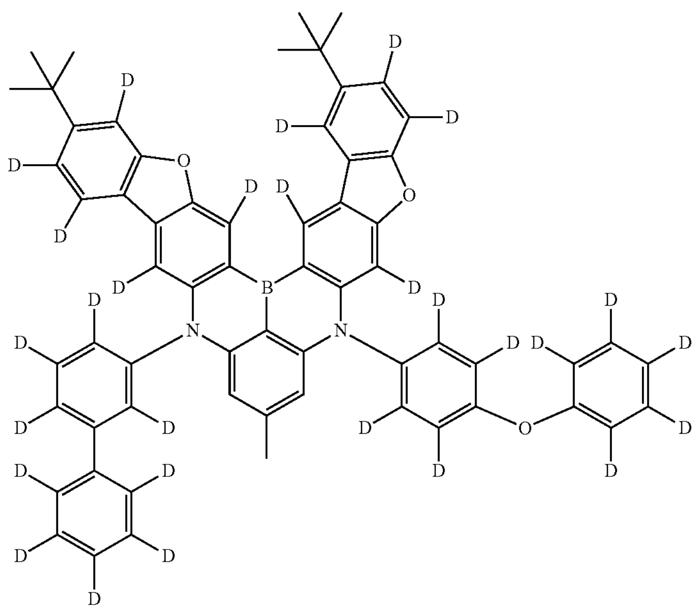
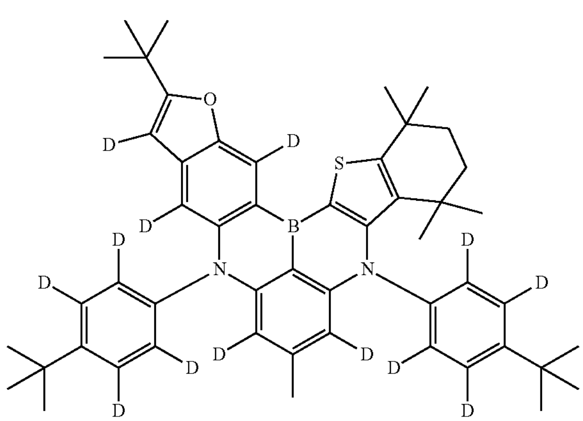
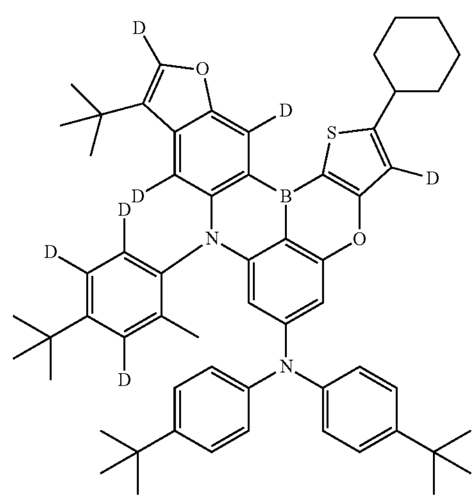

-continued
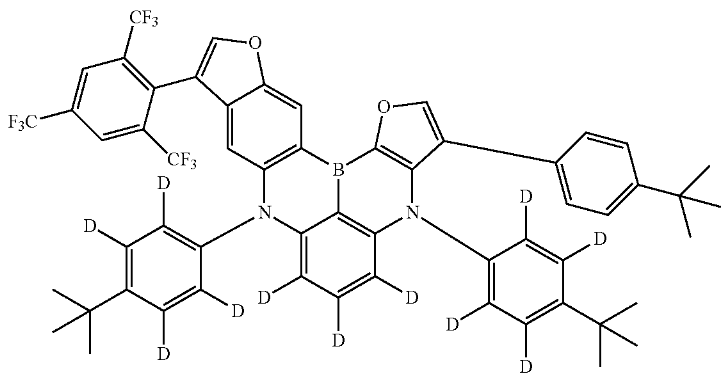
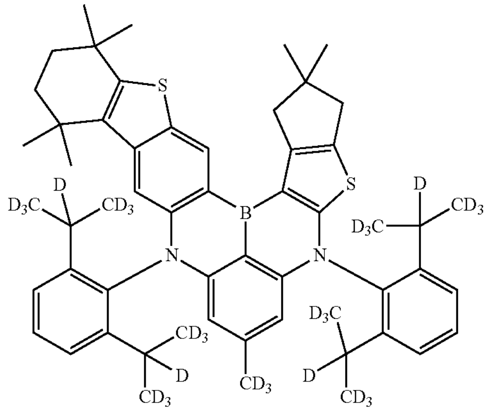
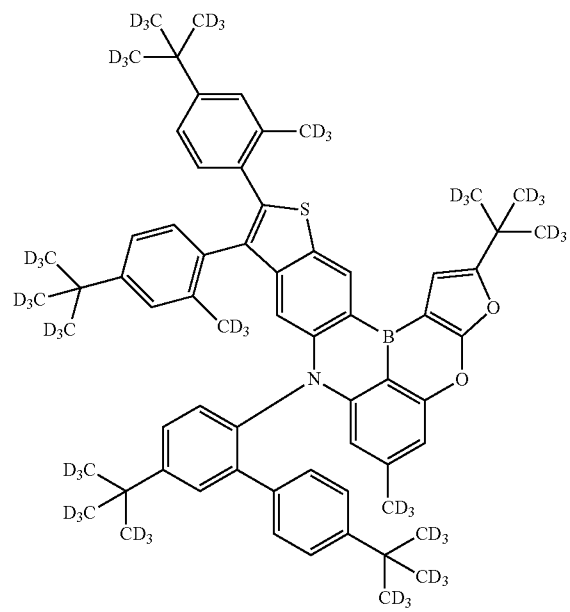
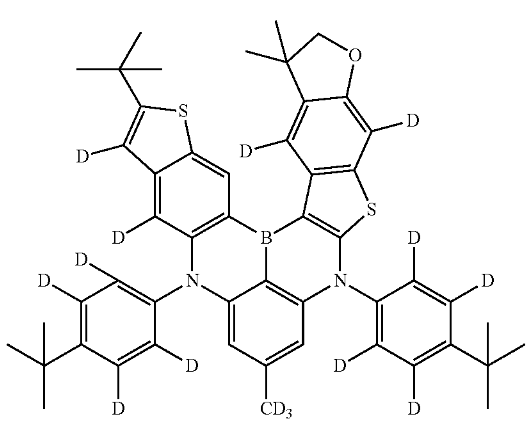
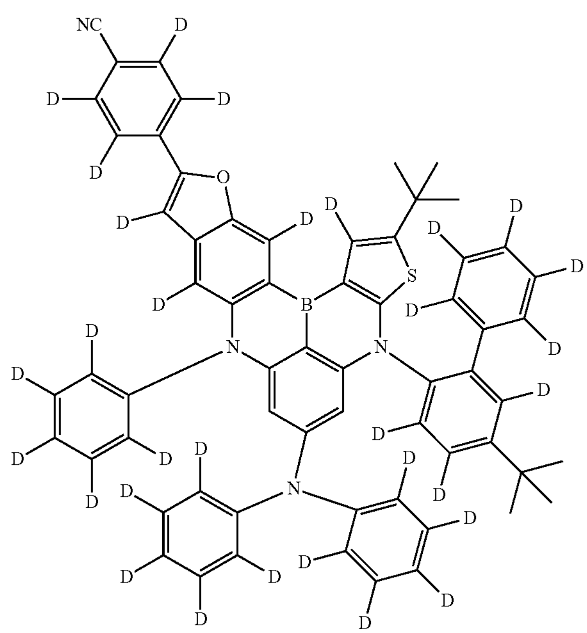

-continued
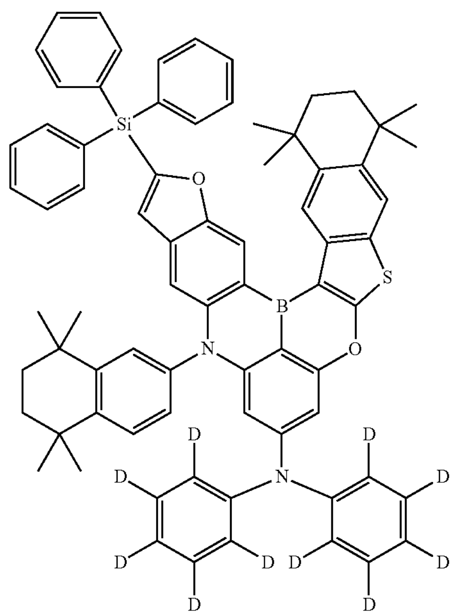
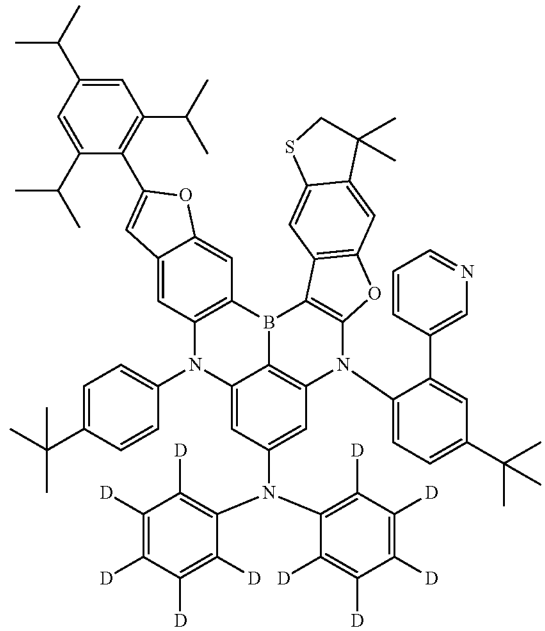
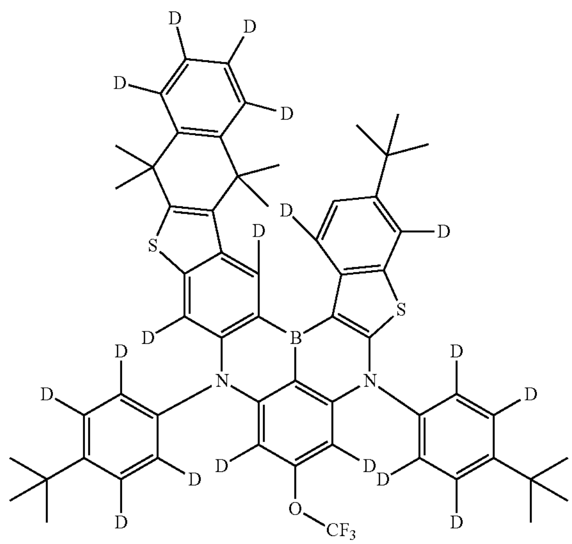
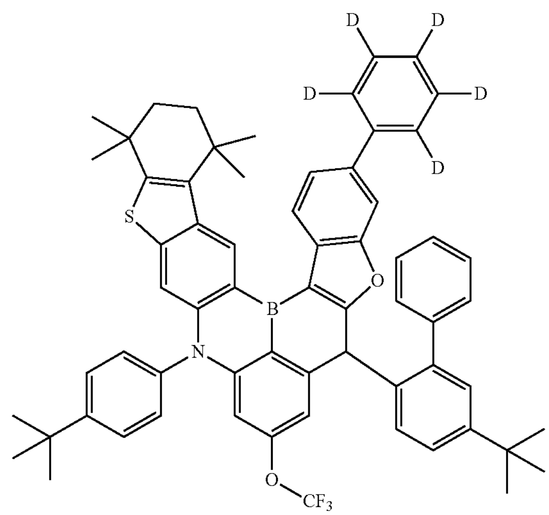
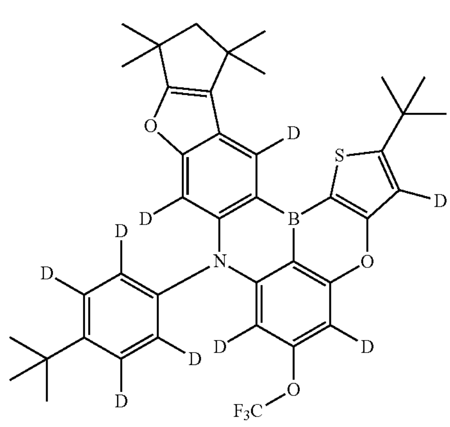 [SMILES: [2H]c1c(C(C)(C)C)sc2c1Oc1c([2H])c(OC(F)(F)F)c([2H])c3c1B2c1c(c([2H])c2oc4c(c2c1[2H])C(C)(C)CC4(C)C)N3c1c([2H])c([2H])c(C(C)(C)C)c([2H])c1[2H]]

-continued
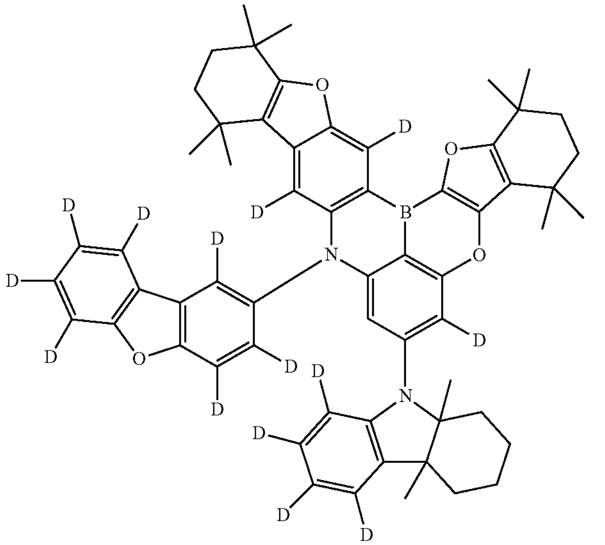
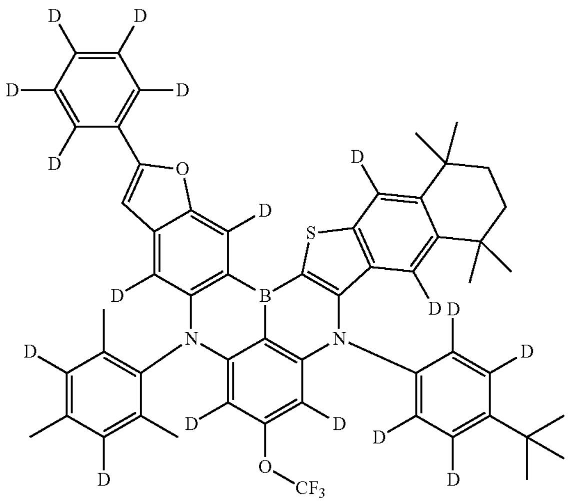
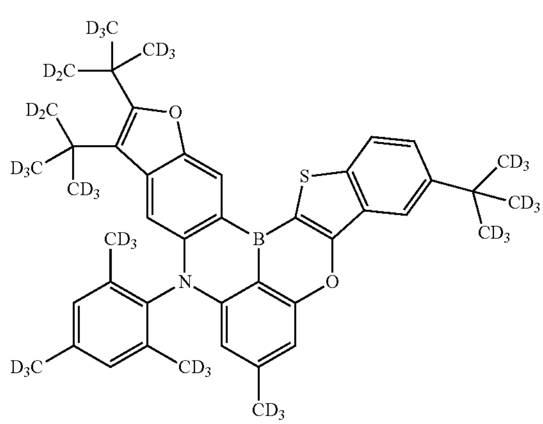
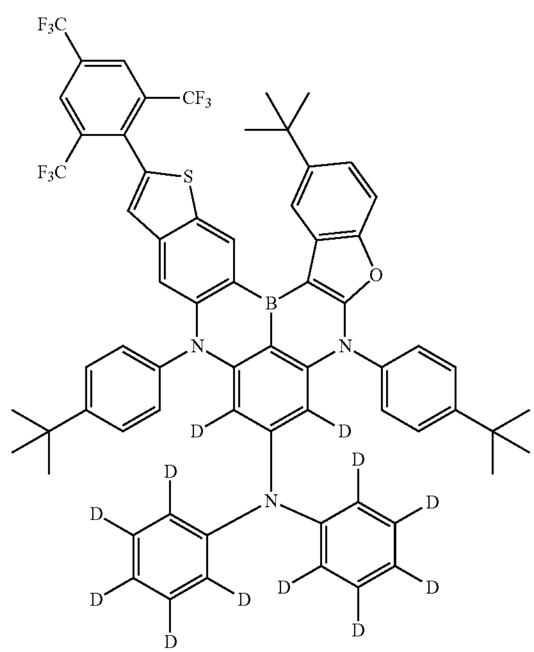

-continued
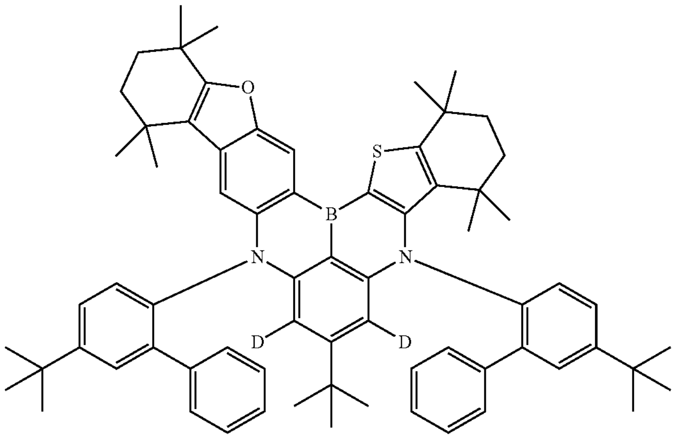
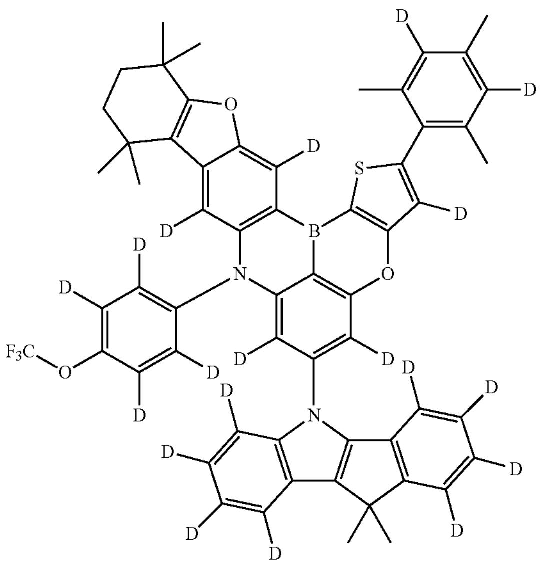
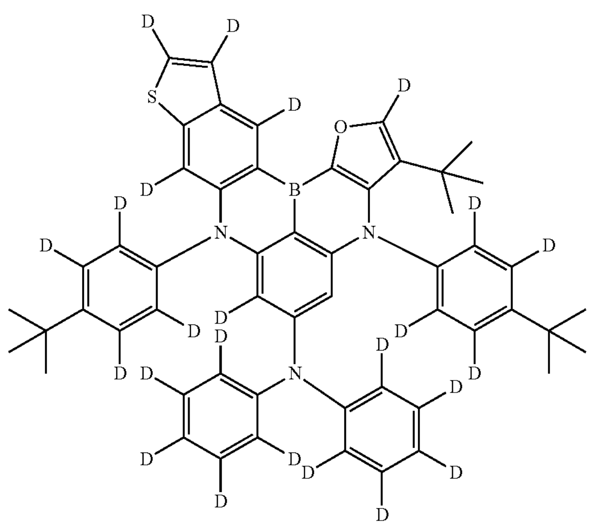
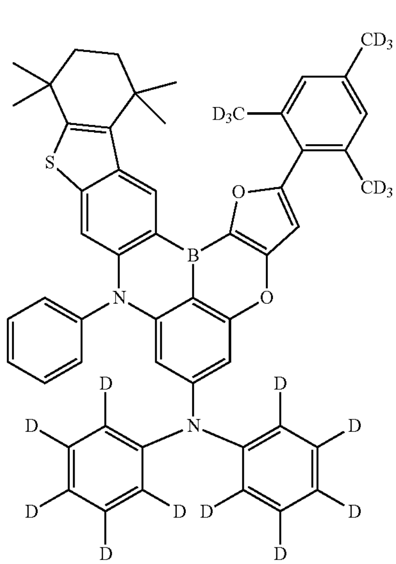
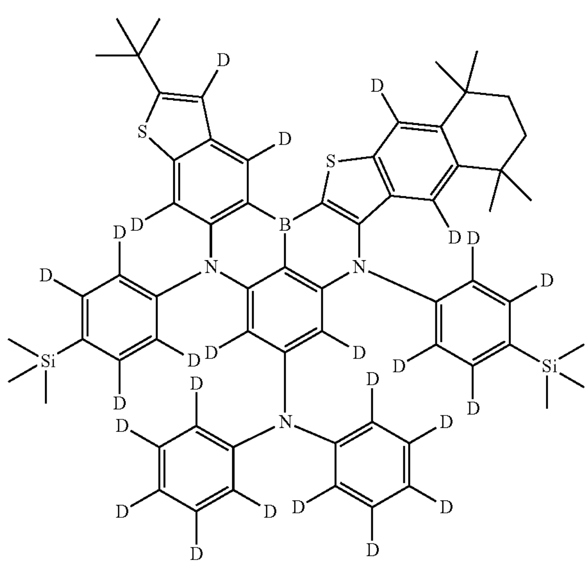

-continued
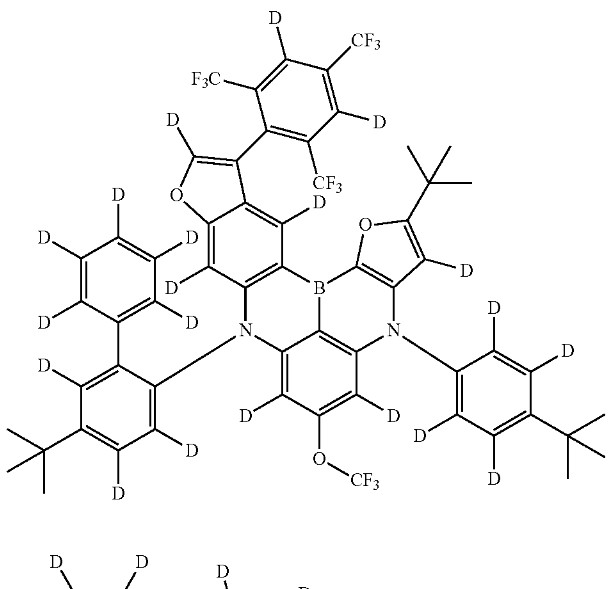
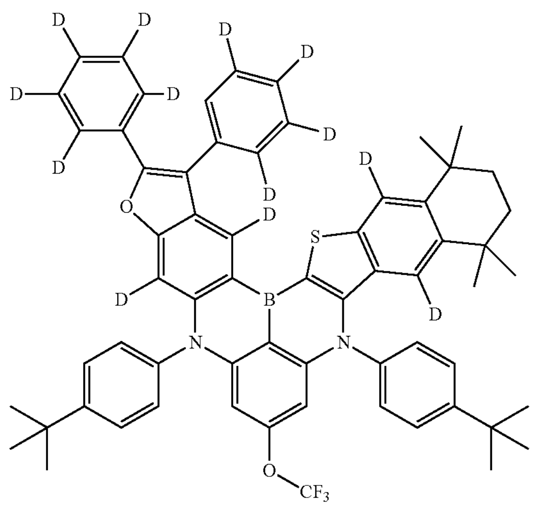
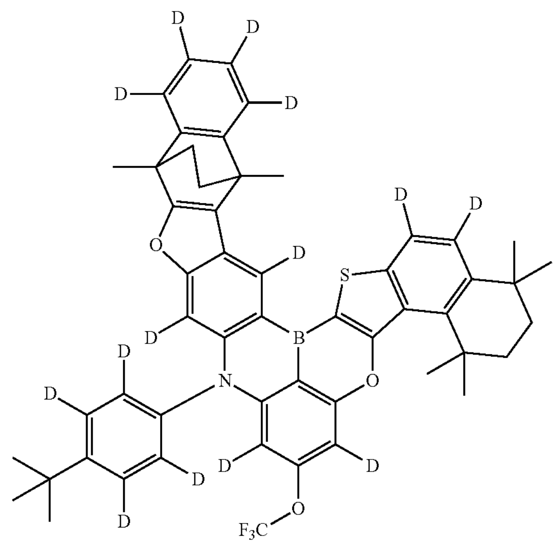
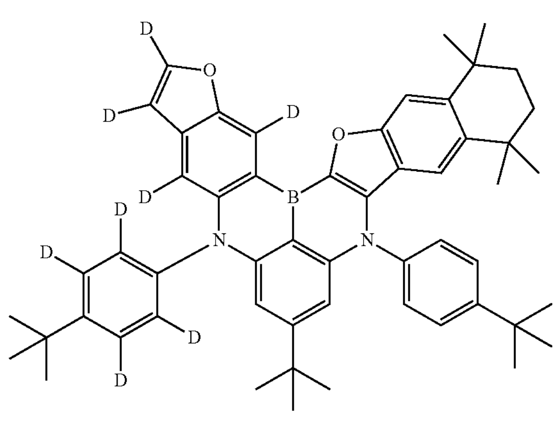
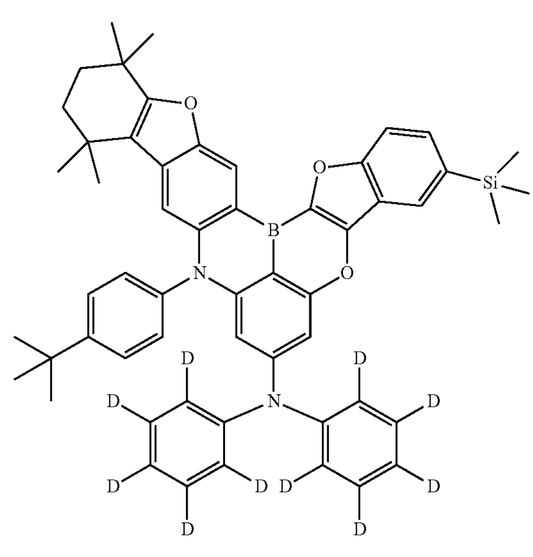

-continued
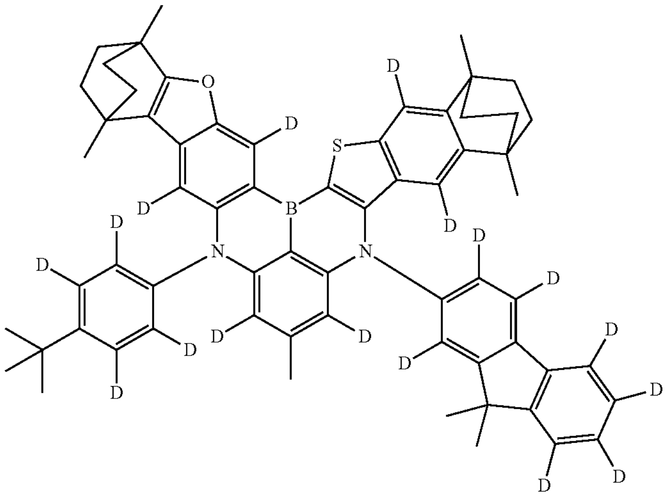
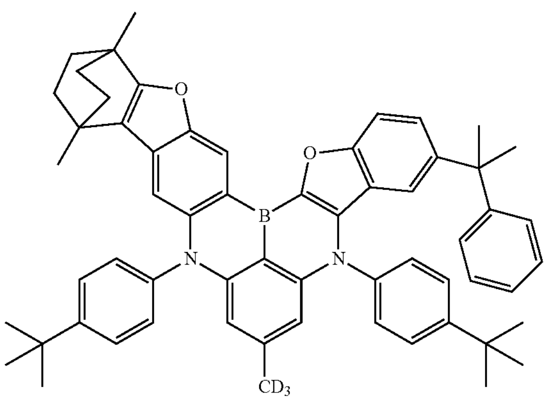
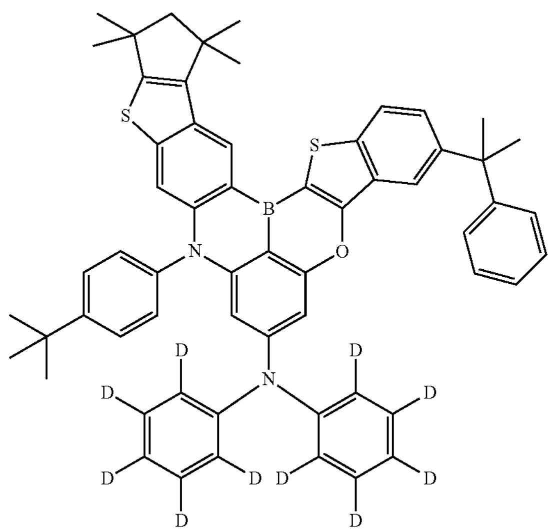
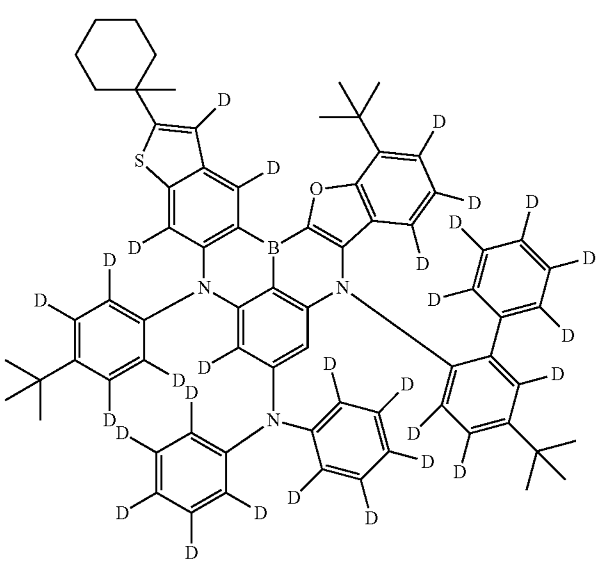
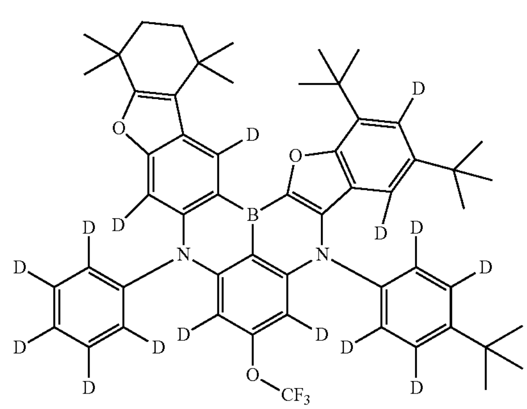

-continued
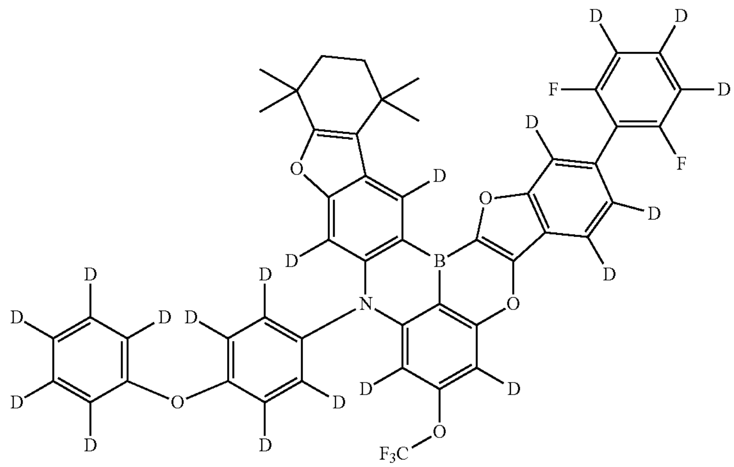
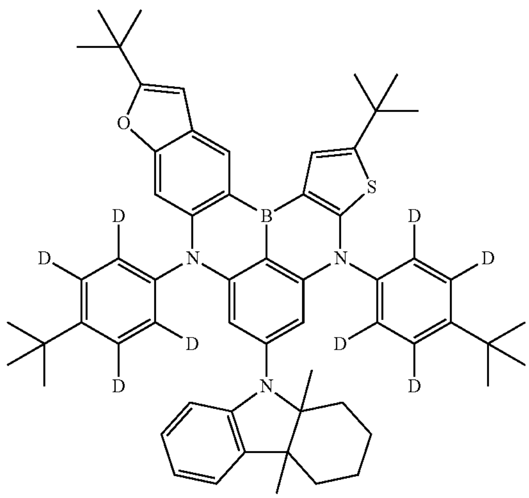
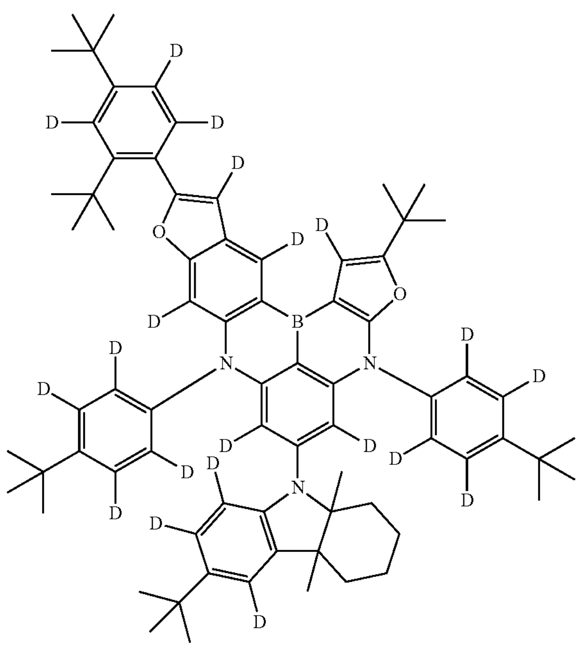

-continued
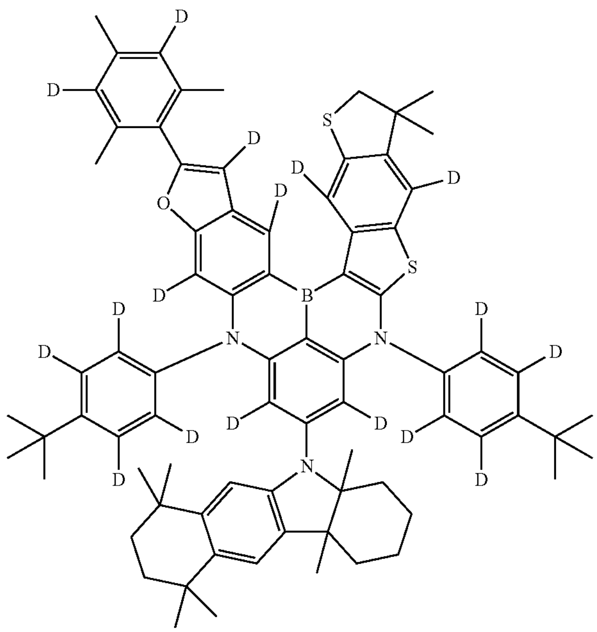
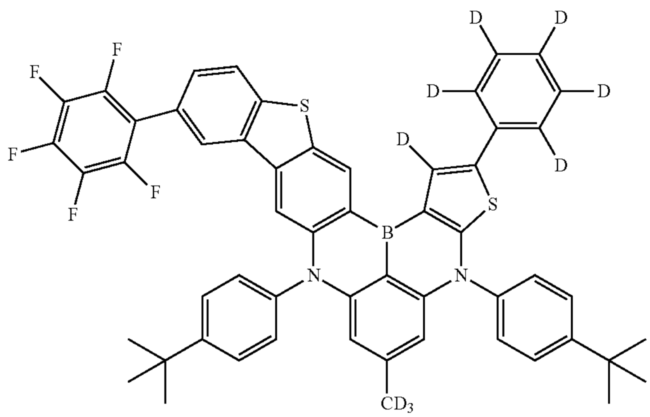
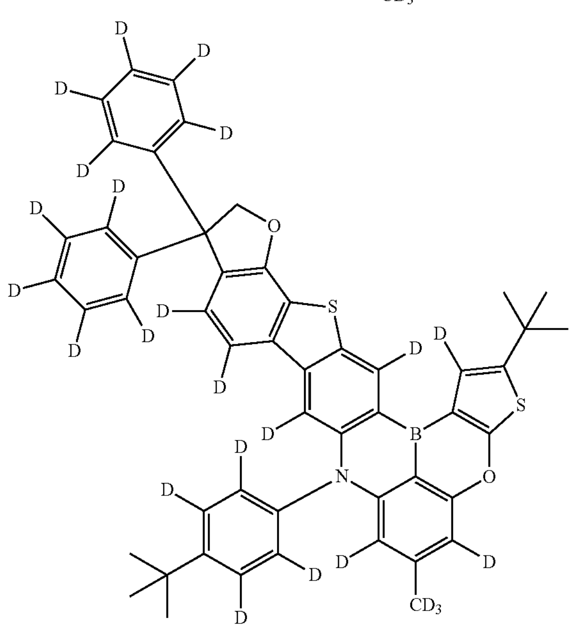
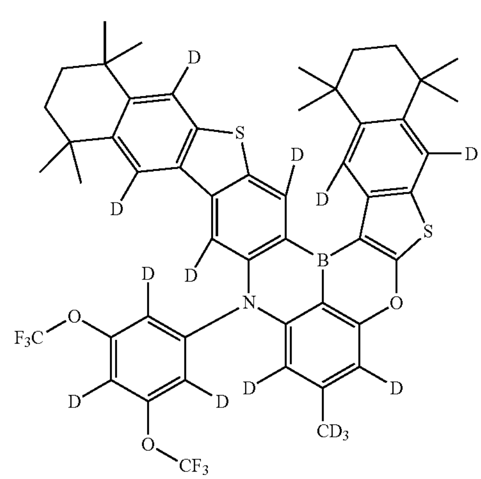

-continued
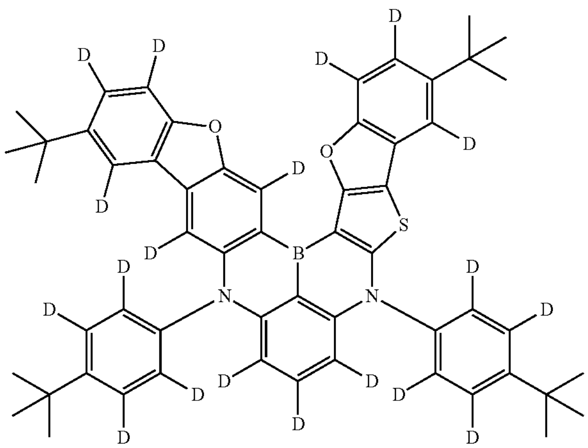
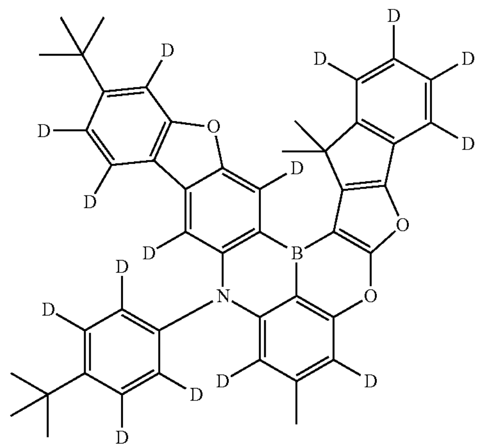
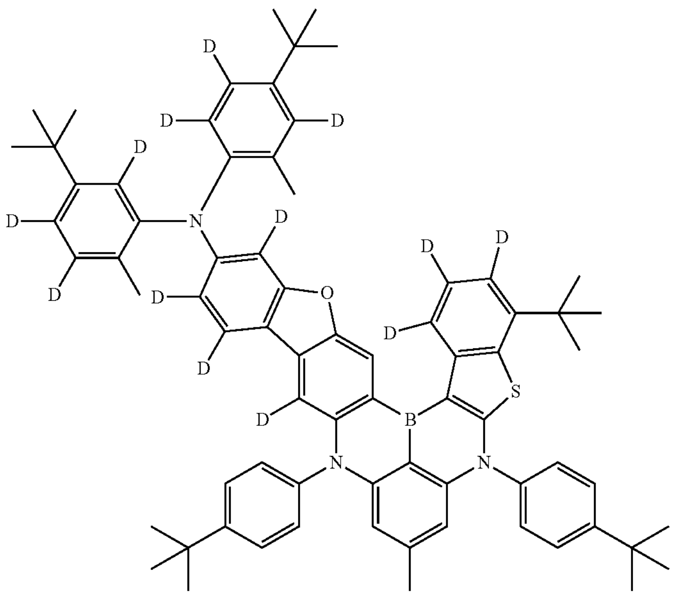
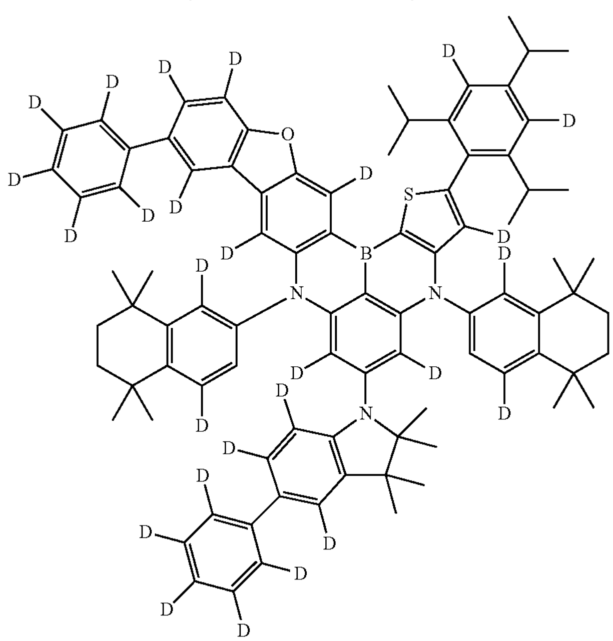

-continued
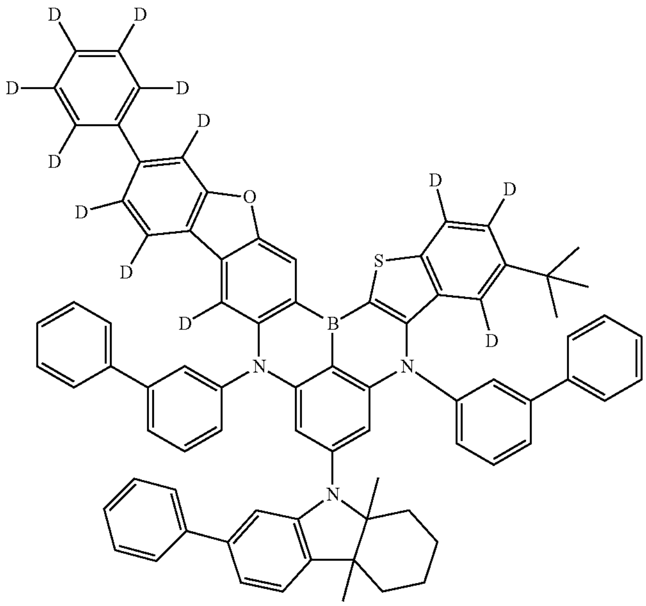
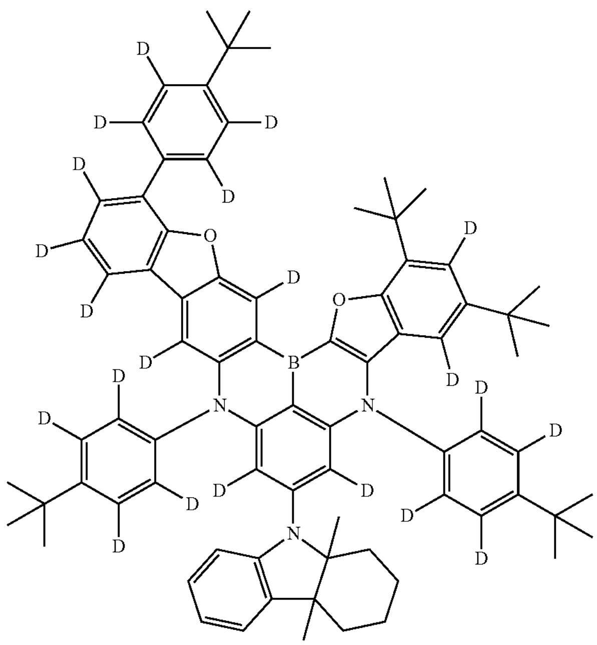
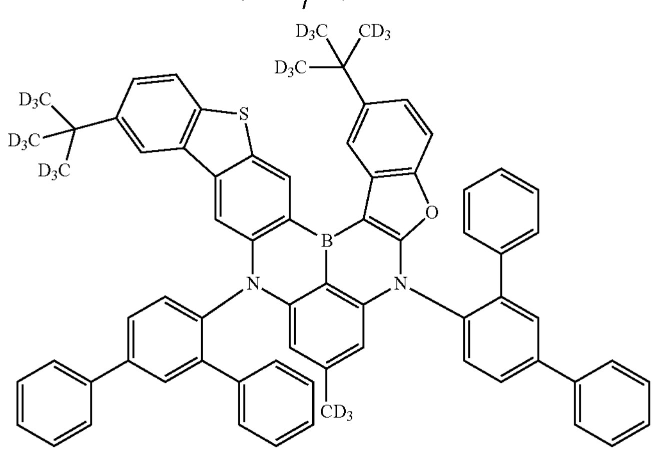

-continued
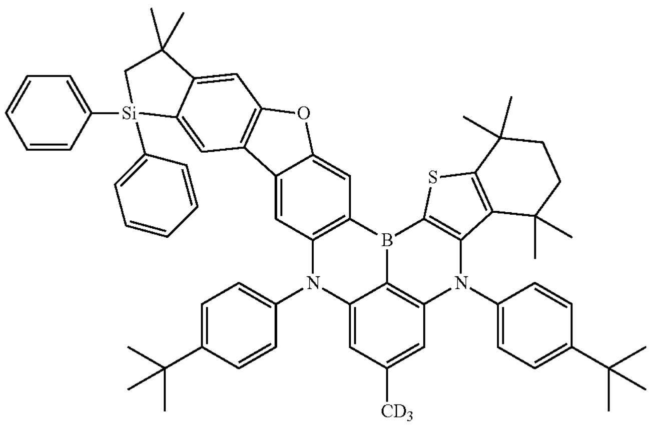
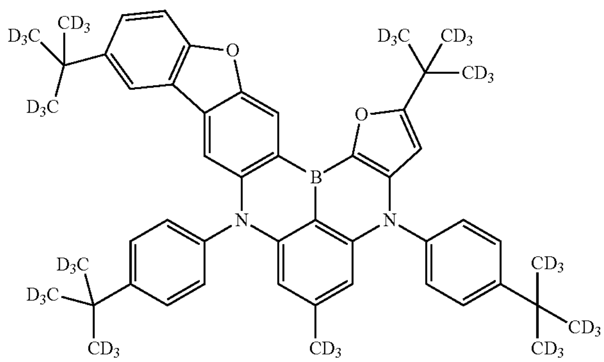
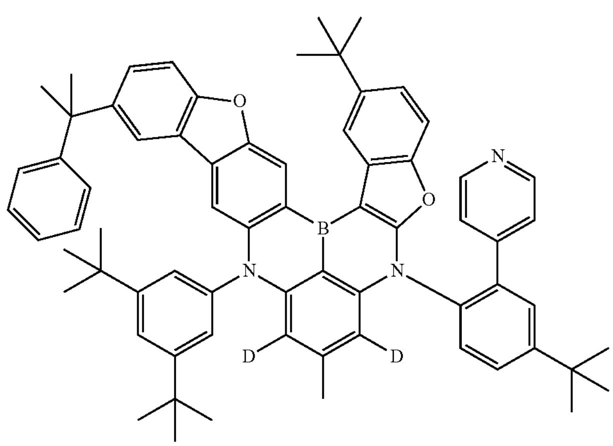

-continued
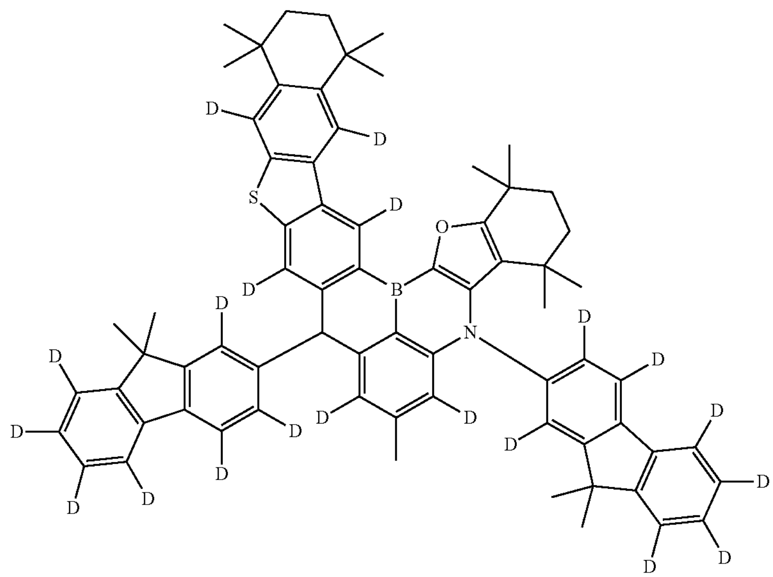
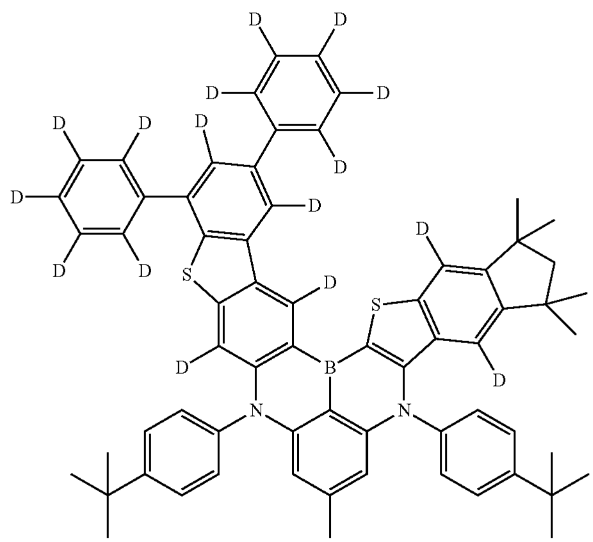
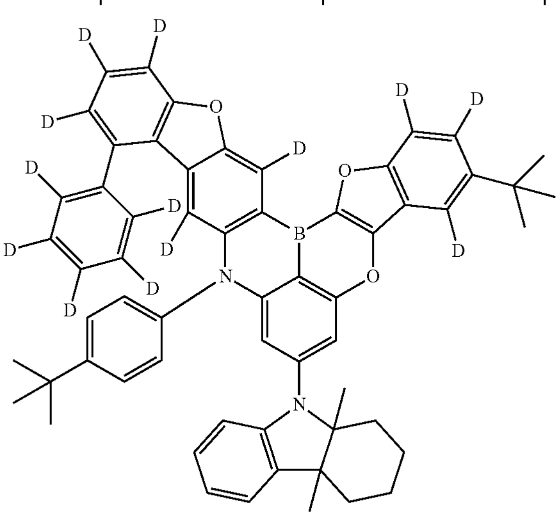
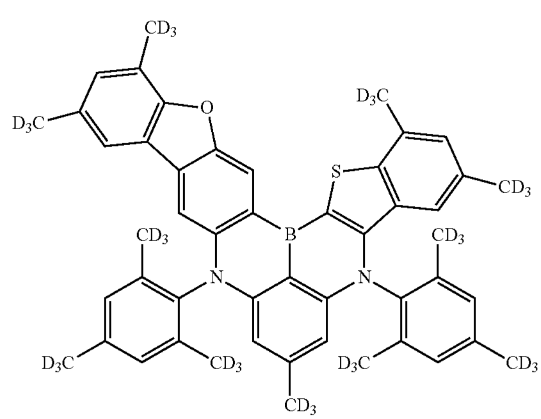

-continued
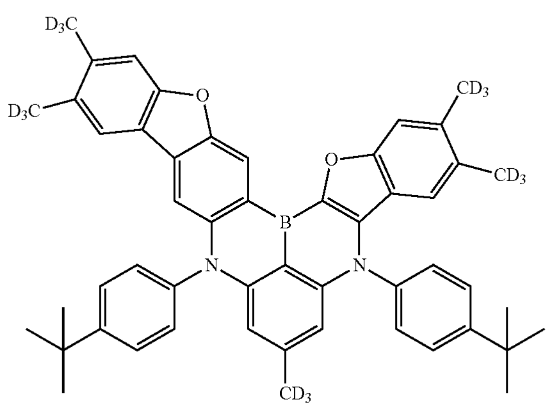
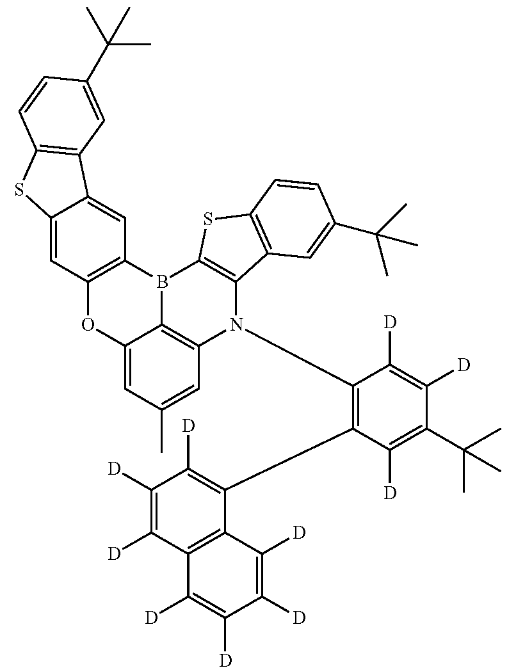
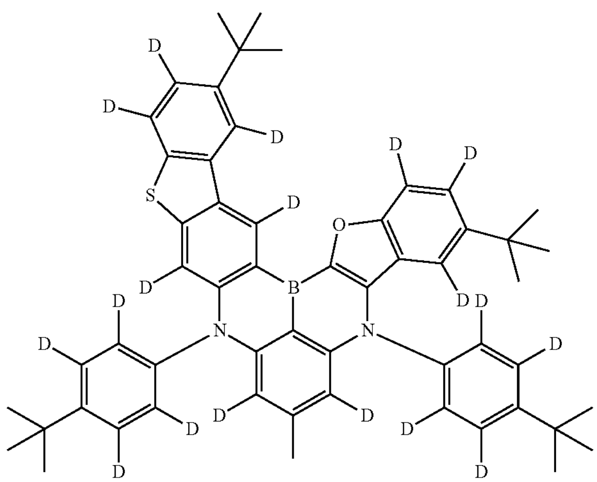
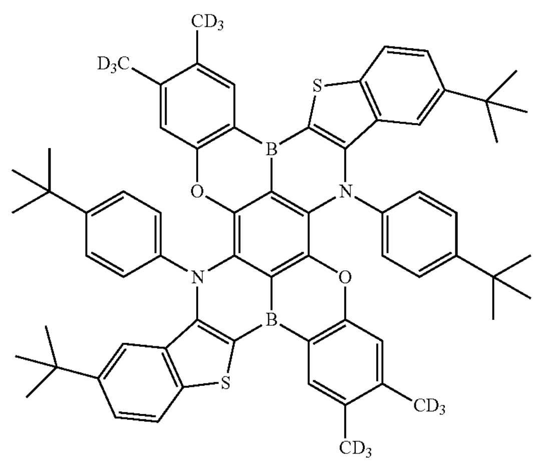
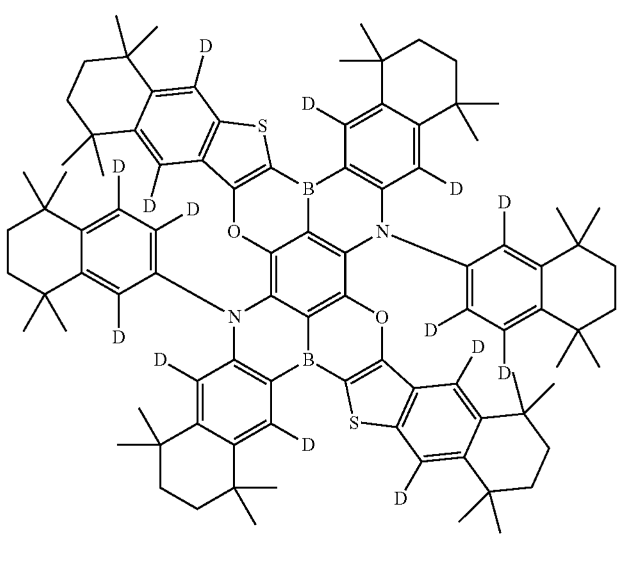

-continued
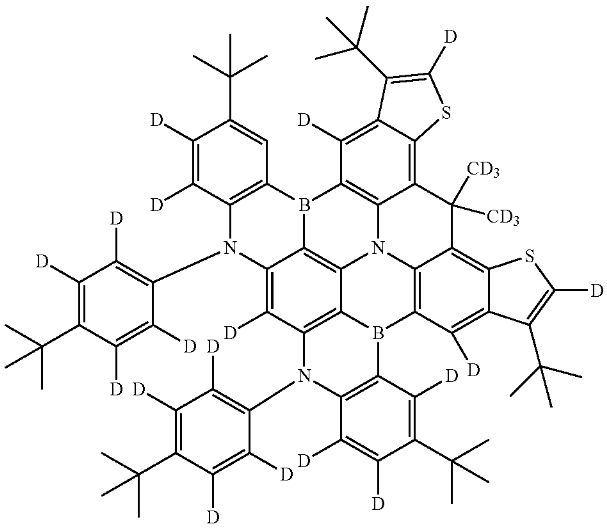
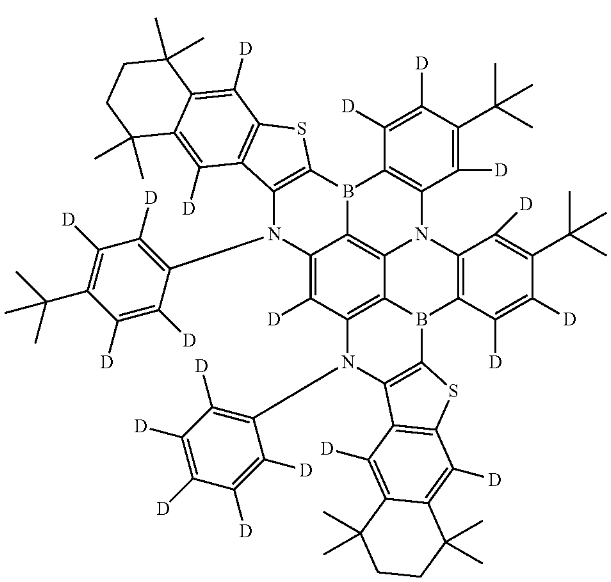

-continued
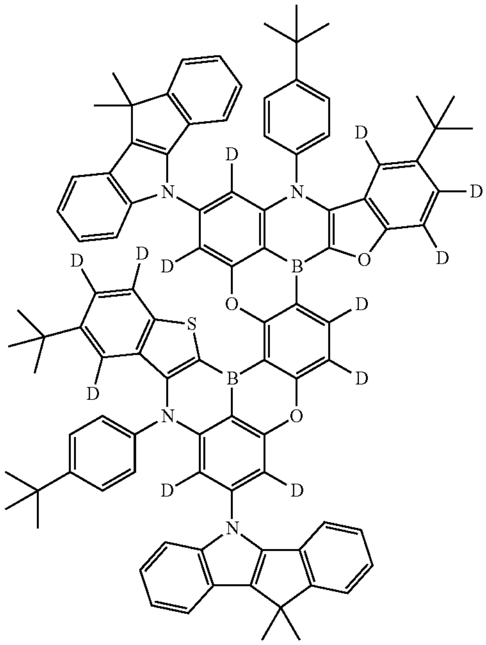
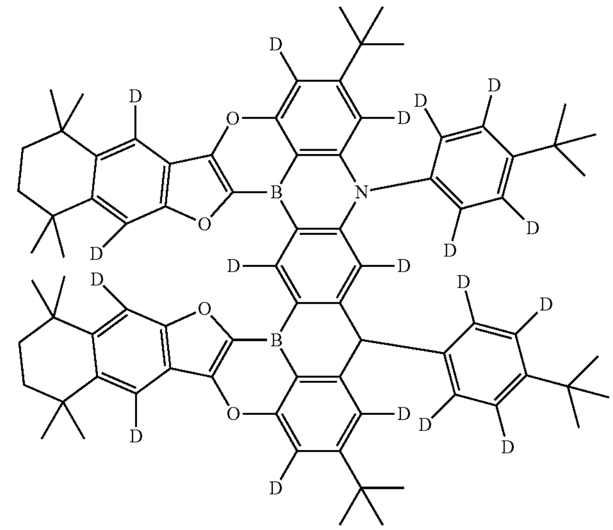
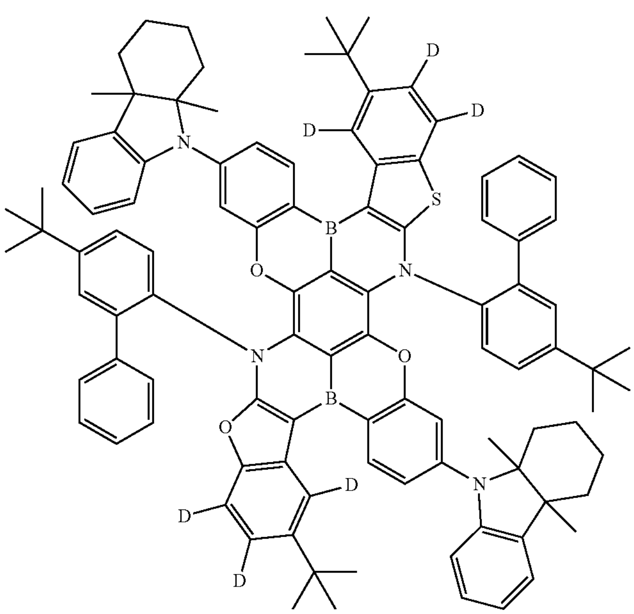

-continued
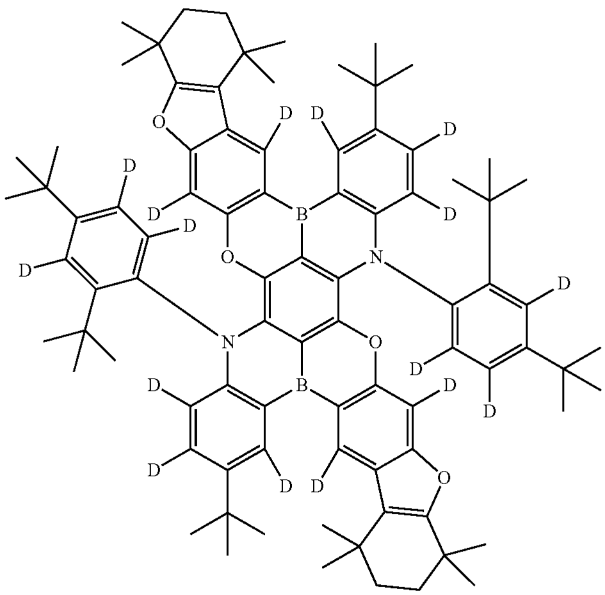
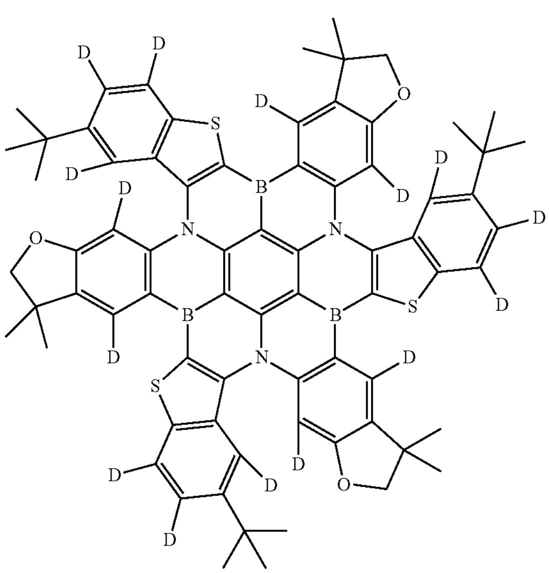

-continued
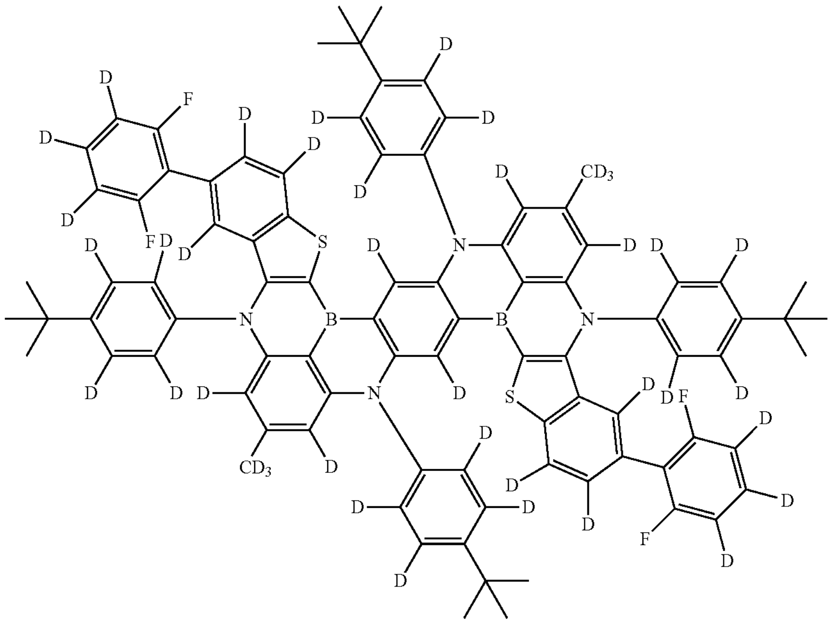
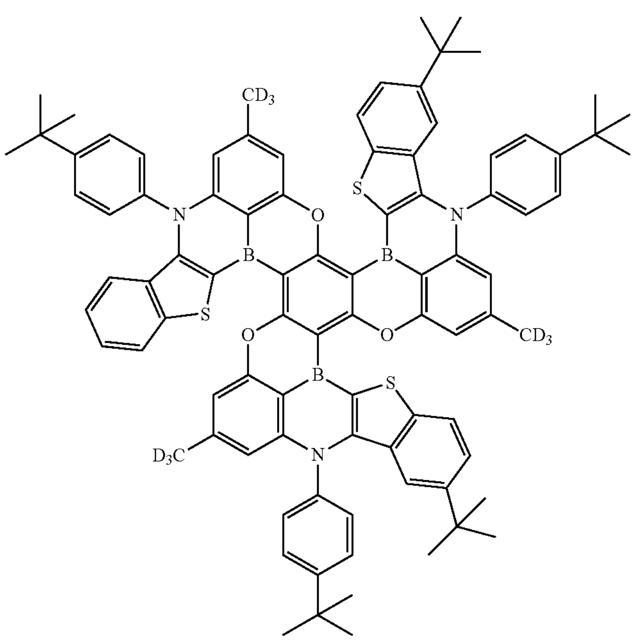
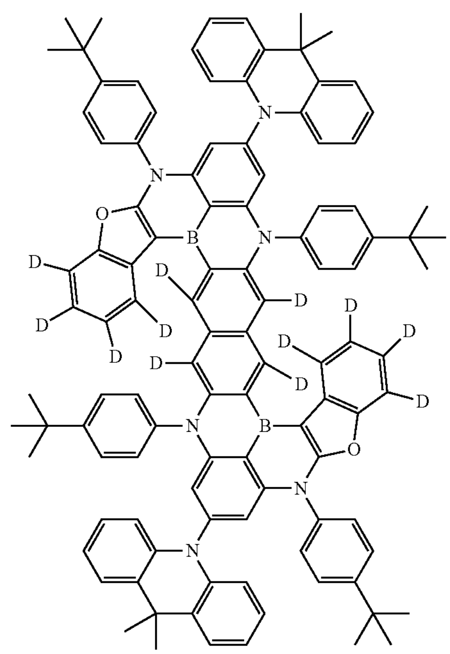

-continued
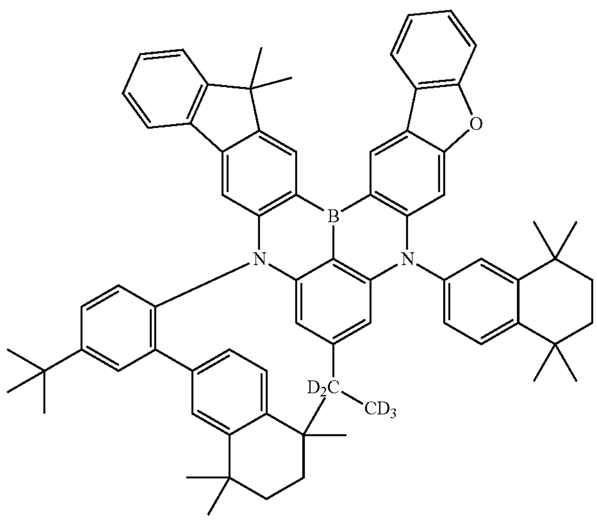
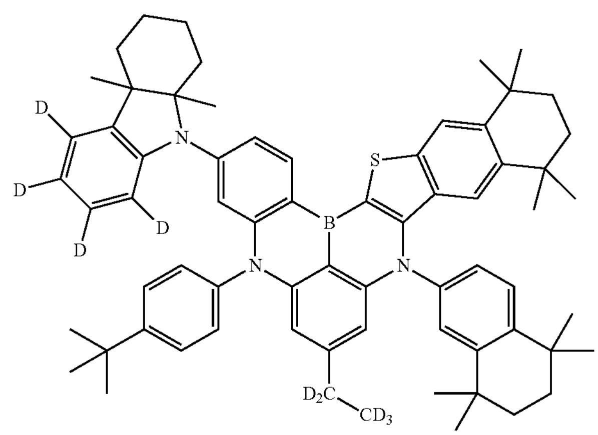
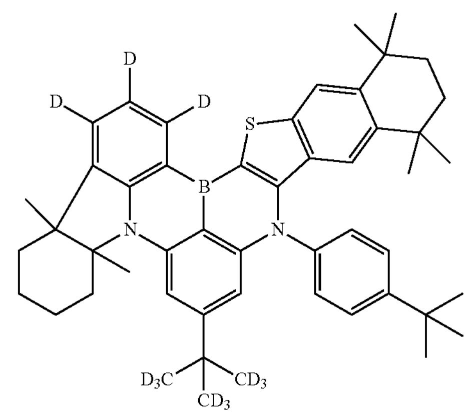
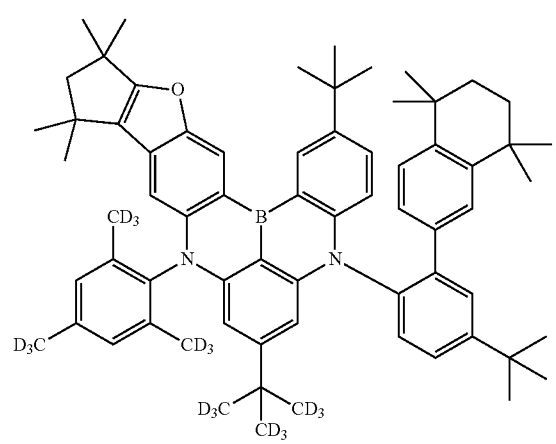
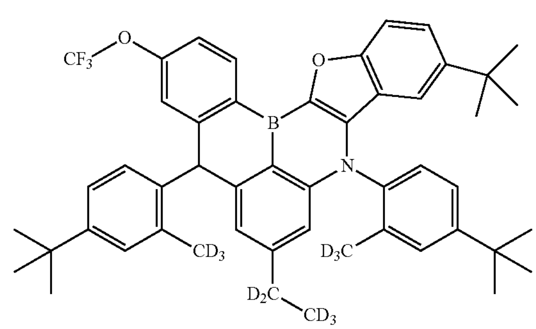

-continued
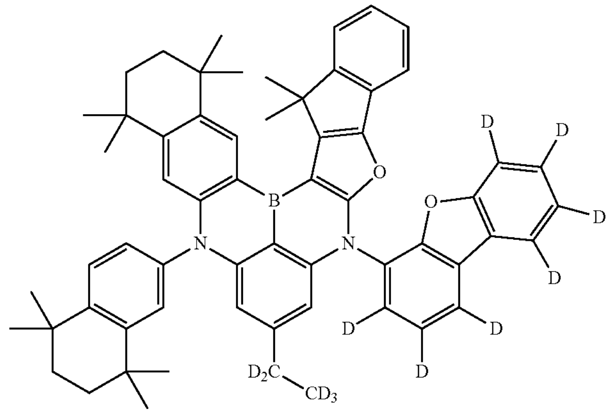
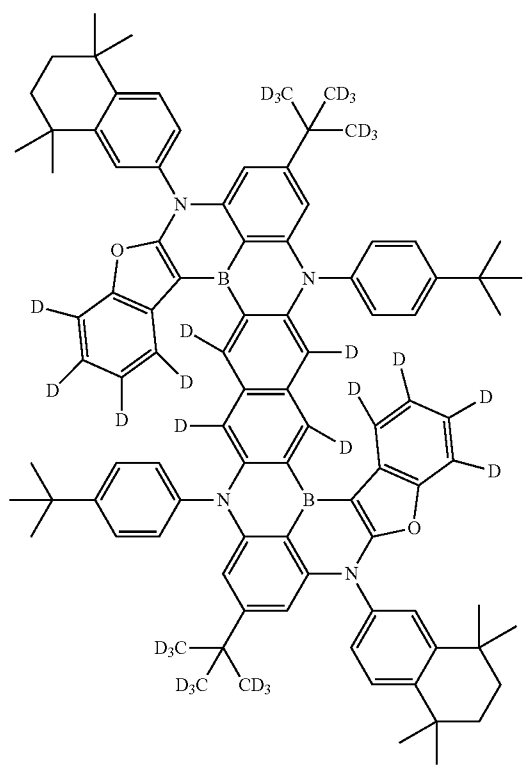

-continued
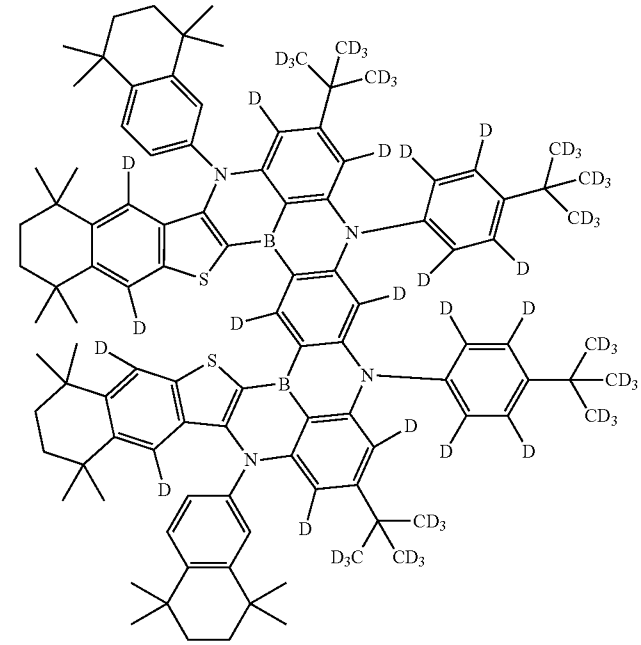
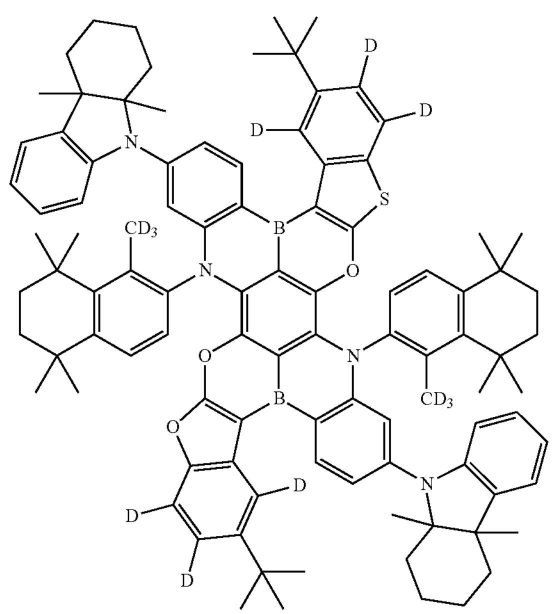

-continued

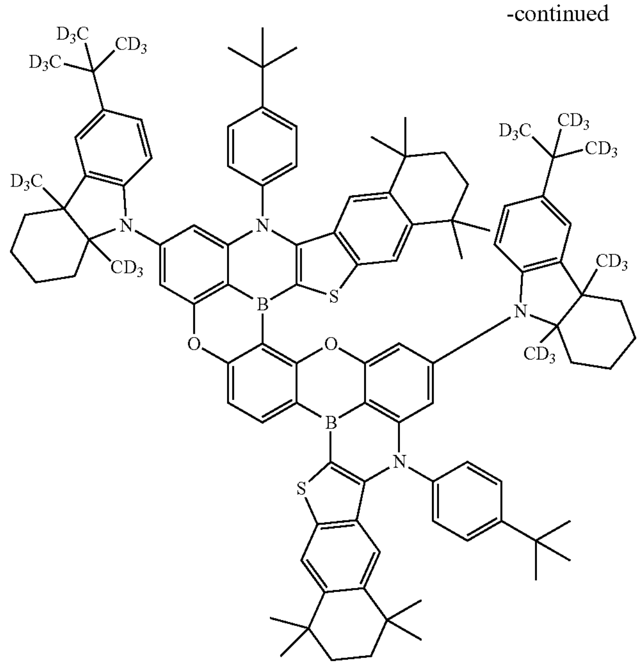

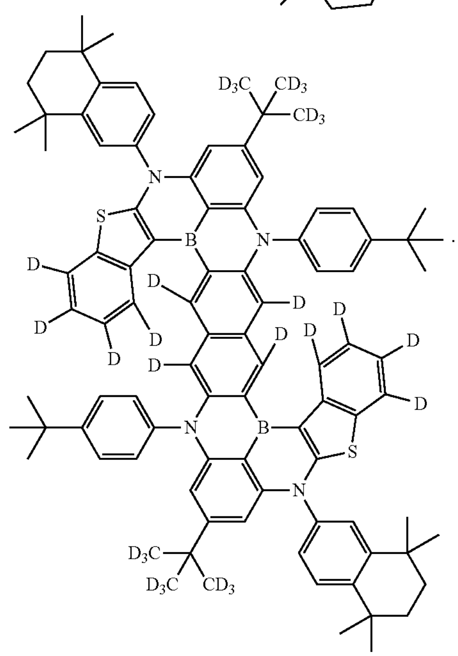

8. The compound of claim 1, wherein R1 comprises deuterium.

9. The compound of claim 1, wherein R2 comprises deuterium.

10. The compound of claim 1, wherein a degree of deuteration of any one of the Chemical Formulae 1-3 to 1-26 is 5% or more and 75% or less.

11. The compound of claim 1, wherein any one of the Chemical Formulae 1-3 to 1-26 comprises:

a straight-chained or branched alkyl group having 1 to 10 carbon atoms, which is substituted with deuterium; or a monocyclic or polycyclic cycloalkyl group having 3 to 10 carbon atoms, which is substituted with one or more of deuterium and a straight-chained or branched alkyl group having 1 to 10 carbon atoms, which is substituted with deuterium; or a monocyclic or polycyclic aliphatic hydrocarbon fused ring having 3 to 10 carbon atoms, which is substituted with one or more of deuterium and a straight-chained or branched alkyl group having 1 to 10 carbon atoms, which is substituted with deuterium.

12. An organic light emitting device, comprising:

a first electrode;

a second electrode; and an organic material layer having one or more layers provided between the first electrode and the second electrode, wherein one or more layers of the organic material layer comprise the compound of claim 1.

13. The organic light emitting device of claim 12, wherein the organic material layer comprises:

a light emitting layer, and the light emitting layer comprises the compound; or a light emitting layer, the light emitting layer comprises a dopant material, and the dopant material comprises the compound.

14. The organic light emitting device of claim 12, wherein the organic material layer comprises a light emitting layer, and the light emitting layer further comprises a compound of Chemical Formula H:

<Chemical Formula H>

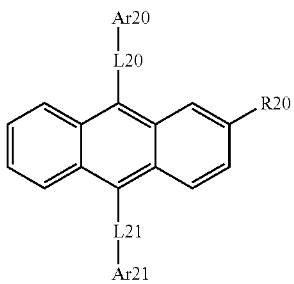

wherein in Chemical Formula H:

L20 and L21 are the same as or different from each other, and are each independently a direct bond, a substituted or unsubstituted arylene group, or a substituted or unsubstituted heteroarylene group;

Ar20 and Ar21 are the same as or different from each other, and are each independently hydrogen, deuterium, a substituted or unsubstituted aryl group, or a substituted or unsubstituted heterocyclic group; and R20 is hydrogen, deuterium, a halogen group, a substituted or unsubstituted alkyl group, a substituted or unsubstituted cycloalkyl group, substituted or unsubstituted aryl group, or a substituted or unsubstituted heterocyclic group.

15. The organic light emitting device of claim 14, wherein Ar20 is a substituted or unsubstituted heterocyclic group, and Ar21 is a substituted or unsubstituted aryl group.

16. The organic light emitting device of claim 12, wherein the organic material layer comprises a light emitting layer, the light emitting layer further comprises a host compound, and at least one hydrogen at a substitutable position of the host compound is substituted with deuterium.

17. The organic light emitting device of claim 12, wherein:

the organic material layer comprises a light emitting layer, and the light emitting layer comprises two or more mixed dopants and a host; or the organic material layer comprises a light emitting layer, and the light emitting layer comprises one or more hosts, and a dopant; or the organic material layer comprises a light emitting layer, and the light emitting layer comprises two or more mixed hosts, and a dopant.

* * * * *